US010991897B2

(12) United States Patent
Li et al.

(10) Patent No.: US 10,991,897 B2
(45) **Date of Patent: *Apr. 27, 2021**

(54) EMITTERS BASED ON OCTAHEDRAL METAL COMPLEXES

(71) Applicant: Arizona Board of Regents on behalf of Arizona State University, Scottsdale, AZ (US)

(72) Inventors: Jian Li, Tempe, AZ (US); Guijie Li, Hangzhou (CN)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/171,026

(22) Filed: Oct. 25, 2018

(65) Prior Publication Data

US 2019/0067602 A1 Feb. 28, 2019

Related U.S. Application Data

(63) Continuation of application No. 15/795,615, filed on Oct. 27, 2017, now abandoned, which is a continuation of application No. 14/937,136, filed on Nov. 10, 2015, now Pat. No. 9,865,825.

(60) Provisional application No. 62/077,443, filed on Nov. 10, 2014.

(51) Int. Cl.

| | |
|---|---|
| ***C07F 15/00*** | (2006.01) |
| ***H01L 51/00*** | (2006.01) |
| ***C09K 11/06*** | (2006.01) |
| ***H05B 33/14*** | (2006.01) |
| *H01L 51/50* | (2006.01) |

(52) U.S. Cl.

CPC ...... *H01L 51/0085* (2013.01); *C07F 15/0033* (2013.01); *C07F 15/0073* (2013.01); *C07F 15/0086* (2013.01); *C09K 11/06* (2013.01); *H05B 33/14* (2013.01); *C09K 2211/1007* (2013.01); *C09K 2211/1011* (2013.01); *C09K 2211/1022* (2013.01); *C09K 2211/1029* (2013.01); *C09K 2211/1044* (2013.01); *C09K 2211/1088* (2013.01); *C09K 2211/1092* (2013.01); *C09K 2211/1096* (2013.01); *C09K 2211/185* (2013.01); *H01L 51/5016* (2013.01)

(58) Field of Classification Search

CPC ............................ C07F 15/0033; H01L 51/50
USPC .............................................. 546/2; 313/504
See application file for complete search history.

(56) References Cited

U.S. PATENT DOCUMENTS

| | | | |
|---|---|---|---|
| 4,769,292 | A | 9/1988 | Tang |
| 5,707,745 | A | 1/1998 | Forrest |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama et al. |
| 7,002,013 | B1 | 2/2006 | Chi |
| 7,026,480 | B2 | 4/2006 | Che et al. |
| 7,029,766 | B2 | 4/2006 | Huo et al. |
| 7,037,599 | B2 | 5/2006 | Culligan et al. |
| 7,064,228 | B1 | 6/2006 | Yu et al. |
| 7,166,368 | B2 | 1/2007 | Lecloux et al. |
| 7,268,485 | B2 | 9/2007 | Tyan |
| 7,276,617 | B2 | 10/2007 | Sotoyama |
| 7,279,704 | B2 | 10/2007 | Walters |
| 7,332,232 | B2 | 2/2008 | Ma |
| 7,442,797 | B2 | 10/2008 | Itoh |
| 7,501,190 | B2 | 3/2009 | Ise |
| 7,655,322 | B2 | 2/2010 | Forrest |
| 7,854,513 | B2 | 12/2010 | Quach |
| 7,947,383 | B2 | 5/2011 | Ise |
| 8,133,597 | B2 | 3/2012 | Yasukawa et al. |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

S. A. Willison et al., "A Luminescent Platinum(II) 2,6-Bis(N-pyrazolyl)pyridine Complex", Inorg. Chem. vol. 43, pp. 2548-2555, 2004.

(Continued)

*Primary Examiner* — Charanjit Aulakh

(74) *Attorney, Agent, or Firm* — Riverside Law LLP

(57) ABSTRACT

Iridium, rhodium, and platinum complexes suitable for use as phosphorescent emitters or as delayed fluorescent and phosphorescent emitters have the following structure:

Formula V

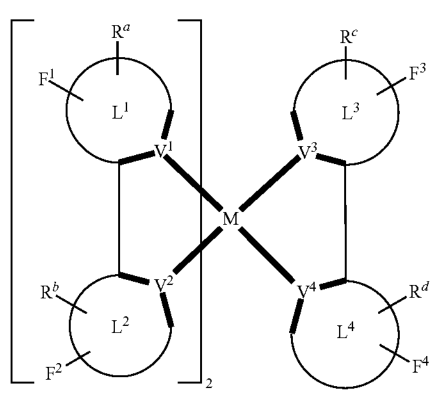

14 Claims, 7 Drawing Sheets

(56) References Cited

U.S. PATENT DOCUMENTS 8,389,725 B2 3/2013 Li et al.
8,617,723 B2 12/2013 Stoessel
8,778,509 B2 7/2014 Yasukawa
8,816,080 B2 8/2014 Li
8,871,361 B2 10/2014 Xia
8,927,713 B2 1/2015 Li
8,946,417 B2 2/2015 Jian
8,987,451 B2 3/2015 Tsai
9,059,412 B2 6/2015 Zeng
9,221,857 B2 12/2015 Li et al.
9,224,963 B2 12/2015 Li
9,238,668 B2 1/2016 Li
9,312,502 B2 4/2016 Li et al.
9,312,505 B2 4/2016 Brooks
9,318,725 B2 4/2016 Li
9,324,957 B2 4/2016 Li
9,382,273 B2 7/2016 Li
9,385,329 B2 7/2016 Li
9,425,415 B2 8/2016 Li
9,461,254 B2 10/2016 Tsai
9,550,801 B2 1/2017 Li
9,598,449 B2 3/2017 Li et al.
9,617,291 B2 4/2017 Li et al.
9,666,822 B2 5/2017 Forrest
9,673,409 B2 6/2017 Li
9,698,359 B2 7/2017 Li
9,711,739 B2 7/2017 Li
9,711,742 B2 7/2017 Li
9,755,163 B2 9/2017 Li
9,818,959 B2 11/2017 Li
9,865,825 B2 1/2018 Li et al.
9,879,039 B2 1/2018 Li
9,882,150 B2 1/2018 Li
9,899,614 B2 2/2018 Li
9,920,242 B2 3/2018 Li
9,923,155 B2 3/2018 Li
9,941,479 B2 4/2018 Li
9,947,881 B2 4/2018 Li
10,020,455 B2 7/2018 Li
10,033,003 B2 7/2018 Li
10,056,564 B2 8/2018 Li
10,056,567 B2 8/2018 Li
10,158,091 B2 12/2018 Li
2001/0019782 A1 9/2001 Igarashi et al.
2002/0068190 A1 6/2002 Tsuboyama
2002/0189666 A1 12/2002 Forrest et al.
2003/0062519 A1 4/2003 Yamazaki et al.
2003/0186077 A1 10/2003 Chen
2004/0230061 A1 11/2004 Seo et al.
2005/0037232 A1 2/2005 Tyan et al.
2005/0170207 A1 8/2005 Ma et al.
2005/0260446 A1 11/2005 MacKenzie
2005/0260448 A1 11/2005 Lin
2006/0024522 A1 2/2006 Thompson et al.
2006/0073359 A1 4/2006 Ise
2006/0093854 A1 5/2006 Sotoyama et al.
2006/0094875 A1 5/2006 Itoh et al.
2006/0127696 A1 6/2006 Stossel et al.
2006/0182992 A1 8/2006 Nii
2006/0202197 A1 9/2006 Nakayama
2006/0210831 A1 9/2006 Sano
2006/0255721 A1 11/2006 Igarashi
2006/0263635 A1 11/2006 Ise
2006/0286406 A1 12/2006 Igarashi et al.
2007/0057630 A1 3/2007 Nishita et al.
2007/0059551 A1 3/2007 Yamazaki
2007/0082284 A1 4/2007 Stoessel
2007/0103060 A1 5/2007 Itoh
2007/0111025 A1 5/2007 Lennartz et al.
2007/0224447 A1 9/2007 Sotoyama et al.
2008/0001530 A1 1/2008 Ise
2008/0036373 A1 2/2008 Itoh
2008/0054799 A1 3/2008 Satou
2008/0067925 A1 3/2008 Oshiyama et al.
2008/0079358 A1 4/2008 Satou
2008/0111476 A1 5/2008 Choi et al.
2008/0241518 A1 10/2008 Satou
2008/0241589 A1 10/2008 Fukunaga et al.
2008/0269491 A1 10/2008 Jabbour et al.
2009/0026936 A1 1/2009 Satou et al.
2009/0026939 A1 1/2009 Kinoshita
2009/0032989 A1 2/2009 Karim
2009/0039768 A1 2/2009 Igarashi et al.
2009/0079340 A1 3/2009 Kinoshita
2009/0128008 A1 5/2009 Ise
2009/0136779 A1 5/2009 Cheng
2009/0153045 A1 6/2009 Kinoshita
2009/0218561 A1 9/2009 Kitamura et al.
2009/0261721 A1 10/2009 Murakami
2009/0267500 A1 10/2009 Kinoshita
2010/0000606 A1 1/2010 Thompson et al.
2010/0013386 A1 1/2010 Thompson et al.
2010/0141127 A1 6/2010 Xia et al.
2010/0171111 A1 7/2010 Takada et al.
2010/0171418 A1 7/2010 Kinoshita et al.
2010/0204467 A1 8/2010 Lamarque
2010/0270540 A1 10/2010 Chung et al.
2011/0028723 A1 2/2011 Li
2011/0049496 A1 3/2011 Fukuzaki
2011/0062858 A1 3/2011 Yersin
2011/0227058 A1 9/2011 Masui
2011/0301351 A1 12/2011 Li
2012/0095232 A1 4/2012 Li
2012/0108806 A1 5/2012 Li
2012/0153816 A1* 6/2012 Takizawa et al. ...... C07F 15/00 546/2
2012/0181528 A1 7/2012 Takada et al.
2012/0199823 A1 8/2012 Molt
2012/0202997 A1 8/2012 Parham
2012/0215001 A1 8/2012 Li
2012/0223634 A1 9/2012 Xia et al.
2012/0264938 A1 10/2012 Li
2012/0273736 A1 11/2012 James et al.
2012/0302753 A1 11/2012 Li
2013/0048963 A1 2/2013 Beers et al.
2013/0082245 A1 4/2013 Kottas
2013/0137870 A1 5/2013 Li
2013/0168656 A1 7/2013 Tsai et al.
2013/0172561 A1 7/2013 Tsai
2013/0200340 A1 8/2013 Otsu et al.
2013/0203996 A1 8/2013 Li
2013/0237706 A1 9/2013 Li
2013/0341600 A1 12/2013 Lin et al.
2014/0014922 A1 1/2014 Lin et al.
2014/0027733 A1 1/2014 Zenq et al.
2014/0066628 A1 3/2014 Li
2014/0073798 A1 3/2014 Li
2014/0084261 A1 3/2014 Brooks et al.
2014/0114072 A1 4/2014 Li
2014/0147996 A1 5/2014 Vogt
2014/0148594 A1 5/2014 Li
2014/0191206 A1 7/2014 Cho
2014/0203248 A1 7/2014 Zhou et al.
2014/0249310 A1 9/2014 Li
2014/0326960 A1 11/2014 Kim et al.
2014/0330019 A1 11/2014 Li
2014/0364605 A1 12/2014 Li
2015/0008419 A1 1/2015 Li
2015/0018558 A1 1/2015 Li
2015/0028323 A1 1/2015 Xia et al.
2015/0069334 A1 3/2015 Xia et al.
2015/0105556 A1 4/2015 Li
2015/0162552 A1 6/2015 Li
2015/0194616 A1 7/2015 Li
2015/0207086 A1 7/2015 Li et al.
2015/0228914 A1 8/2015 Li
2015/0274762 A1 10/2015 Li et al.
2015/0287938 A1 10/2015 Li
2015/0311456 A1 10/2015 Li
2015/0318500 A1 11/2015 Li
2015/0349279 A1 12/2015 Li
2015/0380666 A1 12/2015 Szigethy et al.
2016/0028028 A1 1/2016 Li
2016/0028029 A1 1/2016 Li

(56) References Cited

U.S. PATENT DOCUMENTS

| | | | |
|---|---|---|---|
| 2016/0043331 | A1 | 2/2016 | Li et al. |
| 2016/0072082 | A1 | 3/2016 | Brooks et al. |
| 2016/0133861 | A1 | 5/2016 | Li et al. |
| 2016/0133862 | A1 | 5/2016 | Li |
| 2016/0194344 | A1 | 7/2016 | Li et al. |
| 2016/0197285 | A1 | 7/2016 | Zeng |
| 2016/0197291 | A1 | 7/2016 | Li |
| 2016/0285015 | A1 | 9/2016 | Li |
| 2016/0359120 | A1 | 12/2016 | Li |
| 2016/0359125 | A1 | 12/2016 | Li et al. |
| 2017/0005278 | A1 | 1/2017 | Li |
| 2017/0012224 | A1 | 1/2017 | Li |
| 2017/0040555 | A1 | 2/2017 | Li |
| 2017/0047533 | A1 | 2/2017 | Li |
| 2017/0066792 | A1 | 3/2017 | Li |
| 2017/0069855 | A1 | 3/2017 | Li |
| 2017/0077420 | A1 | 3/2017 | Li |
| 2017/0125708 | A1 | 5/2017 | Li |
| 2017/0267923 | A1 | 9/2017 | Li |
| 2017/0271611 | A1 | 9/2017 | Li |
| 2017/0301871 | A1 | 10/2017 | Li |
| 2017/0305881 | A1 | 10/2017 | Li |
| 2017/0331056 | A1 | 11/2017 | Li |
| 2017/0342098 | A1 | 11/2017 | Li |
| 2017/0373260 | A1 | 12/2017 | Li |
| 2018/0006246 | A1 | 1/2018 | Li |
| 2018/0053904 | A1 | 2/2018 | Li |
| 2018/0130960 | A1 | 5/2018 | Li |
| 2018/0138428 | A1 | 5/2018 | Li |
| 2018/0148464 | A1 | 5/2018 | Li |
| 2018/0159051 | A1 | 6/2018 | Li et al. |
| 2018/0166655 | A1 | 6/2018 | Li |
| 2018/0175329 | A1 | 6/2018 | Li |
| 2018/0194790 | A1 | 7/2018 | Li et al. |
| 2018/0219161 | A1 | 8/2018 | Li |
| 2018/0226592 | A1 | 8/2018 | Li |
| 2018/0226593 | A1 | 8/2018 | Li |
| 2018/0277777 | A1 | 9/2018 | Li |
| 2018/0301641 | A1 | 10/2018 | Li |
| 2018/0312750 | A1 | 11/2018 | Li |
| 2018/0331307 | A1 | 11/2018 | Li |
| 2018/0334459 | A1 | 11/2018 | Li |
| 2018/0337345 | A1 | 11/2018 | Li |
| 2018/0337349 | A1 | 11/2018 | Li |
| 2018/0337350 | A1 | 11/2018 | Li |
| 2019/0013485 | A1 | 1/2019 | Li |
| 2019/0067602 | A1 | 2/2019 | Li |
| 2019/0109288 | A1 | 4/2019 | Li |
| 2019/0194536 | A1 | 6/2019 | Li |
| 2019/0259963 | A1 | 8/2019 | Li |
| 2019/0276485 | A1 | 9/2019 | Li |
| 2019/0312217 | A1 | 10/2019 | Li |
| 2019/0367546 | A1 | 12/2019 | Li |
| 2019/0389893 | A1 | 12/2019 | Li |
| 2020/0006678 | A1 | 1/2020 | Li |
| 2020/0071330 | A1 | 3/2020 | Li |
| 2020/0075868 | A1 | 3/2020 | Li |

FOREIGN PATENT DOCUMENTS

| | | | |
|---|---|---|---|
| CN | 1894269 | A | 1/2007 |
| CN | 101142223 | A | 3/2008 |
| CN | 101667626 | | 3/2010 |
| CN | 102449108 | A | 5/2012 |
| CN | 102892860 | A | 1/2013 |
| CN | 102971396 | A | 3/2013 |
| CN | 103102372 | | 5/2013 |
| CN | 104232076 | A | 12/2014 |
| CN | 104377231 | | 2/2015 |
| CN | 104693243 | A | 6/2015 |
| CN | 105367605 | A | 3/2016 |
| CN | 105418591 | A | 3/2016 |
| EP | 1808052 | A1 | 7/2007 |
| EP | 1874893 | A1 | 1/2008 |
| EP | 1874894 | | 1/2008 |
| EP | 1919928 | A1 | 5/2008 |
| EP | 2036907 | | 3/2009 |
| EP | 2096690 | | 9/2009 |
| EP | 2112213 | A2 | 10/2009 |
| EP | 2417217 | A2 | 2/2012 |
| EP | 2711999 | | 3/2014 |
| JP | 2002105055 | | 4/2002 |
| JP | 2002105055 | A | 4/2002 |
| JP | 2003342284 | | 12/2003 |
| JP | 2005267557 | | 9/2005 |
| JP | 2005310733 | A | 11/2005 |
| JP | 2006047240 | A | 2/2006 |
| JP | 2006114889 | | 4/2006 |
| JP | 2006232784 | A | 9/2006 |
| JP | 2006242080 | | 9/2006 |
| JP | 2006242081 | A | 9/2006 |
| JP | 2006256999 | | 9/2006 |
| JP | 2006257238 | A | 9/2006 |
| JP | 2006261623 | A | 9/2006 |
| JP | 2006282965 | | 10/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007031678 | A | 2/2007 |
| JP | 2007042875 | | 2/2007 |
| JP | 2007051243 | A | 3/2007 |
| JP | 2007053132 | | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 2007088105 | | 4/2007 |
| JP | 2007088164 | | 4/2007 |
| JP | 2007096259 | | 4/2007 |
| JP | 2007099765 | A | 4/2007 |
| JP | 2007110067 | | 4/2007 |
| JP | 2007110102 | A | 4/2007 |
| JP | 2007519614 | | 7/2007 |
| JP | 2007258550 | A | 10/2007 |
| JP | 2007324309 | | 12/2007 |
| JP | 2008010353 | A | 1/2008 |
| JP | 2008091860 | | 4/2008 |
| JP | 2008103535 | A | 5/2008 |
| JP | 2008108617 | | 5/2008 |
| JP | 2008109085 | | 5/2008 |
| JP | 2008109103 | A | 5/2008 |
| JP | 2008160087 | | 7/2008 |
| JP | 2008525366 | | 7/2008 |
| JP | 2008198801 | | 8/2008 |
| JP | 2008270729 | A | 11/2008 |
| JP | 2008270736 | | 11/2008 |
| JP | 2009016184 | | 1/2009 |
| JP | 2009016579 | | 1/2009 |
| JP | 2009032977 | A | 2/2009 |
| JP | 2009032988 | | 2/2009 |
| JP | 2009059997 | | 3/2009 |
| JP | 2009059997 | A | 3/2009 |
| JP | 2009076509 | | 4/2009 |
| JP | 2009161524 | A | 7/2009 |
| JP | 2009266943 | A | 11/2009 |
| JP | 2009267171 | | 11/2009 |
| JP | 2009267244 | | 11/2009 |
| JP | 2009272339 | A | 11/2009 |
| JP | 2009283891 | A | 12/2009 |
| JP | 2010135689 | | 6/2010 |
| JP | 2010171205 | A | 8/2010 |
| JP | 2011071452 | A | 4/2011 |
| JP | 2012079895 | A | 4/2012 |
| JP | 2012079898 | A | 4/2012 |
| JP | 5604505 | | 9/2012 |
| JP | 2012522843 | | 9/2012 |
| JP | 2012207231 | A | 10/2012 |
| JP | 2012222255 | A | 11/2012 |
| JP | 2012231135 | A | 11/2012 |

(56) References Cited

FOREIGN PATENT DOCUMENTS

| | | | |
|---|---|---|---|
| JP | 2013023500 | A | 2/2013 |
| JP | 2013048256 | A | 3/2013 |
| JP | 2013053149 | A | 3/2013 |
| JP | 2013525436 | | 6/2013 |
| JP | 2014019701 | A | 2/2014 |
| JP | 2014058504 | A | 4/2014 |
| JP | 2014221807 | A | 11/2014 |
| JP | 2014239225 | A | 12/2014 |
| JP | 2015081257 | A | 4/2015 |
| KR | 20060115371 | | 11/2006 |
| KR | 20070061830 | | 6/2007 |
| KR | 20070112465 | | 11/2007 |
| KR | 20130043460 | | 4/2013 |
| KR | 101338250 | | 12/2013 |
| KR | 20140052201 | | 5/2014 |
| KR | 20140052501 | A | 5/2014 |
| TW | 200701835 | | 1/2007 |
| TW | 201249851 | | 12/2012 |
| TW | 201307365 | A | 2/2013 |
| TW | 201710277 | | 3/2017 |
| WO | WO2000070655 | | 11/2000 |
| WO | WO2004003108 | | 1/2004 |
| WO | WO2004039781 | | 5/2004 |
| WO | WO2004085450 | | 10/2004 |
| WO | WO2004108857 | | 12/2004 |
| WO | 2005042444 | A2 | 5/2005 |
| WO | 2005042550 | A1 | 5/2005 |
| WO | WO2005075600 | | 8/2005 |
| WO | WO2005103195 | | 11/2005 |
| WO | WO2005105746 | | 11/2005 |
| WO | WO2005113704 | | 12/2005 |
| WO | 2006033440 | A1 | 3/2006 |
| WO | WO2006067074 | | 6/2006 |
| WO | WO2006082742 | | 8/2006 |
| WO | 2006098505 | A1 | 9/2006 |
| WO | WO2006100888 | | 9/2006 |
| WO | 2006113106 | | 10/2006 |
| WO | 2006115299 | A1 | 11/2006 |
| WO | WO2006115301 | | 11/2006 |
| WO | 2007034985 | A1 | 3/2007 |
| WO | 2007069498 | A1 | 6/2007 |
| WO | 2008054578 | | 5/2008 |
| WO | 2008066192 | A1 | 6/2008 |
| WO | 2008066195 | A1 | 6/2008 |
| WO | 2008066196 | A1 | 6/2008 |
| WO | WO2008101842 | | 8/2008 |
| WO | WO2008117889 | | 10/2008 |
| WO | WO2008123540 | | 10/2008 |
| WO | 2009017211 | A1 | 2/2009 |
| WO | 2009023667 | | 2/2009 |
| WO | WO2009086209 | | 7/2009 |
| WO | WO2009111299 | | 9/2009 |
| WO | 2010007098 | A1 | 1/2010 |
| WO | WO2010056669 | | 5/2010 |
| WO | WO2010093176 | | 8/2010 |
| WO | 2010105141 | | 9/2010 |
| WO | 2010118026 | | 10/2010 |
| WO | WO2011064335 | | 6/2011 |
| WO | WO2011070989 | | 6/2011 |
| WO | 2011089163 | | 7/2011 |
| WO | 2011137429 | | 11/2011 |
| WO | 2011137431 | | 11/2011 |
| WO | 2012074909 | | 6/2012 |
| WO | 2012112853 | | 8/2012 |
| WO | 2012116231 | | 8/2012 |
| WO | 2012142387 | | 10/2012 |
| WO | WO2012142387 | | 10/2012 |
| WO | 2012162488 | | 11/2012 |
| WO | 2012163471 | A1 | 12/2012 |
| WO | 2013130483 | | 9/2013 |
| WO | WO 2014016611 | | 1/2014 |
| WO | 2014031977 | | 2/2014 |
| WO | WO2014031977 | | 2/2014 |
| WO | 2014047616 | | 3/2014 |
| WO | 2014109814 | | 7/2014 |
| WO | WO2014109814 | | 7/2014 |
| WO | WO2014208271 | | 12/2014 |
| WO | 2015027060 | | 2/2015 |
| WO | 2015131158 | | 9/2015 |
| WO | WO2015131158 | | 9/2015 |
| WO | WO 2015131158 | | 9/2015 |
| WO | 2016025921 | | 2/2016 |
| WO | 2016029137 | | 2/2016 |
| WO | 2016029186 | | 2/2016 |
| WO | WO2016029189 | | 2/2016 |
| WO | WO2016197019 | | 12/2016 |
| WO | 2018071697 | | 4/2018 |
| WO | 2018140765 | | 8/2018 |
| WO | 2019079505 | | 4/2019 |
| WO | 2019079508 | | 4/2019 |
| WO | 2019079509 | | 4/2019 |
| WO | 2019236541 | | 12/2019 |
| WO | 2020018476 | | 1/2020 |

OTHER PUBLICATIONS

J. M. Longmire et al., "Synthesis and X-ray Crystal Structures of Palladium(II) and Platinum(II) Complexes of the PCP-Type Chiral Tridentate Ligand", Organometallics, vol. 17, pp. 4374-4379, 1998.

V. Adamovich et al., "High efficiency single dopant white electrophosphorescent light emitting diodes", New J. Chem, vol. 26, pp. 1171-1178. 2002.

Del Cano et al., "Near-infrared electroluminescence based on perylenediimide-doped tris(8-quinolinolato) aluminum", Applied Physics Letters, 88, pp. 071117-1-071117-3, 2006.

B. Harrison et al., "Near-infrared electroluminescence from conjugated polymer/lanthanide porphyrin blends", Applied Physics Letter, vol. 79, No. 23, pp. 3770-3772, Dec. 3, 2001.

J. Kido et al., "Organo Lanthanide Metal Complexes for Electroluminescent Materials", Chem. Rev., vol. 102, pp. 2357-2368, 2002.

S. Lamansky et al., "Highly Phosphorescent Bis-Cyclometalated Iridium Complexes: Synthesis, Photophysical Characterization, and Use in Organic Light Emitting Diodes", J. Am. Chem. Soc., vol. 123, pp. 4304-4312, 2001.

S. Lamansky et al., "Synthesis and Characterization of Phosphorescent Cyclometalated Iridium Complexes", Inorg. Chem., vol. 40, pp. 1704-1711, 2001.

X. Li et al., "Synthesis and properties of novel poly(p-phenylenevinylene) copolymers for near-infrared emitting diodes", European Polymer Journal, vol. 41, pp. 2923-2933, 2005.

P. Peumans et al., "Small molecular weight organic thin-film photodetectors and solar cells", Journal of Applied Physics, vol. 93, No. 7, pp. 3693-3723, Apr. 1, 2003.

Rand et al., Organic Double-Heterostructure Photovoltaic Cells Employing Thick Tris (acetylacetonato) ruthenium (III) Exciton-Blocking Layers, Advanced Materials vol. 17, pp. 2714-2718, 2005.

C.W. Tang, "Two-layer organic photovoltaic cell", Appl. Phys. Letters 48 (2), pp. 183-185, 1986).

Vanhelmont et al., "Synthesis, Crystal Structure, High-Resolution Optical Spectroscopy, and Extended Huckel Calculations for [Re(CO)4(thpy)] (thpy-2-(2-Thienyl)pyridinate). Comparison with Related Cyclometalated Complexes", Inorg. Chem., vol. 36, pp. 5512-5517, 1997.

Williams et al., "Organic light-emitting diodes having exclusive near-infrared electrophosphorescence", Applied Physics Letters, vol. 89, pp. 083506 (3 pages), 2006.

Forrest et al., "Measuring the Efficiency of Organic Light-Emitting Devices", Advanced Materials, vol. 15, No. 13, pp. 1043-1048, 2003.

Cardenas et al., "Divergent Behavior of Palladium(II) and Platinum(II) in the Metalation of 1,2-Di(2-pyridyl)benzene," Organometallics 1999, 18, pp. 3337-3341.

Williams et al., "An Alternative Route to Highly Luminescent Platinum(II) Complexes," Inorg. Chem., 2003, 42, pp. 8609-8611.

Sanna et al., "Platinum complexes with N-N-C ligands Synthesis, electrochemical and spectroscopic characteristics of platinum(II) and relevant electroreduced species," Inorganica Chimica Acta 305, 2000, pp. 189-205.

(56) References Cited

OTHER PUBLICATIONS

International Search Report and Written Opinion, PCT/US2008/087847, dated Aug. 6, 2009, 12 pages.
International Search Report and Written Opinion, PCT/US2009/035441, dated Oct. 19, 2009, 14 pages.
Ionkin, A.S. et al.: Synthesis and structural characterization of a series of novel polyaromatic ligands. containing pyrene and related biscyclometalated iridium complexes. Organometallics, vol. 25, pp. 1461-1471, 2006.
Ayan Maity et al., "Room-temperature synthesis of cyclometalated iridium(III) complexes; kinetic isomers and reactive functionalities" Chem. Sci., vol. 4, pp. 1175-1181 (2013).
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Marc Lepeltier et al., "Efficient blue green organic light-emitting devices based on a monofluorinated heteroleptic iridium(III) complex," Synthetic Metals, vol. 199, 2015, pp. 139-146.
Stefan Bernhard, "The First Six Years: A Report," Department of Chemistry, Princeton University, May 2008, 11 pages.
Chew, S. et al.: Photoluminescence and electroluminescence of a new blue-emitting homoleptic iridium complex. Applied Phys. Letters; vol. 88, pp. 093510-1-093510-3, 2006.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Sylvia Bettington et al. "Tris-Cyclometalated lridium(lll) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Christoph Ulbricht et al., "Synthesis and Characterization of Oxetane-Functionalized Phosphorescent 1r(lll)-Complexes", Macromol. Chem. Phys. 2009, 210, pp. 531-541.
Dan Wang et al., "Carbazole and arylamine functionalized iridium complexes for efficient electro-phosphorescent light-emitting diodes", Inorganica Chimica Acta 370 (2011) pp. 340-345.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Hoe-Joo Seo et al., "Blue phosphorescent iridium(lll) complexes containing carbazole-functionalized phenyl pyridine for organic light-emitting diodes: energy transfer from carbazolyl moieties to iridium(lll) cores", RSC Advances, 2011, vol. 1, pp. 755-757.
Jack W. Levell et al., "Carbazole/iridium dendrimer side-chain phosphorescent copolymers for efficient light emitting devices", New J. Chem., 2012, vol. 36, pp. 407-413.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Zhaowu Xu et al., "Synthesis and properties of iridium complexes based 1,3,4-oxadiazoles derivatives", Tetrahedron 64 (2008) pp. 1860-1867.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Matthew J. Jurow et al., "Understanding and predicting the orientation of heteroleptic phosphors in organic light-emitting materials", Nature Materials, vol. 15, Jan. 2016, pp. 85-93.
Baldo et al., "Very High-Efficiency Green Organic Light-Emitting Devices Based on Electrophosphorescence," Appl Phys Lett 75(3):4-6 (1999).
Brian W. D'Andrade et al. "Controlling Exciton Diffusion in Multilayer White Phosphorescent Organic Light Emitting Devices" Adv. Mater., vol. 14, No. 2. Jan. 16, 2002, pp. 147-151.
Chi et al. "Transition-metal phosphors with cyclometalating ligands: fundamentals and applications" Chemical Society Reviews, vol. 39 No. 2, Feb. 2010. pp. 638-655.
Eric Turner et al. "Cyclometalated Platinum Complexes with Luminescent Quantum Yields Approaching 100%" Inorq. Chem. 2013, vol. 52, pp. 7344-7351.
Nicholas R. Evans et al. "Triplet Energy Back Transfer in Conjugated Polymers with Pendant Phosphorescent Iridium Complexes" J. Am. Chem. Soc., vol. 128, 2006, pp. 6647-6656.
Rui Zhu et al. "Color tuning based on a six-membered chelated iridium (Ill) complex with aza-aromatic ligand" Chemistry Letters, vol. 34, No. 12, 2005 pp. 1668-1669.
Shih-Chun Lo et al. "High-Triplet-Energy Dendrons: Enhancing the Luminescence of Deep Blue Phosphorescent Indium(lll) Complexes" J. Am. Chem. Soc., vol. 131, 2009, pp. 16681-16688.
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Wong. Challenges in organometallic research—Great opportunity for solar cells and OLEDs. Journal of Organometallic Chemistry 2009, vol. 694, pp. 2644-2647.
Xiao-Chu Hang et al. "Highly Efficient Blue-Emitting Cyclometalated Platinum(ll) Complexes" Anqewandte Chem. International Edition, vol. 52, No. 26, Jun. 24 2013, pp. 6753-6756.
Supporting Information: Xiao-Chun Hang et al., "Highly Efficient Blue-Emitting Cyclometalated Platinum(II) Complexes by Judicious Molecular Design," Wiley-VCH 2013, 7 pages.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
V. Thamilarasan et al., "Green-emitting phosphorescent iridium(III) complex: Structural, photophysical and electrochemical properties," Inorganica Chimica Acta, vol. 408, 2013, pp. 240-245.
Rui Zhu et al., "Color tuning based on a six-membered chelated iridium (III) complex with aza-aromatic ligand," Chemistry Letters, vol. 34, No. 12, 2005, pp. 1668-1669.
Li, X. et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Chi-Ming Che et al. "Photophysical Properties and OLEO Applications of Phosphorescent Platinum(ll) Schiff Base Complexes," Chem. Eur. J., vol. 16, 2010, pp. 233-247.
U.S. Appl. No. 16/668,010, filed Oct. 30, 2019.
U.S. Appl. No. 16/739,480, filed Jan. 10, 2020.
U.S. Appl. No. 16/751,561, filed Jan. 24, 2020.
JP2009267244, English Translation from Epo, Nov 2009, 80 pages.
JP2010135689, English translation from Epo, dated Jun. 2010, 95 pp.
Satake et al., "Interconverlible Cationic and Neutral Pyridinylimidazole rp-Allylpalladium Complexes. Structural Assignment by 1H, 13C, and 15N Nmr and X-ray Diffraction", Organometallics, vol. 18, No. 24, 1999, pp. 5108-5111.
Baldo et al., "Highly Efficient Phosphorescent Emission from Organic Electroluminescent Devices," Nature, vol. 395, Sep. 10, 1998, pp. 151-154.
Baldo et al., "Very high-efficiency green organic light-emitting devices based on electrophosphorescence," Applied Physics Letters, vol. 75, No. 1, Jul. 5, 1999, pp. 4-6.
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Barry O'Brien et al.: White organic light emitting diodes using Pt-based red, green and blue phosphorescent dopants. Proc. SPIE, vol. 8829, pp. 1-6, Aug. 25, 2013.
Vanessa Wood et al., "Colloidal quantum dot light-emitting devices," Nano Reviews 1, Jul. 2010, pp. 5202.

(56) References Cited

OTHER PUBLICATIONS

Glauco Ponterini et al., "Comparison of Radiationless Decay Processes in Osmium and Platinum Porphyrins," J. Am. Chem. Soc., vol. 105, No. 14, 1983, pp. 4639-4645.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Jan Kalinowski et al., "Light-emitting devices based on organometallic platinum complexes as emitters," Coordination Chemistry Reviews, vol. 255, 2011, pp. 2401-2425.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Stephen R. Forrest, "The path to ubiquitous and low-cost organic electronic appliances on plastic," Nature, vol. 428, Apr. 29, 2004, pp. 911-918.
Xiaofan Ren et al., "Ultrahigh Energy Gap Hosts in Deep Blue Organic Electrophosphorescent Devices," Chem. Mater., vol. 16, 2004, pp. 4743-4747.
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Steven C. F. Kui et al., "Robust Phosphorescent Platinum(II) Complexes Containing Tetradentate O/\N/\C/\N Ligands: Excimeric Excited State and Application in Organic White-Light-Emitting Diodes," Chem. Eur. J., 2013, vol. 19, pp. 69-73.
Steven C. F. Kui et al., "Robust phosphorescent platinum(II) complexes with tetradentate O/\N/\C/\N ligands: high efficiency OLEDs with excellent efficiency stability," Chem. Commun., 2013, vol. 49, pp. 1497-1499.
Guijie Li et al., "Efficient and stable red organic light emitting devices from a tetradentate cyclometalated platinum complex," Organic Electronics, 2014, vol. 15 pp. 1862-1867.
Guijie Li et al., Efficient and Stable White Organic Light-Emitting Diodes Employing a Single Emitter, Adv. Mater., 2014, vol. 26, pp. 2931-2936.
Barry O'Brien et al., "High efficiency white organic light emitting diodes employing blue and red platinum emitters," Journal of Photonics for Energy, vol. 4, 2014, pp. 043597-1-043597-8.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Dorwald; "Side Reactions in Organic Synthesis: A Guide to Successful Synthesis Design," Chapter 1, 2005 Wiley-VCH Verlag GmbH & Co. KGaA, Wienheim, 32 pages.
Murakami; JP 2007324309, English machine translation from EPO, dated Dec. 13, 2007, 89 pages.
Zhi-Qiang Zhu et.al., "Harvesting All Electrogenerated Excitons through Metal Assisted Delayed Fluorescent Materials," Adv. Mater. 27 (2015) 2533-2537.
Zhi-Qiang Zhu et. al., "Efficient Cyclometalated Platinum(II) Complex with Superior Operational Stability," Adv. Mater. 29 (2017) 1605002, pp. 1-5.
D.F. O'Brien et al., "Improved energy transfer in electrophosphorescent devices," Appl. Phys. Lett., vol. 74, No. 3, Jan. 18, 1999, pp. 442-444.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Guijie Li et al., "Modifying Emission Spectral Bandwidth of Phosphorescent Platinum(II) Complexes Through Synthetic Control," Inorg. Chem. 2017, 56, 8244-8256.
Tyler Fleetham et al., "Efficient Red-Emitting Platinum Complex with Long Operational Stability," ACS Appl. Mater. Interfaces 2015, 7, 16240-16246.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
U.S. Appl. No. 62/323,383, filed Apr. 15, 2016, OLED With Doped Electron Blocking Layer, Jian Li.—U.S. Appl. No. 62/377,747, filed Aug. 22, 2016, OLED With Multi-Emissive Material Layer, Jian Li.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.

* cited by examiner

EMITTERS BASED ON OCTAHEDRAL METAL COMPLEXES

CROSS-REFERENCE TO RELATED APPLICATION

This application is a continuation of U.S. patent application Ser. No. 15/795,615 entitled "EMITTERS BASED ON OCTAHEDRAL METAL COMPLEXES" filed on Oct. 27, 2017, which is a continuation of U.S. patent application Ser. No. 14/937,136 entitled "EMITTERS BASED ON OCTAHEDRAL METAL COMPLEXES" filed on Nov. 10, 2015, now U.S. Pat. No. 9,865,825, which claims priority to U.S. Provisional Patent Application No. 62/077,443 entitled "EMITTERS BASED ON OCTAHEDRAL METAL COMPLEXES" filed on Nov. 10, 2014, the disclosures of which are incorporated by reference herein in their entirety.

TECHNICAL FIELD

The present disclosure relates to multidentate iridium, rhodium, and platinum complexes suitable for use as phosphorescent or delayed fluorescent and phosphorescent emitters in display and lighting applications.

BACKGROUND

Compounds capable of absorbing and/or emitting light can be ideally suited for use in a wide variety of optical and electroluminescent devices, including, for example, photo-absorbing devices such as solar- and photo-sensitive devices, organic light emitting diodes (OLEDs), photo-emitting devices, or devices capable of both photo-absorption and emission and as markers for bio-applications. Much research has been devoted to the discovery and optimization of organic and organometallic materials for using in optical and electroluminescent devices. Generally, research in this area aims to accomplish a number of goals, including improvements in absorption and emission efficiency and improvements in the stability of devices, as well as improvements in processing ability.

Despite significant advances in research devoted to optical and electro-optical materials (e.g., red and green phosphorescent organometallic materials are commercially available and have been used as phosphors in organic light emitting diodes (OLEDs), lighting and advanced displays), many currently available materials exhibit a number of disadvantages, including poor processing ability, inefficient emission or absorption, and less than ideal stability, among others.

Good blue emitters are particularly scarce, with one challenge being the stability of the blue devices. The choice of the host materials has an impact on the stability and the efficiency of the devices. The lowest triplet excited state energy of the blue phosphors is very high compared with that of the red and green phosphors, which means that the lowest triplet excited state energy of host materials for the blue devices should be even higher. Thus, one of the problems is that there are limited host materials to be used for the blue devices. Accordingly, a need exists for new materials which exhibit improved performance in optical emitting and absorbing applications.

SUMMARY

The present disclosure relates to iridium, rhodium and platinum complexes suitable for use as emitters in organic light emitting diodes (OLEDs), display and lighting applications.

Disclosed herein are complexes of Formula I, Formula II, Formula III, Formula IV, Formula V, Formula VI, Formula VII, Formula VIII, Formula IX, and Formula X:

Formula I

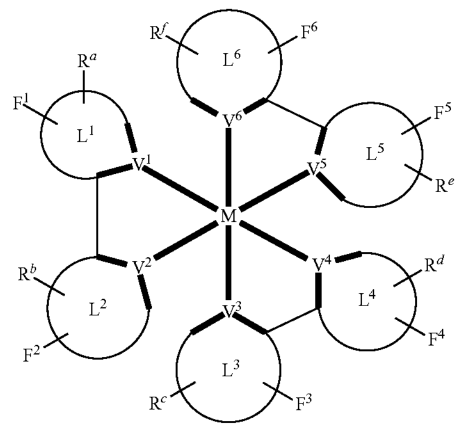

Formula II

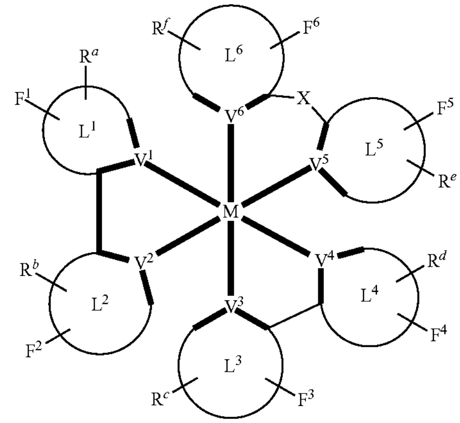

Formula III

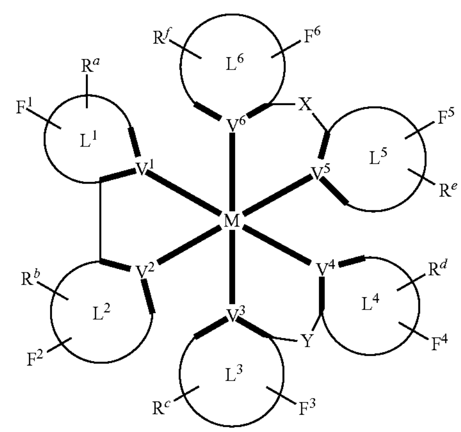

-continued

Formula IV

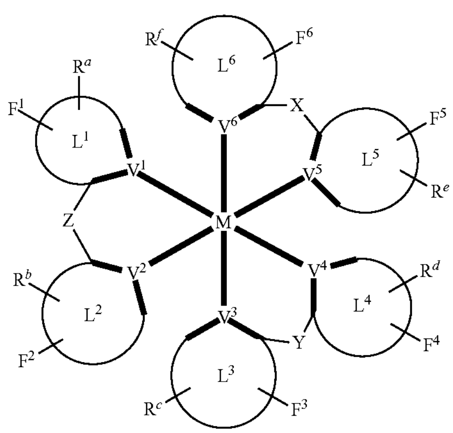

Formula V

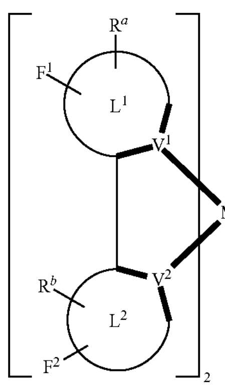

Formula VI

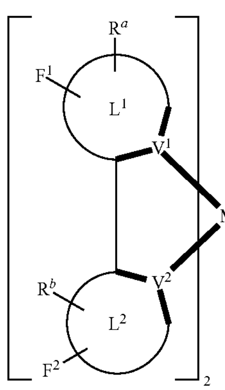

Formula VII

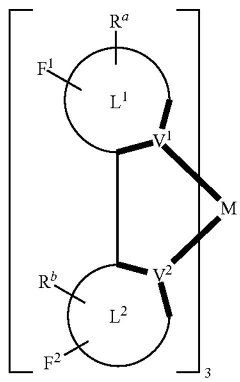

-continued

Formula VIII

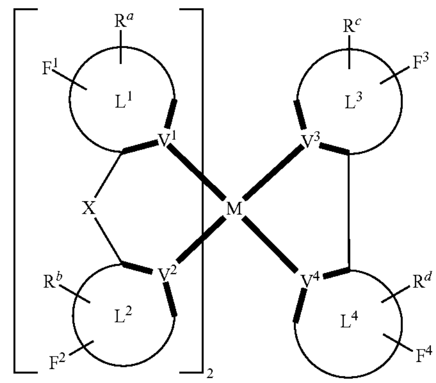

Formula IX

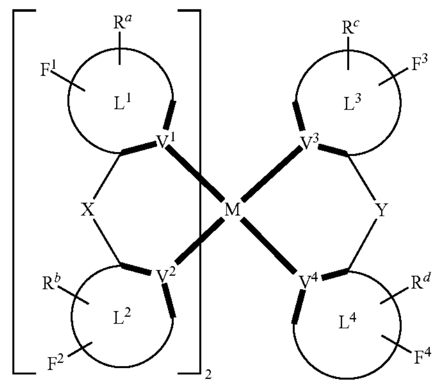

Formula X

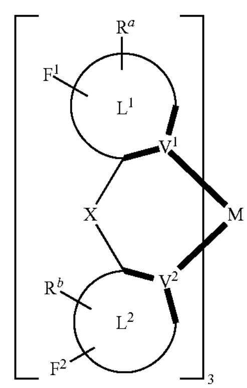

wherein:

M is Ir(III), Rh(III), or Pt(IV), each of $L^1$, $L^2$, $L^3$, $L^4$, $L^5$, and $L^6$ is independently a substituted or unsubstituted aryl, cycloalkyl, cycloalkenyl, heteroaryl, heterocyclyl, carbene, or N-heterocyclic carbene, dione, cyanogen, or phosphine, each of $V^1$, $V^2$, $V^3$, $V^4$, $V^5$, and $V^6$ is coordinated with M and is independently N, C, P, B, or Si, each of X, Y, and Z is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, each of $F^1$, $F^2$, $F^3$, $F^4$, $F^5$, and $F^6$ is independently present or absent, wherein at least one of $F^1$, $F^2$, $F^3$, $F^4$, $F^5$, and $F^6$ is present, and each $F^1$, $F^2$, $F^3$, $F^4$, $F^5$, and $F^6$ present is a fluorescent luminophore, each of $R^a$, $R^b$, $R^c$, $R^d$, $R^e$, and $R^f$ is independently present or absent, and if present each of $R^a$, $R^b$, $R^c$, $R^d$, $R^e$ and $R^f$ independently represents mono-, di-, or tri-substitutions, and wherein each of $R^a$, $R^b$, $R^c$, $R^d$, $R^e$ and $R^f$ present is independently deuterium, halogen, hydroxyl, thiol, nitro, cyano, nitrile, isonitrile, sulfinyl, mercapto, sulfo, carboxyl, hydrazino; substituted or unsubstituted aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of $R^1$, $R^2$, and $R^3$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

Also disclosed herein are compositions including one or more compounds disclosed herein.

Also disclosed herein are devices, such as OLEDs, including one or more compounds or compositions disclosed herein.

Figure 1:
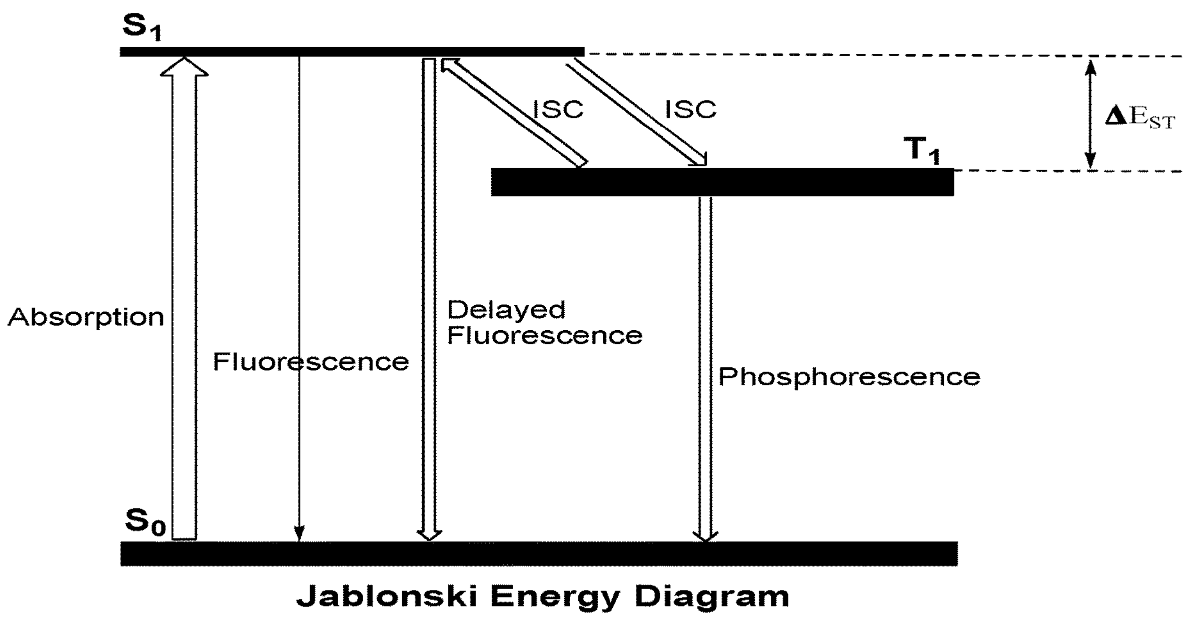
FIG. 1 depicts a Jablonski energy diagram for metal complexes disclosed herein.

Additional aspects will be set forth in the description which follows. Advantages will be realized and attained by means of the elements and combinations particularly pointed out in the claims. It is to be understood that both the foregoing general description and the following detailed description are exemplary and explanatory only and are not restrictive.

DETAILED DESCRIPTION

The present disclosure can be understood more readily by reference to the following detailed description and the Examples included therein.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing, example methods and materials are now described.

As used in the specification and the appended claims, the singular forms "a", "an", and "the" include plural referents unless the context clearly dictates otherwise. Thus, for example, reference to "a component" includes mixtures of two or more components.

As used herein, the terms "optional" and "optionally" mean that the subsequently described event or circumstance can or cannot occur, and that the description includes instances where said event or circumstance occurs and instances where it does not.

Disclosed are the components to be used to prepare the compositions described herein as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions. Thus, if there are a variety of additional steps that can be performed it is understood that each of these additional steps can be performed with any specific embodiment or combination of embodiments of the methods.

As referred to herein, a linking atom or group connects two atoms such as, for example, a N atom and a C atom. A linking group is in one aspect disclosed as X, Y, or Z herein. The linking atom can optionally, if valency permits, have other chemical moieties attached. For example, in one aspect, an oxygen would not have any other chemical groups attached as the valency is satisfied once it is bonded to two atoms (e.g., N or C atoms). In another aspect, when carbon is the linking atom, two additional chemical moieties such as amine, amide, thiol, aryl, heteroaryl, cycloalkyl, and heterocyclyl moieties may be attached to the carbon.

The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "A," "$A^1$," "$A^2$," "$A^3$," and "$A^4$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula $—(CH_2)_a—$, where "a" is an integer of from 2 to 500.

The terms "alkoxy" and "alkoxyl" as used herein to refer to an alkyl or cycloalkyl group bonded through an ether linkage; that is, an "alkoxy" group can be defined as $—OA^1$ where $A^1$ is alkyl or cycloalkyl as defined above. "Alkoxy" also includes polymers of alkoxy groups as just described; that is, an alkoxy can be a polyether such as $—OA^1\text{-}OA^2$ or $—OA^1\text{-}(OA^2)_a\text{-}OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C{=}C(A^3A^4)$ are intended to include both the E and Z isomers. This can be presumed in structural formulae herein wherein an asymmetric alkene is present, or it can be explicitly indicated by the bond symbol C═C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C═C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C═O.

The terms "amine" or "amino" as used herein are represented by the formula $—NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula $—N(\text{-alkyl})_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula $—OC(O)A^1$ or $—C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C\text{-}A^2\text{-}C(O)O)_a—$ or $-(A^1O(O)C\text{-}A^2\text{-}OC(O))_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O\text{-}A^2O)_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "polymeric" includes polyalkylene, polyether, polyester, and other groups with repeating units, such as, but not limited to $—(CH_2O)_n—CH_3$, $—(CH_2CH_2O)_n—CH_3$, $—[CH_2CH(CH_3)]_n—CH_3$, $—[CH_2CH(COOCH_3)]_n—CH_3$, $—[CH_2CH(COOCH_2CH_3)]_n—CH_3$, and $—[CH_2CH(COO^tBu)]_n—CH_3$, where n is an integer (e.g., n>1 or n>2).

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $—N_3$.

The term "nitro" as used herein is represented by the formula $—NO_2$.

The term "nitrile" as used herein is represented by the formula —CN.

The term "silyl" as used herein is represented by the formula —$SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas —$S(O)A^1$, —$S(O)_2A^1$, —$OS(O)_2A^1$, or —$OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S═O. The term "sulfonyl" is used herein to refer to the sulfo-oxo group represented by the formula —$S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R," "$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this invention are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

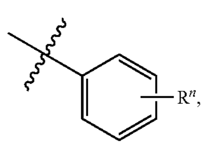

which is understood to be equivalent to a formula:

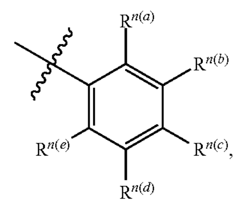

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

1. Compounds

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Excitons decay from singlet excited states to ground state to yield prompt luminescence, which is fluorescence. Excitons decay from triplet excited states to ground state to generate luminescence, which is phosphorescence. Because the strong spin-orbit coupling of the heavy metal atom enhances intersystem crossing (ISC) very efficiently between singlet and triplet excited states, phosphorescent metal complexes, such as platinum complexes, have demonstrated their potential to harvest both the singlet and triplet excitons to achieve 100% internal quantum efficiency. Thus phosphorescent metal complexes are good dopants in the emissive layer of organic light emitting devices (OLEDs). Much achievement has been made in the past decade to lead to the lucrative commercialization of the technology, for example, OLEDs have been used in advanced displays in smart phones, televisions, and digital cameras.

However, to date, blue electroluminescent devices remain the most challenging area of this technology, due at least in part to instability of the blue devices. It is generally understood that the choice of host materials is a factor in the stability of the blue devices. But the lowest triplet excited state ($T_1$) energy of the blue phosphors is high, which generally means that the lowest triplet excited state ($T_1$) energy of host materials for the blue devices should be even higher. This leads to difficulty in the development of the host materials for the blue devices.

This disclosure provides a materials design route by introducing fluorescent luminophore(s) to the ligand of the metal complexes. Thereby chemical structures of the fluorescent luminophores and the ligands may be modified, and also the metal may be changed to adjust the singlet states energy and the triplet states energy of the metal complexes, which all may affect the optical properties of the complexes, for example, emission and absorption spectra. Accordingly, the energy gap ($\Delta E_{ST}$) between the lowest triplet excited state ($T_1$) and the lowest singlet excited state ($S_1$) may be also adjusted. When the $\Delta E_{ST}$ becomes small enough, intersystem crossing (ISC) from the lowest triplet excited state ($T_1$) to the lowest singlet excited state ($S_1$) may occur efficiently, such that the excitons undergo non-radiative relaxation via ISC from $T_1$ to $S_1$, then relax from $S_1$ to $S_0$, which leads to delayed fluorescence, as depicted in the Jablonski Energy Diagram in FIG. 1. Through this pathway, higher energy excitons may be obtained from lower excited state (from $T_1 \rightarrow S_1$), which means more host materials may be available for the dopants. This approach offers a solution to problems associated with blue devices.

The metal complexes described herein can be tailored or tuned to a specific application that requires a particular emission or absorption characteristic. The optical properties of the metal complexes in this disclosure can be tuned by varying the structure of the ligand surrounding the metal center or varying the structure of fluorescent luminophore(s) on the ligands. For example, the metal complexes having a ligand with electron donating substituents or electron withdrawing substituents can generally exhibit different optical properties, including emission and absorption spectra. The color of the metal complexes can be tuned by modifying the conjugated groups on the fluorescent luminophores and ligands.

The emission of such complexes can be tuned (e.g., from the ultraviolet to near-infrared), by, for example, modifying the ligand or fluorescent luminophore structure. A fluorescent luminophore is a group of atoms in an organic molecule, which can absorb energy to generate singlet excited state(s), and the singlet exciton(s) produced decay rapidly to yield prompt luminescence. In another aspect, the complexes provide emission over a majority of the visible spectrum. In one example, the complexes described herein emit light over a range of from about 400 nm to about 700 nm. In another aspect, the complexes have improved stability and efficiency over traditional emission complexes. In yet another aspect, the complexes are suitable for luminescent labels in, for example, bio-applications, anti-cancer agents, emitters in organic light emitting diodes (OLED), or a combination thereof. In another aspect, the complexes described herein are suitable for light emitting devices, such as, for example, compact fluorescent lamps (CFL), light emitting diodes (LED), incandescent lamps, and combinations thereof.

Disclosed herein are compounds or compound complexes comprising iridium, rhodium and platinum compounds. The terms compound, compound complex, and complex are used interchangeably herein. In one aspect, the compounds disclosed herein have a neutral charge.

The compounds disclosed herein can exhibit desirable properties and have emission and/or absorption spectra that can be tuned via the selection of appropriate ligands. In another aspect, any one or more of the compounds, structures, or portions thereof, specifically recited herein may be excluded.

The compounds disclosed herein are suited for use in a wide variety of optical and electro-optical devices, including, but not limited to, photo-absorbing devices such as solar- and photo-sensitive devices, organic light emitting diodes (OLEDs), photo-emitting devices, or devices capable of both photo-absorption and emission and as markers for bio-applications.

As briefly described above, the disclosed compounds are iridium, rhodium, and platinum complexes. In one aspect, the compounds disclosed herein can be used as host materials for OLED applications, such as full color displays.

The compounds disclosed herein are useful in a variety of applications. As light emitting materials, the compounds can be useful in organic light emitting diodes (OLEDs), luminescent devices and displays, and other light emitting devices.

In another aspect, the compounds can provide improved efficiency and/or operational lifetimes in lighting devices, such as, for example, organic light emitting devices, as compared to conventional materials.

Compounds described herein can be made using a variety of methods, including, but not limited to those recited in the examples.

In one aspect, the compounds disclosed herein are delayed fluorescent emitters. In another aspect, the compounds disclosed herein are phosphorescent emitters. In yet another aspect, the compounds disclosed herein are delayed fluorescent emitters and phosphorescent emitters.

Disclosed herein are complexes of Formula I, Formula II, Formula III, Formula IV, Formula V, Formula VI, Formula VII, Formula VIII, Formula IX, and Formula X:

Formula I

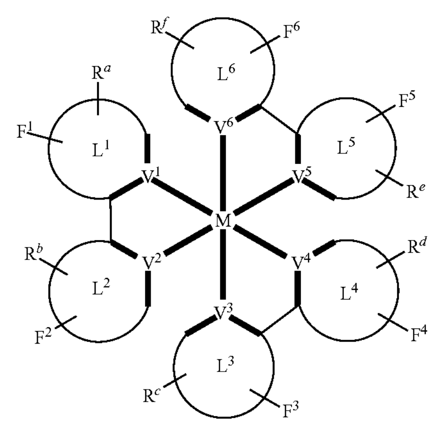

Formula II

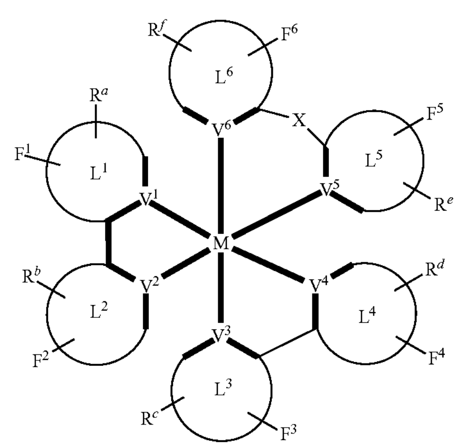

-continued

Formula III

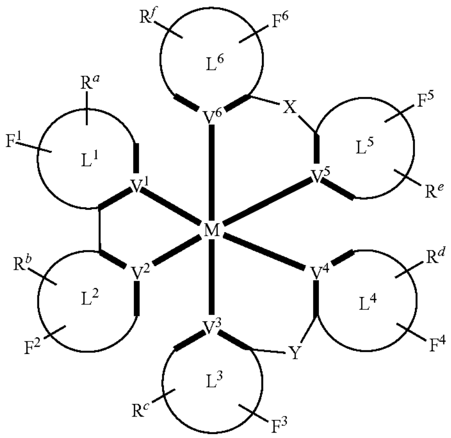

Formula IV

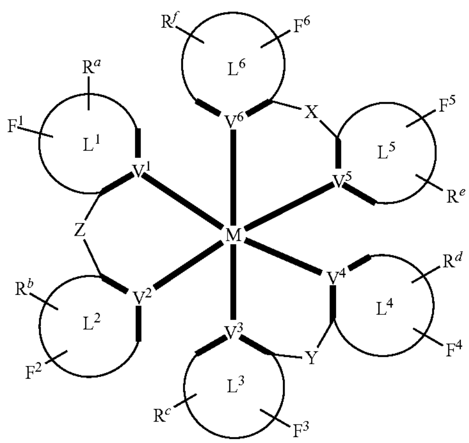

Formula V

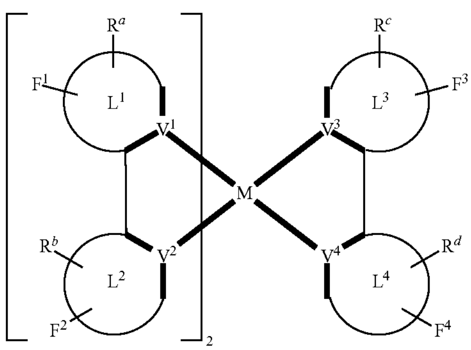

Formula VI

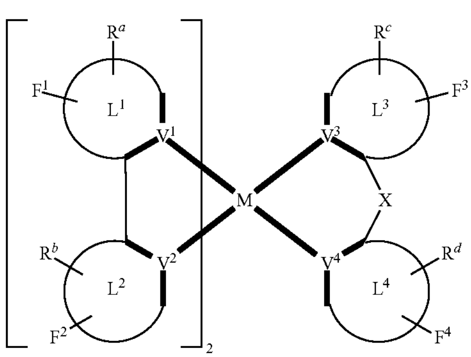

-continued

Formula VII

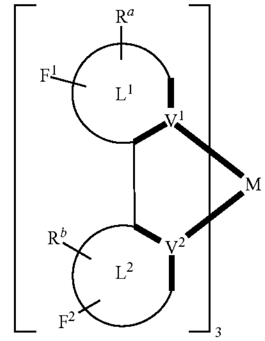

Formula VIII

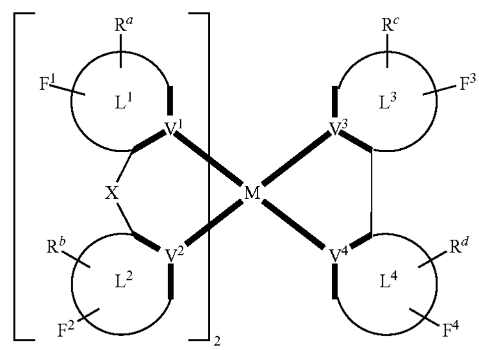

Formula IX

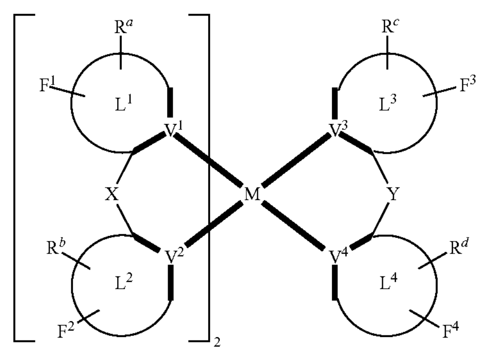

Formula X

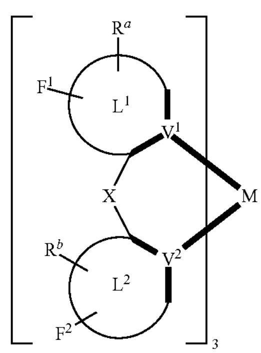

wherein:

M is Ir(III), Rh(III), or Pt(IV), each of $L^1$, $L^2$, $L^3$, $L^4$, $L^5$ and $L^6$ is independently a substituted or unsubstituted aryl, cycloalkyl, cycloalkenyl, heteroaryl, heterocyclyl, carbene, or N-heterocyclic carbene, dione, cyanogen, or phosphine, each of $V^1$, $V^2$, $V^3$, $V^4$, $V^5$, and $V^6$ is coordinated with M and is independently N, C, P, B, or Si, each of X, Y, and Z is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, each of $F^1$, $F^2$, $F^3$, $F^4$, $F^5$, and $F^6$ is independently present or absent, wherein at least one of $F^1$, $F^2$, $F^3$, $F^4$, $F^5$, and $F^6$ is present, and each $F^1$, $F^2$, $F^3$, $F^4$, $F^5$, and $F^6$ present is a fluorescent luminophore, each of $R^a$, $R^b$, $R^c$, $R^d$, $R^e$, and $R^f$ is independently present or absent, and if present each of $R^a$, $R^b$, $R^c$, $R^d$, $R^e$, and $R^f$ independently represents mono-, di-, or tri-substitutions, and wherein each of $R^a$, $R^b$, $R^c$, $R^d$, $R^e$ and $R^f$ present is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of $R^1$, $R^2$, and $R^3$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

For Formulas I-X as described herein, groups may be defined as described below.

A. M Groups

In one aspect, M is Ir(III).

In another aspect, M is Rh(III).

In yet another aspect, M is Pt(IV).

B. V Groups

In one aspect, each of $V^1$, $V^2$, $V^3$, $V^4$, $V^5$, and $V^6$ is coordinated with M and is independently N, C, P, B, or Si.

In another aspect, each of $V^1$, $V^2$, $V^3$, $V^4$, $V^5$, and $V^6$ is independently N or C.

In yet another aspect, each of $V^1$, $V^2$, $V^3$, $V^4$, $V^5$, and $V^6$ is independently P or B.

In yet another aspect, each of $V^1$, $V^2$, $V^3$, $V^4$, $V^5$, and $V^6$ is Si.

C. Linking Groups

In one aspect, each of X, Y, and Z is independently present or absent, and each X, Y, and Z present is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$.

In another aspect, each of X, Y, and Z, if present, is independently O, S, or $CH_2$.

D. L Groups

In one aspect, $L^1$ is aryl, cycloalkyl, cycloalkenyl, heteroaryl, heterocyclyl, carbene, or N-heterocyclic carbene. In one example, $L^1$ is aryl, cycloalkyl, cycloalkenyl, heteroaryl, or N-heterocyclyl. In another example, $L^1$ is aryl or heteroaryl. In yet another example, $L^1$ is aryl.

In one aspect, $L^2$ is aryl, cycloalkyl, cycloalkenyl, heteroaryl, heterocyclyl, carbene, or N-heterocyclic carbene. In one example, $L^2$ is aryl, cycloalkyl, cycloalkenyl, heteroaryl, or N-heterocyclyl. In another example, $L^2$ is aryl or heteroaryl. In yet another example, $L^2$ is aryl.

In one aspect, $L^3$ is aryl, cycloalkyl, cycloalkenyl, heteroaryl, heterocyclyl, carbene, or N-heterocyclic carbene. In one example, $L^3$ is aryl, cycloalkyl, cycloalkenyl, heteroaryl, or heterocyclyl. In another example, $L^3$ is aryl or heteroaryl. In yet another example, $L^3$ is aryl.

In one aspect, $L^4$ is aryl, cycloalkyl, cycloalkenyl, heteroaryl, heterocyclyl, carbene, or N-heterocyclic carbene. In one example, $L^4$ is aryl, cycloalkyl, cycloalkenyl, heteroaryl, or heterocyclyl. In another example, $L^4$ is aryl or heteroaryl. In yet another example, $L^4$ is aryl.

In one aspect, $L^5$ is aryl, cycloalkyl, cycloalkenyl, heteroaryl, heterocyclyl, carbene, or N-heterocyclic carbene. In one example, $L^5$ is aryl, cycloalkyl, cycloalkenyl, heteroaryl, or heterocyclyl. In another example, $L^5$ is aryl or heteroaryl. In yet another example, $L^5$ is aryl.

In one aspect, $L^6$ is aryl, cycloalkyl, cycloalkenyl, heteroaryl, heterocyclyl, carbene, or N-heterocyclic carbene. In one example, $L^6$ is aryl, cycloalkyl, cycloalkenyl, heteroaryl, or heterocyclyl. In another example, $L^6$ is aryl or heteroaryl. In yet another example, $L^6$ is heteroaryl. In yet another example, $L^6$ is heterocyclyl.

It is understood that $V^n$ can be a part of $L^n$, where n=1 to 6, and is intended to be included the descriptions of $L^n$ above.

In one aspect, for any of the formulas disclosed herein, each of

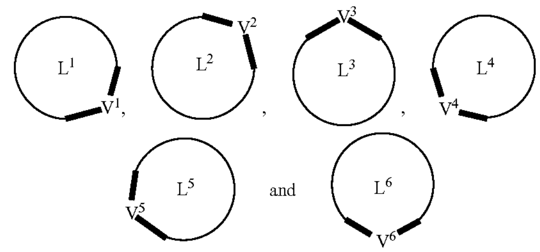

is independently one following structures:

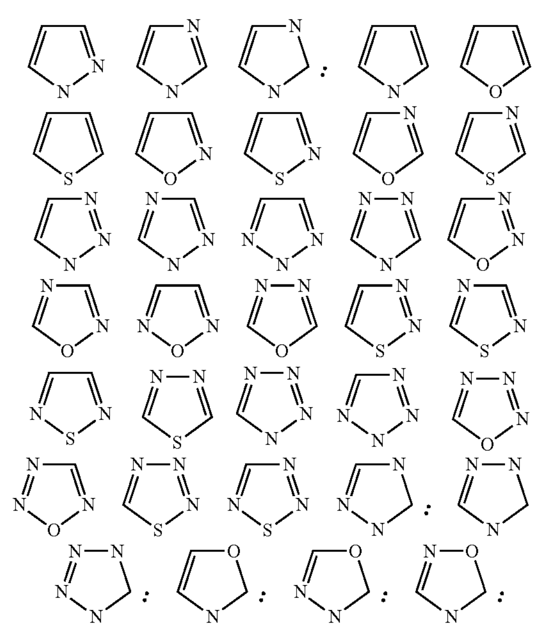

-continued
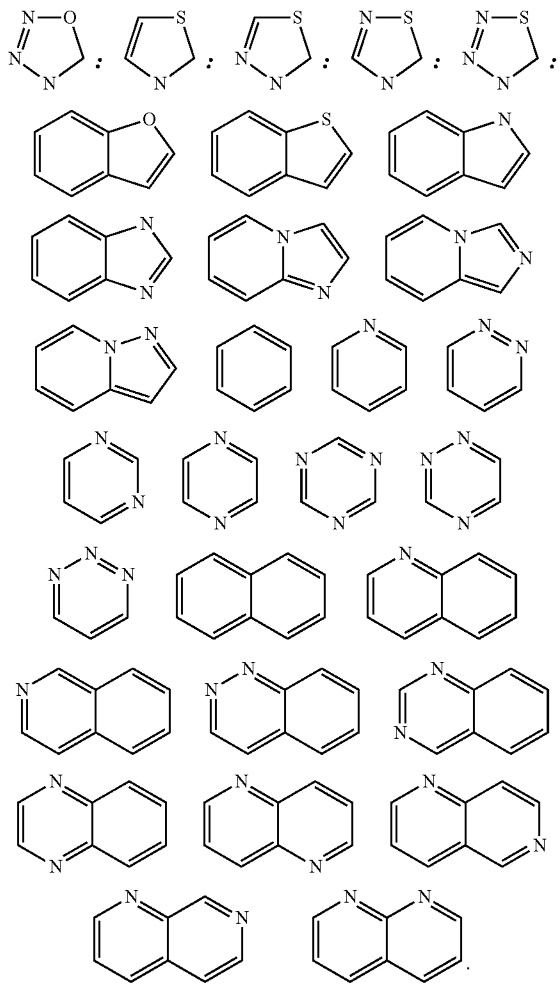
It is understood that one or more of $R^a$, $R^b$, $R^c$, $R^d$, $R^e$, and $R^f$ as described herein can be bonded to one of the above structures as permitted by valency.
In one aspect,
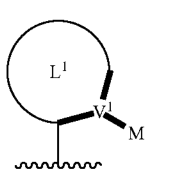
has the structure
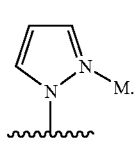
In one aspect, for any of the formulas illustrated in this disclosure, each of
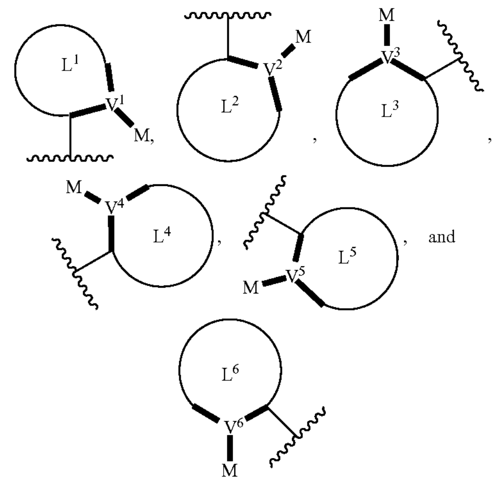
is independently one of following structures:
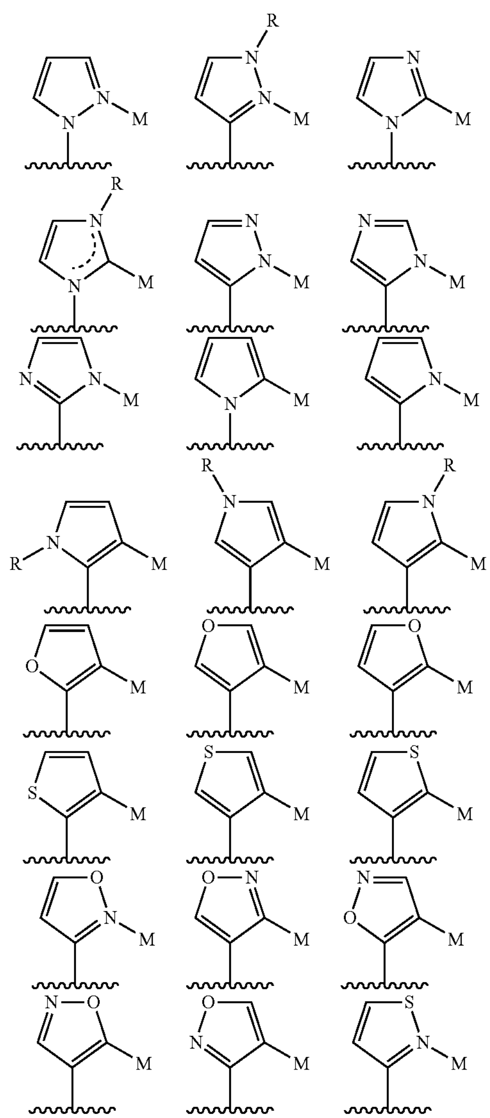

-continued
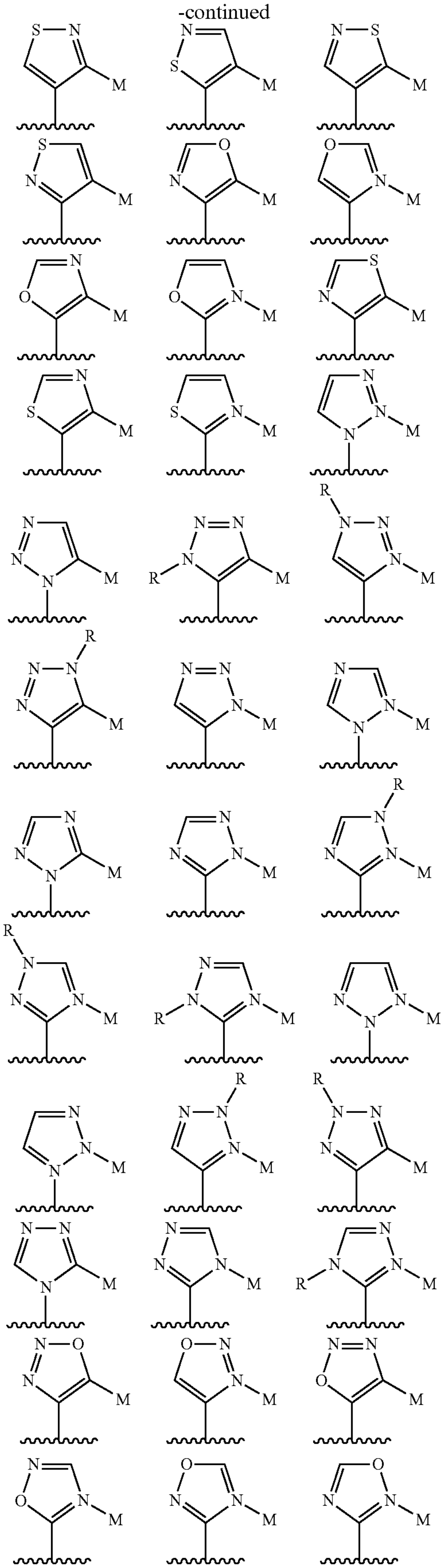
-continued
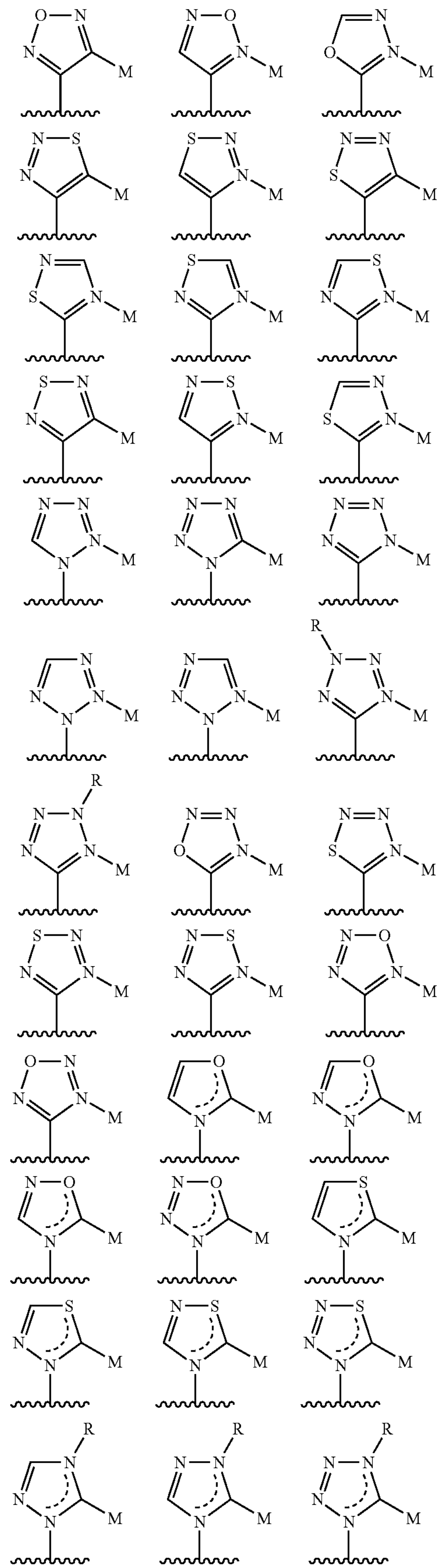

-continued

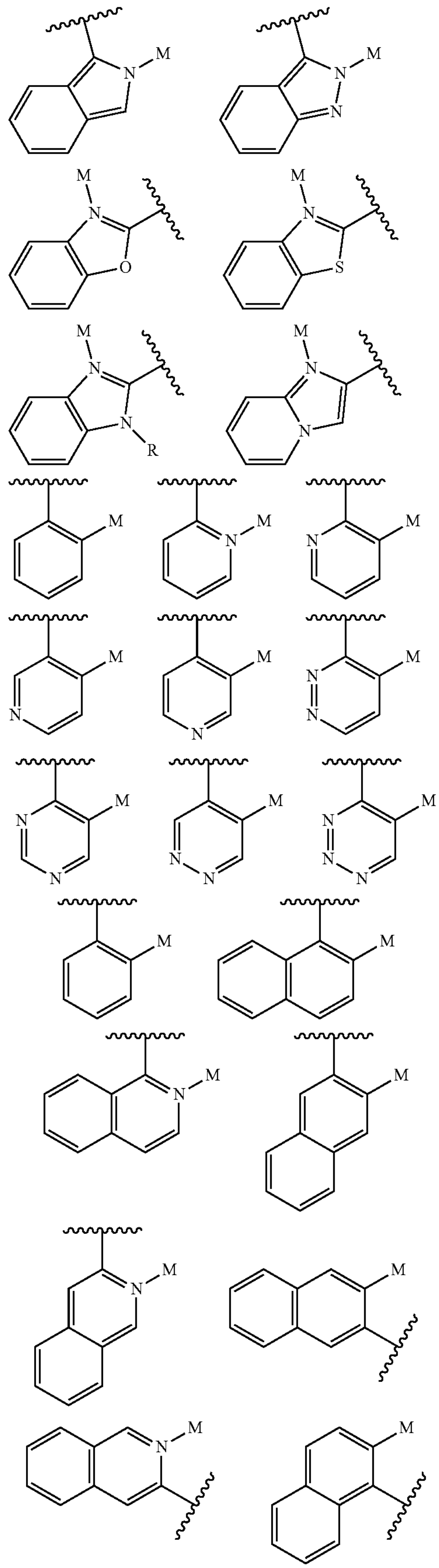

-continued

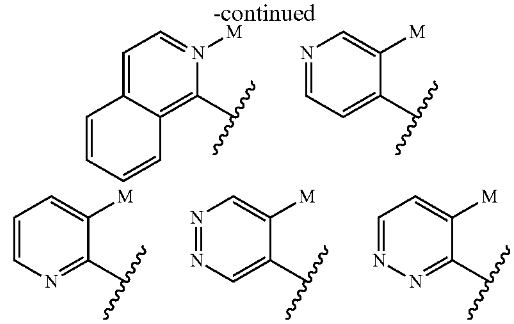

wherein R is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

E. Fluorescent Luminophore Groups

In one aspect, at least one of $F^1$, $F^2$, $F^3$, $F^4$, $F^5$, and $F^6$ is present. In one example, $F^1$ is present, and $F^2$, $F^3$, $F^4$, $F^5$, and $F^6$ are absent.

In one aspect, each of $F^1$, $F^2$, $F^3$, $F^4$, $F^5$, and $F^6$ present is independently selected from aromatic hydrocarbons and their derivatives, polyphenyl hydrocarbons, hydrocarbons with condensed aromatic nuclei, naphthalene, anthracene, phenanthrene, chrysene, pyrene, triphenylene, perylene, acenapthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, arylethylene, arylacetylene and their derivatives, diarylethylenes, diarylpolyenes, diaryl-substituted vinylbenzenes, distyrylbenzenes, trivinylbenzenes, arylacetylenes, stilbene, and functional substitution products of stilbene.

In another aspect, each $F^1$, $F^2$, $F^3$, $F^4$, $F^5$, and $F^6$ present is independently selected from substituted or unsubstituted five-, six- or seven-membered heterocyclic compounds, furan, thiophene, pyrrole and their derivatives, aryl-substituted oxazoles, 1,3,4-oxadiazoles, 1,3,4-thiadiazoles, aryl-substituted 2-pyrazolines and pyrazoles, benzazoles, 2H-benzotriazole and its substitution products, heterocycles with one, two or three nitrogen atoms, oxygen-containing heterocycles, coumarins and their derivatives, miscellaneous dyes, acridine dyes, xanthene dyes, oxazines, and thiazines.

In yet another aspect, for any of the formulas disclosed herein, each $F^1$, $F^2$, $F^3$, $F^4$, $F^5$, and $F^6$ present may independently have one of the following structures:

1. Aromatic Hydrocarbons and Their Derivatives

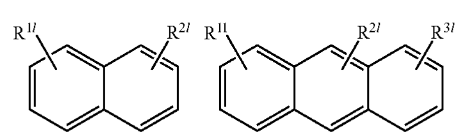

-continued
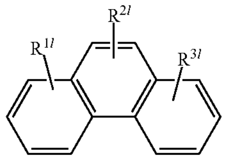
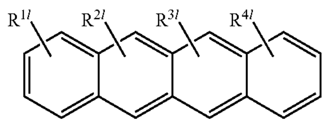
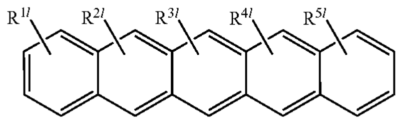
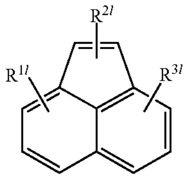
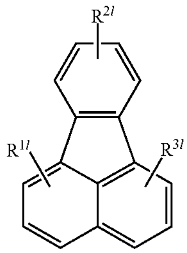
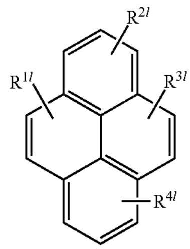
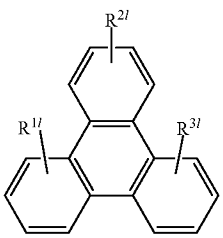
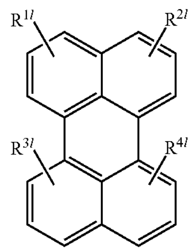
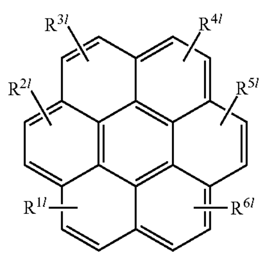
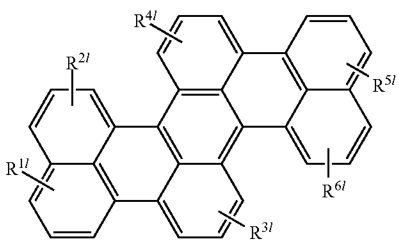
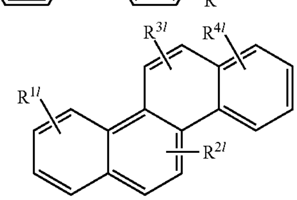
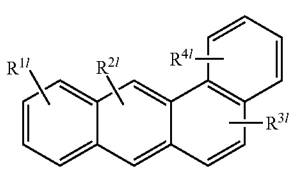
-continued
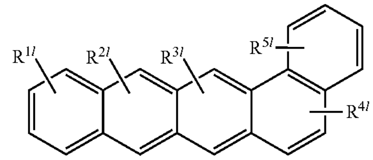
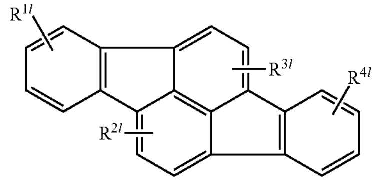
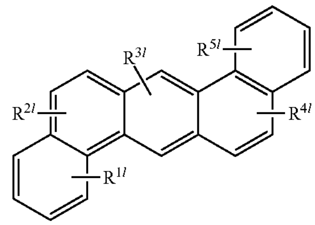
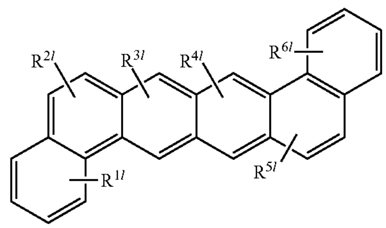
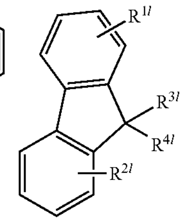
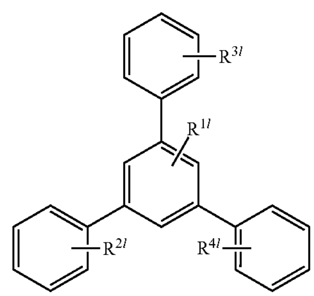
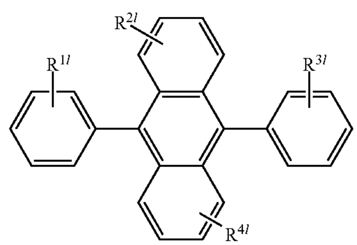
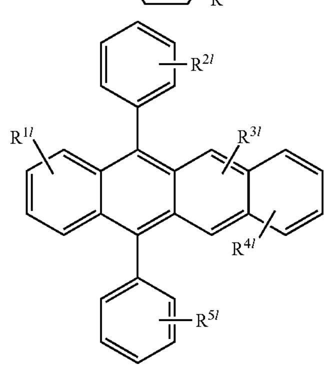

-continued
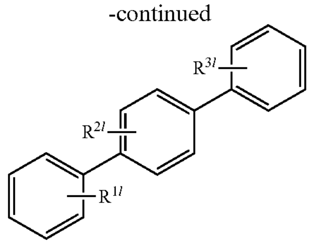
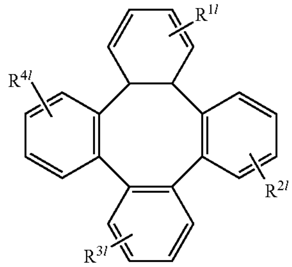
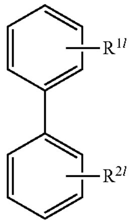
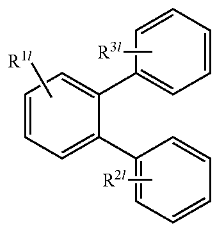
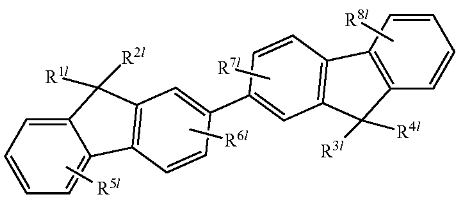
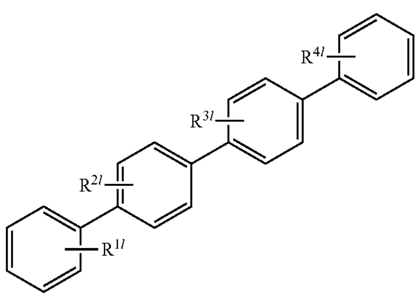
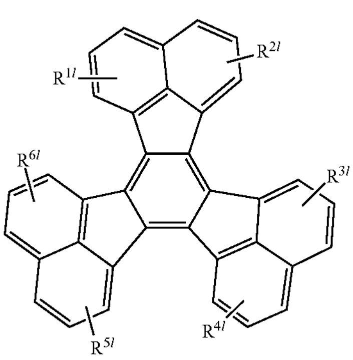
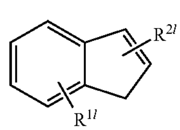
-continued
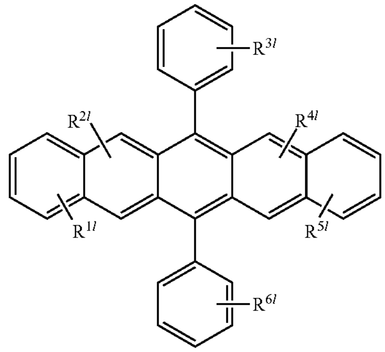
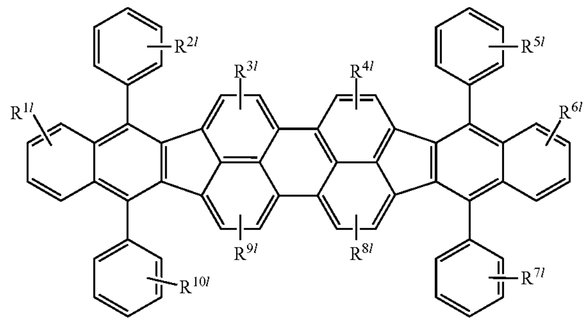
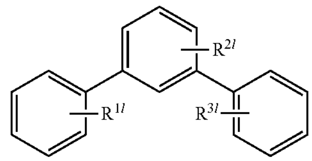
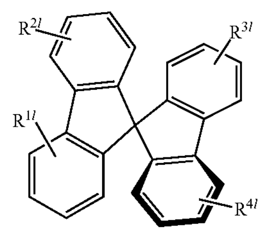
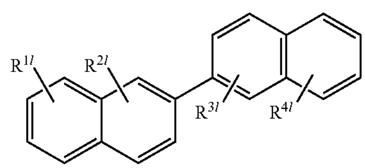
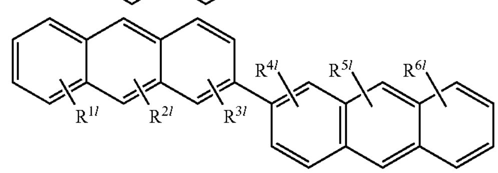
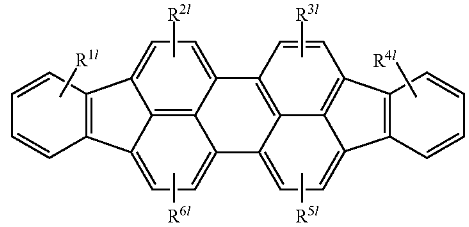
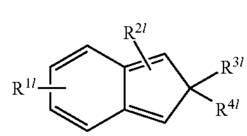

-continued
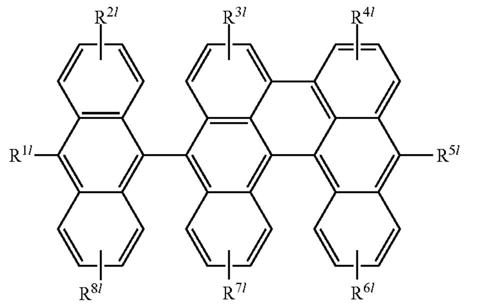
2. Arylethylene, Arylacetylene and Their Derivatives
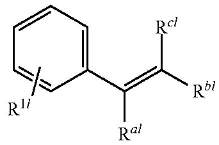
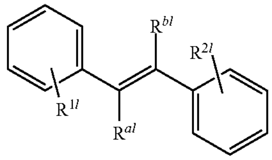
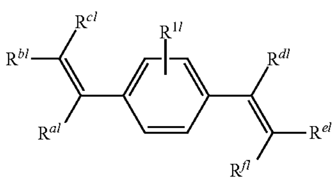
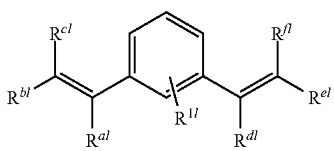
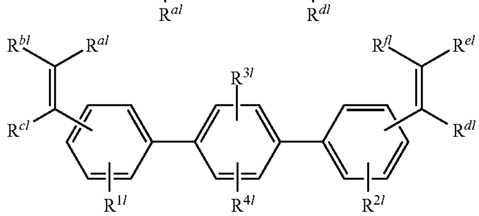
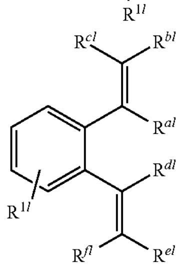
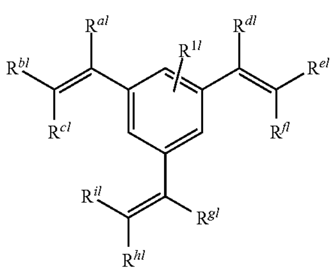
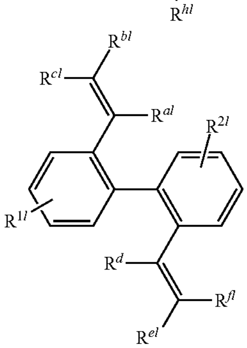
-continued
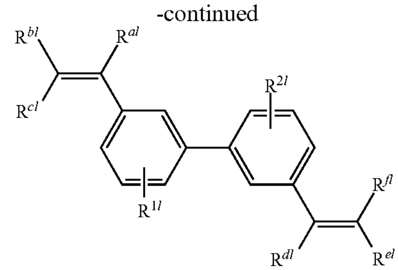
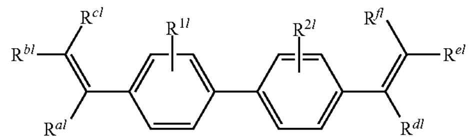
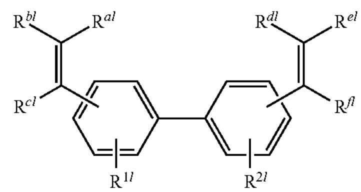
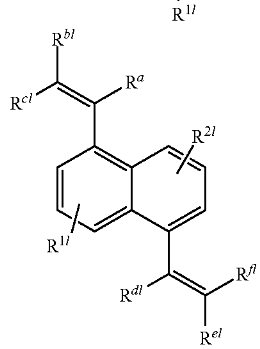
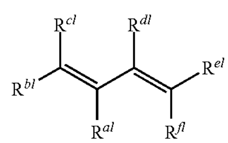
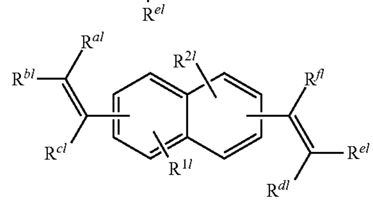
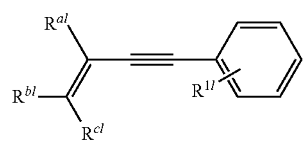
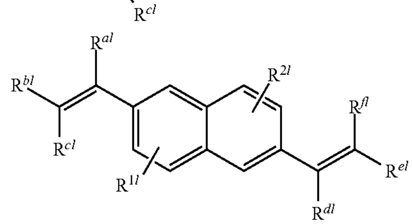
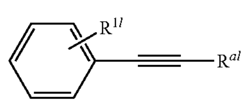
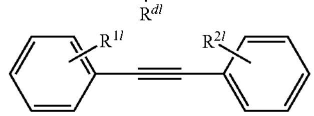
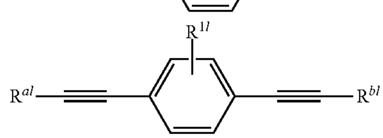
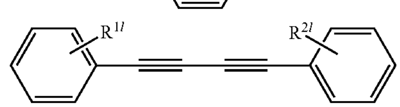

-continued
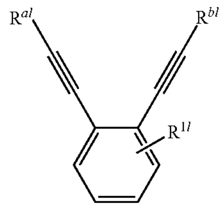
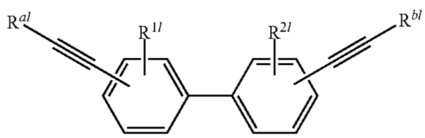
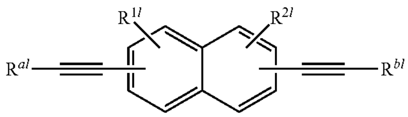
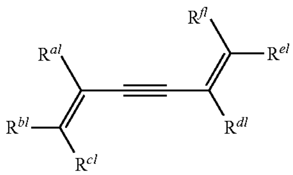
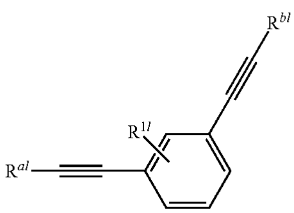
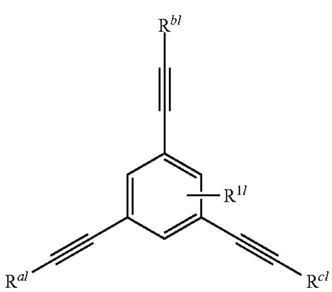
where each of $R^{al}$, $R^{bl}$, $R^{cl}$, $R^{dl}$, $R^{el}$, $R^{fl}$, $R^{gl}$, $R^{hl}$ and $R^{il}$ can be one of the following structure:
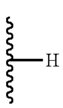
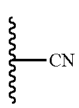
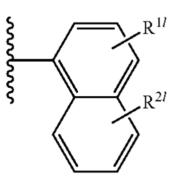
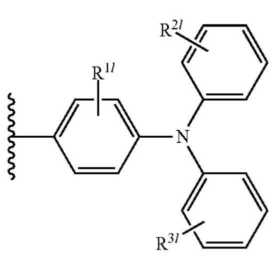
-continued
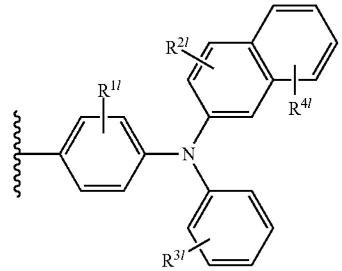
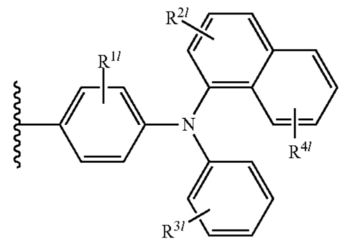
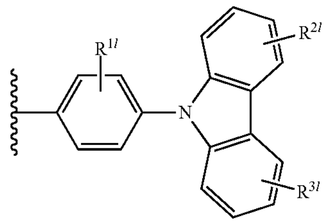
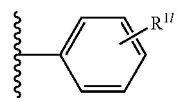
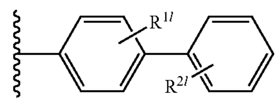
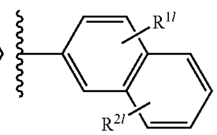
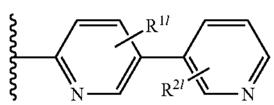
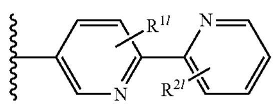
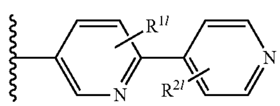
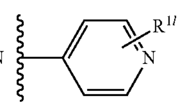
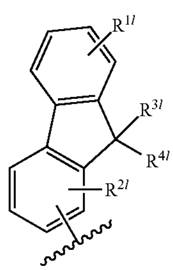
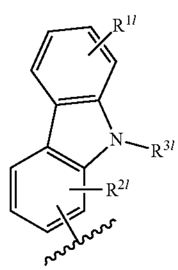
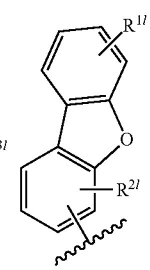
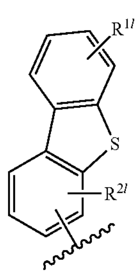
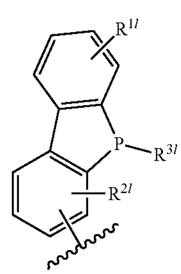
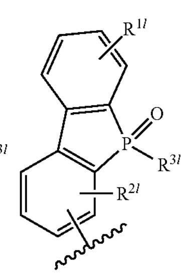

-continued
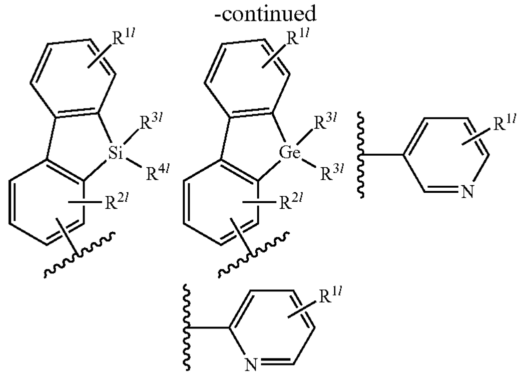
3. Heterocyclic Compounds and Their Derivatives
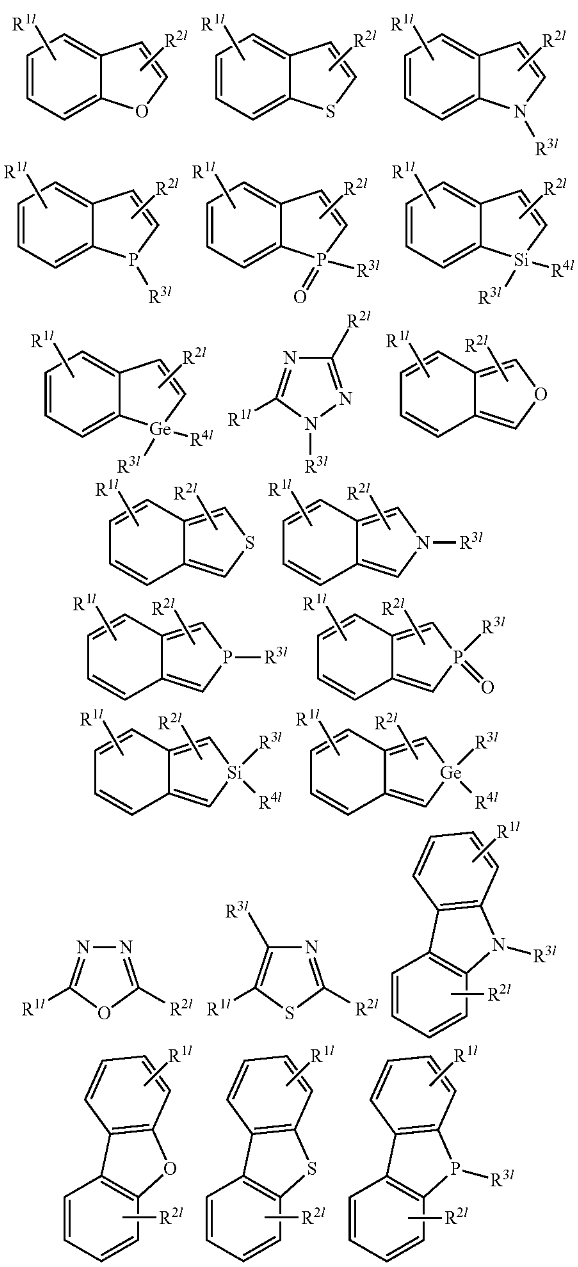
-continued
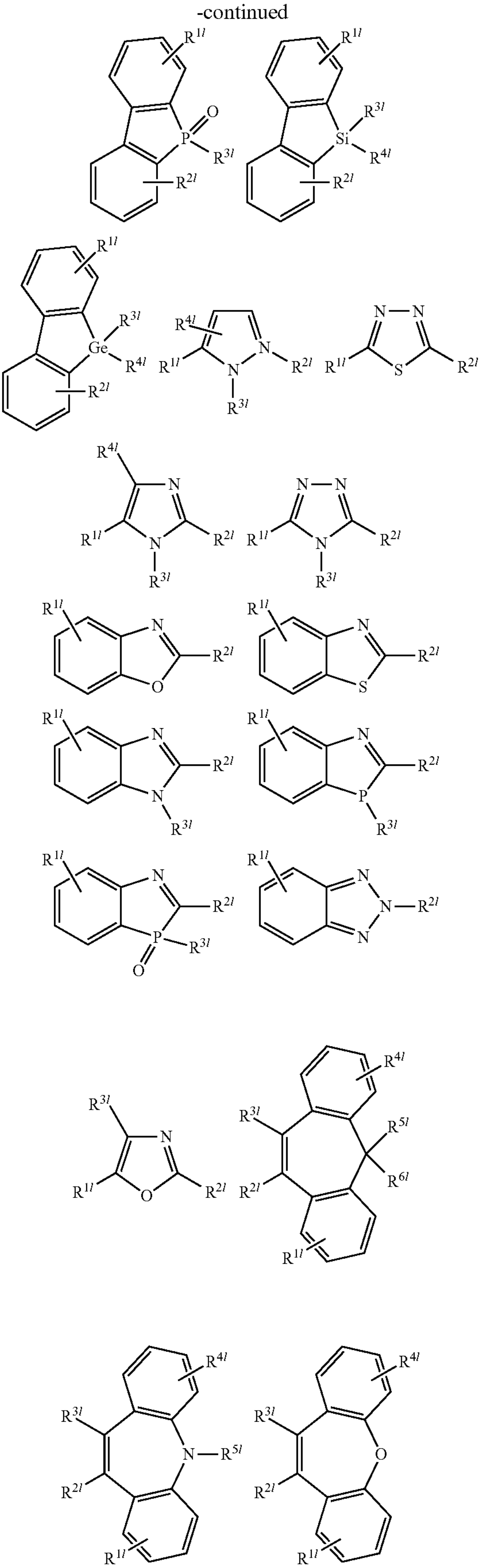

-continued
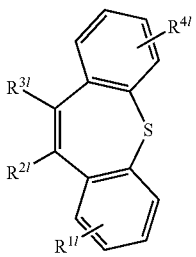
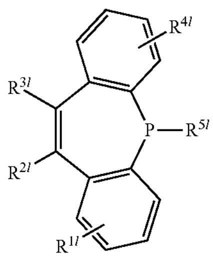
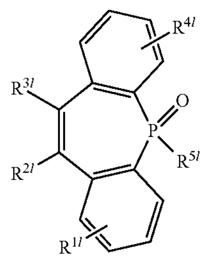
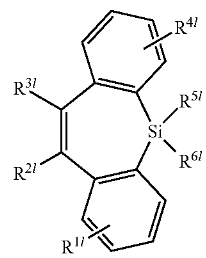
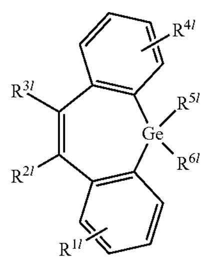
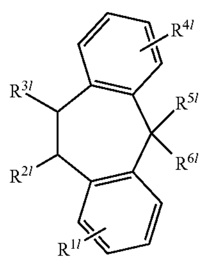
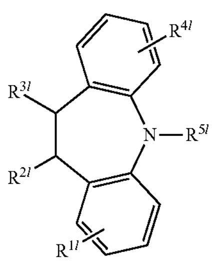
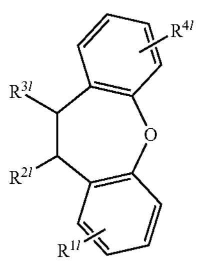
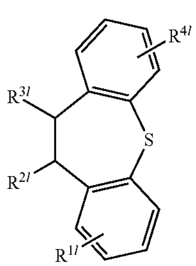
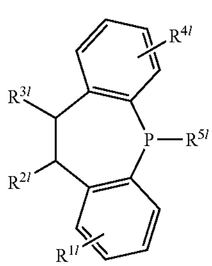
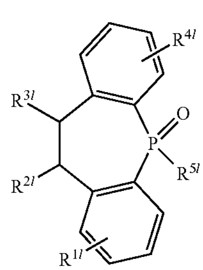
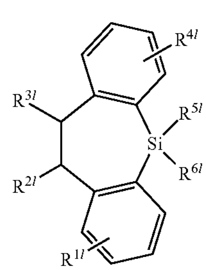
-continued
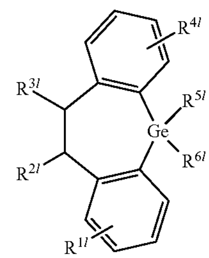
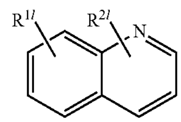
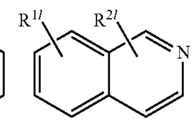
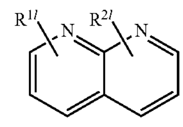
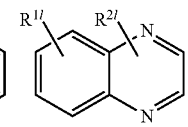
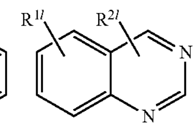
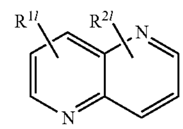
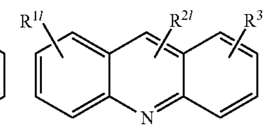
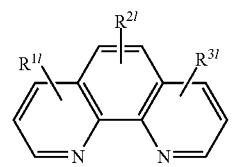
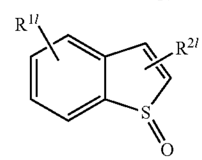
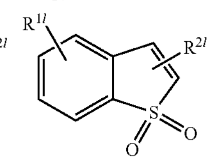
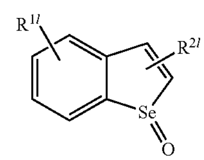
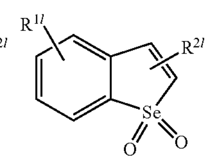
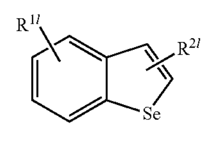
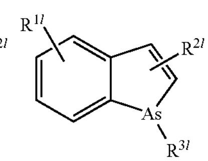
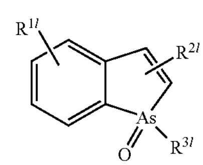
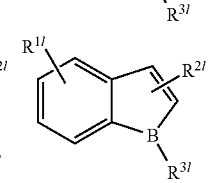
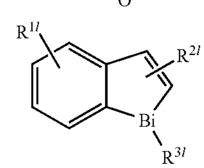
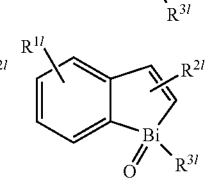
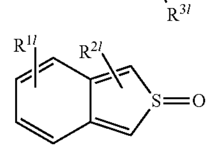
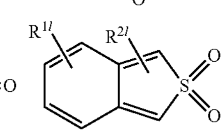
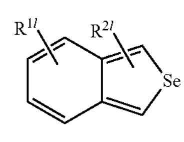
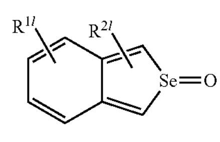

-continued
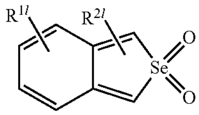
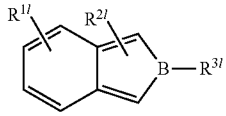
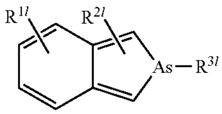
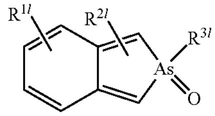
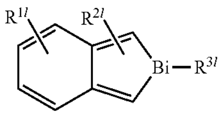
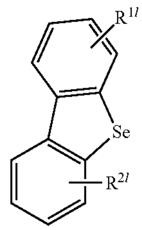
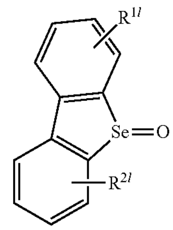
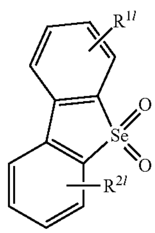
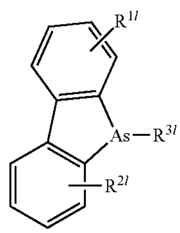
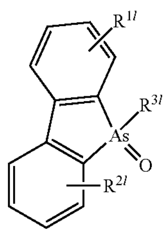
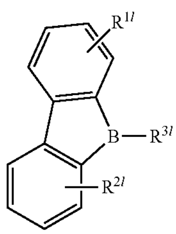
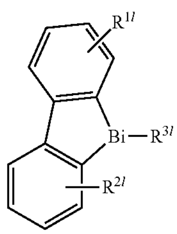
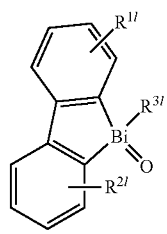
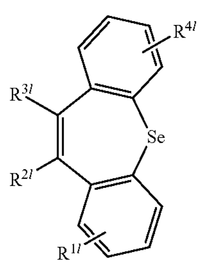
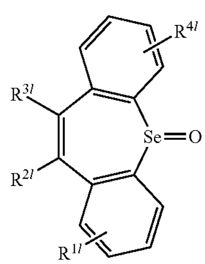
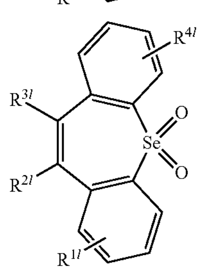
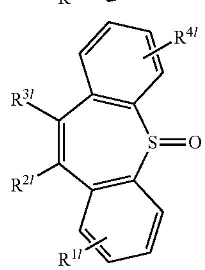
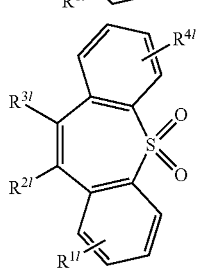
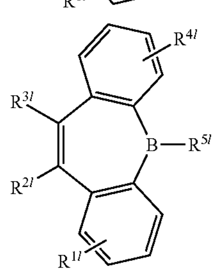
-continued
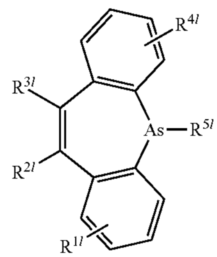
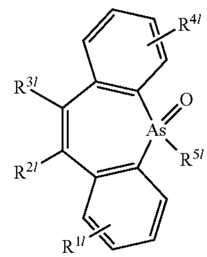
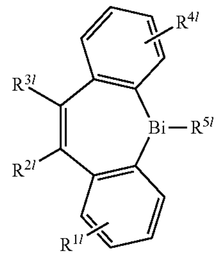
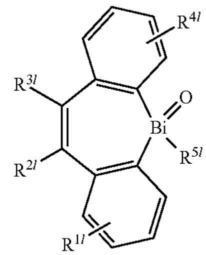
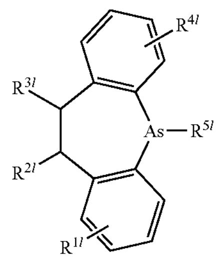
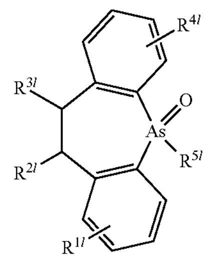
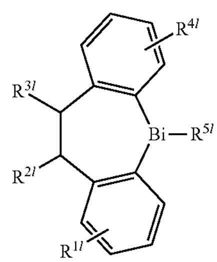
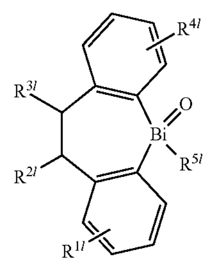
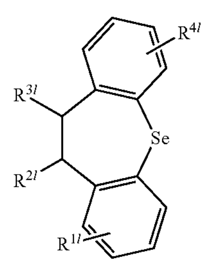
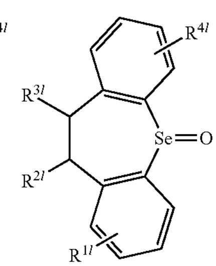
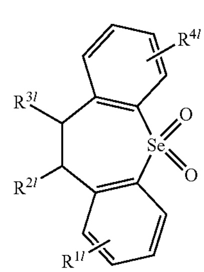
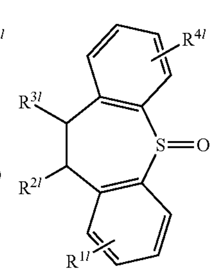

-continued
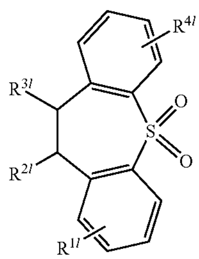
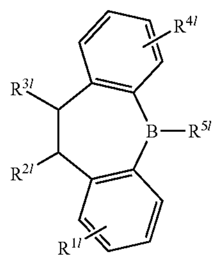
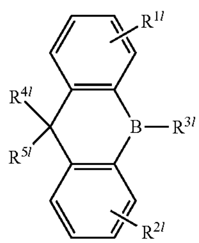
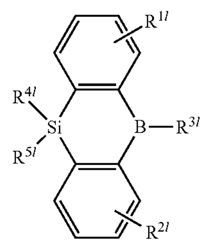
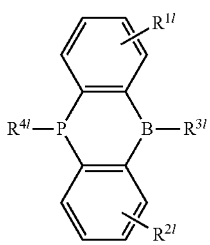
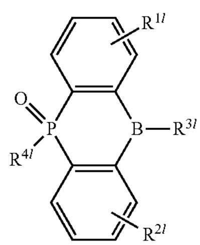
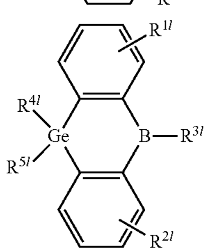
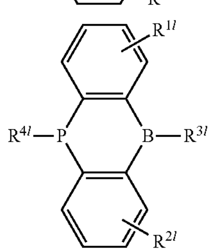
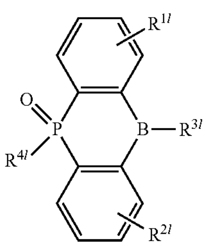
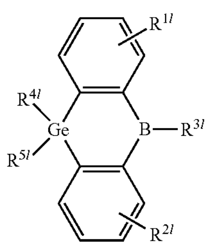
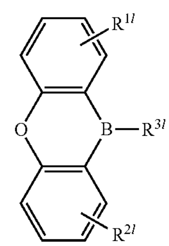
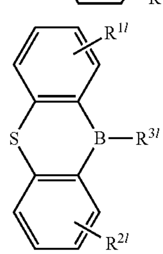
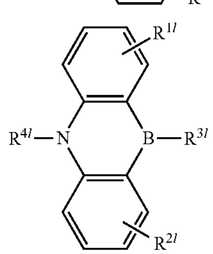
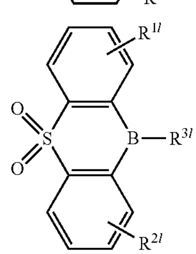
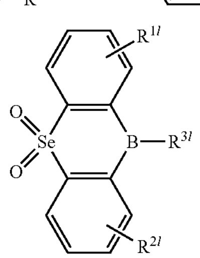
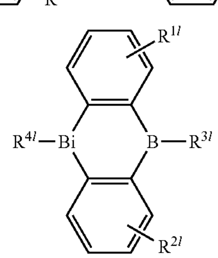
-continued
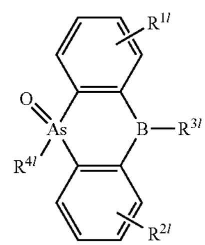
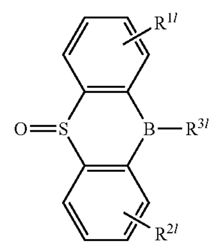
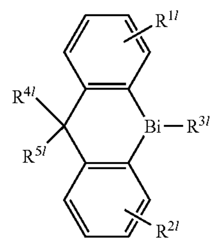
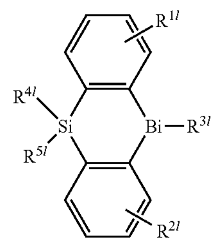
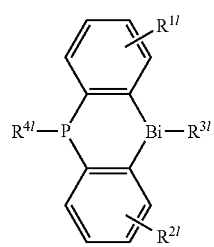
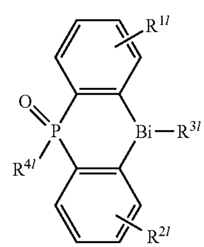
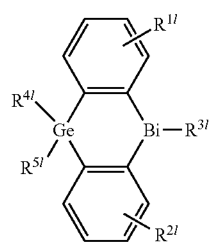
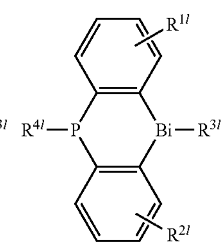
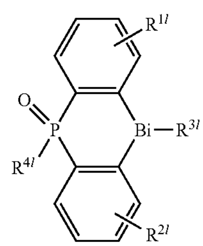
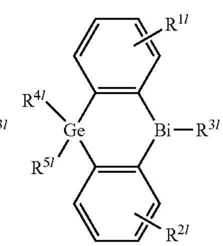
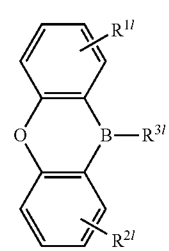
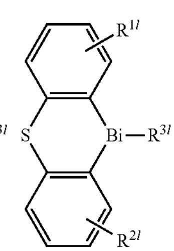
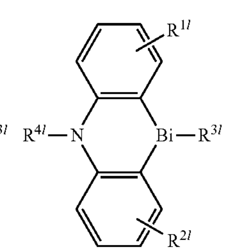
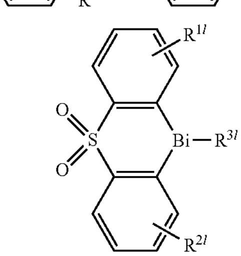
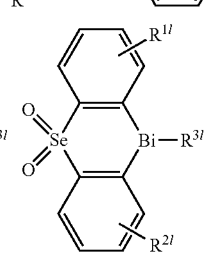

-continued
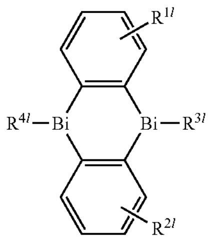
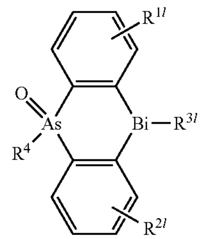
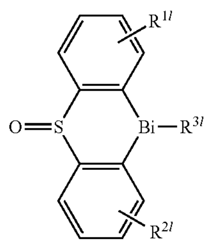
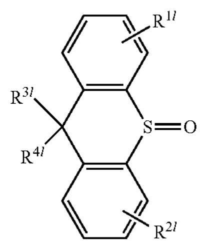
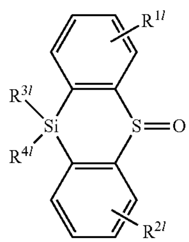
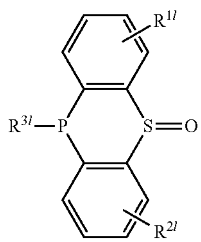
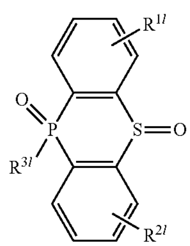
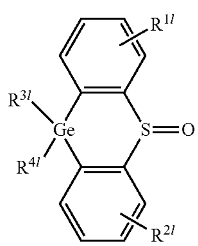
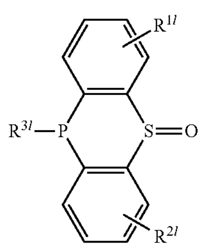
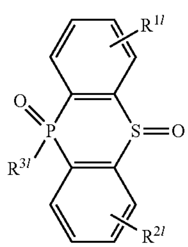
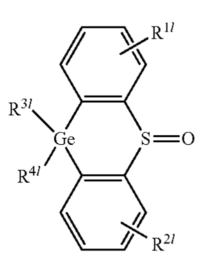
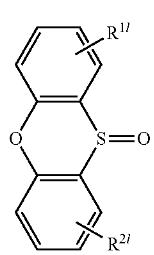
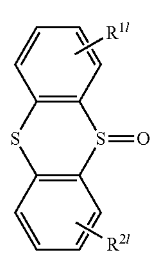
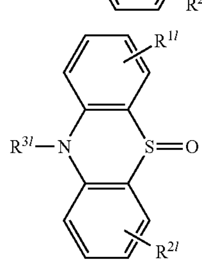
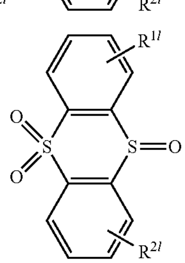
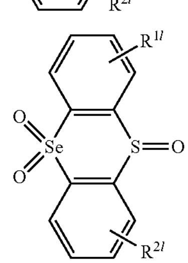
-continued
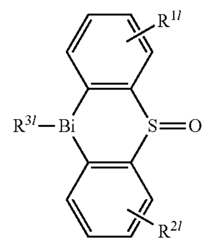
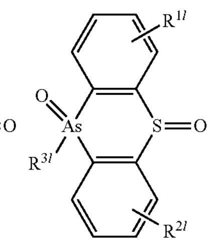
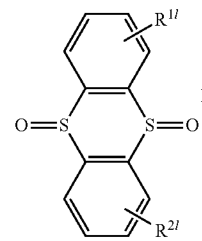
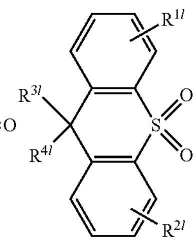
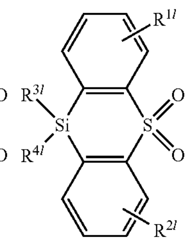
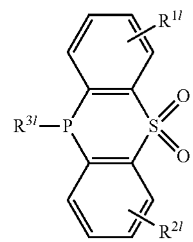
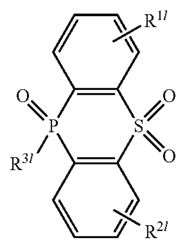
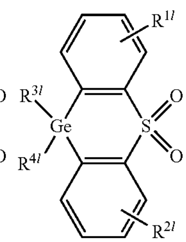
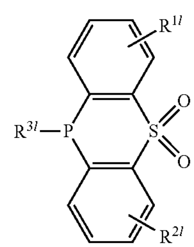
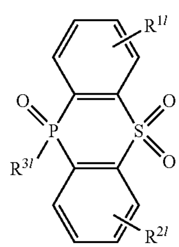
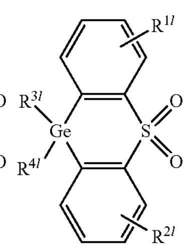
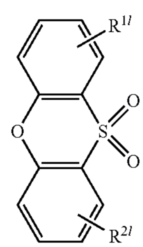
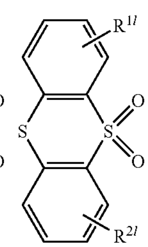
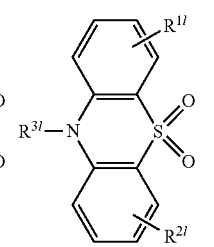
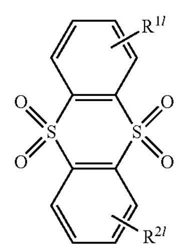
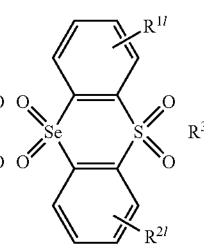
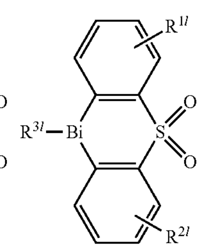
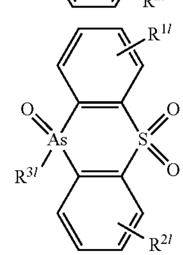
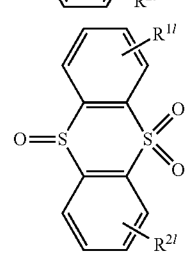
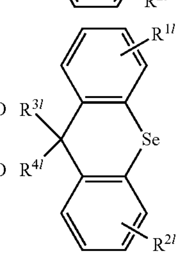

-continued
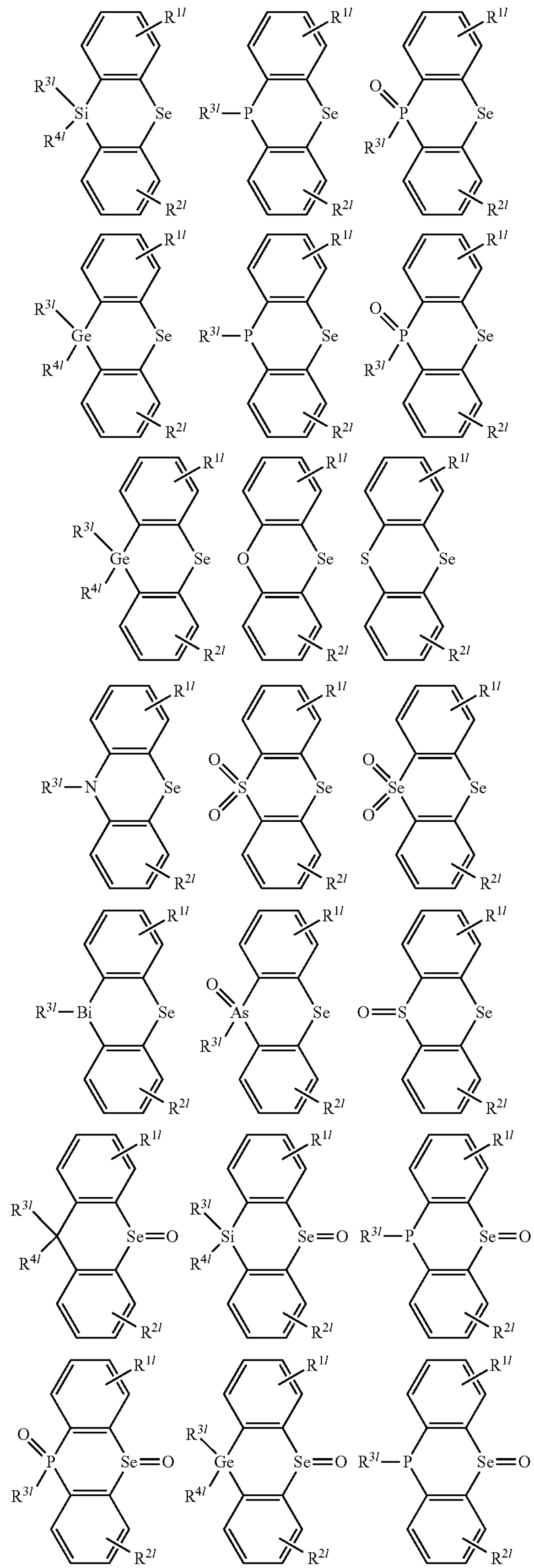
-continued
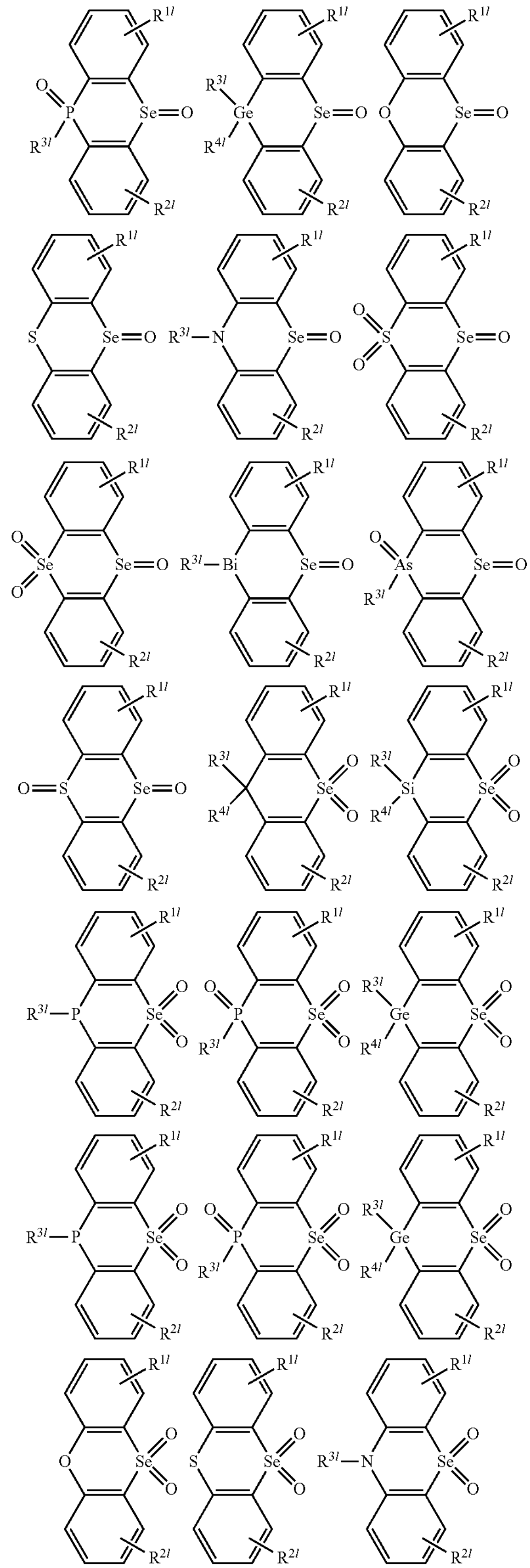

-continued
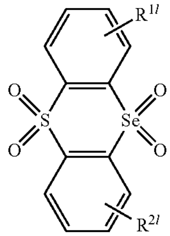
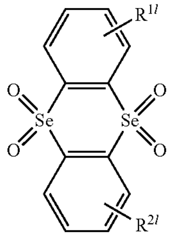
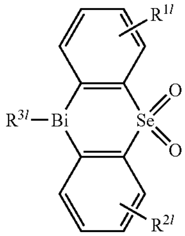
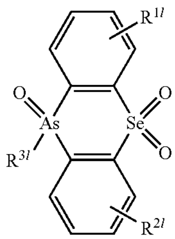
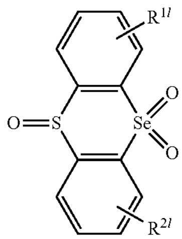
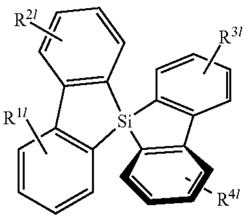
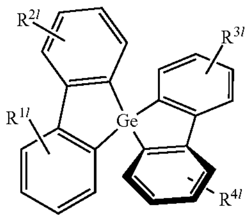
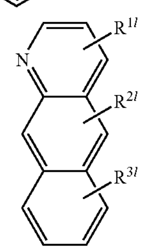
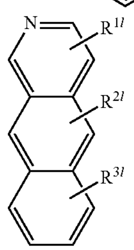
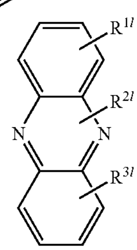
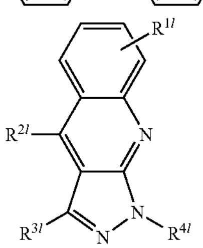
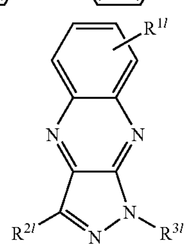
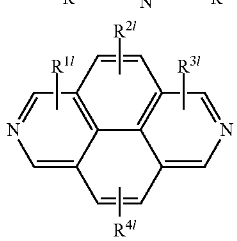
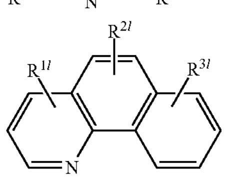
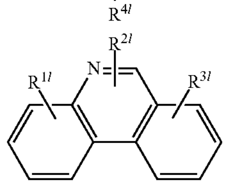
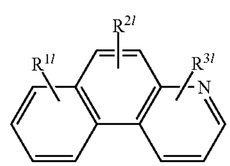
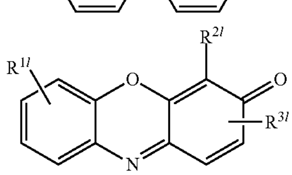
-continued
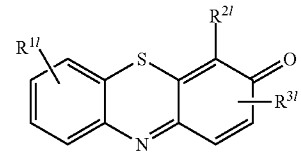
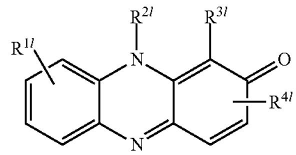
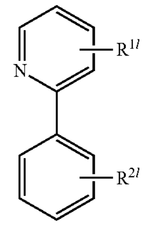
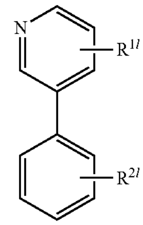
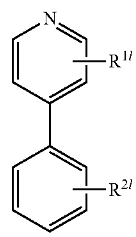
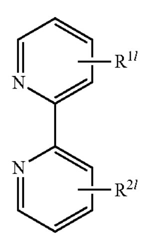
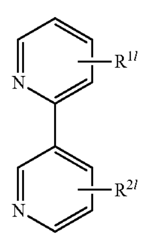
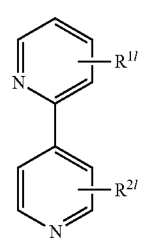
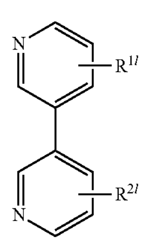
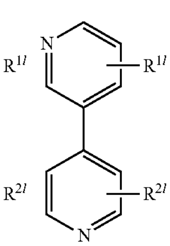
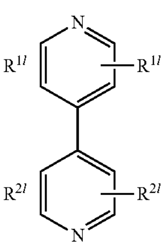
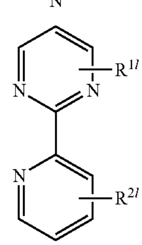
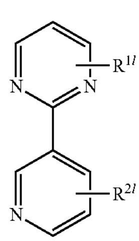
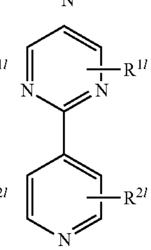
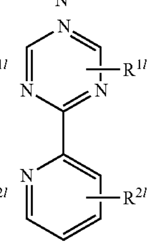
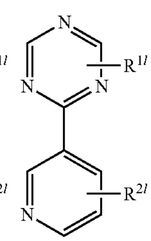
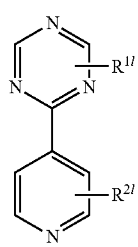
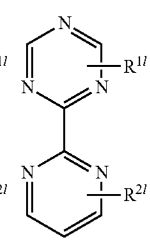
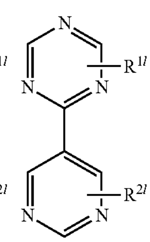
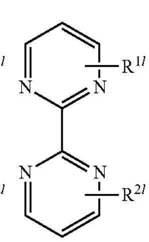
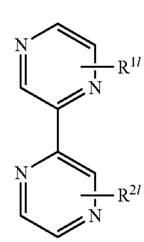
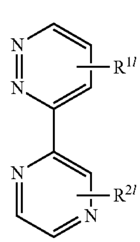
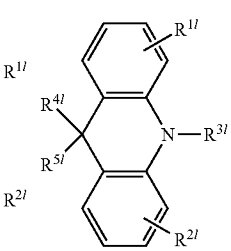

-continued
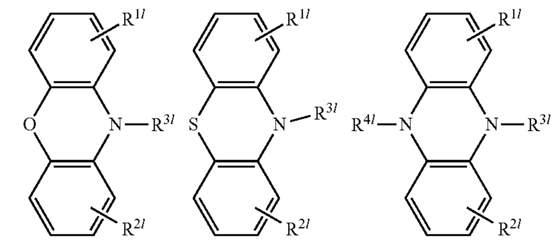
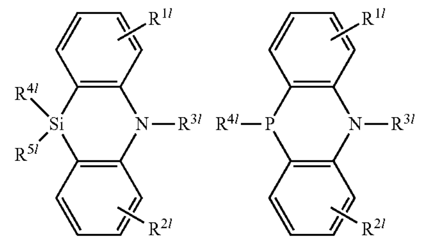
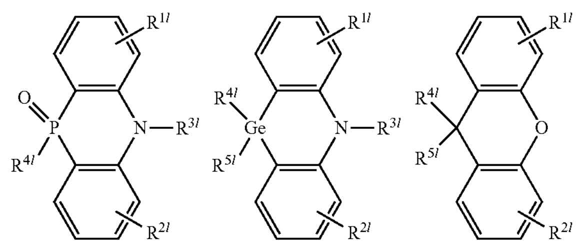
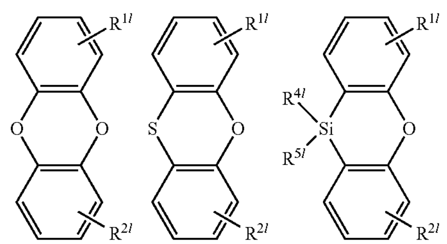
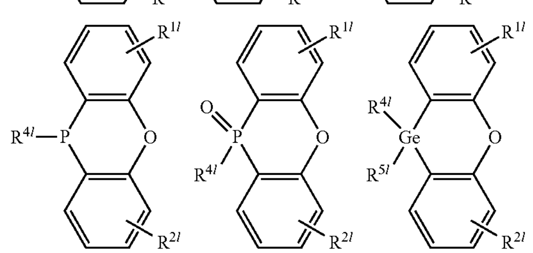
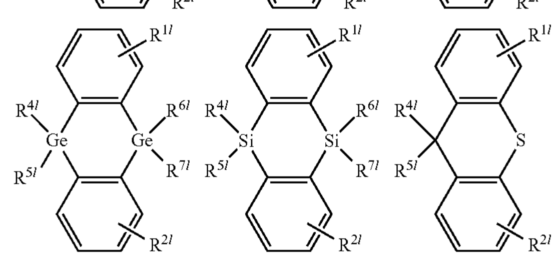
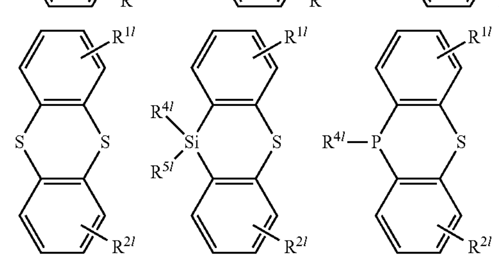
-continued
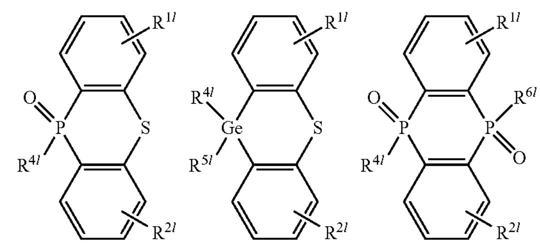
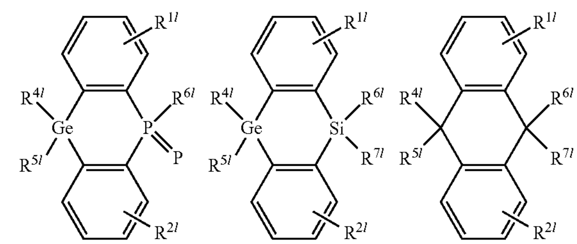
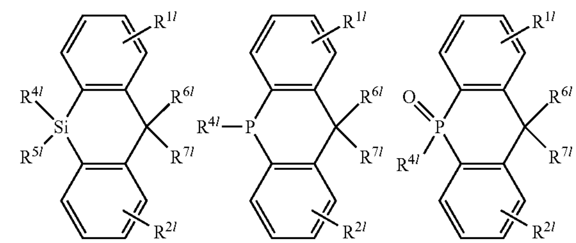
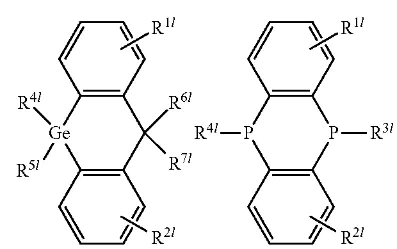
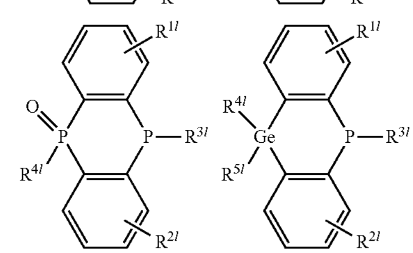
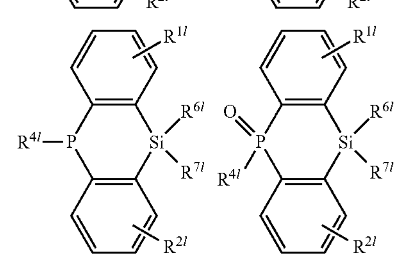
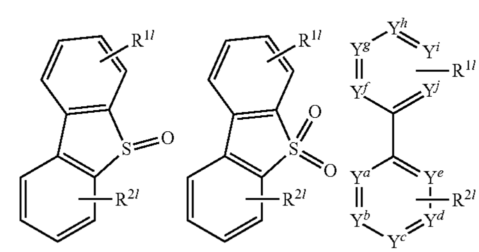

-continued
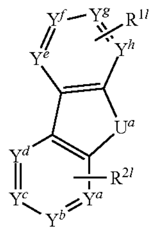
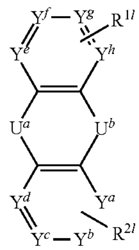
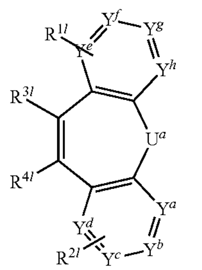
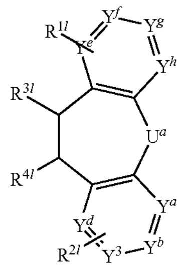
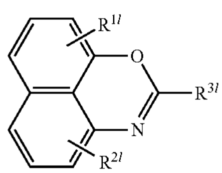
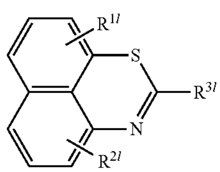
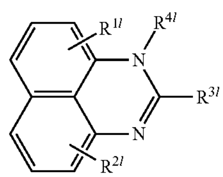
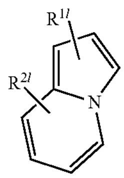
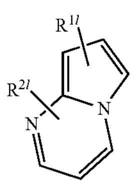
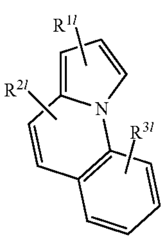
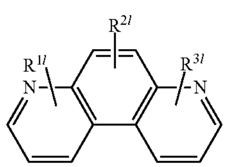
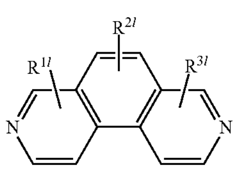
4. Other Fluorescent Luminophors
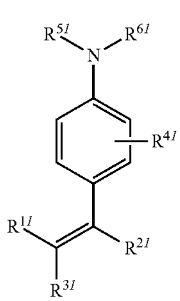
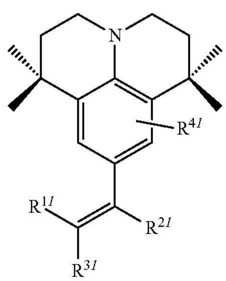
-continued
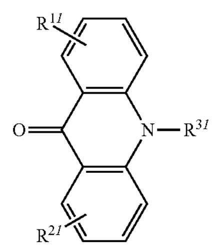
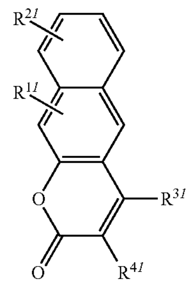
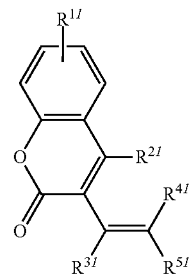
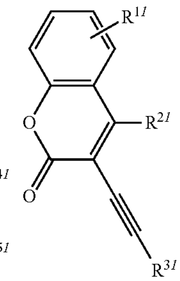
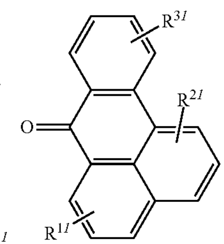
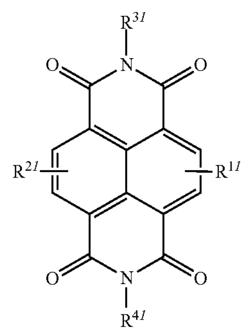
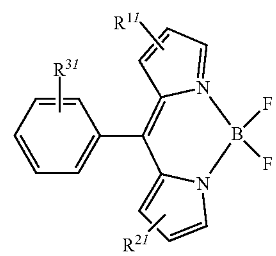
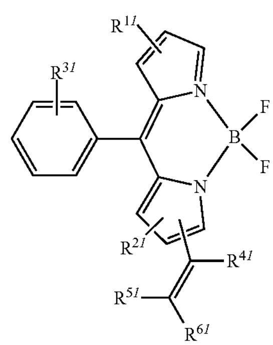
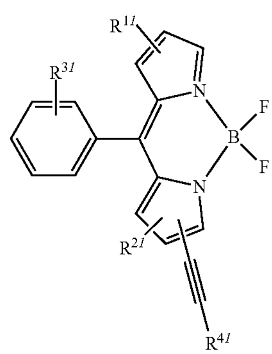
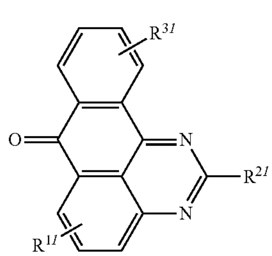
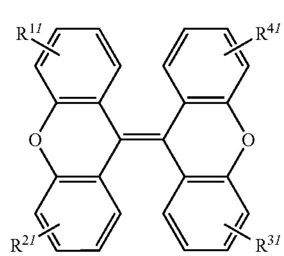

-continued
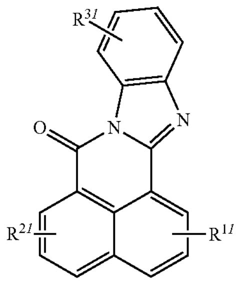
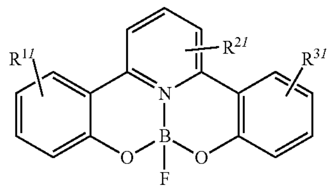
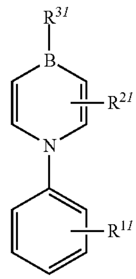
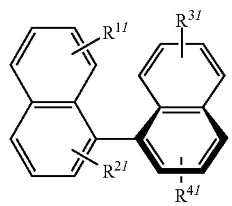
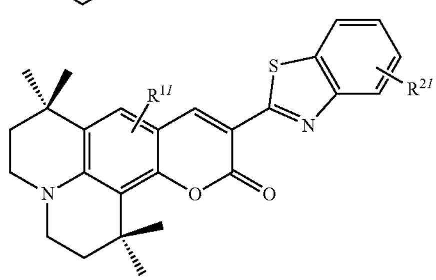
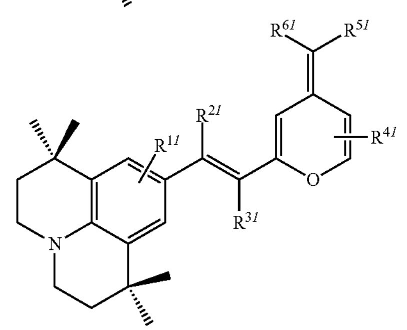
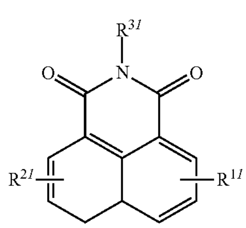
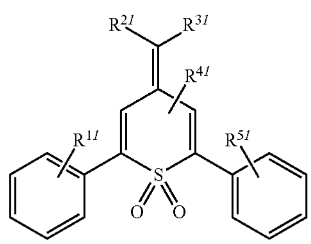
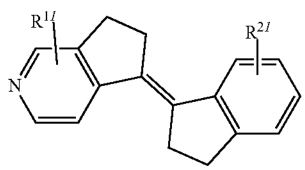
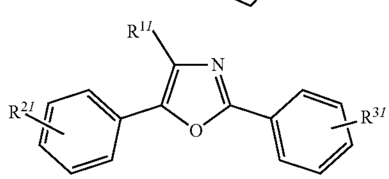
-continued
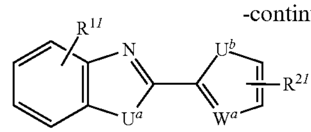
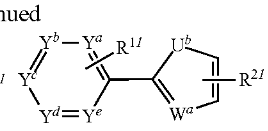
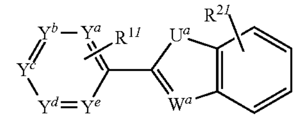
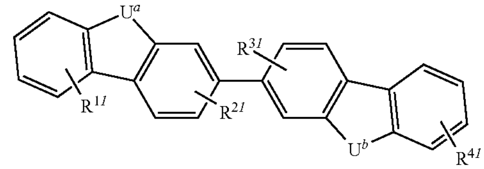
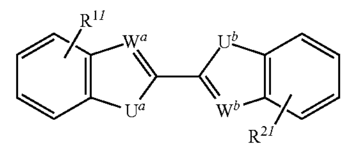
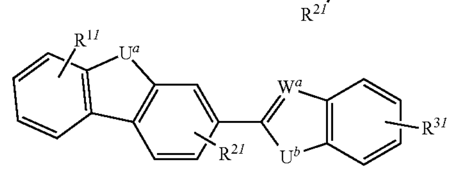
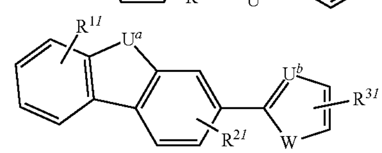
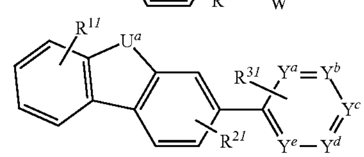
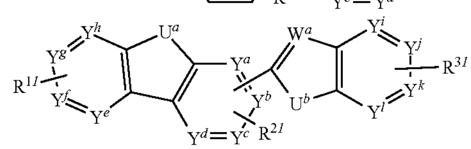
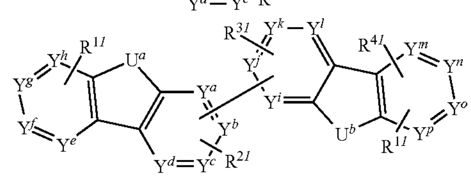
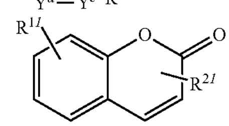
Coumarins
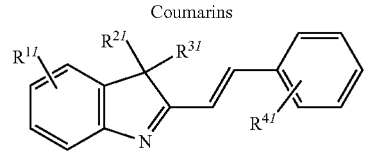
wherein:
each of $R^{11}$, $R^{21}$, $R^{31}$, $R^{41}$, $R^{51}$, $R^{61}$, $R^{71}$, and $R^{81}$ is independently a mono-, di-, or tri-substitution, and if present each of $R^{11}$, $R^{21}$, $R^{31}$, $R^{41}$, $R^{51}$, $R^{61}$, $R^{71}$, and $R^{81}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, substituted or unsubstituted alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$ is independently C, N, or B, each of $U^a$, $U^b$, and $U^c$ is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and each of W, $W^a$, $W^b$, and $W^c$ is independently CH, $CR^1$, $SiR^1$, GeH, $GeR^1$, N, P, B, Bi, or Bi═O.

In one aspect, $F^1$ is covalently bonded to $L^1$ directly. In one aspect $F^2$ is covalently bonded to $L^2$ directly. In one aspect, $F^3$ is covalently bonded to $L^3$ directly. In one aspect, $F^4$ is covalently bonded to $L^4$ directly. In one aspect, $F^5$ is covalently bonded to $L^5$ directly. In one aspect, $F^6$ is covalently bonded to $L^6$ directly.

In another aspect, fluorescent luminophore $F^1$ is covalently bonded to $L^1$ by a linking atom or linking group. In another aspect, $F^2$ is covalently bonded to $L^2$ by a linking atom or linking group. In another aspect, $F^3$ is covalently bonded to $L^3$ by a linking atom or linking group. In another aspect, $F^4$ is covalently bonded to $L^4$ by a linking atom or linking group. In another aspect, $F^5$ is covalently bonded to $L^5$ by a linking atom or linking group. In another aspect, $F^6$ is covalently bonded to $L^6$ by a linking atom or linking group.

F. Linking Atoms or Linking Groups

In some cases, each linking atom or linking group in the structures disclosed herein is independently one of the atoms or groups depicted below:

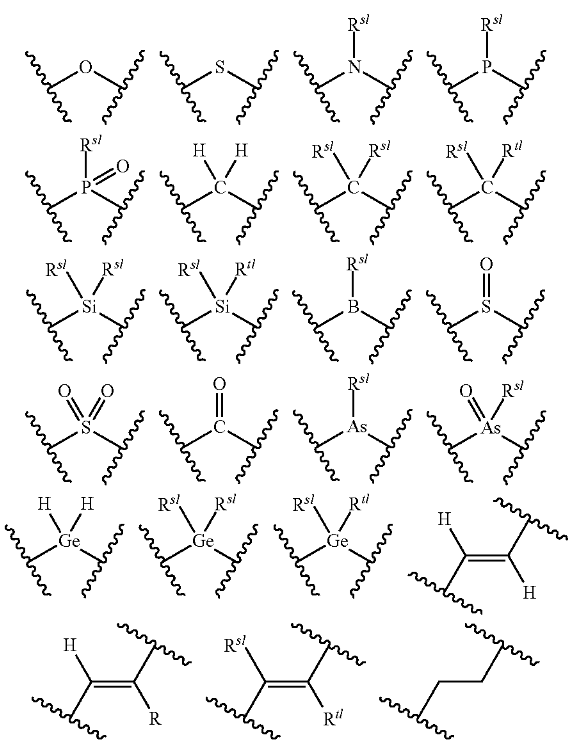

-continued

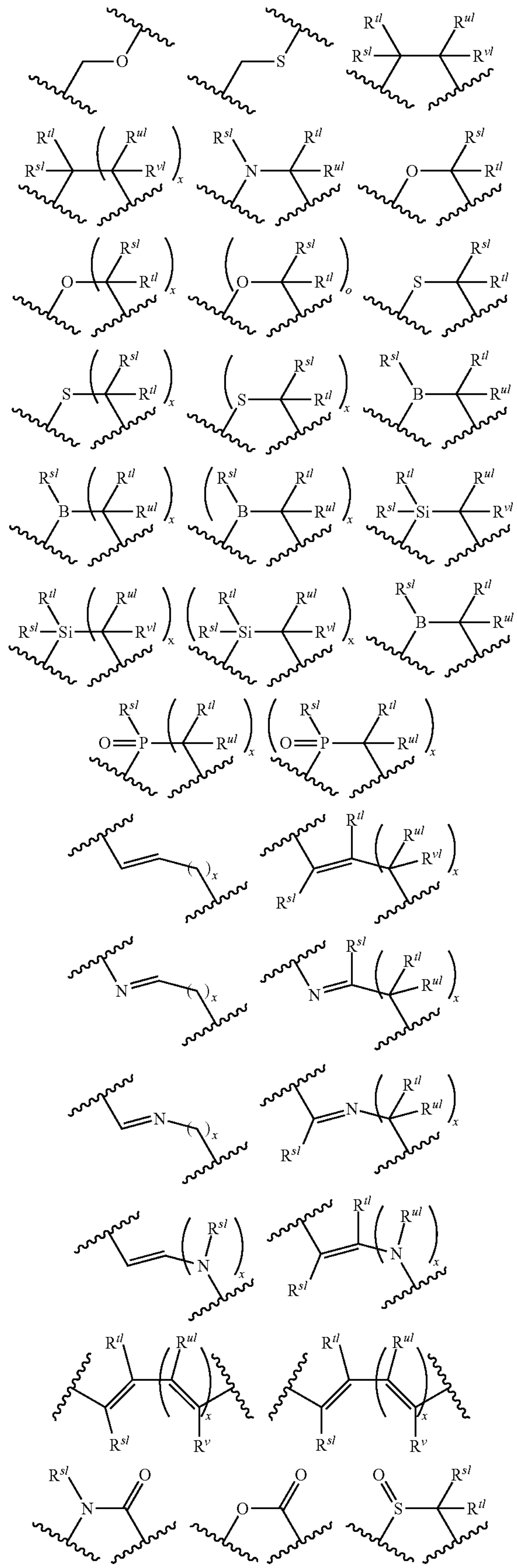

-continued

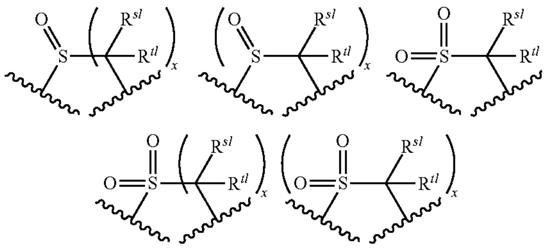

wherein x is from 1 to 10, wherein each of $R^{sl}$, $R^{tl}$, $R^{ul}$, and $R^{vl}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, or polymeric, or any conjugate or combination thereof. In other cases, a linking atom or linking group in the structures disclosed herein includes other structures or portions thereof not specifically recited herein, and the present disclosure is not intended to be limited to those structures or portions thereof specifically recited.

In one aspect, a linking atom and linking group recited above is covalently bonded to any atom of a fluorescent luminophore $F^1$, $F^2$, $F^3$, $F^4$, $F^5$, and $F^6$ if present and if valency permits. In one example example, if $F^1$ is

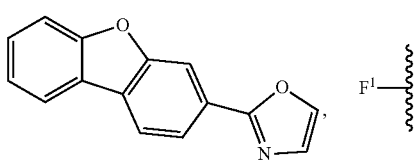

can be

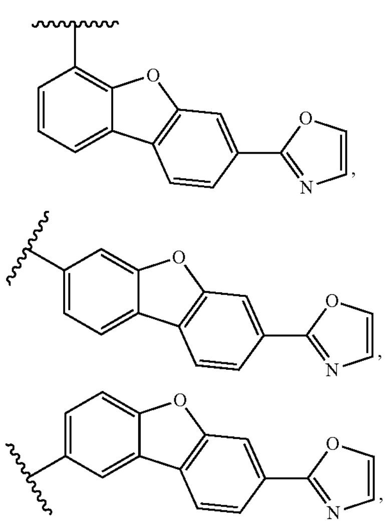

-continued

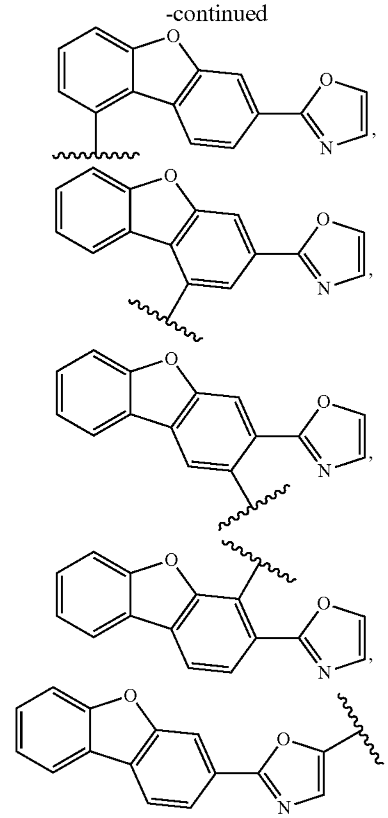

or

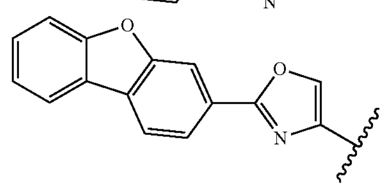

G. R Groups

In one aspect, at least one $R^a$ is present. In another aspect, $R^a$ is absent.

In one aspect, $R^a$ is a mono-substitution. In another aspect, $R^a$ is a di-substitution. In yet another aspect, $R^a$ is a tri-substitution.

In one aspect, $R^a$ is connected to at least $L^1$. In another aspect, $R^b$ is connected to at least $L^2$. In yet another aspect, W is connected to at least $L^3$. In one aspect, $R^d$ is connected to at least $L^4$. In one aspect, $R^e$ is connected to at least $L^5$. In one aspect, $R^f$ is connected to at least $L^6$.

In one aspect, $R^a$ is a di-substitution and the $R^a$'s are linked together. When the $R^a$'s are linked together the resulting structure can be a cyclic structure that includes a portion of the five-membered cyclic structure as described herein. For example, a cyclic structure can be formed when the di-substitution is of $L^1$ and $L^2$ and the $R^a$'s are linked together. A cyclic structure can also be formed when the di-substitution is of $L^3$ and $L^4$ and the $R^a$'s are linked together. A cyclic structure can also be formed when the di-substitution is of $L^5$ and $L^6$ and the $R^a$'s are linked together.

In one aspect, each $R^a$, if present, is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and two or more of $R^a$ are optionally linked together. In one aspect, at least one $R^a$ is halogen, hydroxyl, substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl; or any conjugate or combination thereof, and two or more of $R^a$ are optionally linked together.

In one aspect, at least one $R^b$ is present. In another aspect, $R^b$ is absent.

In one aspect, $R^b$ is a mono-substitution. In another aspect, $R^b$ is a di-substitution. In yet another aspect, $R^b$ is a tri-substitution.

In one aspect, each $R^b$, if present, is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and two or more of $R^b$ are optionally linked together. In one aspect, at least one $R^b$ is halogen, hydroxyl; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl; or any conjugate or combination thereof, and two or more of $R^b$ are optionally linked together.

In one aspect, at least one $R^c$ is present. In another aspect, $R^c$ is absent.

In one aspect, $R^c$ is a mono-substitution. In another aspect, $R^c$ is a di-substitution. In yet another aspect, $R^c$ is a tri-substitution.

In one aspect, each $R^c$, if present, is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and two or more of $R^c$ are optionally linked together. In one aspect, at least one $R^c$ is halogen, hydroxyl; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl; or any conjugate or combination thereof, and two or more of $R^c$ are optionally linked together.

In one aspect, at least one $R^d$ is present. In another aspect, $R^d$ is absent.

In one aspect, $R^d$ is a mono-substitution. In another aspect, $R^d$ is a di-substitution. In yet another aspect, $R^d$ is a tri-substitution.

In one aspect, each $R^d$, if present, is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, substituted silyl, polymeric, or any conjugate or combination thereof, and two or more of $R^d$ are optionally linked together.

In one aspect, at least one $R^e$ is present. In another aspect, $R^e$ is absent.

In one aspect, $R^e$ is a mono-substitution. In another aspect, $R^e$ is a di-substitution. In yet another aspect, $R^e$ is a tri-substitution.

In one aspect, each $R^e$, if present, is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and two or more of $R^e$ are optionally linked together.

In one aspect, at least one $R^f$ is present. In another aspect, $R^f$ is absent.

In one aspect, $R^f$ is a mono-substitution. In another aspect, $R^f$ is a di-substitution. In yet another aspect, $R^f$ is a tri-substitution.

In one aspect, each $R^f$, if present, is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and two or more of $R^f$ are optionally linked together.

In one aspect, each of R, $R^1$, $R^2$, $R^3$, and $R^4$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In another aspect, each of R, $R^1$, $R^2$, $R^3$, and $R^4$ is independently hydrogen, halogen, hydroxyl, thiol, nitro, cyano; substituted or unsubstituted: aryl, cycloalkyl, cycloalkenyl, heterocyclyl, heteroaryl, alkyl, alkenyl, alkynyl, or amino. In another aspect, each of R, $R^1$, $R^2$, $R^3$, and $R^4$ is independently hydrogen; or substituted or unsubstituted: aryl, cycloalkyl, cycloalkenyl, heterocyclyl, heteroaryl, alkyl, alkenyl, or alkynyl.

H. Exemplary Compounds

In one aspect, Formulas I-X of this disclosure include the following structures. In another aspect, Formulas I-X include other structures or portions thereof not specifically recited herein, and the present disclosure is not intended to be limited to those structures or portions thereof specifically recited.
Structures Ir-1
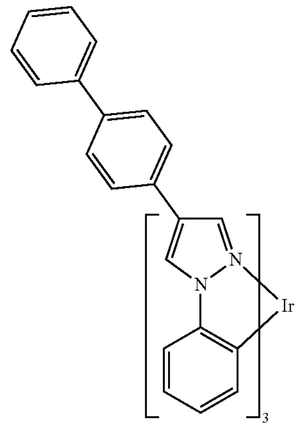
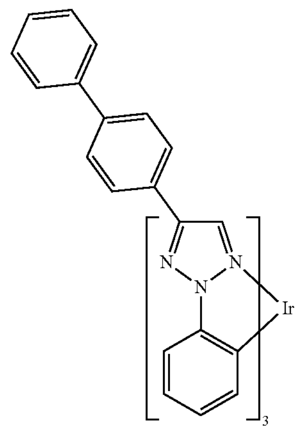
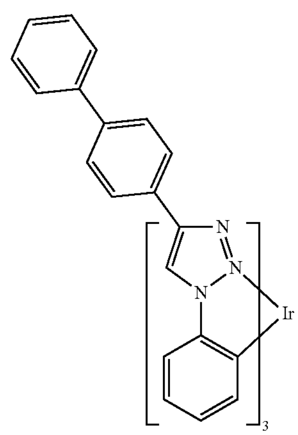
-continued
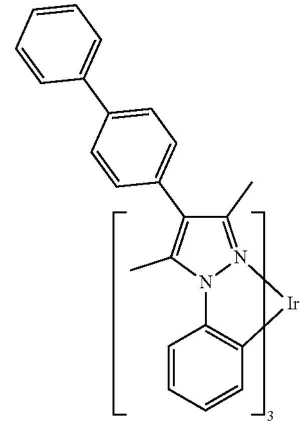
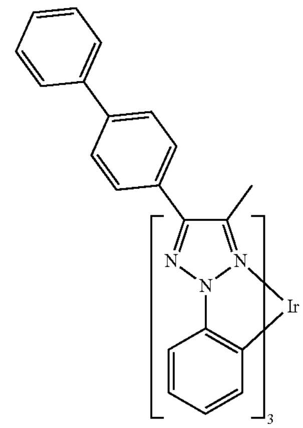
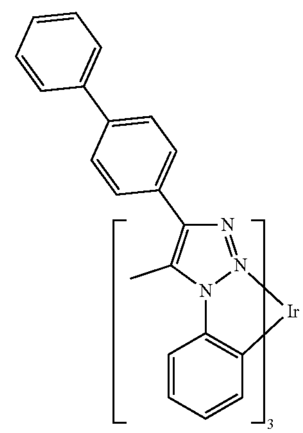
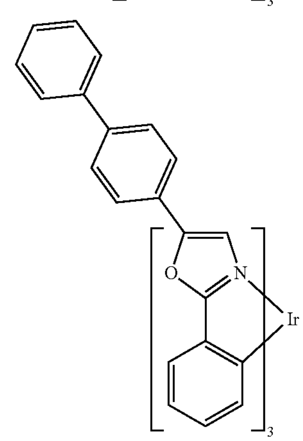

-continued
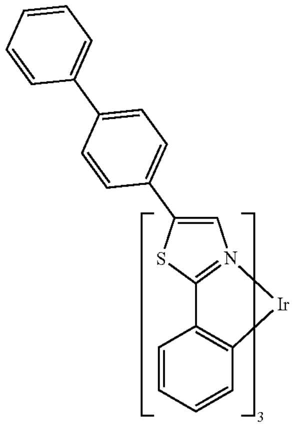
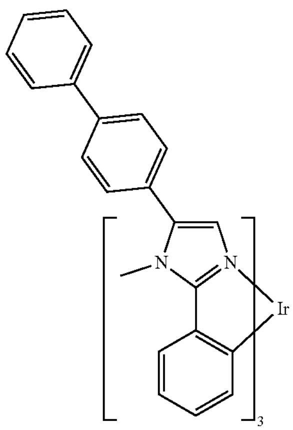
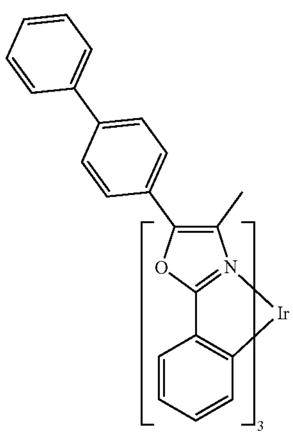
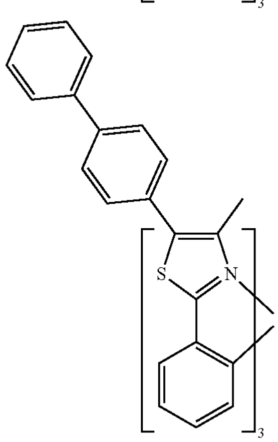
-continued
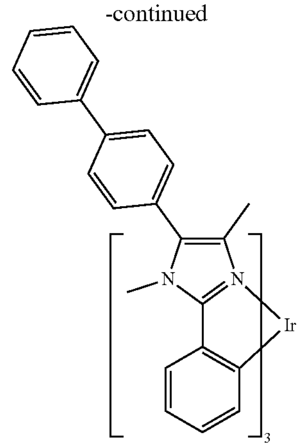
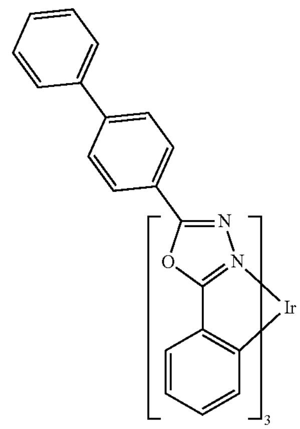
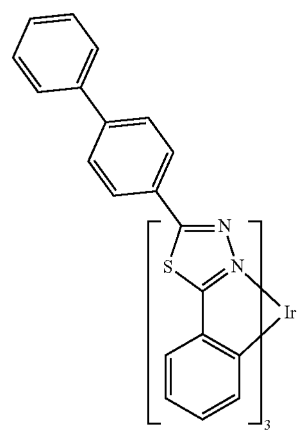
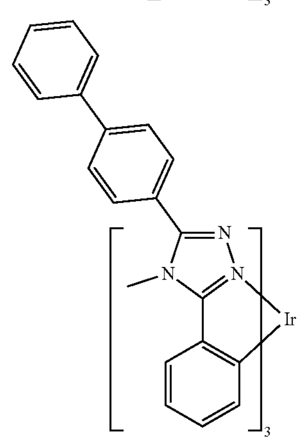

-continued
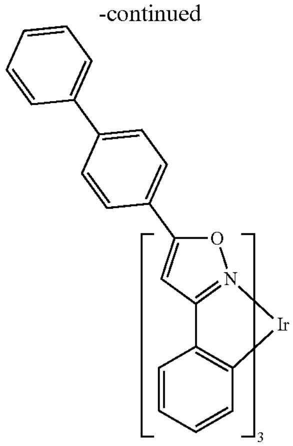
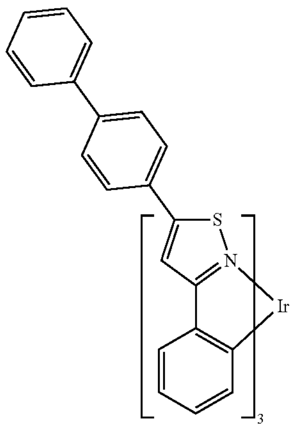
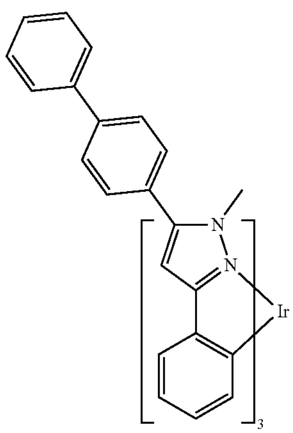
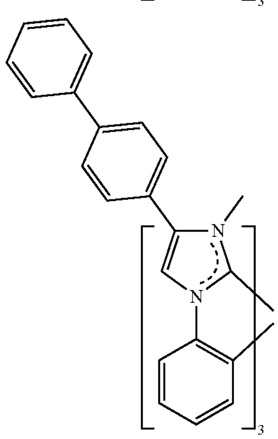
-continued
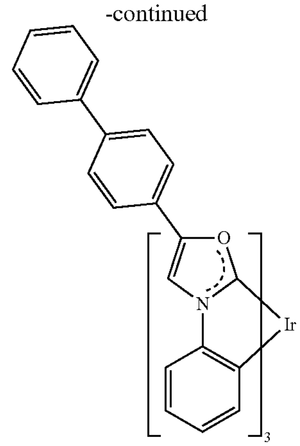
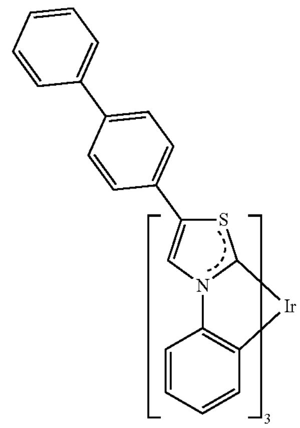
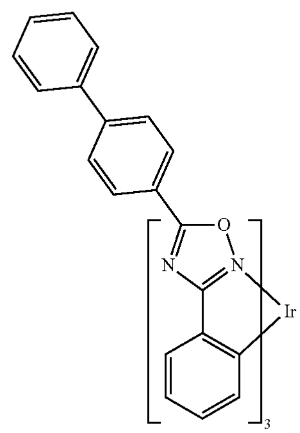
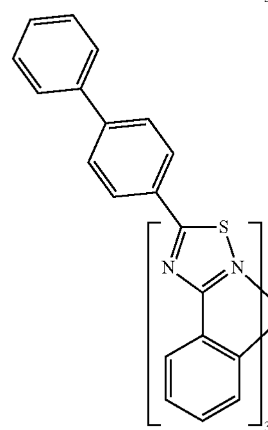

-continued
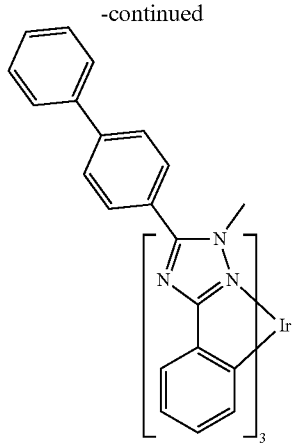
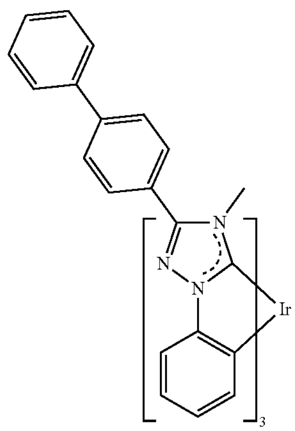
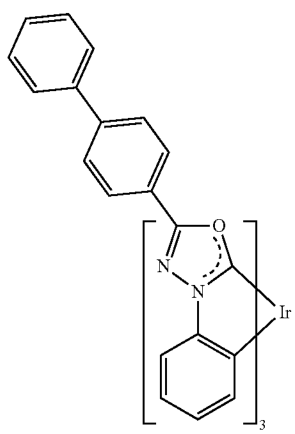
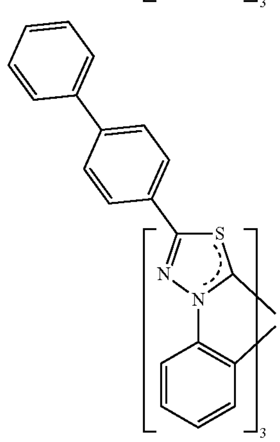
-continued
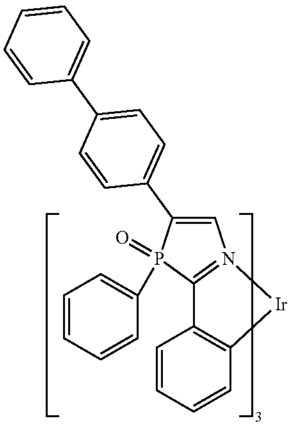
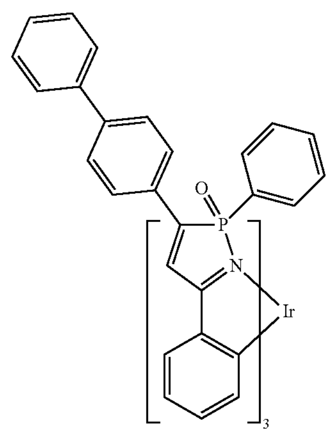
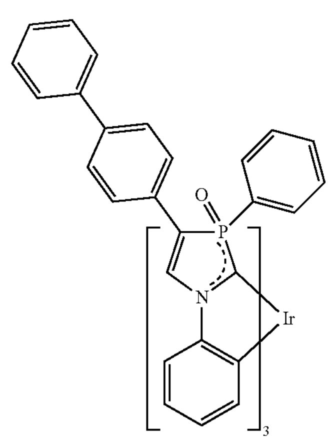

-continued
Structures Ir-2
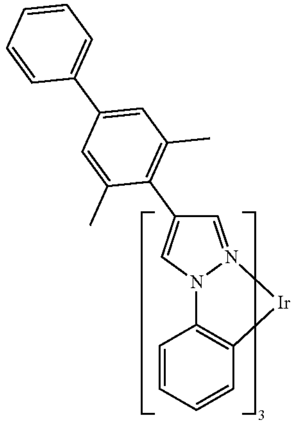
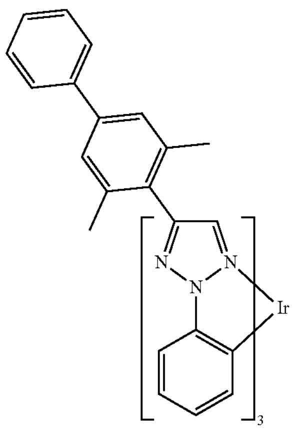
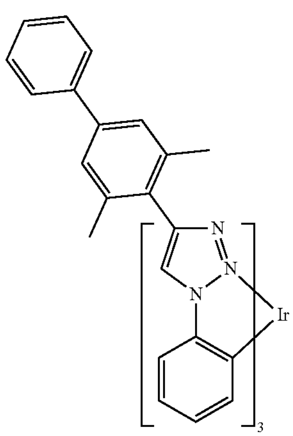
-continued
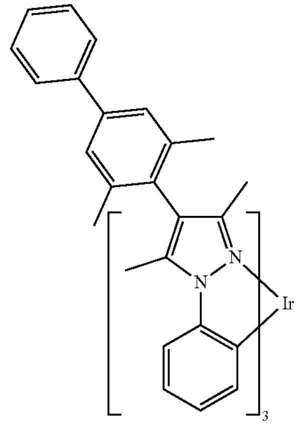
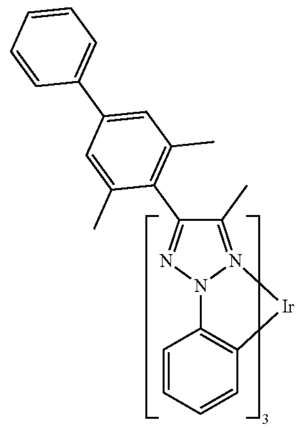
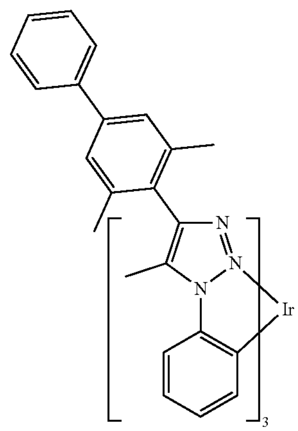
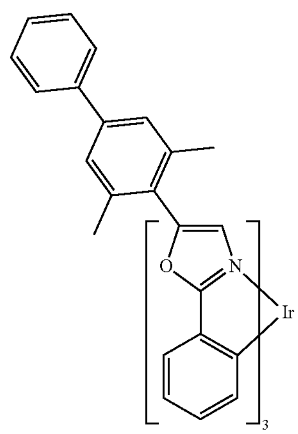

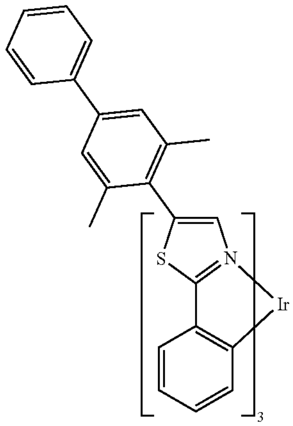
S
N
Ir
3
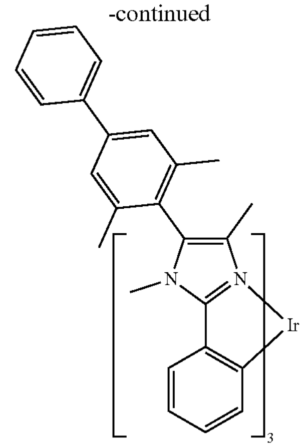
N
N
Ir
3
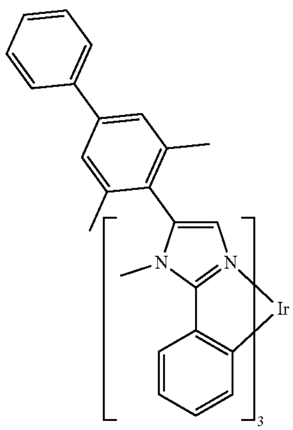
N
N
Ir
3
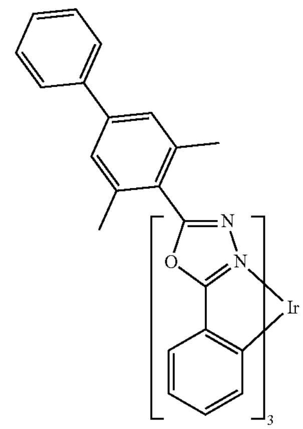
N
O
N
Ir
3
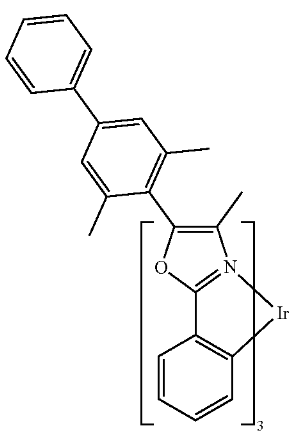
O
N
Ir
3
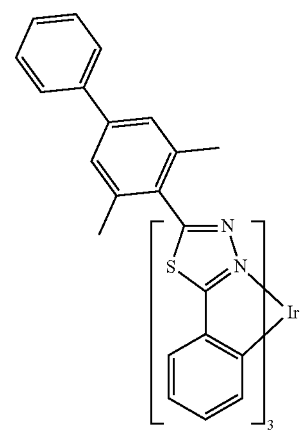
N
S
N
Ir
3
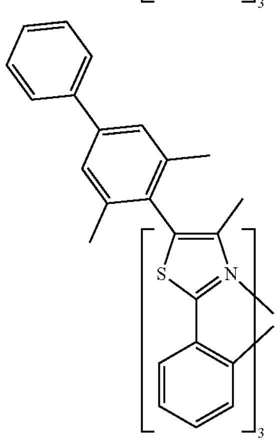
S
N
Ir
3
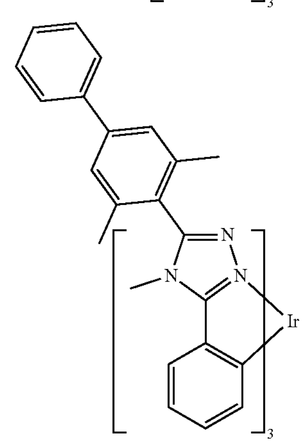
N
N
N
Ir
3

-continued
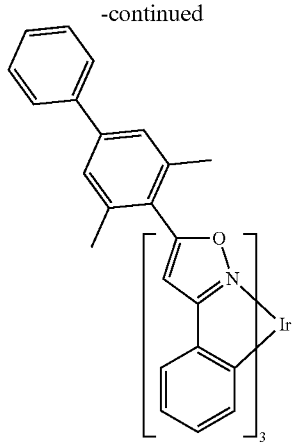
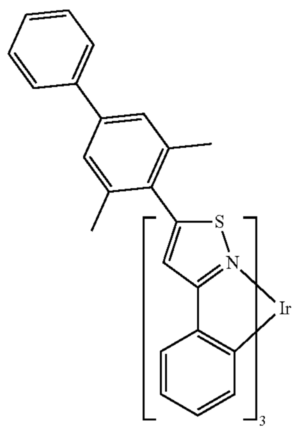
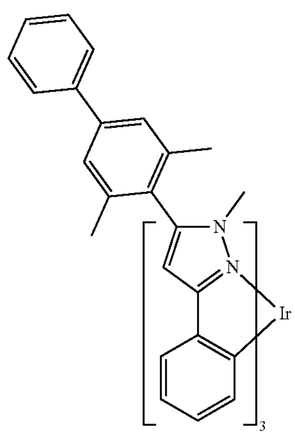
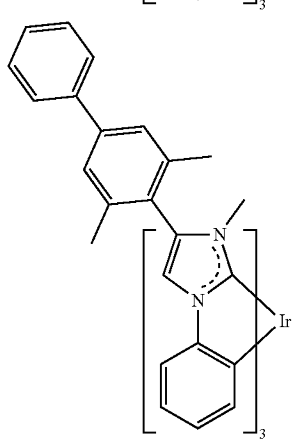
-continued
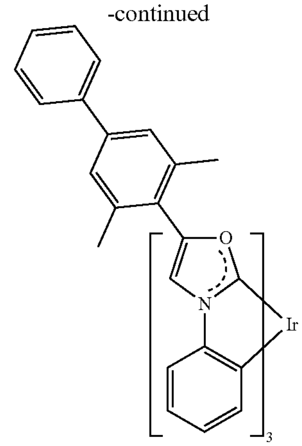
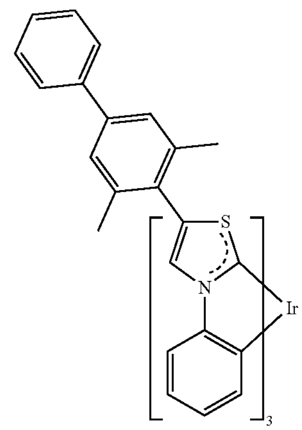
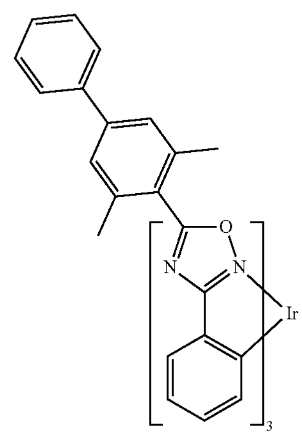
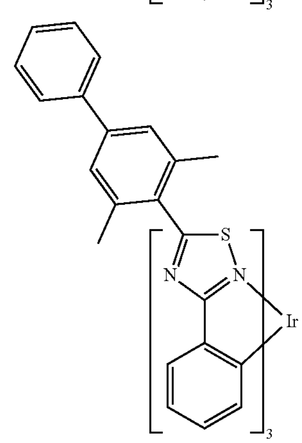

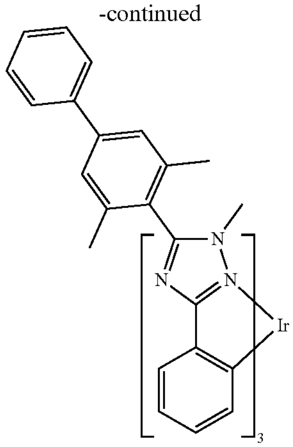
N
N
N
Ir
3
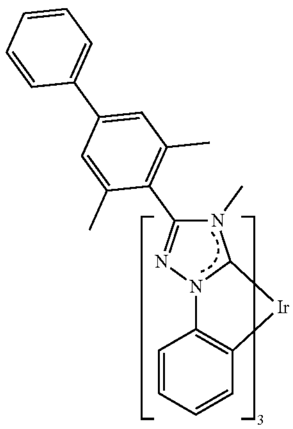
N
N
N
Ir
3
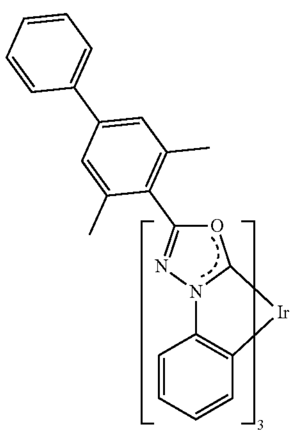
O
N
N
Ir
3
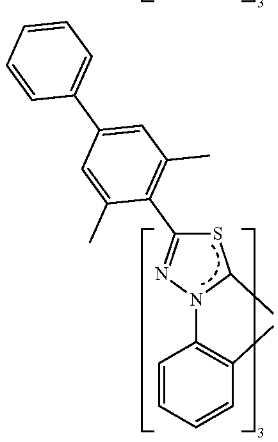
S
N
N
Ir
3
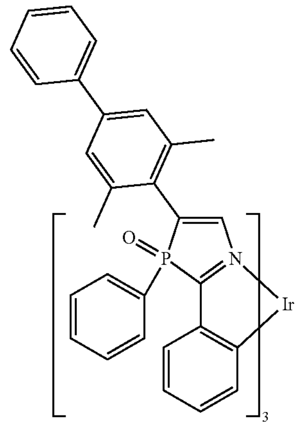
O
P
N
Ir
3
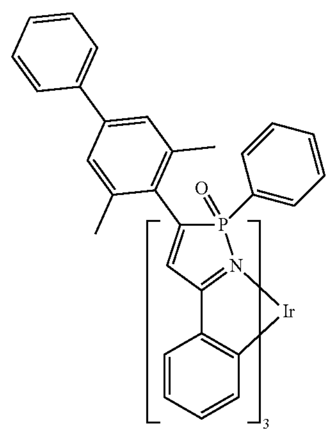
O
P
N
Ir
3
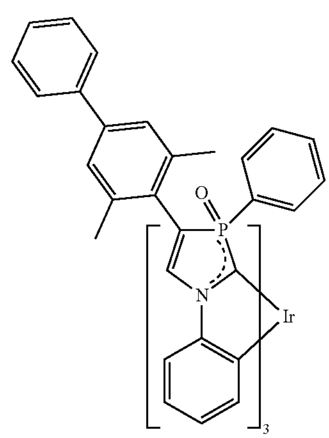
O
P
N
Ir
3

-continued
Structures Ir-3
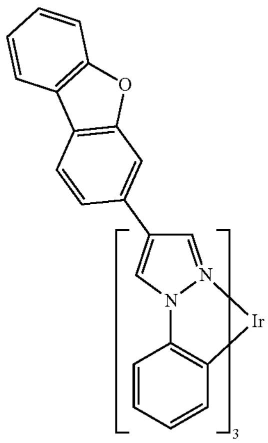
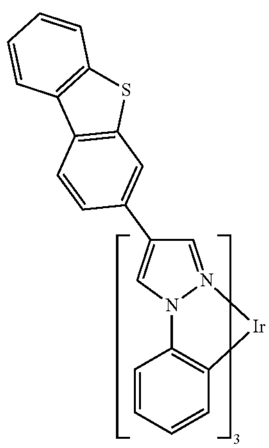
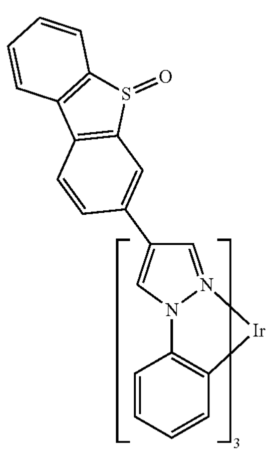
-continued
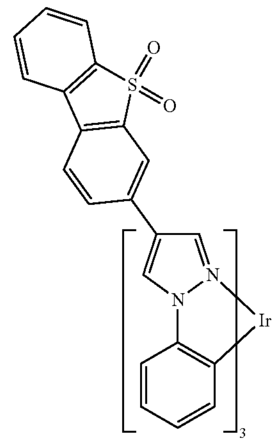
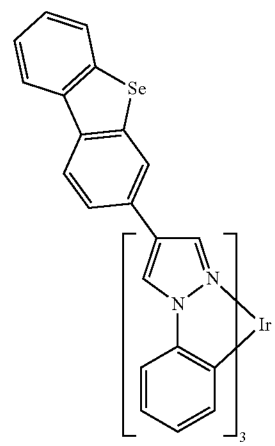
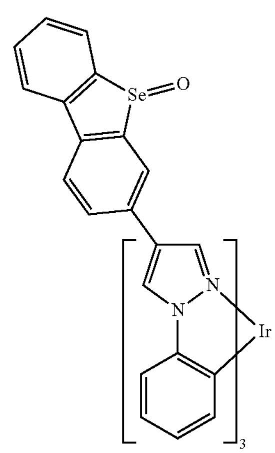

-continued
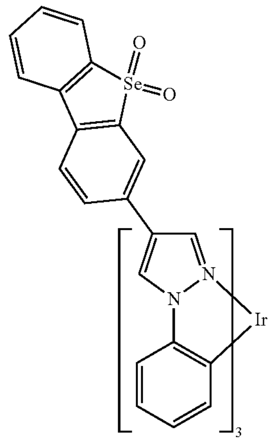
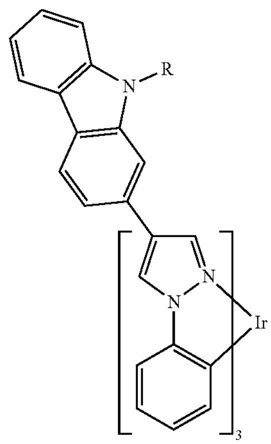
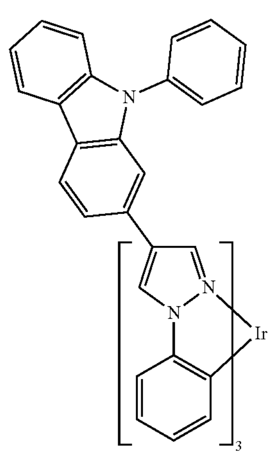
-continued
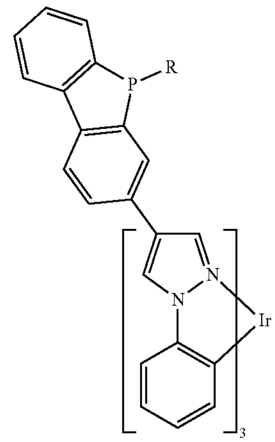
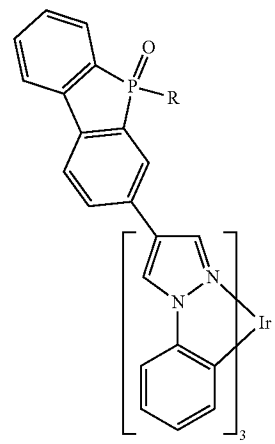
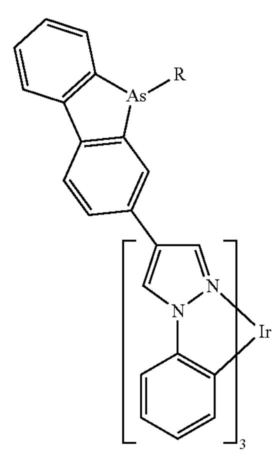

-continued
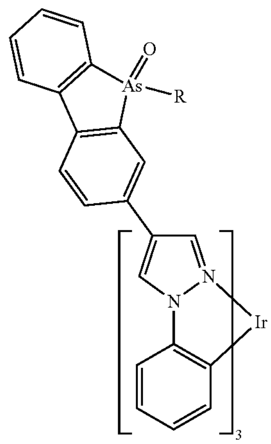
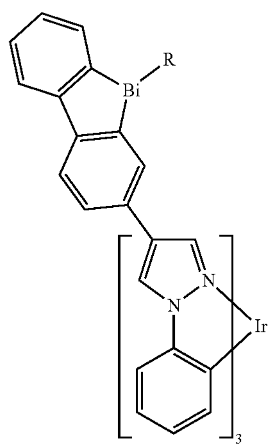
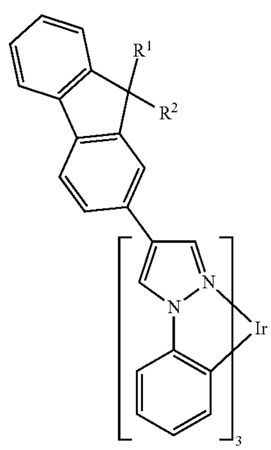
-continued
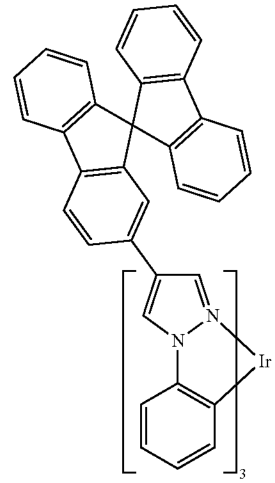
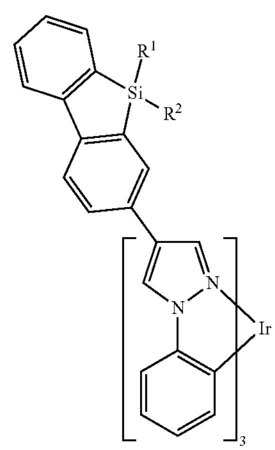
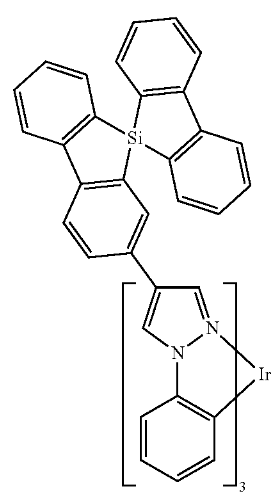

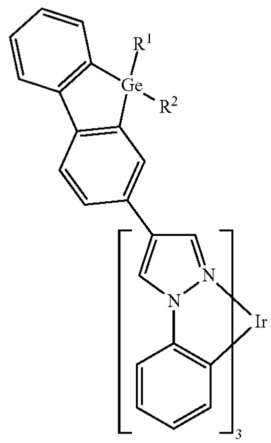
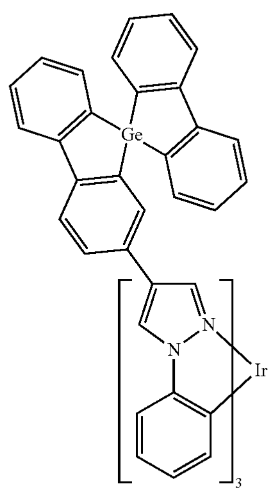
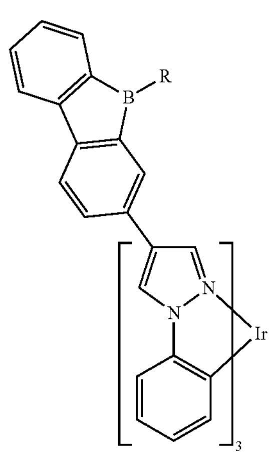
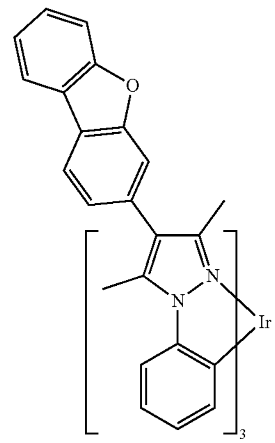
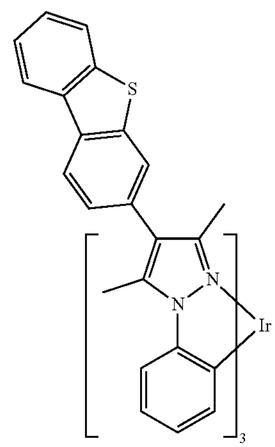
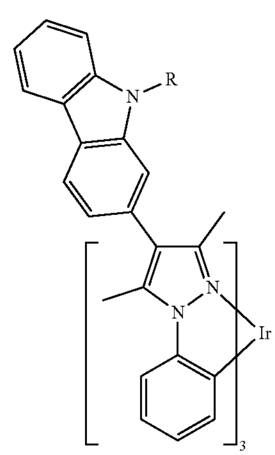

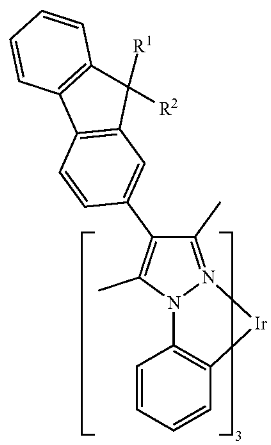
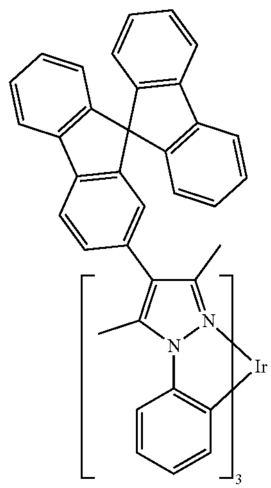
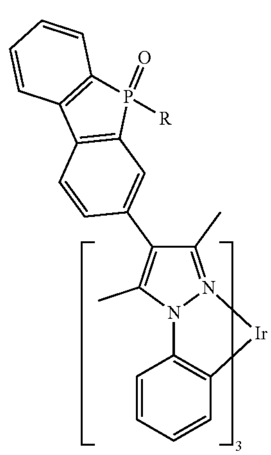
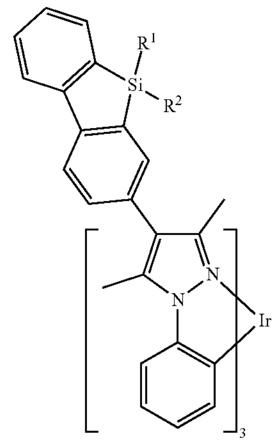
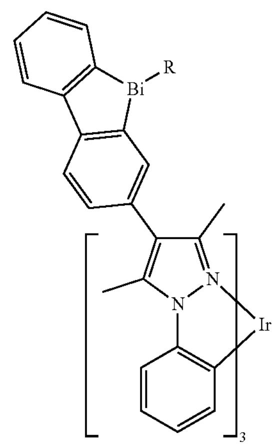
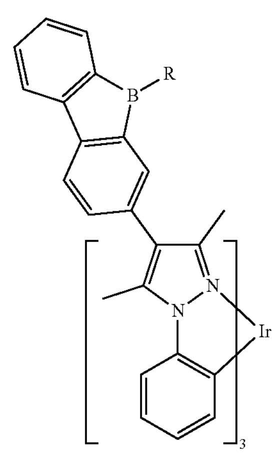

Structures Ir-4
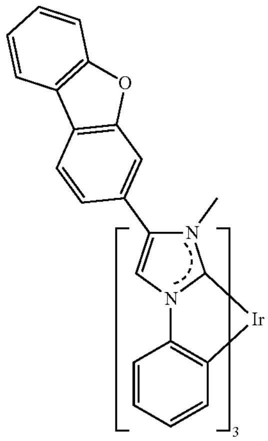
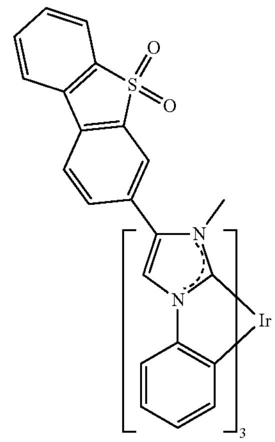
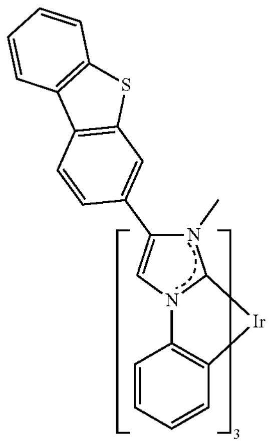
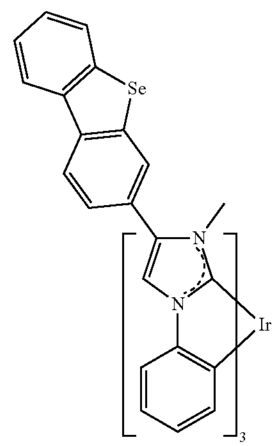
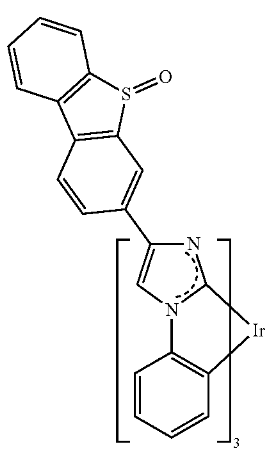
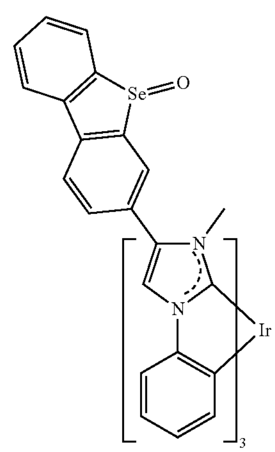

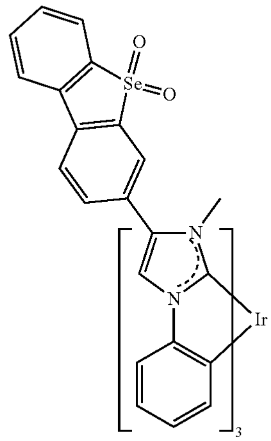
O
Se
O
N
N
Ir
3
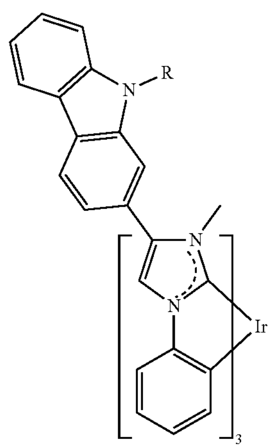
N
R
N
N
Ir
3
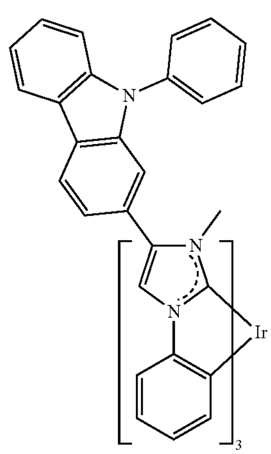
N
N
N
Ir
3
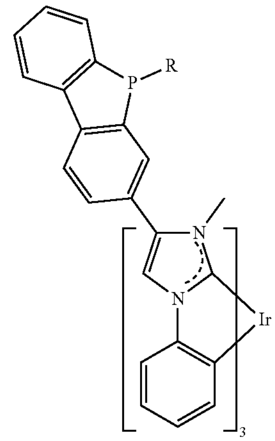
P
R
N
N
Ir
3
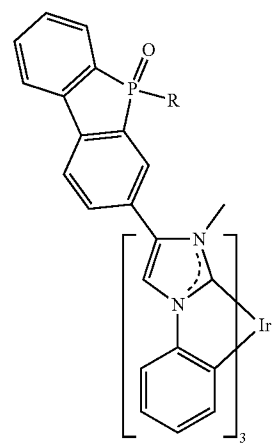
O
P
R
N
N
Ir
3
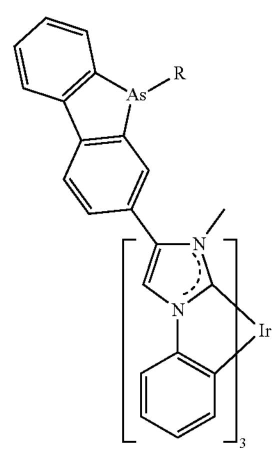
As
R
N
N
Ir
3

-continued
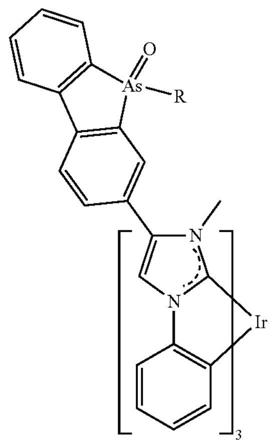
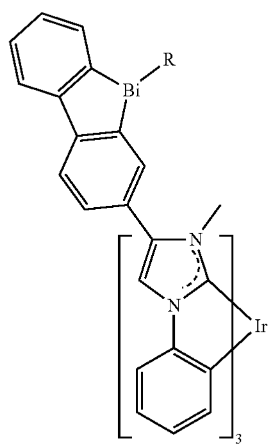
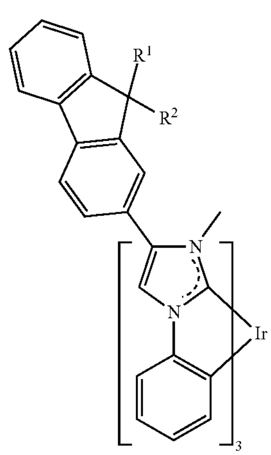
-continued
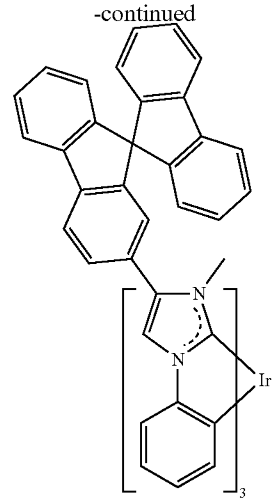
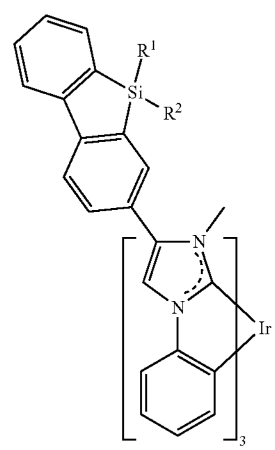
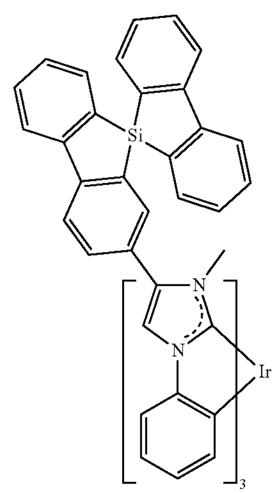

-continued
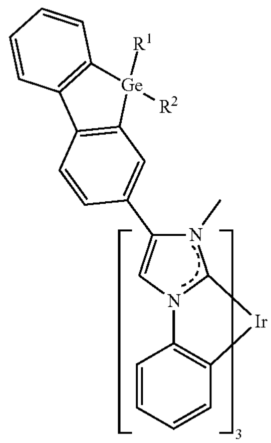
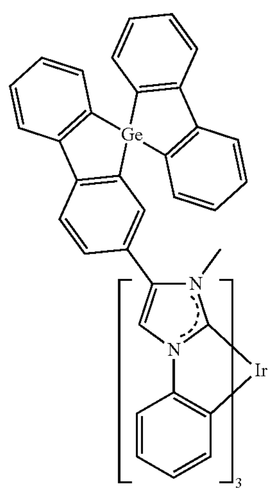
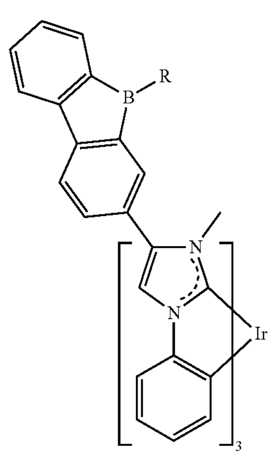
-continued
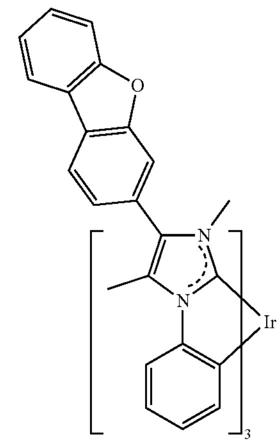
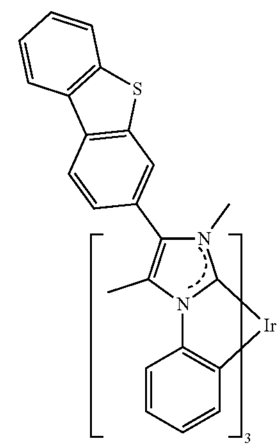
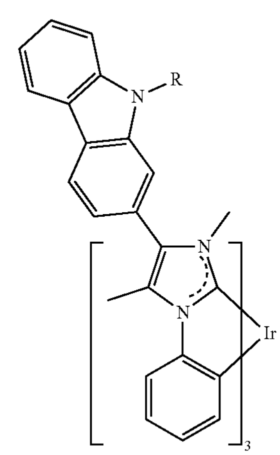

-continued
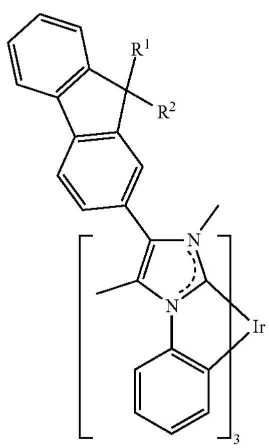
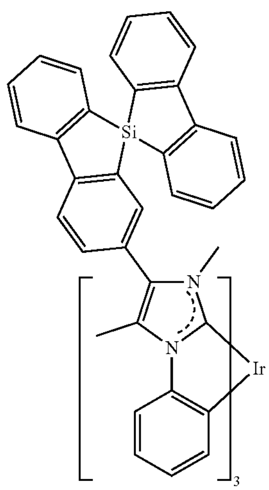
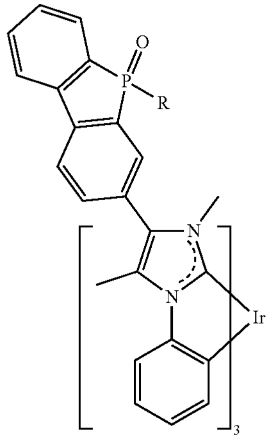
-continued
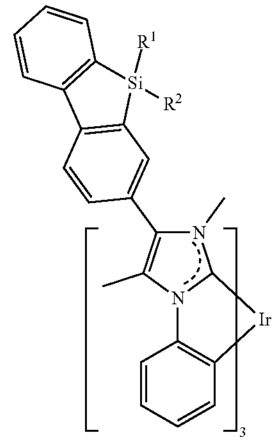
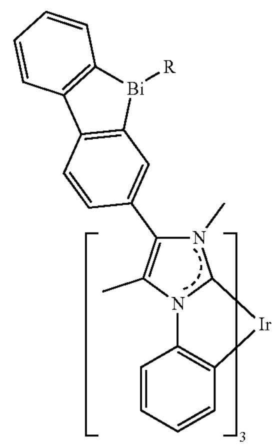
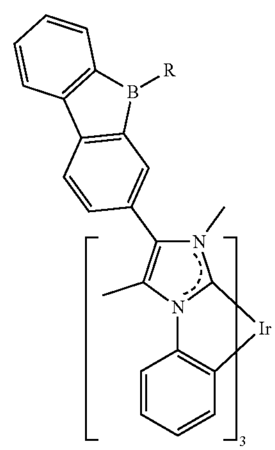
Structures Ir-5
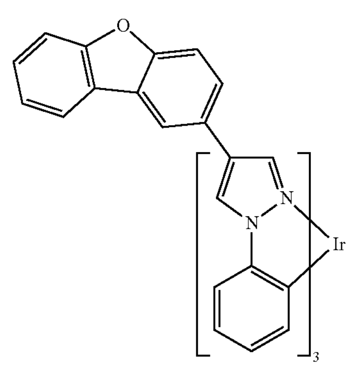

-continued
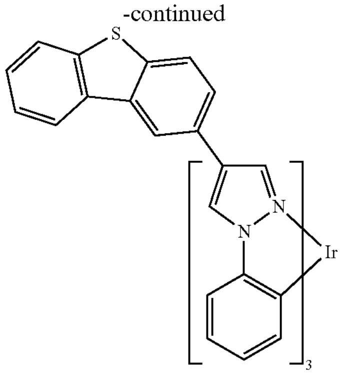
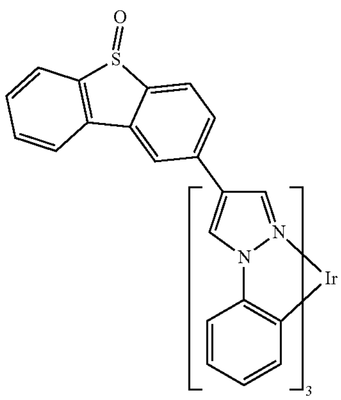
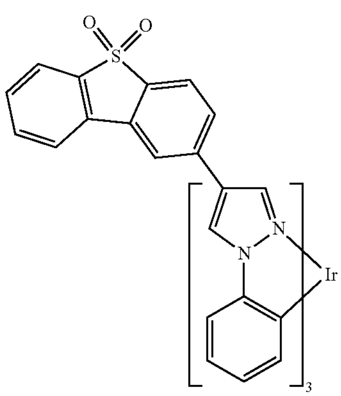
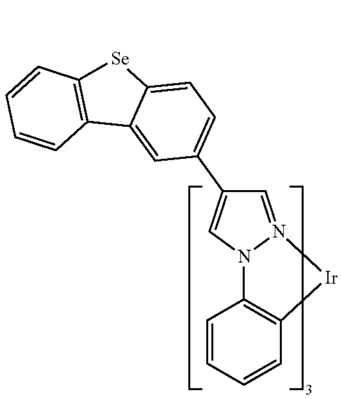
-continued
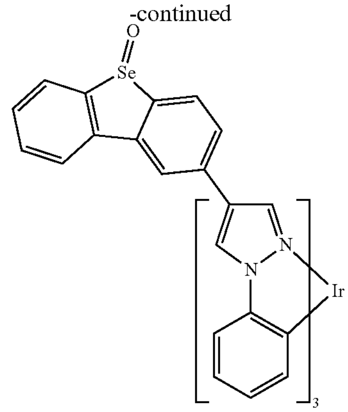
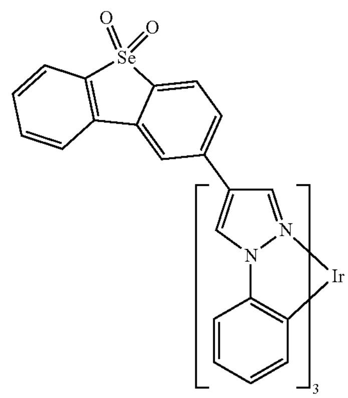
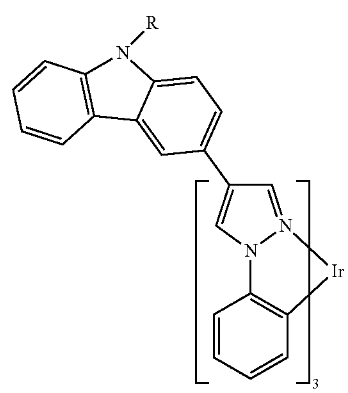
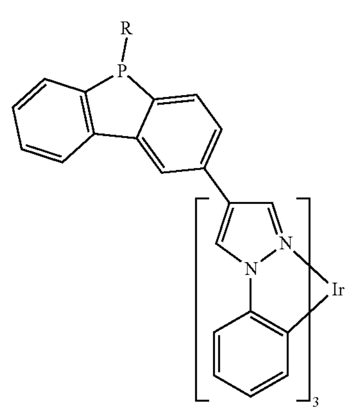

-continued
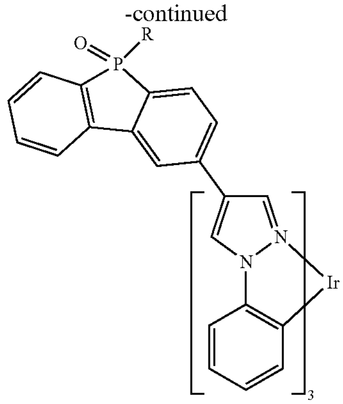
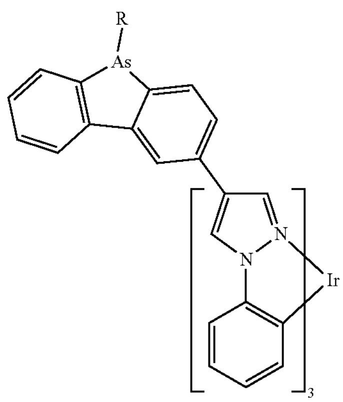
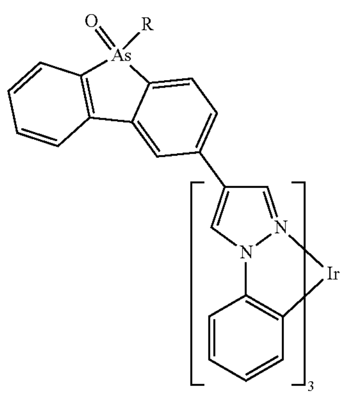
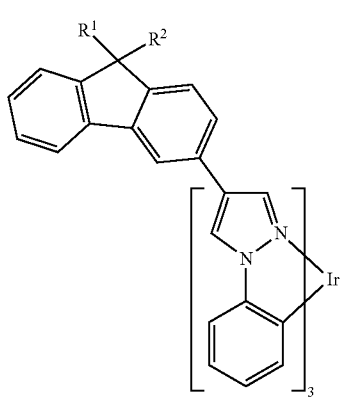
-continued
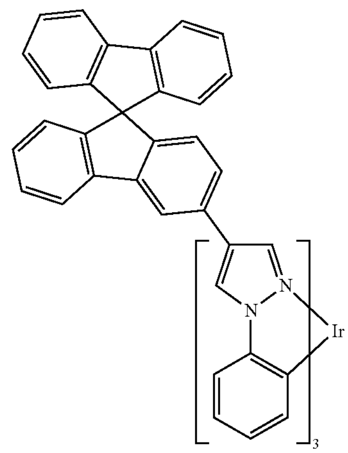
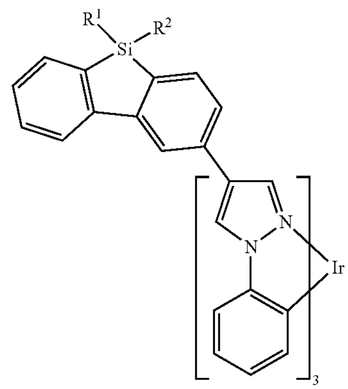
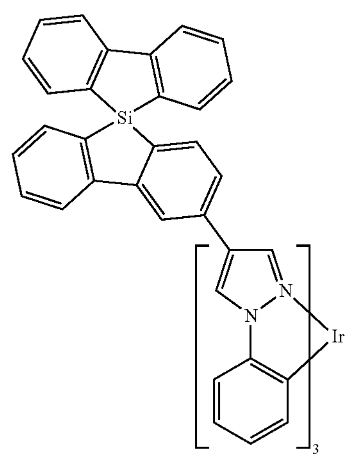
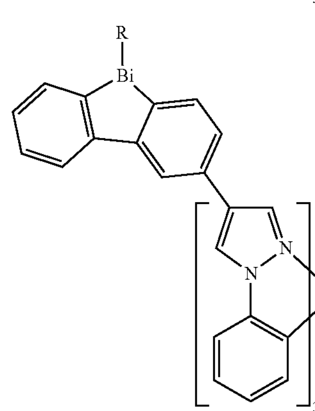

-continued
-continued
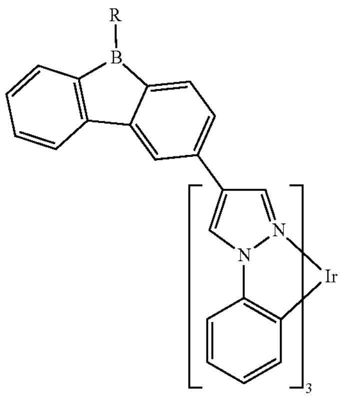
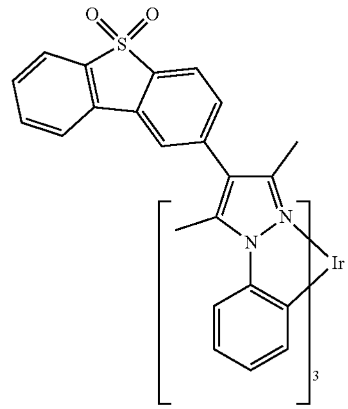
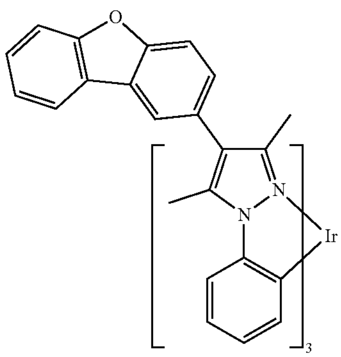
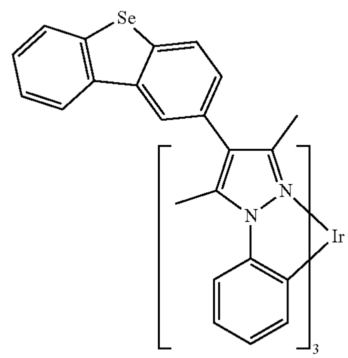
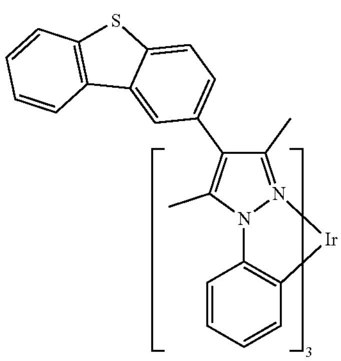
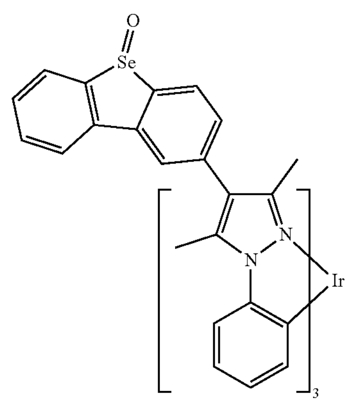
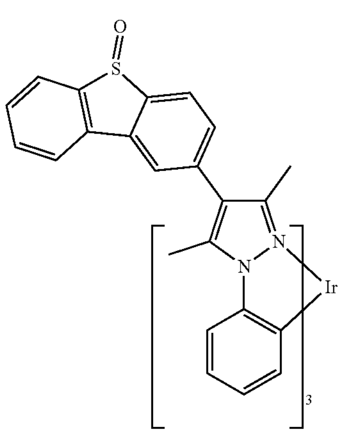
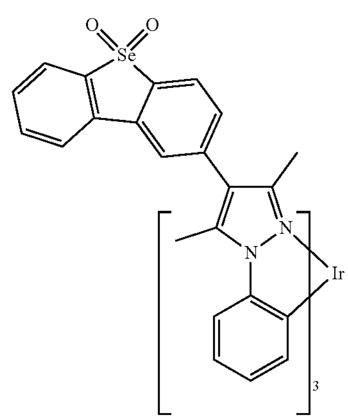

-continued
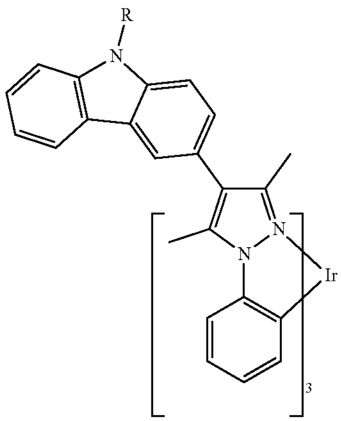
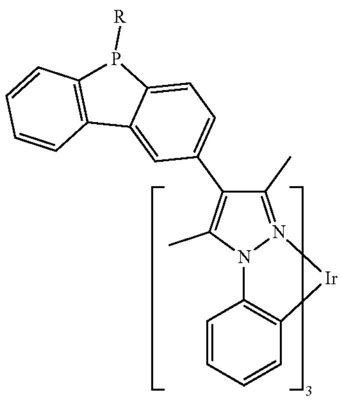
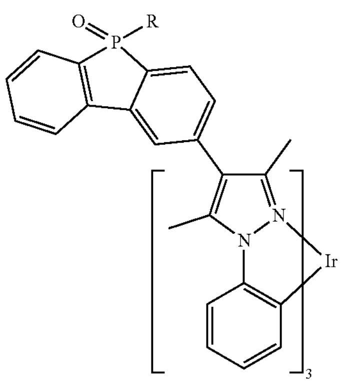
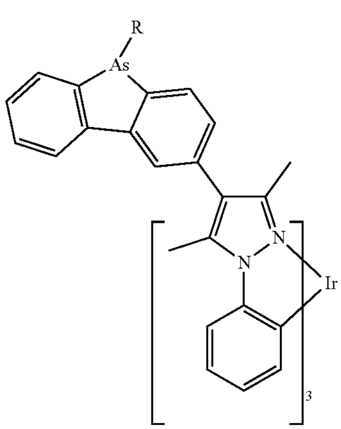
-continued
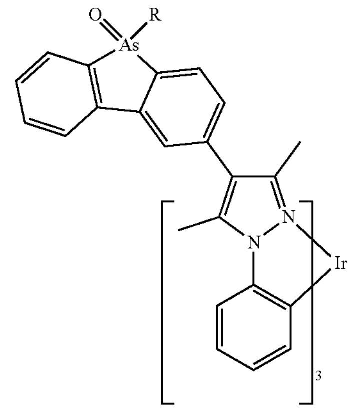
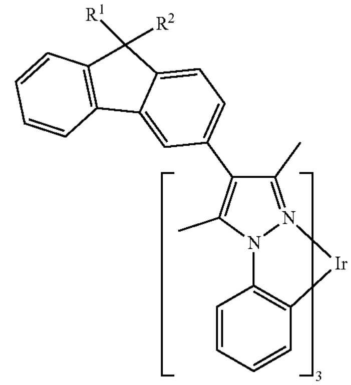
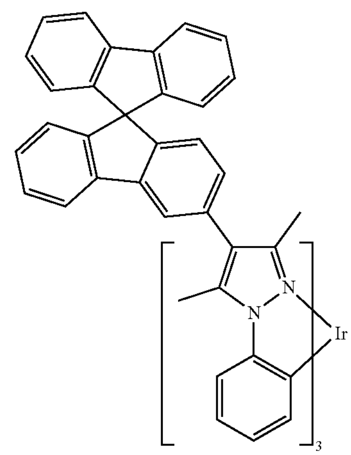
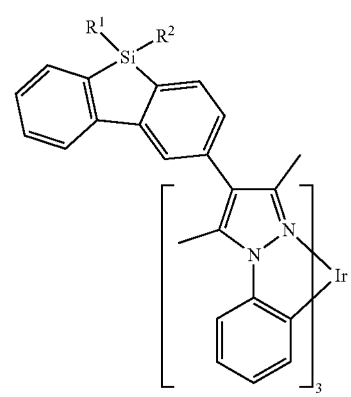

-continued
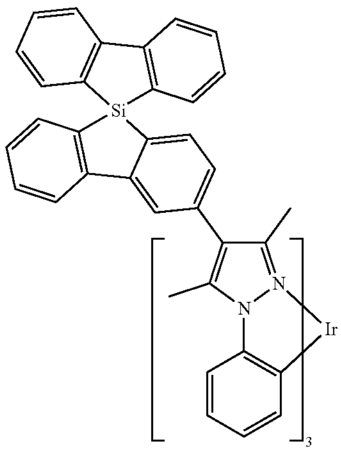
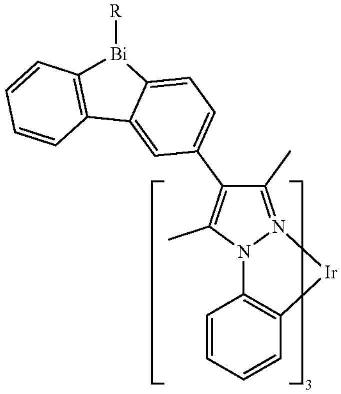
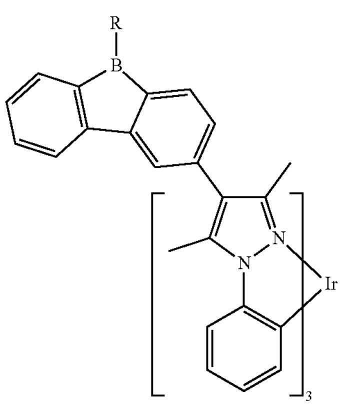
Structures Ir-6
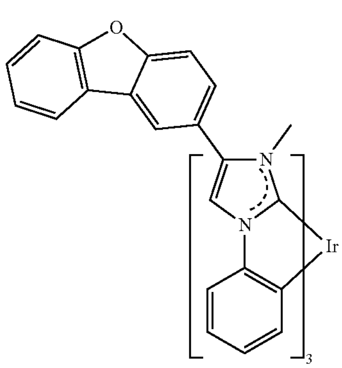
-continued
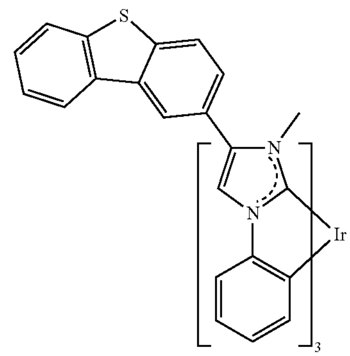
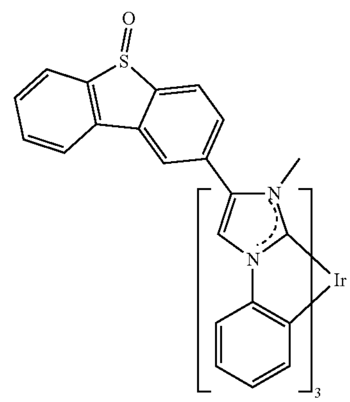
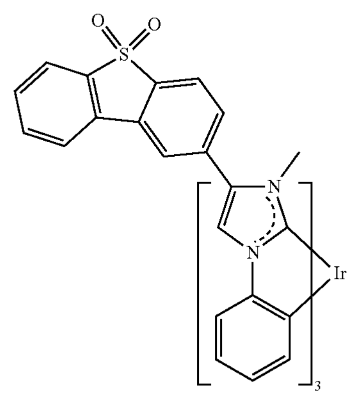
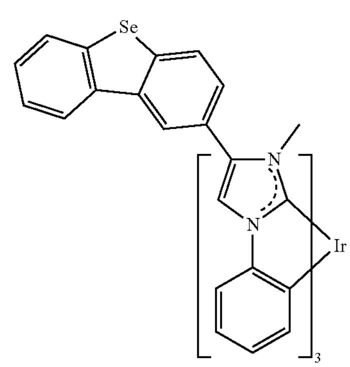

-continued
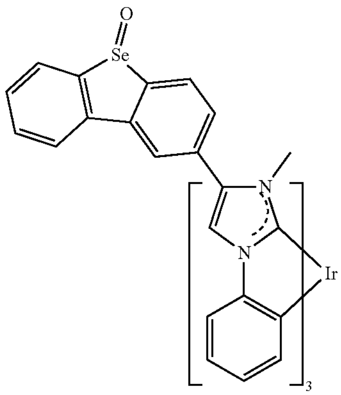
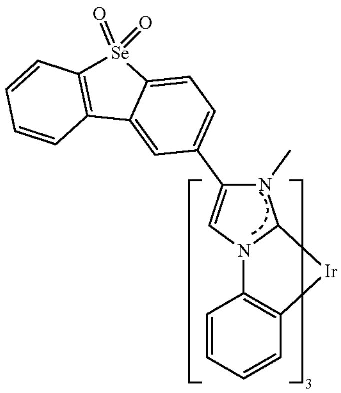
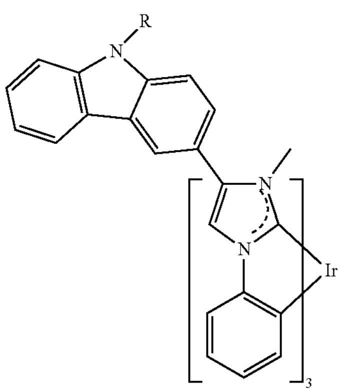
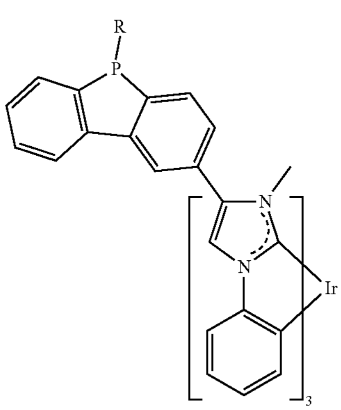
-continued
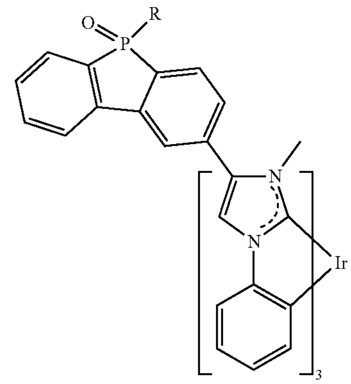
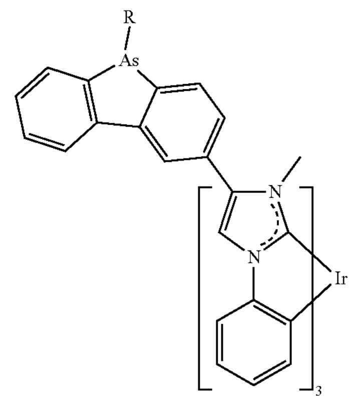
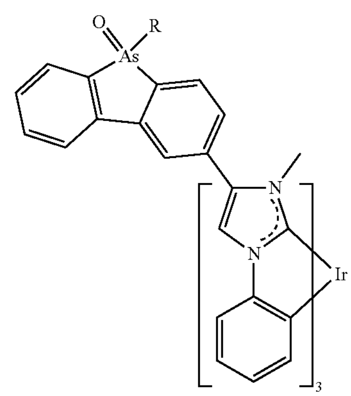
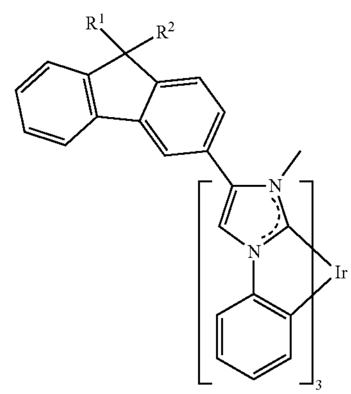

-continued
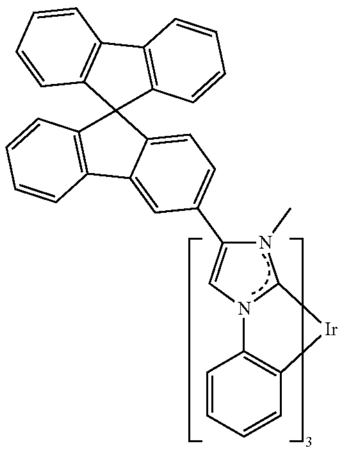
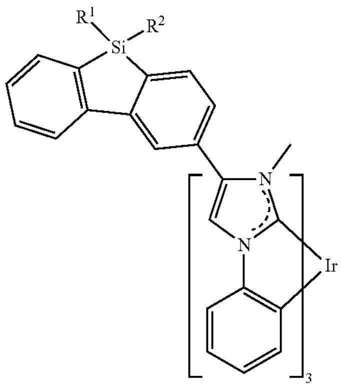
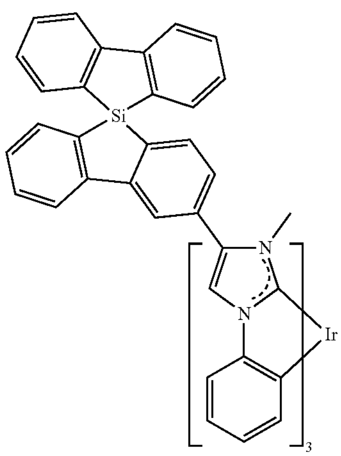
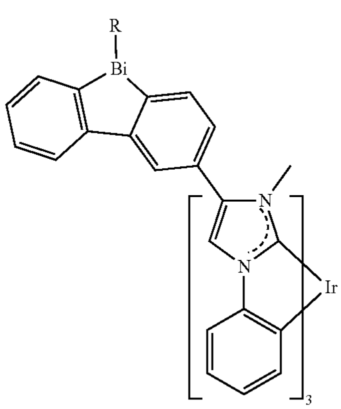
-continued
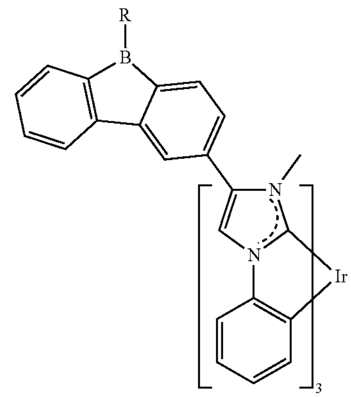
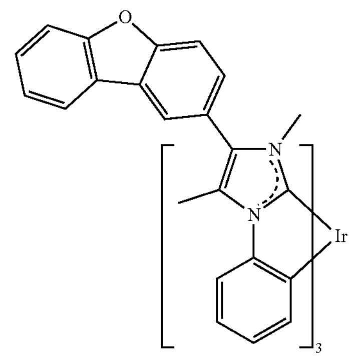
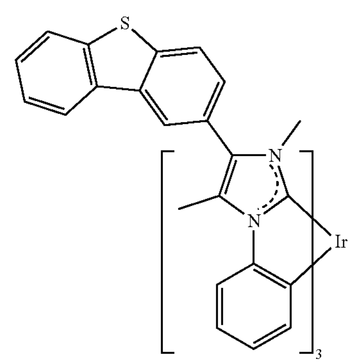
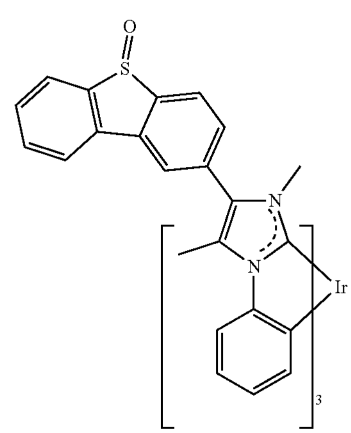

-continued
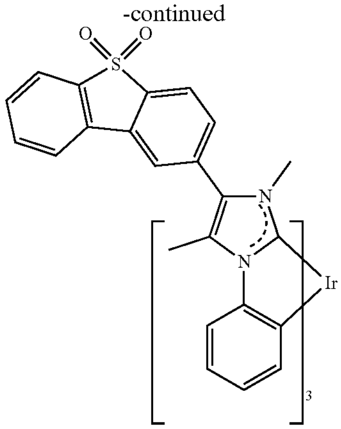
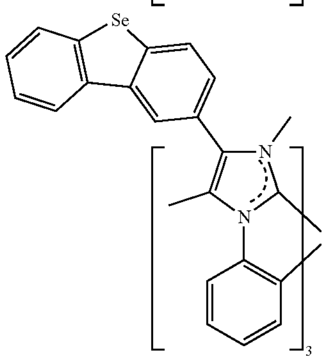
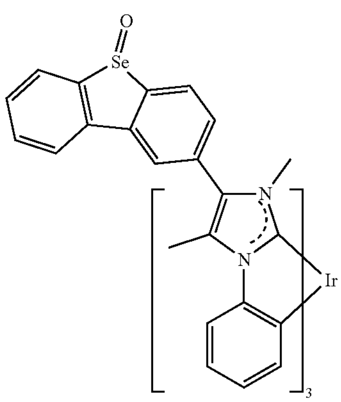
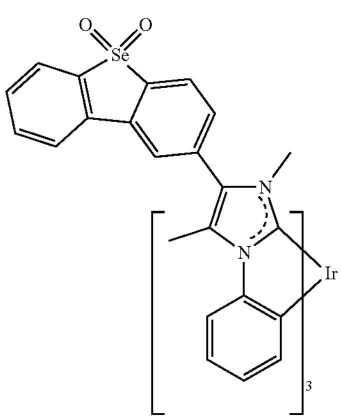
-continued
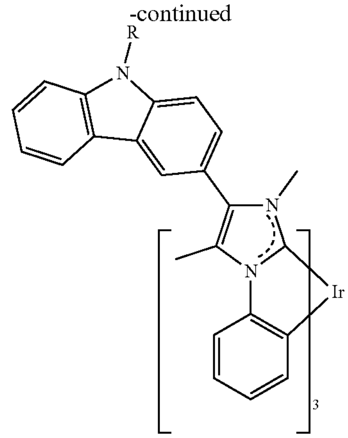
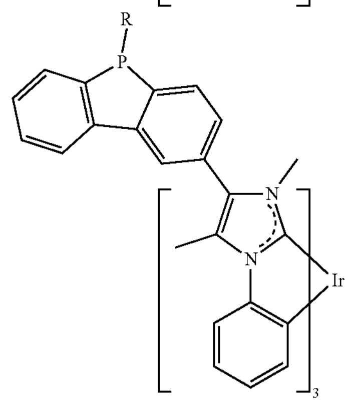
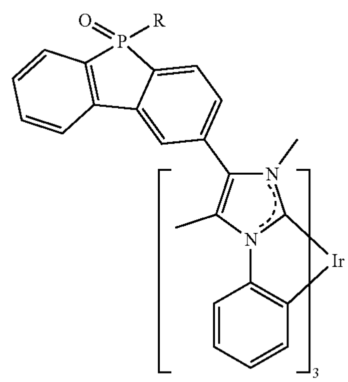
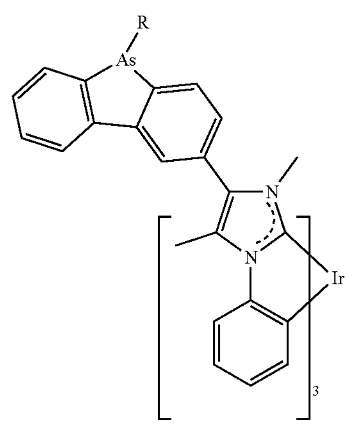

-continued
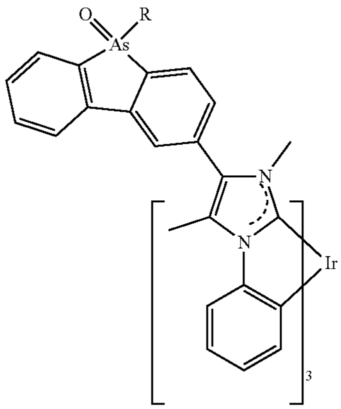
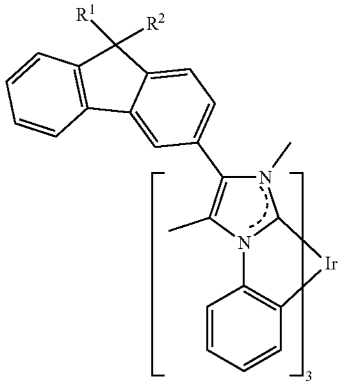
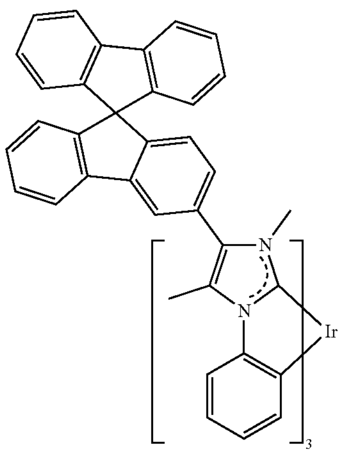
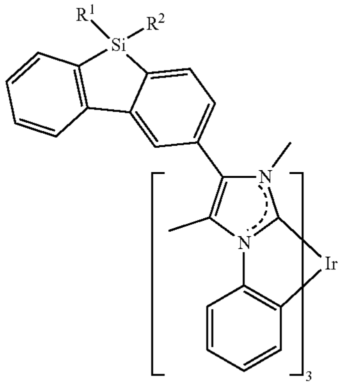
-continued
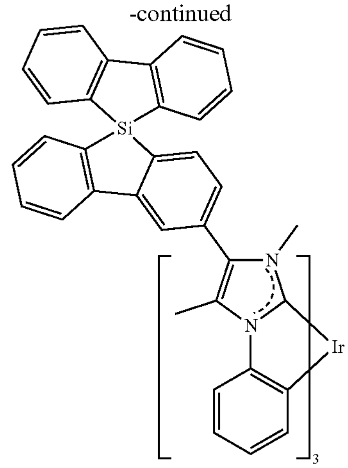
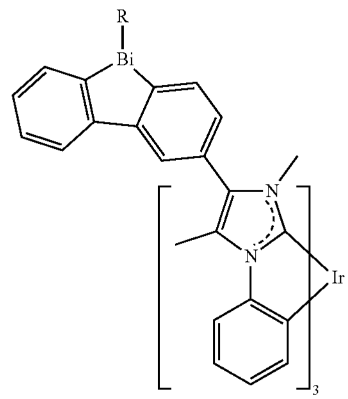
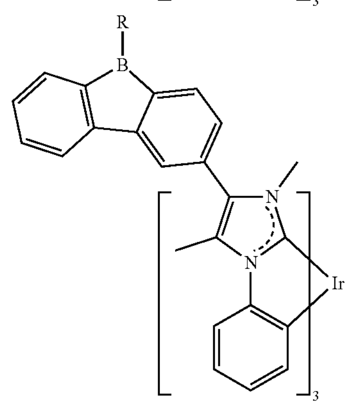
Structures Ir-7
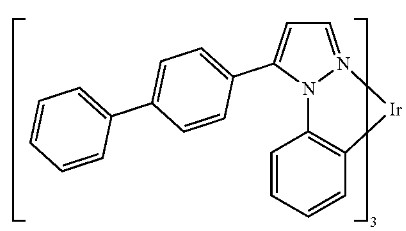
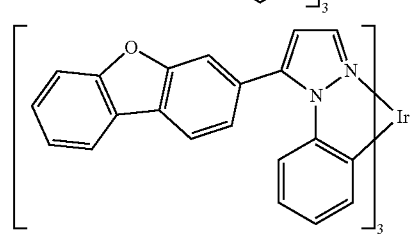

-continued
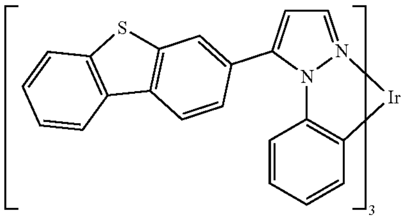
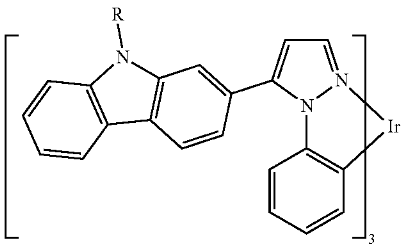
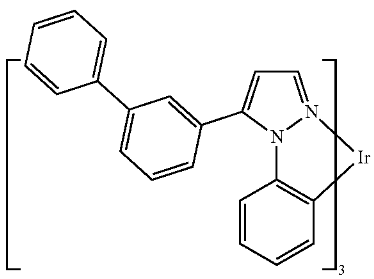
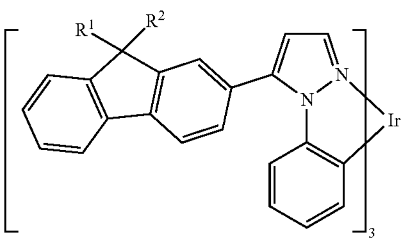
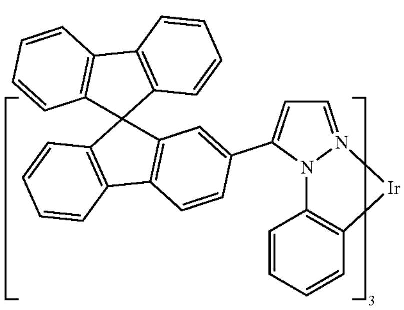
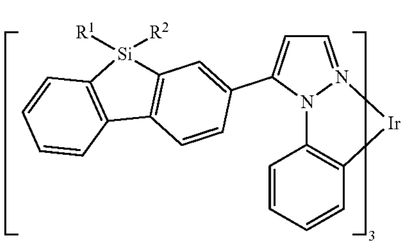
-continued
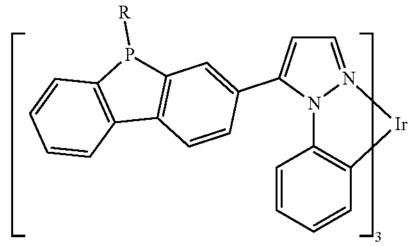
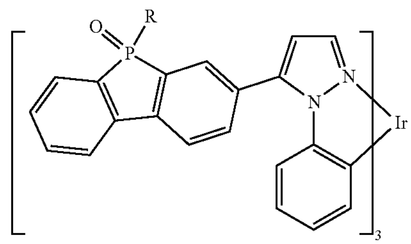
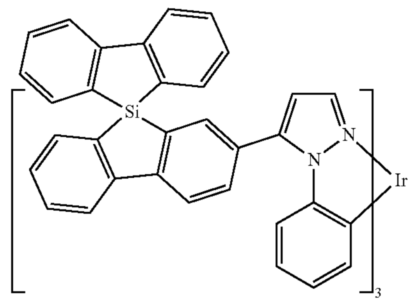
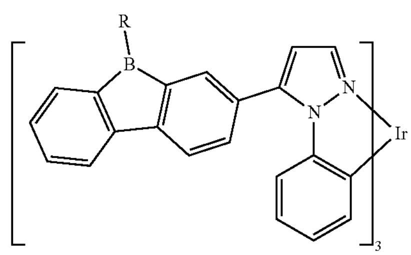
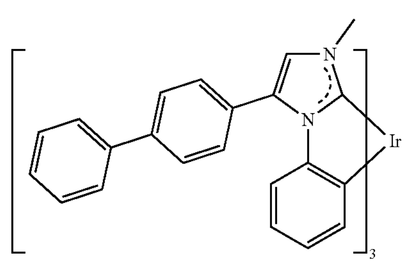
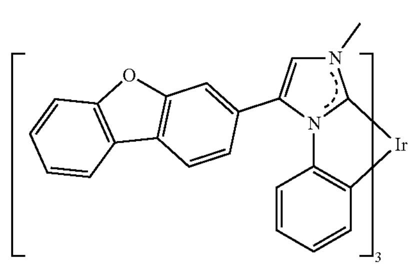

-continued
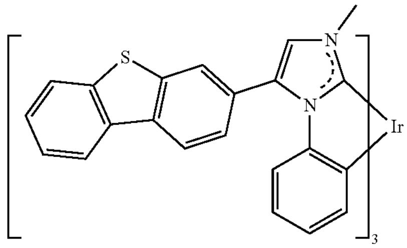
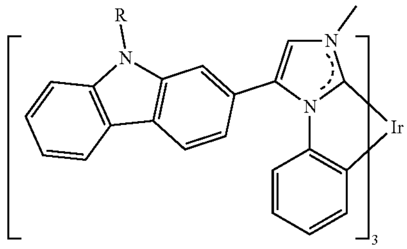
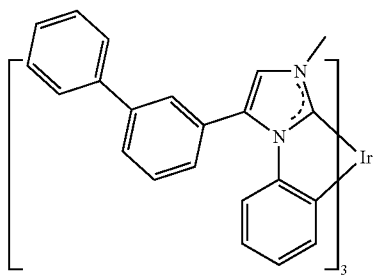
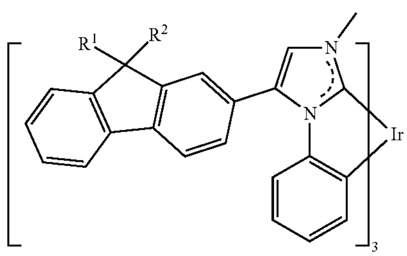
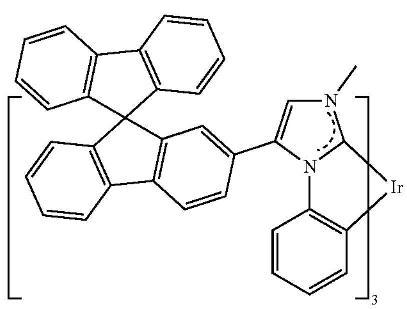
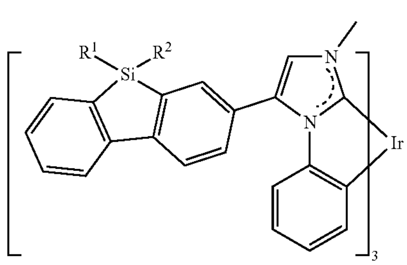
-continued
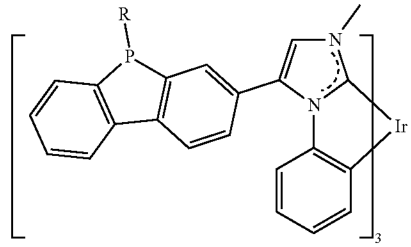
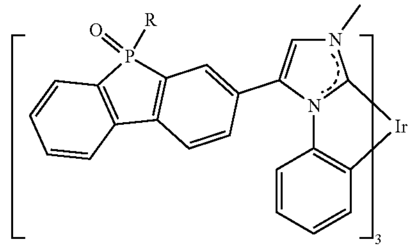
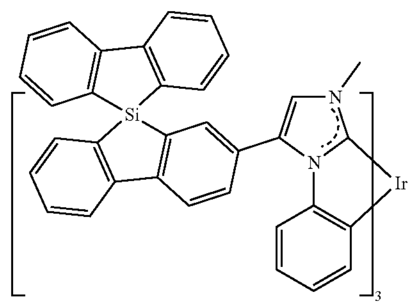
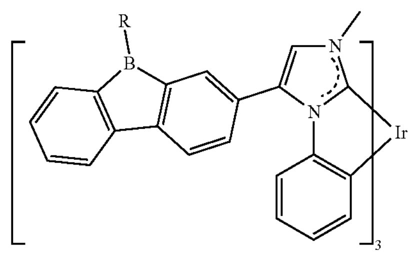
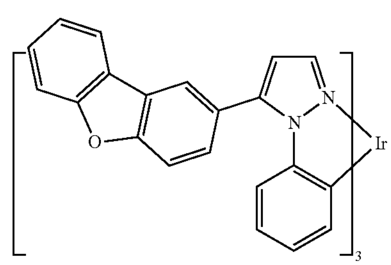
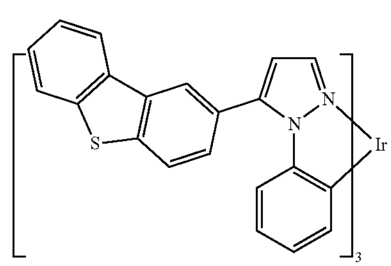

-continued
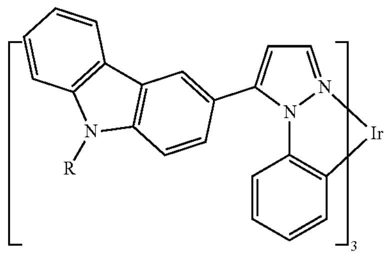
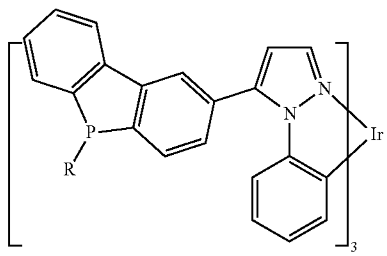
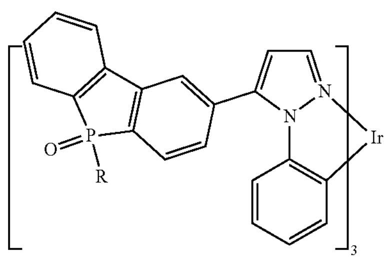
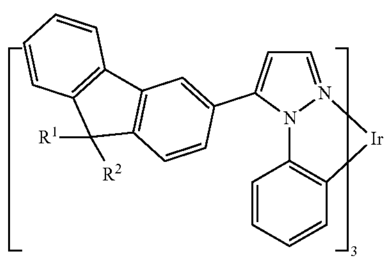
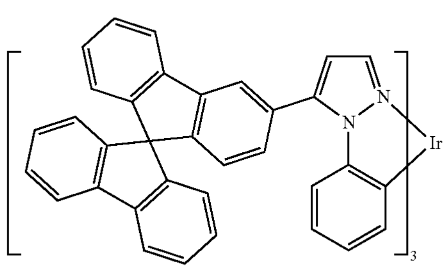
-continued
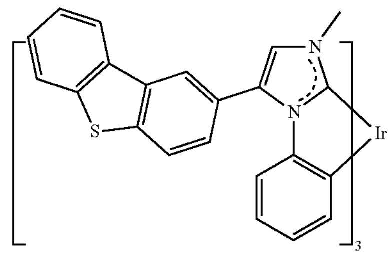
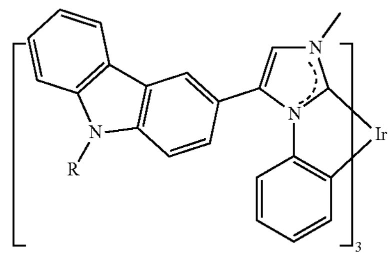
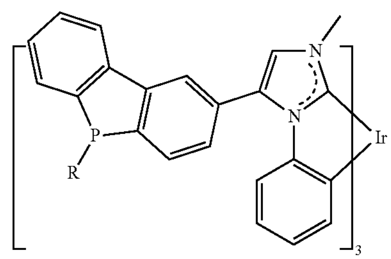
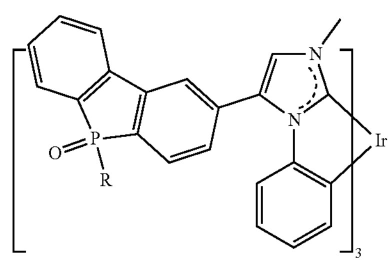
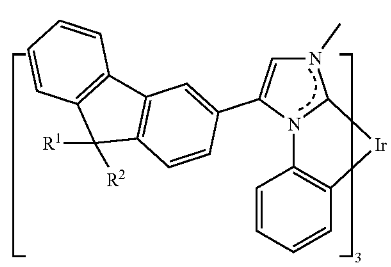
Structures Ir-8
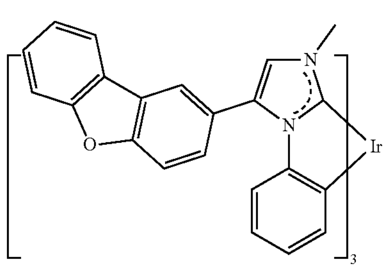
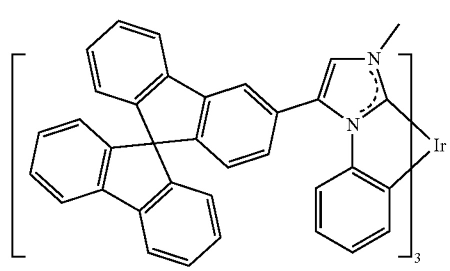

-continued
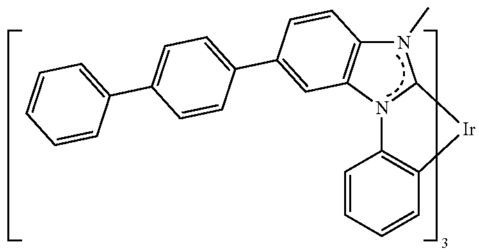
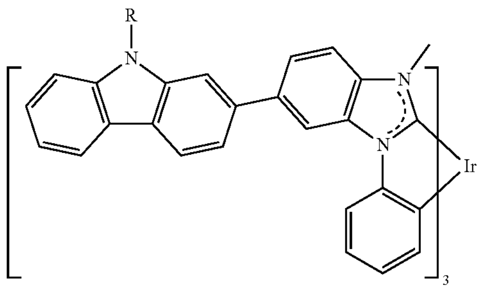
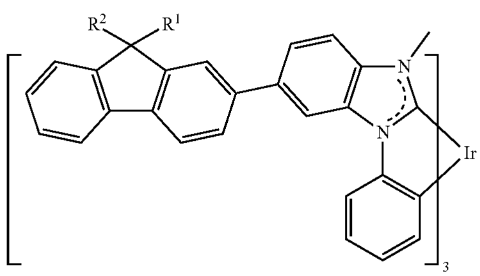
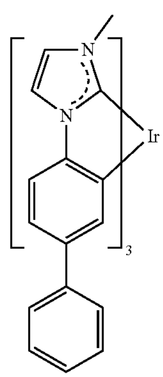
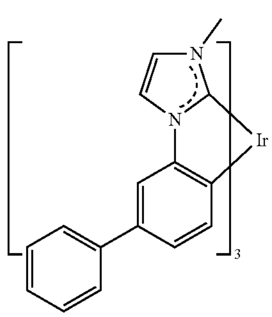
-continued
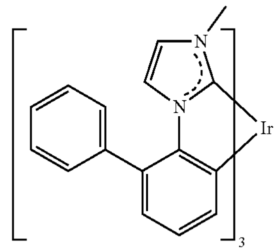
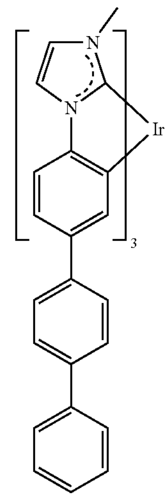
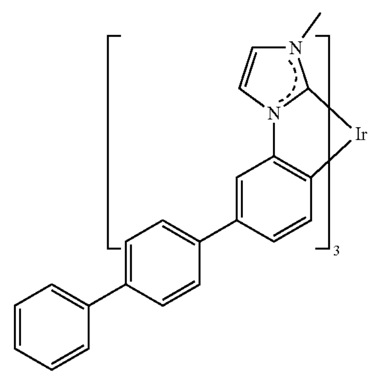
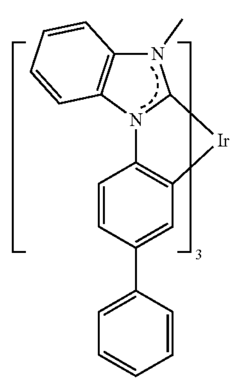

-continued
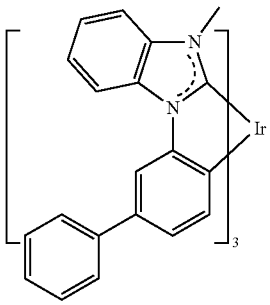
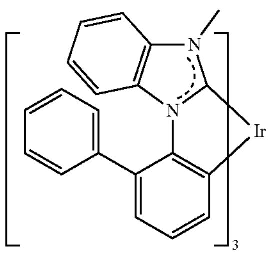
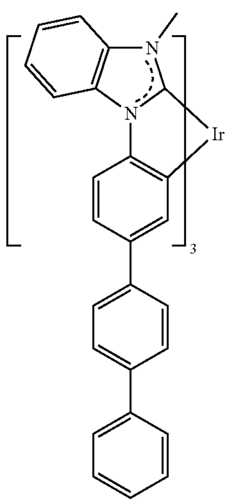
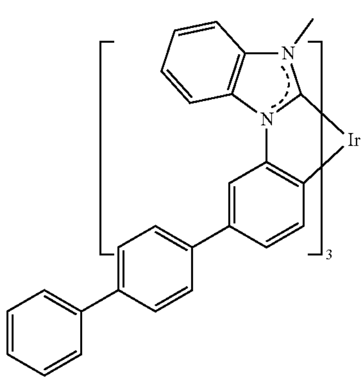
-continued
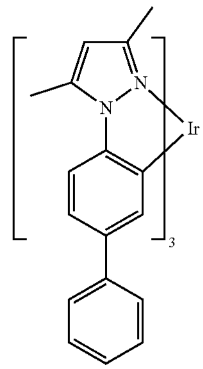
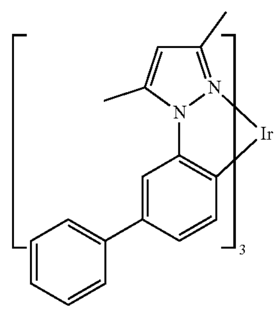
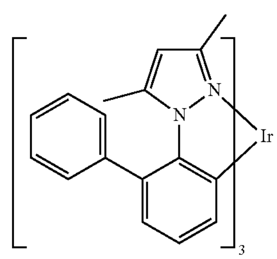
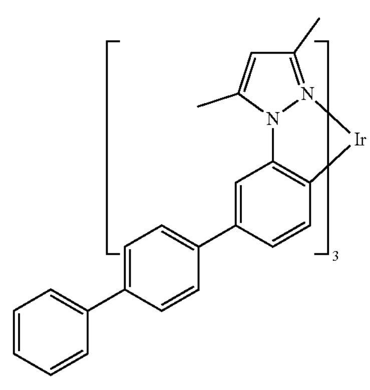

-continued
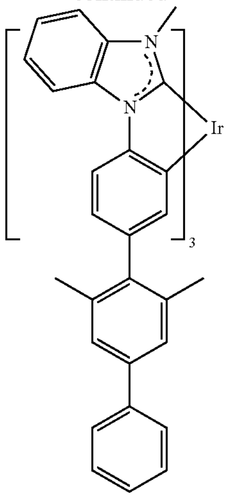
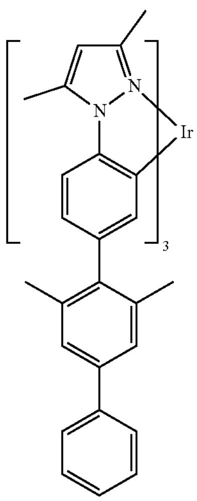
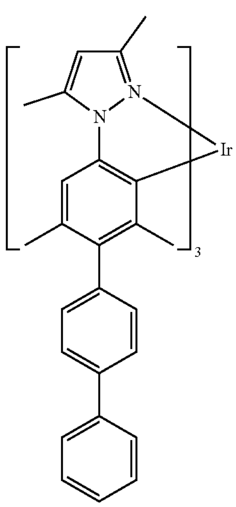
-continued
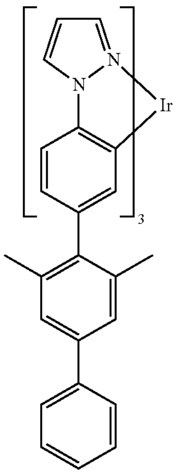
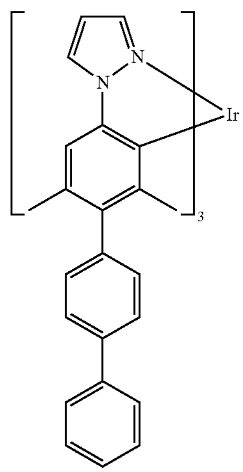
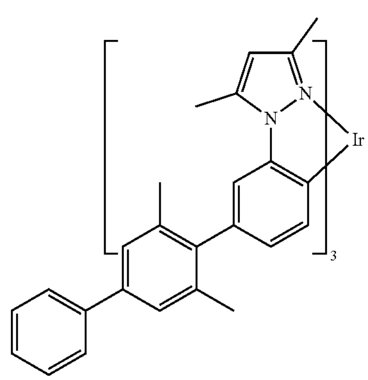

Structures Ir-9
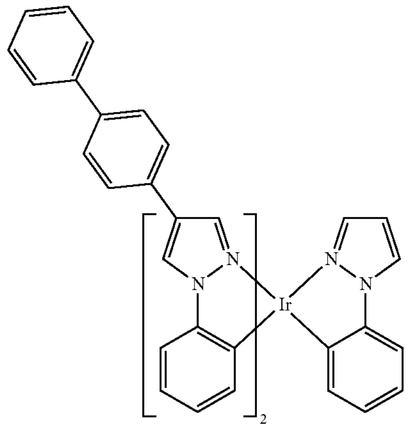
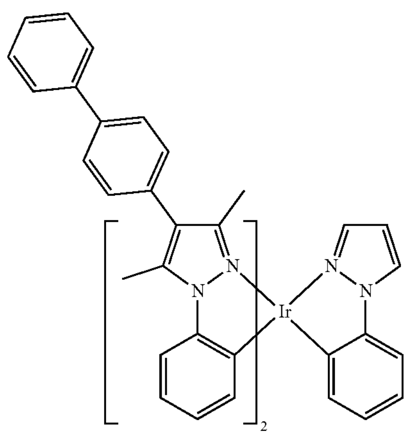
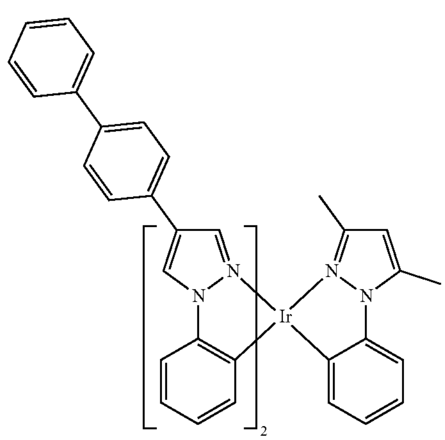
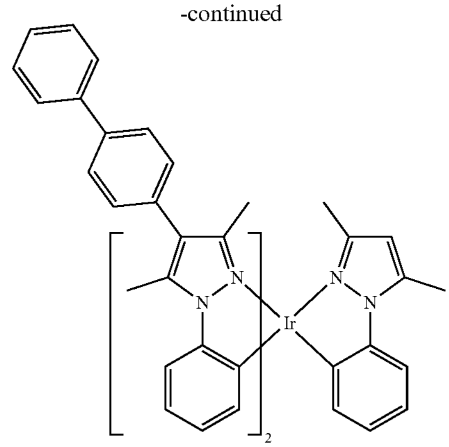
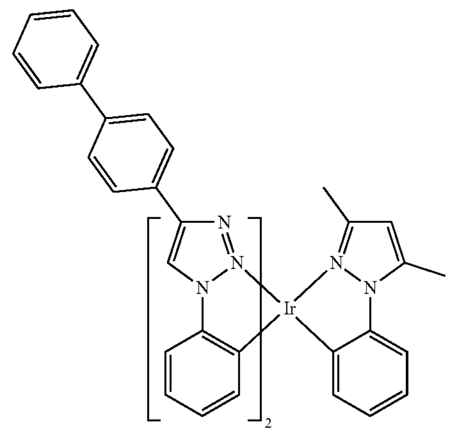
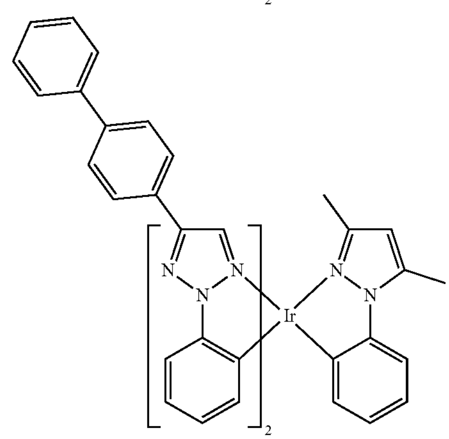
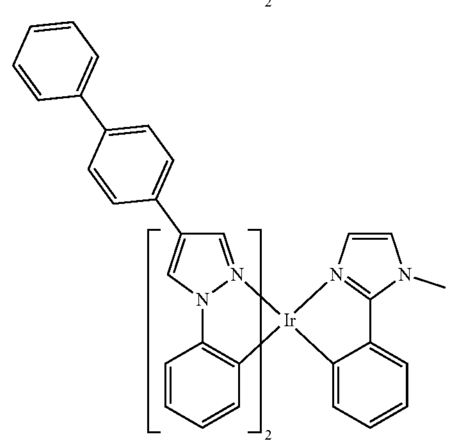

-continued
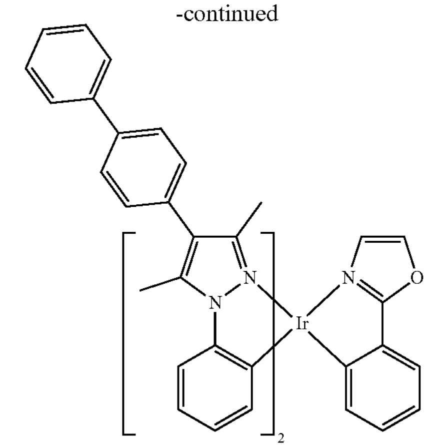
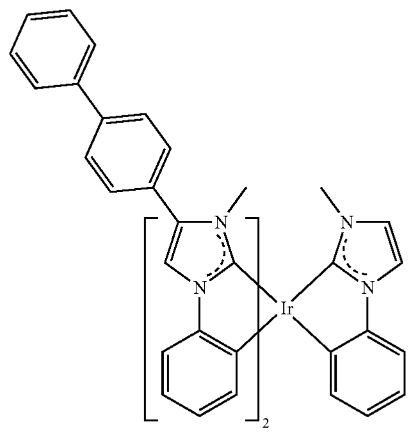
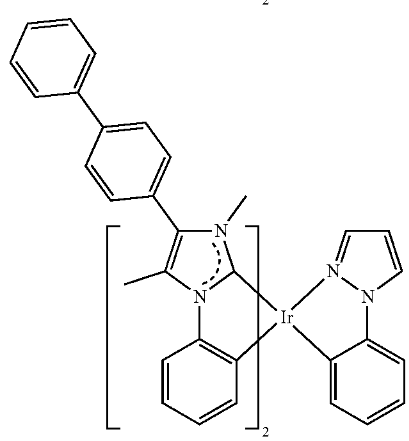
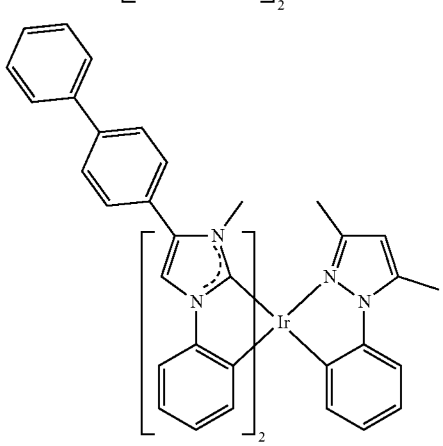
-continued
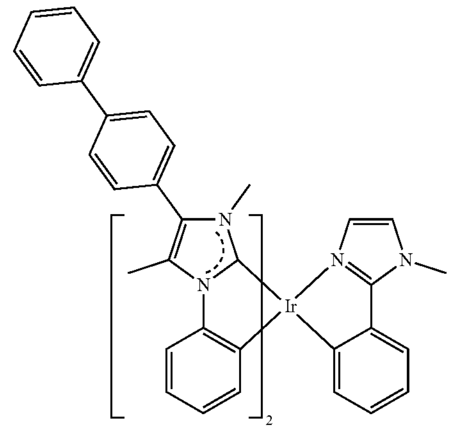
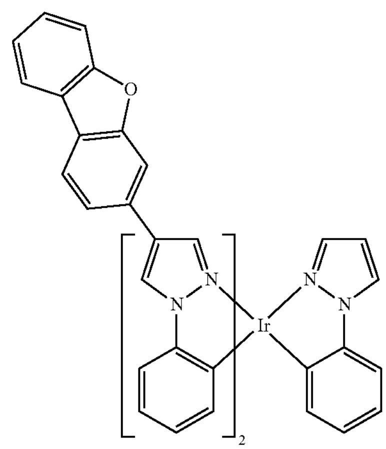
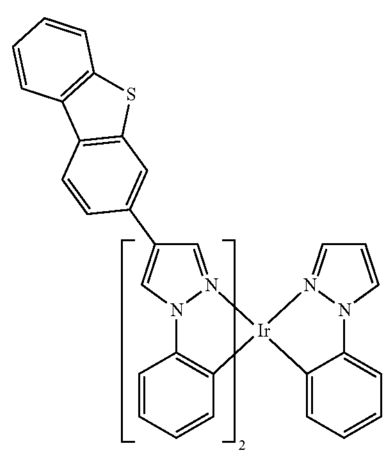

-continued
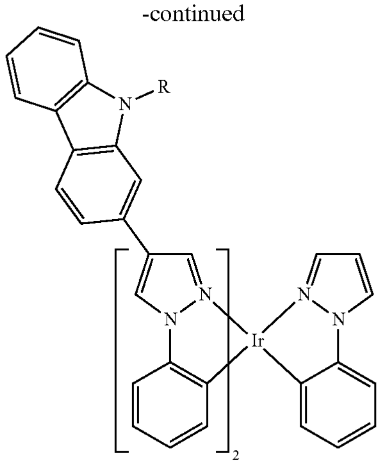
-continued
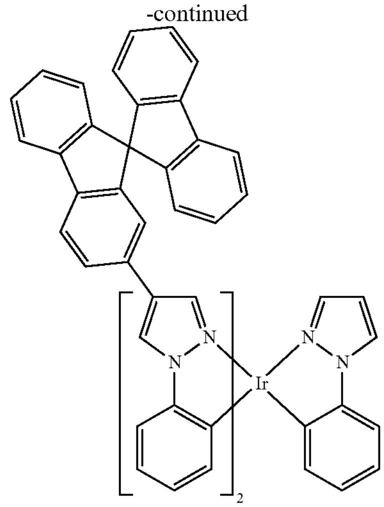
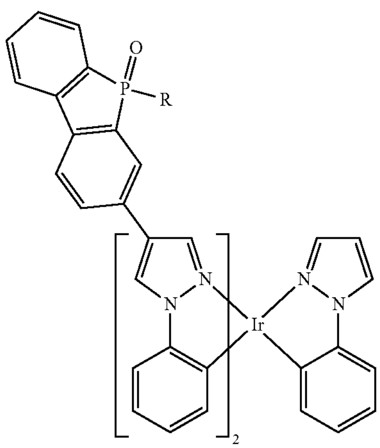
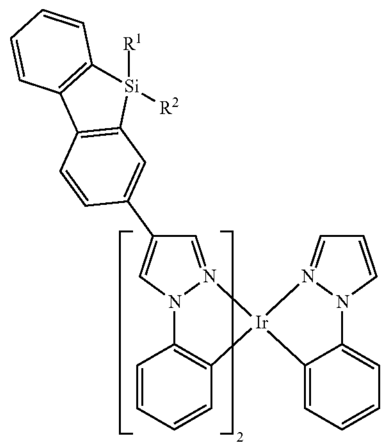
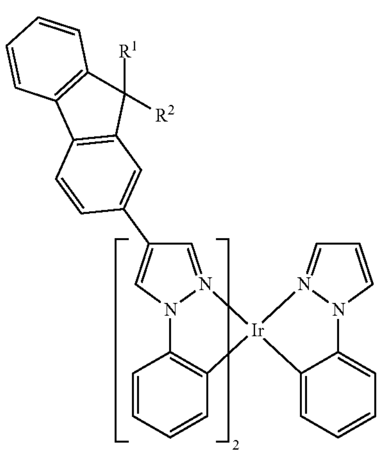
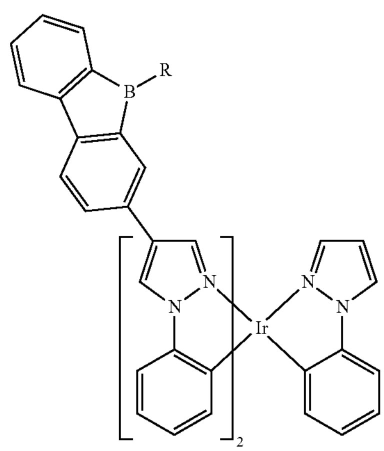

-continued
Structures Ir-10
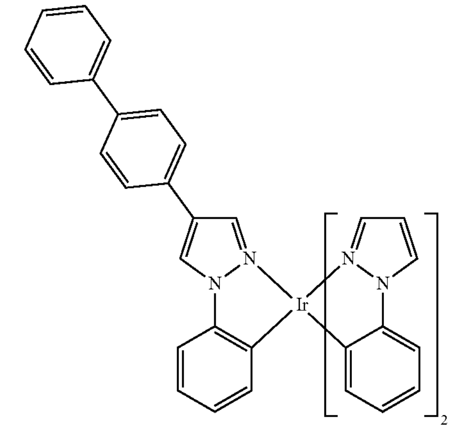
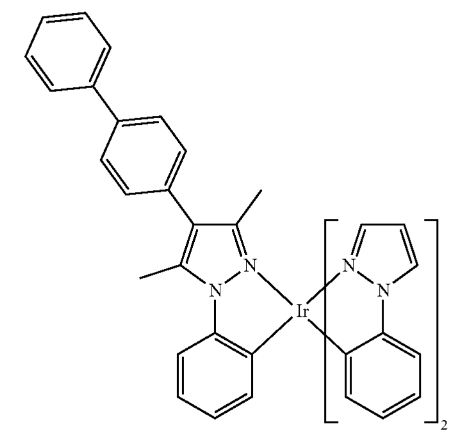
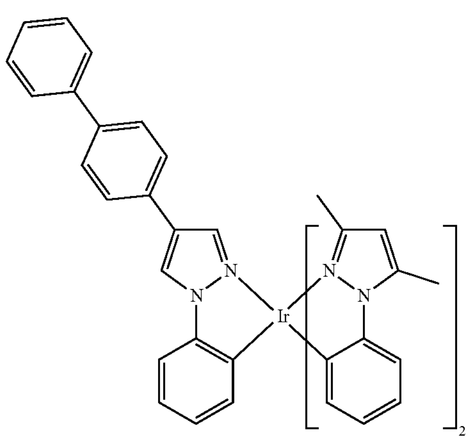
-continued
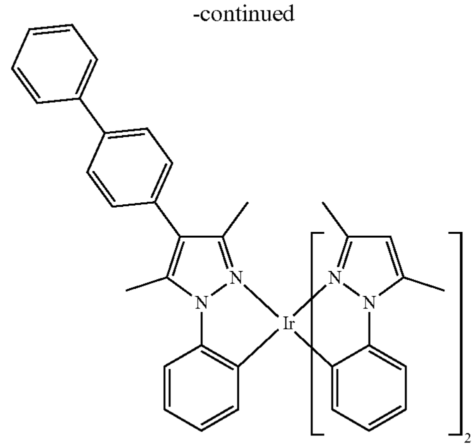
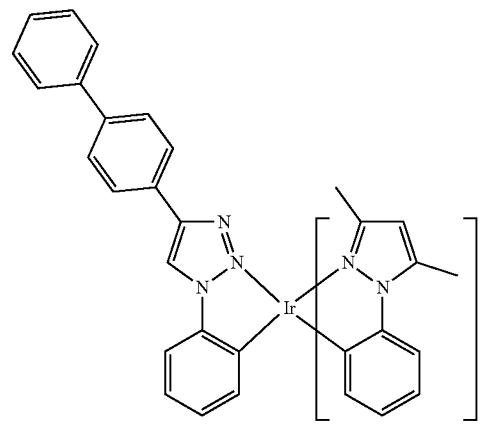
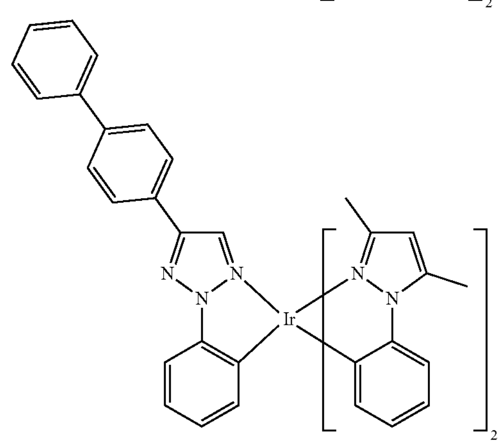
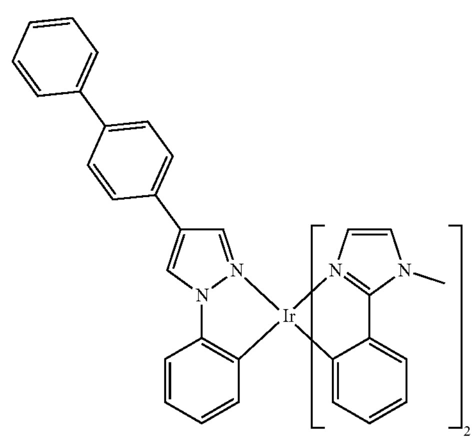

-continued
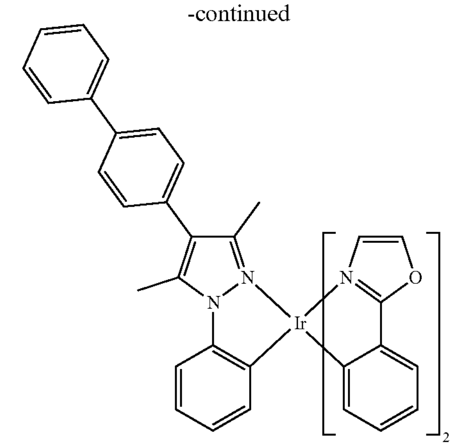
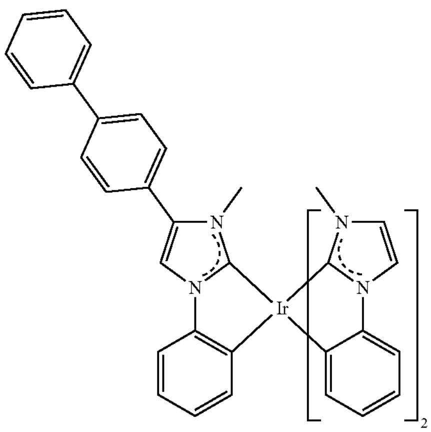
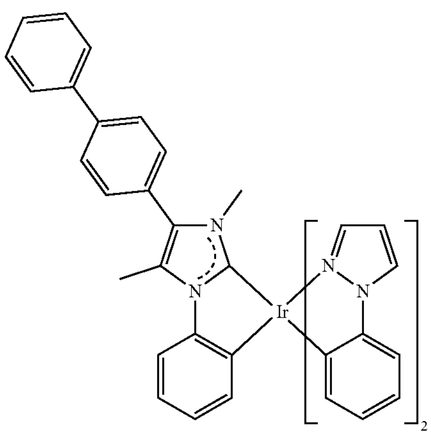
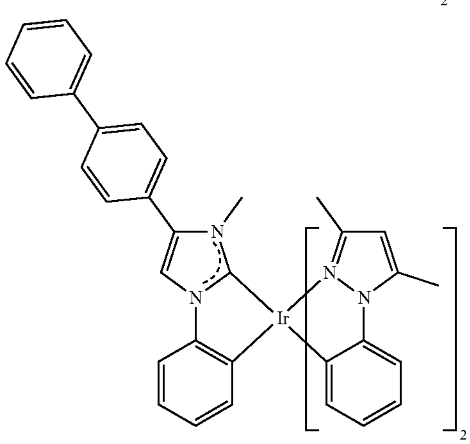
-continued
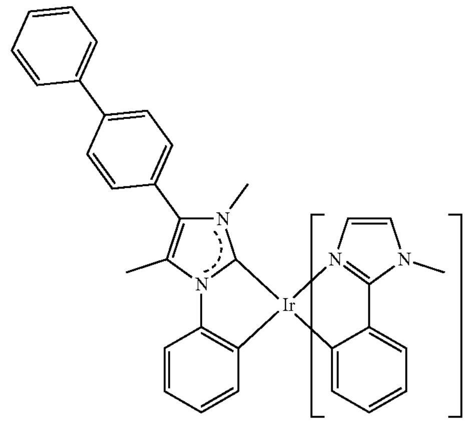
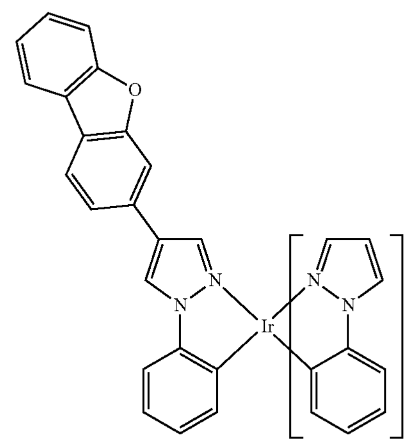
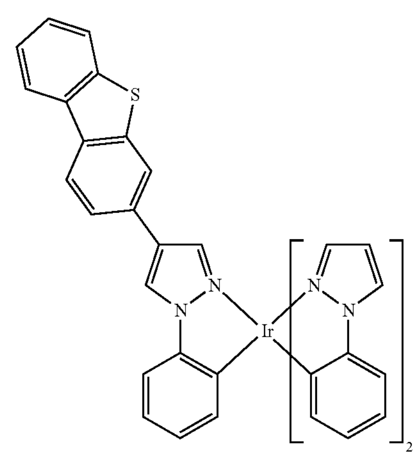

-continued
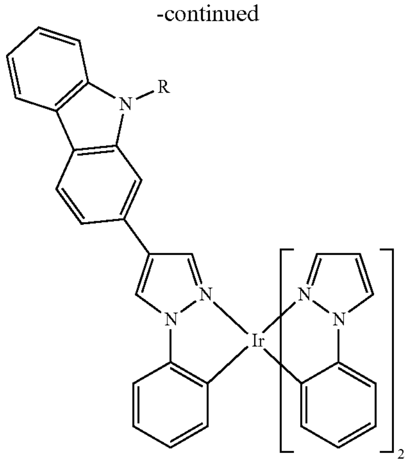
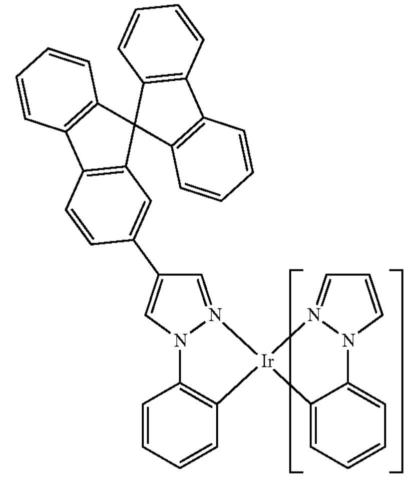
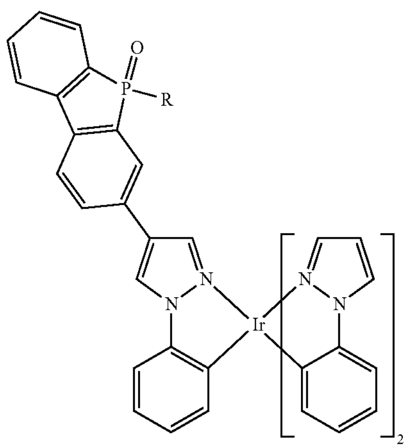
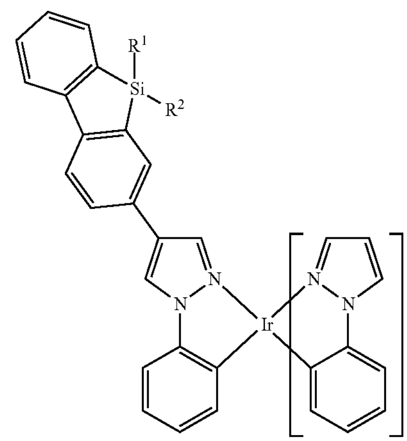
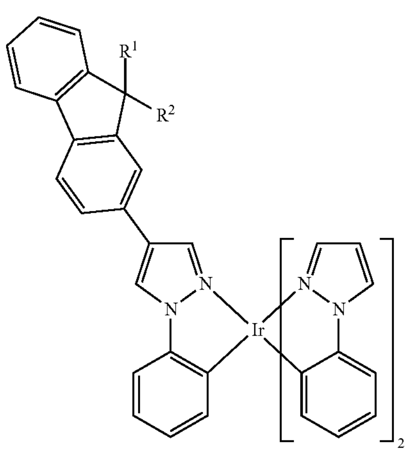
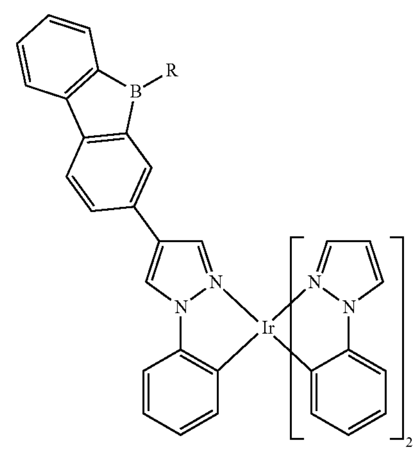

-continued
Structures Ir-11
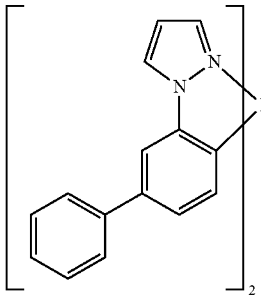
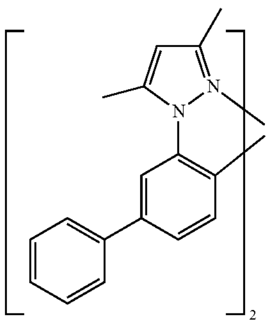
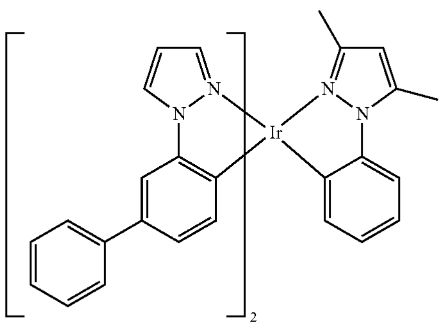
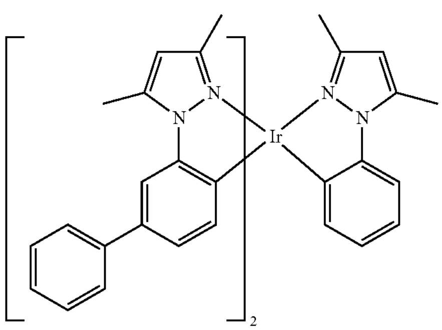
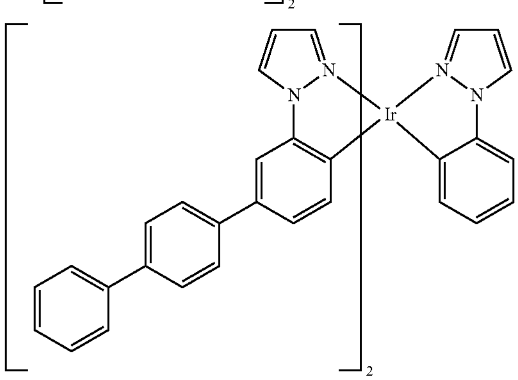
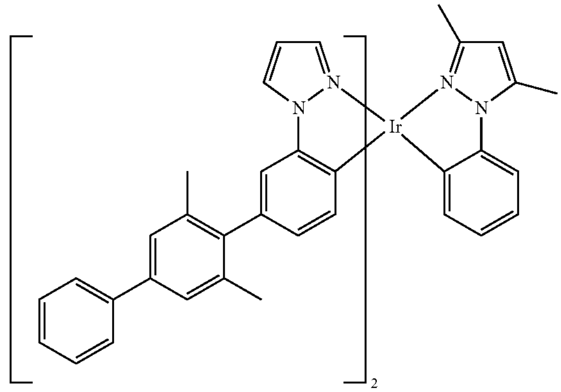
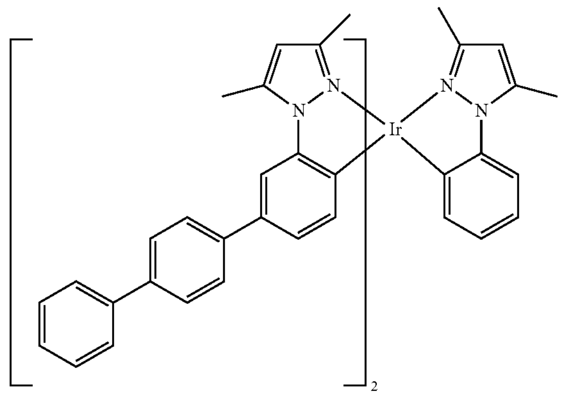
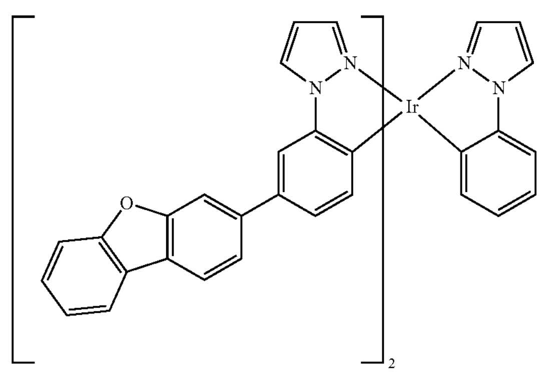
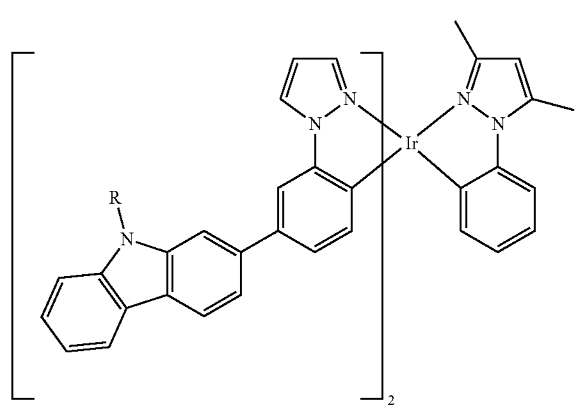

-continued
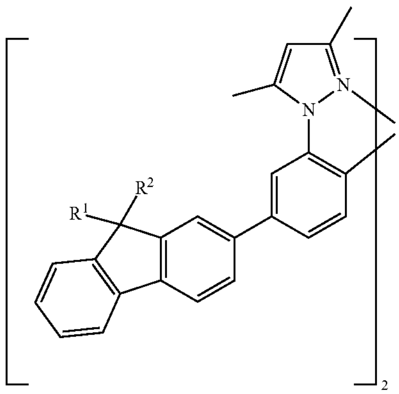
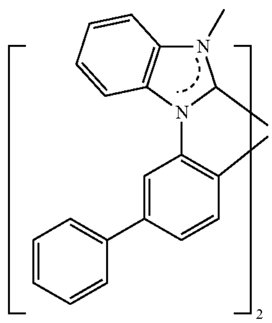
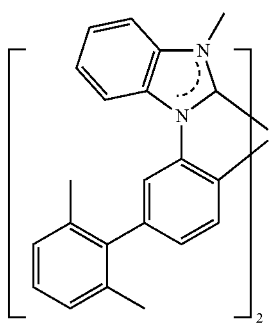
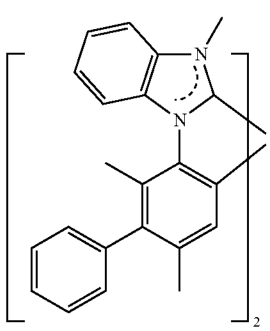
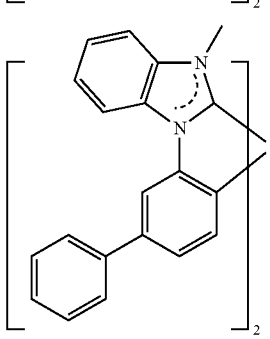
-continued
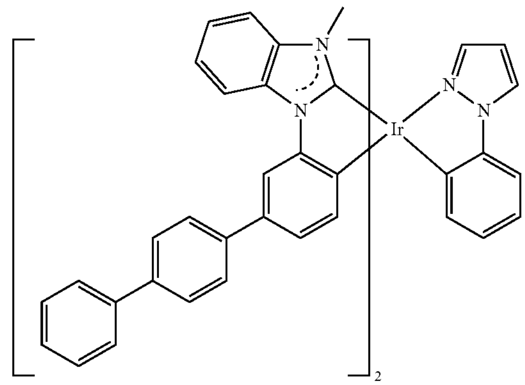
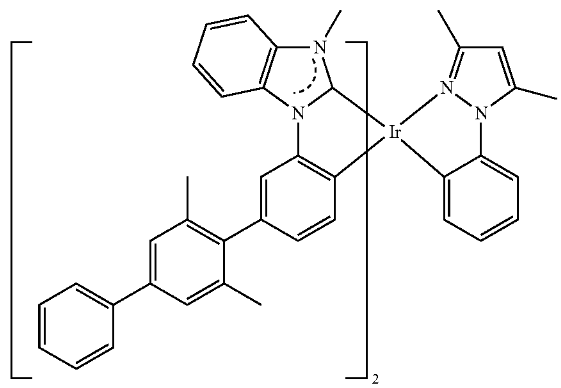
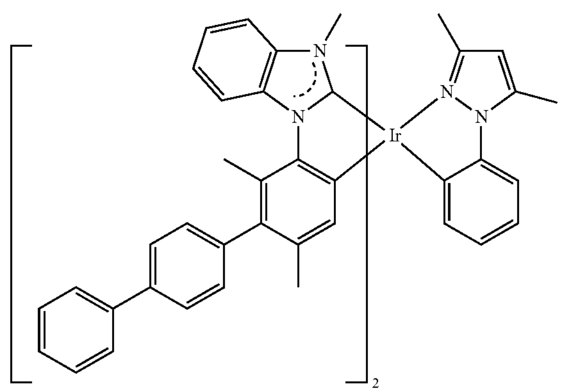
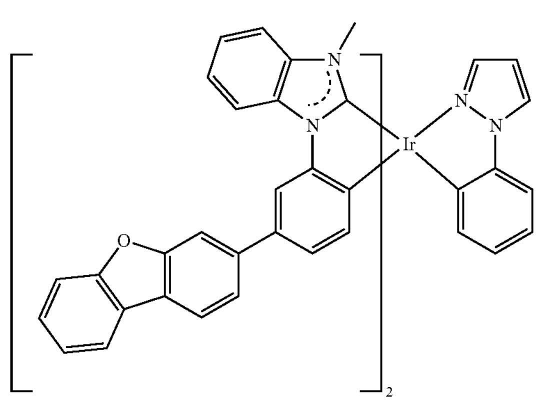

-continued
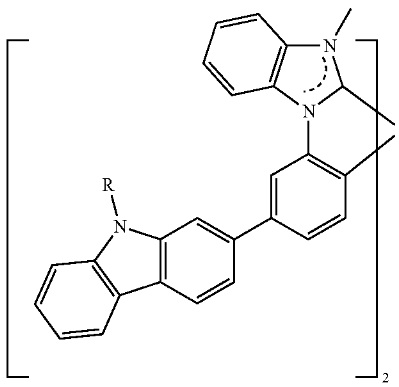
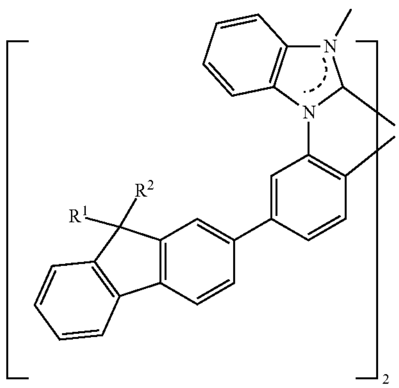
Structures Ir-12
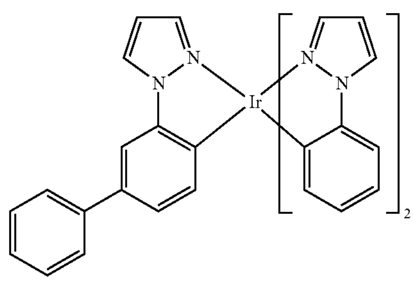
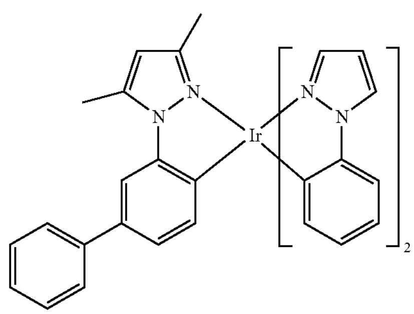
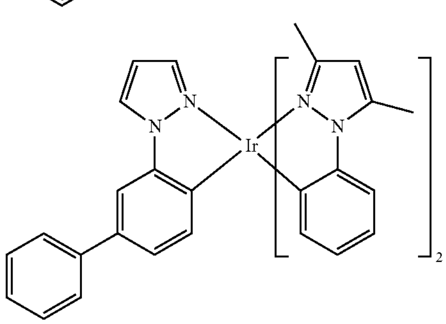
-continued
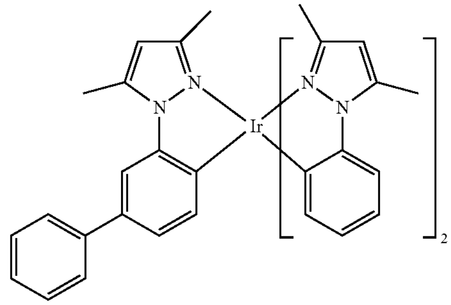
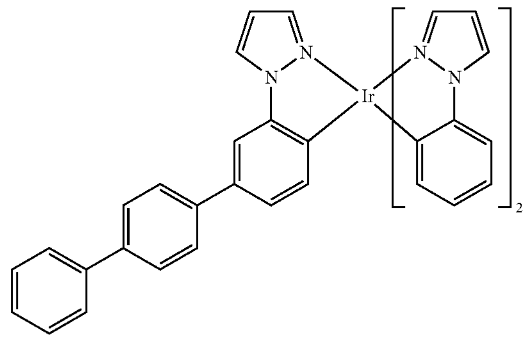
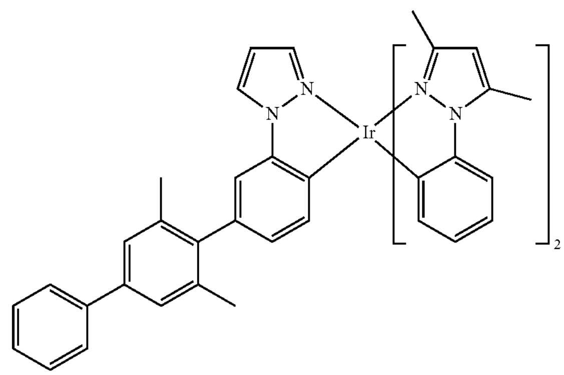
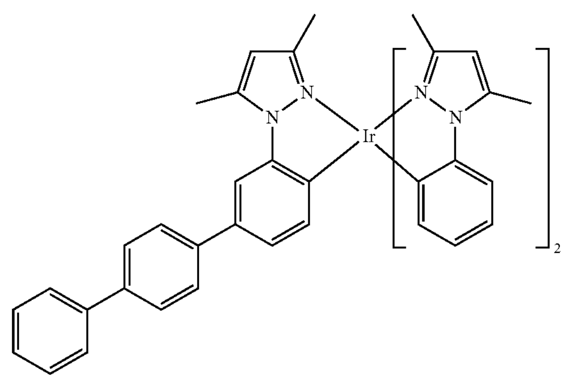
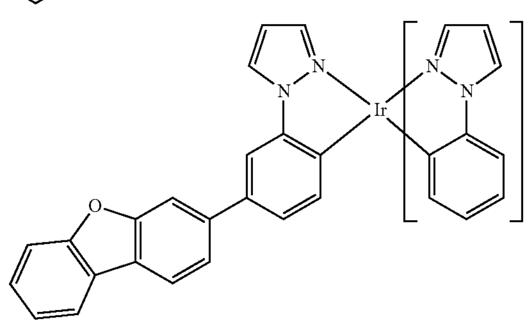

-continued
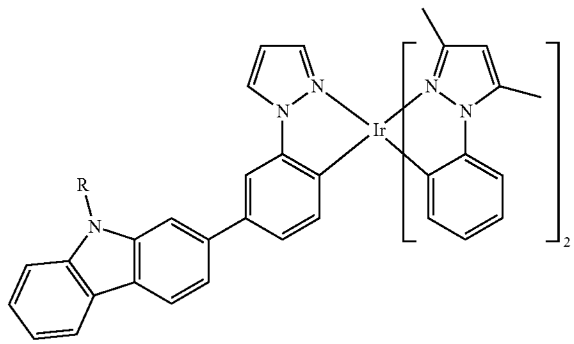
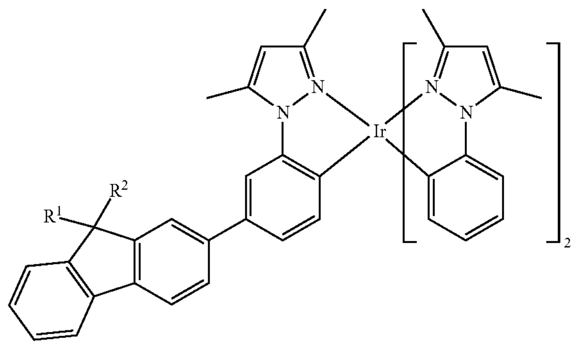
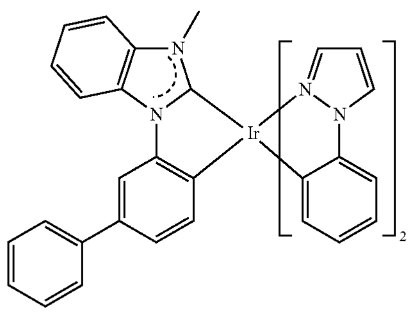
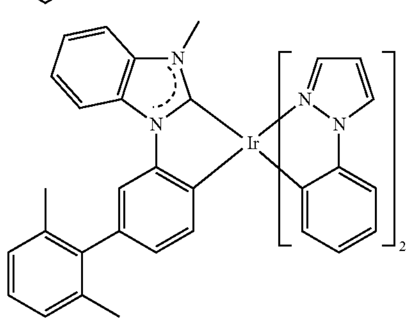
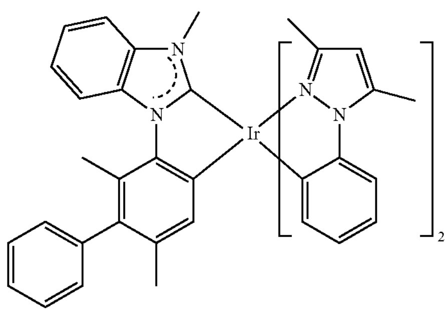
-continued
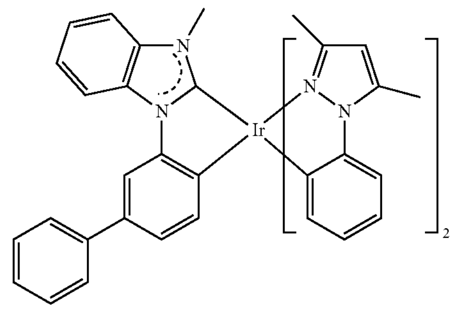
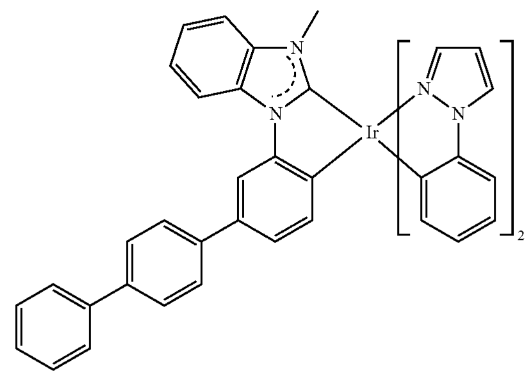
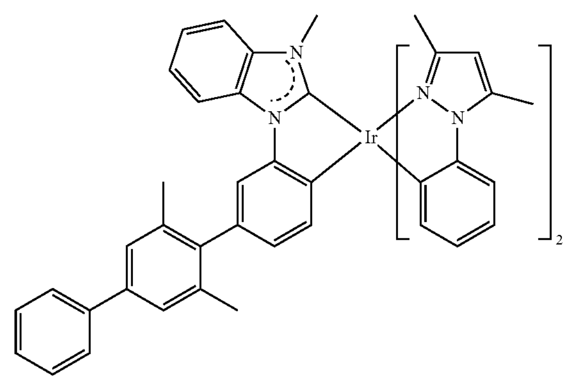
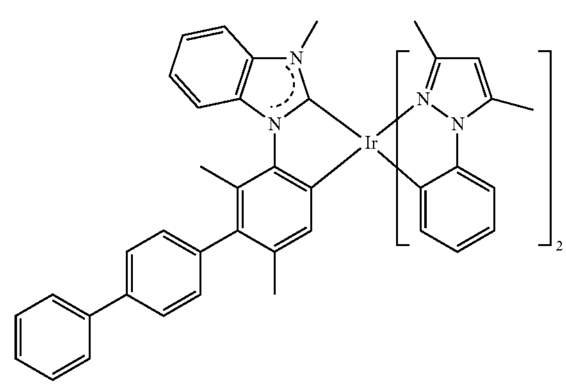

-continued
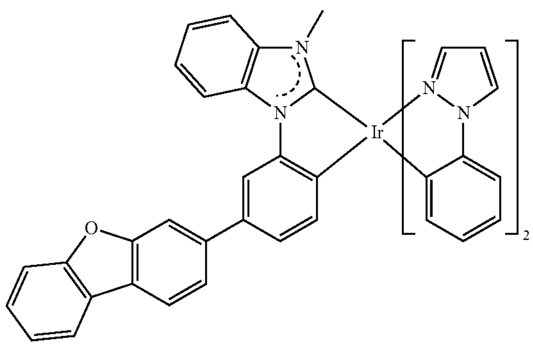
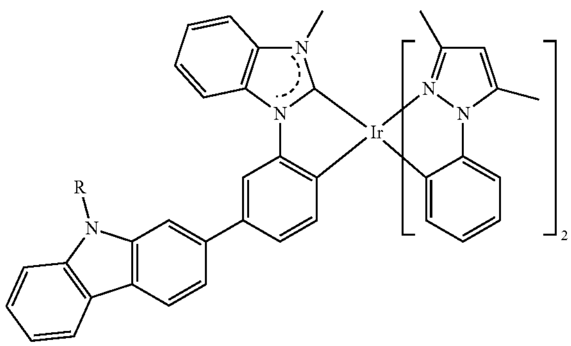
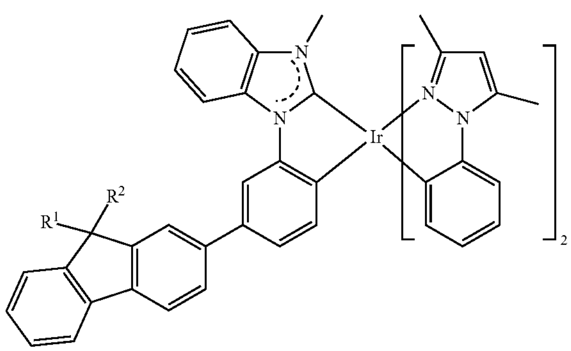
Structures Ir-13
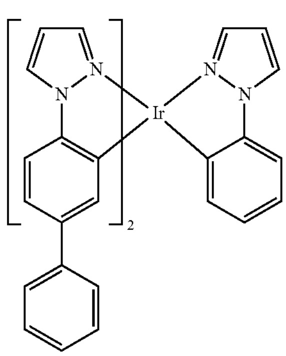
-continued
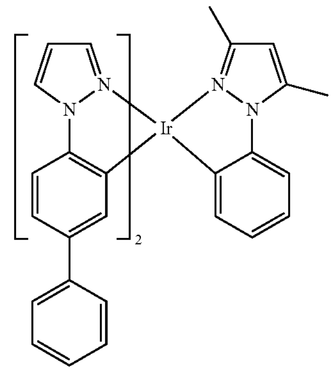
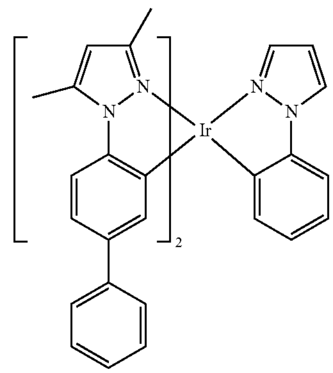
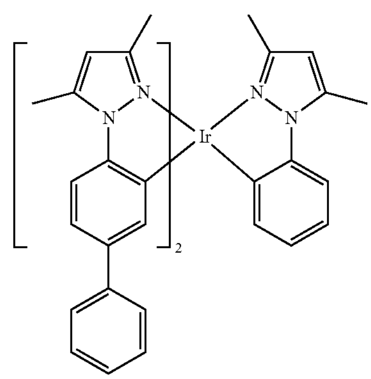
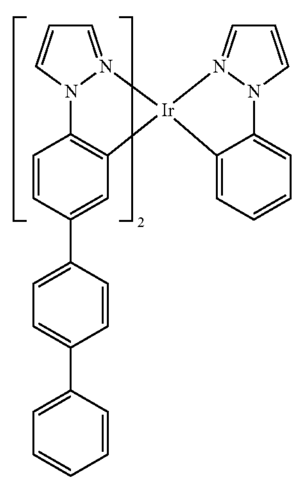

-continued
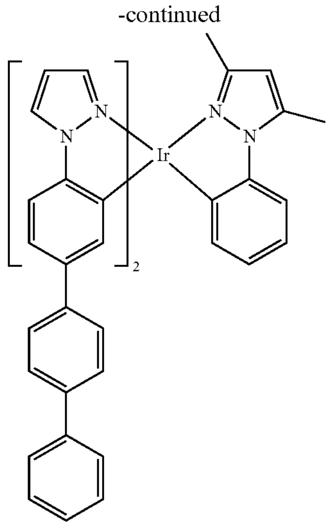
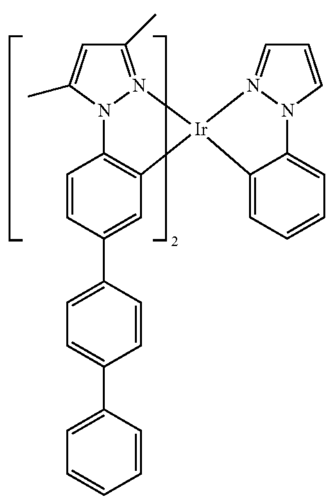
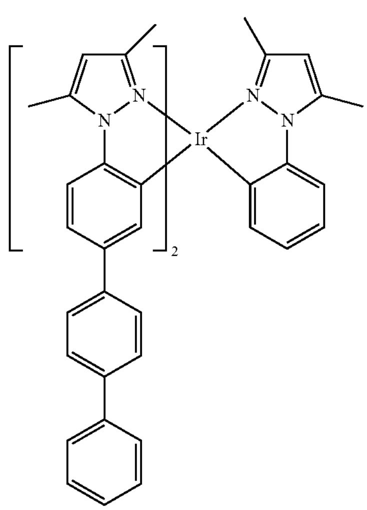
-continued
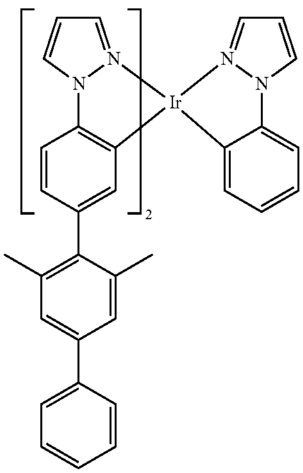
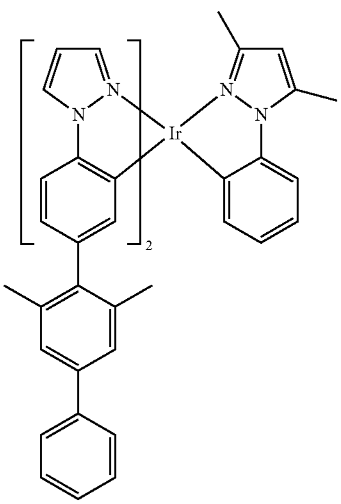
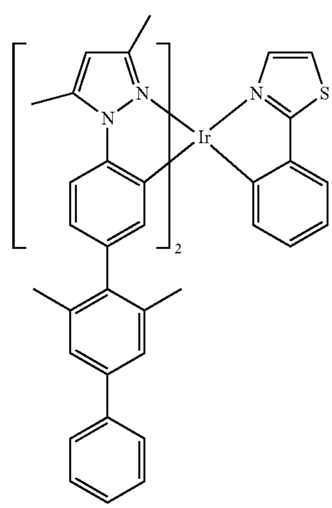

-continued
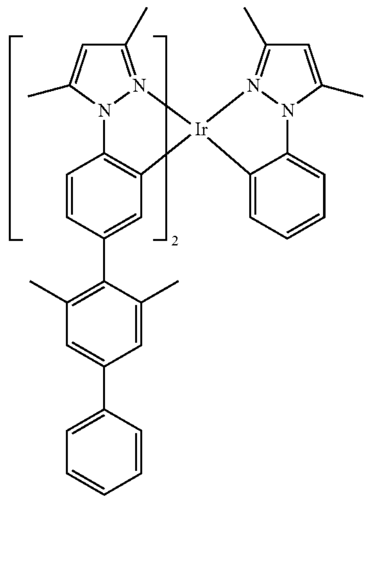
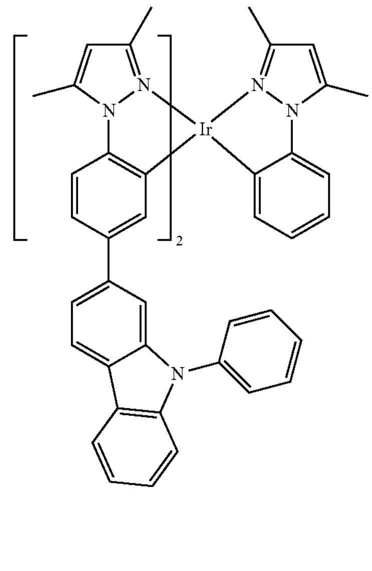
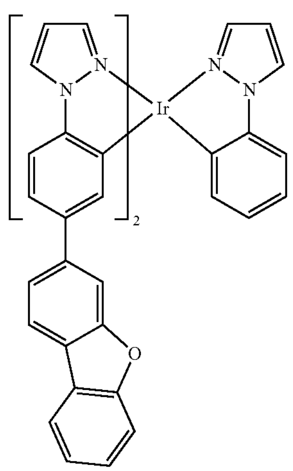
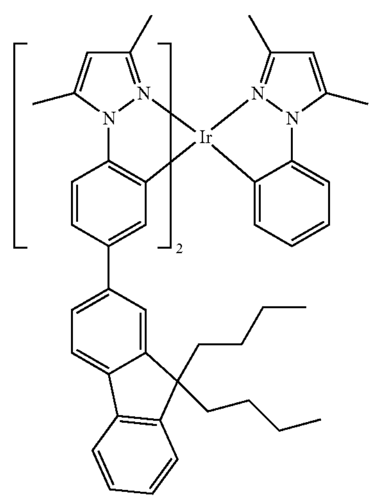
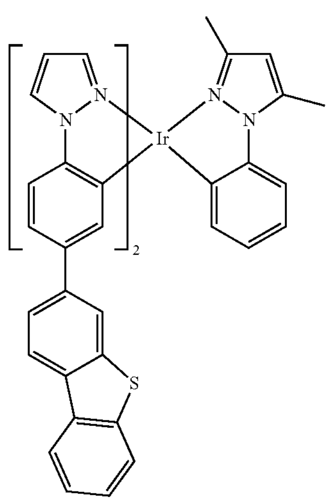
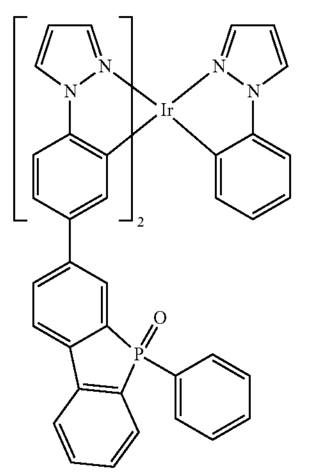
-continued -continued
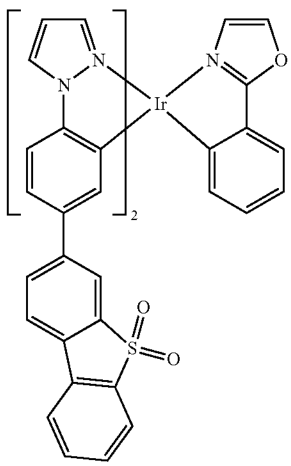
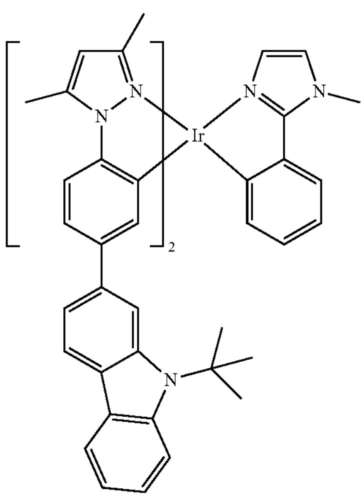
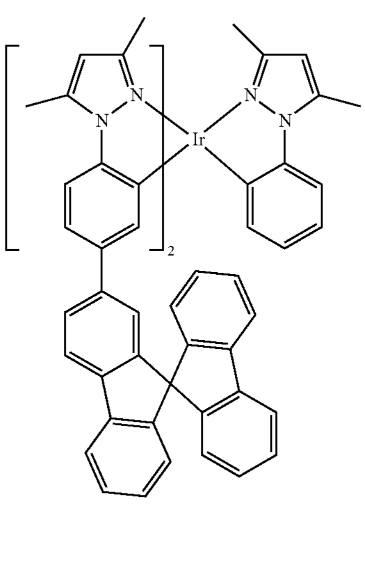
-continued
Structures Ir-14
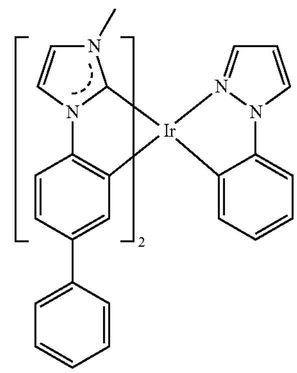
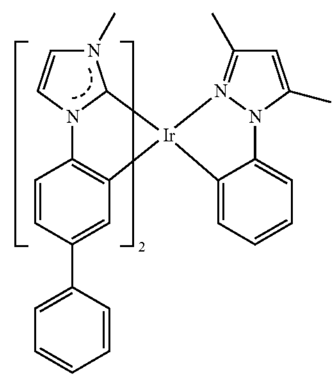
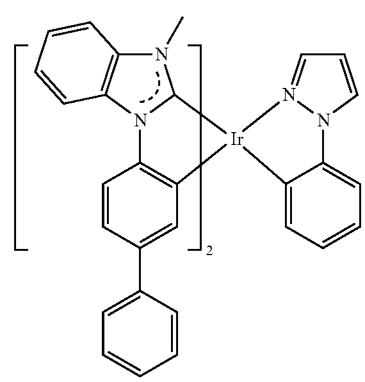
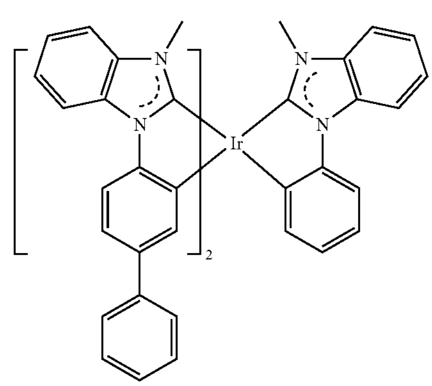

-continued
-continued
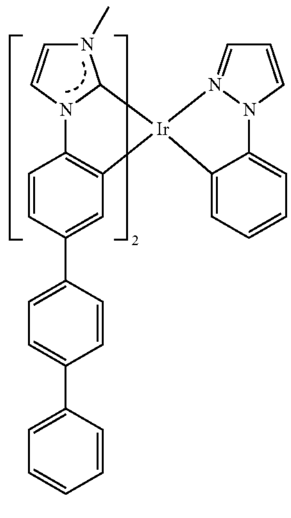
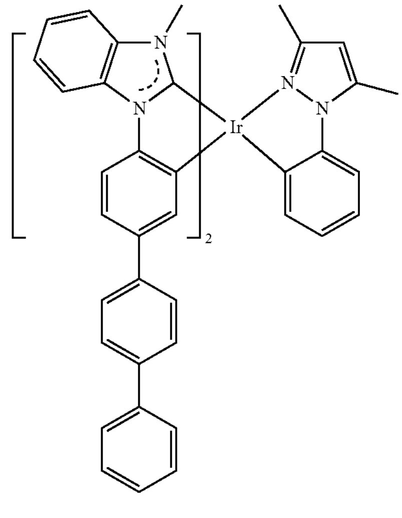
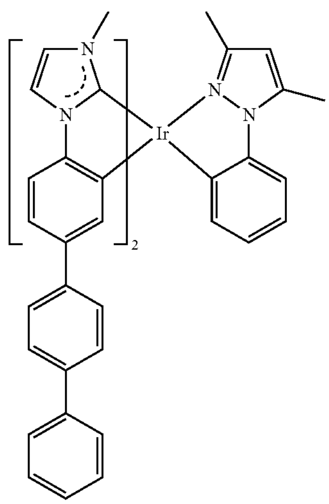
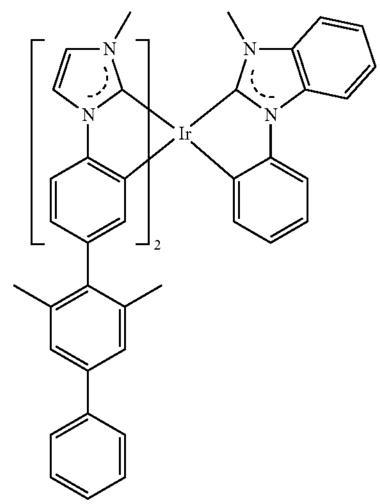
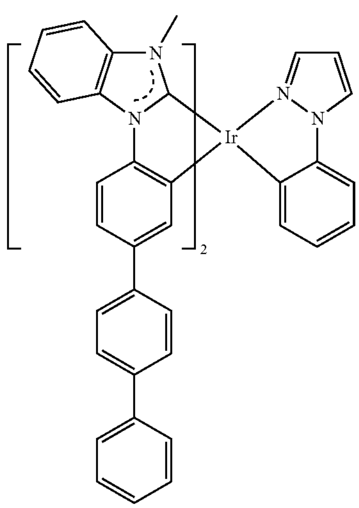
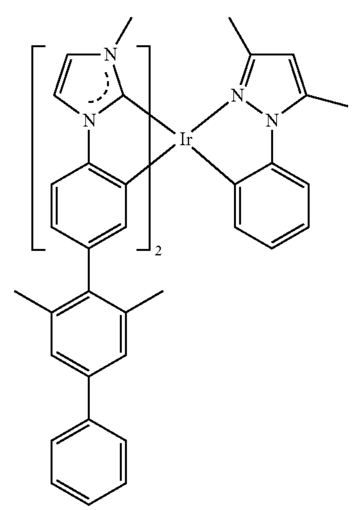

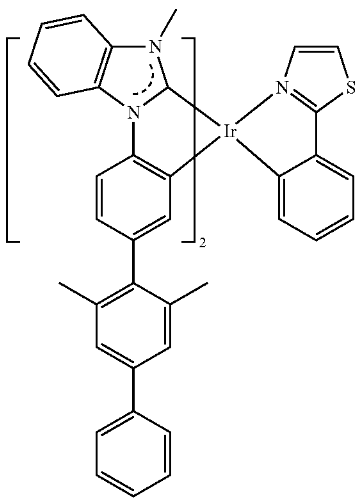
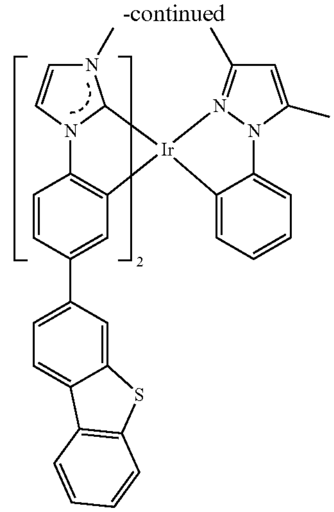
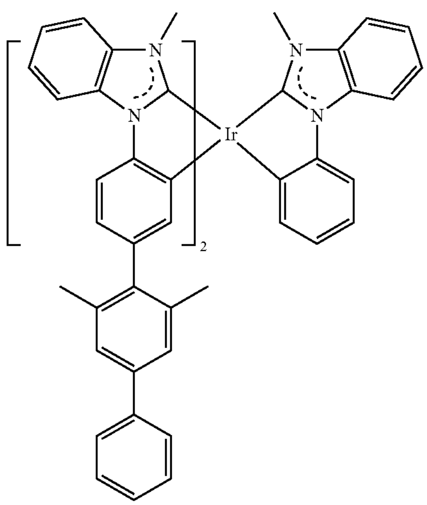
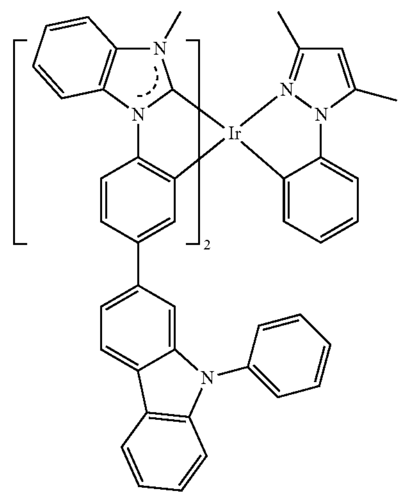
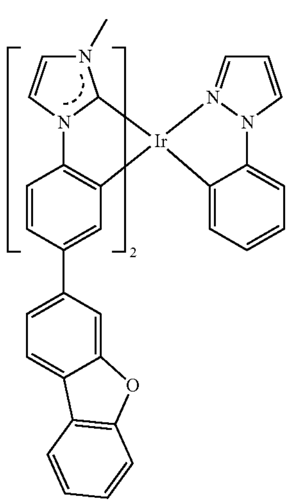
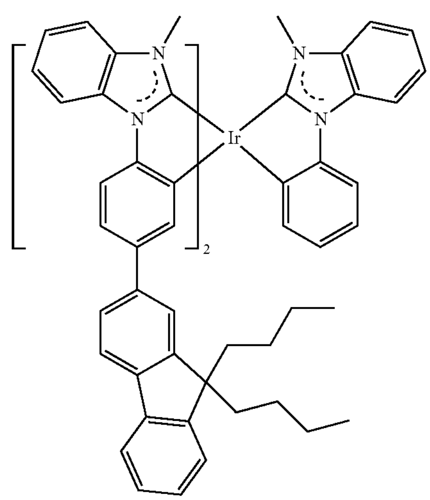

-continued
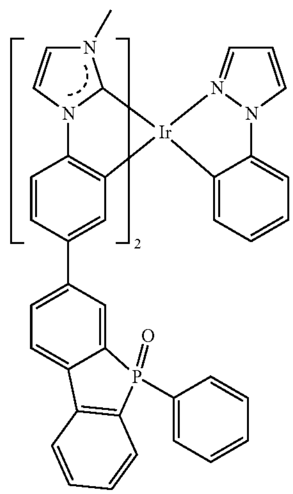
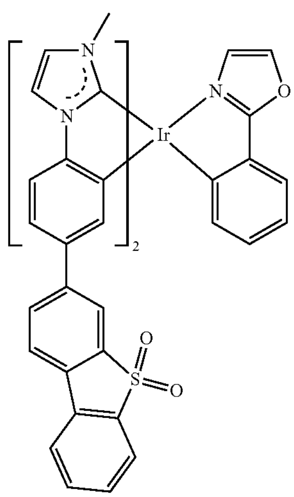
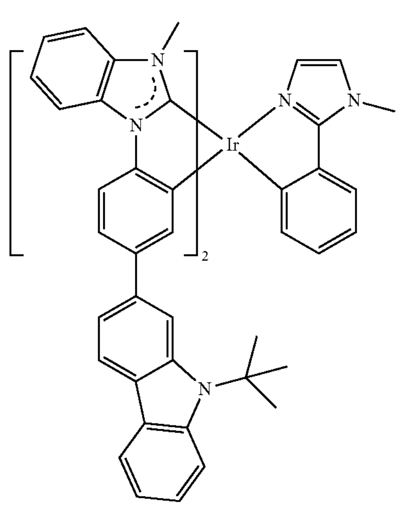
-continued
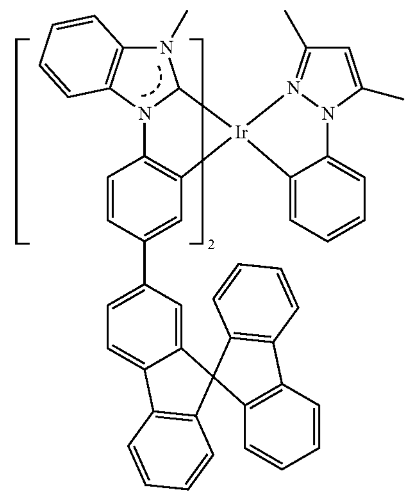
Structures Ir-15
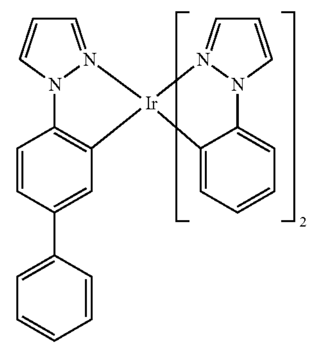
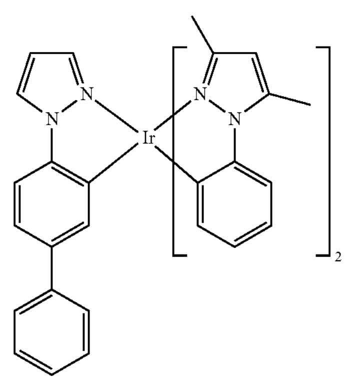
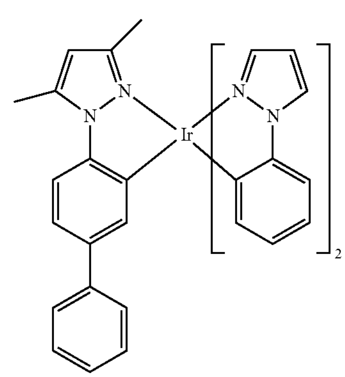

-continued
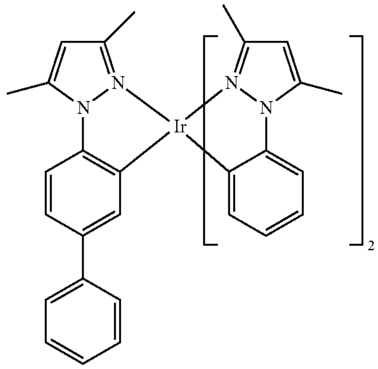
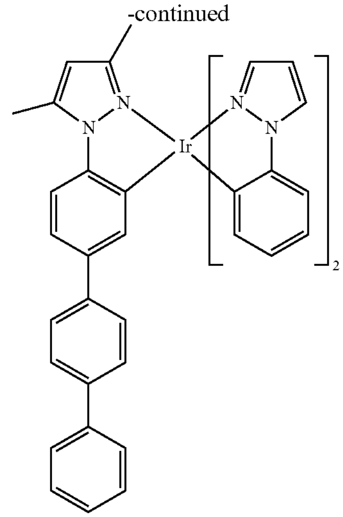
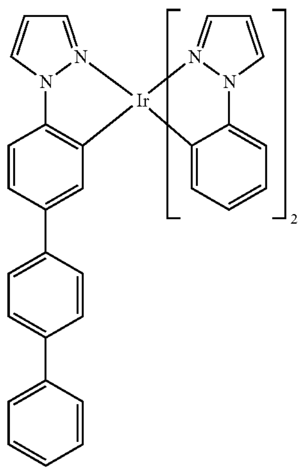
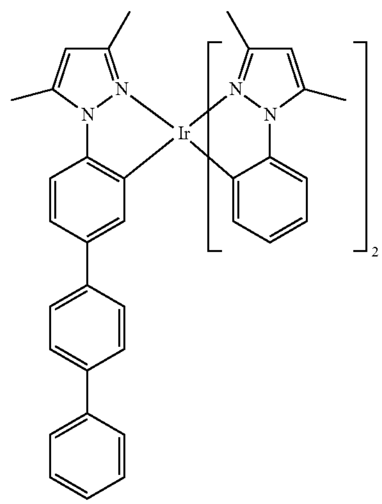
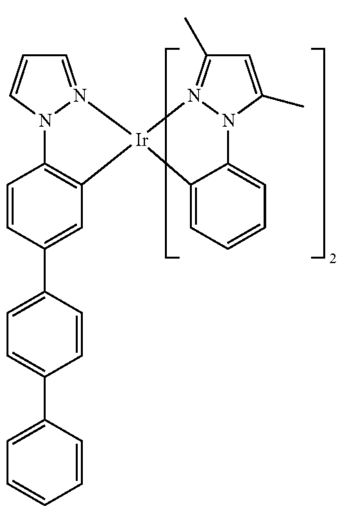
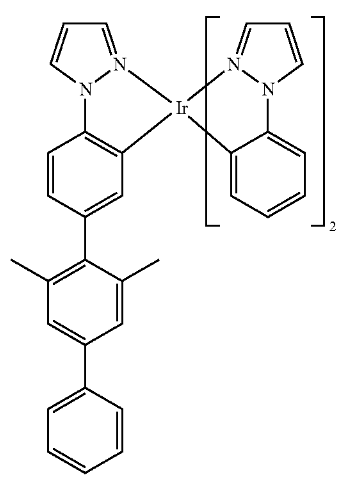

-continued
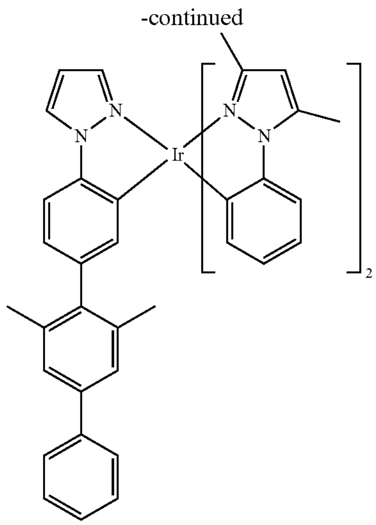
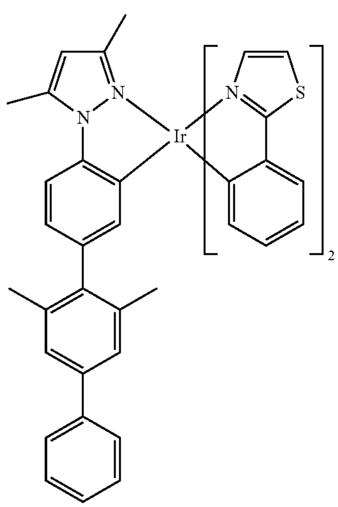
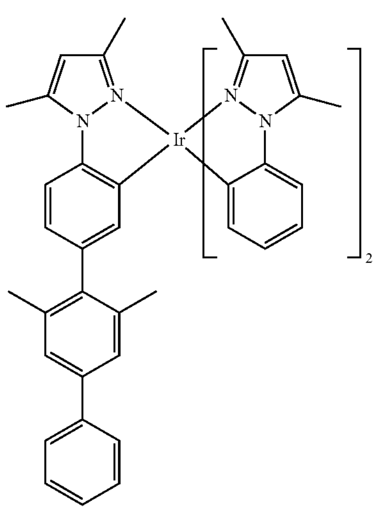
-continued
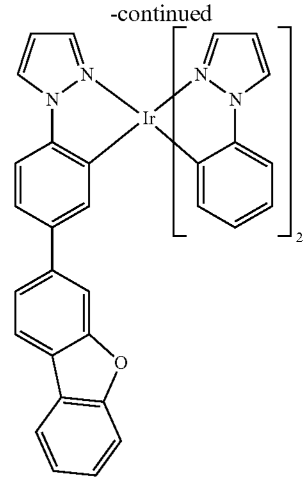
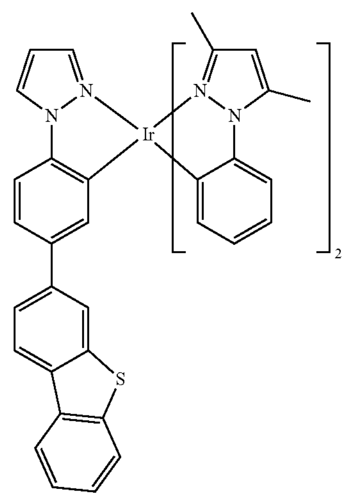
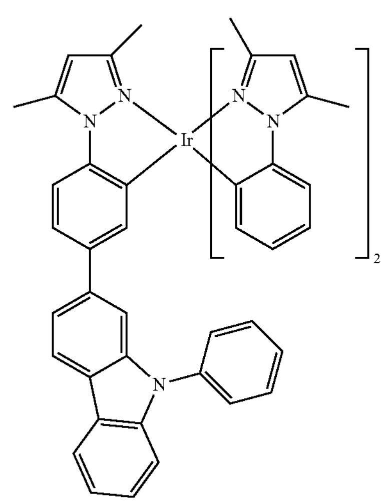

-continued
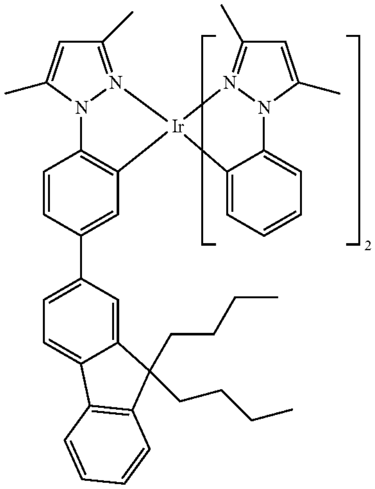
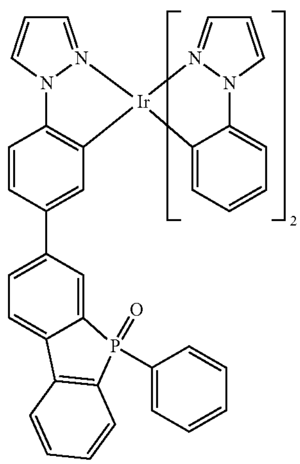
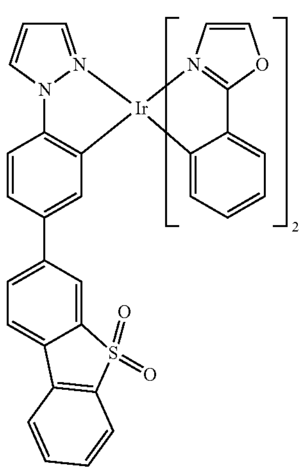
-continued
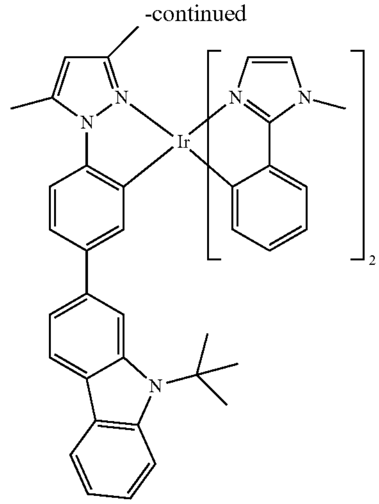
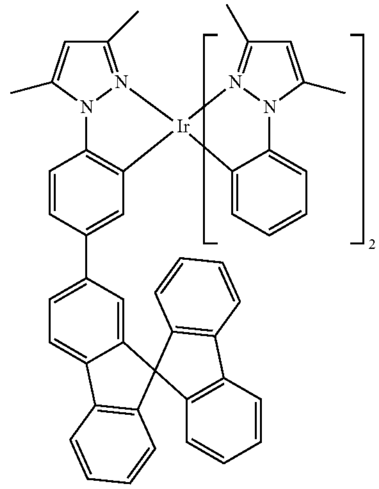
Structures Ir-16
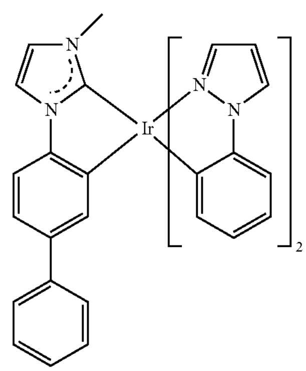
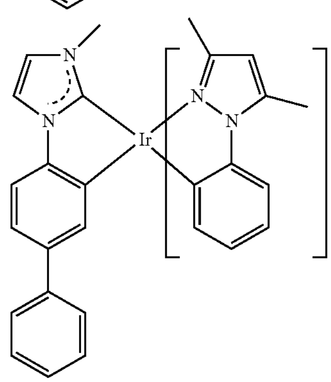

-continued
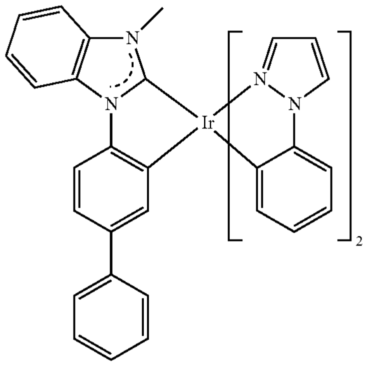
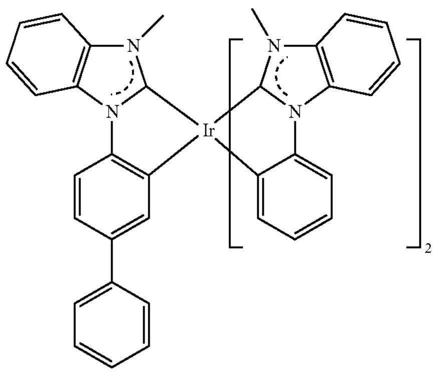
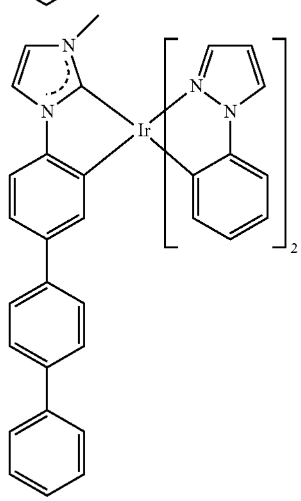
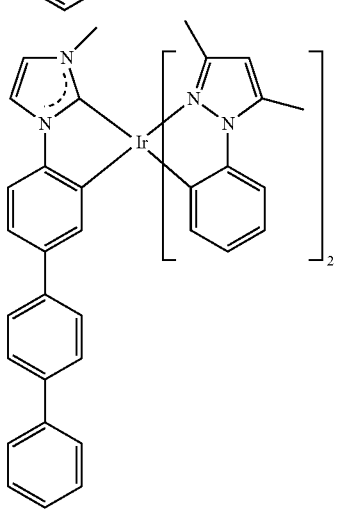
-continued
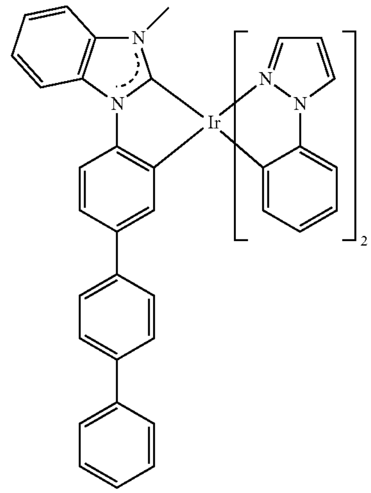
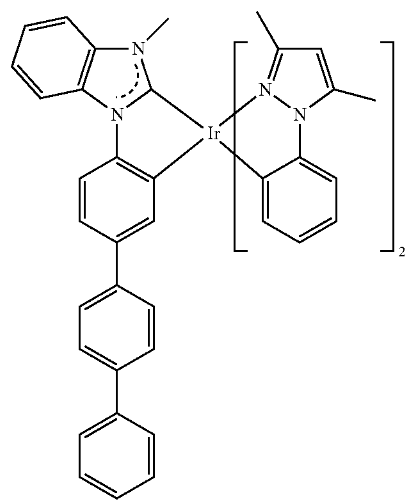
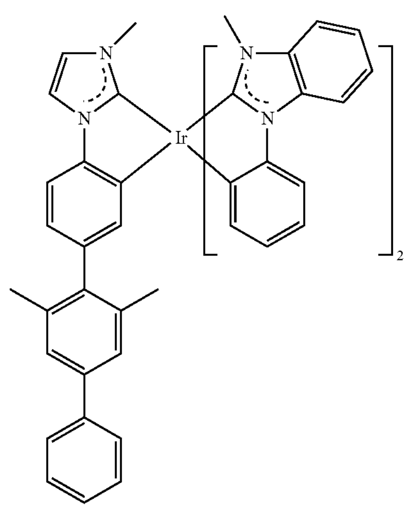

-continued
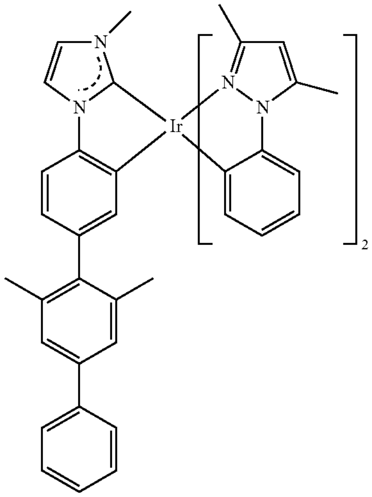
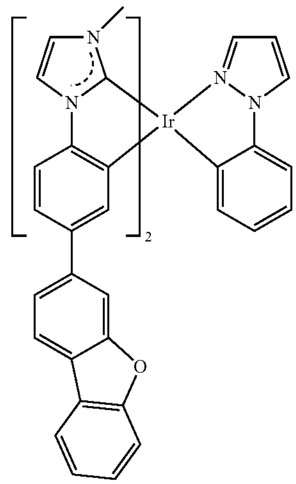
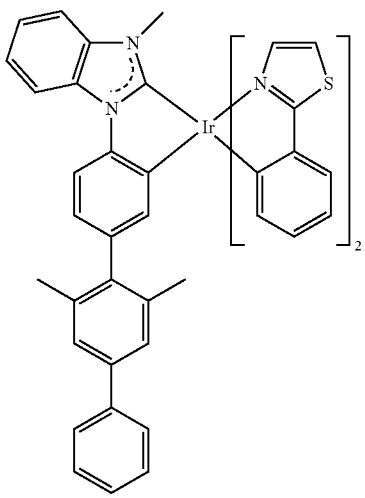
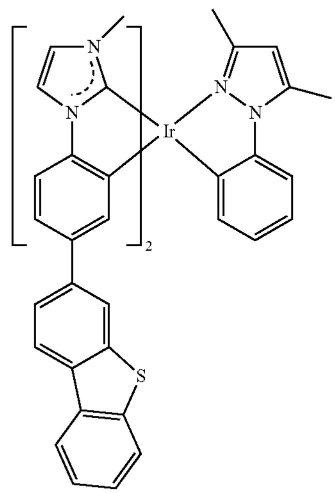
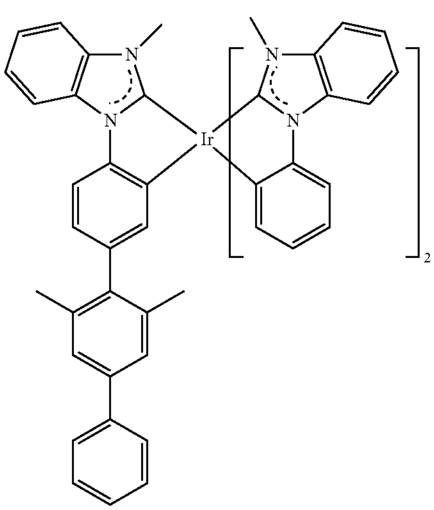
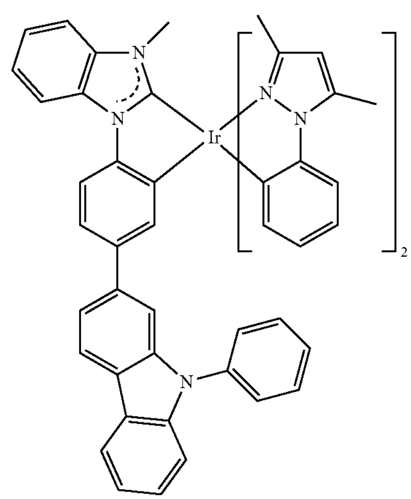

-continued
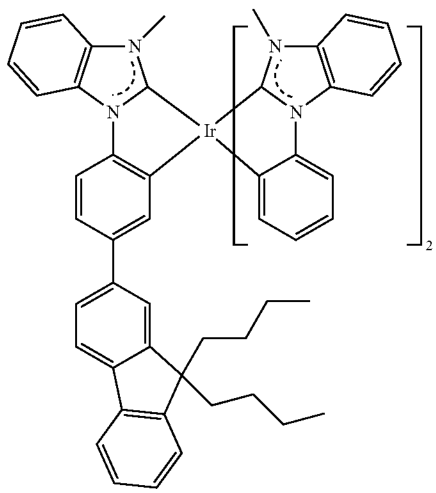
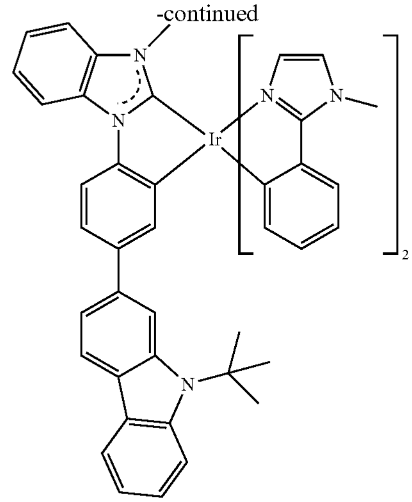
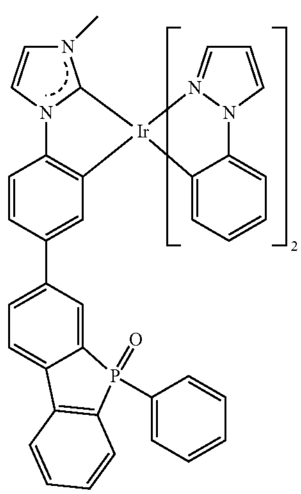
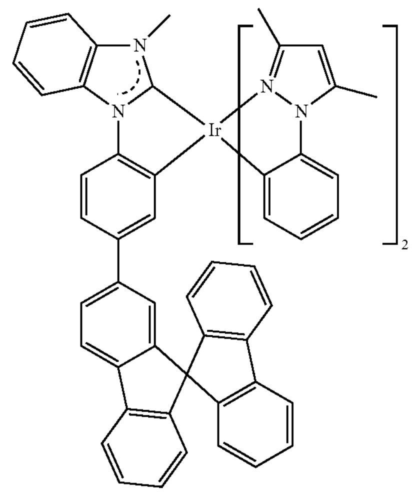
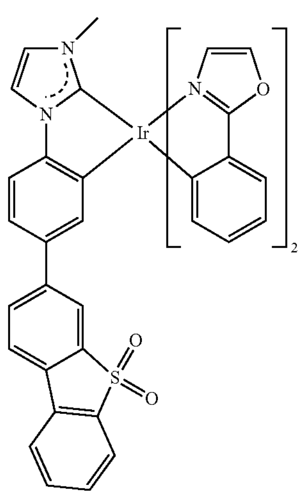
Structures Ir-17
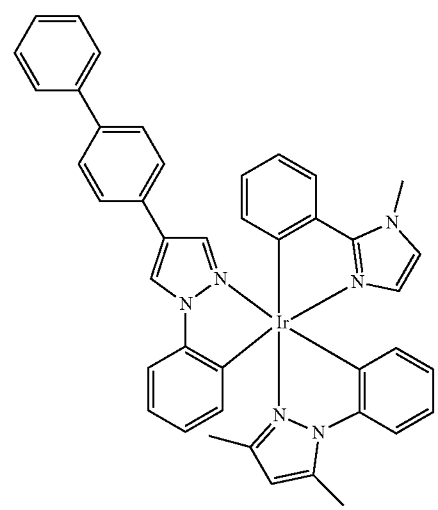

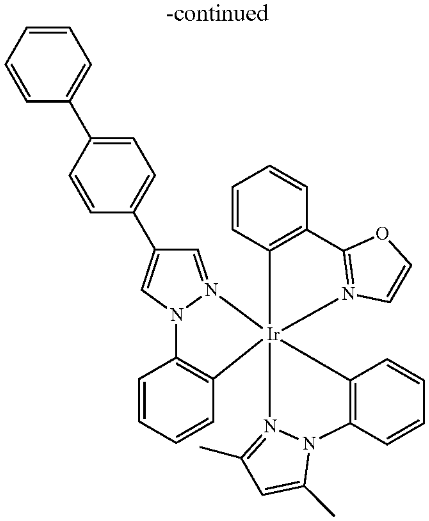
O
N
N
N
Ir
N
N
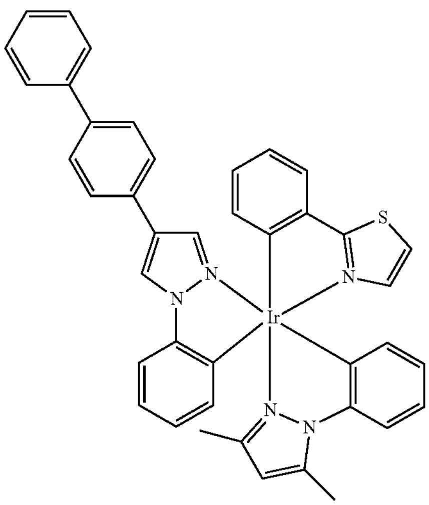
S
N
N
N
Ir
N
N
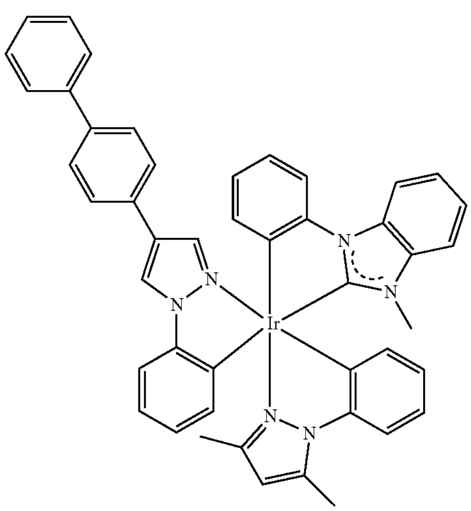
N
N
N
N
Ir
N
N
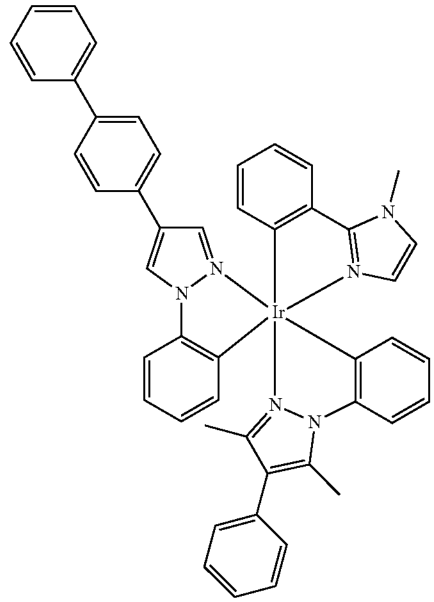
N
N
N
N
Ir
N
N
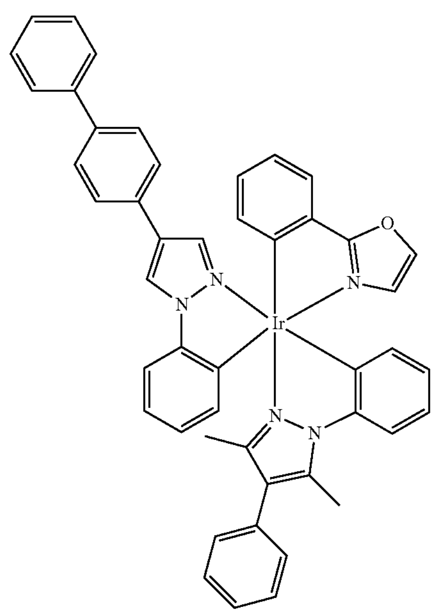
O
N
N
N
Ir
N
N

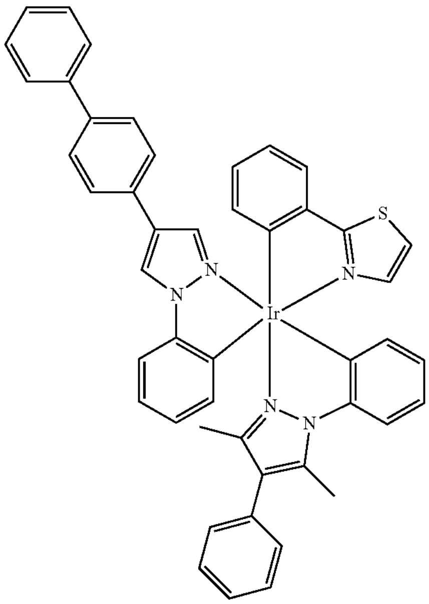
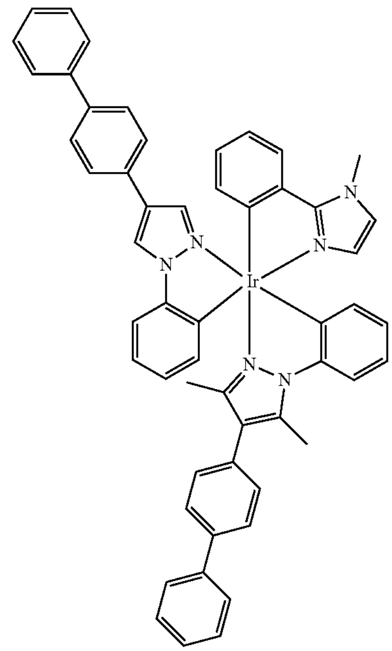
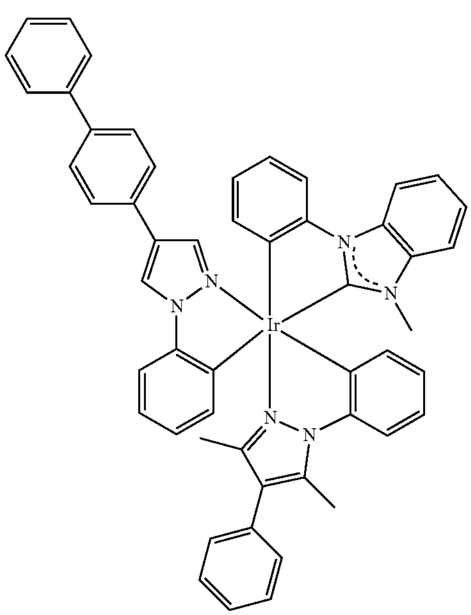
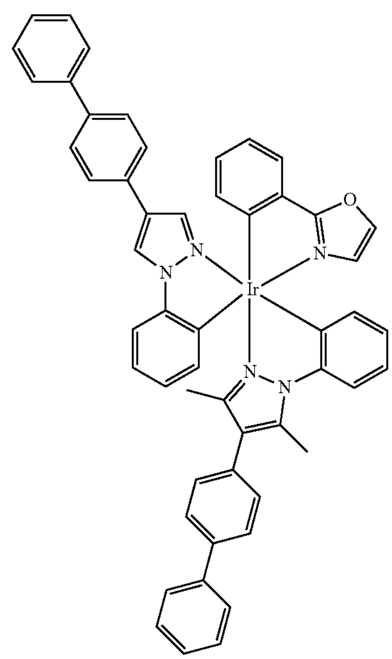

-continued
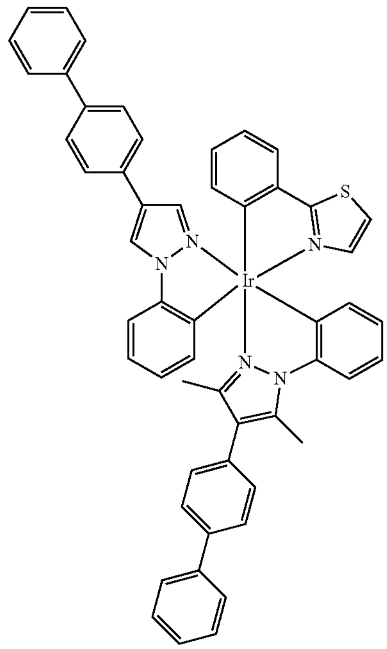
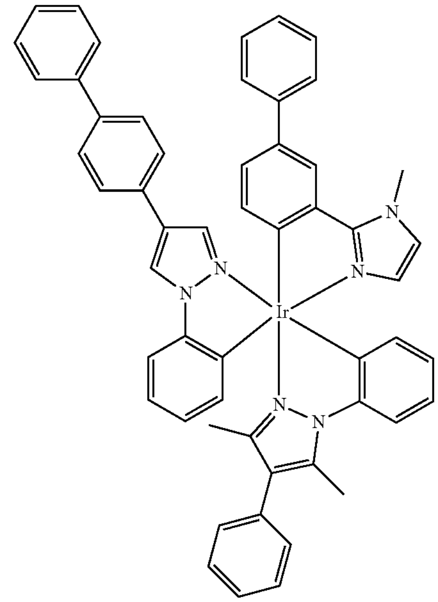
-continued
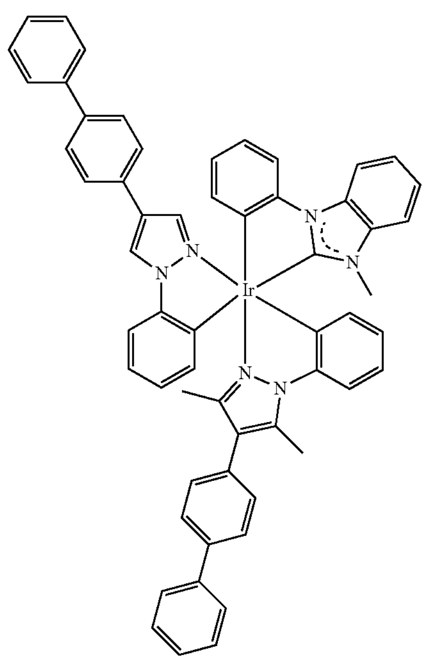
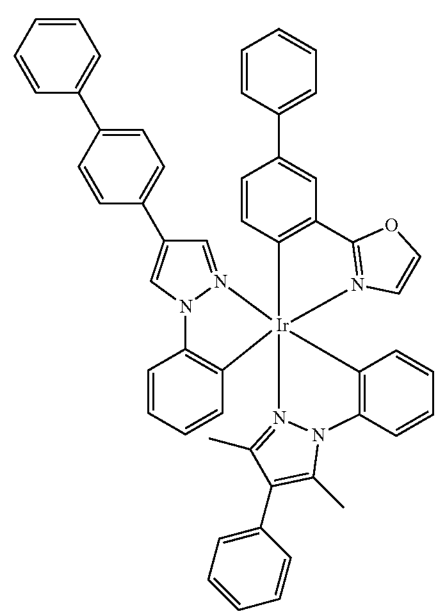

-continued
-continued
Structures Ir-18
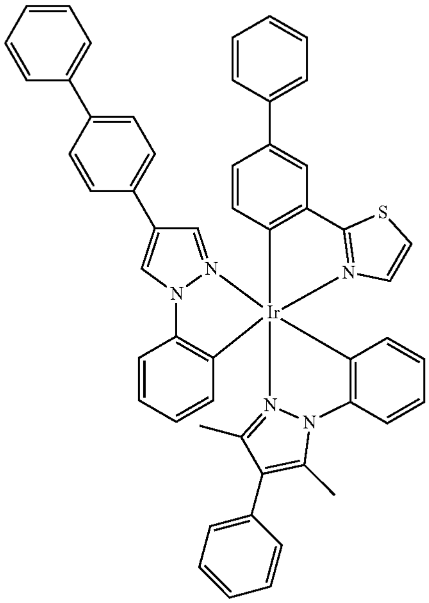
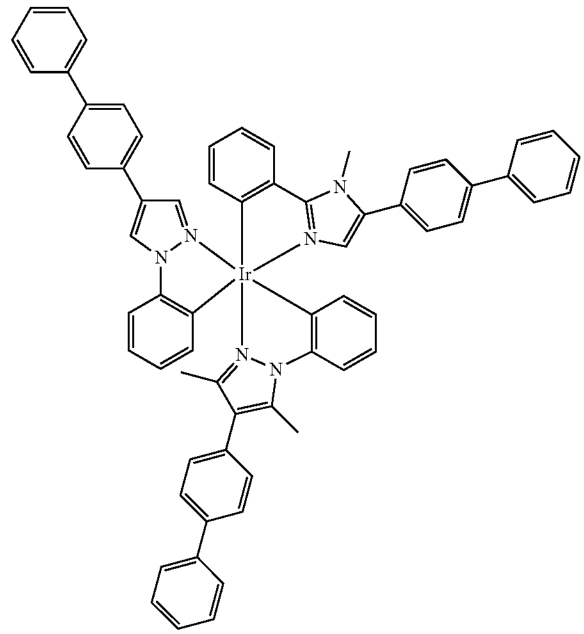
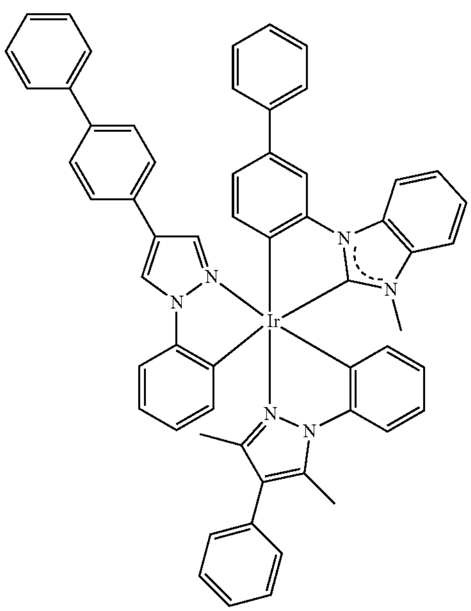
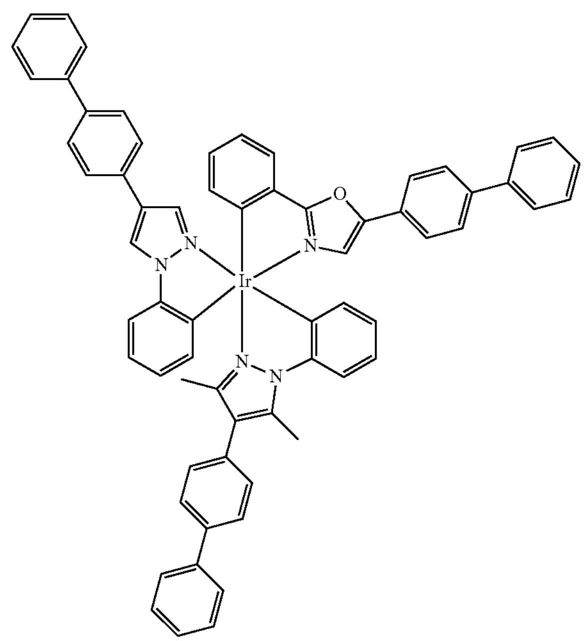

-continued
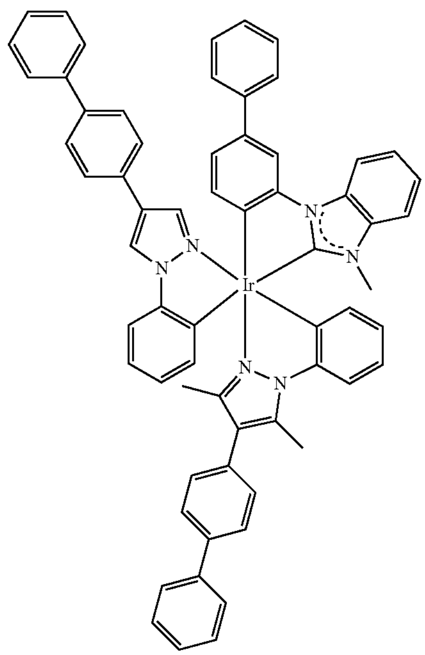
-continued
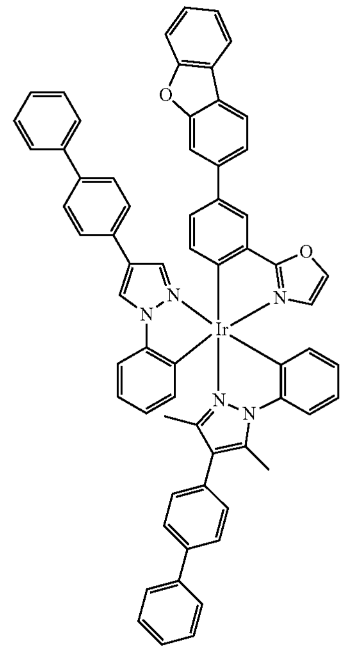
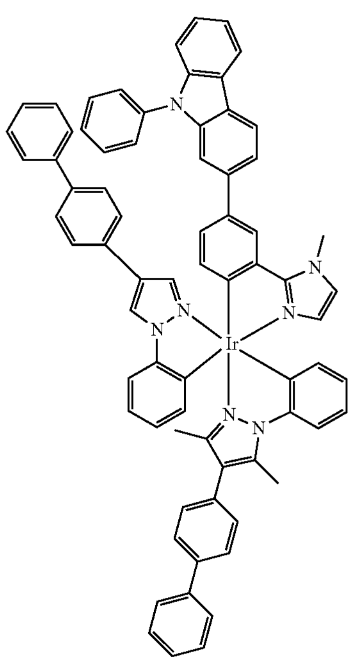
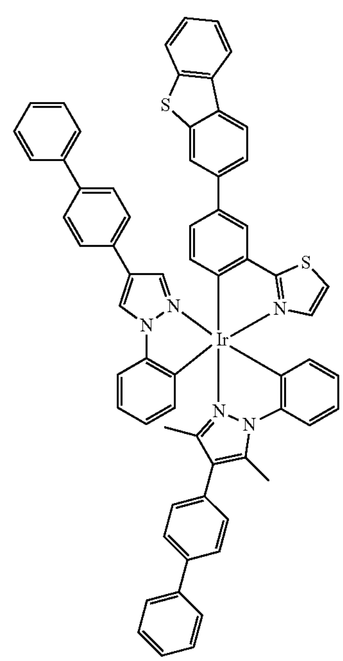

-continued
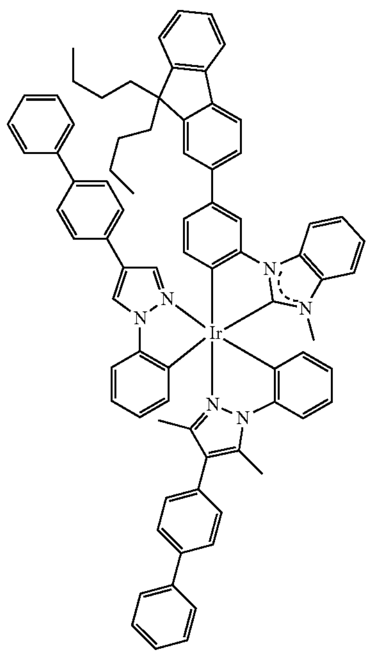
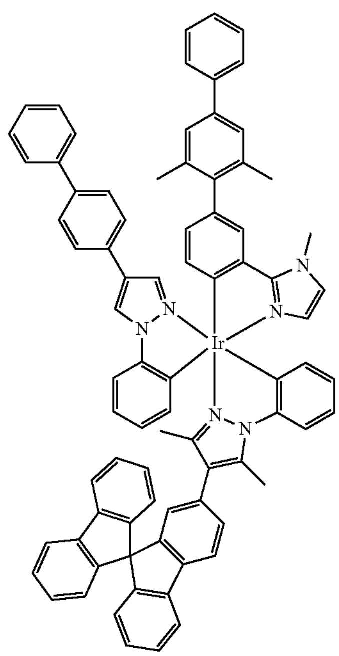
-continued
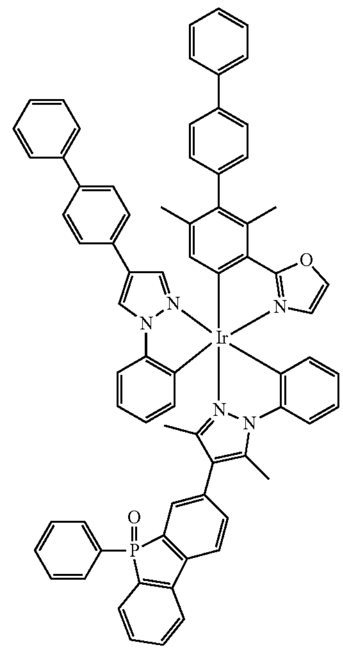
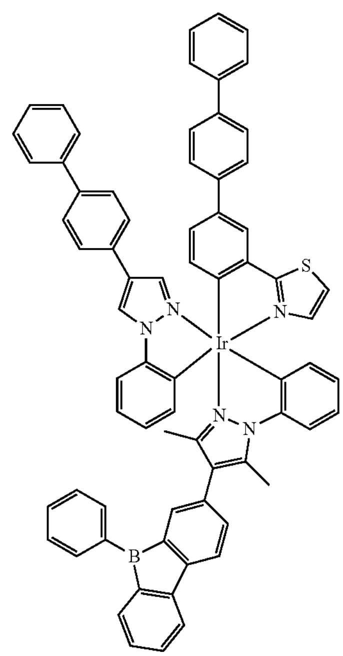

-continued
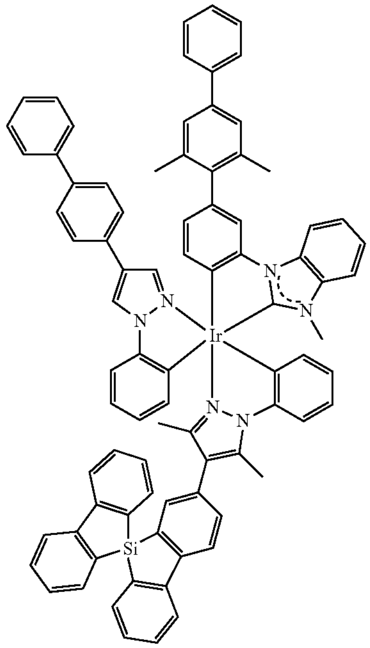
Structures Ir-19
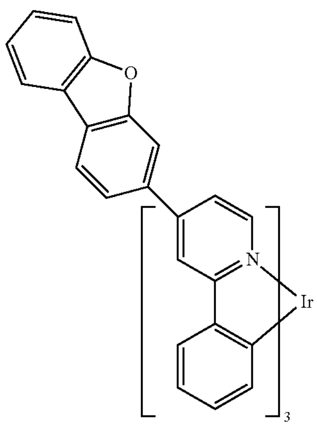
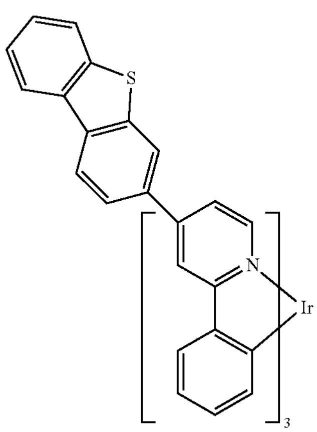
-continued
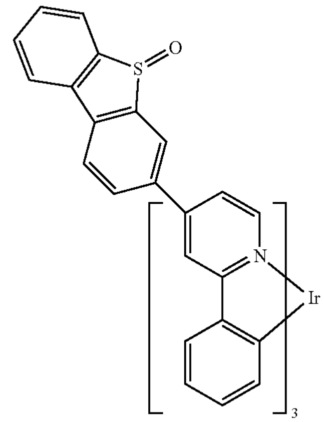
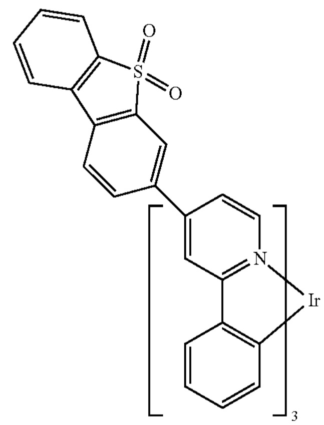
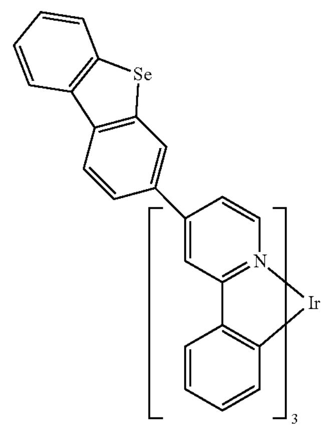
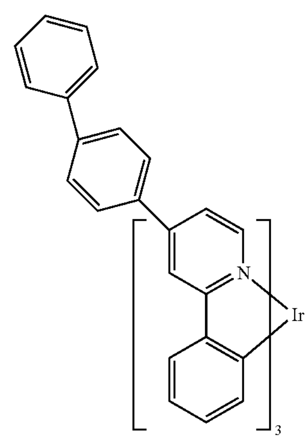

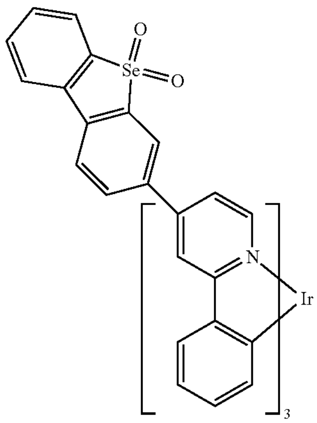
O
Se
O
N
Ir
3
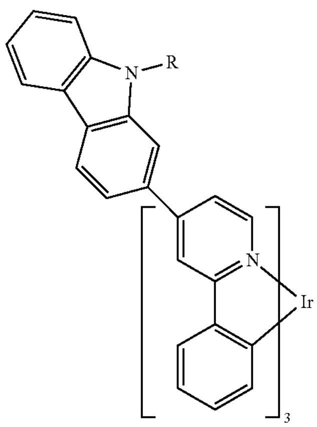
N
R
N
Ir
3
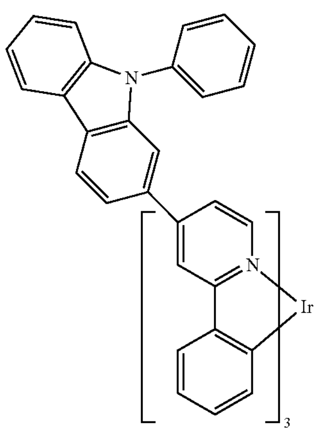
N
N
Ir
3
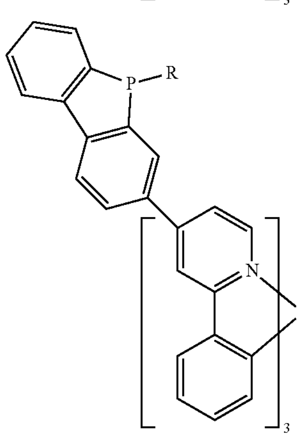
P
R
N
Ir
3
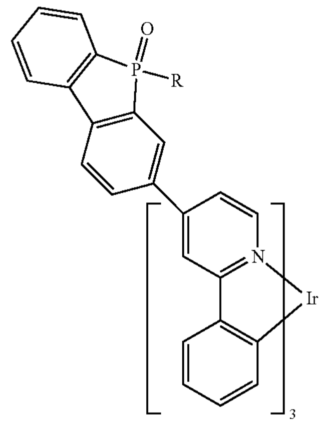
O
P
R
N
Ir
3
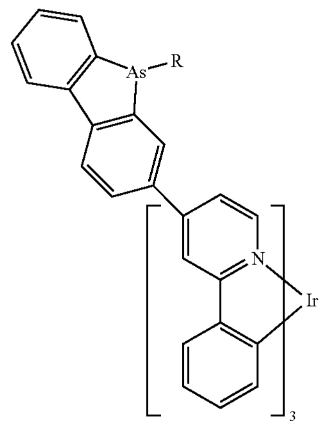
As
R
N
Ir
3
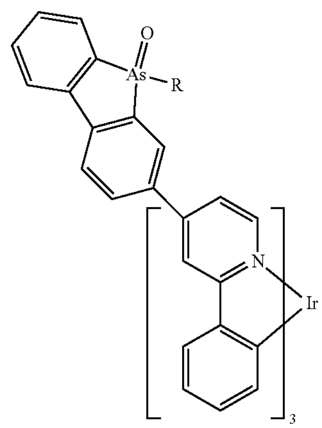
O
As
R
N
Ir
3
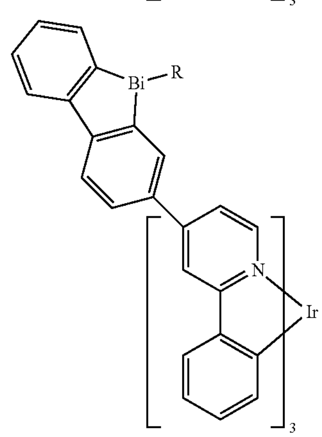
Bi
R
N
Ir
3

-continued
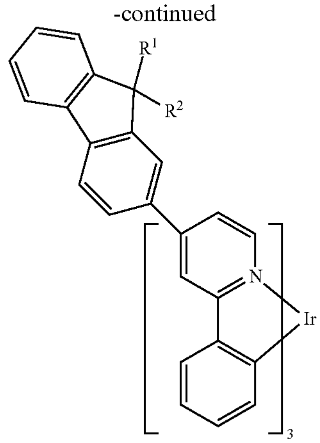
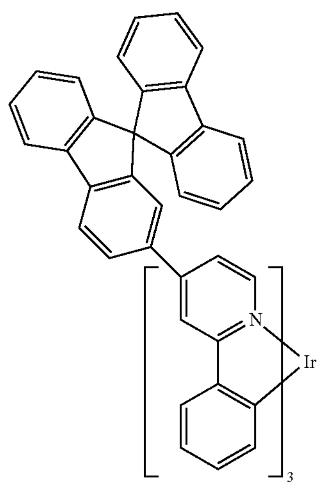
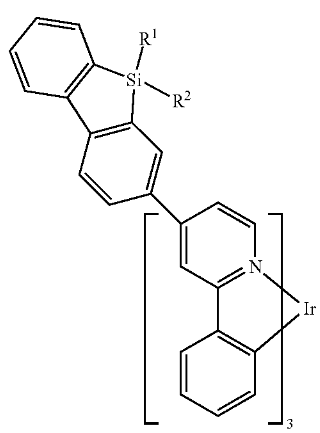
-continued
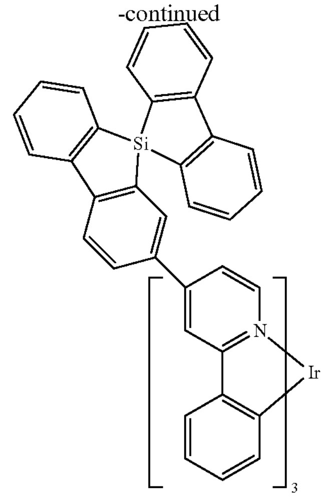
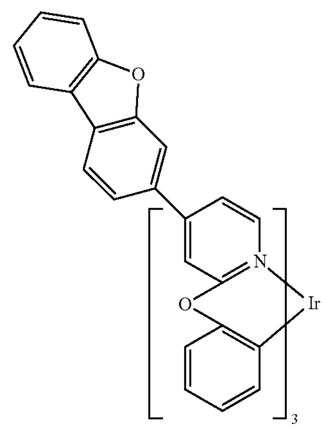
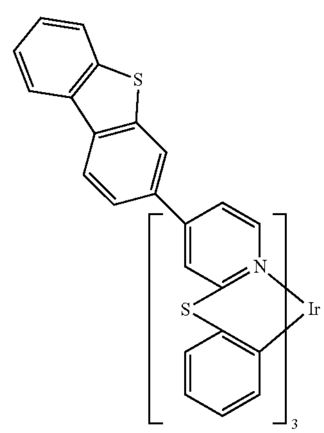

-continued
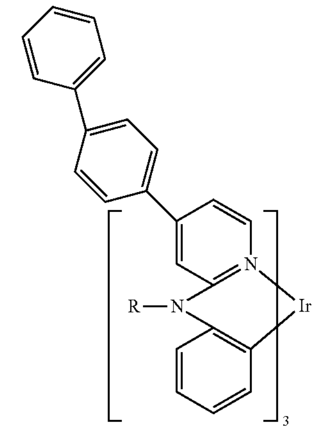
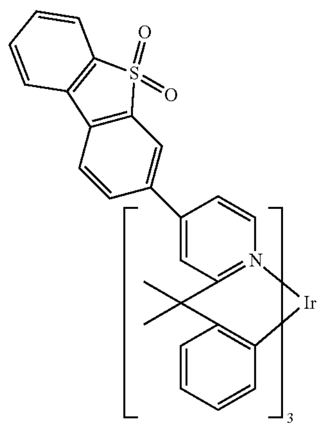
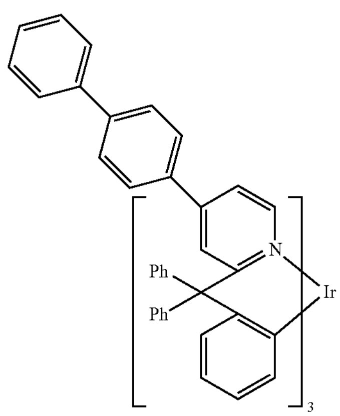
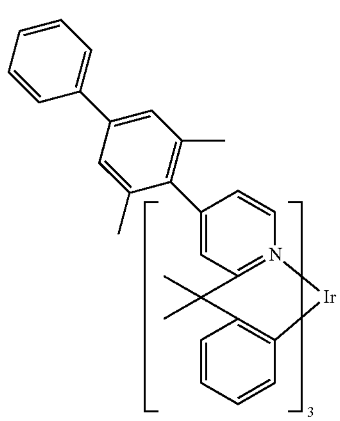
-continued
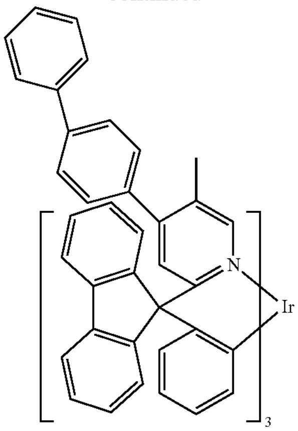
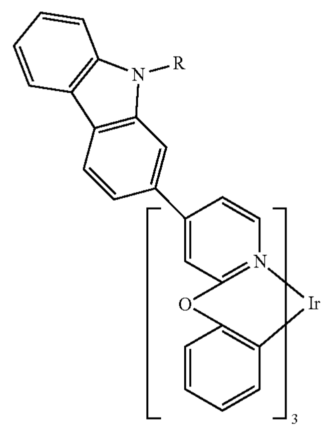
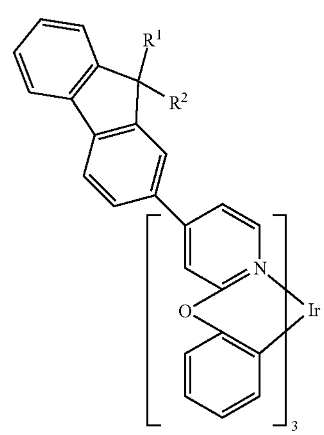

-continued
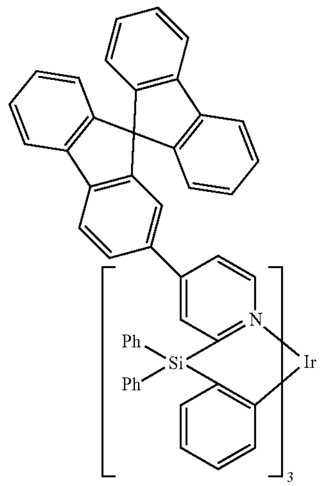
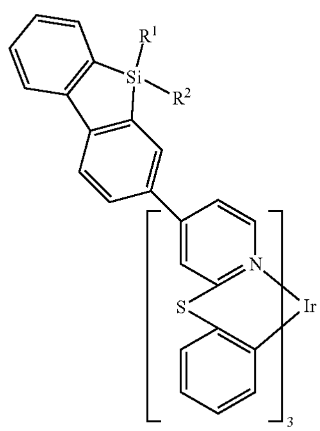
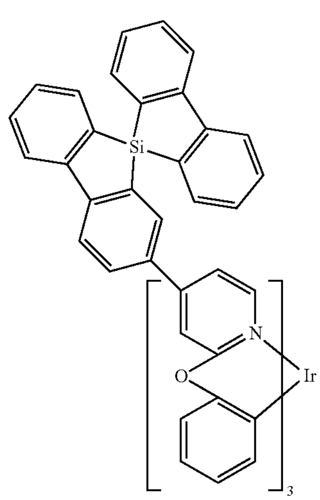
-continued
Structures Ir-20
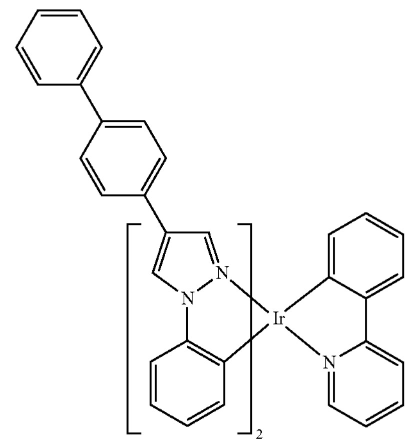
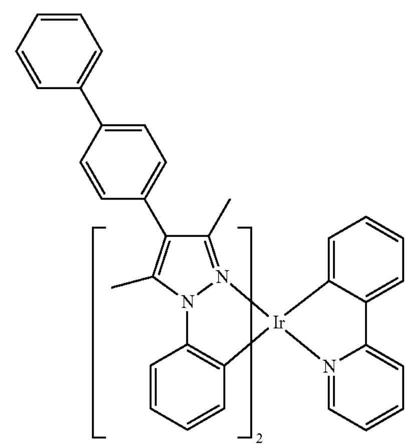
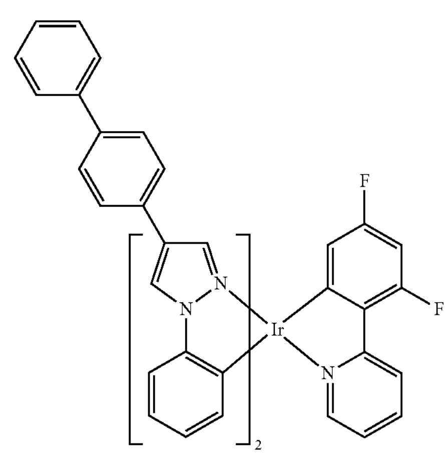

-continued
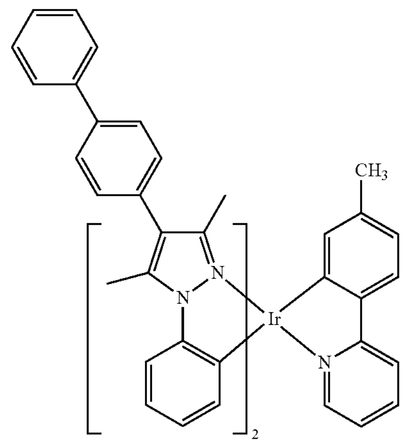
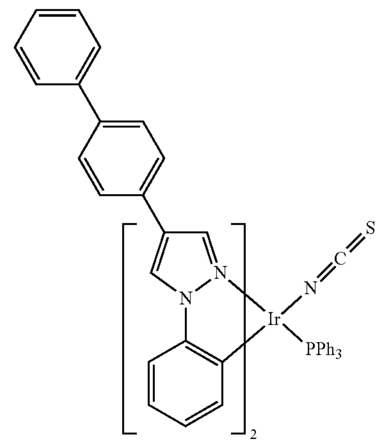
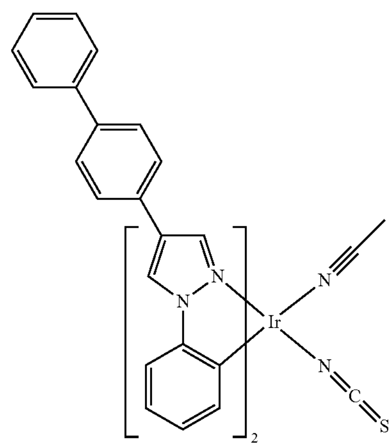
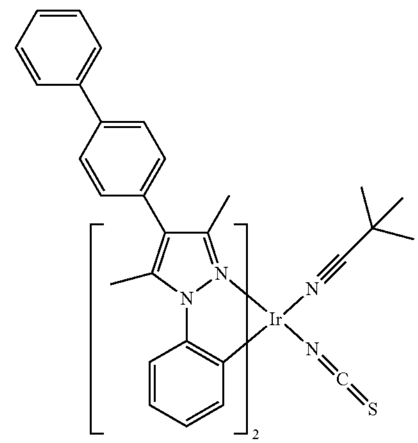
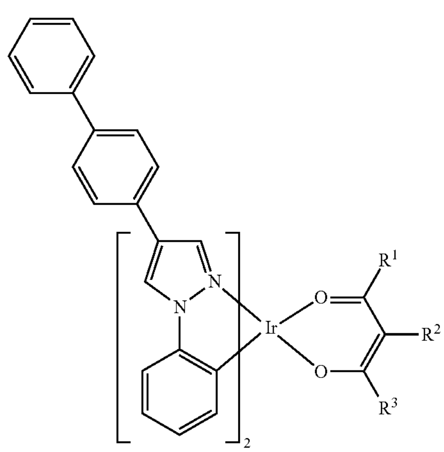
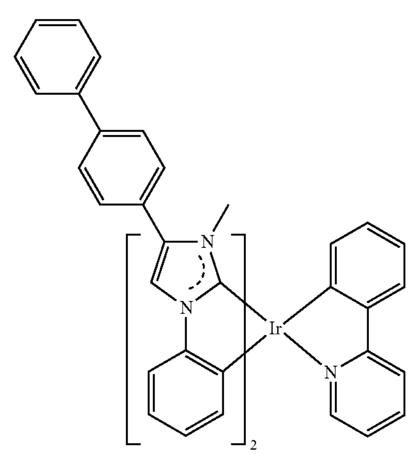
-continued -continued
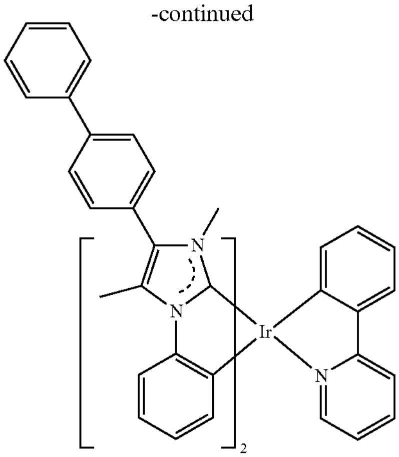
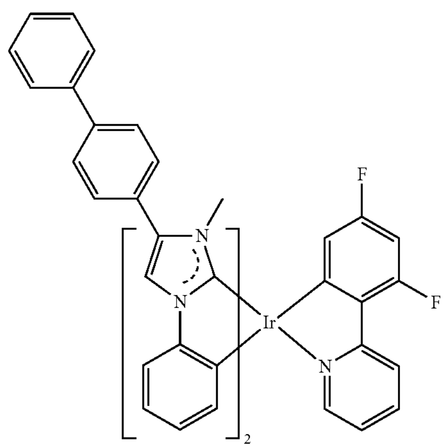
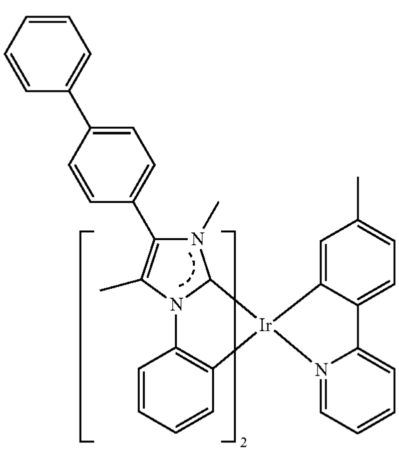
-continued
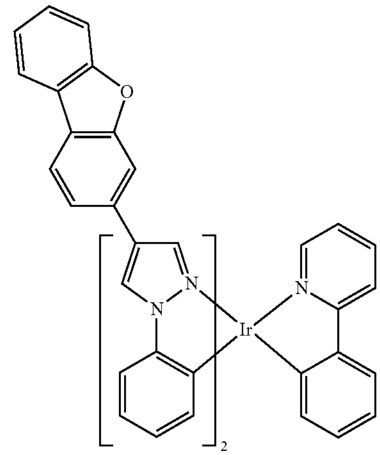
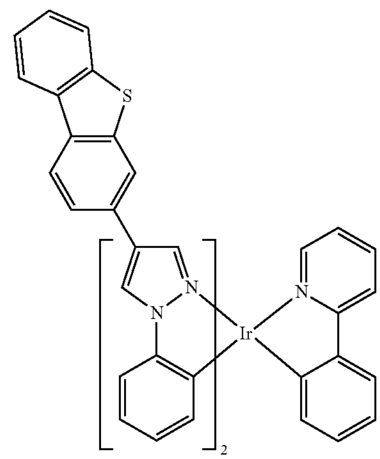
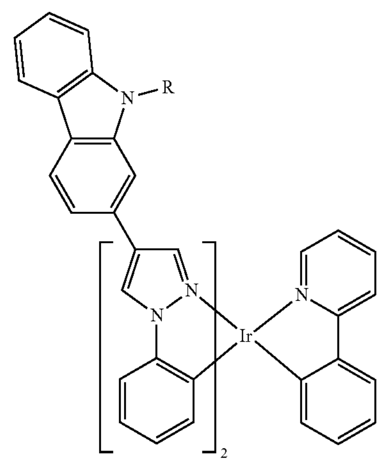

-continued
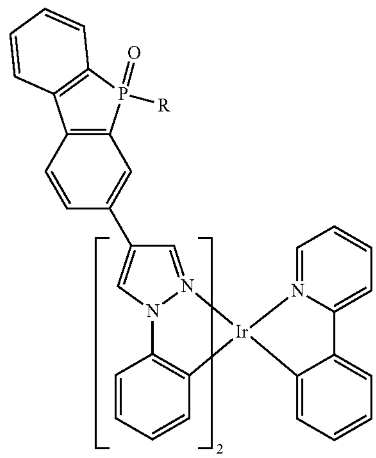
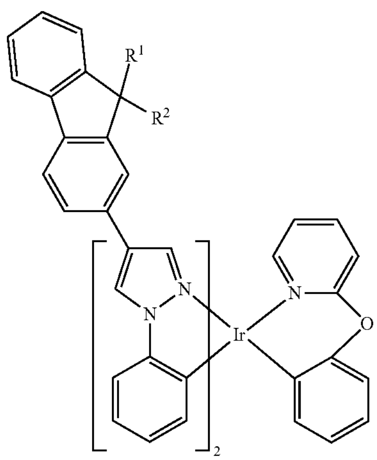
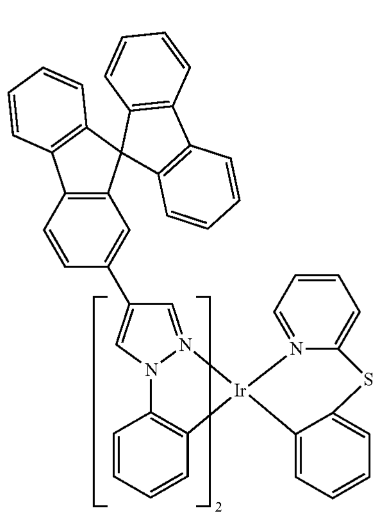
-continued
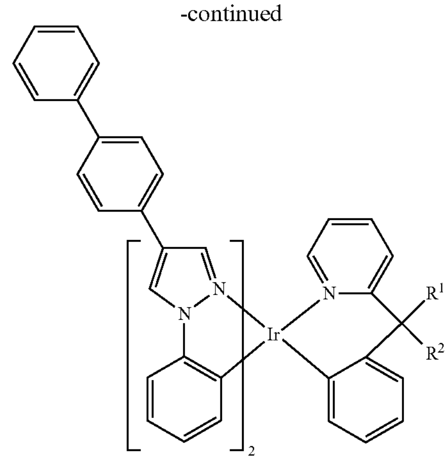
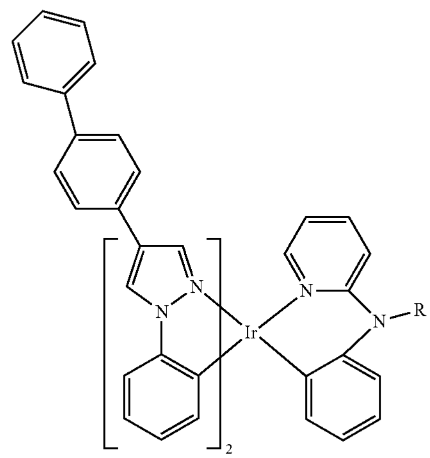
Structures Ir-21
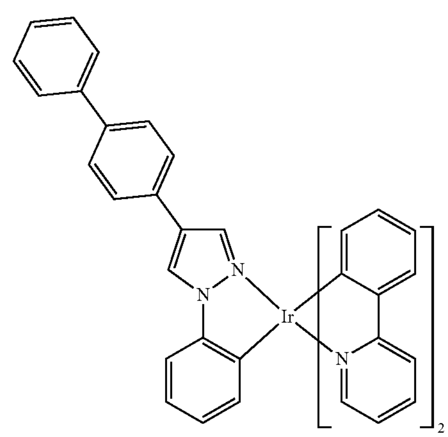

-continued
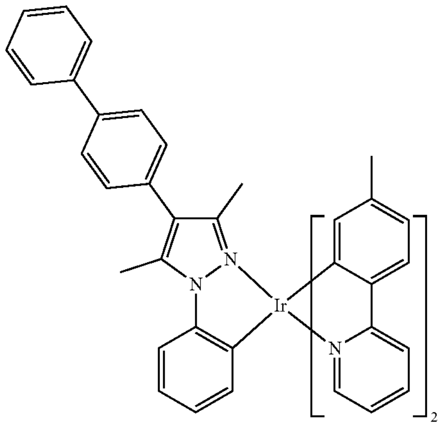
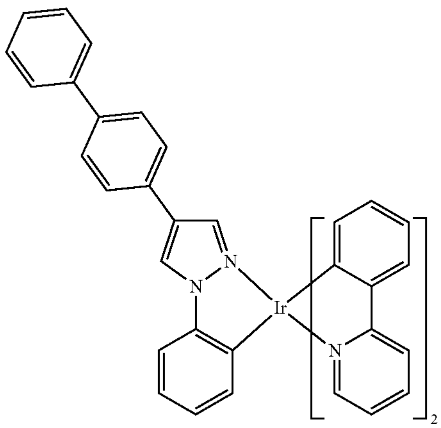
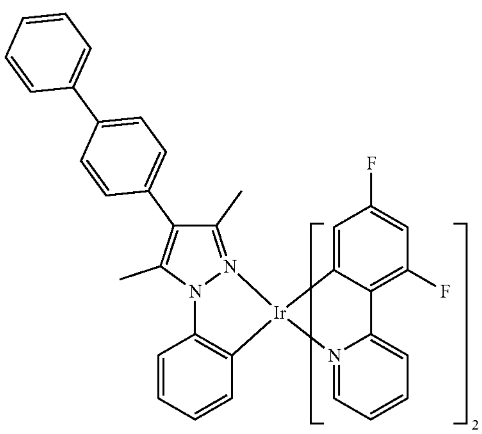
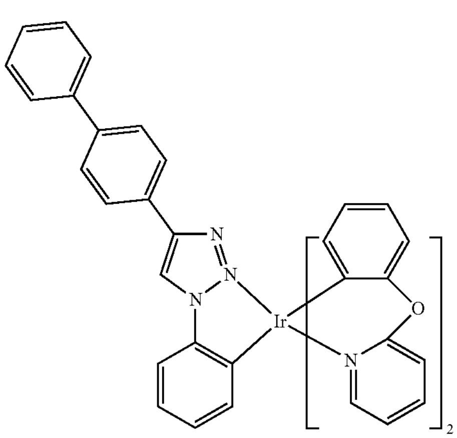
-continued
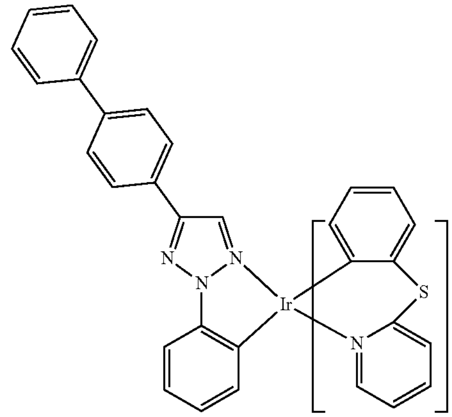
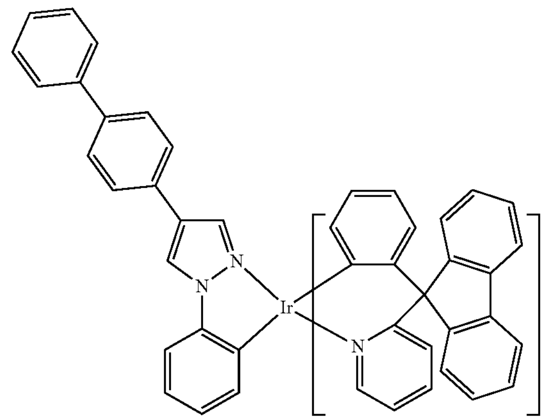
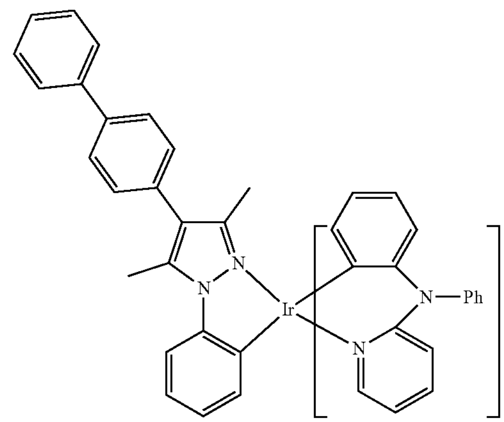
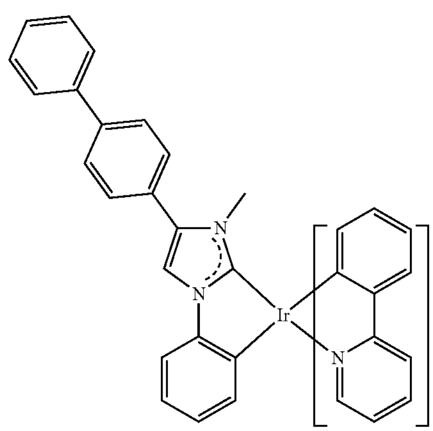

-continued
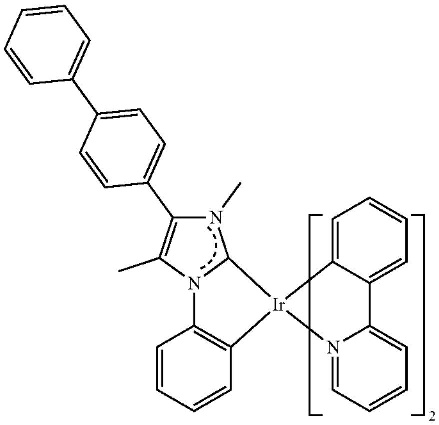
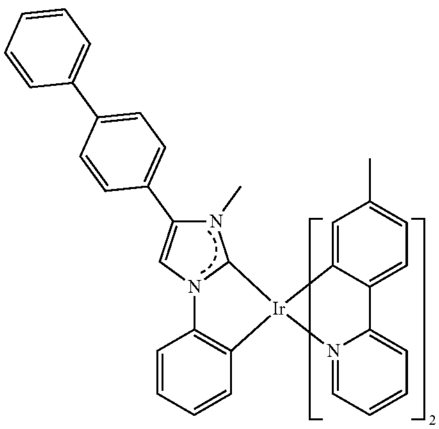
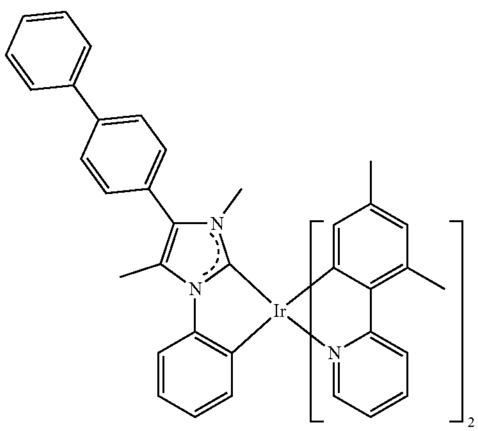
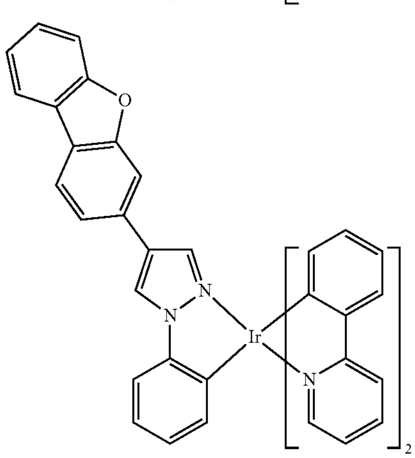
-continued
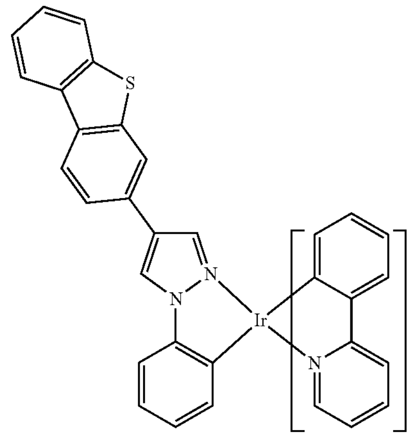
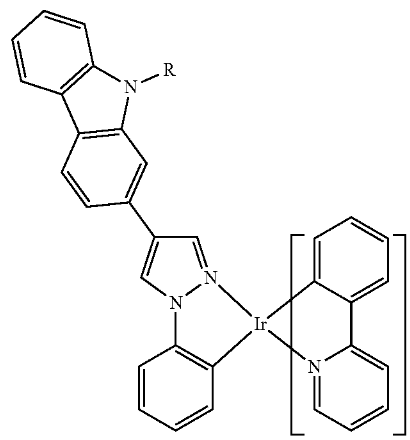
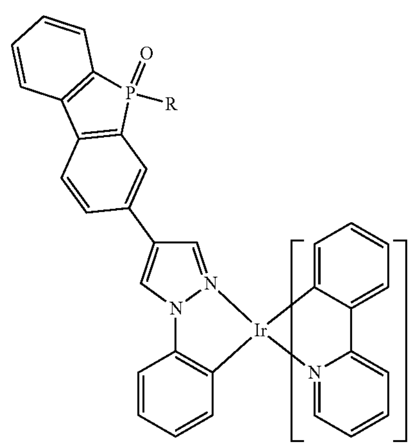

-continued
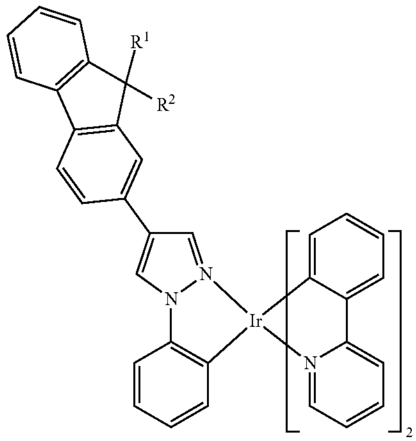
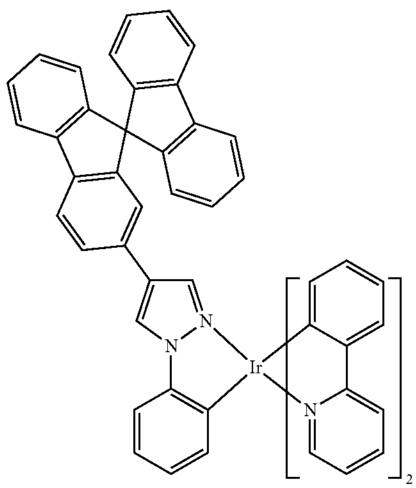
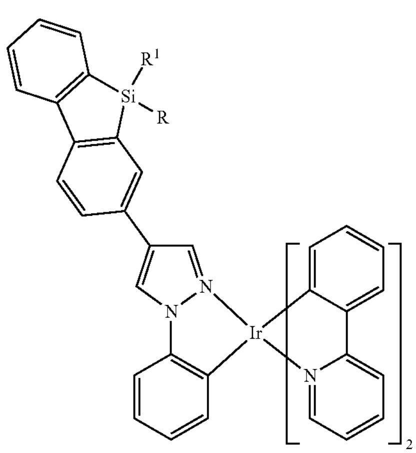
-continued
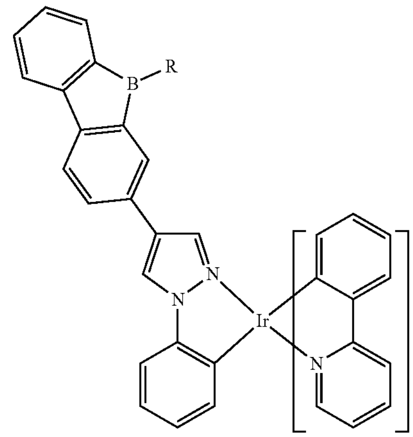
Structures Ir-22
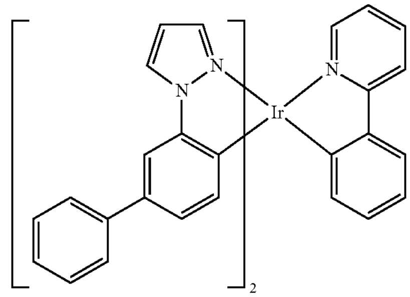
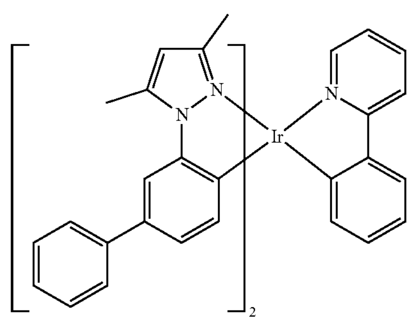
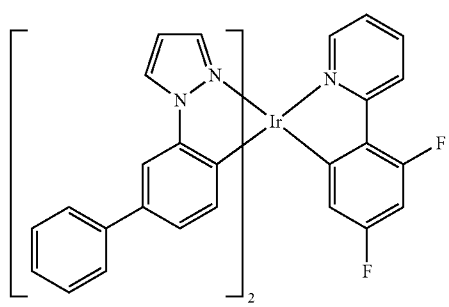
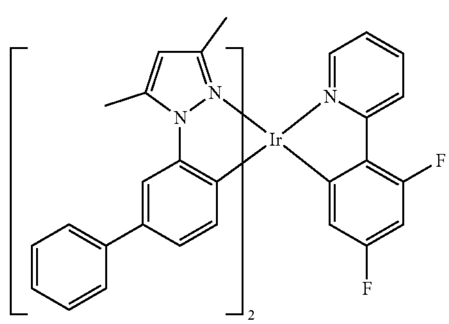

-continued
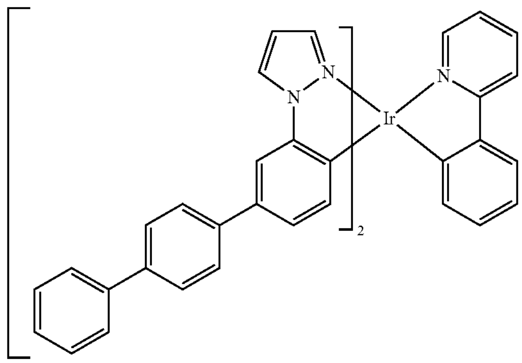
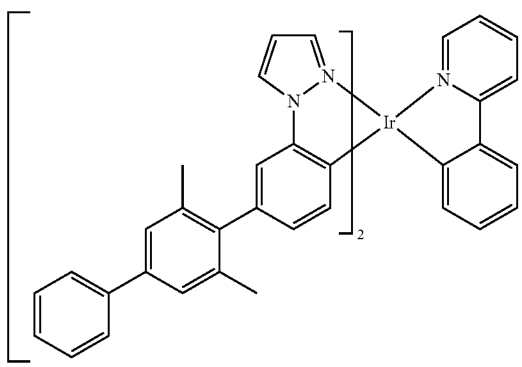
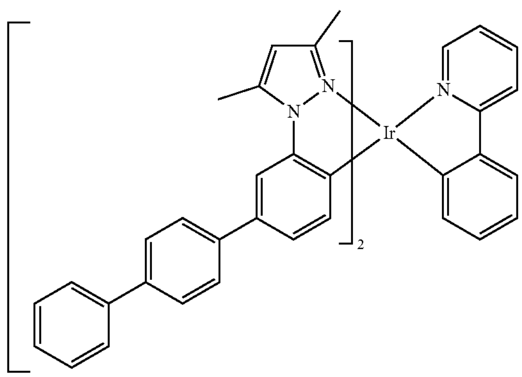
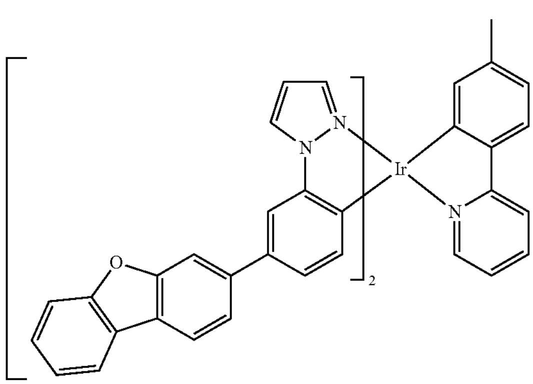
-continued
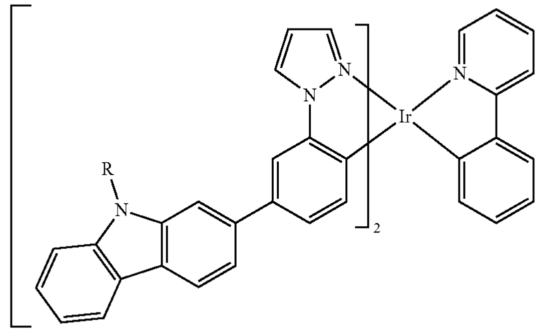
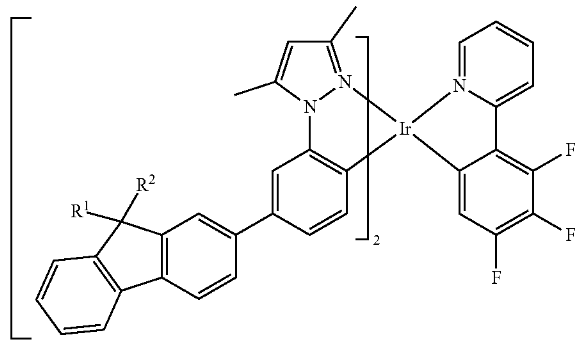
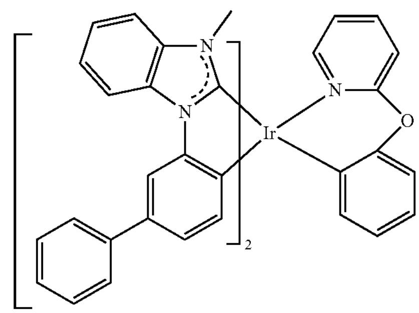
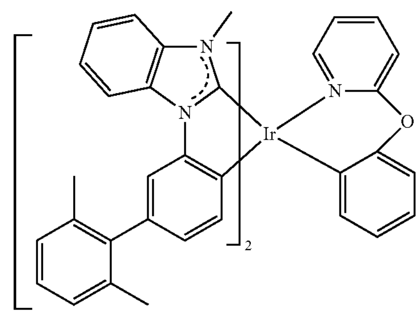
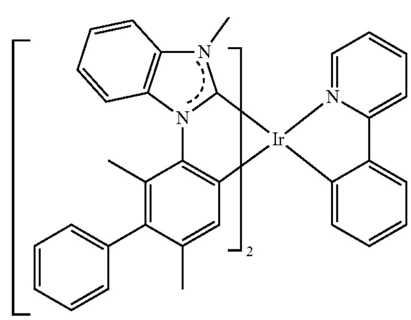

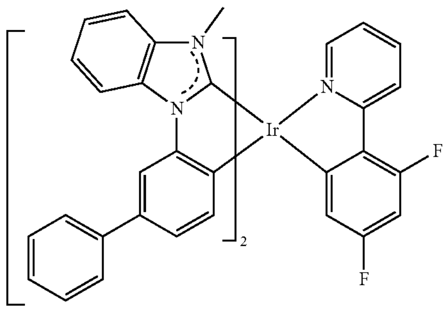
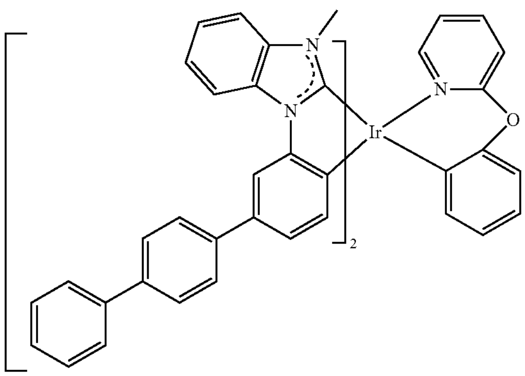
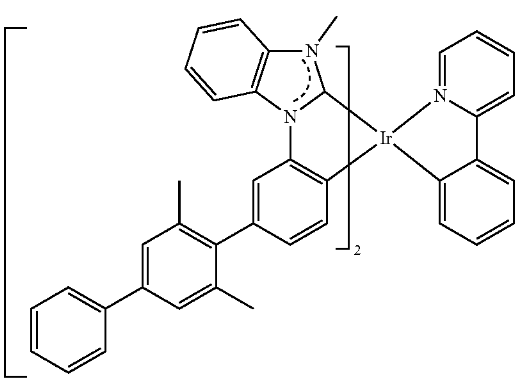
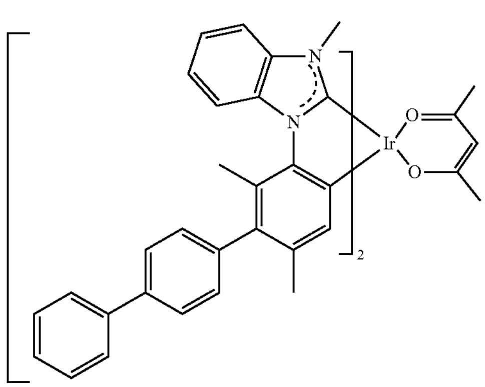
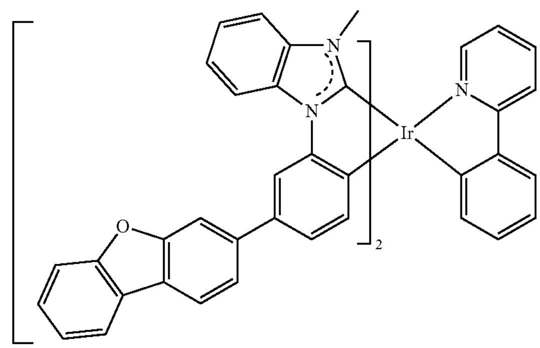
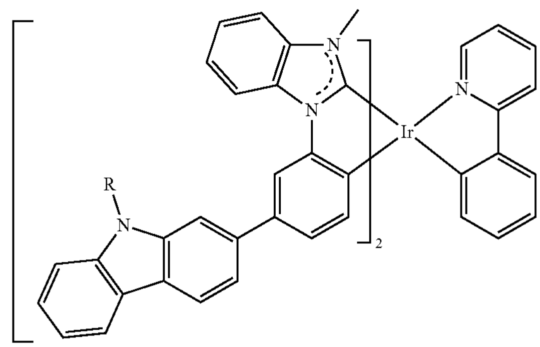
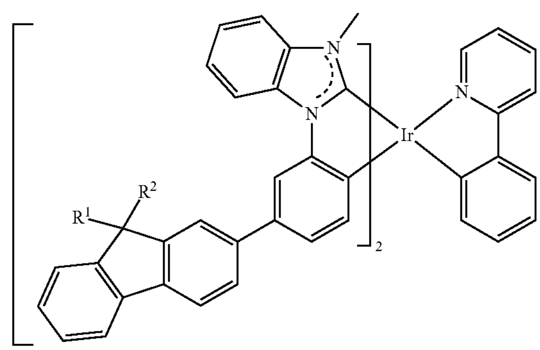
Structures Ir-23
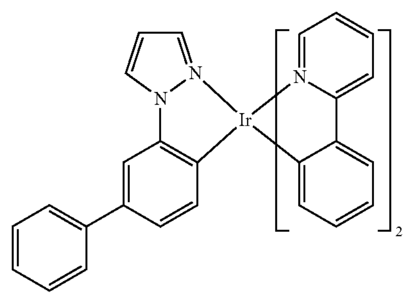
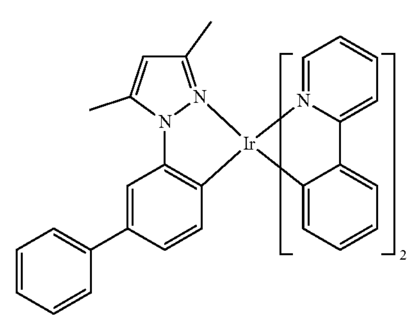

-continued
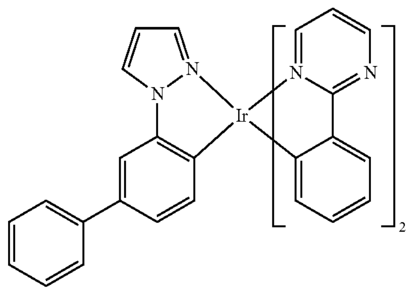
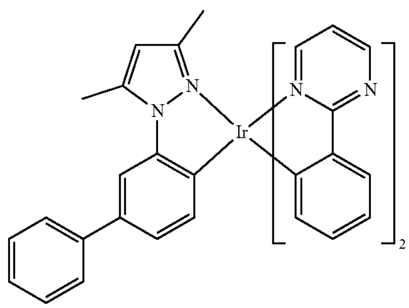
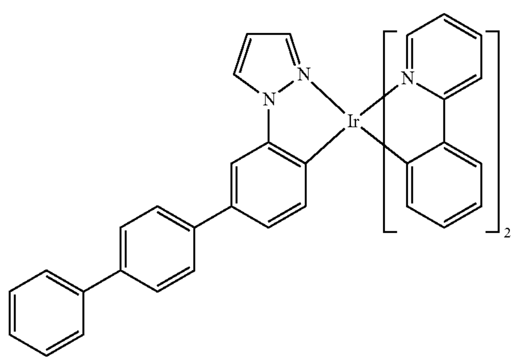
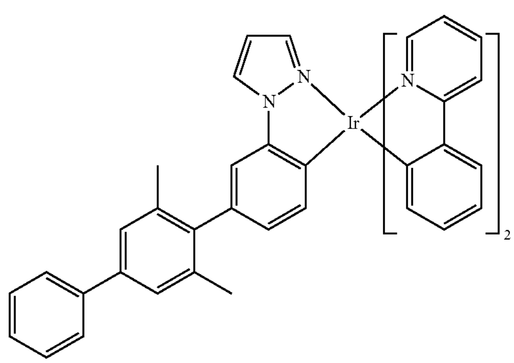
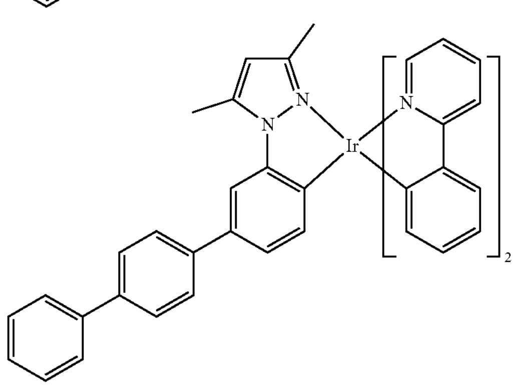
-continued
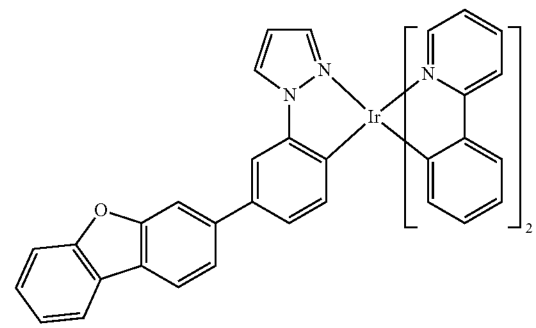
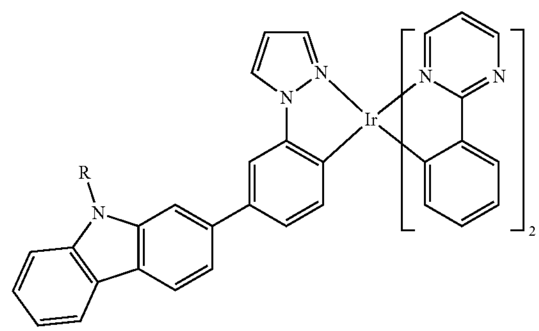
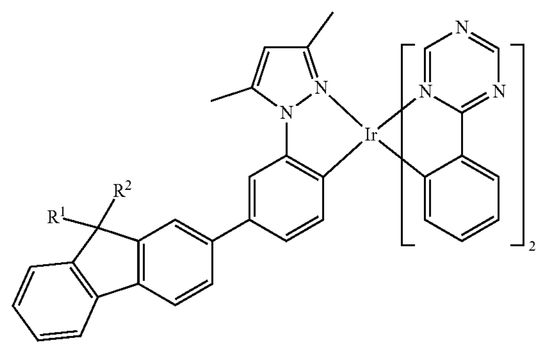
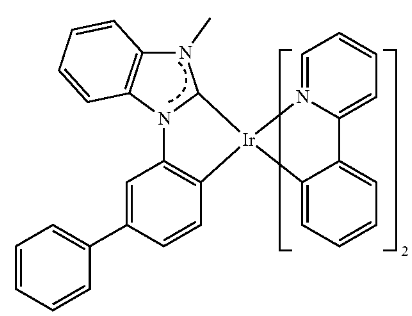
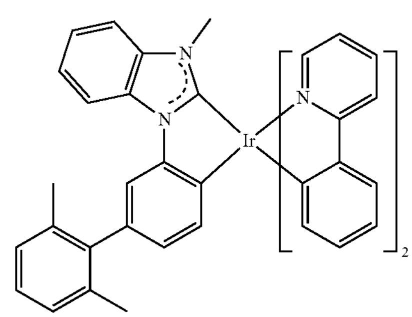

-continued
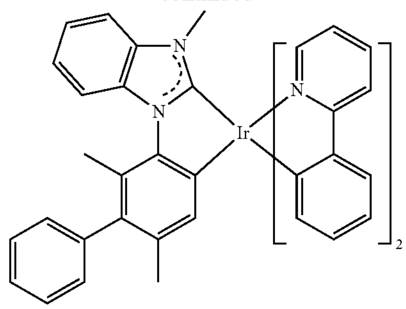
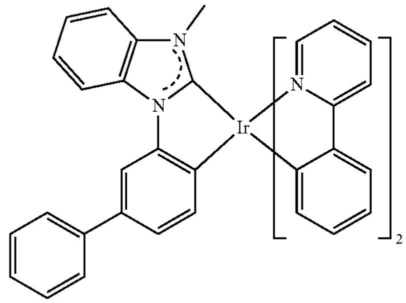
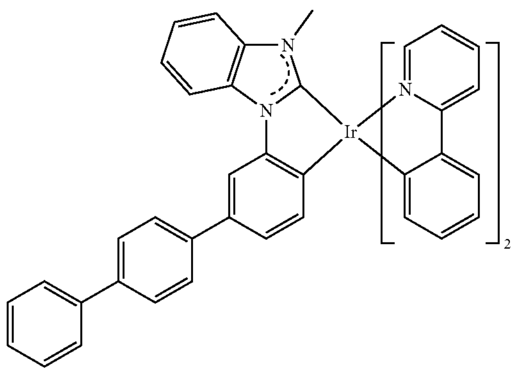
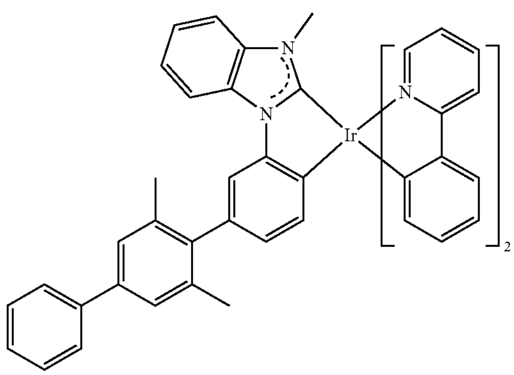
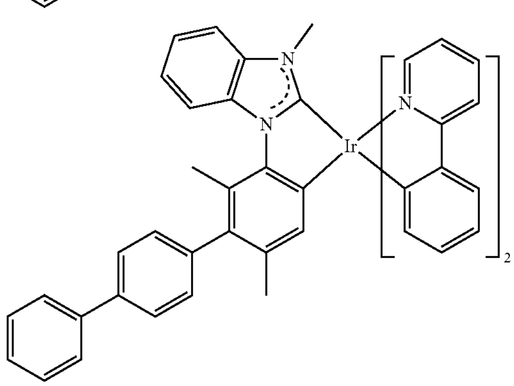
-continued
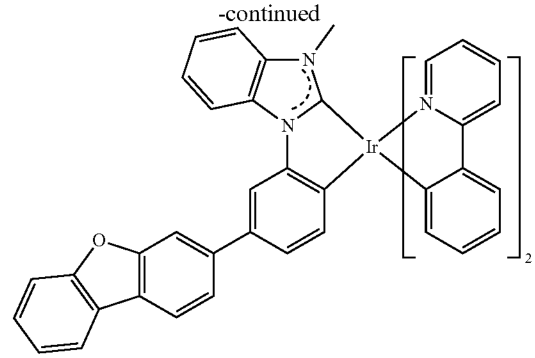
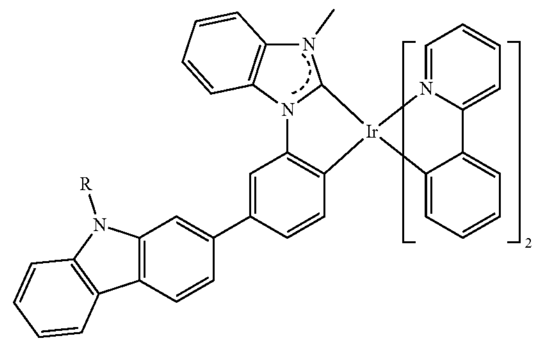
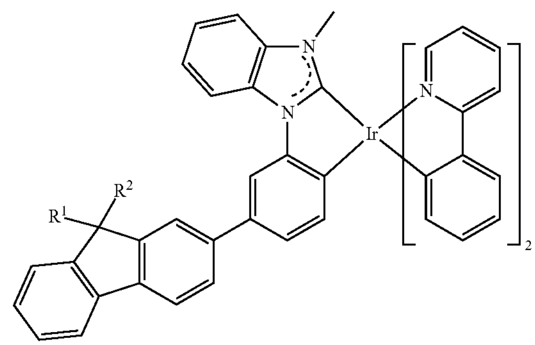
Structures Ir-24
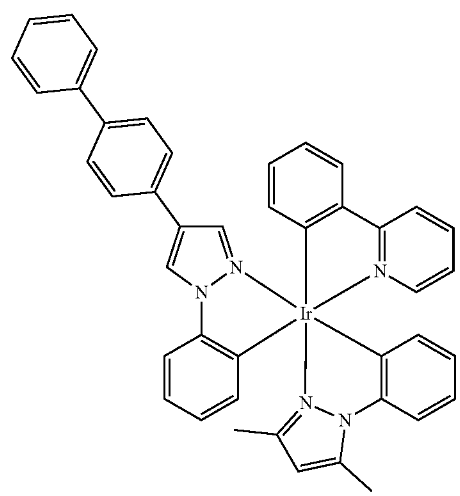

-continued
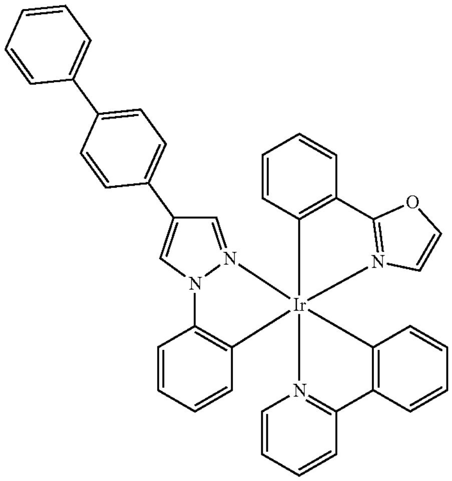
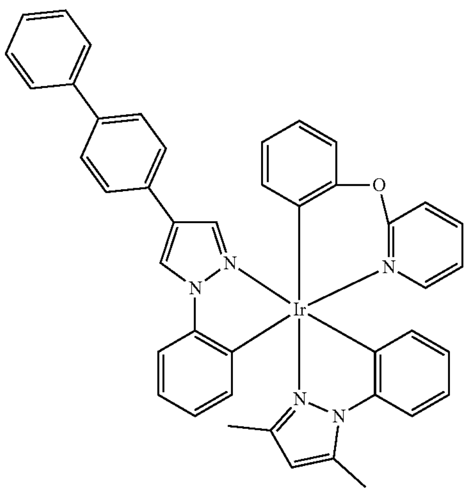
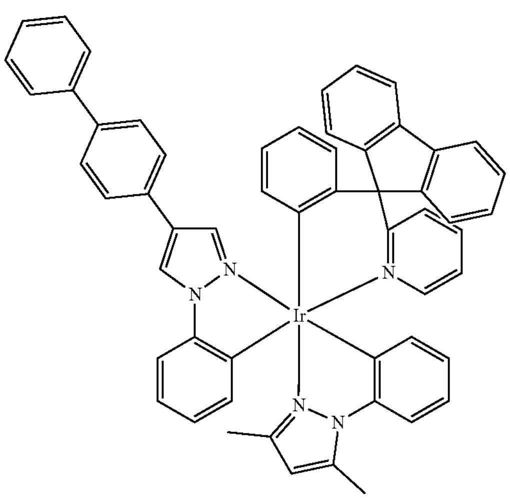
-continued
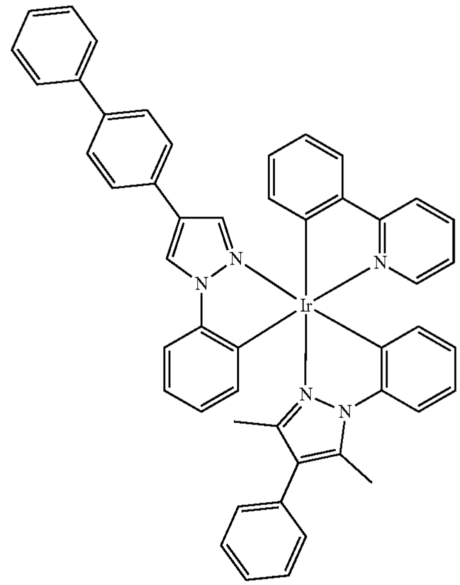
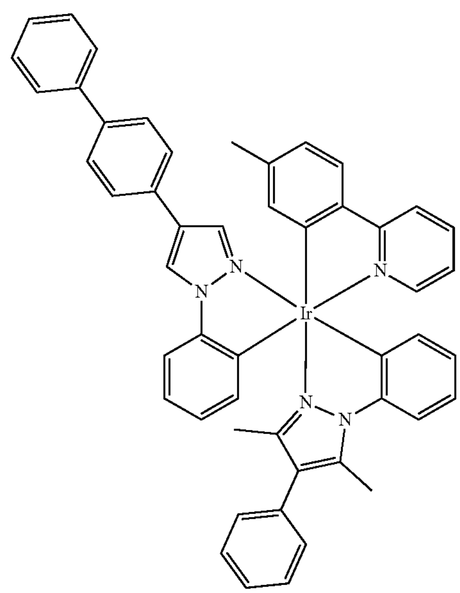

-continued
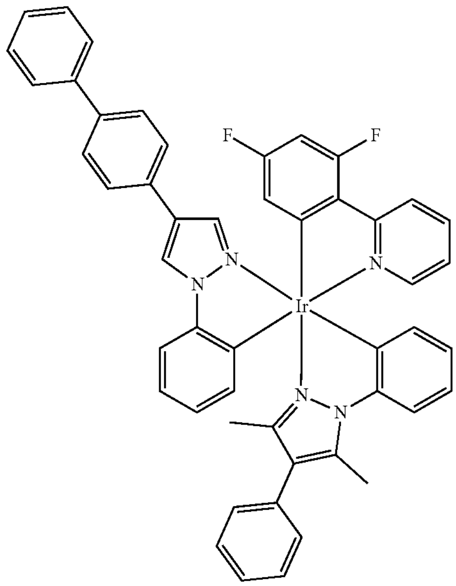
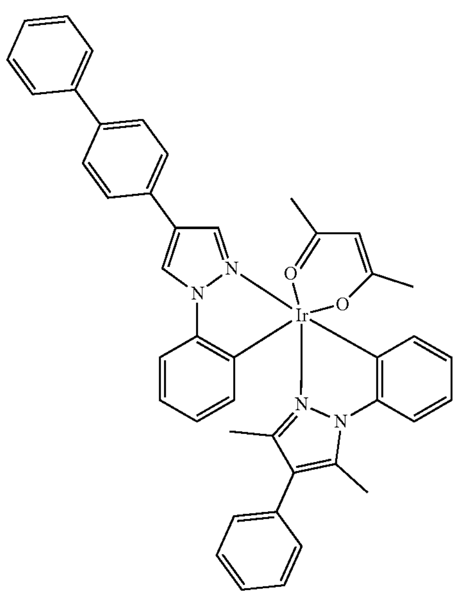
-continued
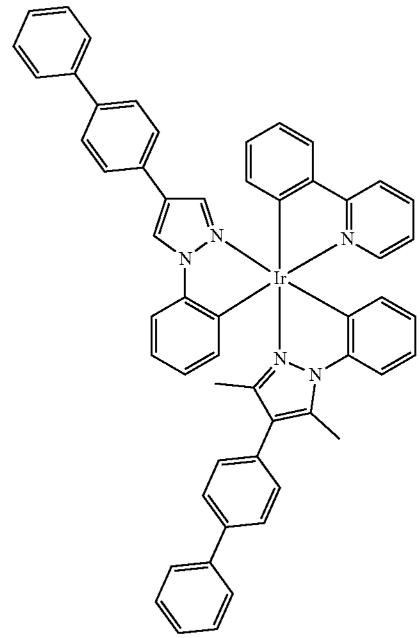
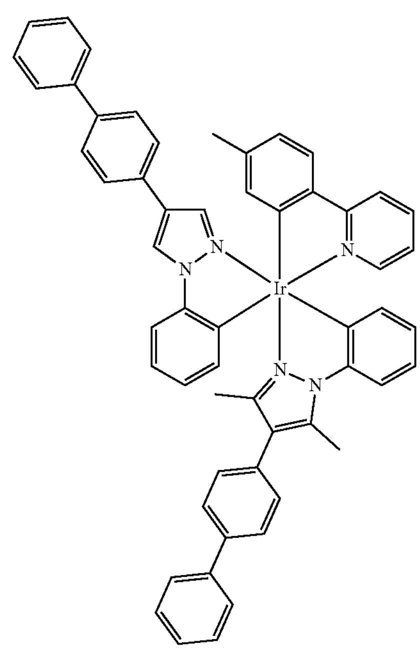

-continued
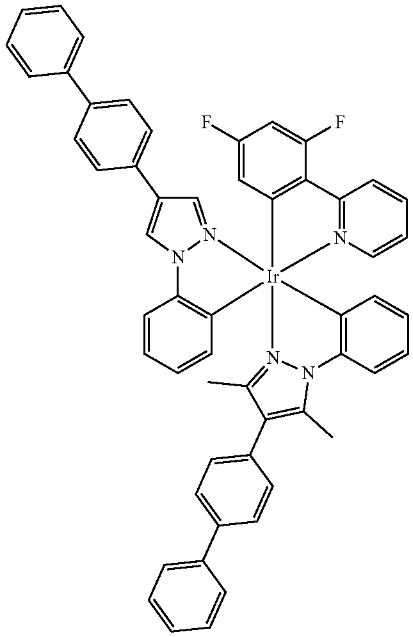
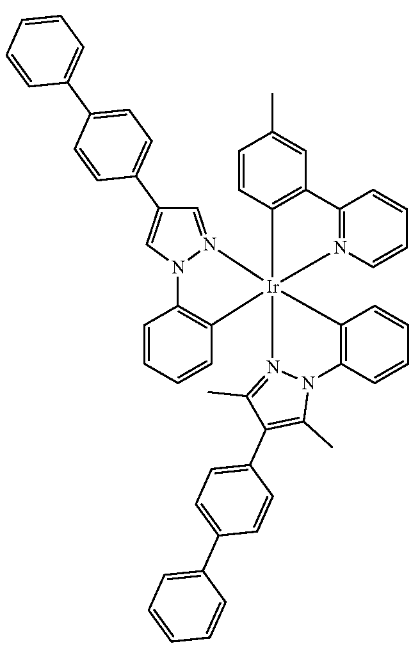
-continued
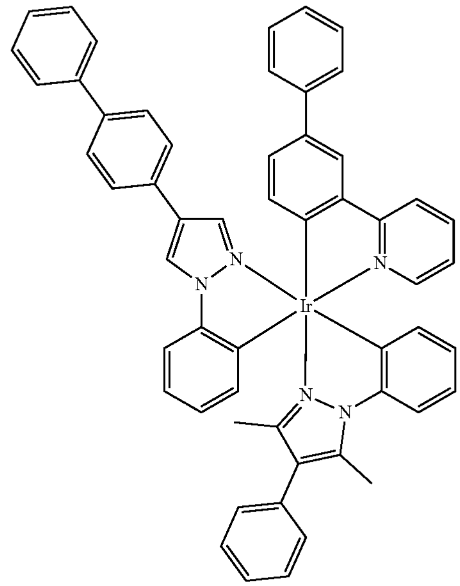
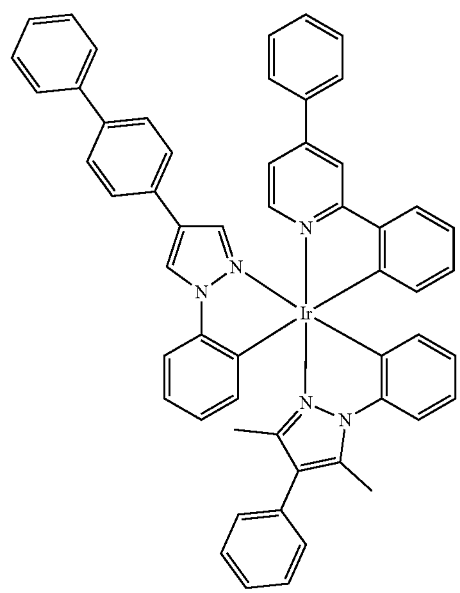

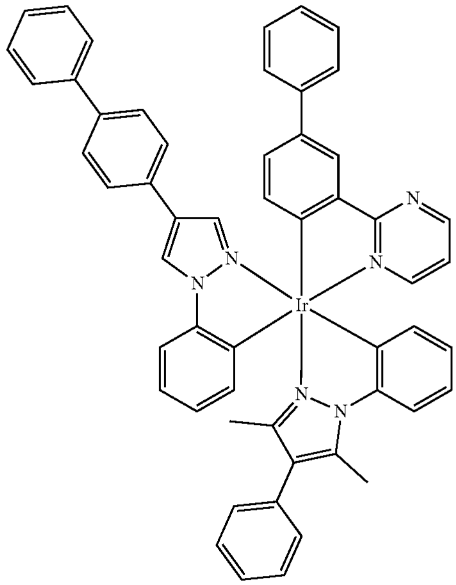
Structures Ir-25
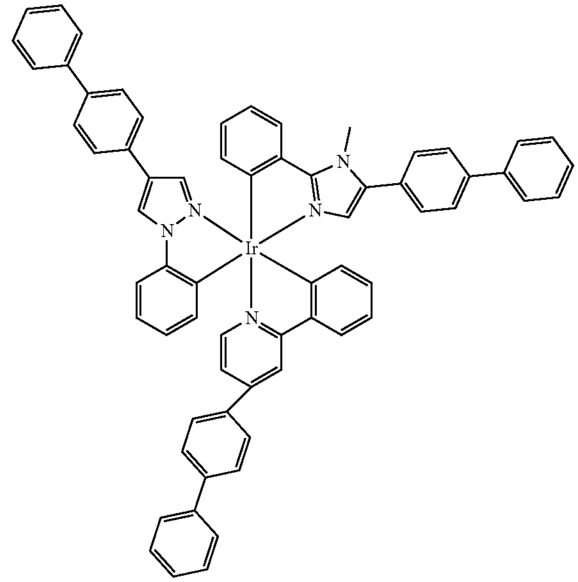
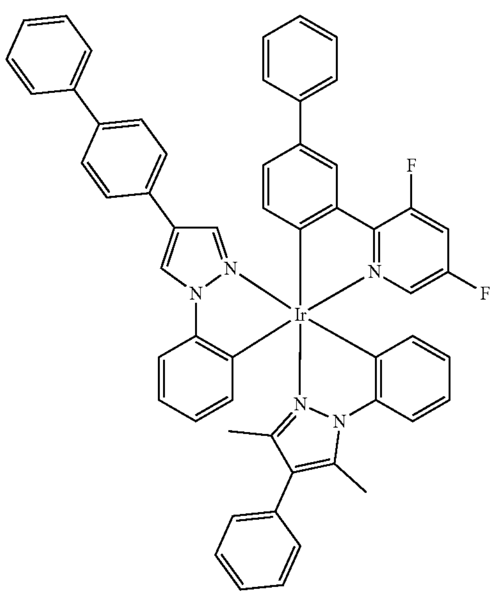
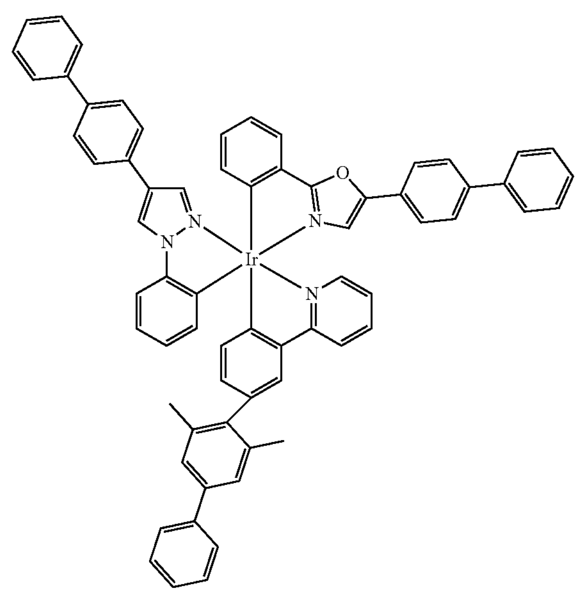

-continued
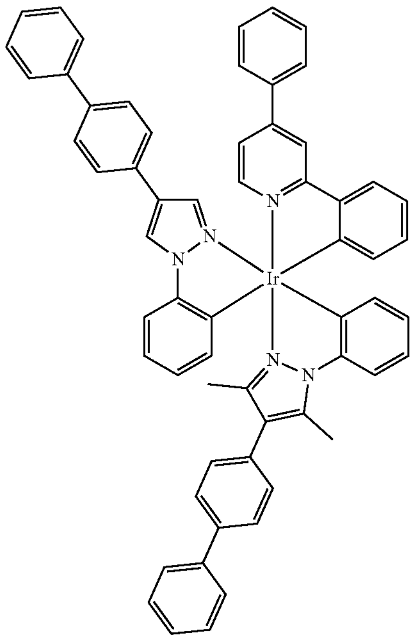
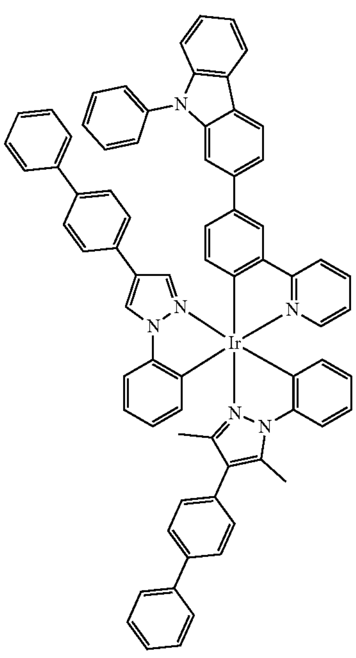
-continued
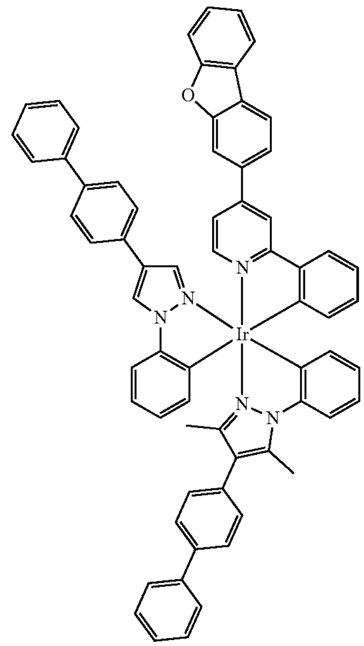
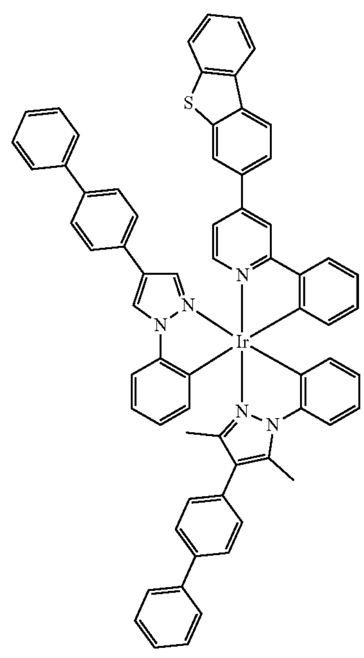

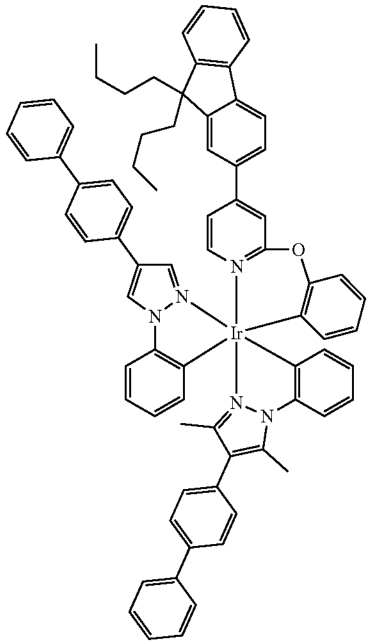
O
N
N
N
Ir
N
N
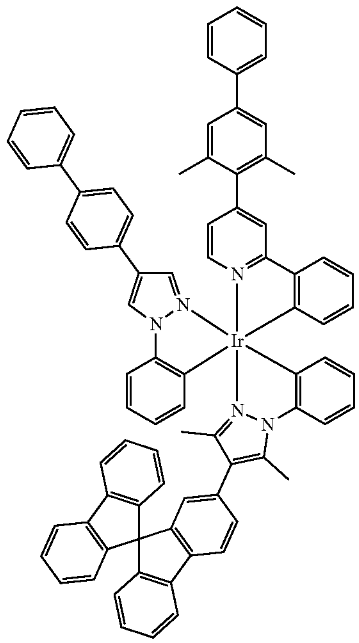
N
N
N
Ir
N
N
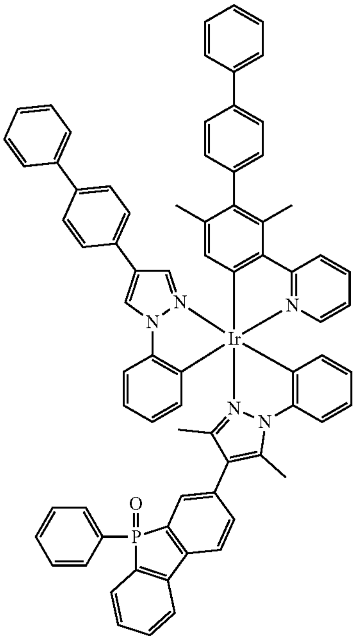
N
N
N
Ir
N
N
O
P
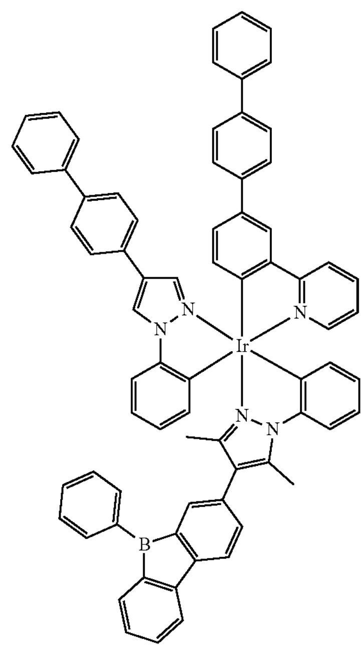
N
N
N
Ir
N
N
B -continued
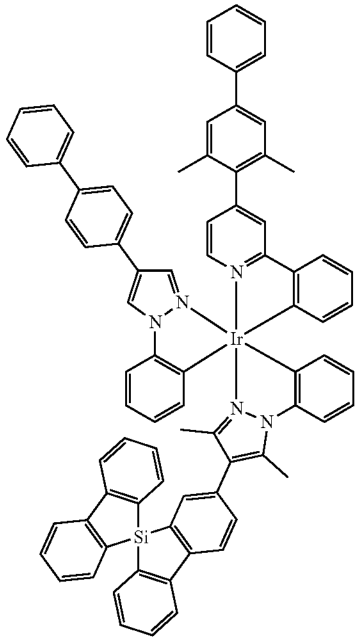
Structures Rh-1
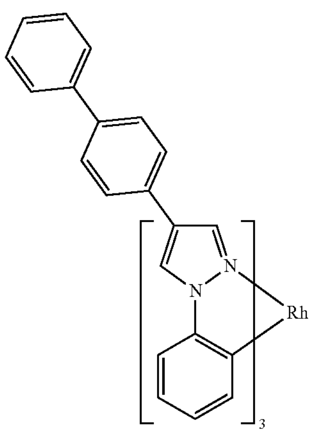
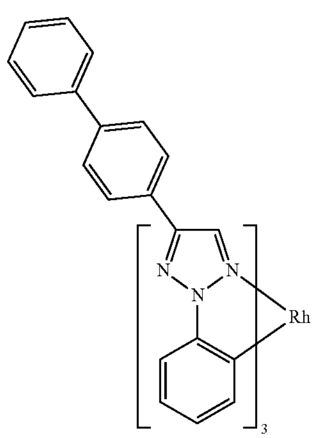
-continued
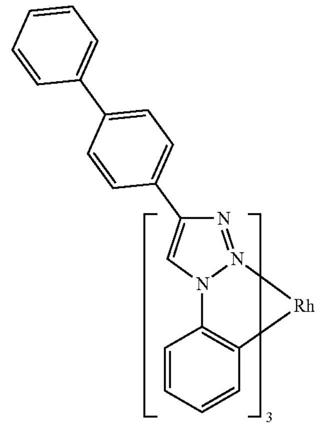
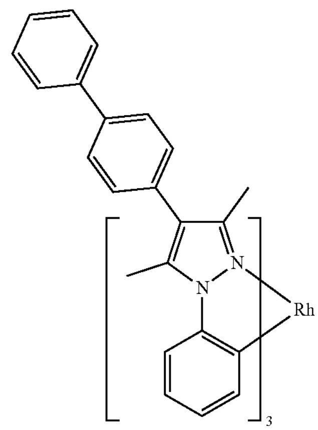
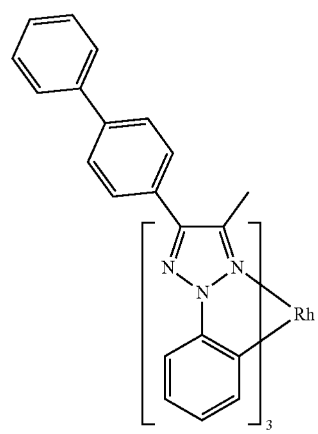
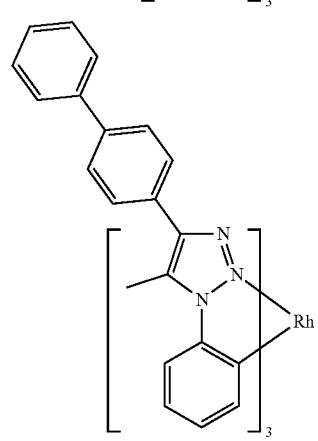

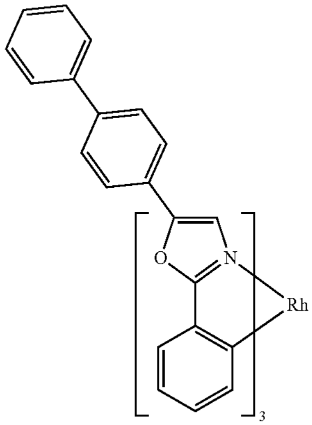
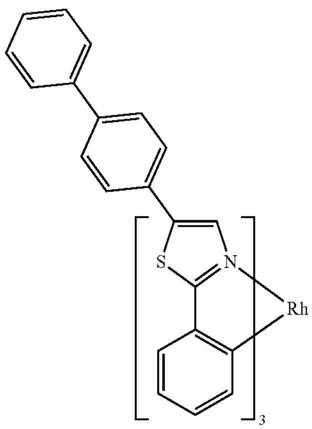
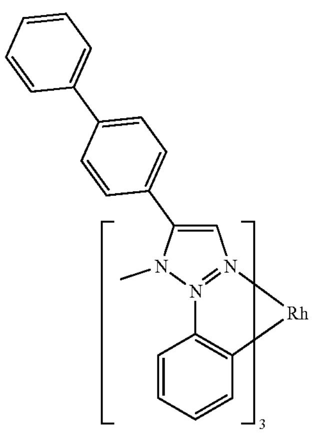
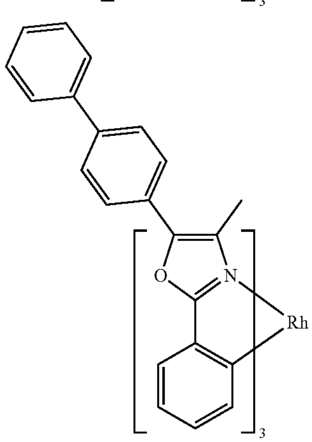
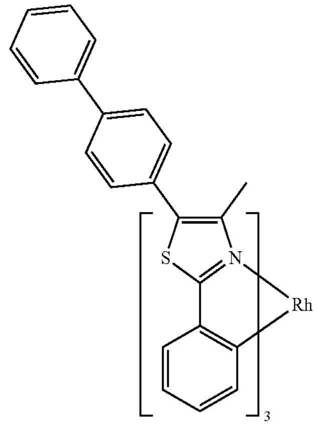
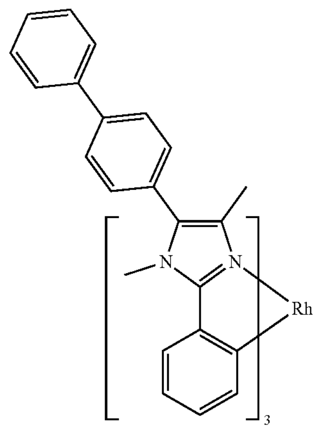
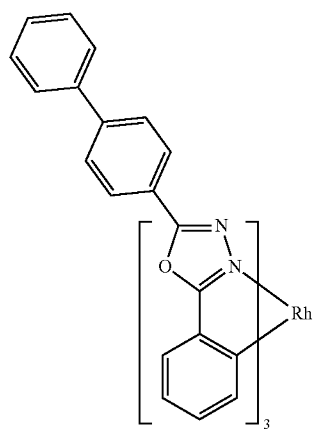
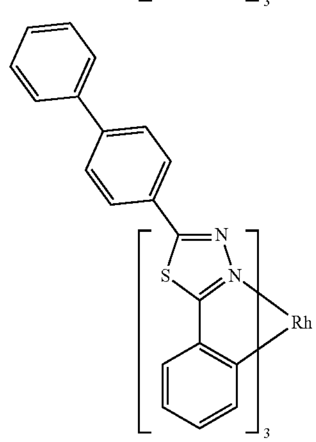

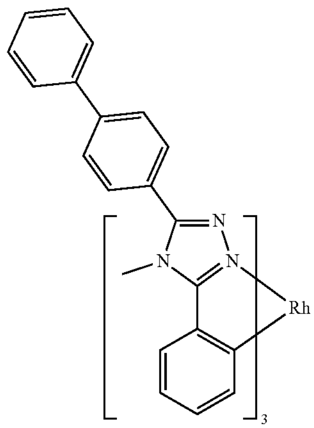
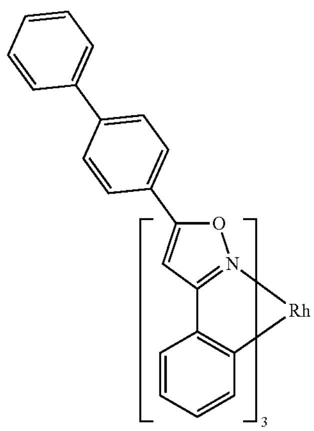
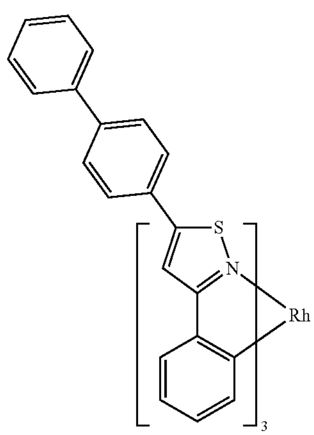
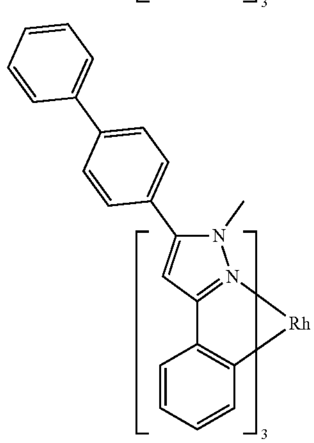
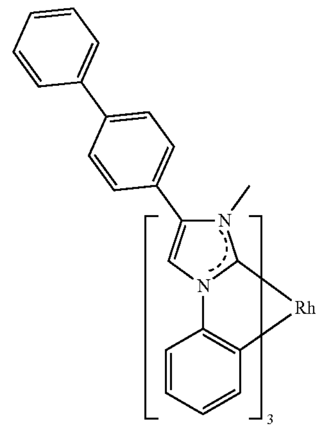
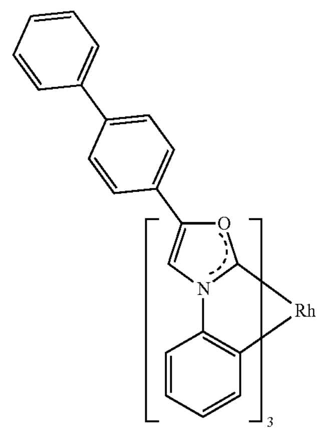
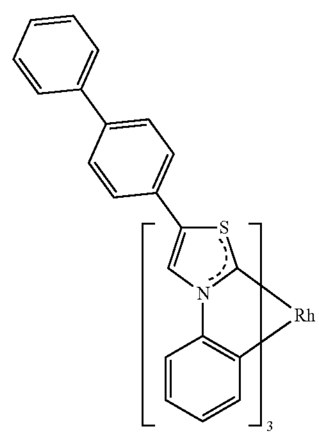
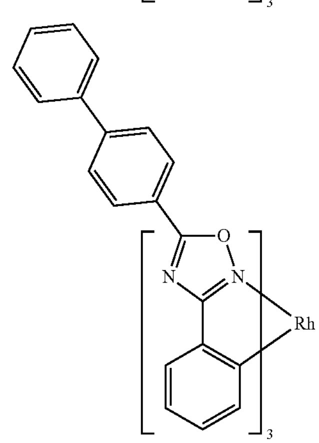

-continued
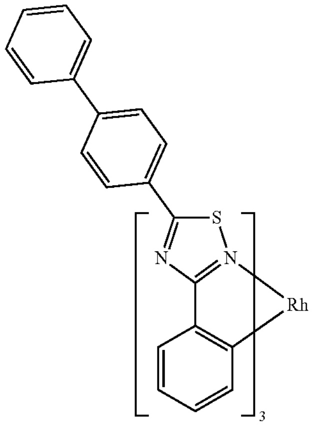
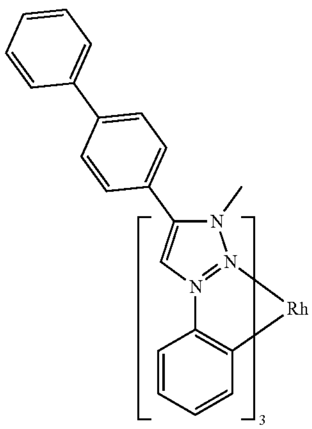
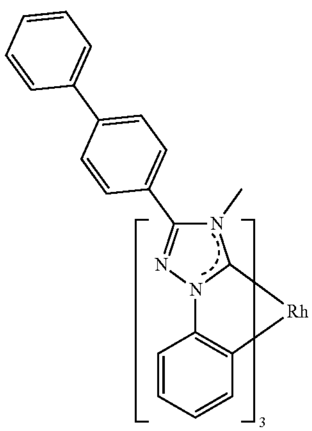
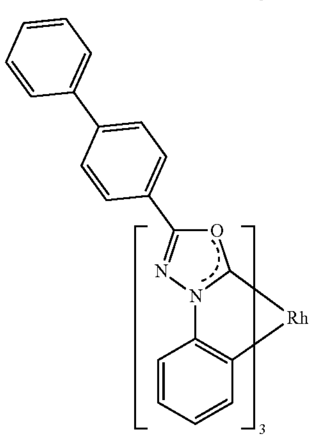
-continued
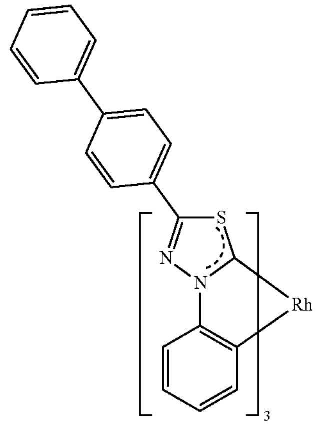
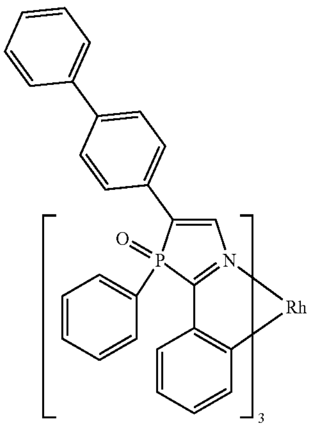
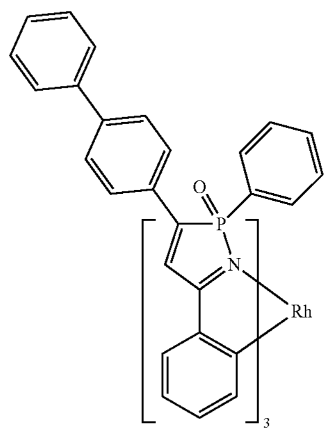
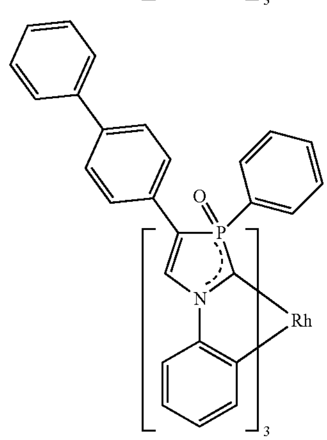

-continued
Structures Rh-2
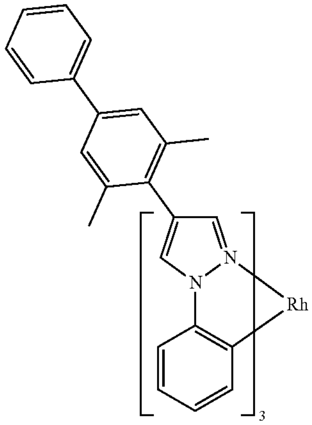
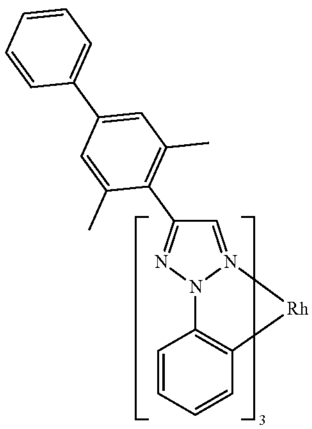
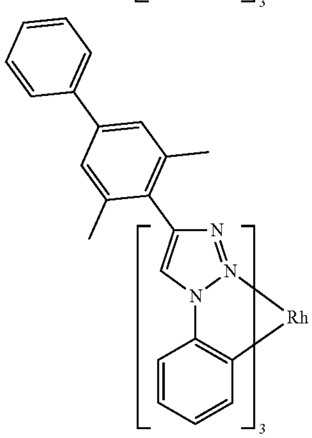
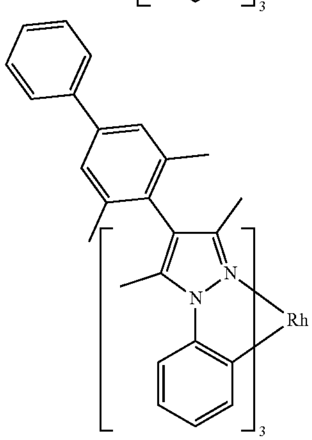
-continued
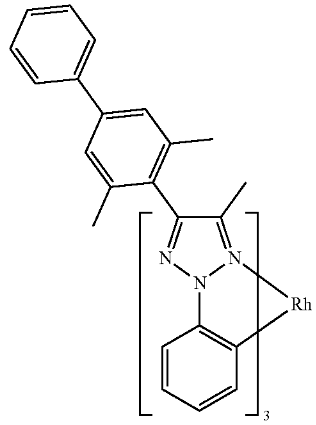
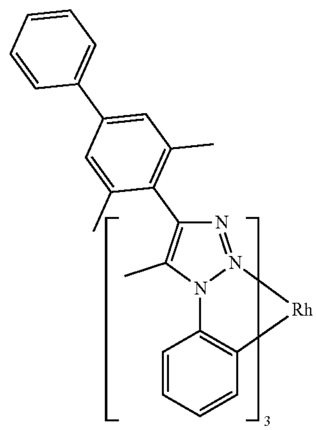
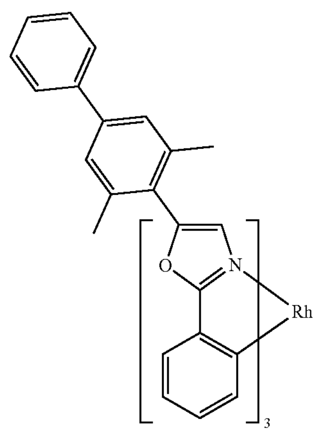
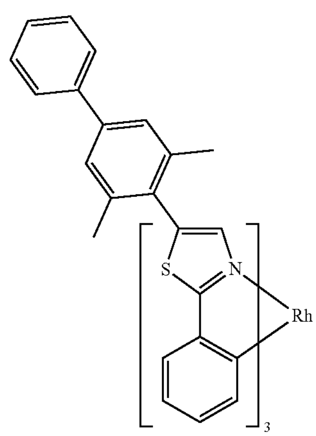

-continued
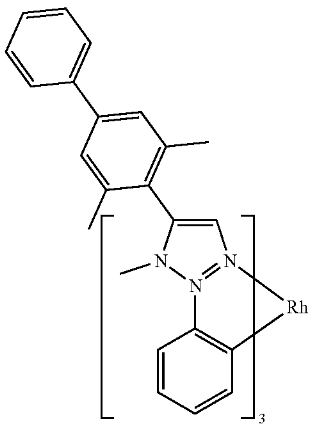
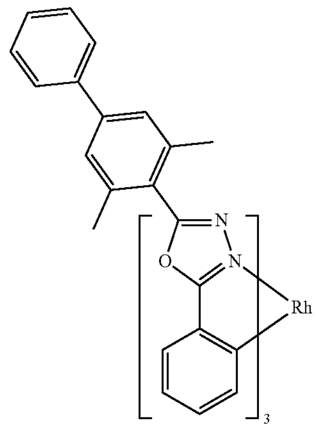
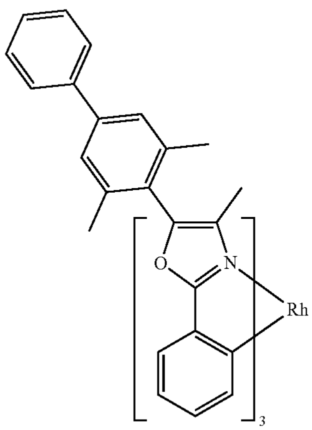
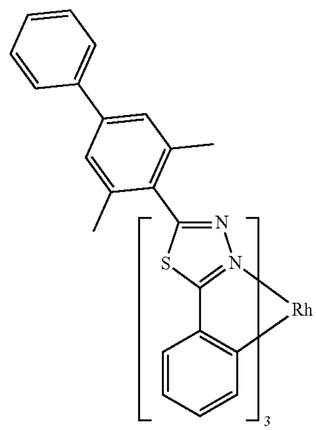
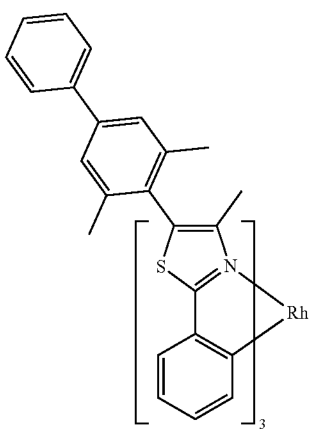
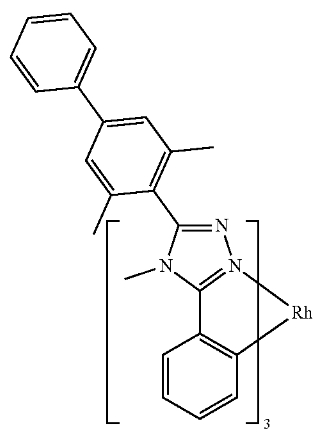
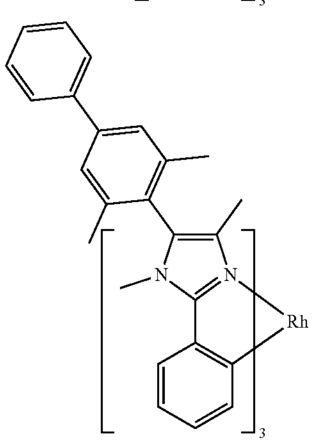
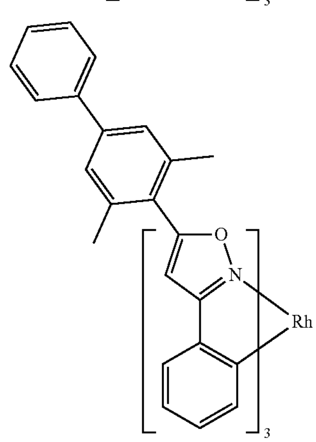
-continued -continued
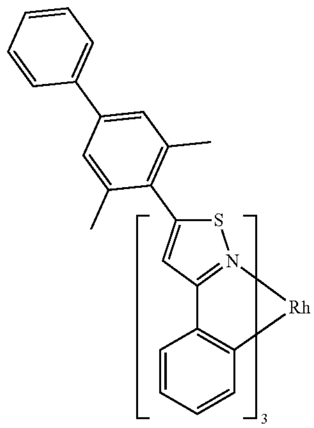
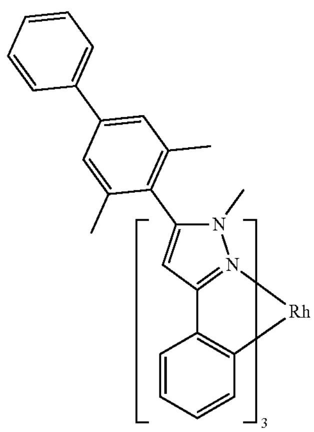
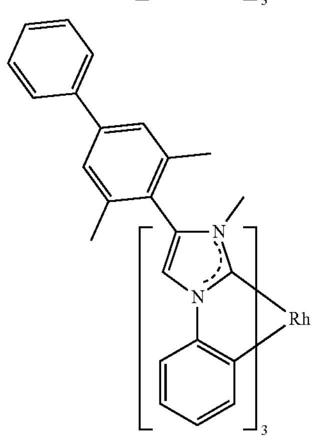
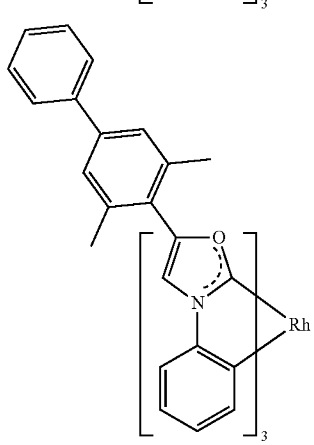
-continued
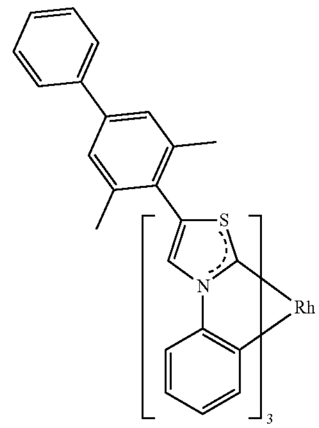
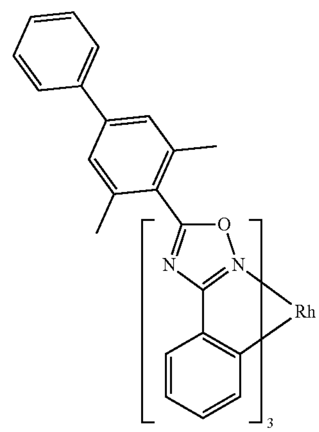
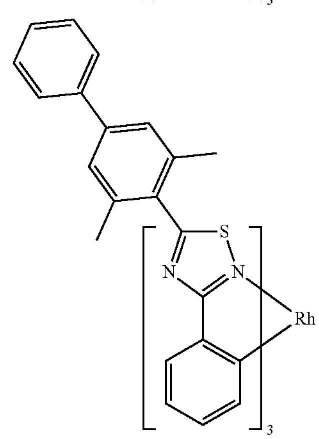
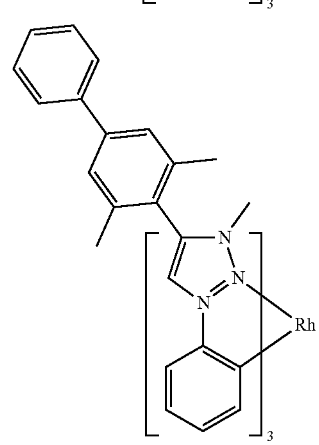

-continued
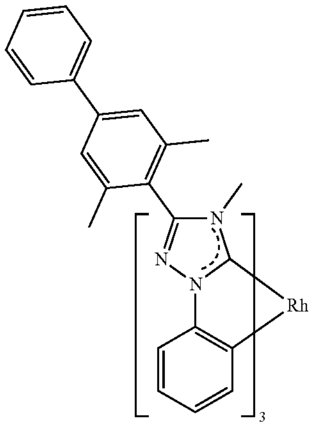
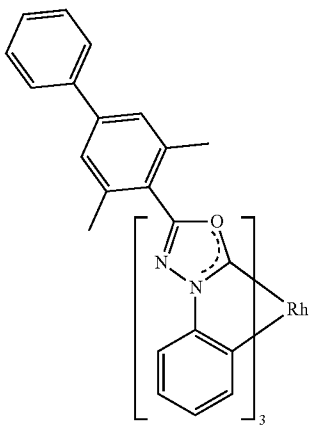
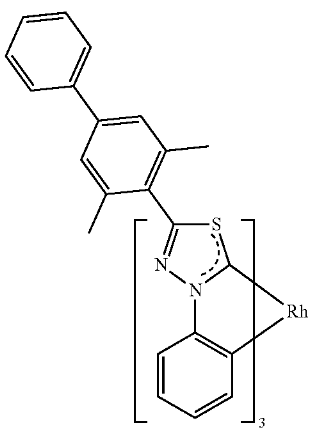
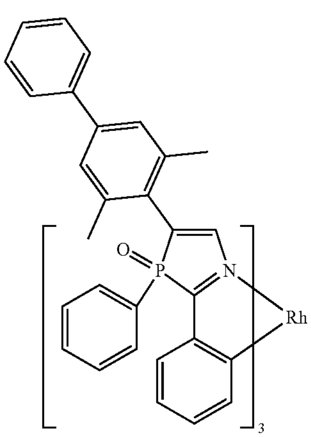
-continued
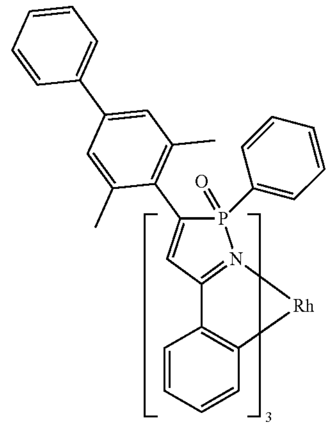
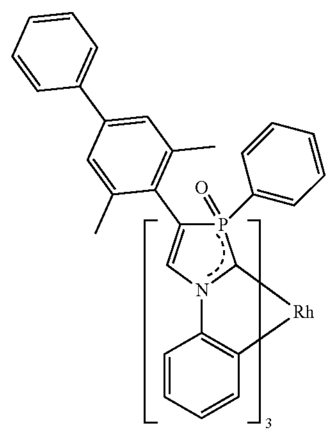
Structures Rh-3
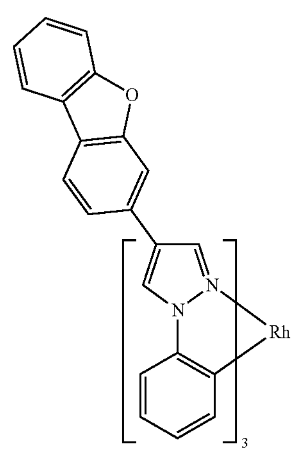

-continued
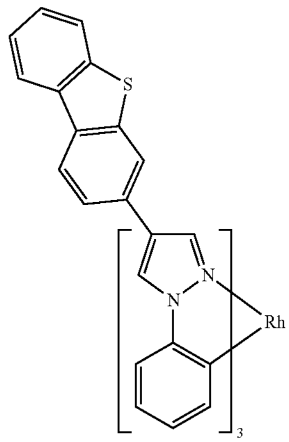
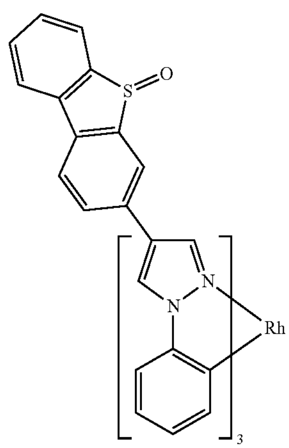
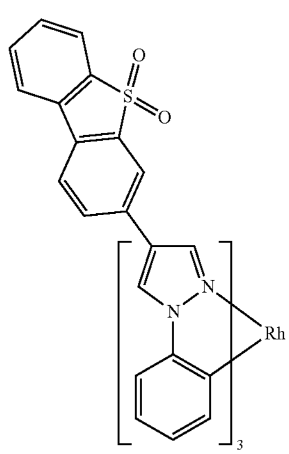
-continued
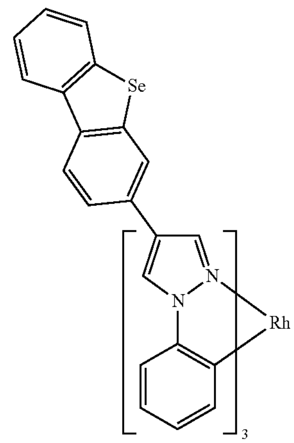
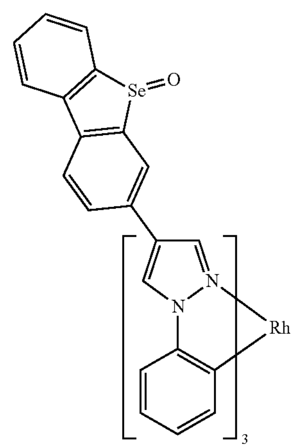
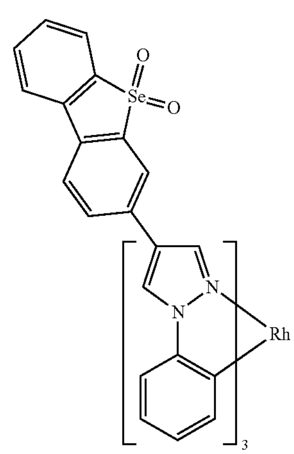

-continued
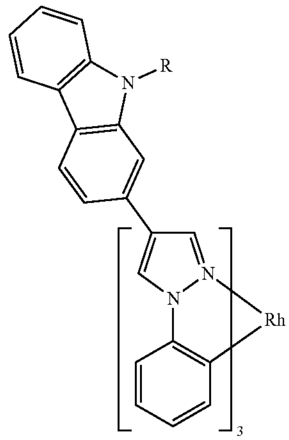
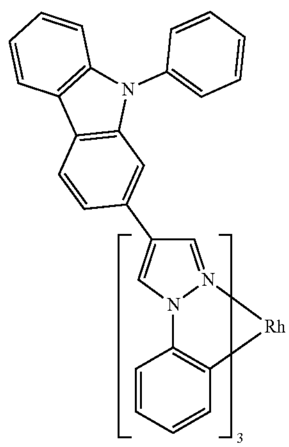
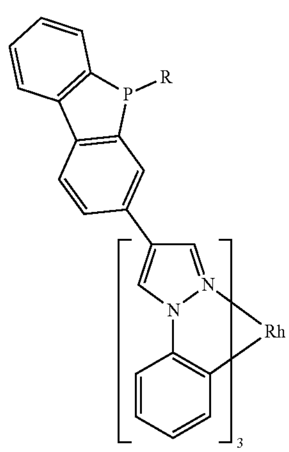
-continued
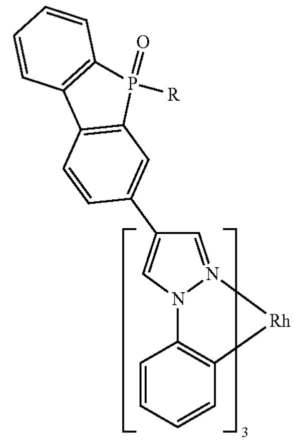
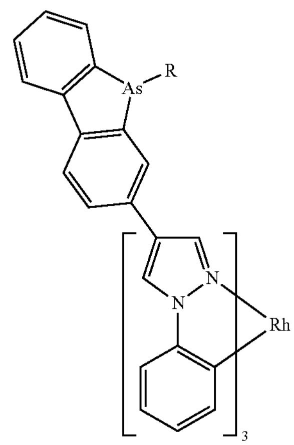
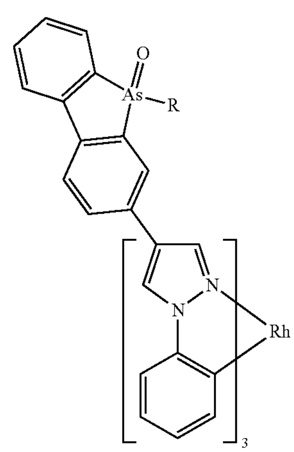

-continued
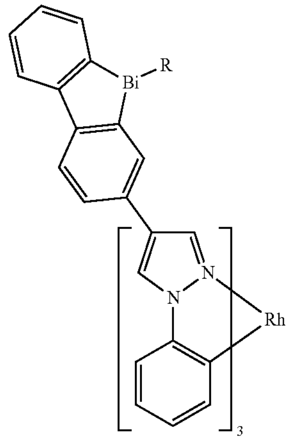
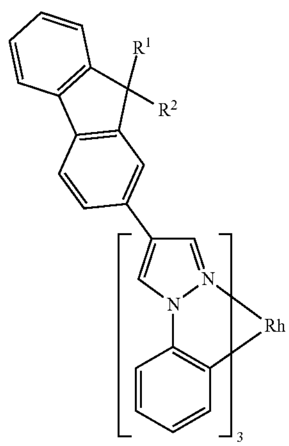
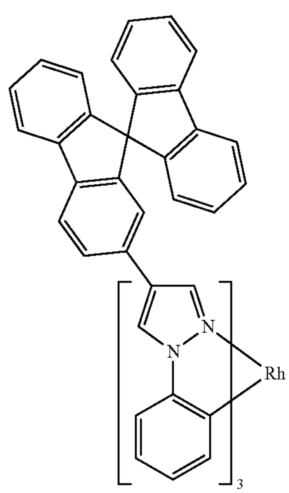
-continued
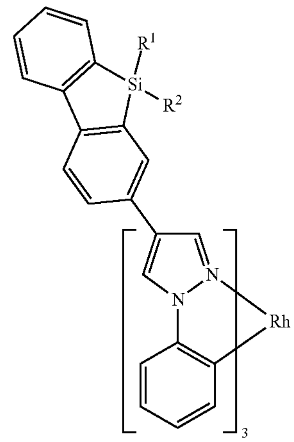
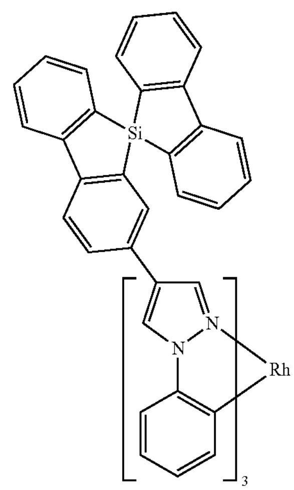
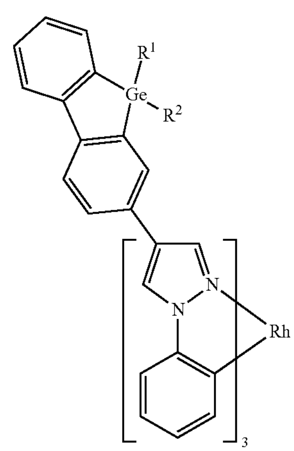

-continued
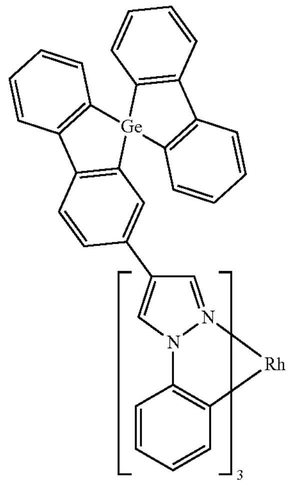
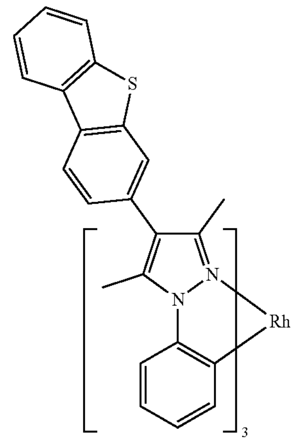
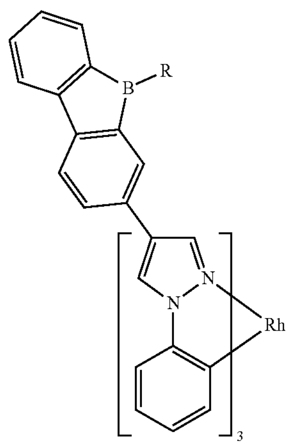
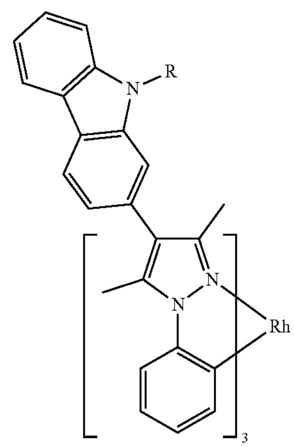
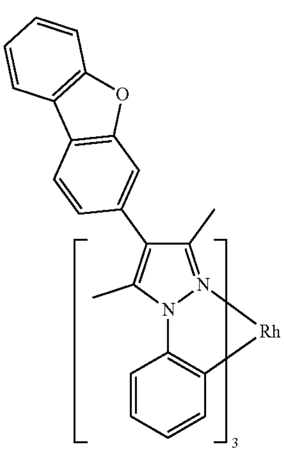
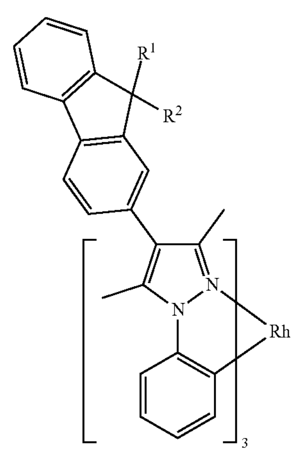

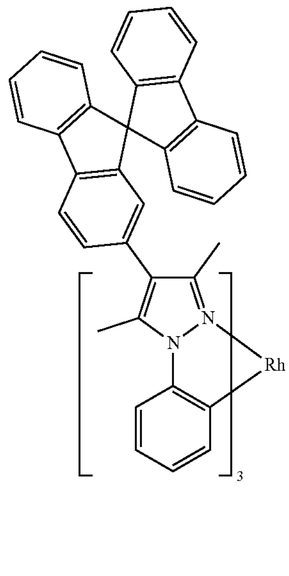
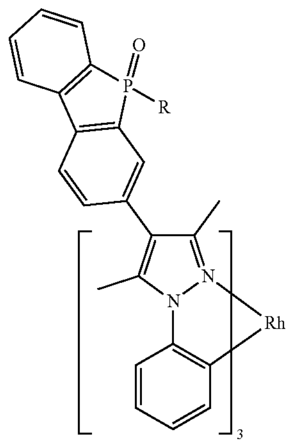
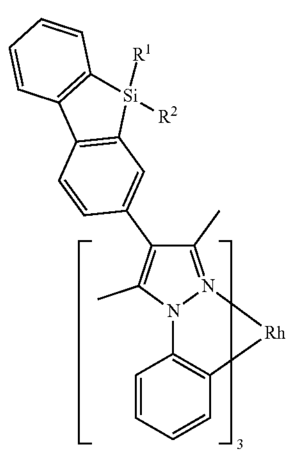
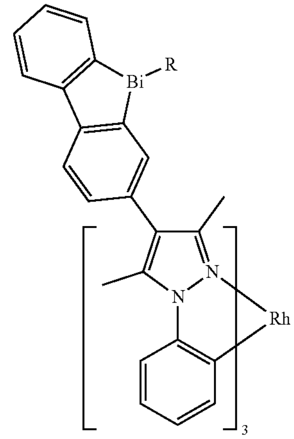
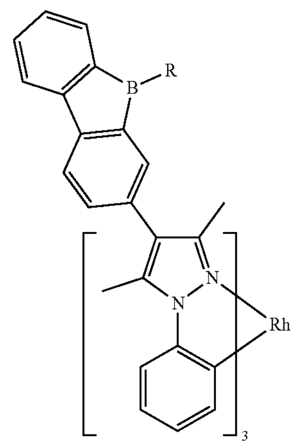
Structures Rh-4
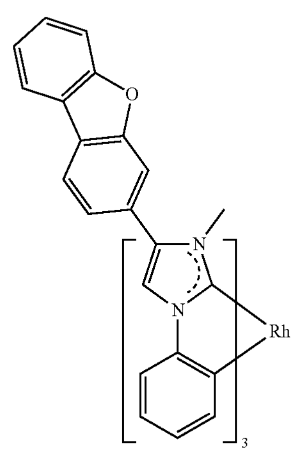

-continued
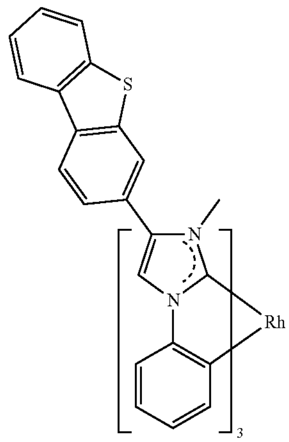
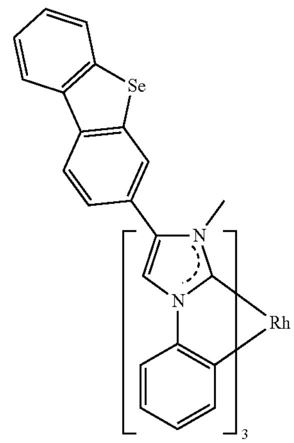
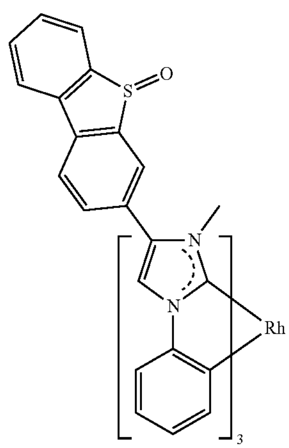
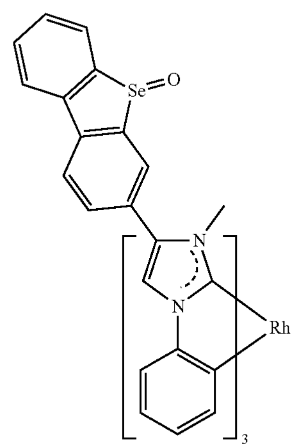
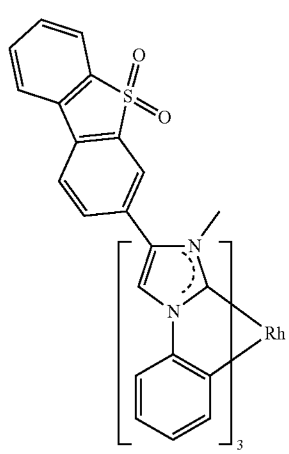
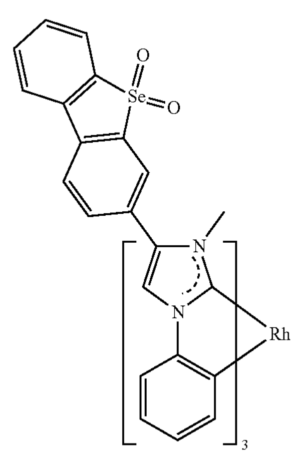
-continued -continued
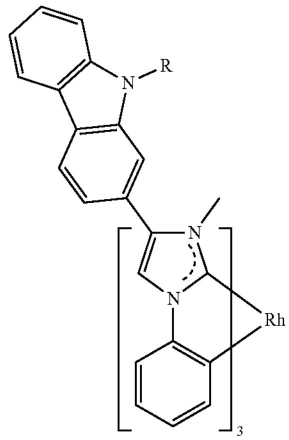
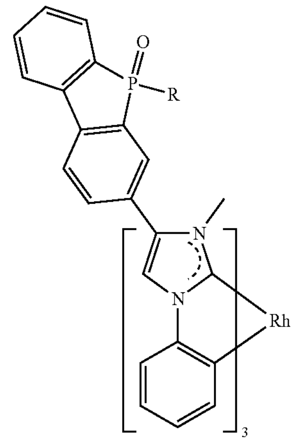
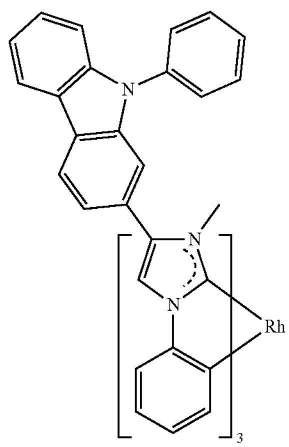
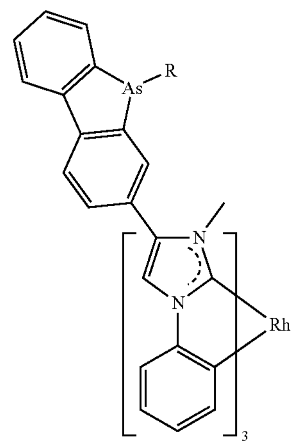
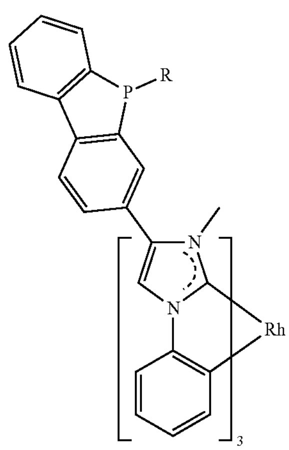
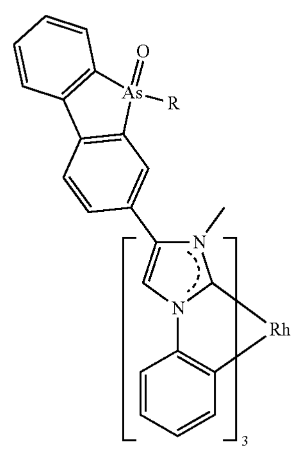

-continued
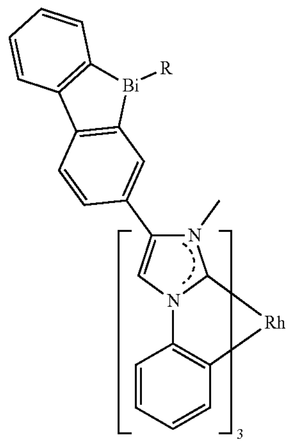
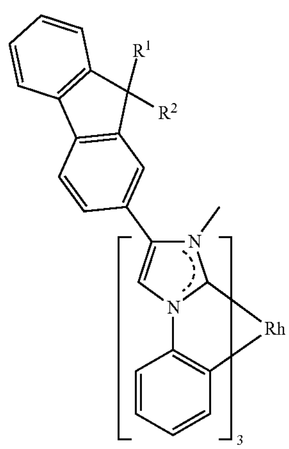
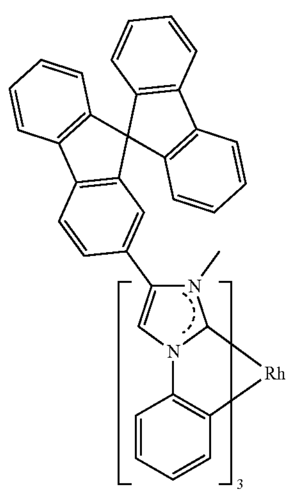
-continued
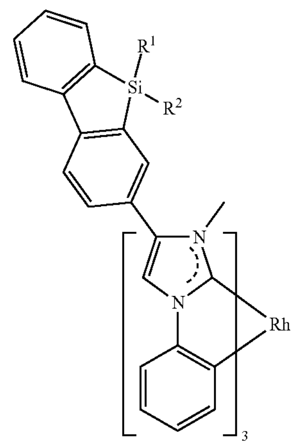
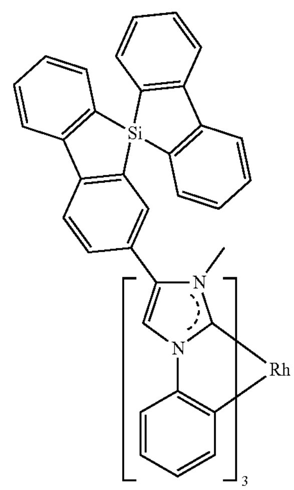
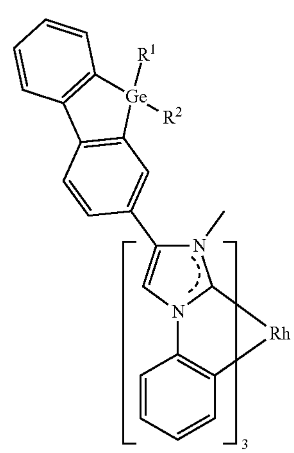

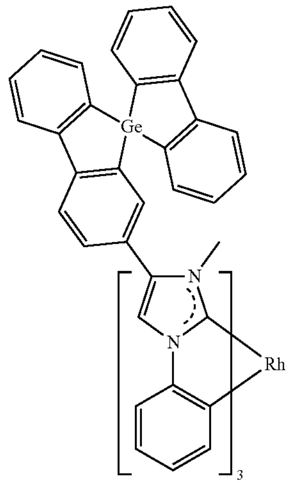
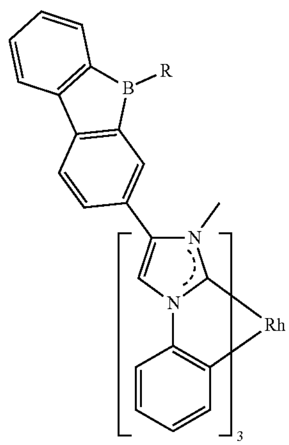
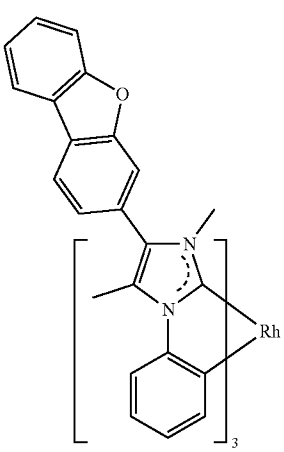
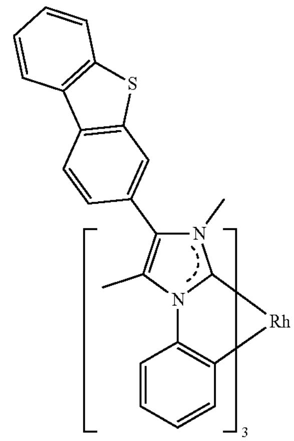
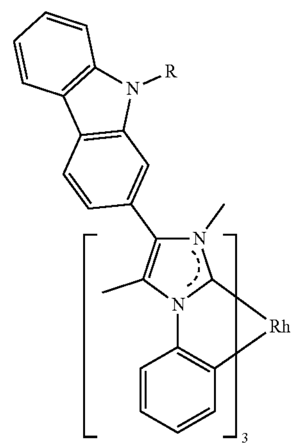
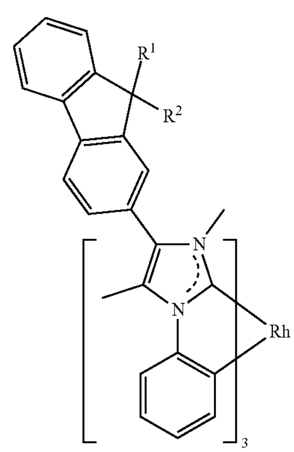

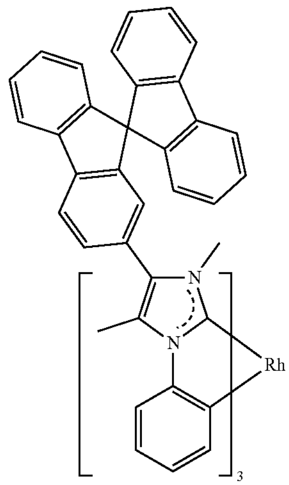
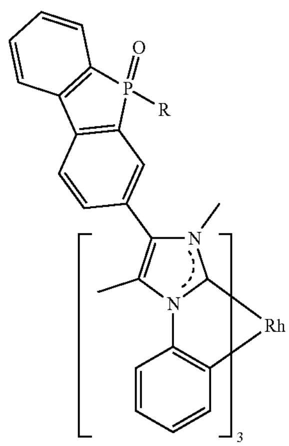
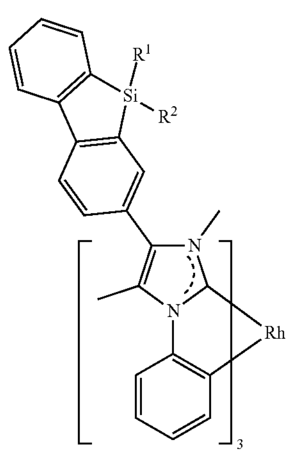
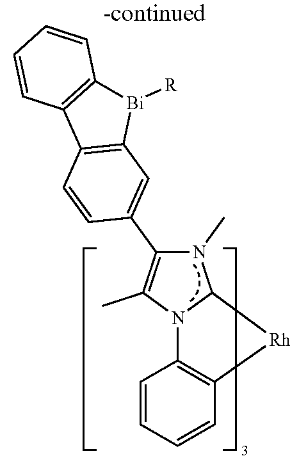
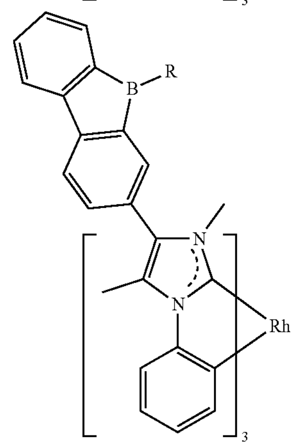
Structures Rh-5
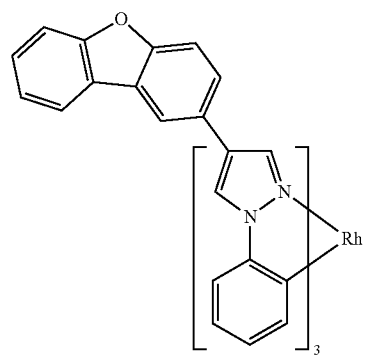
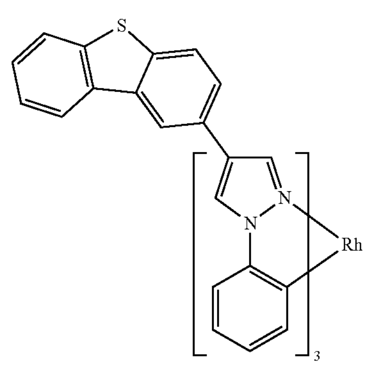

-continued
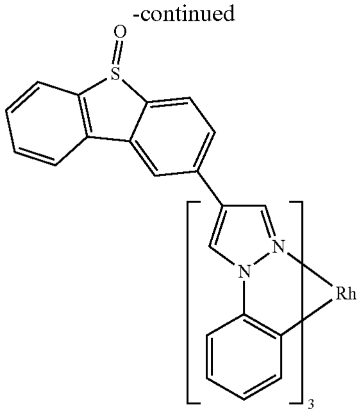
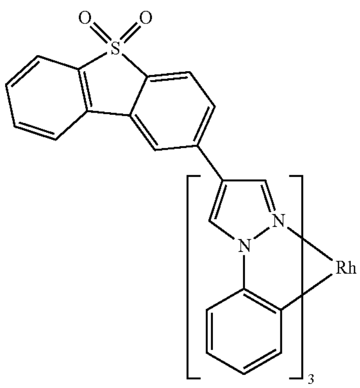
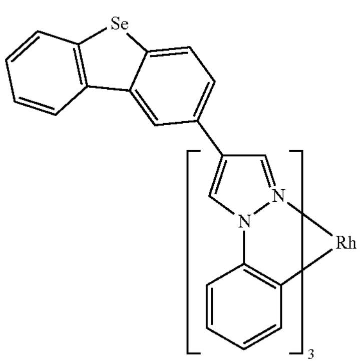
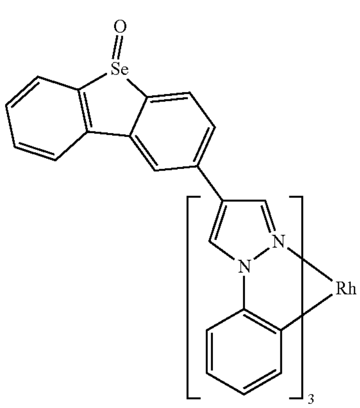
-continued
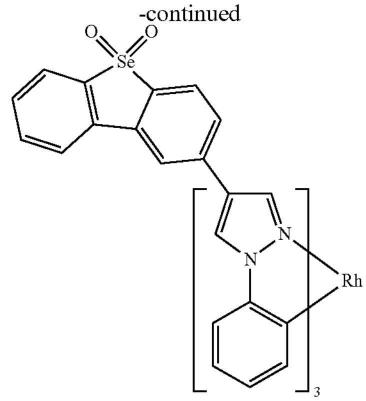
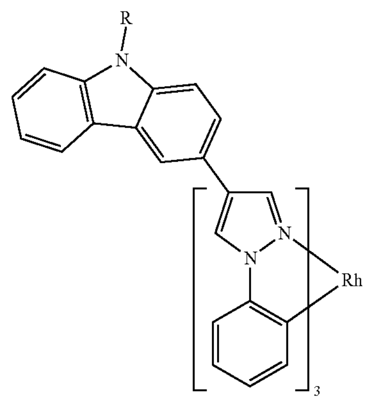
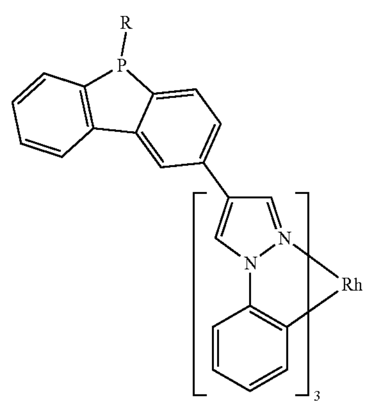
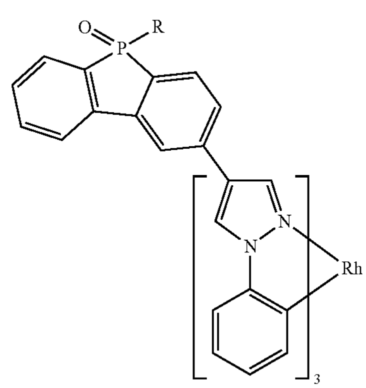

-continued
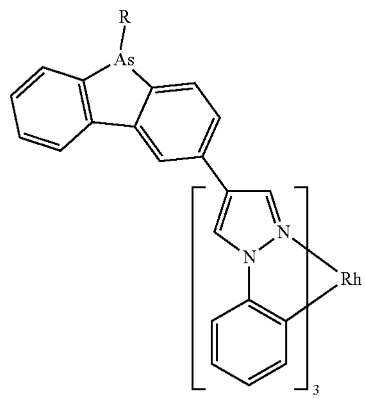
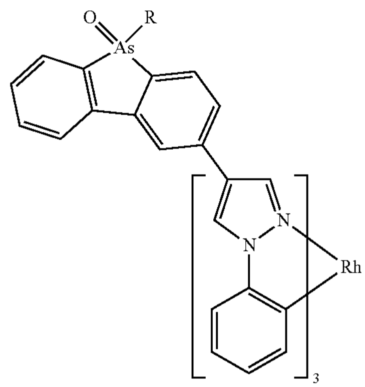
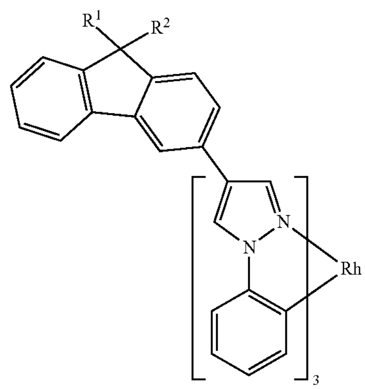
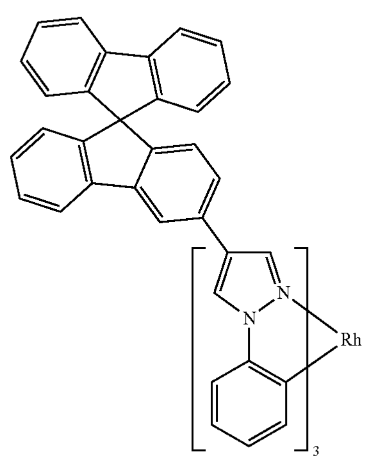
-continued
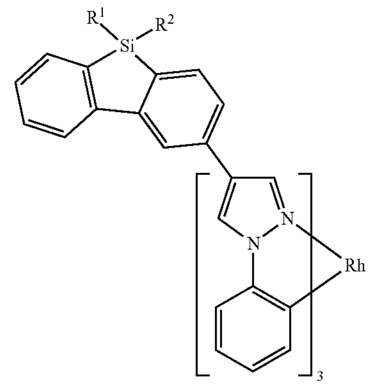
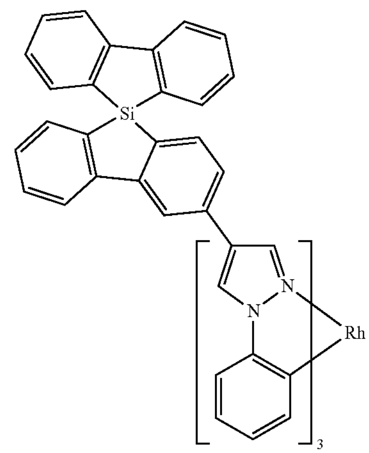
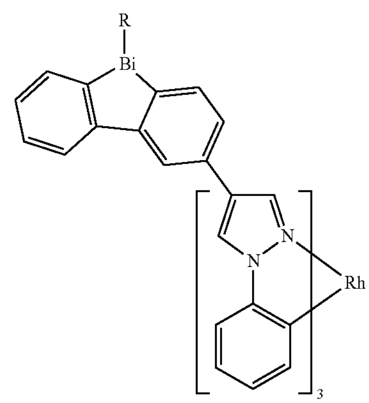
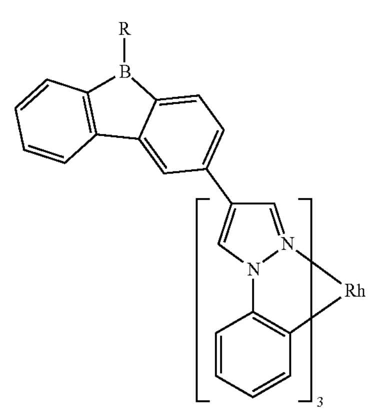

-continued
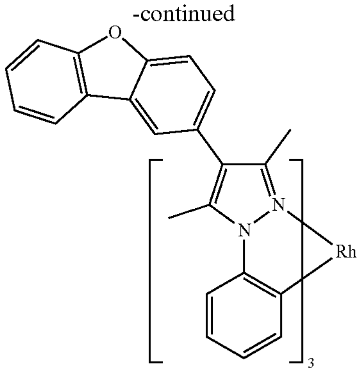
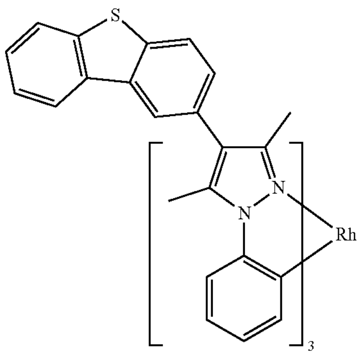
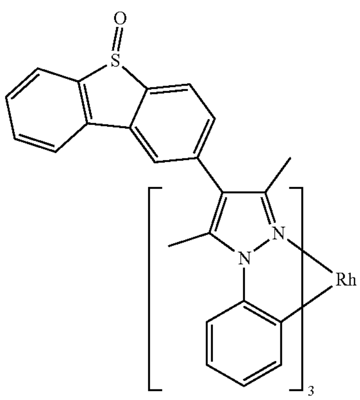
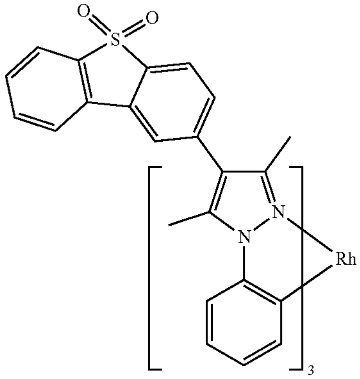
-continued
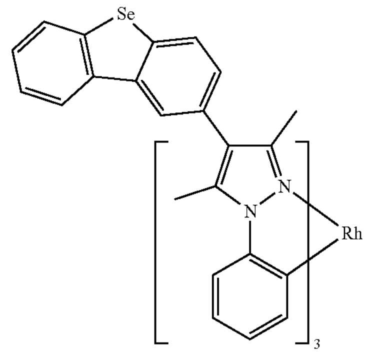
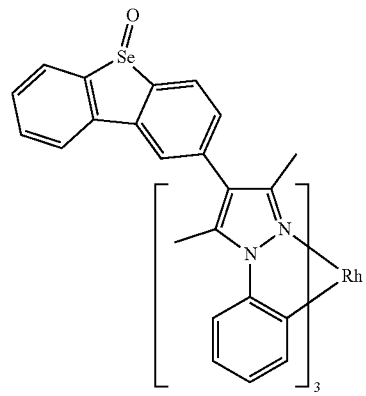
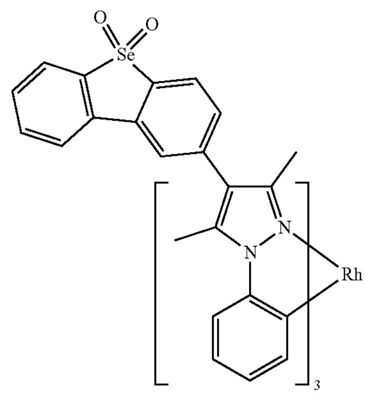
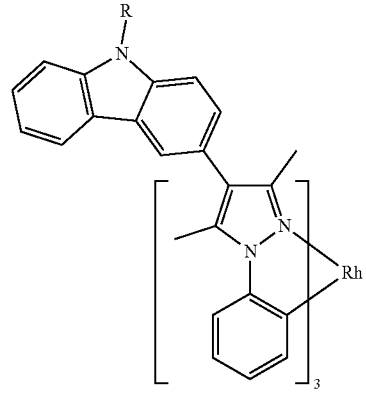

-continued
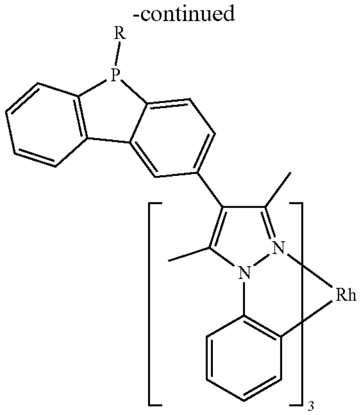
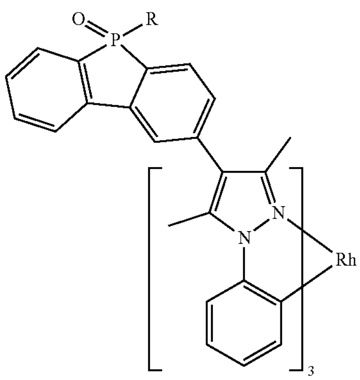
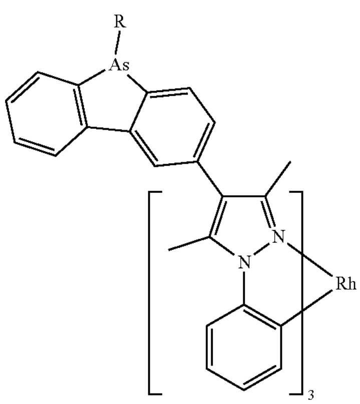
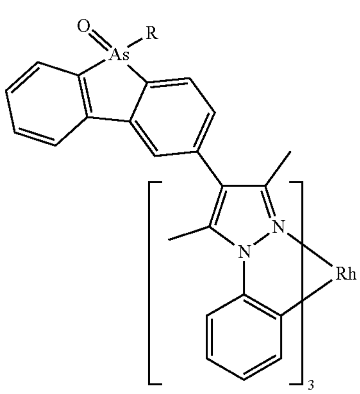
-continued
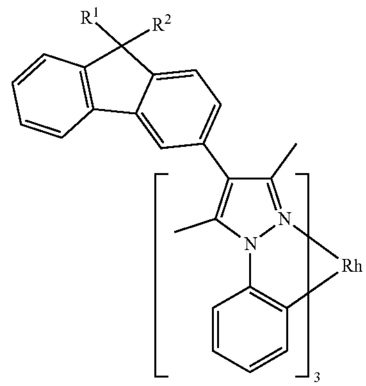
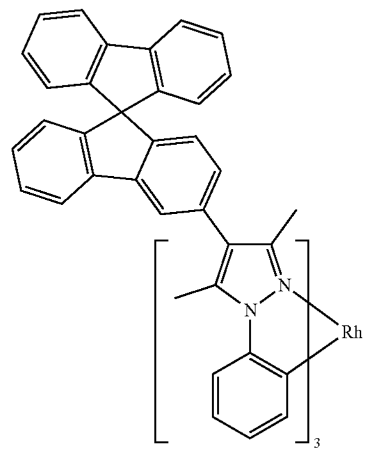
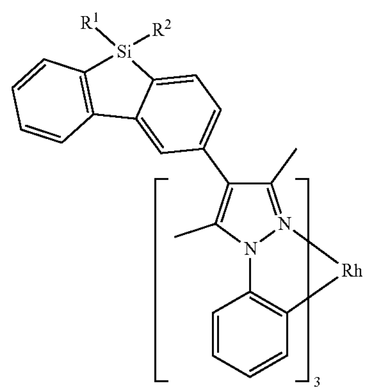
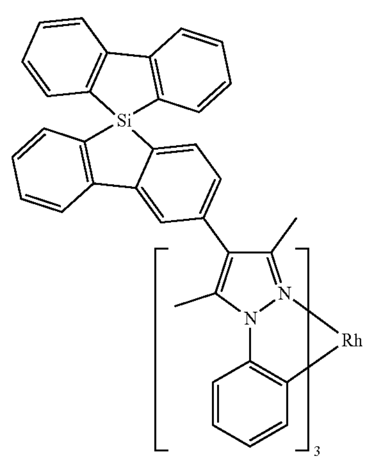

-continued
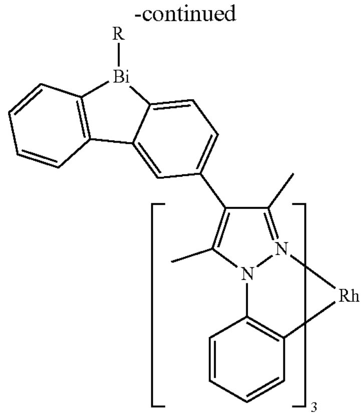
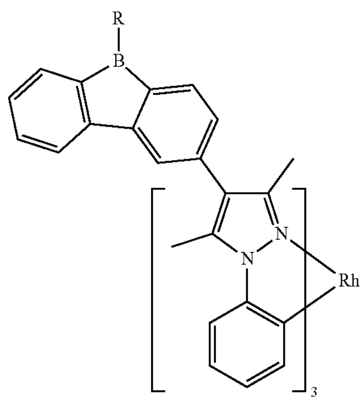
Structures Rh-6
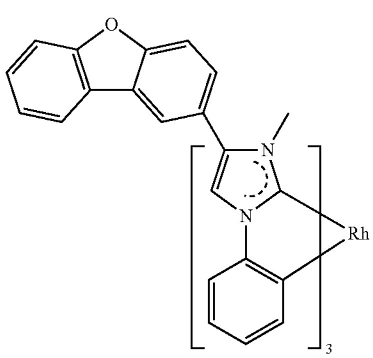
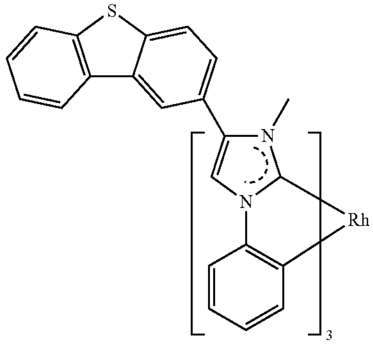
-continued
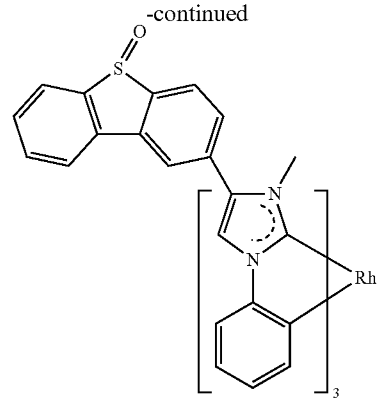
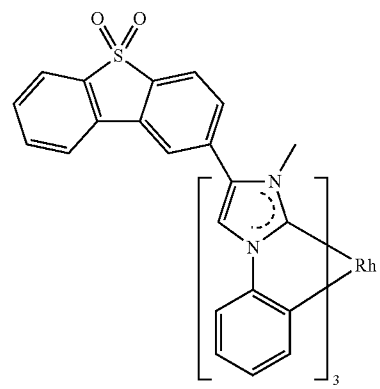
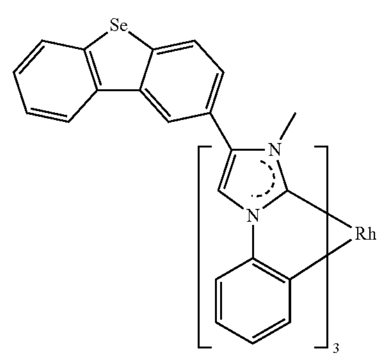
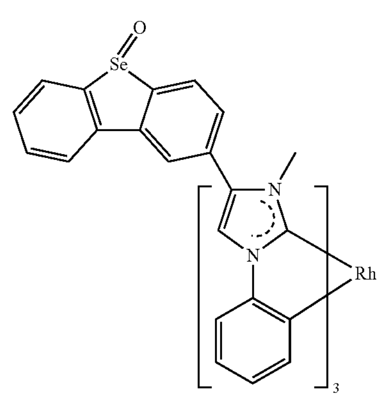

-continued
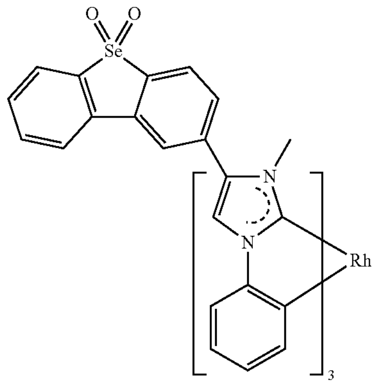
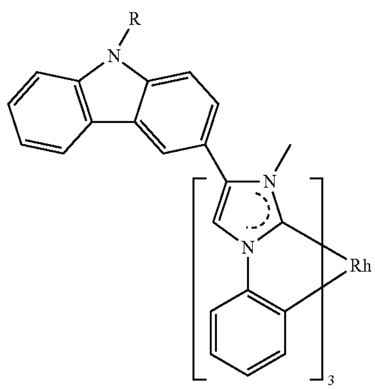
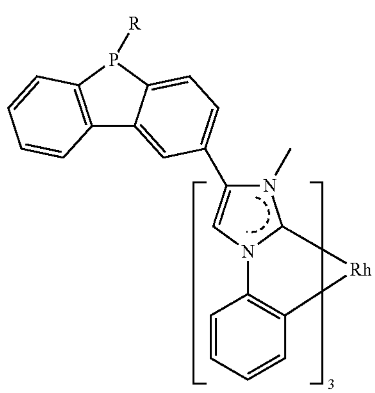
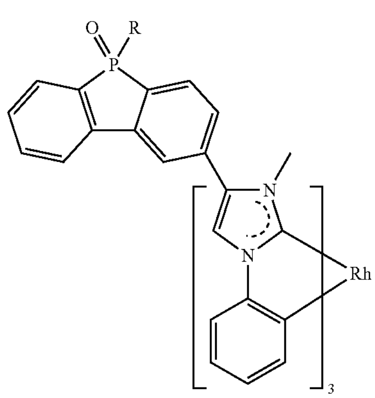
-continued
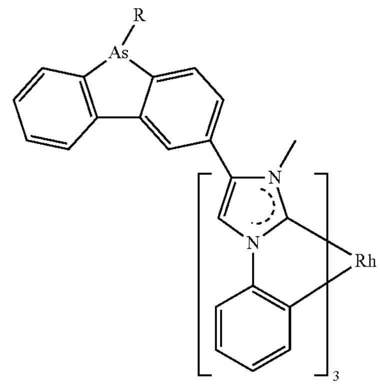
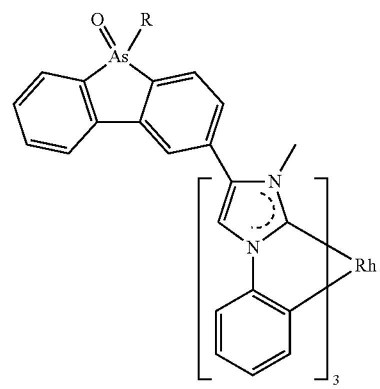
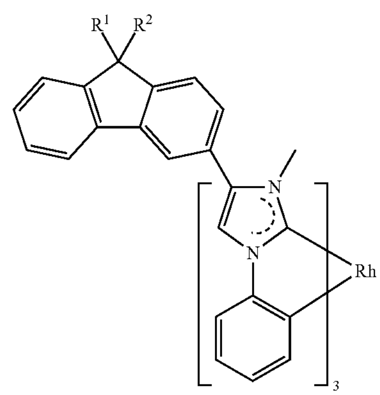
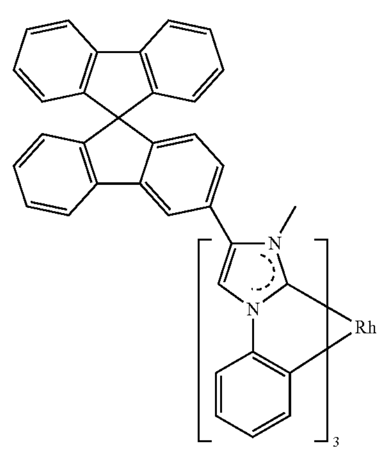

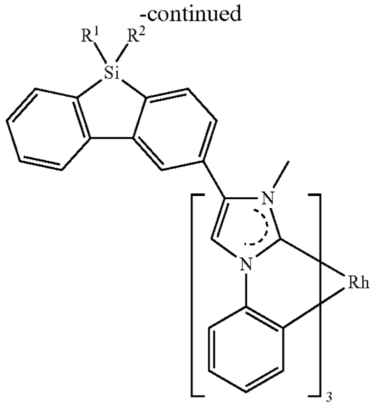
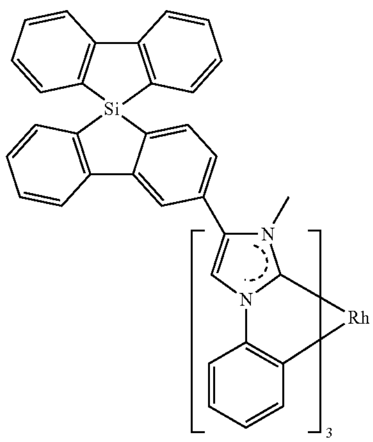
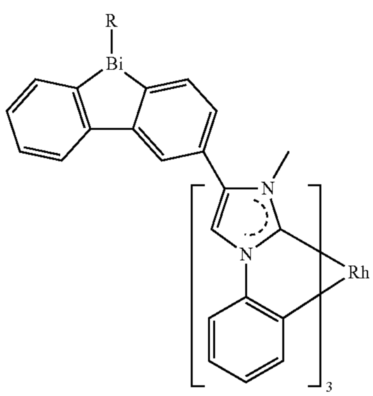
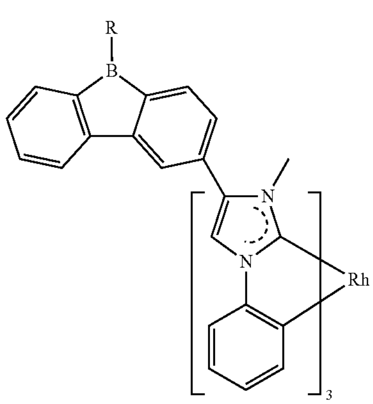
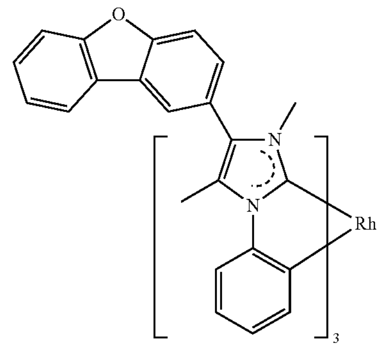
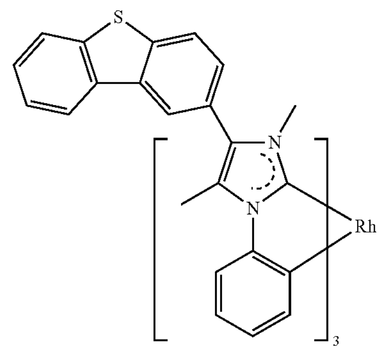
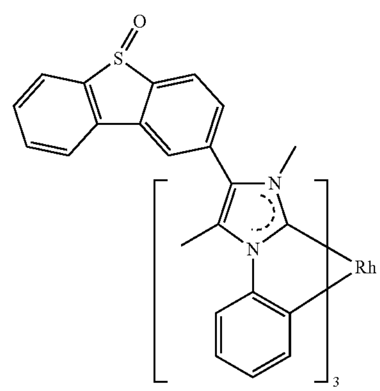
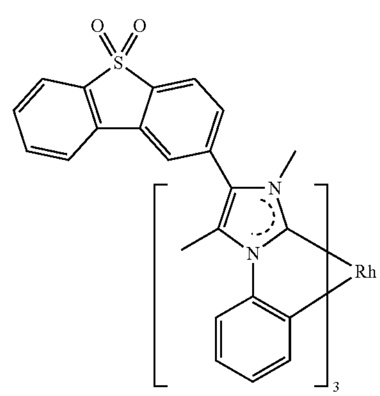

-continued
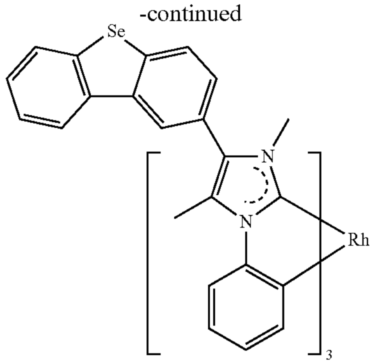
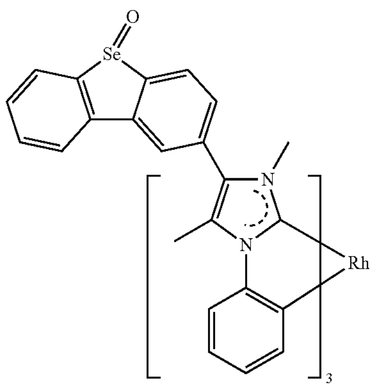
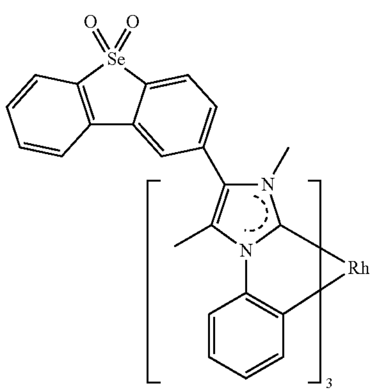
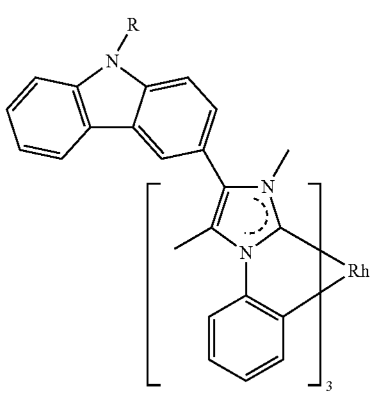
-continued
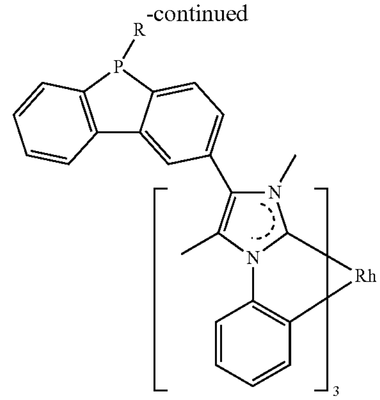
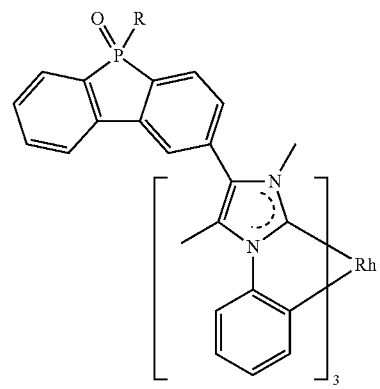
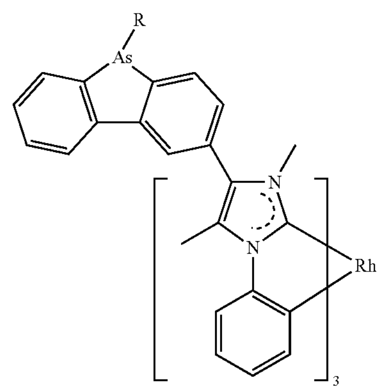
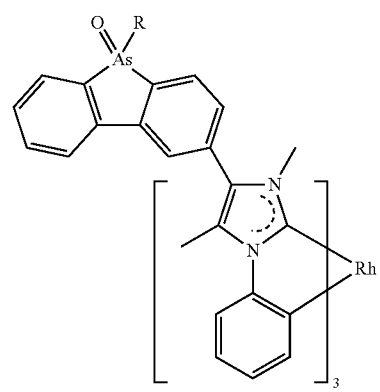

-continued
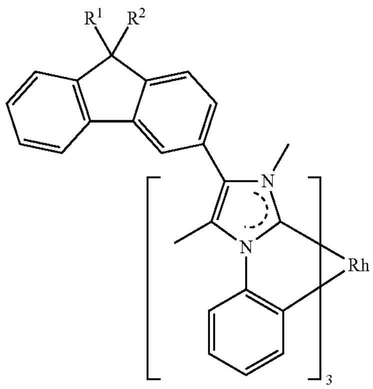
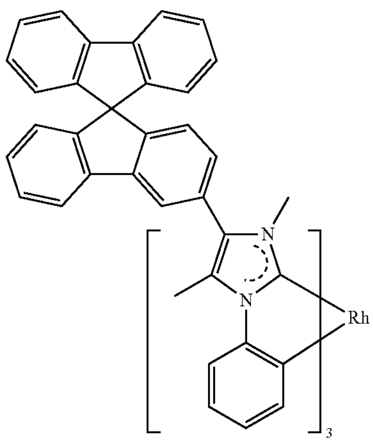
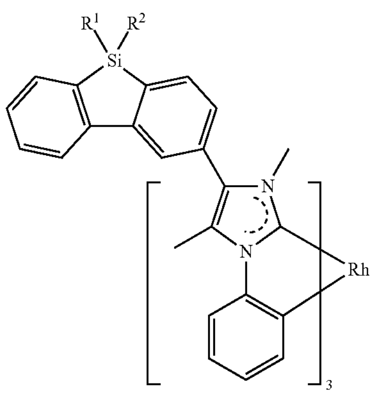
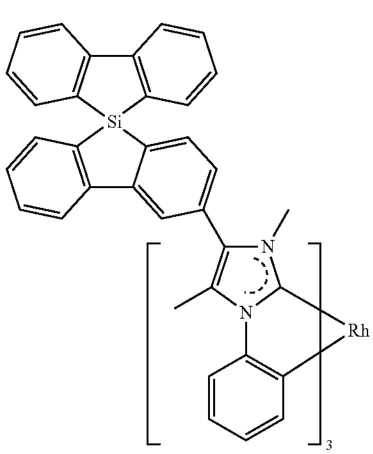
-continued
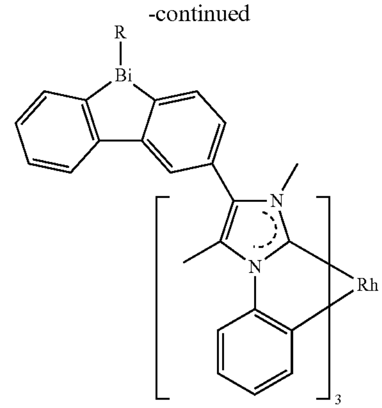
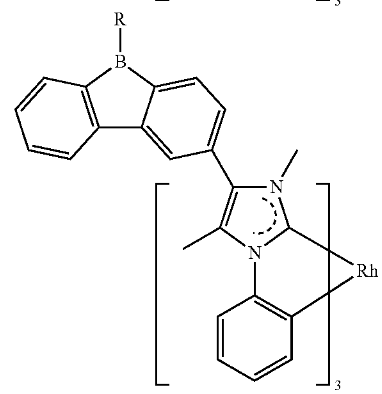
Structures Rh-7
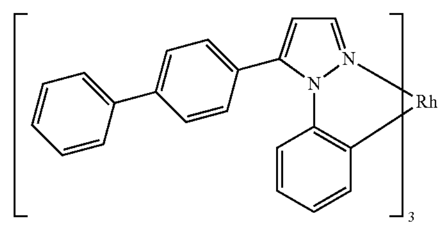
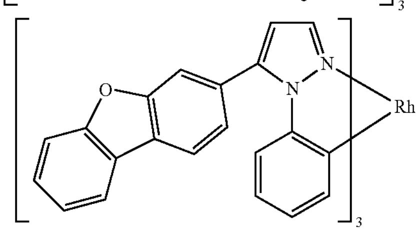
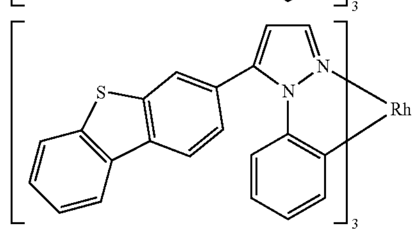
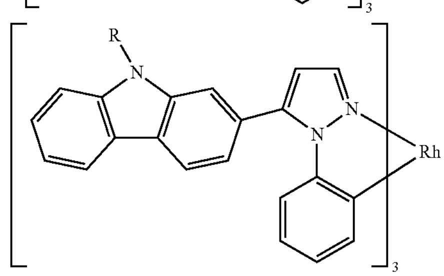

-continued
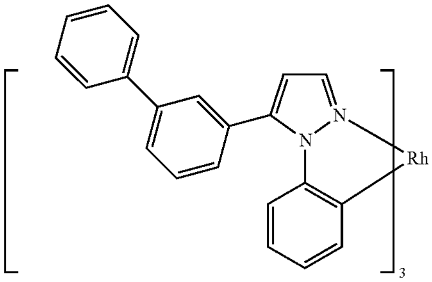
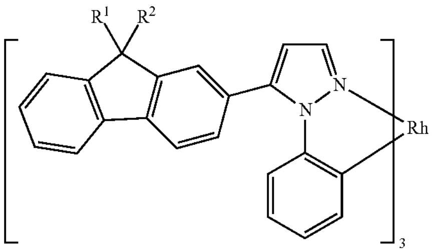
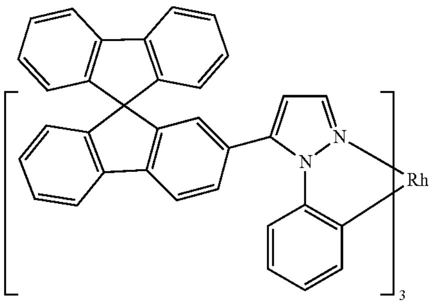
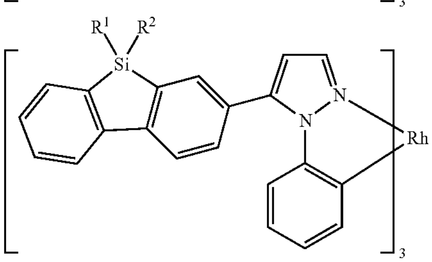
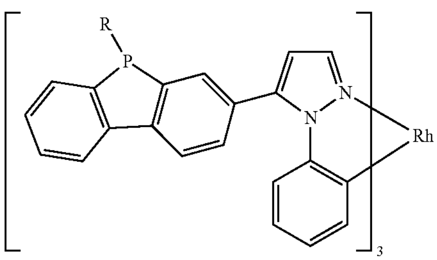
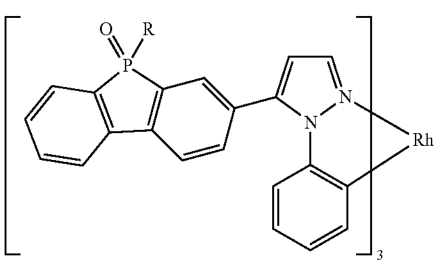
-continued
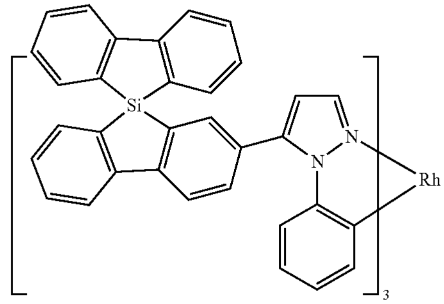
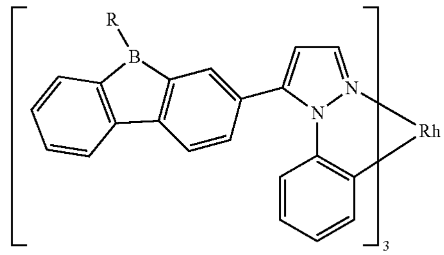
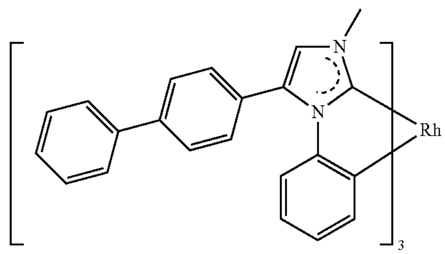
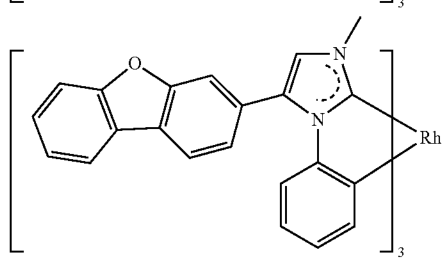
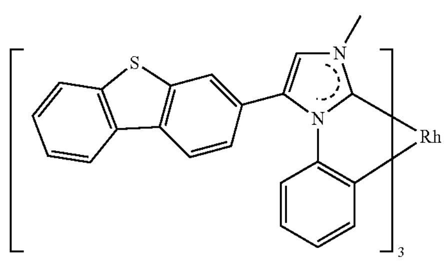
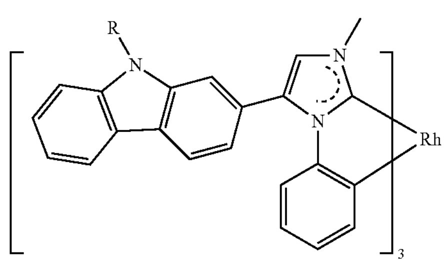

-continued
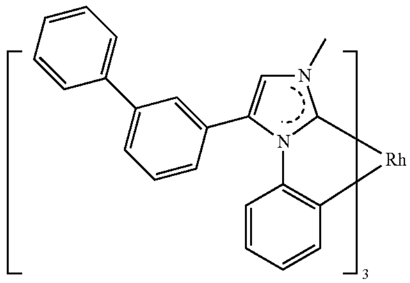
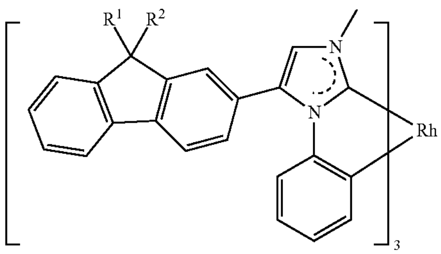
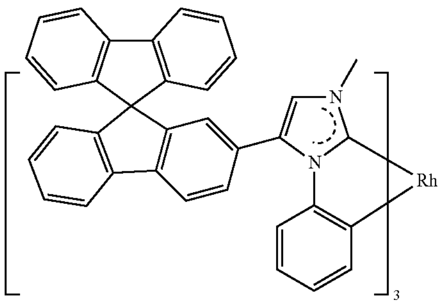
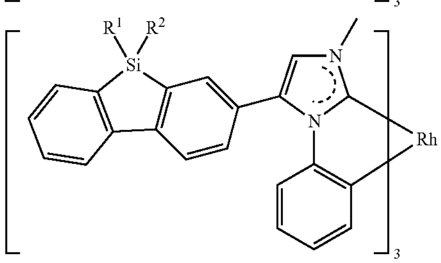
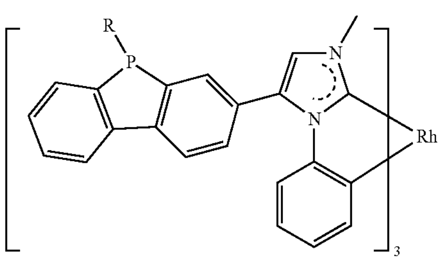
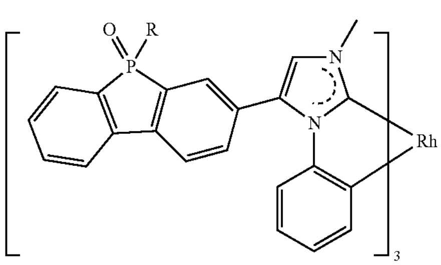
-continued
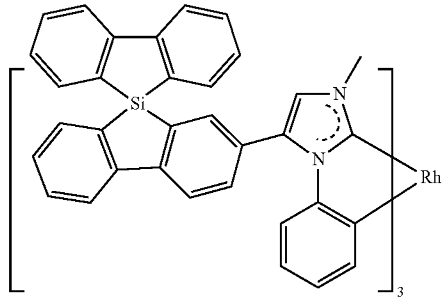
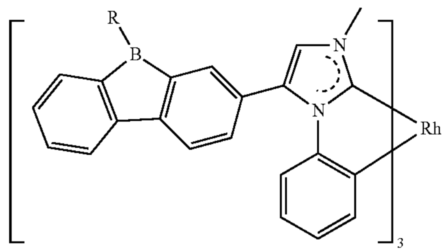
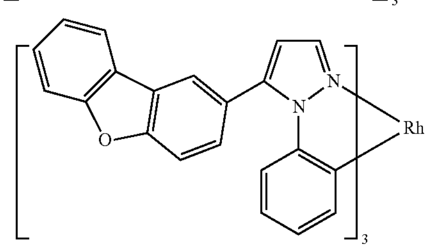
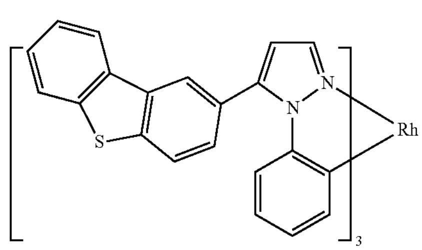
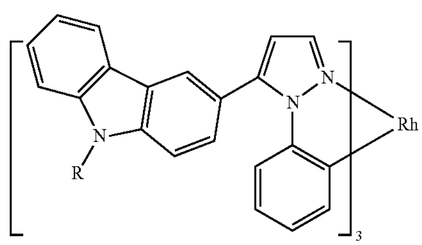
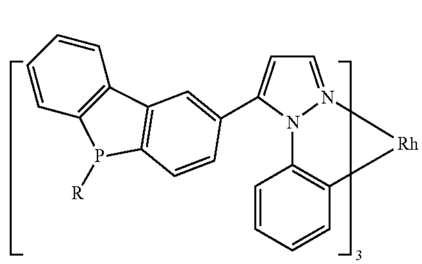

-continued
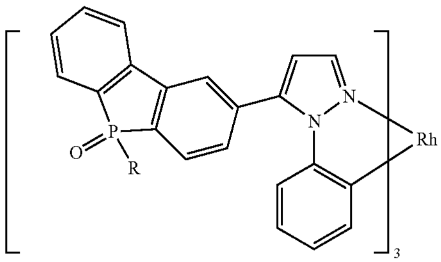
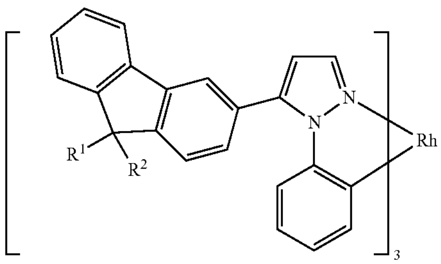
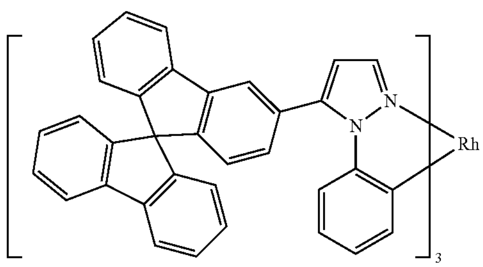
Structures Rh-8
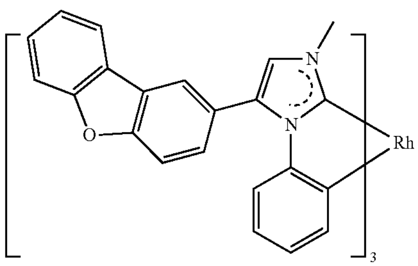
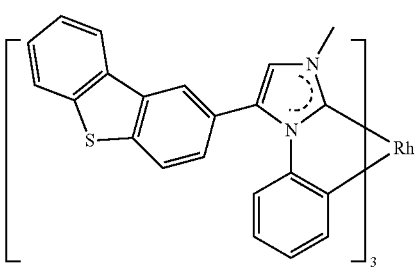
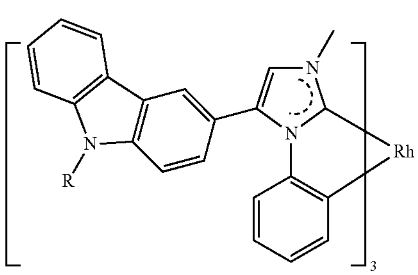
-continued
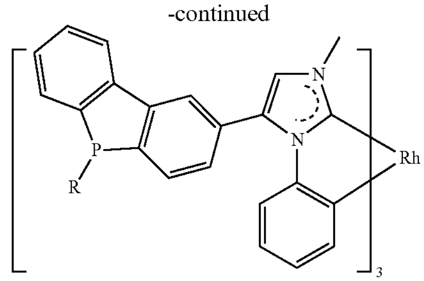
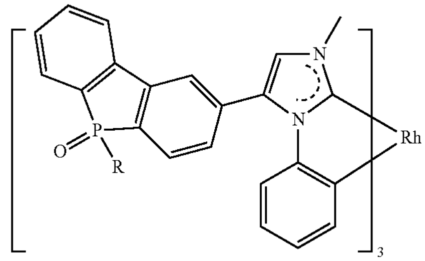
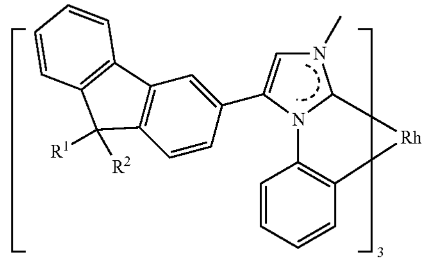
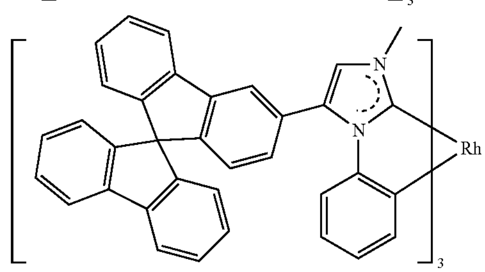
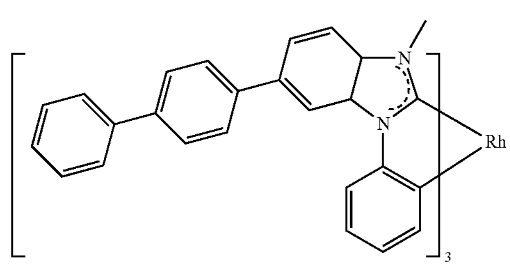
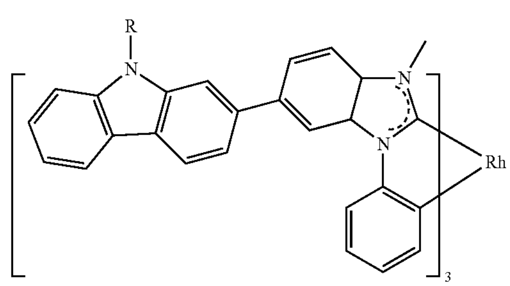

-continued
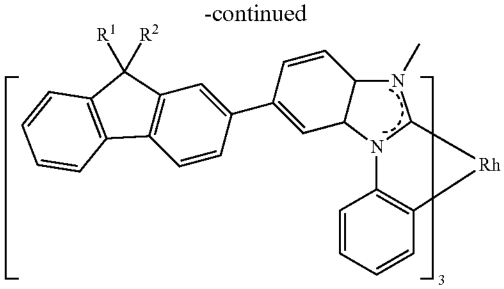
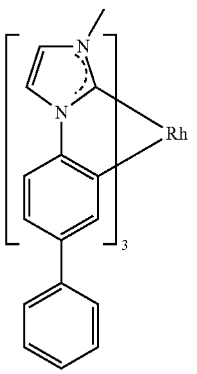
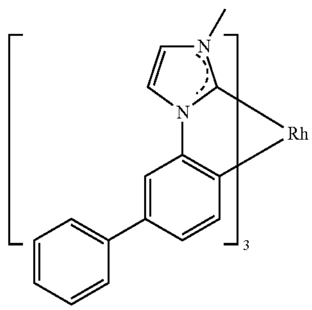
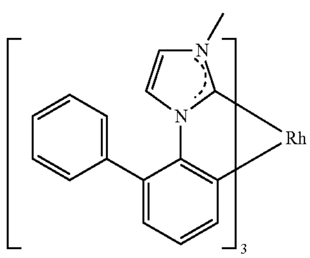
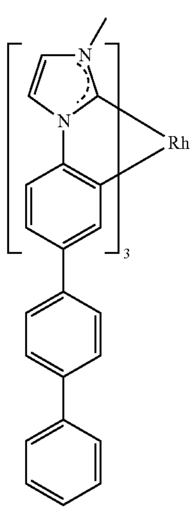
-continued
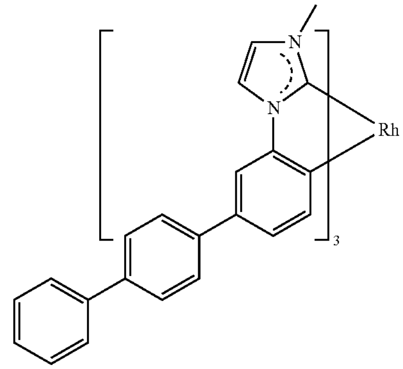
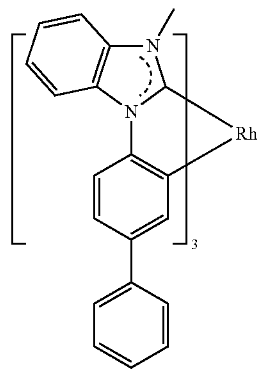
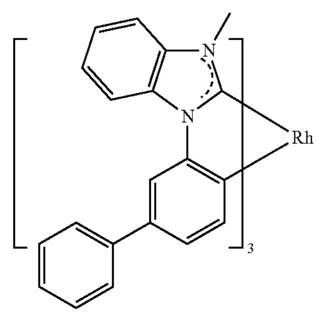
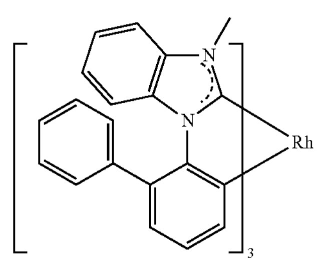

-continued
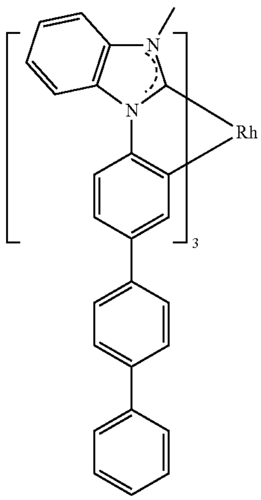
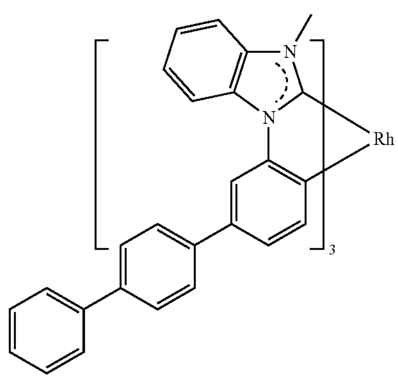
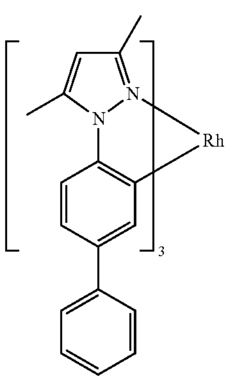
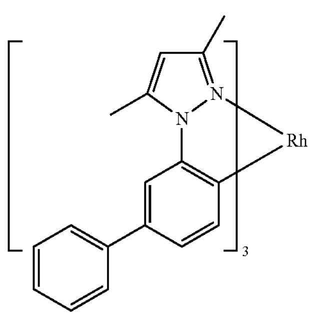
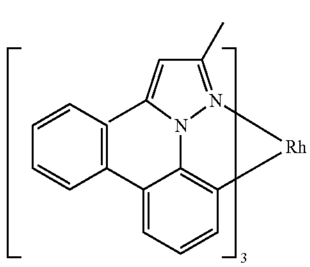
-continued
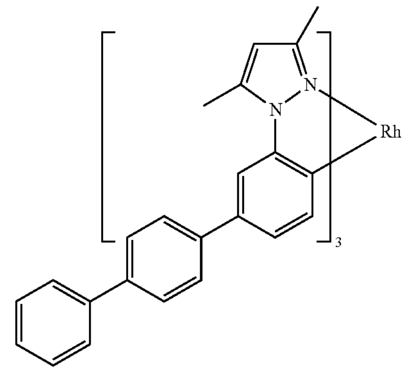
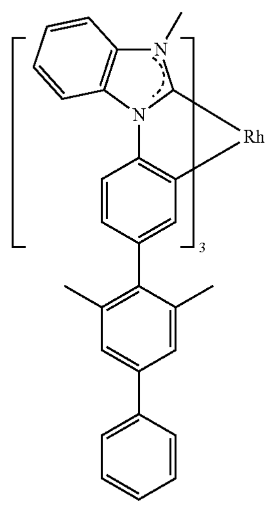
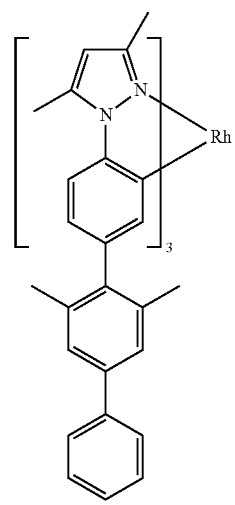
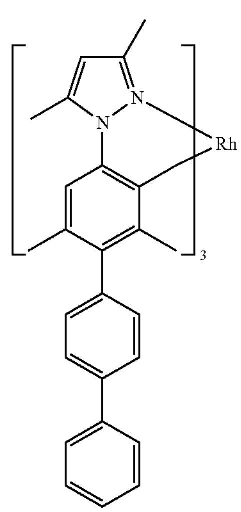
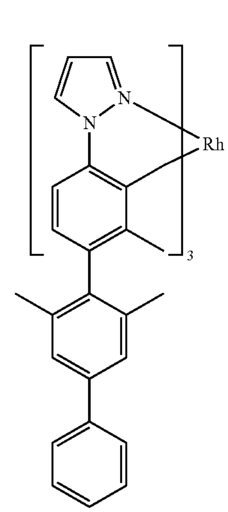

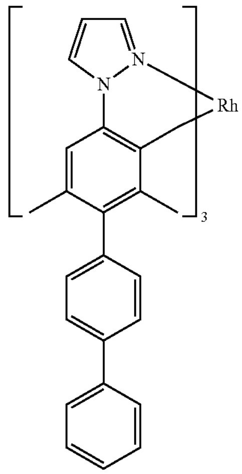
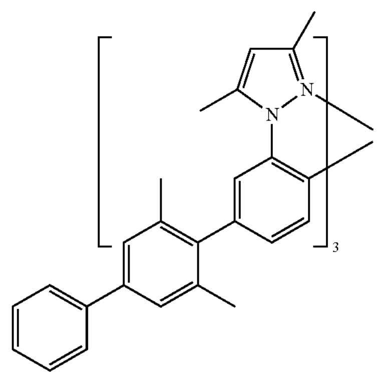
Structures Rh-9
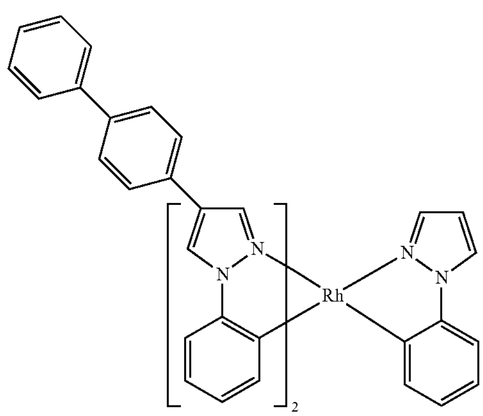
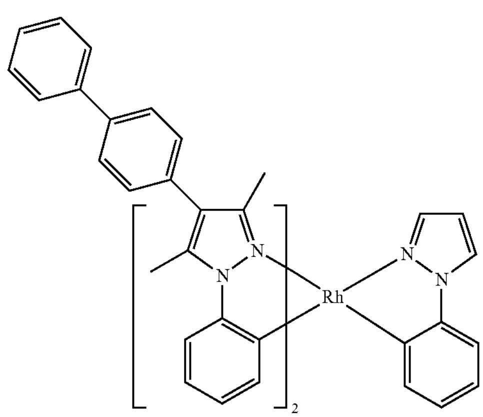
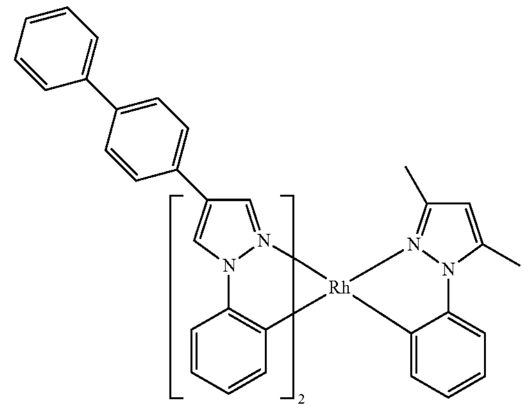
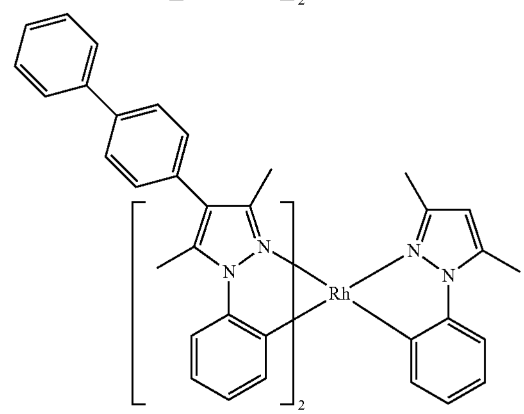
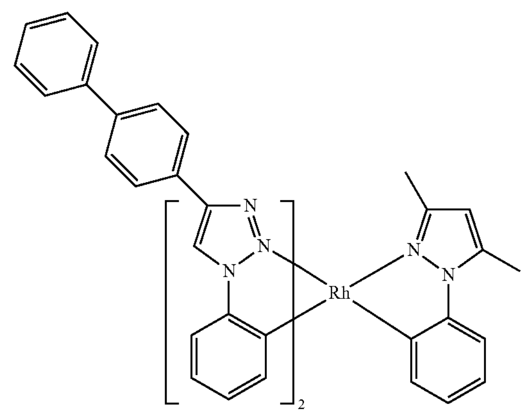
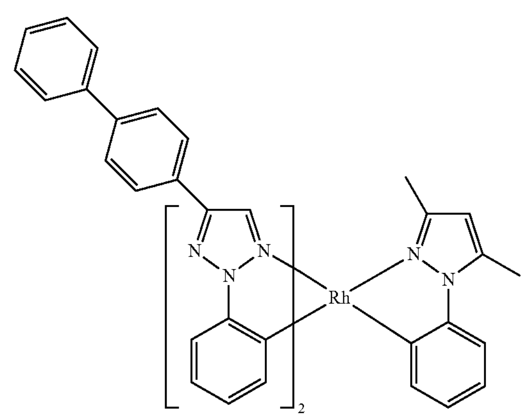

-continued
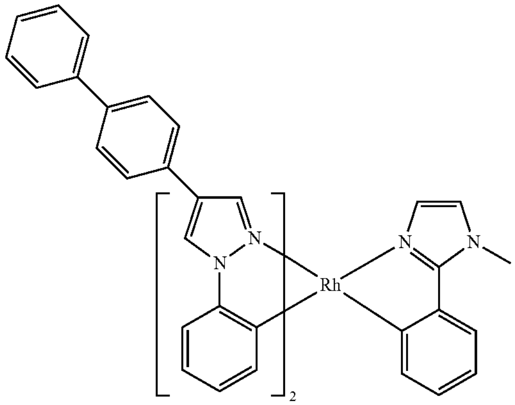
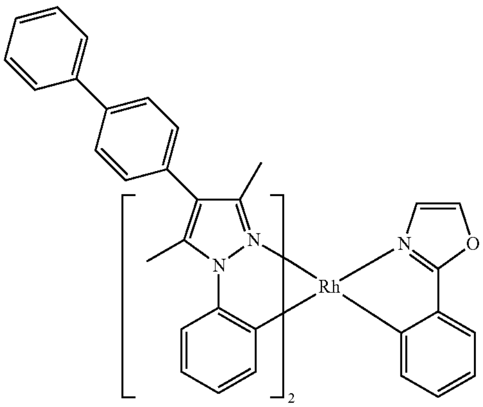
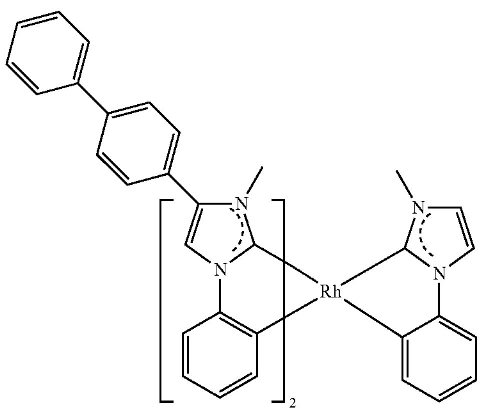
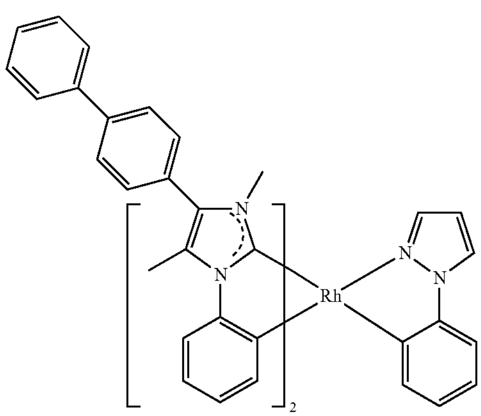
-continued
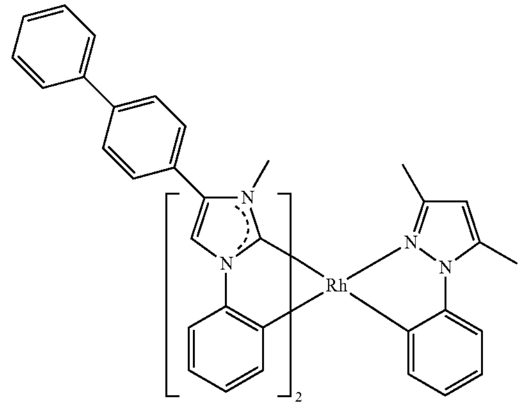
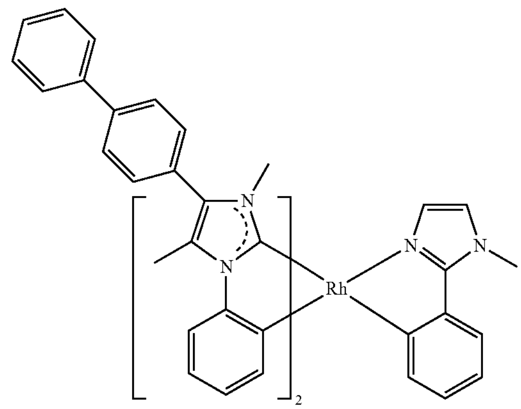
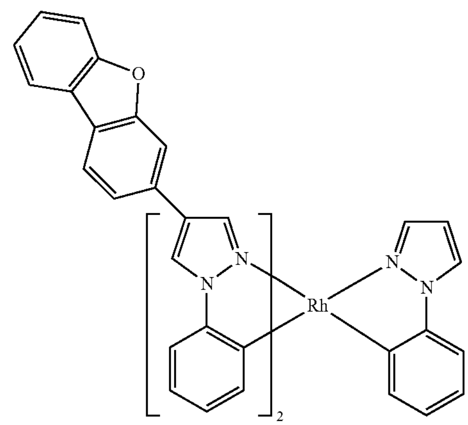
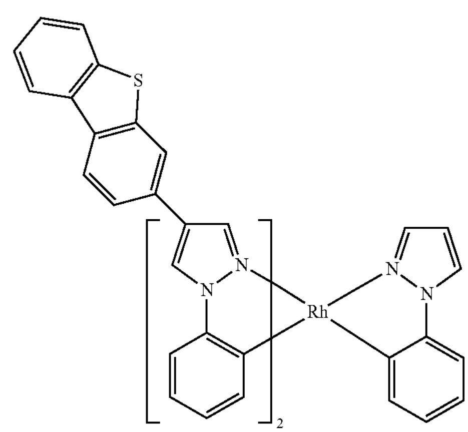

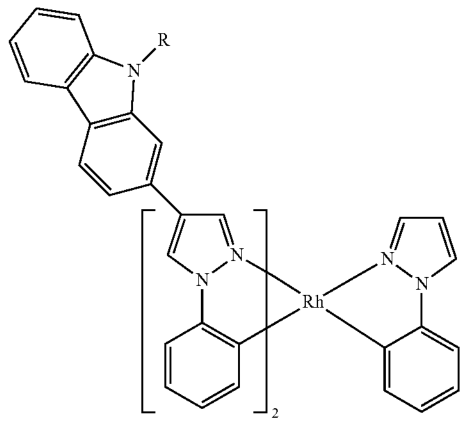
R
N
N
N
Rh
N
N
2
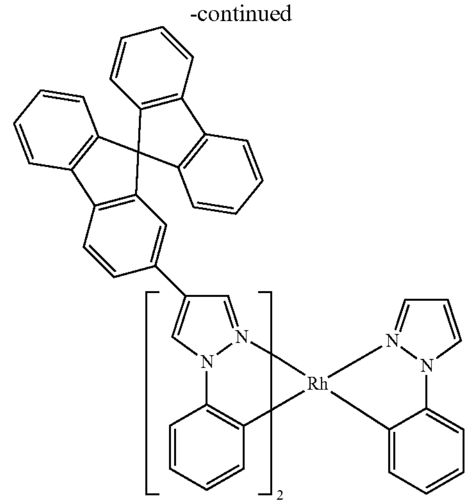
N
N
Rh
N
N
2
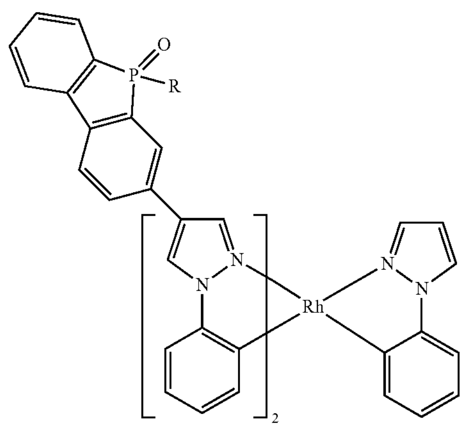
O
P
R
N
N
Rh
N
N
2
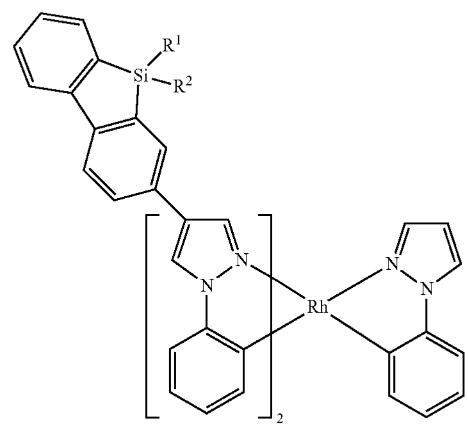
R1
Si
R2
N
N
Rh
N
N
2
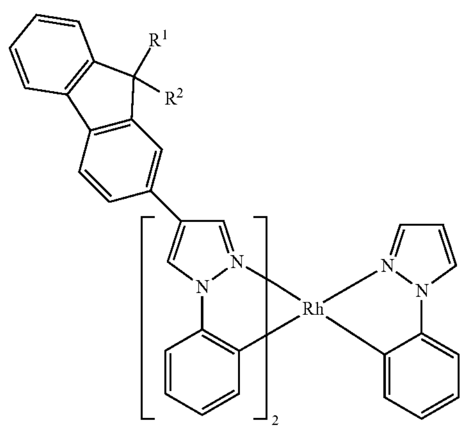
R1
R2
N
N
Rh
N
N
2
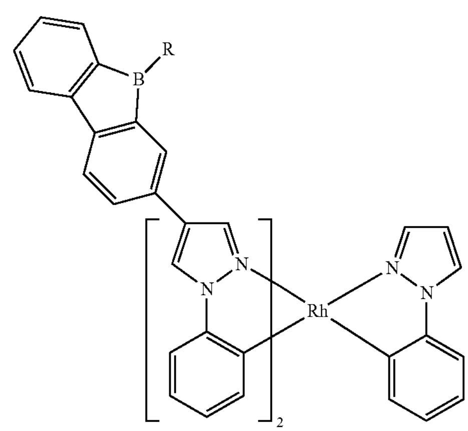
R
B
N
N
Rh
N
N
2

-continued
Structures Rh-10
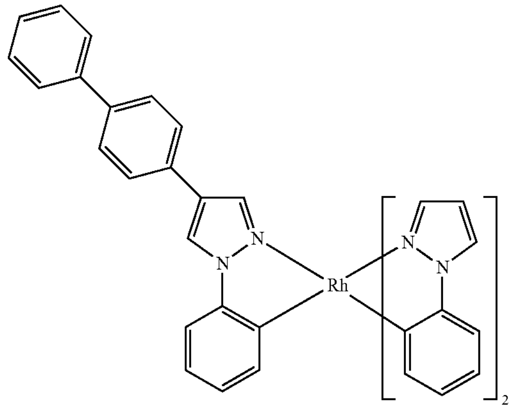
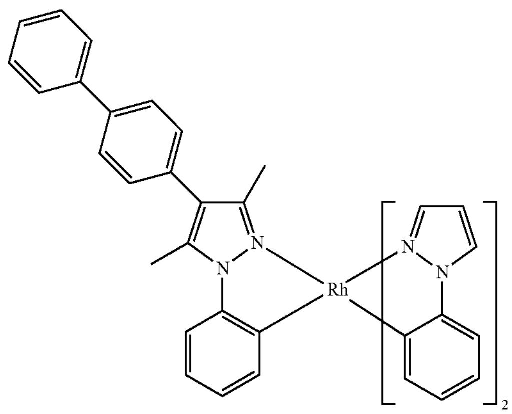
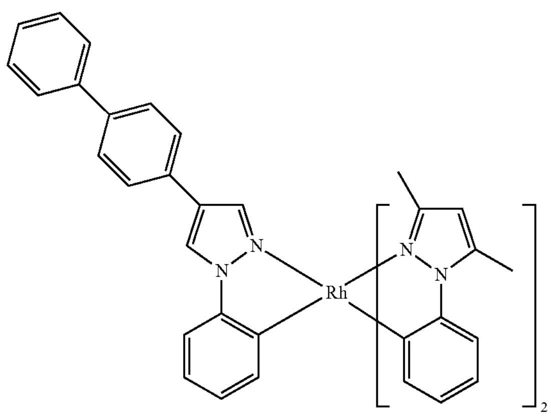
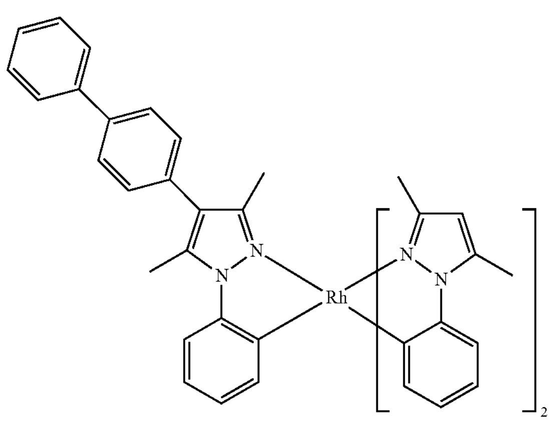
-continued
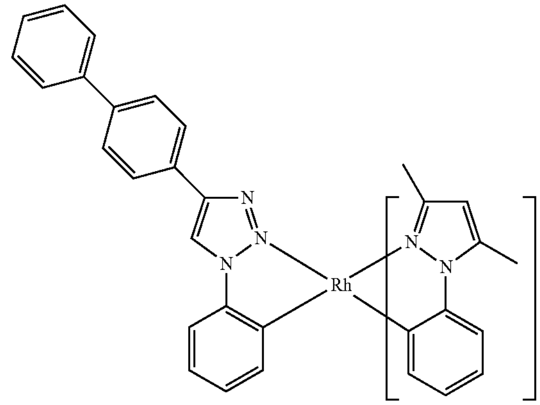
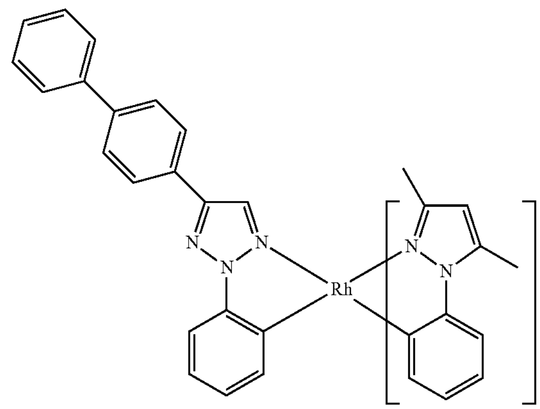
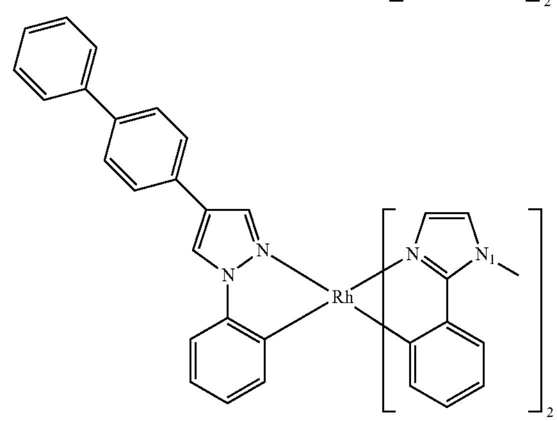
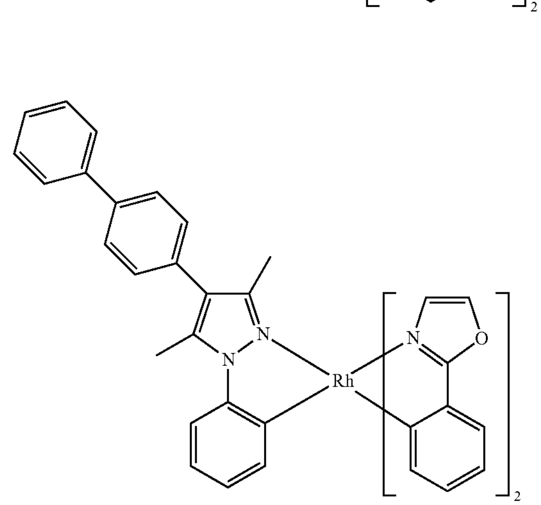

-continued
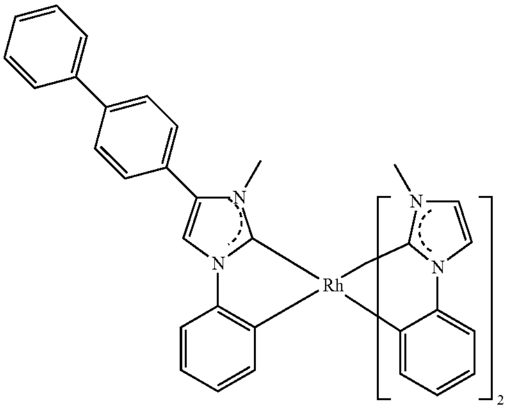
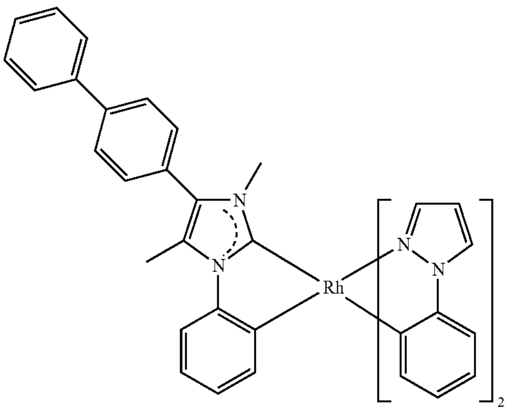
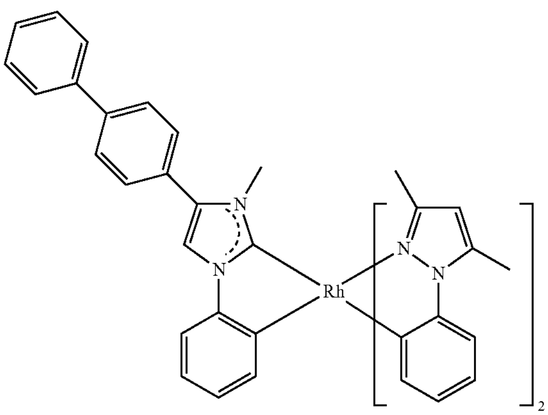
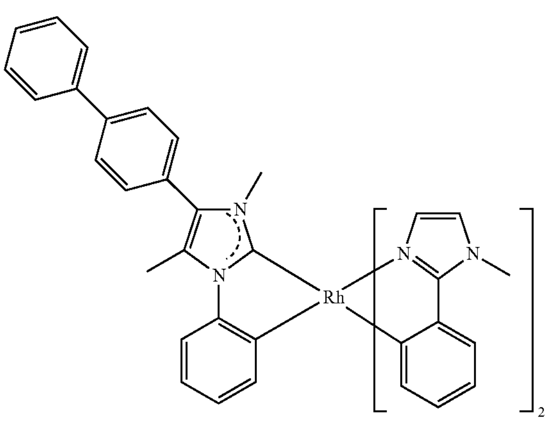
-continued
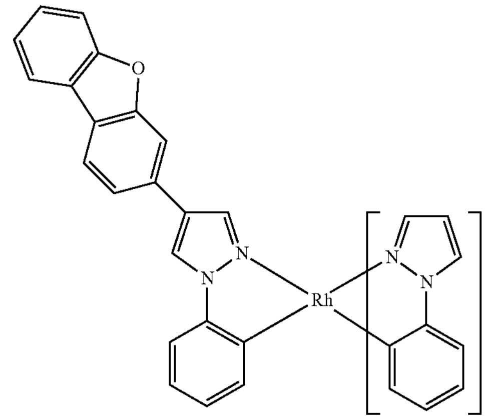
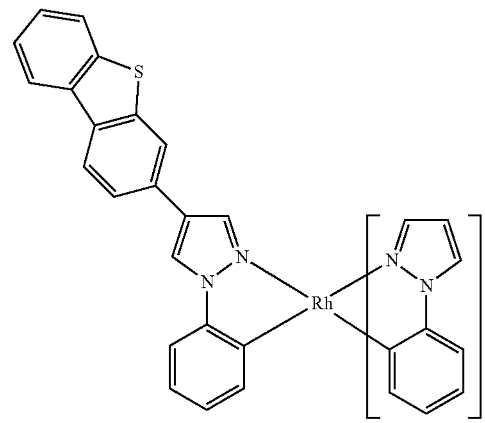
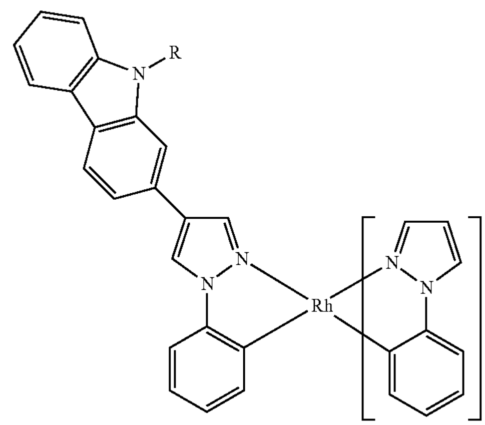
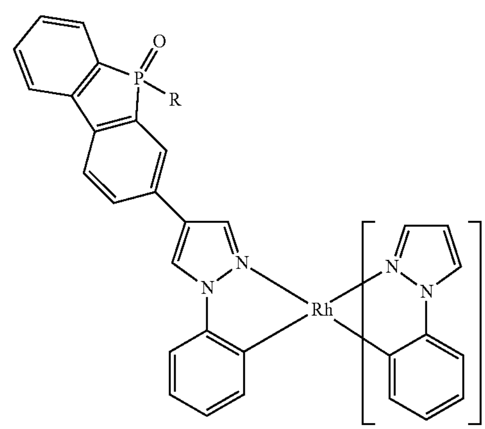

-continued
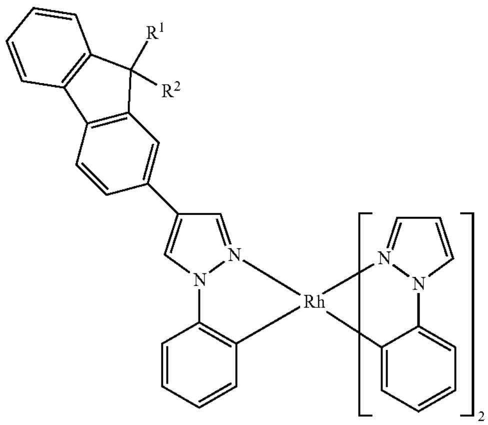
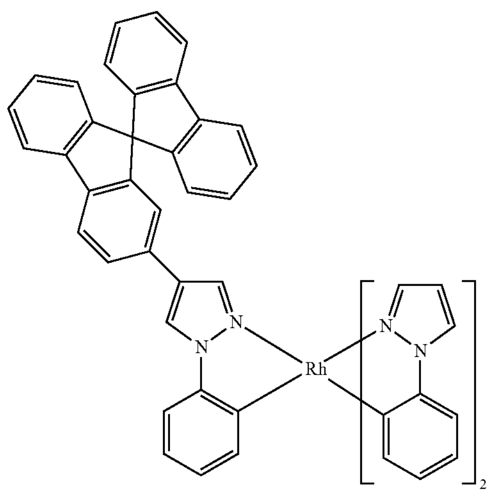
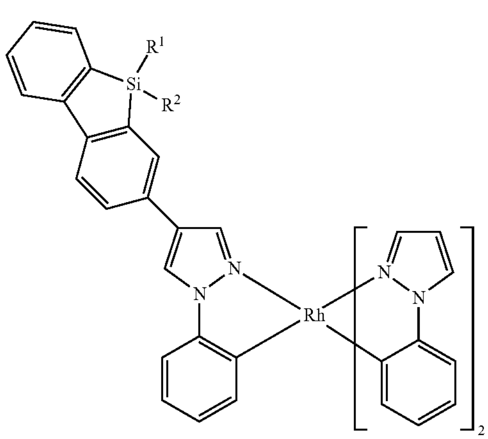
-continued
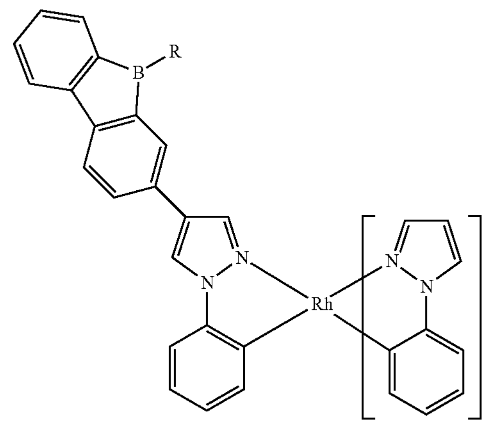
Structures Rh-11
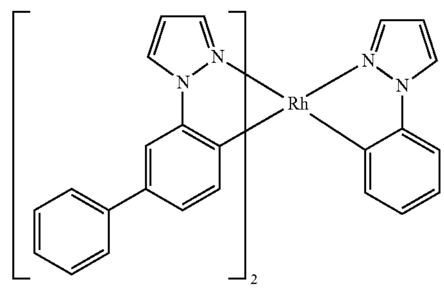
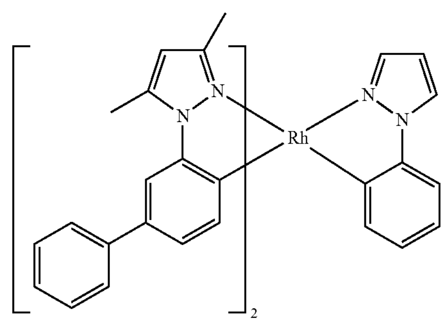
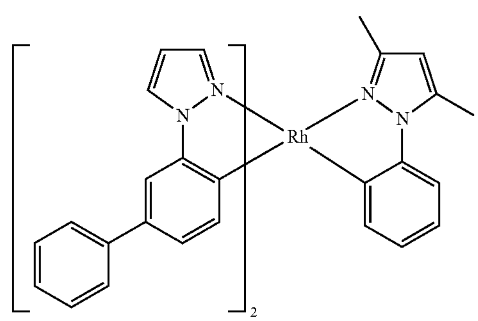
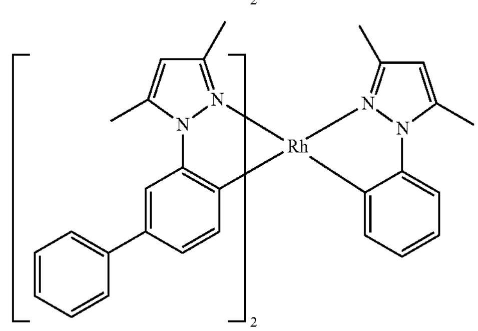

-continued
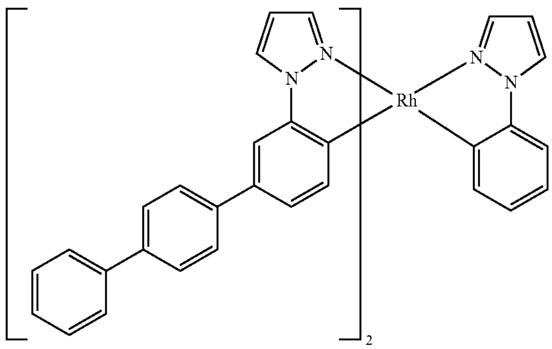
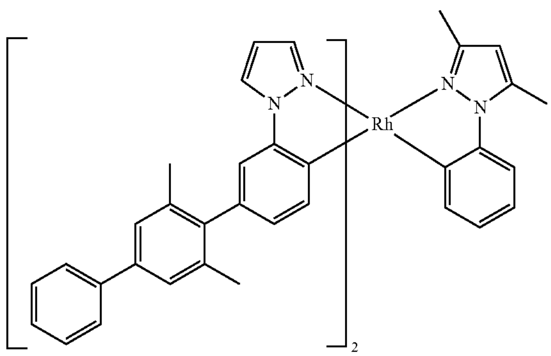
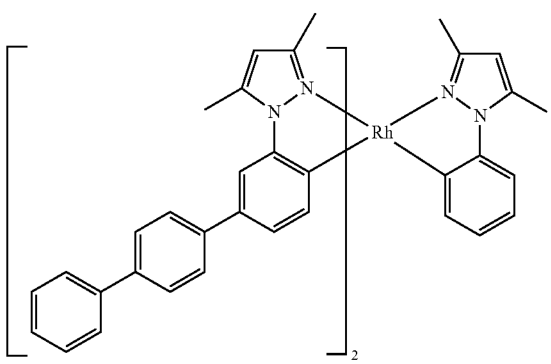
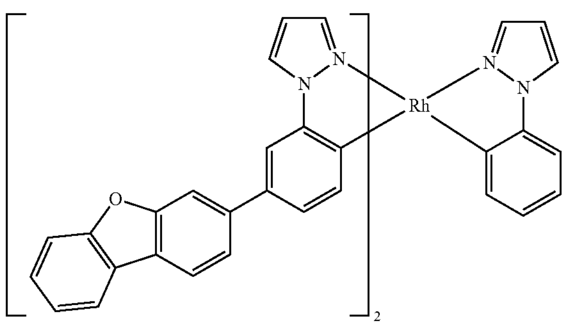
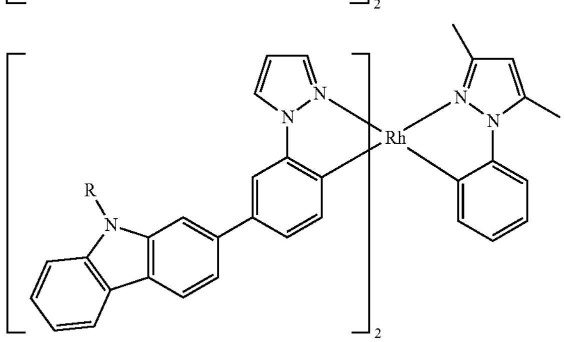
-continued
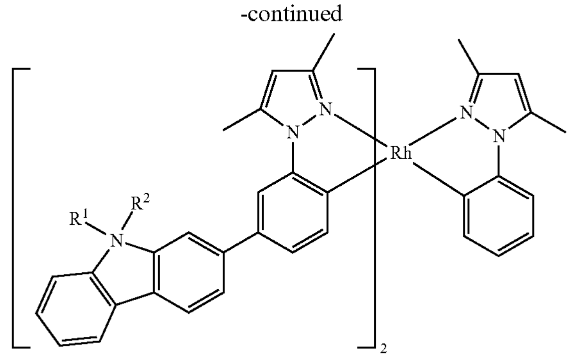
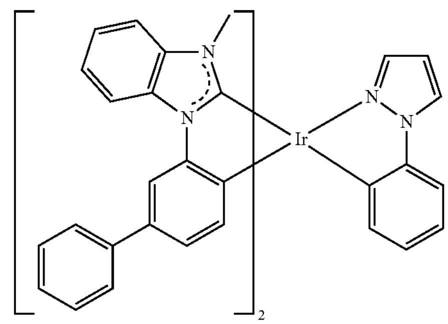
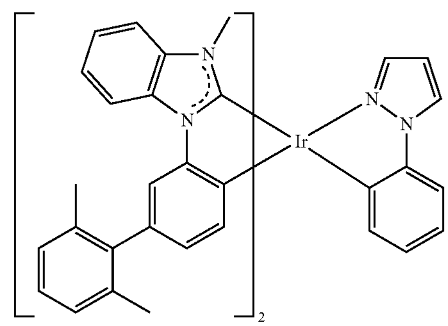
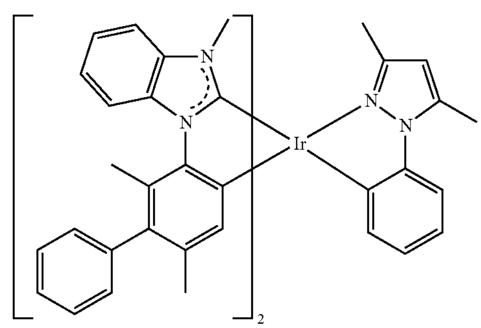
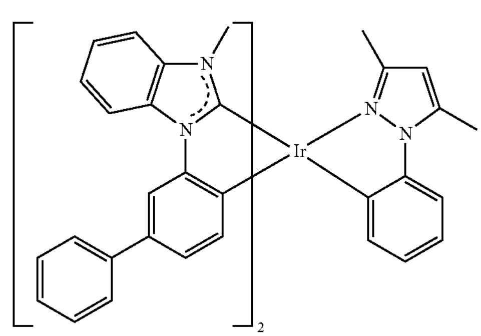

-continued
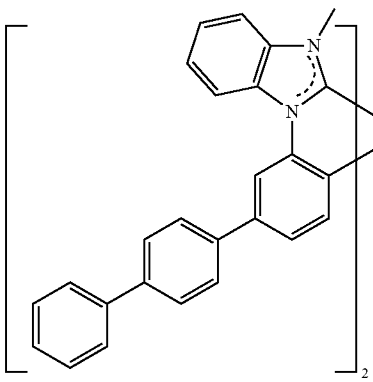
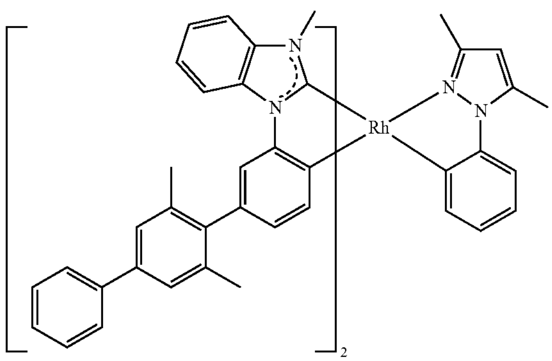
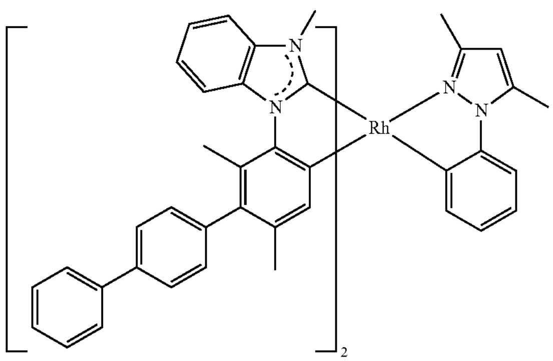
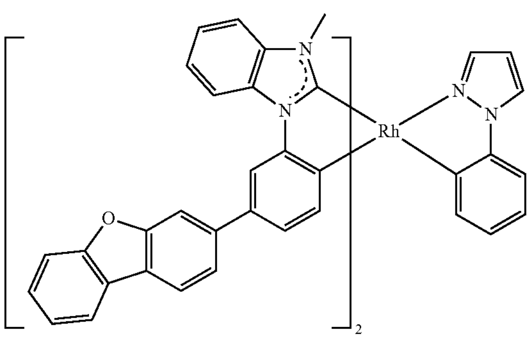
-continued
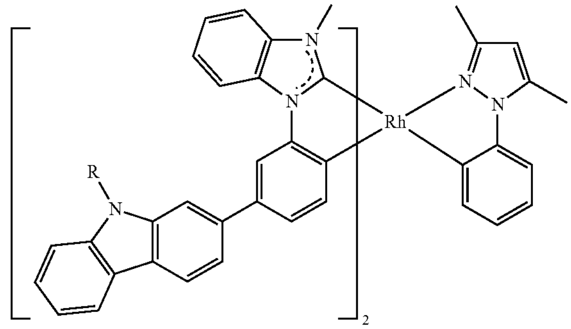
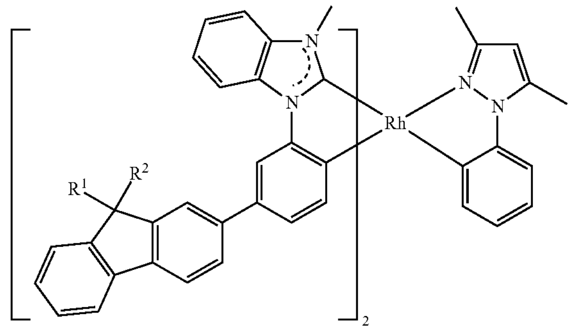
Structures Rh-12
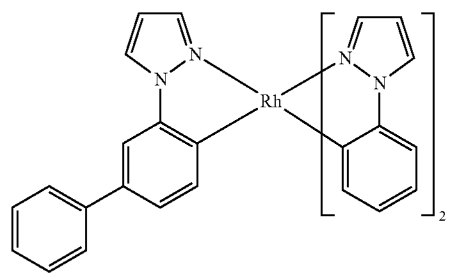
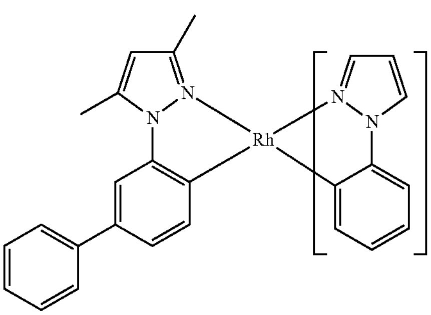
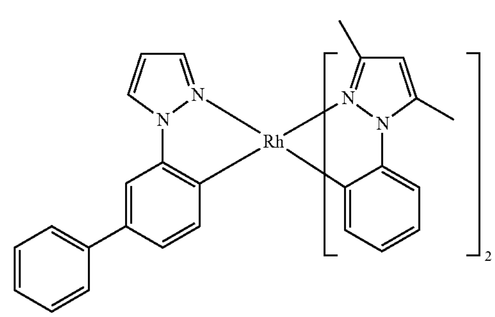

-continued
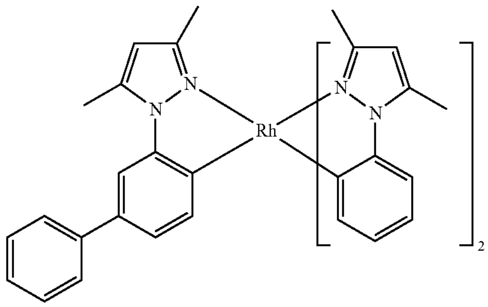
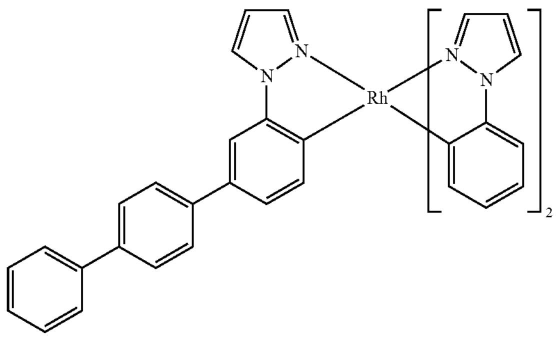
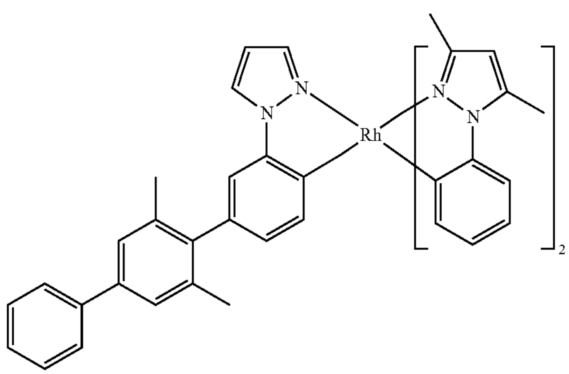
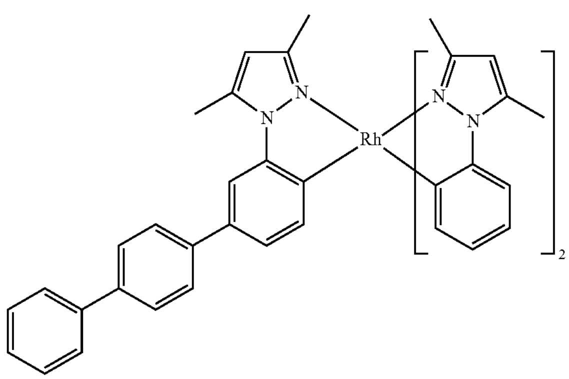
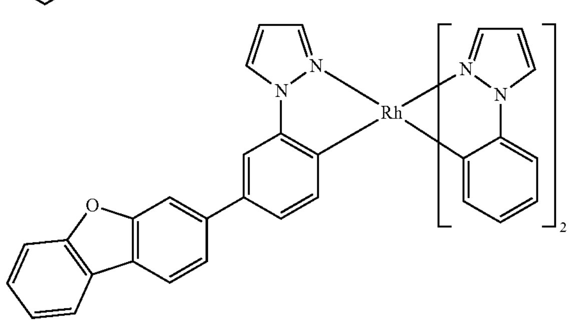
-continued
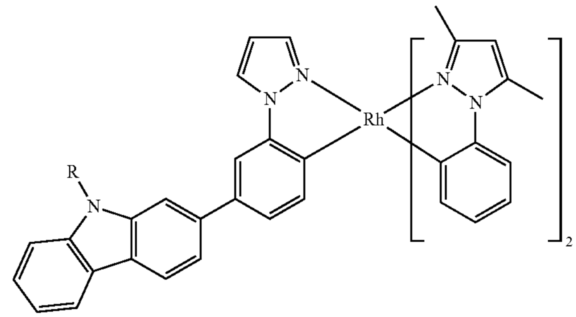
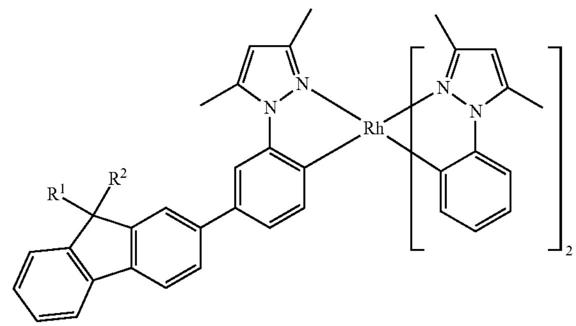
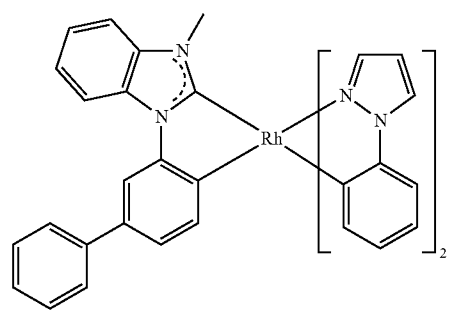
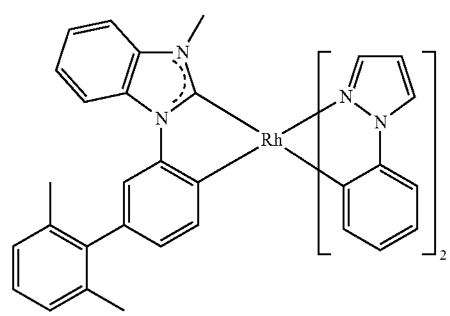
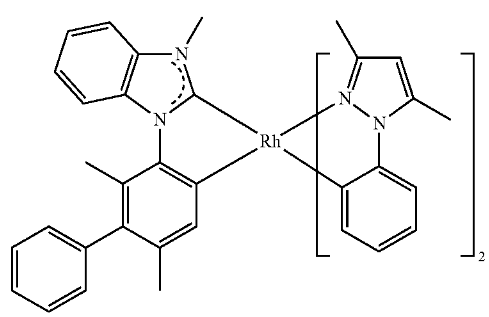

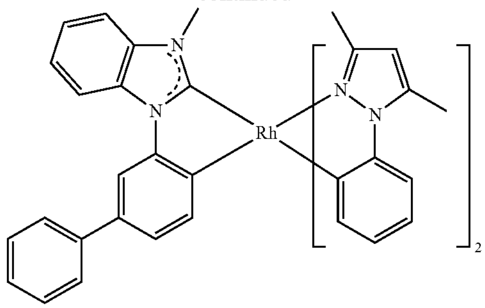
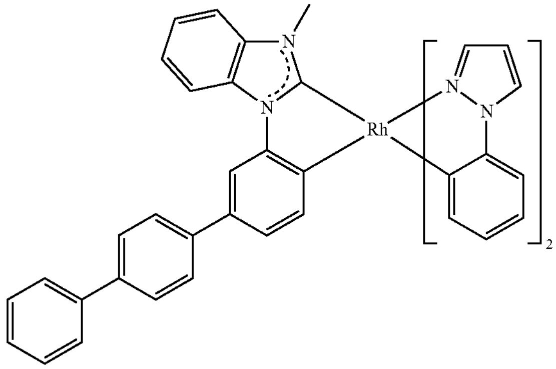
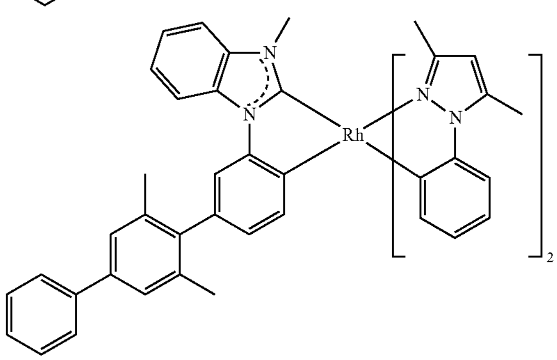
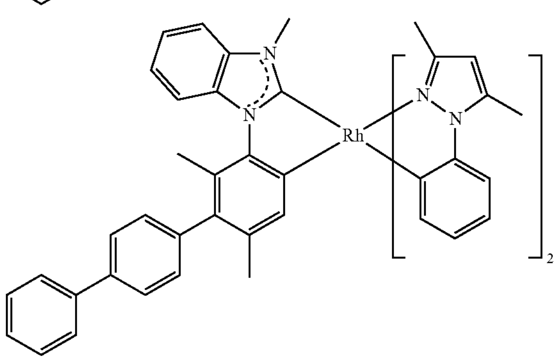
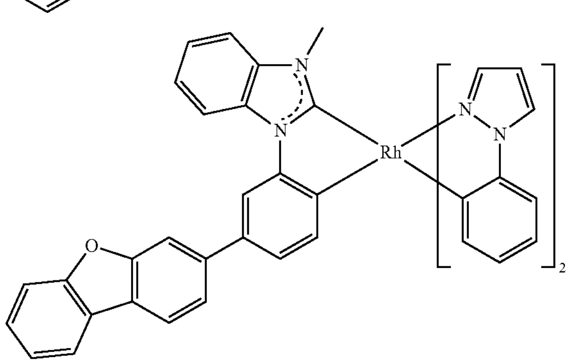
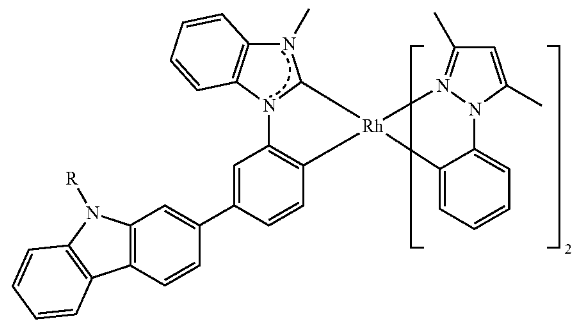
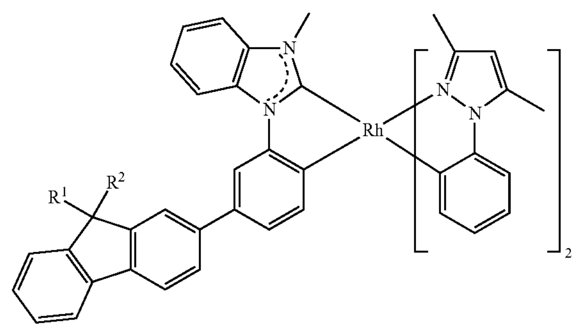
Structures Rh-13
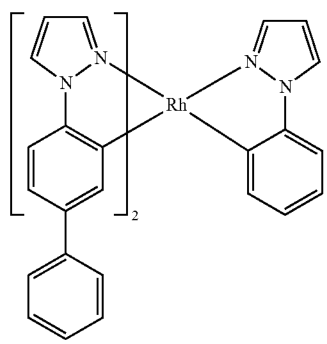
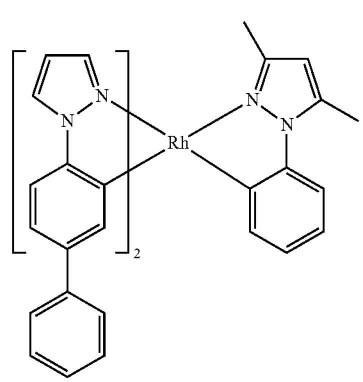

-continued
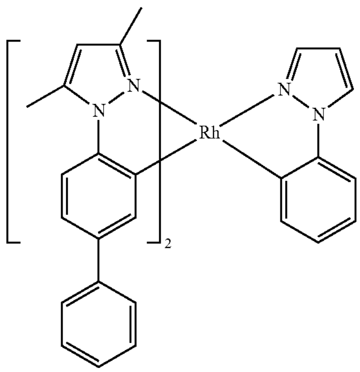
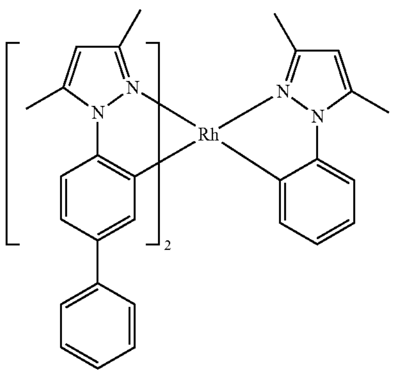
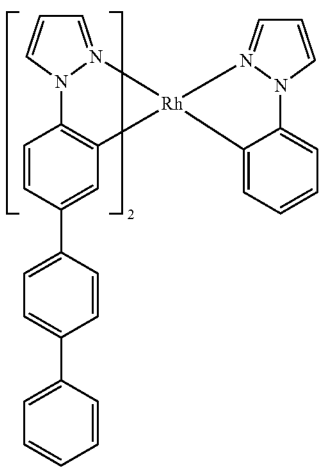
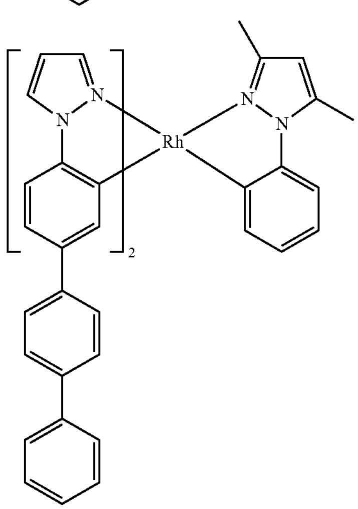
-continued
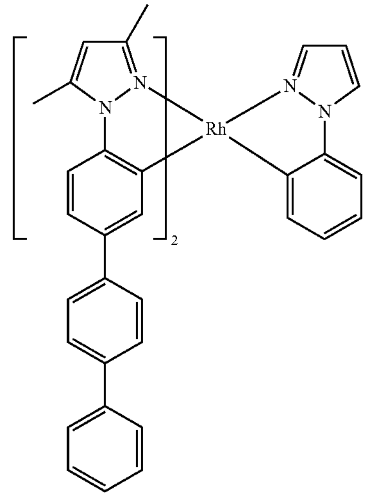
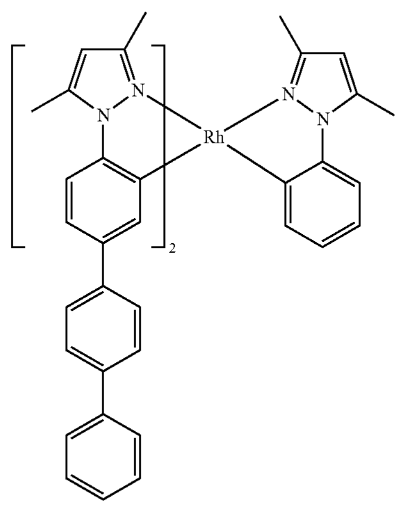
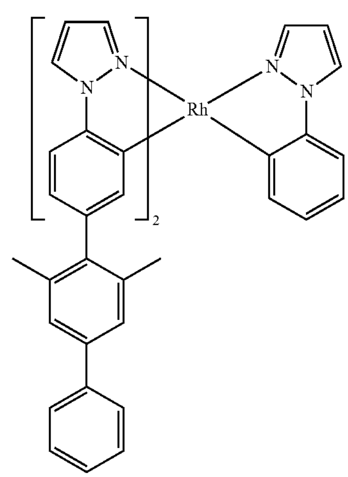

-continued
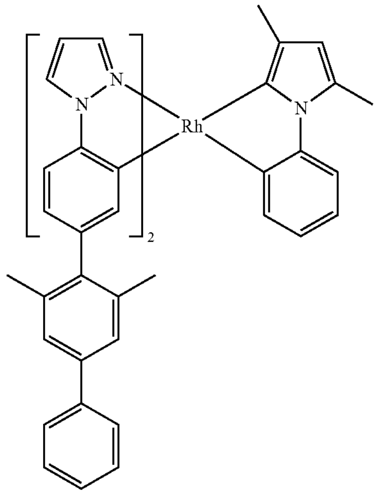
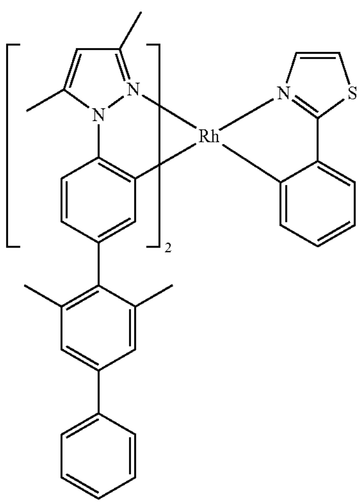
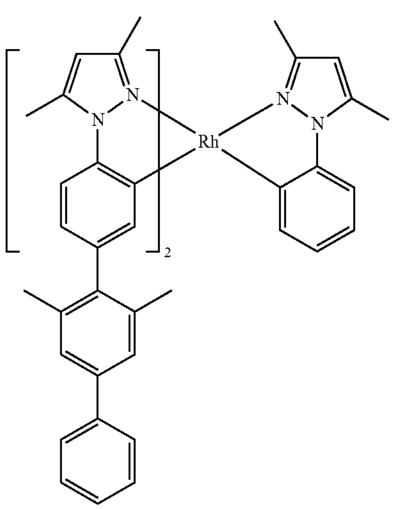
-continued
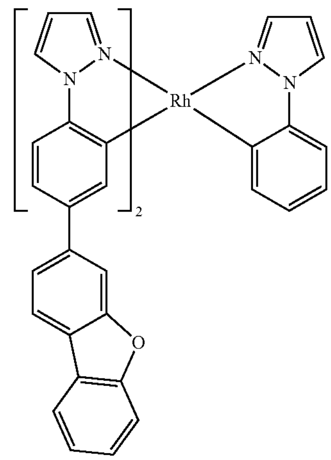
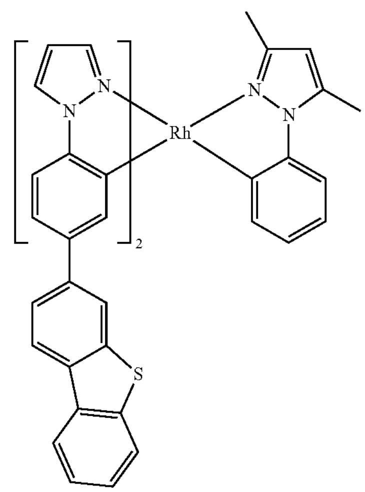
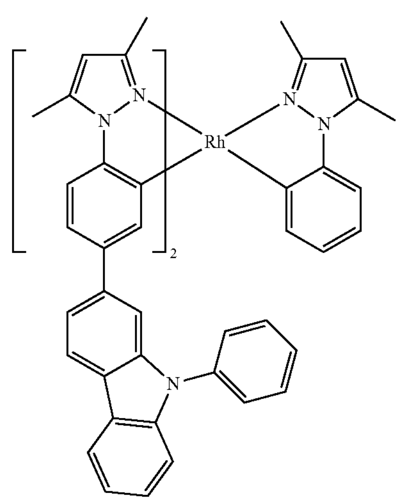

-continued
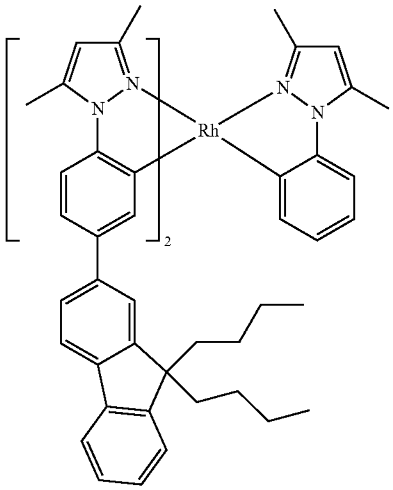
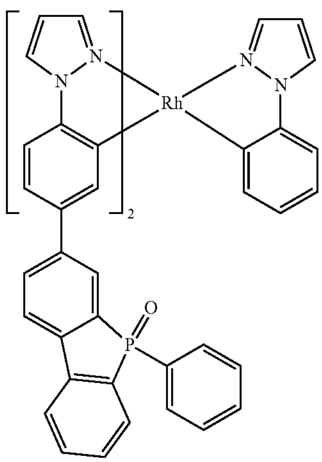
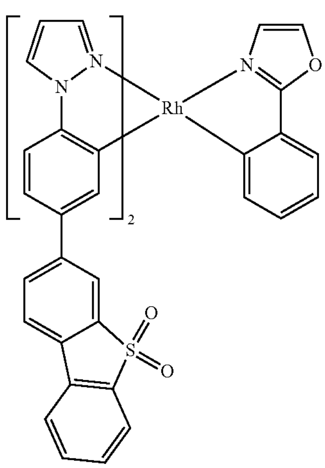
-continued
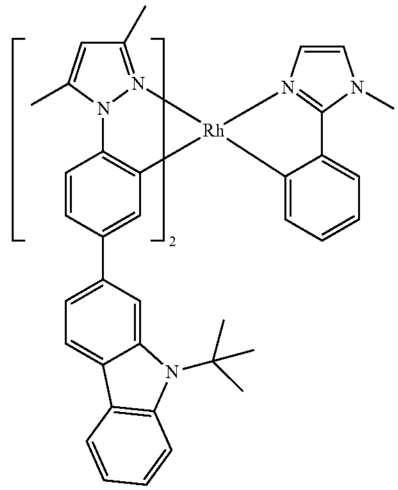
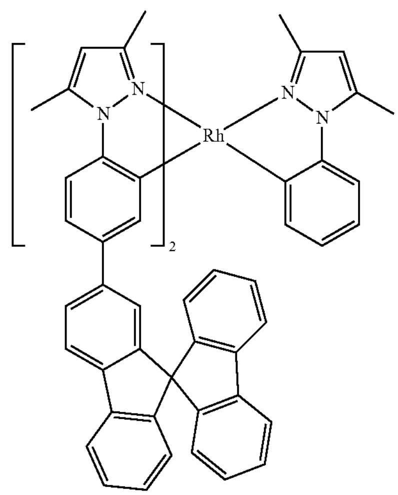
Structures Rh-14
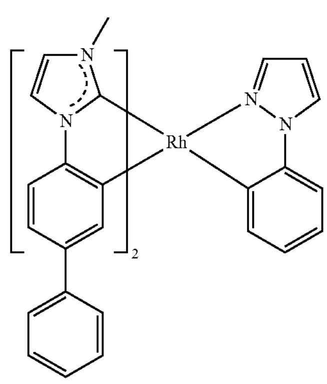

-continued
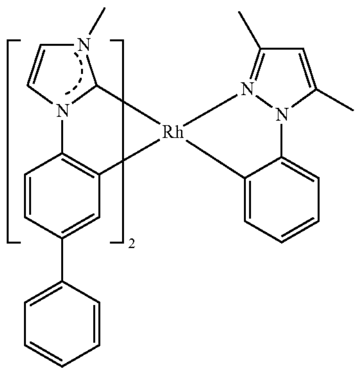
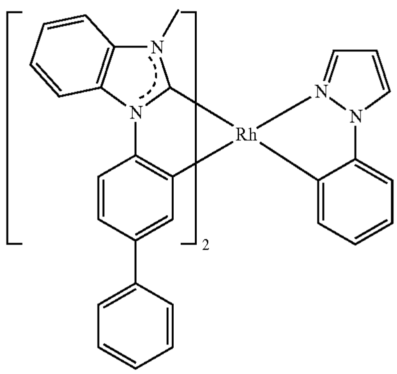
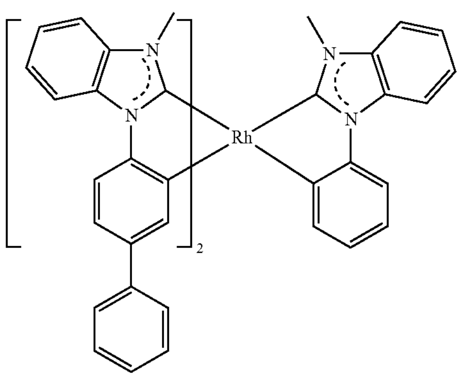
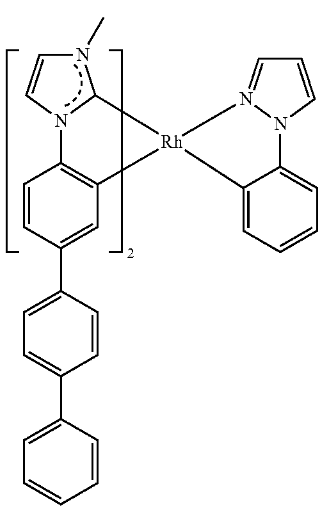
-continued
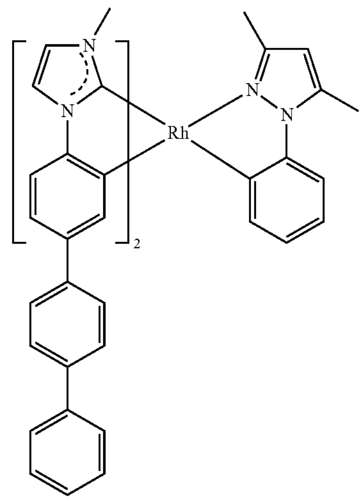
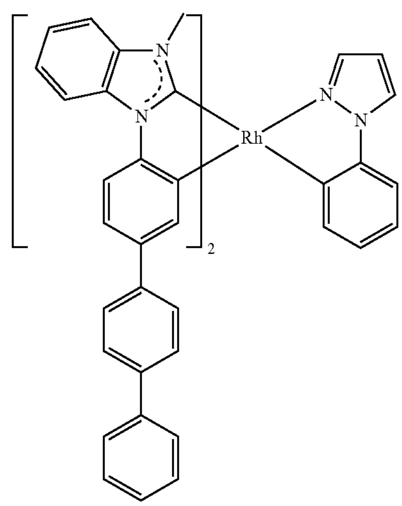
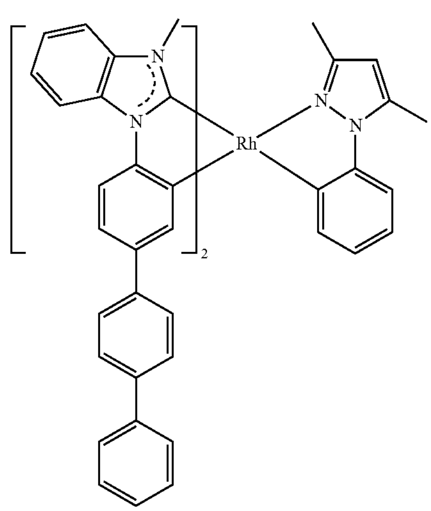

-continued
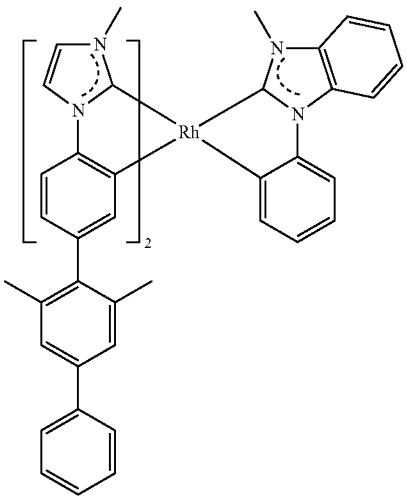
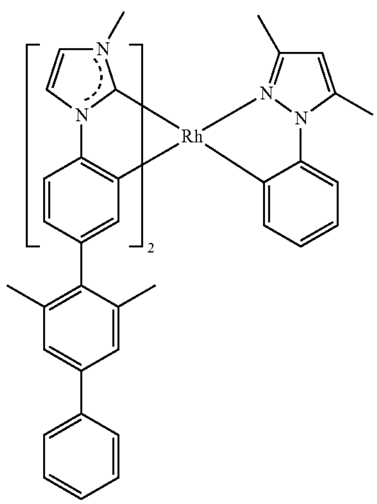
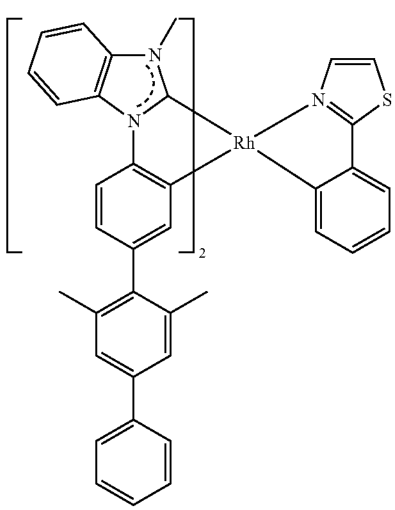
-continued
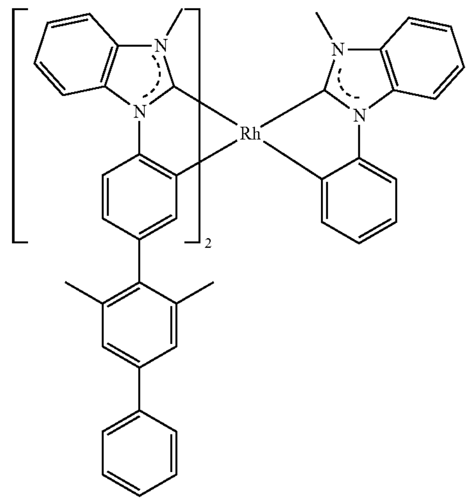
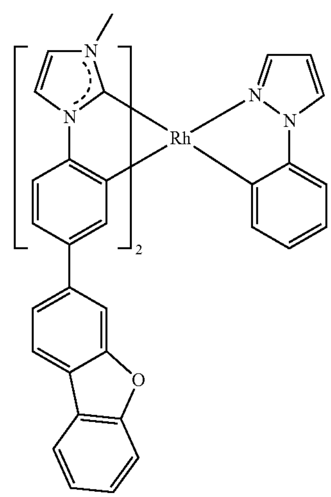
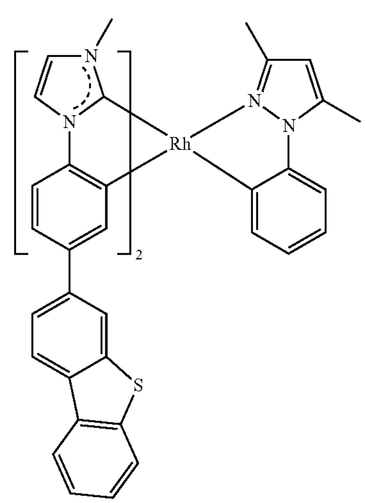

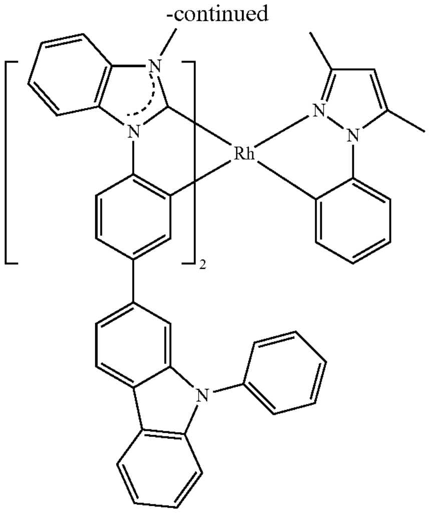
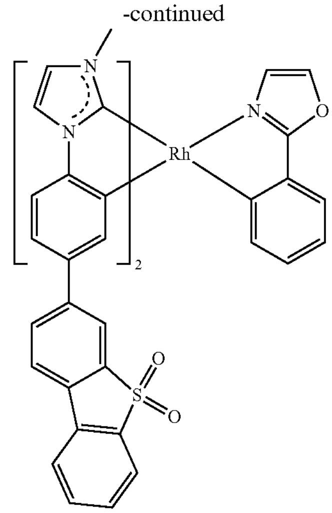
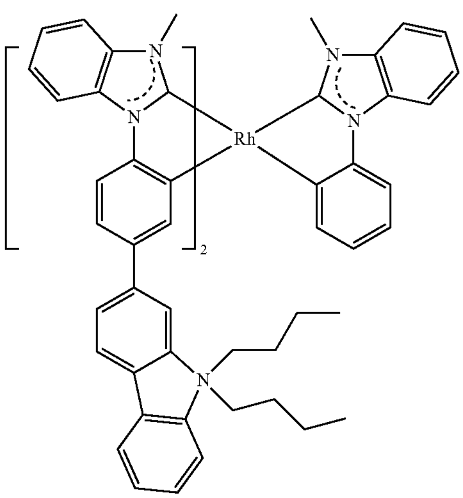
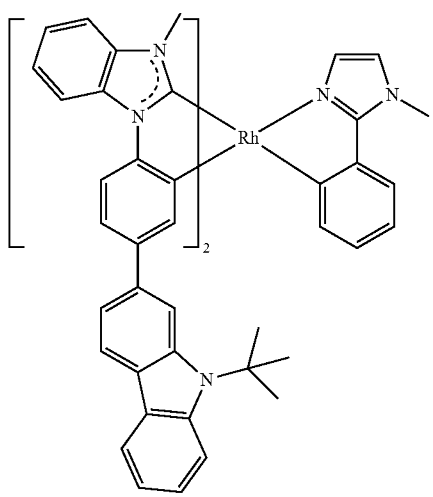
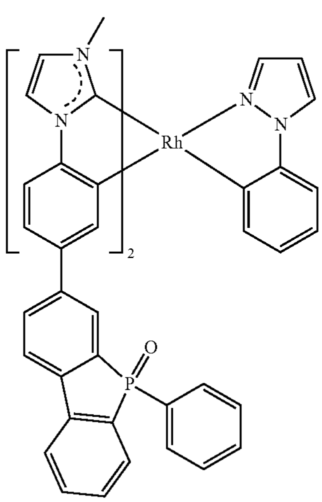
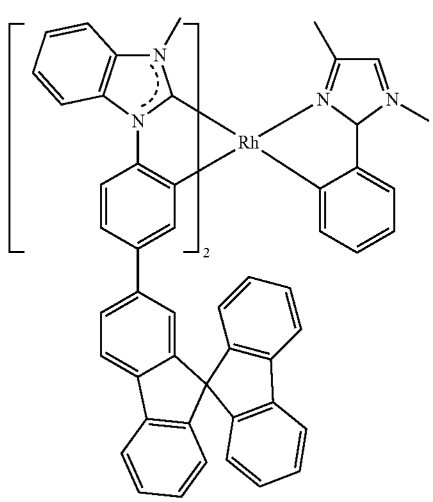

-continued
Structures Rh-15
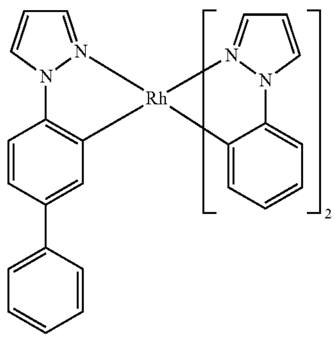
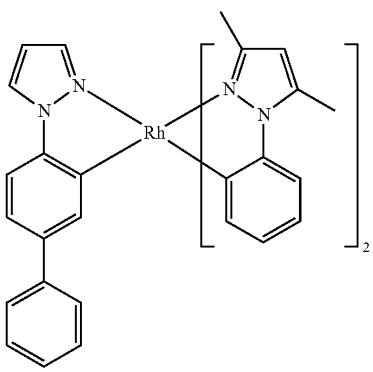
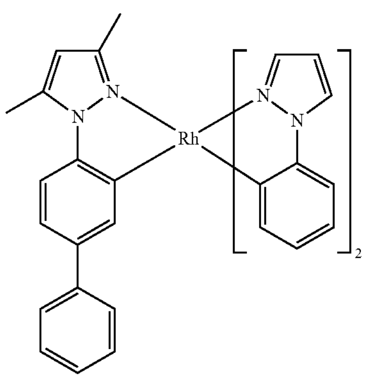
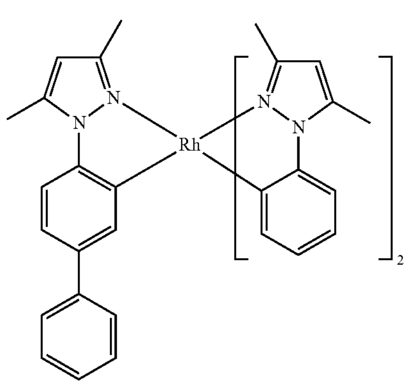
-continued
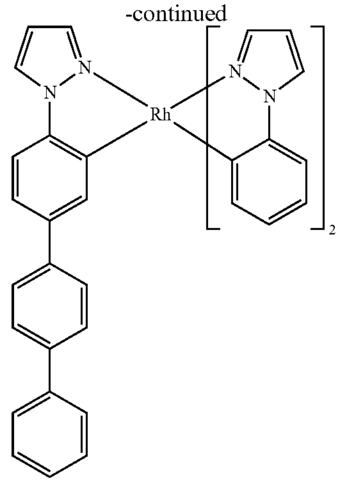
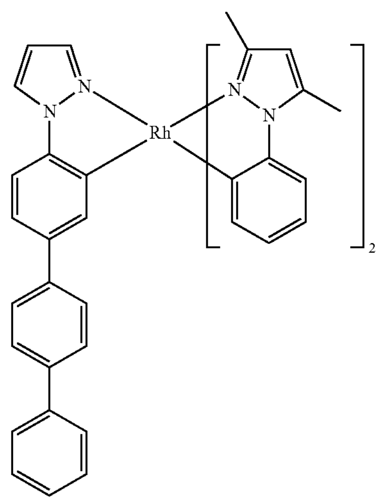
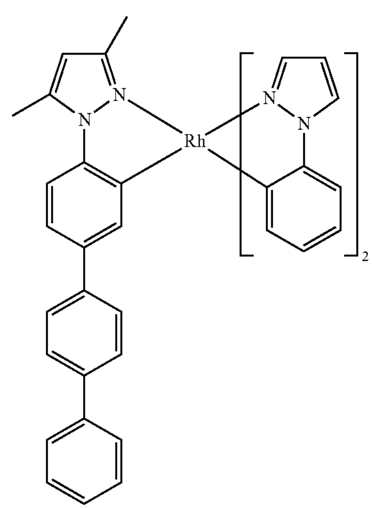

-continued
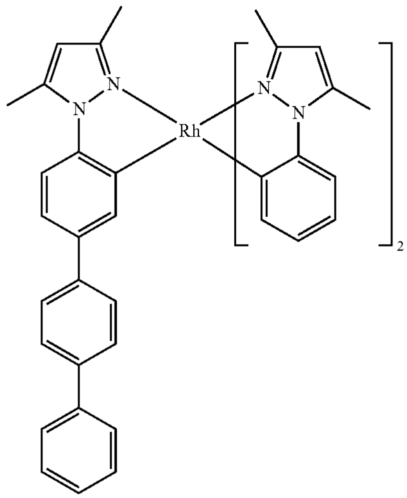
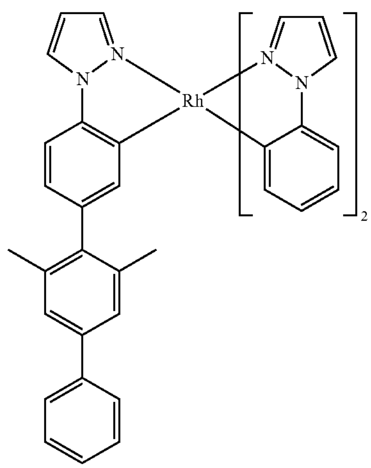
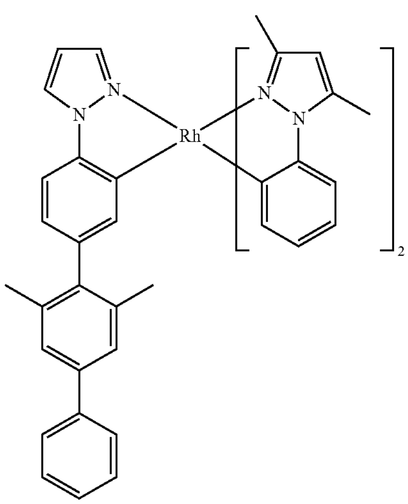
-continued
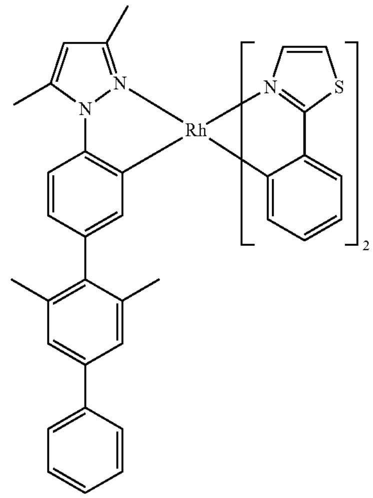
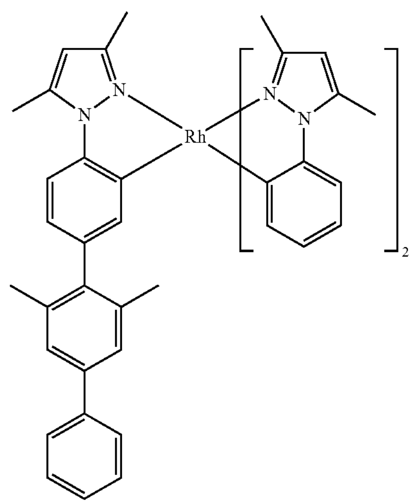
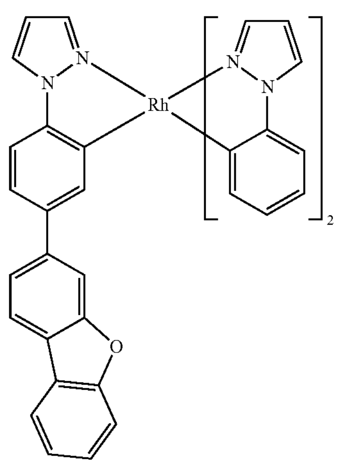

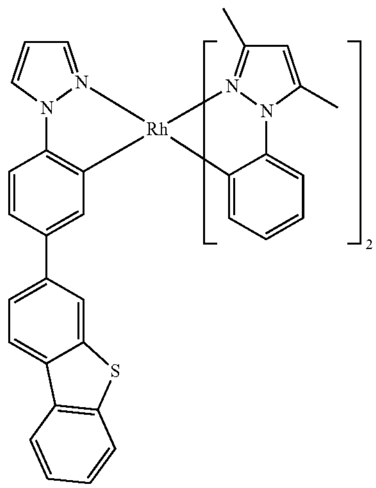
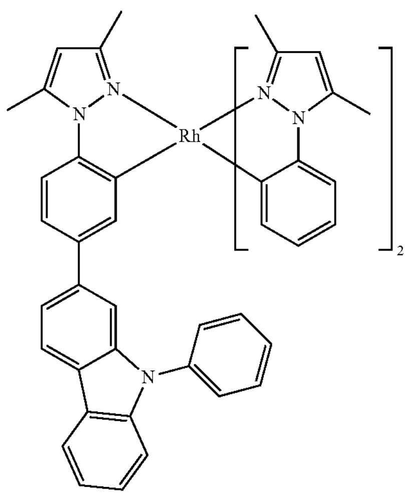
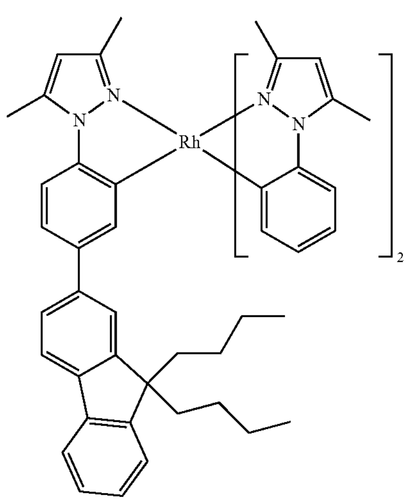
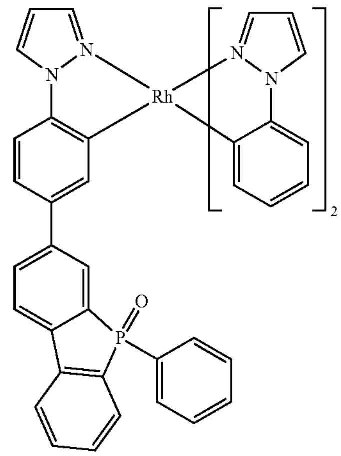
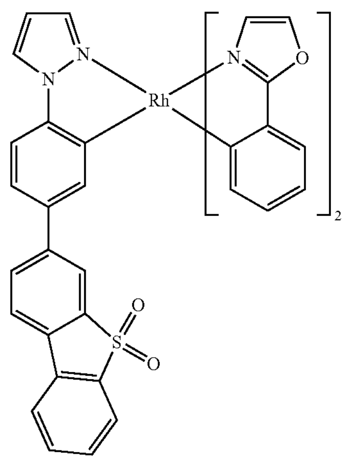
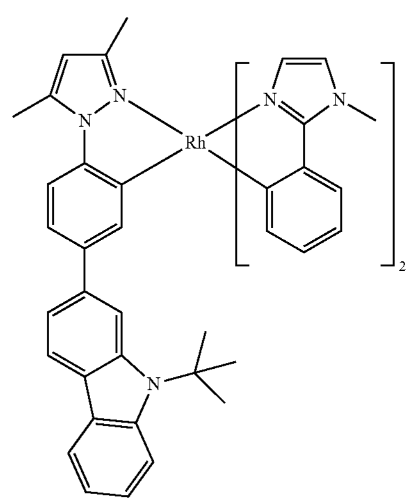

-continued
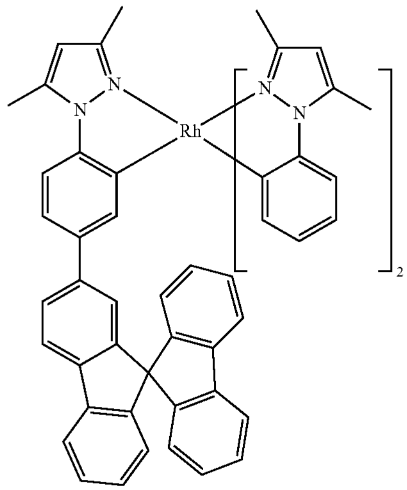
Structures Rh-16
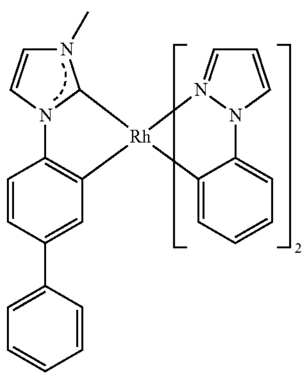
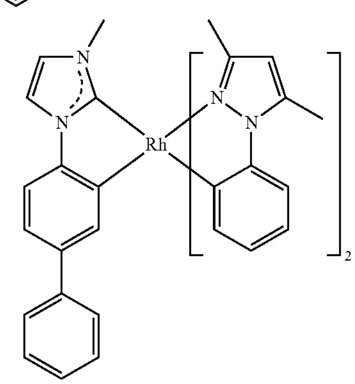
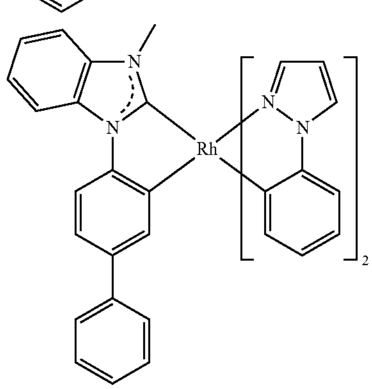
-continued
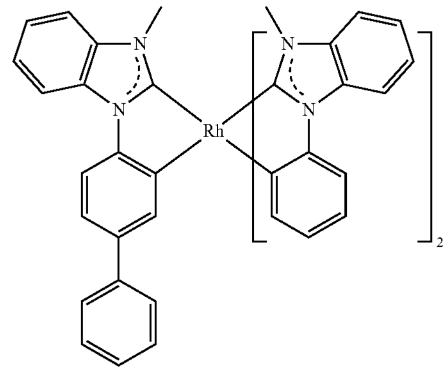
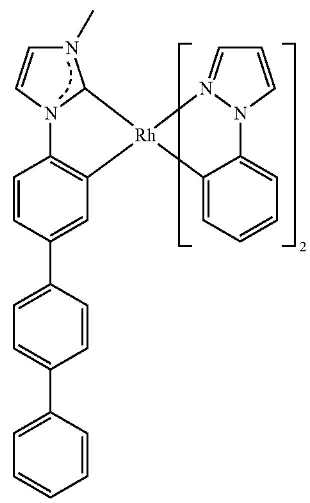
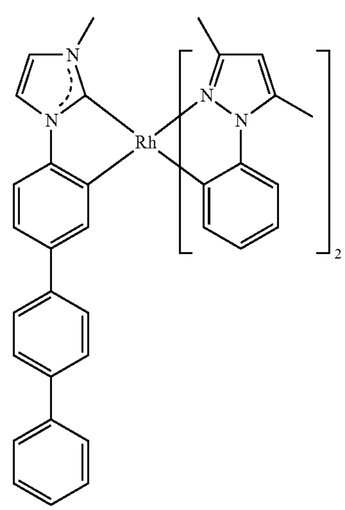

-continued
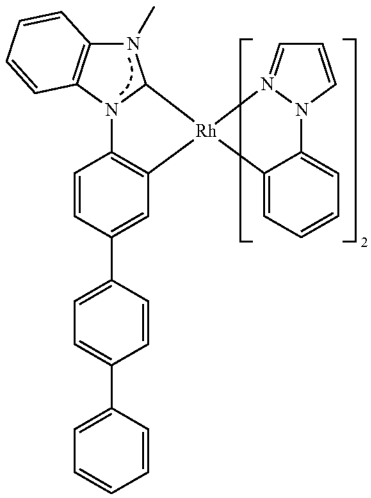
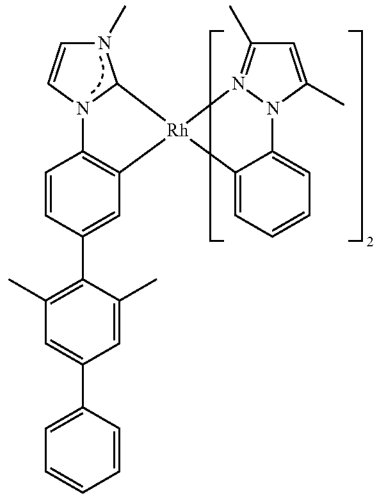
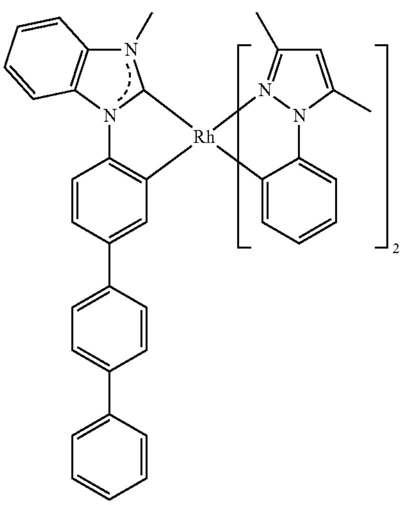
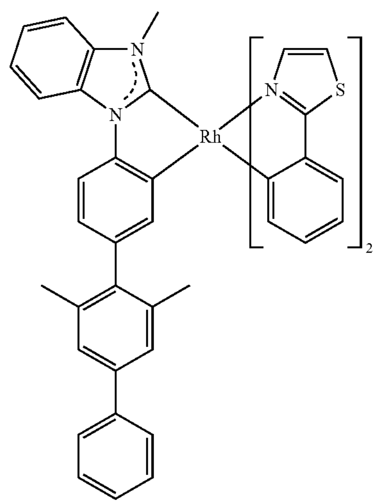
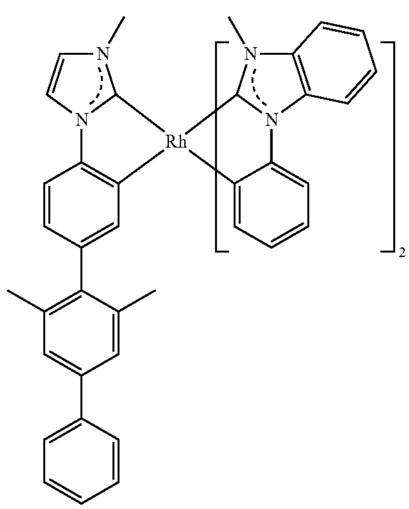
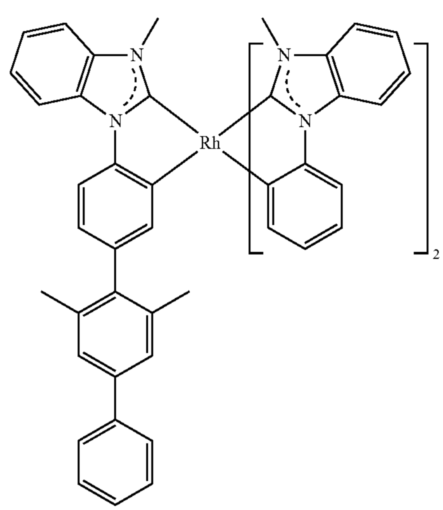
-continued -continued
-continued
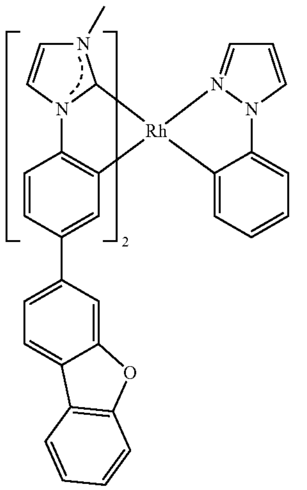
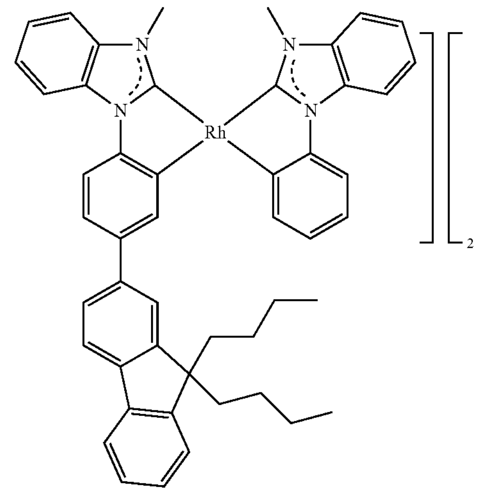
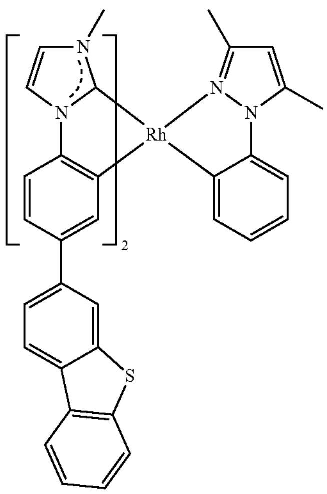
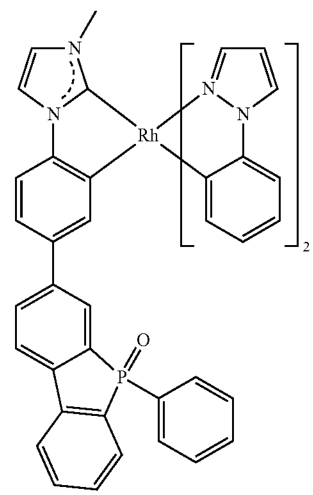
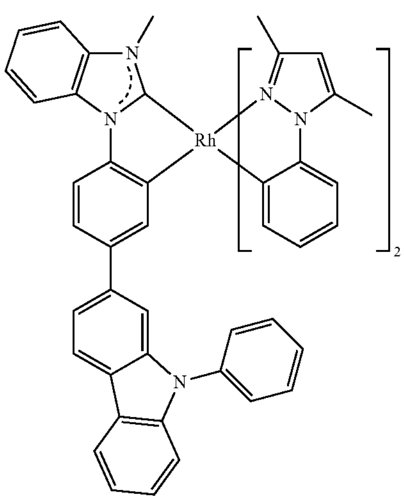
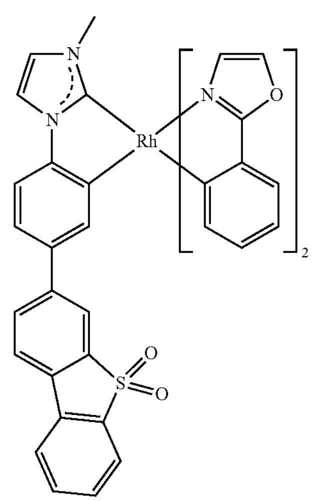

-continued
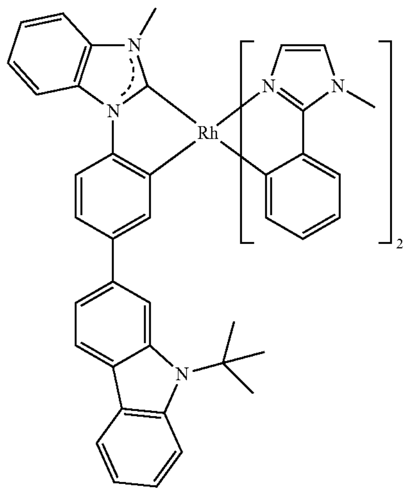
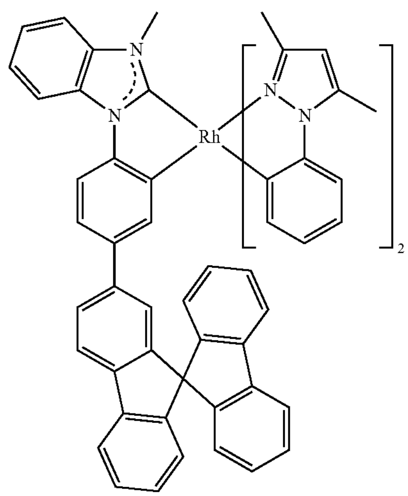
Structures Rh-17
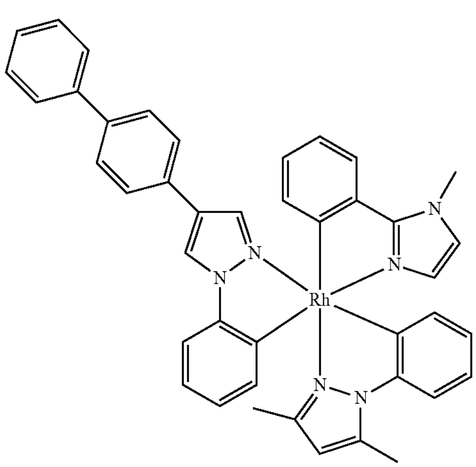
-continued
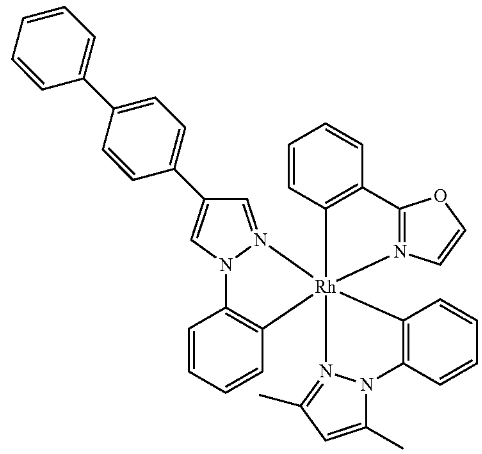
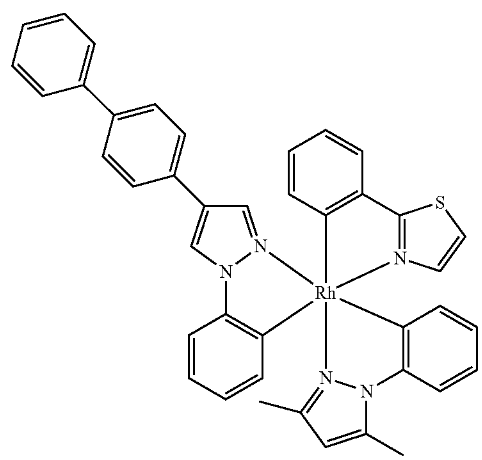
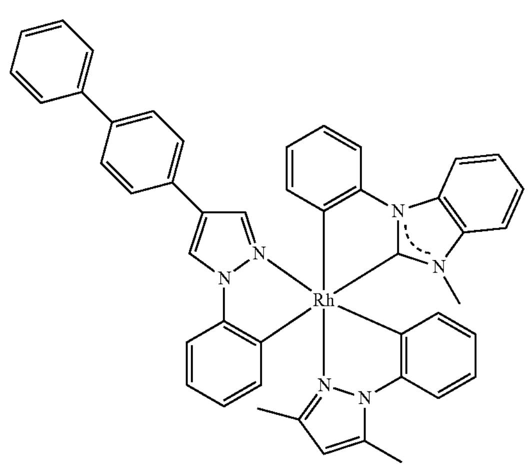

-continued
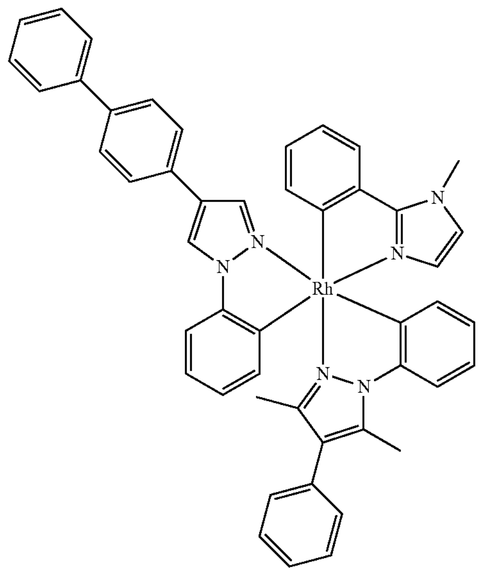
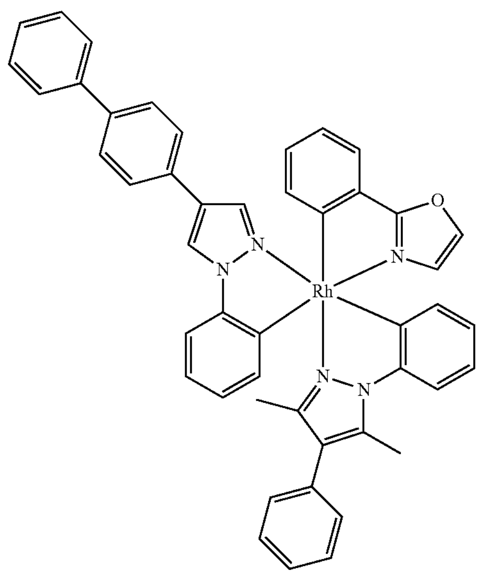
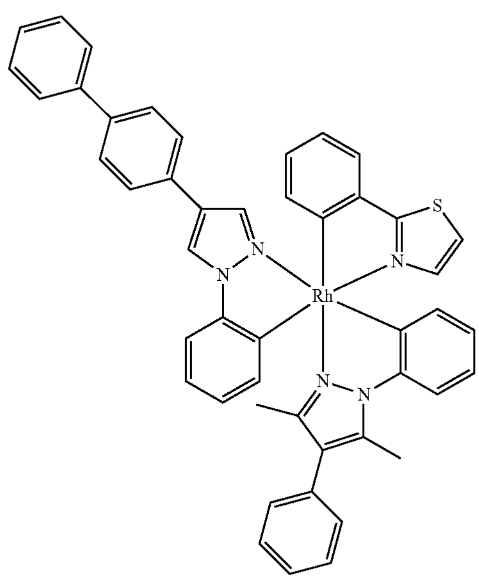
-continued
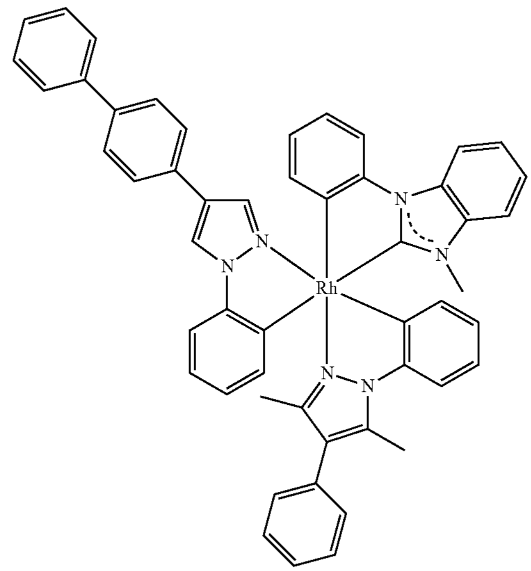
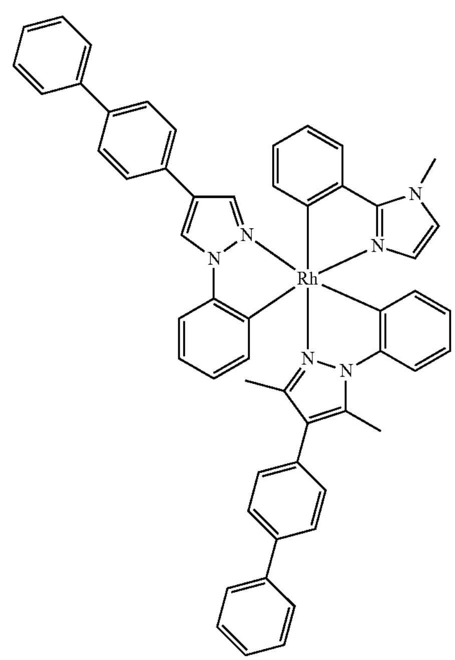

-continued
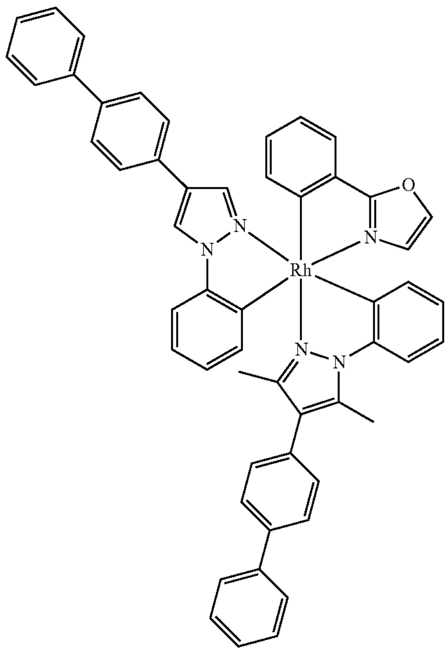
-continued
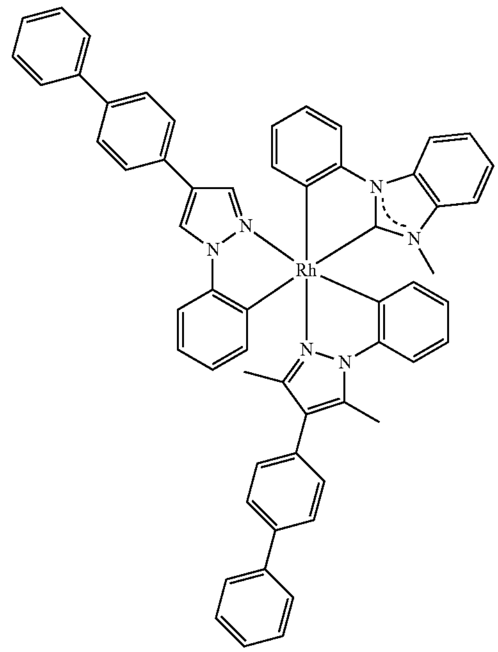
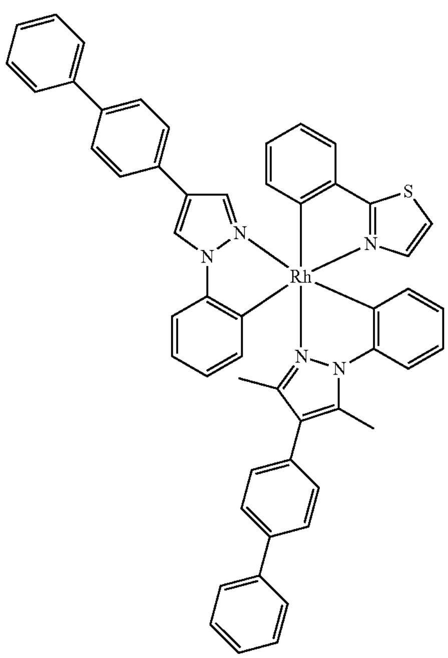
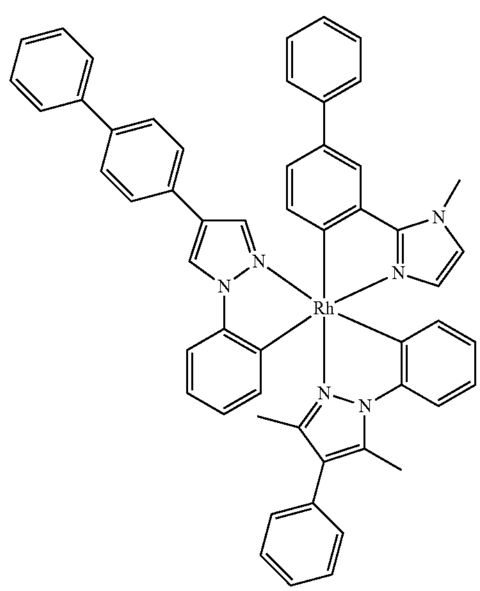

-continued
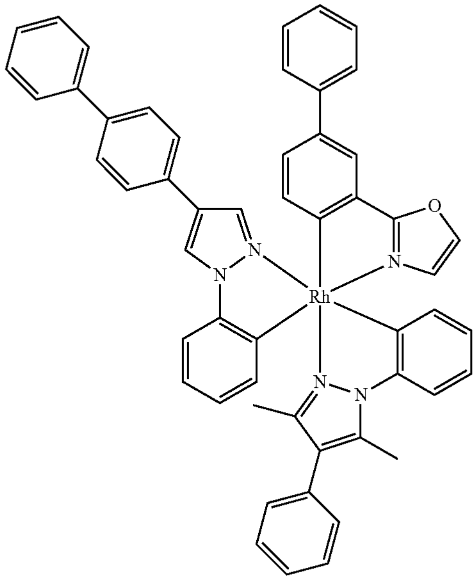
-continued
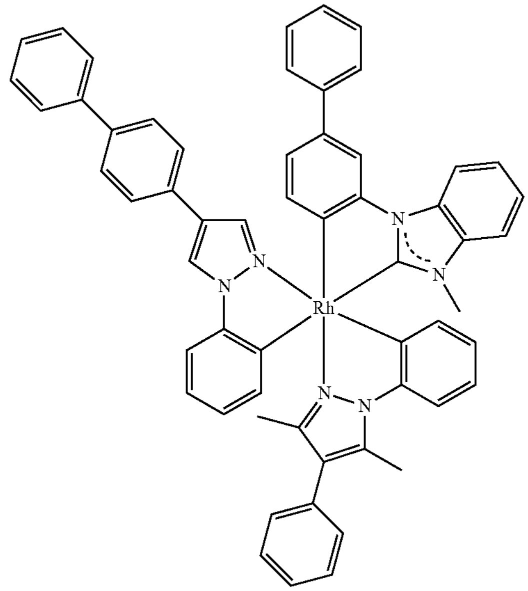
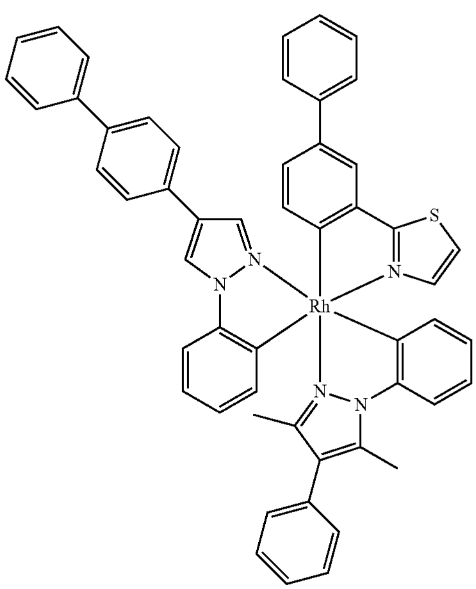
Structures Rh-18
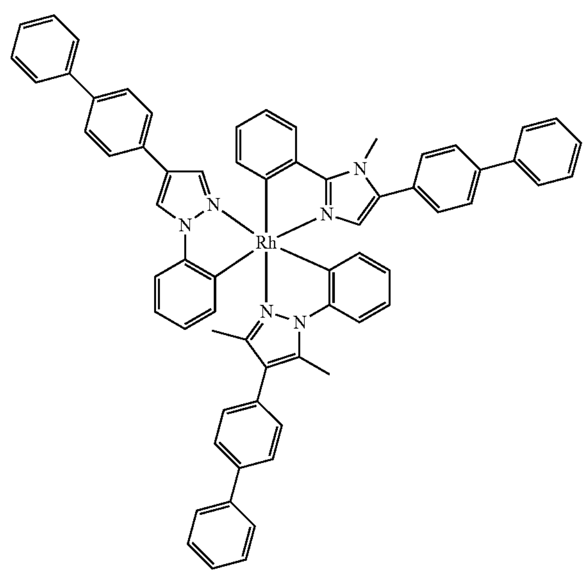

-continued
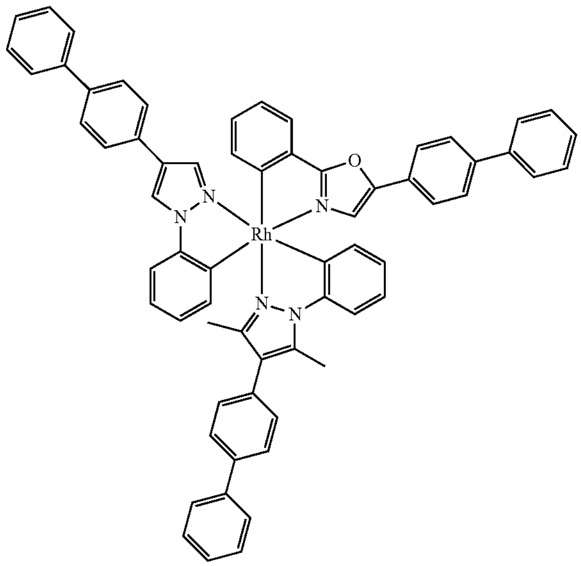
-continued
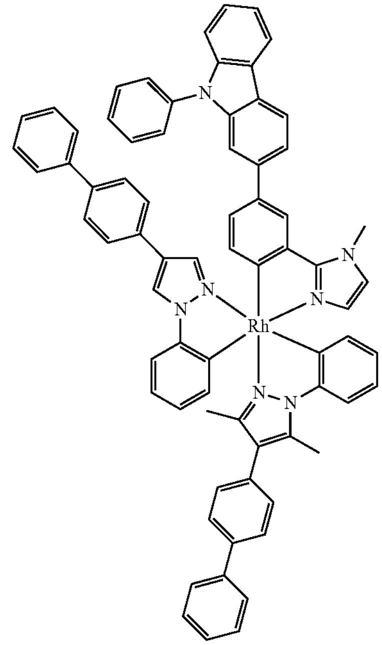
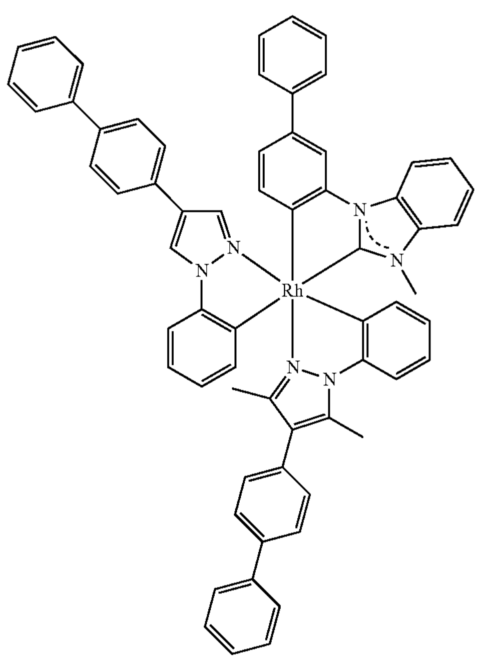
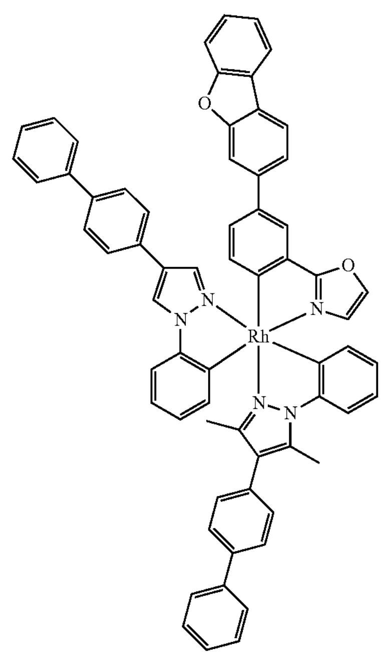

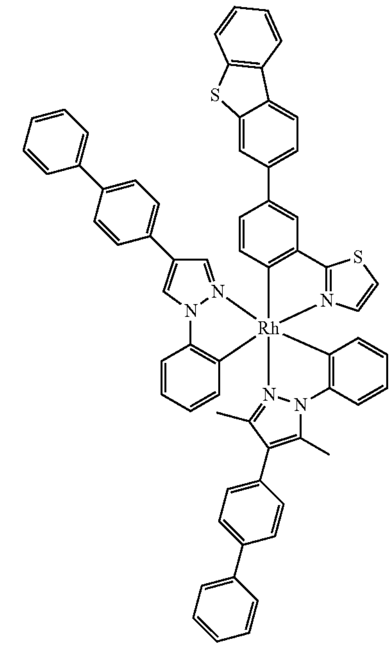
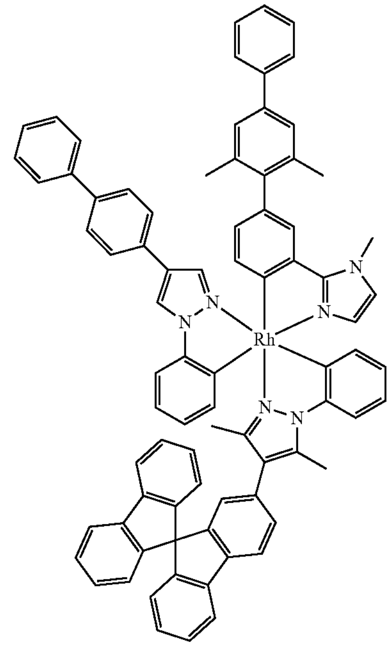
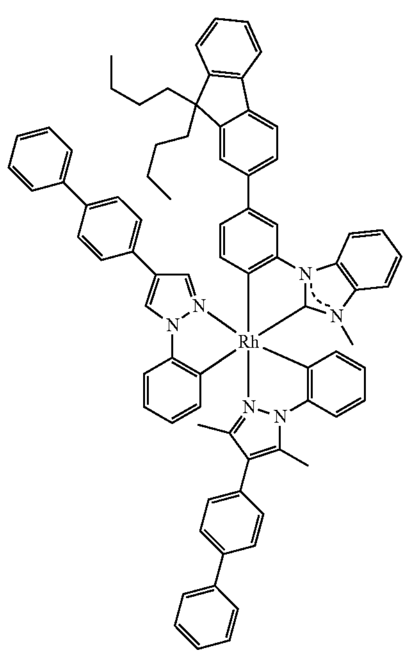
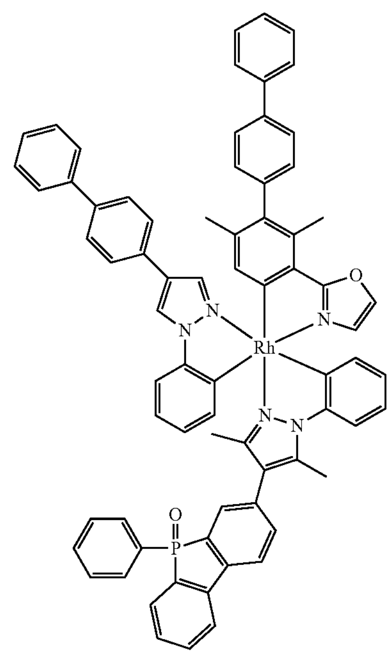

-continued
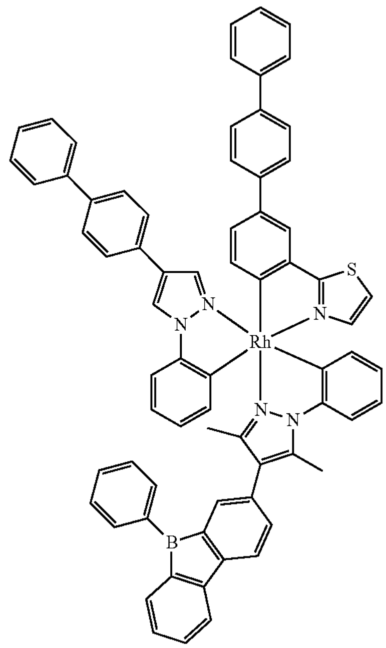
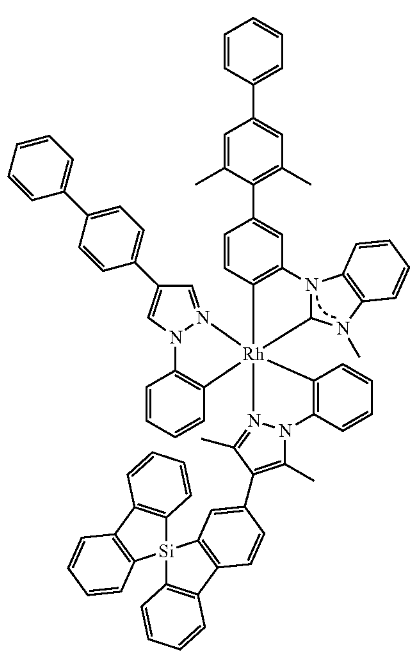
-continued
Structure Rh-19
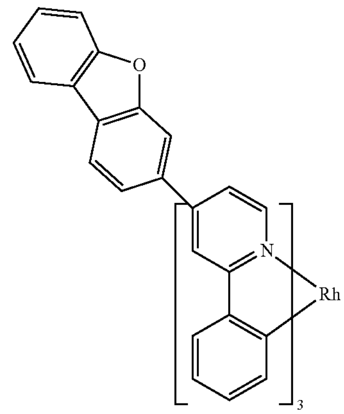
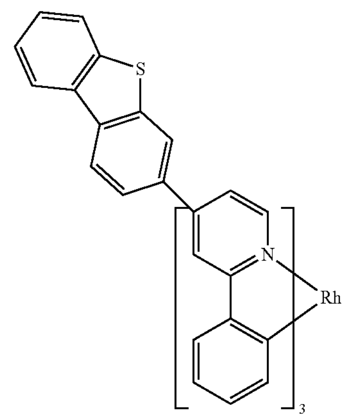
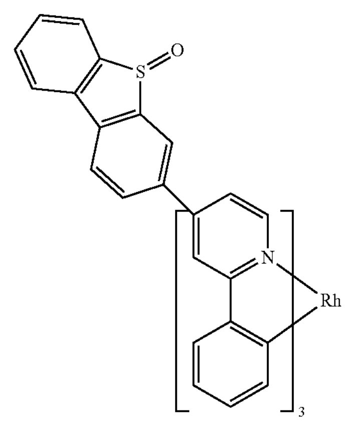
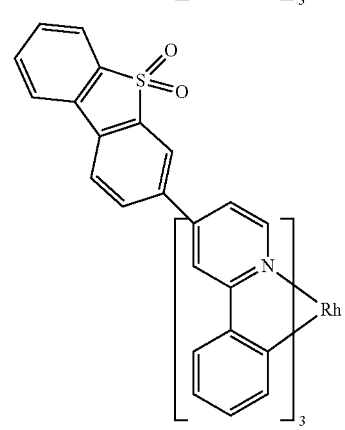

-continued
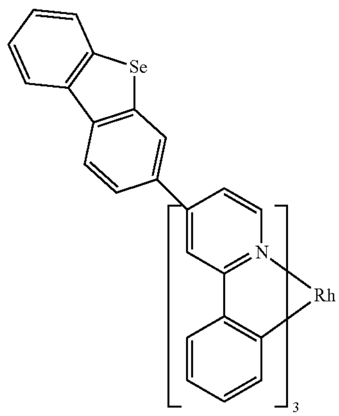
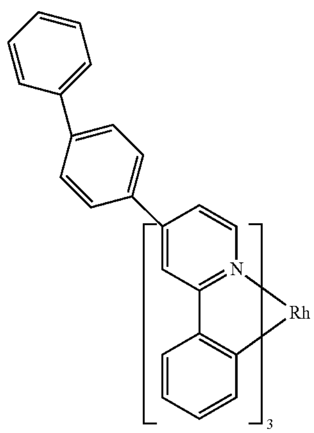
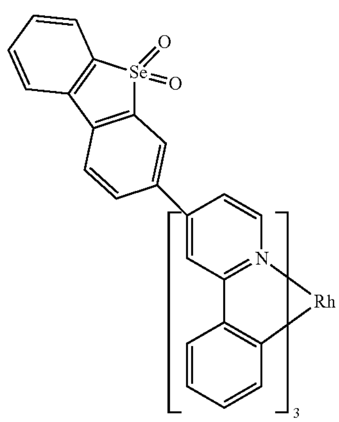
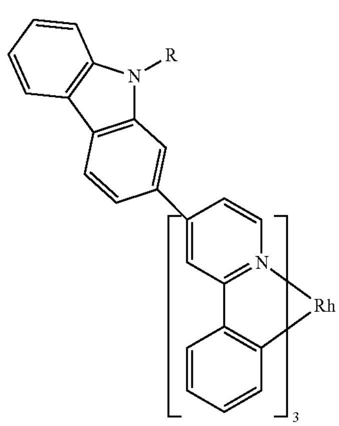
-continued
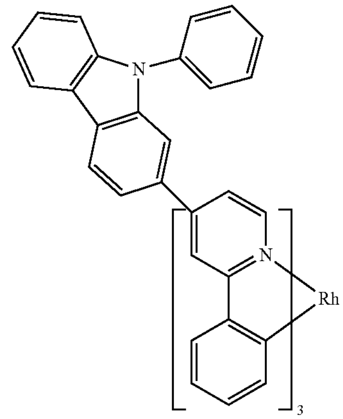
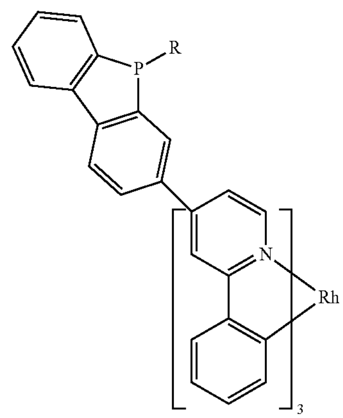
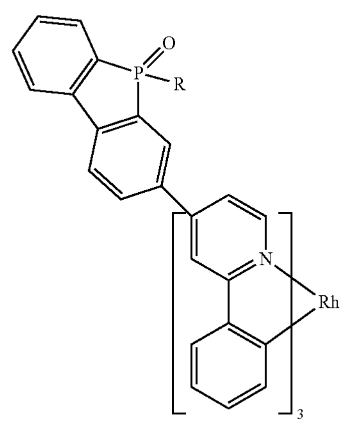
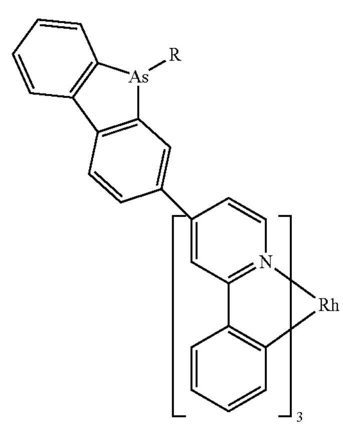

-continued
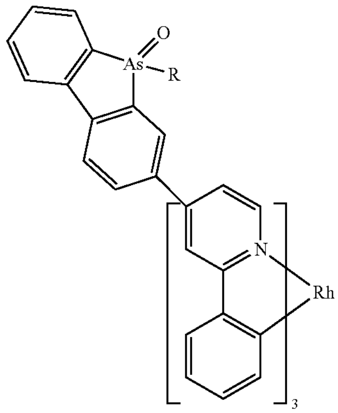
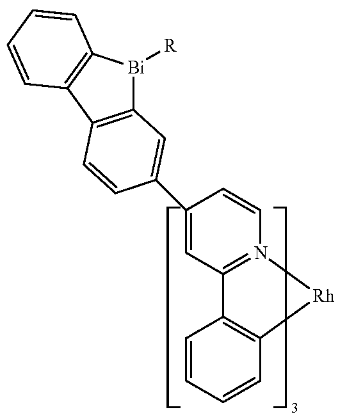
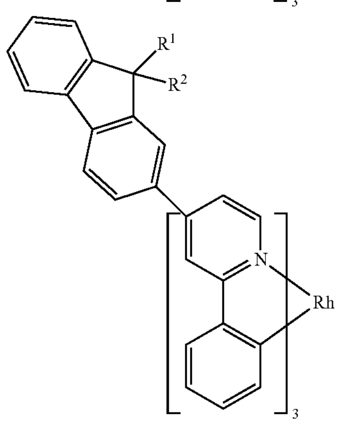
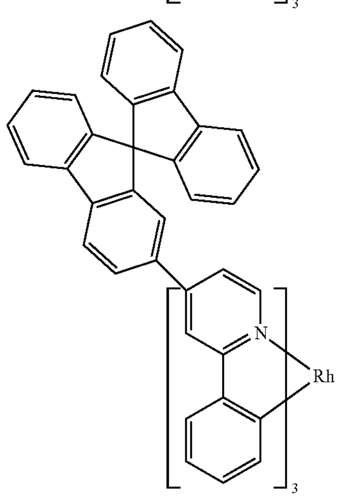
-continued
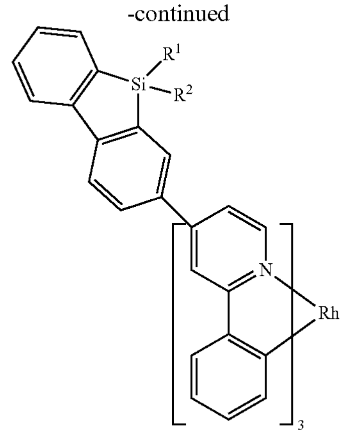
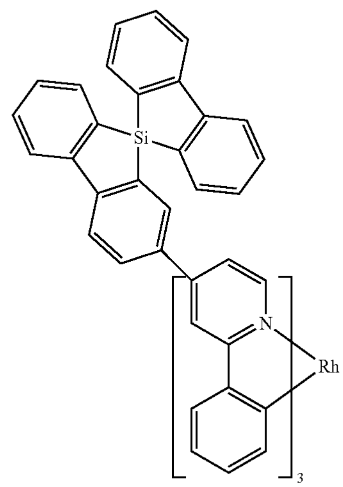
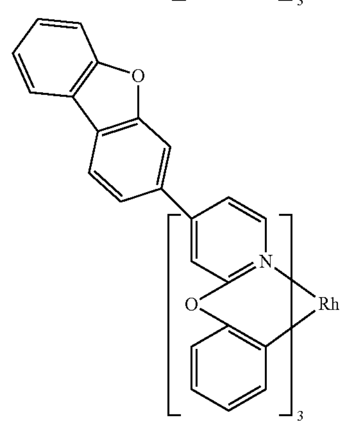
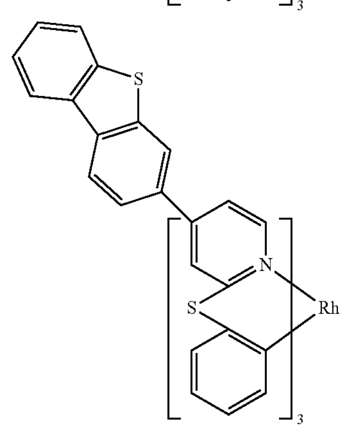

-continued
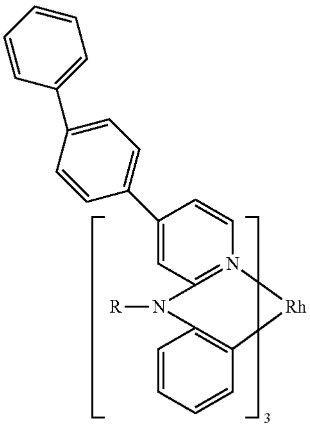
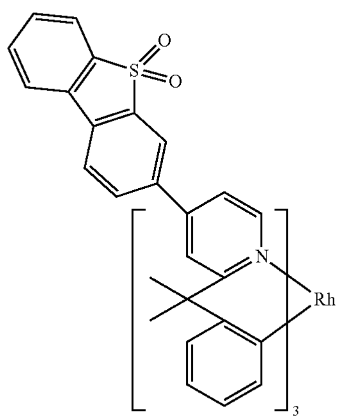
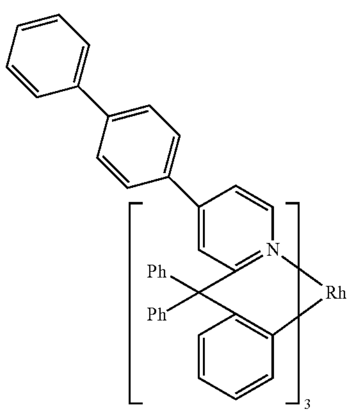
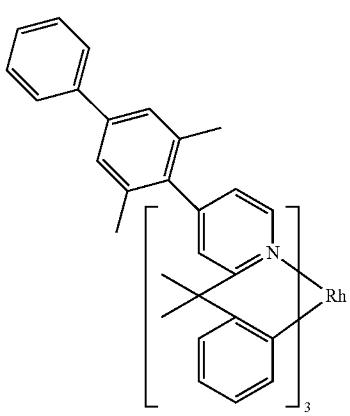
-continued
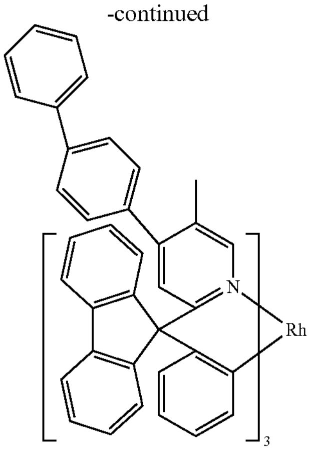
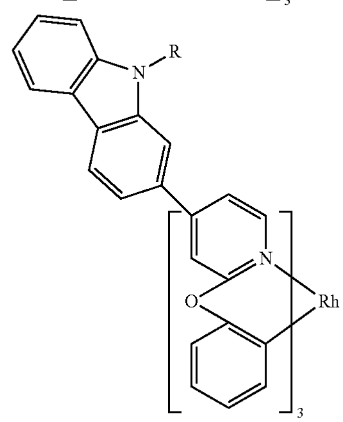
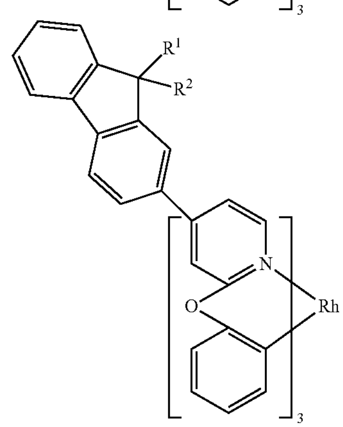
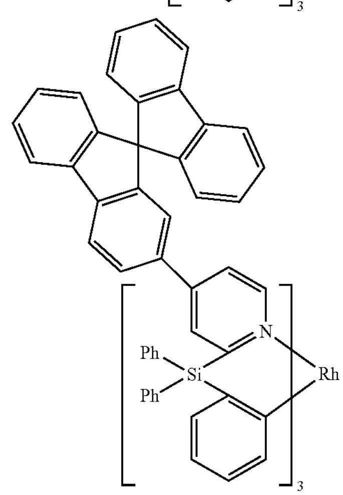

-continued
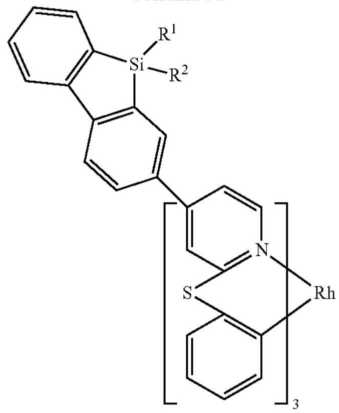
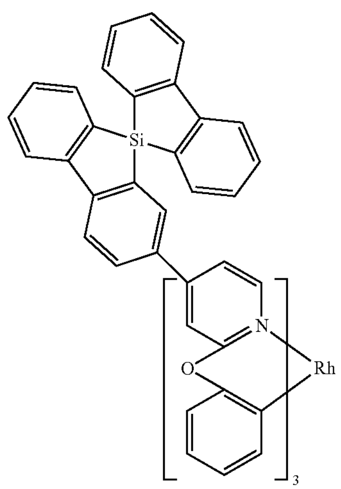
Structures Rh-20
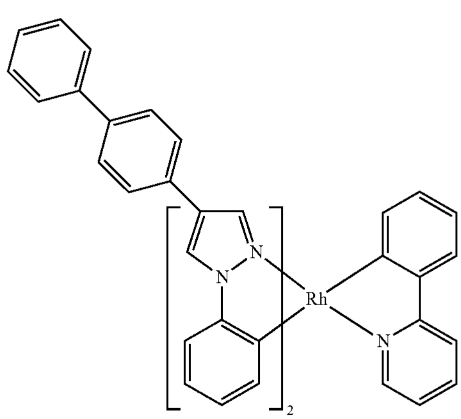
-continued
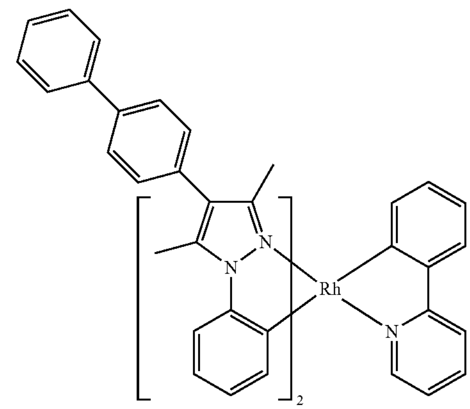
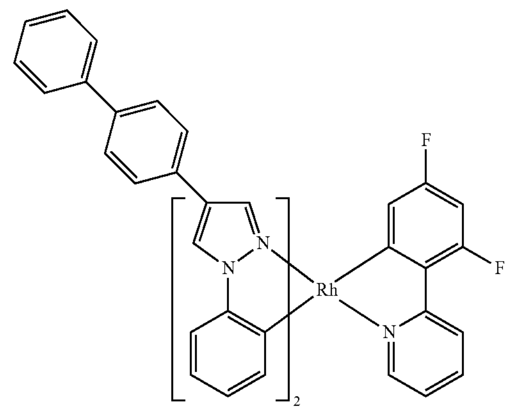
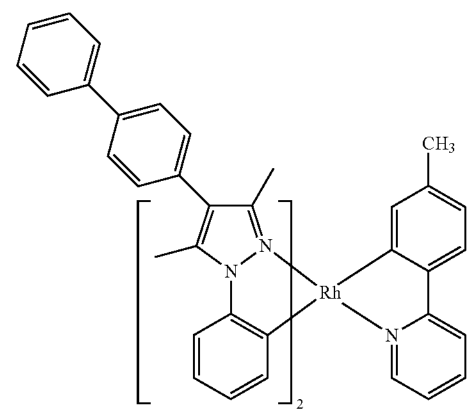
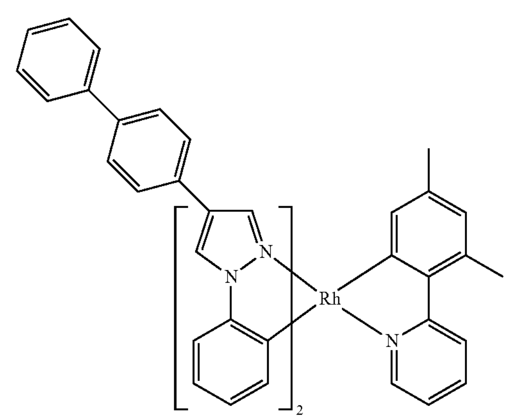

-continued
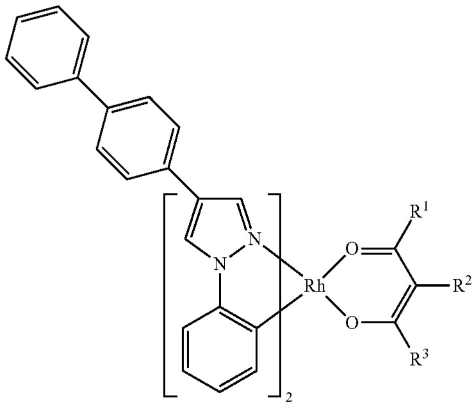
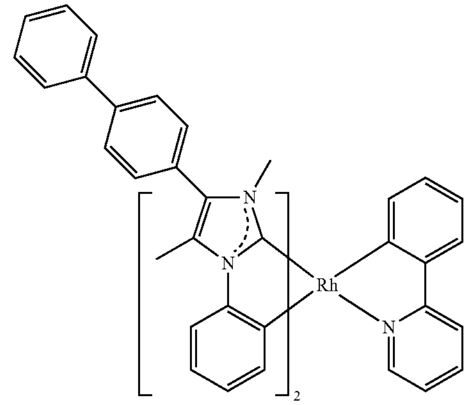
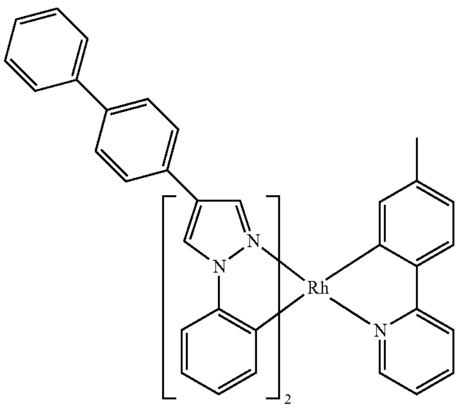
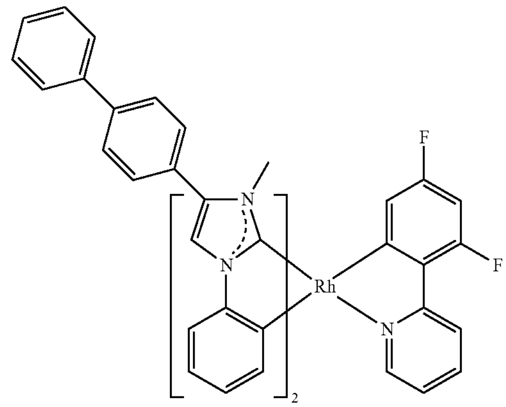
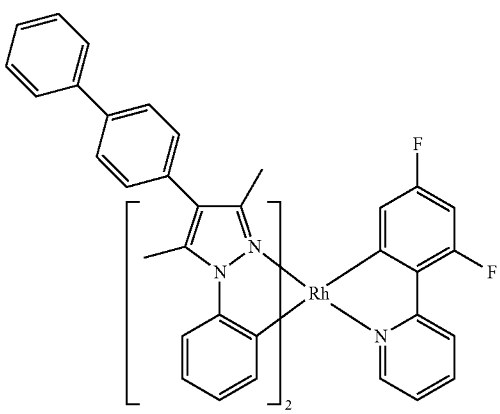
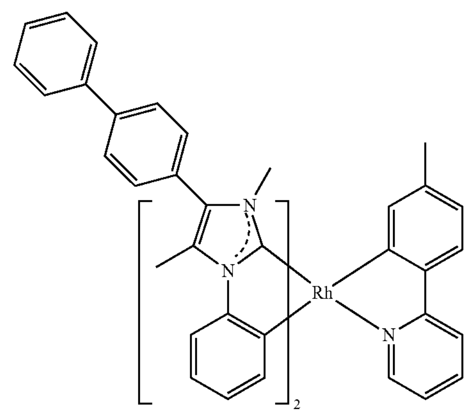
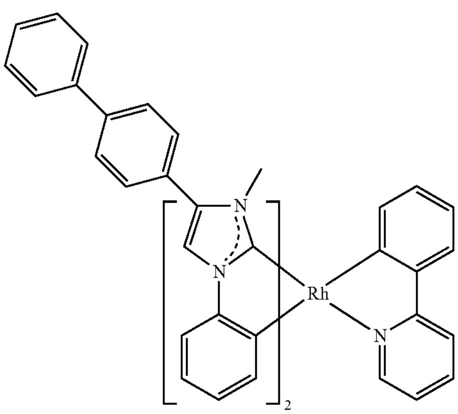
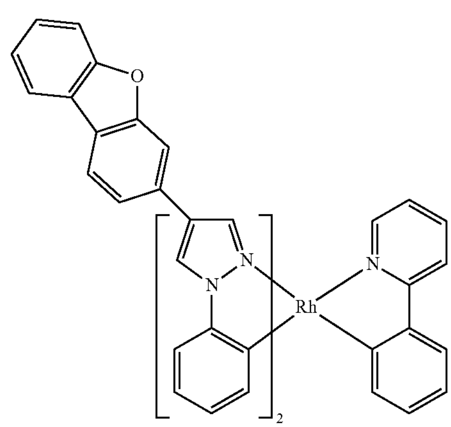

-continued
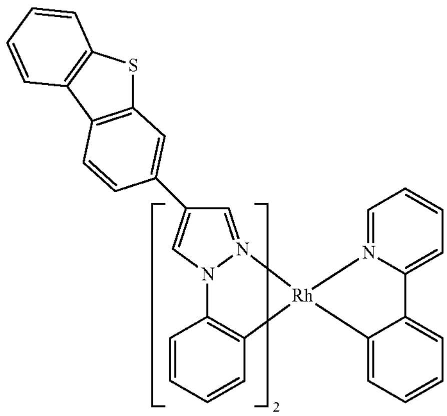
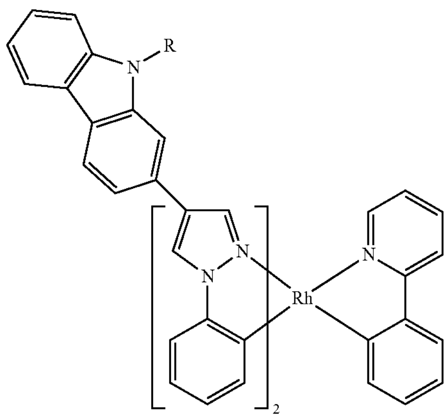
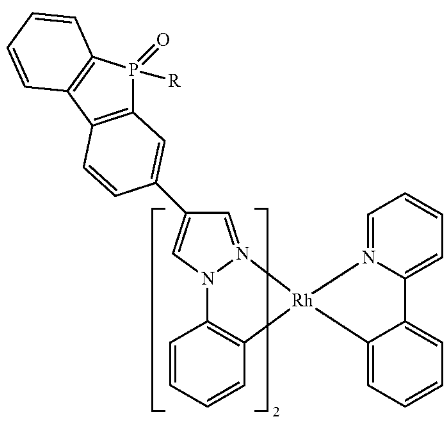
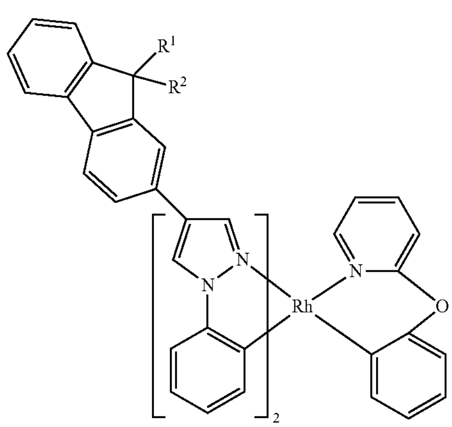
-continued
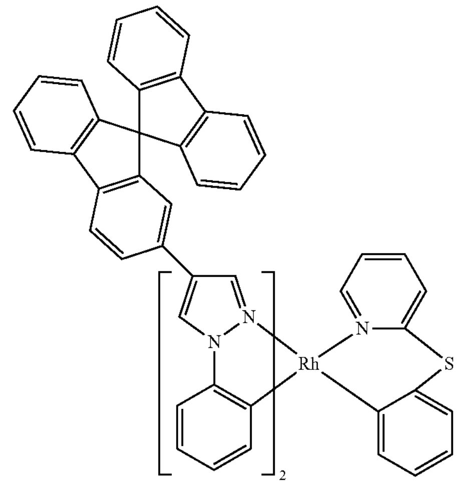
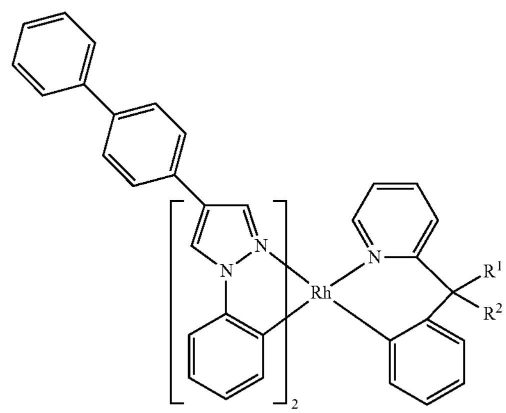
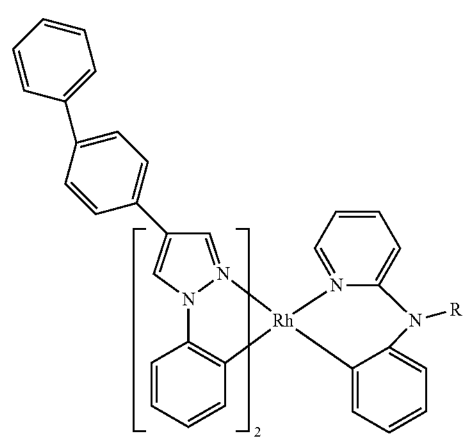

-continued
Structures Rh-21
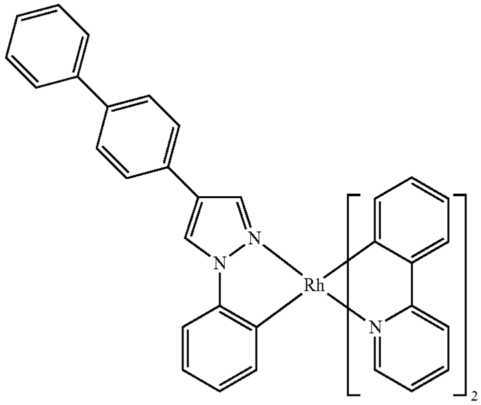
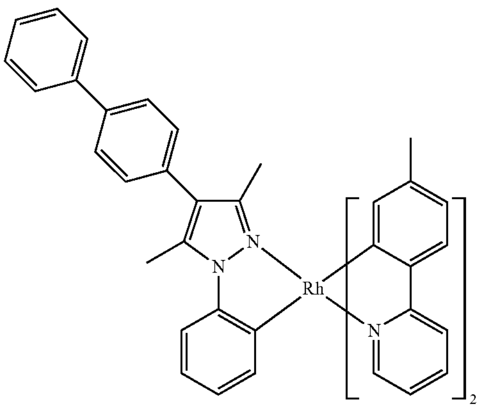
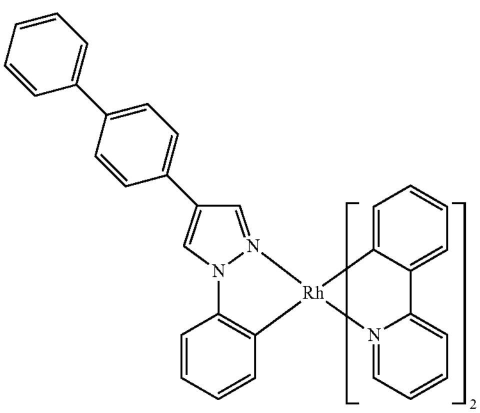
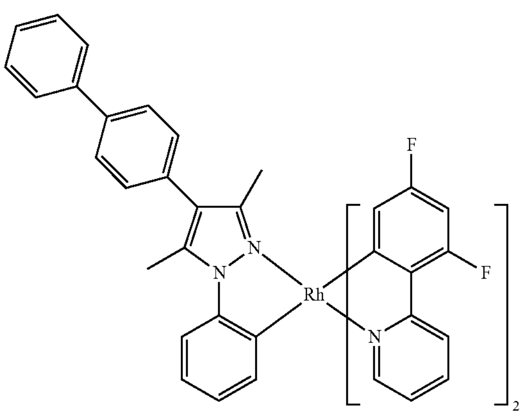
-continued
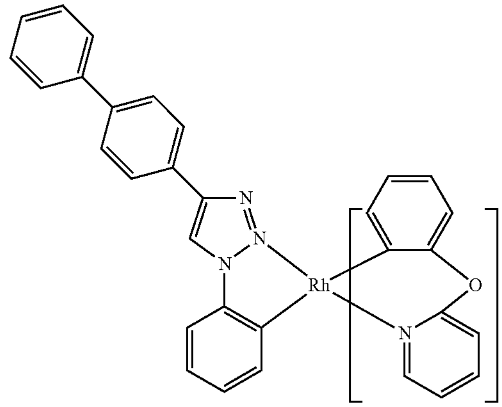
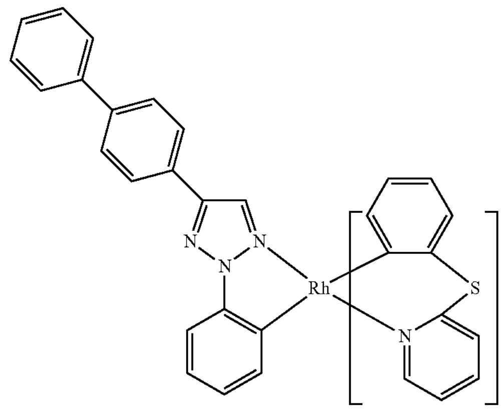
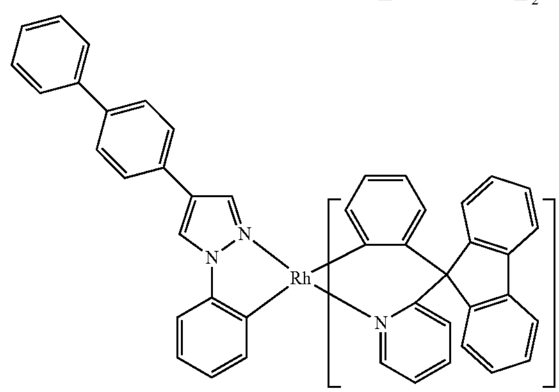
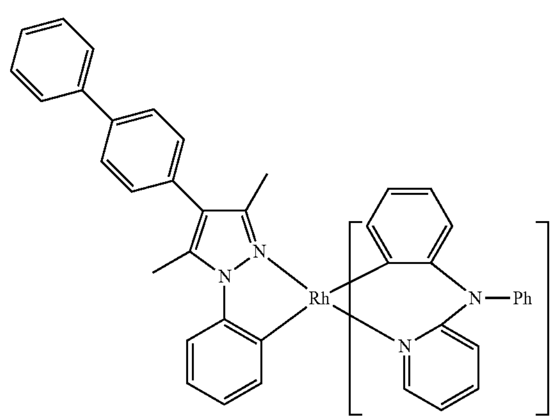

-continued
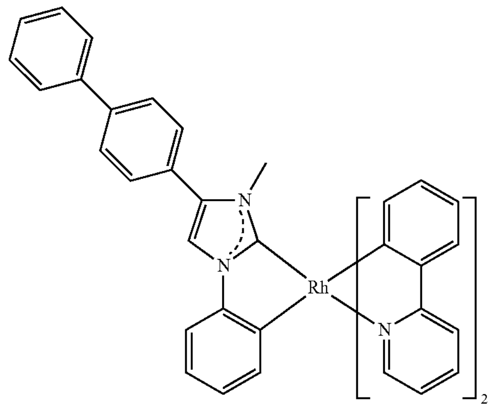
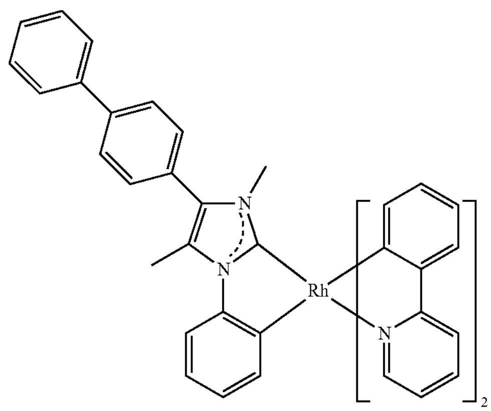
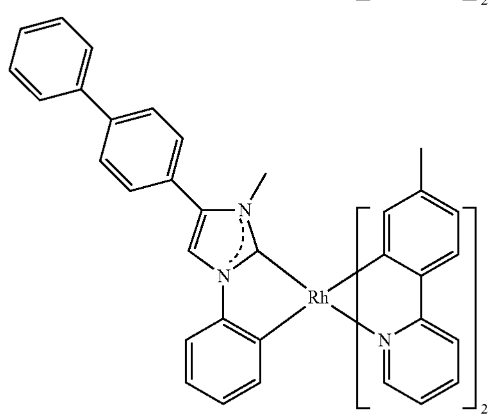
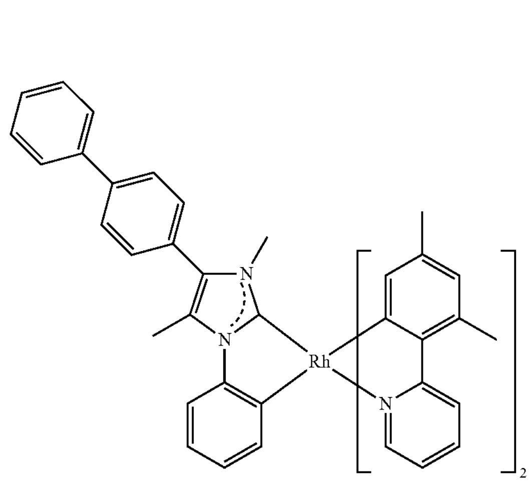
-continued
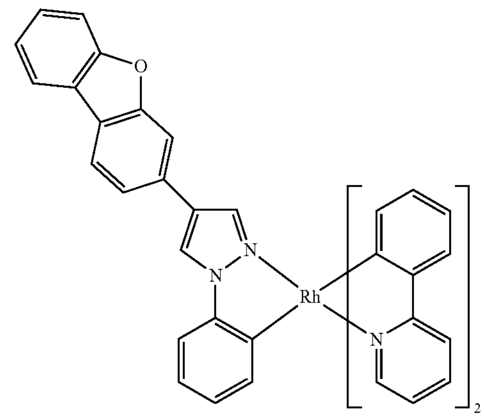
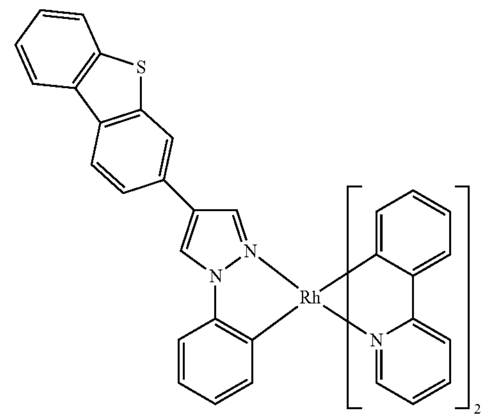
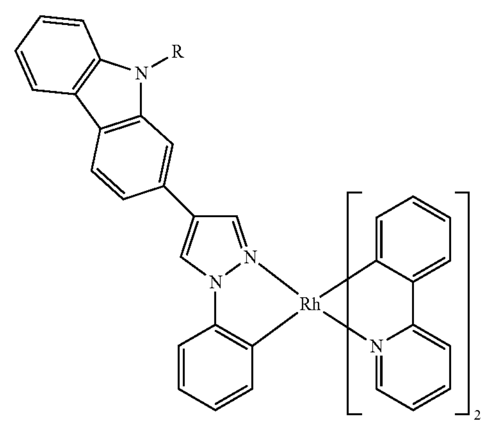
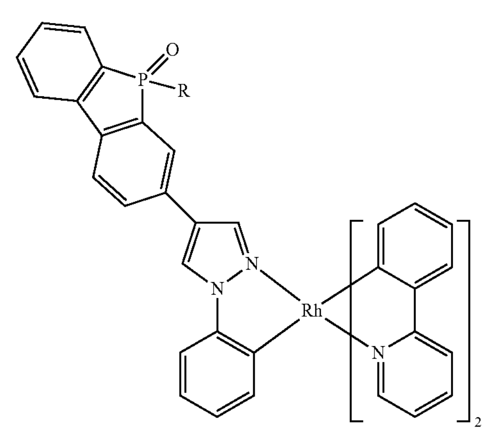

-continued
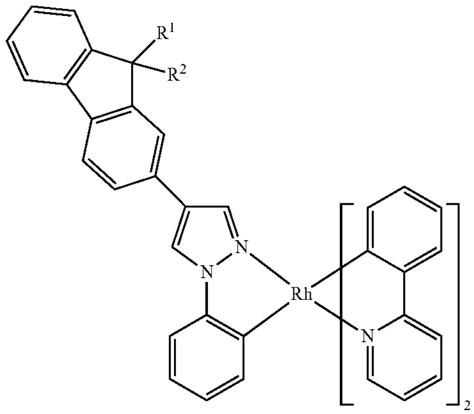
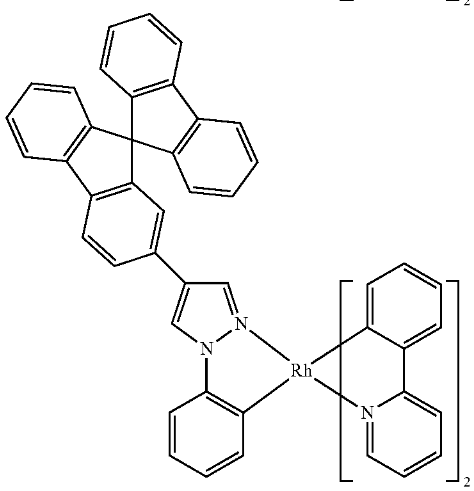
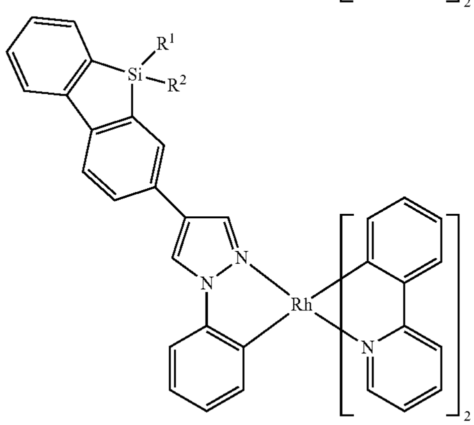
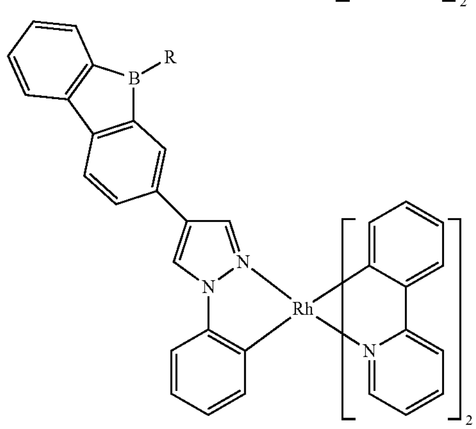
-continued
Structures Rh-22
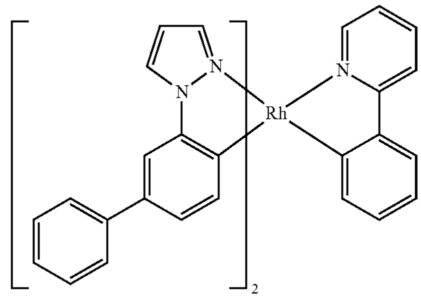
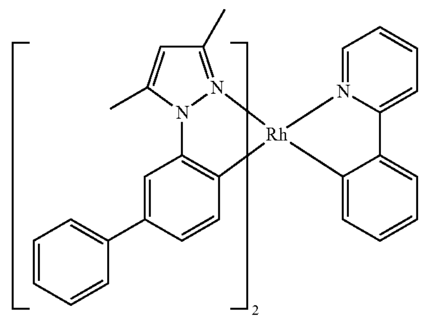
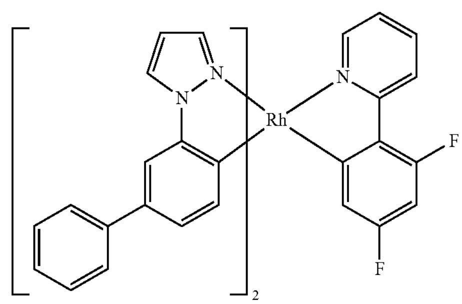
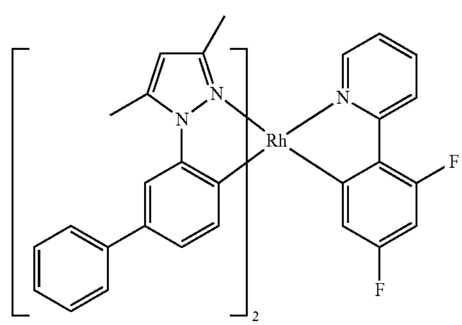
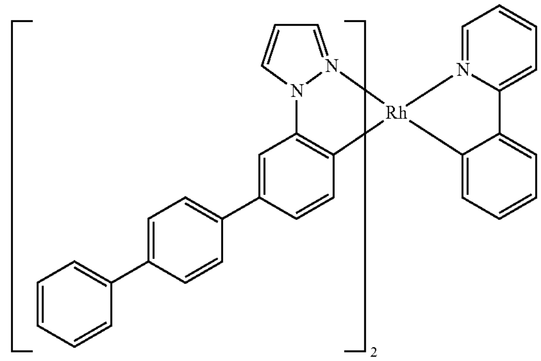

-continued
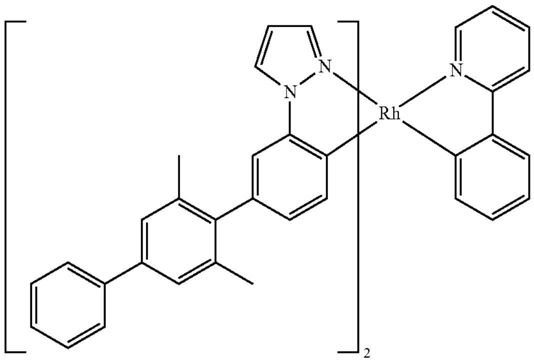
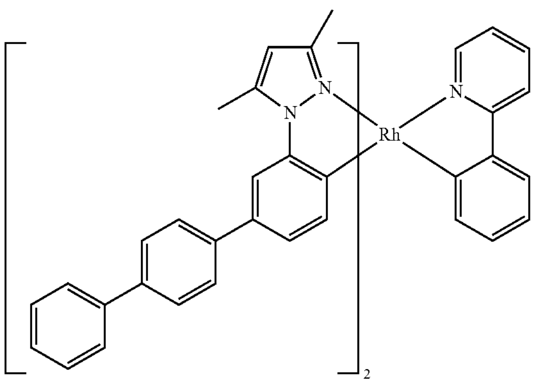
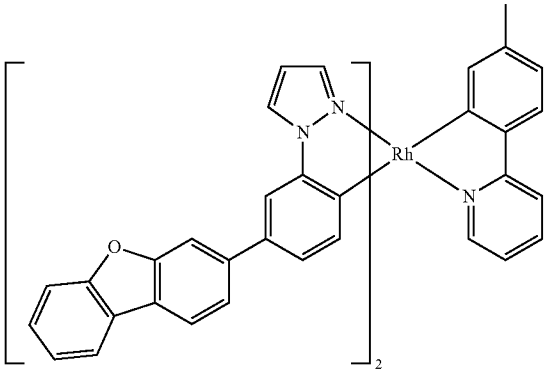
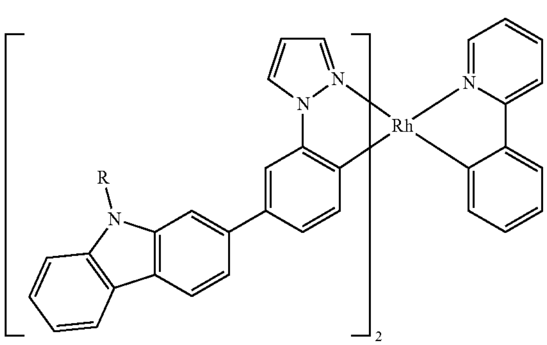
-continued
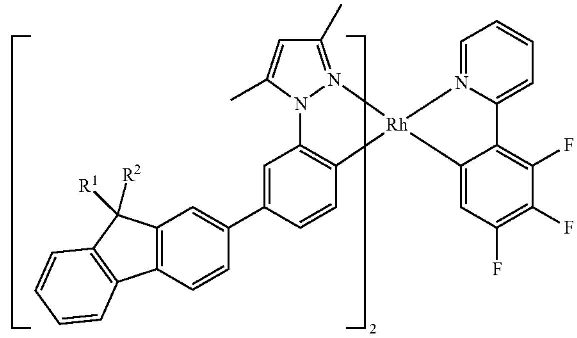
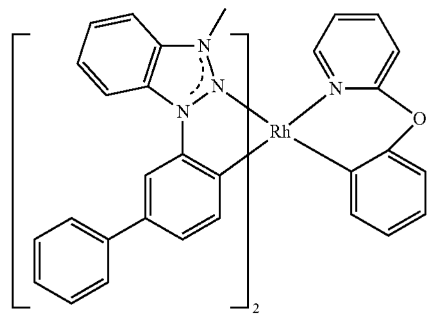
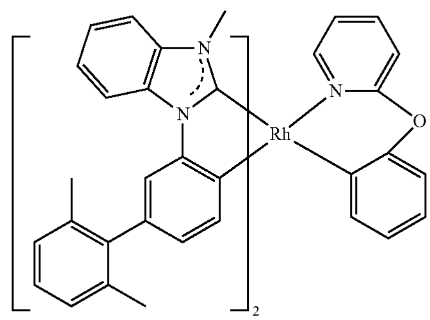
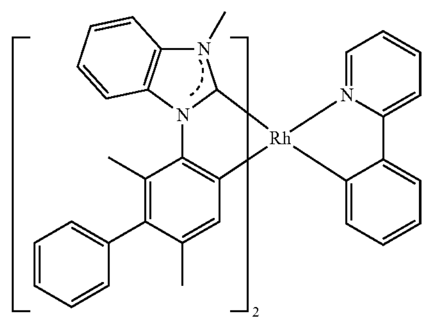
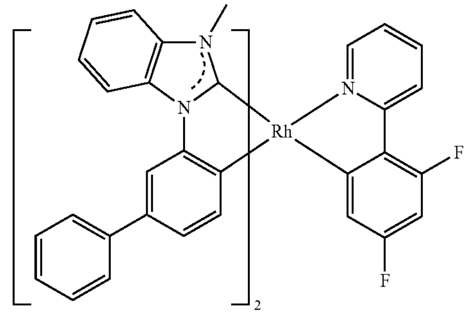

-continued
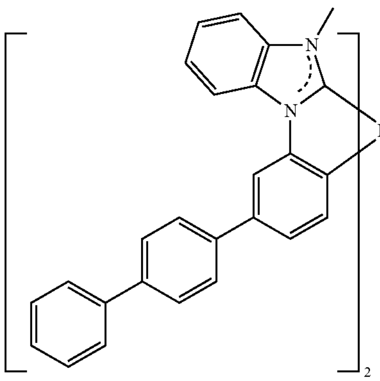
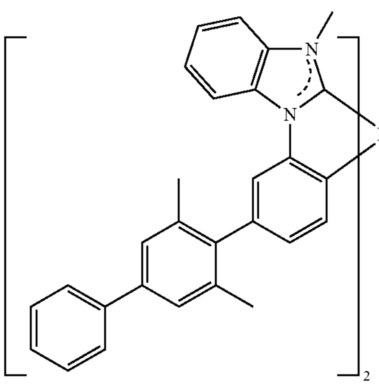
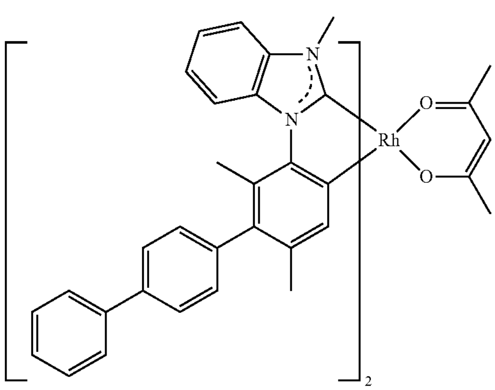
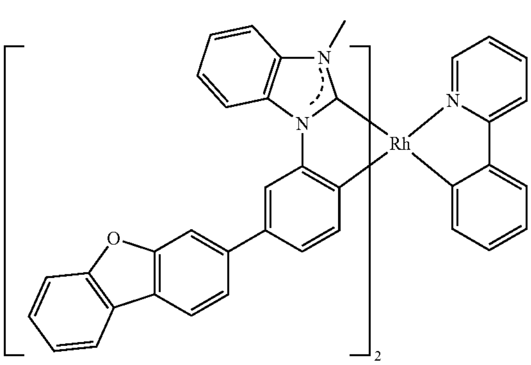
-continued
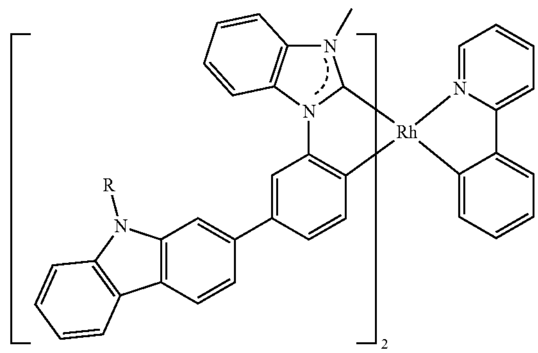
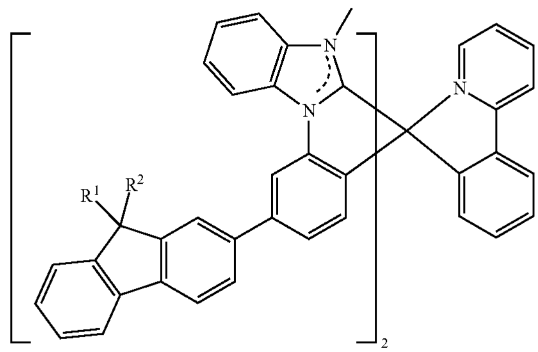
Structures Rh-23
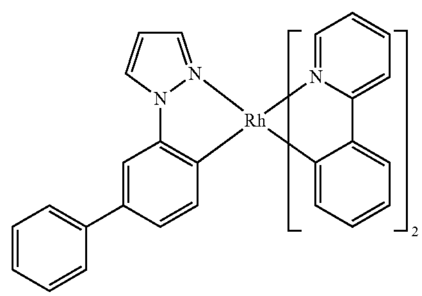
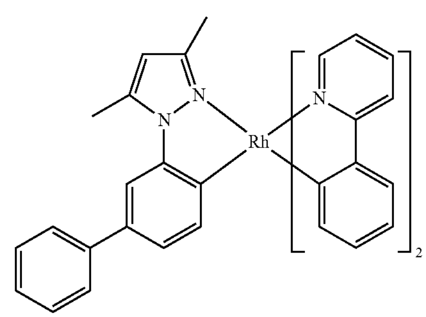
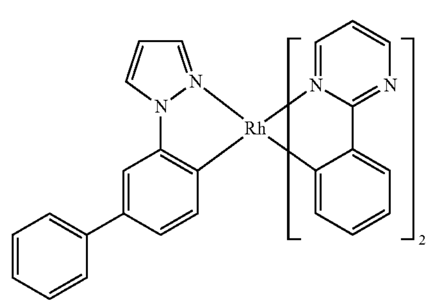

-continued
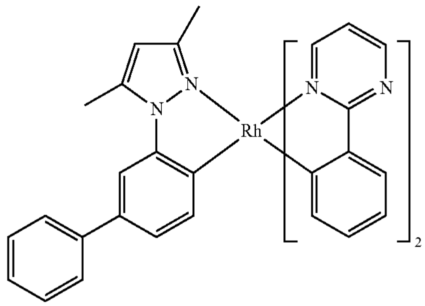
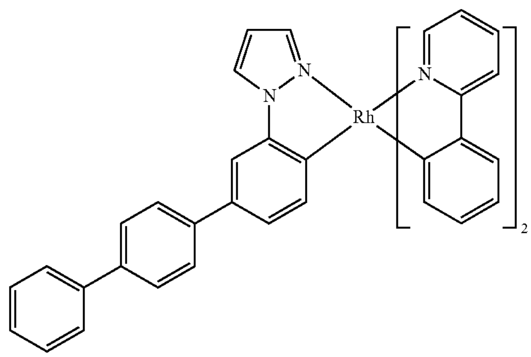
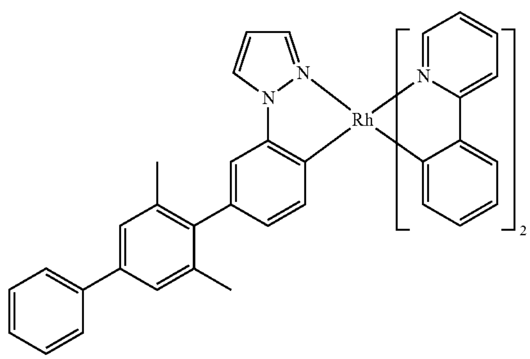
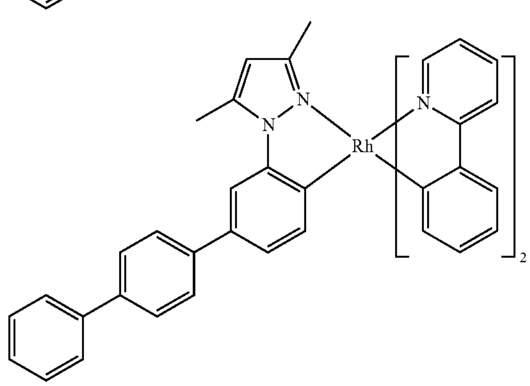
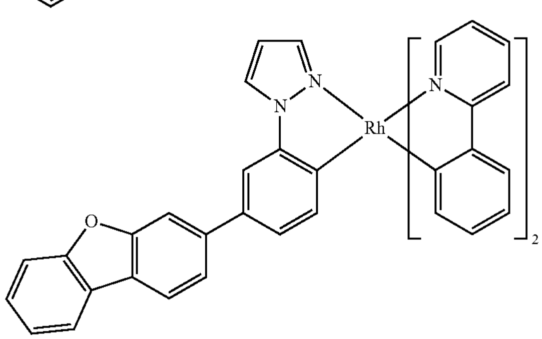
-continued
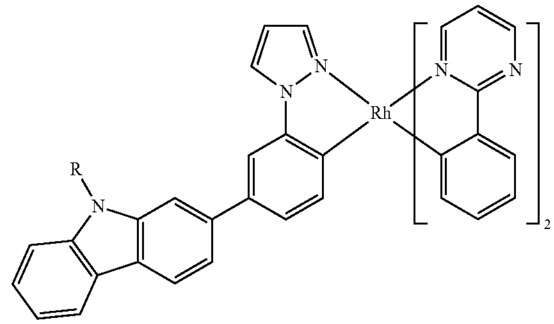
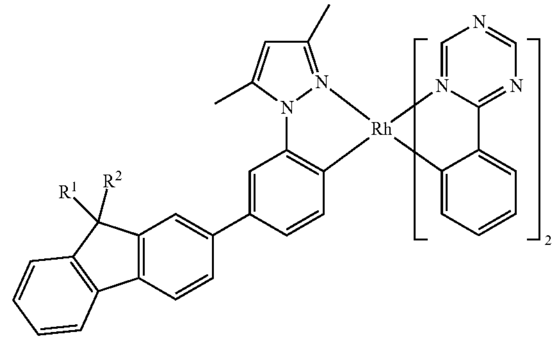
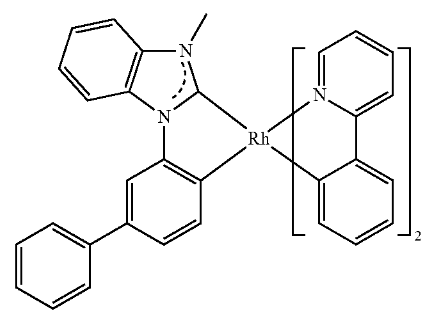
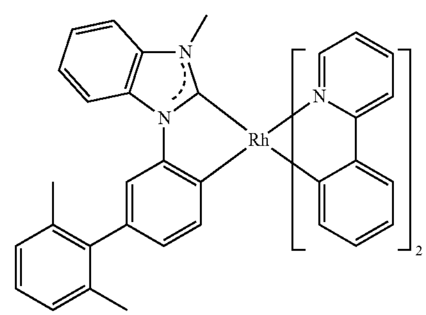
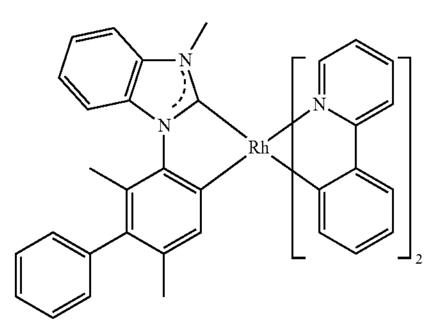

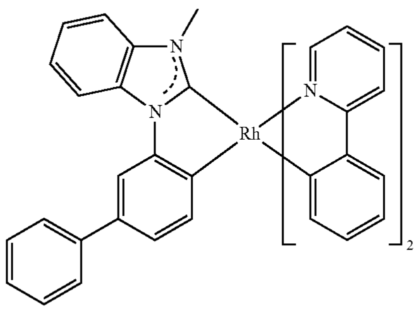
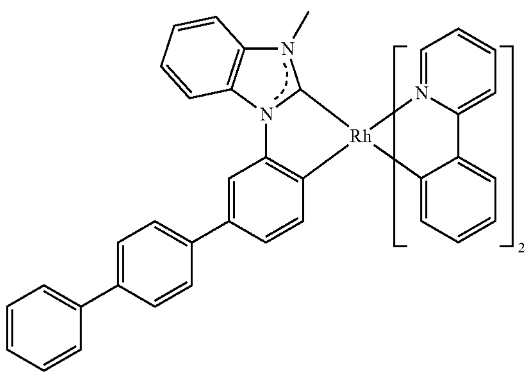
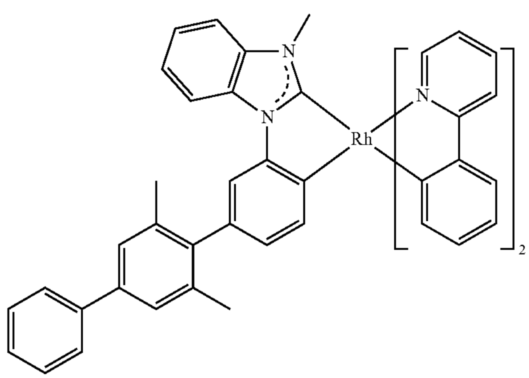
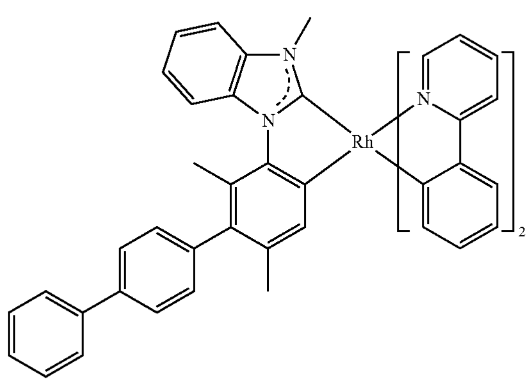
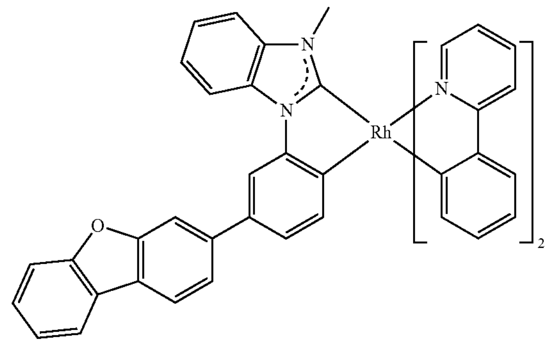
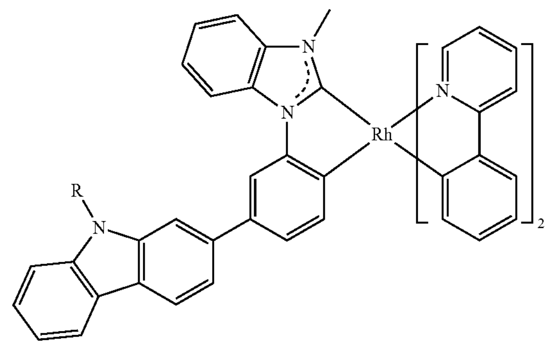
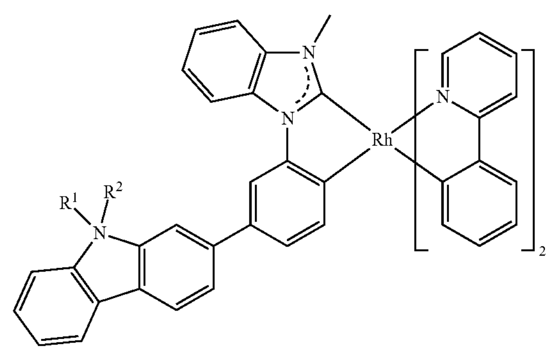
Structures Rh-24
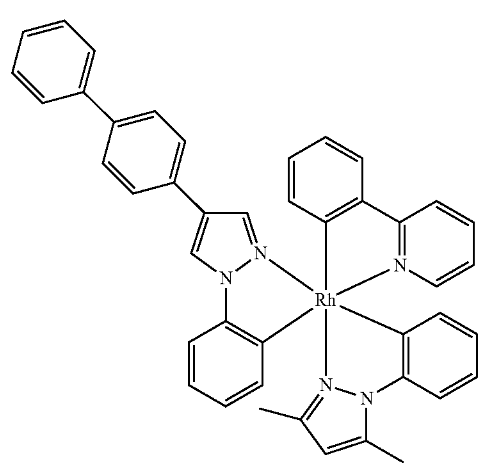

-continued
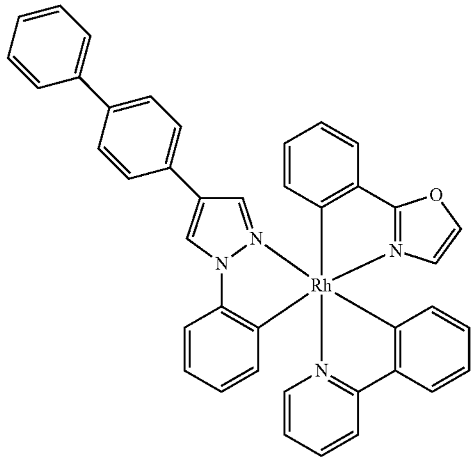
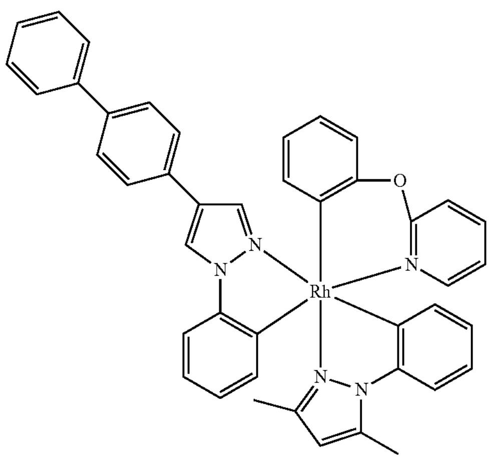
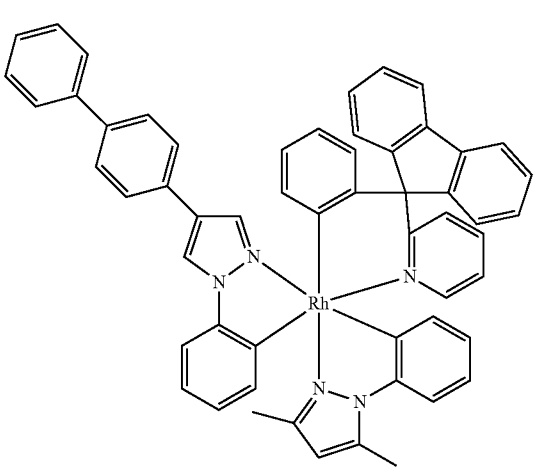
-continued
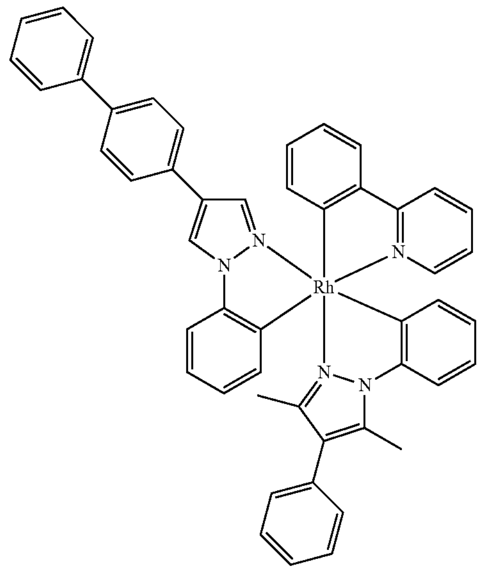
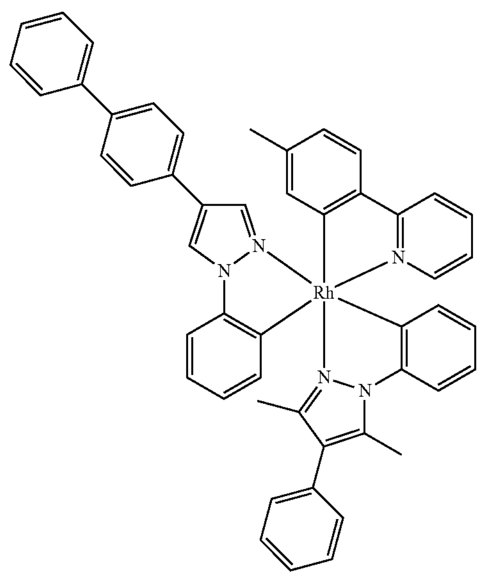
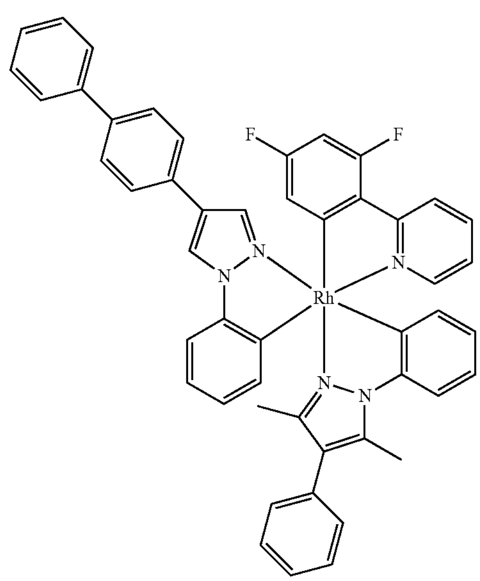

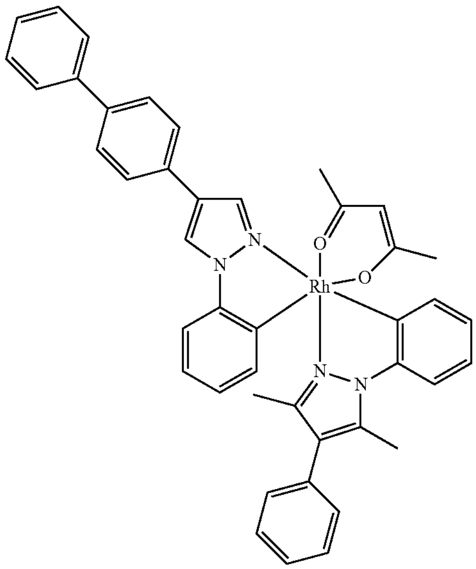
N
N
O
O
Rh
N
N
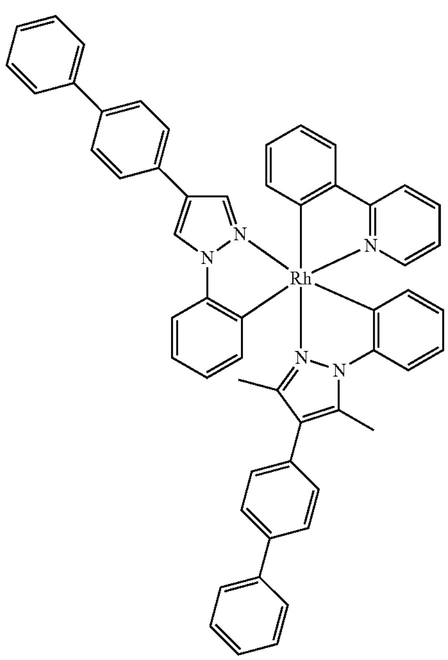
N
N
N
Rh
N
N
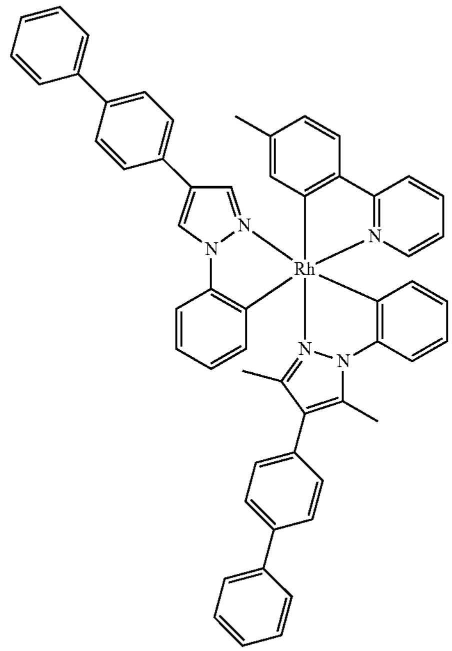
N
N
N
Rh
N
N
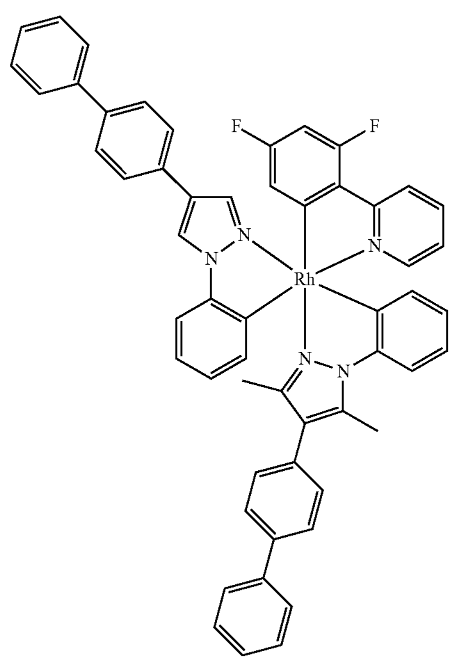
F
F
N
N
N
Rh
N
N -continued
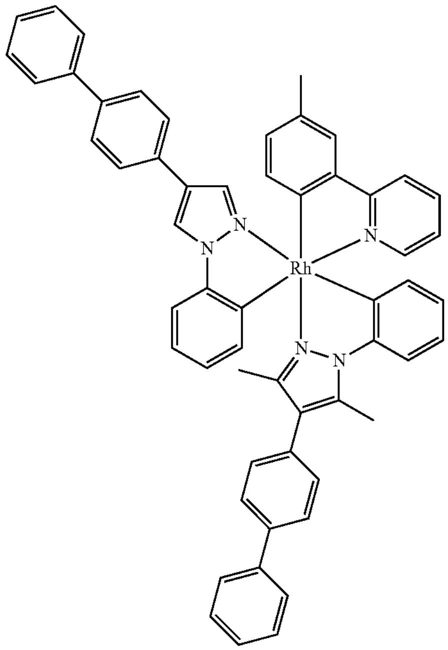
-continued
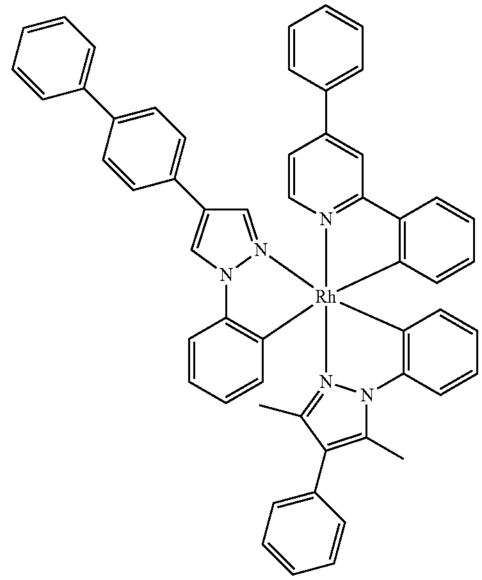
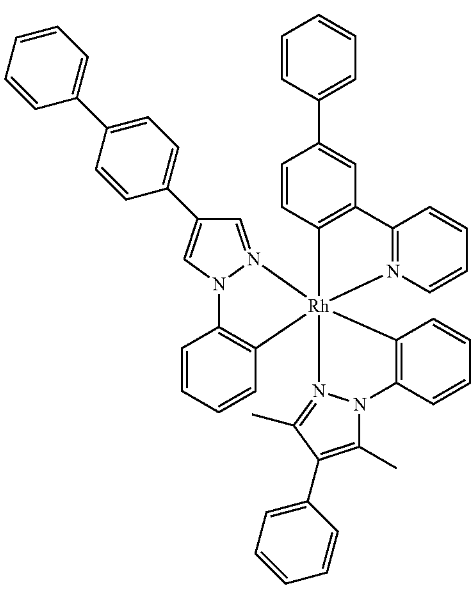
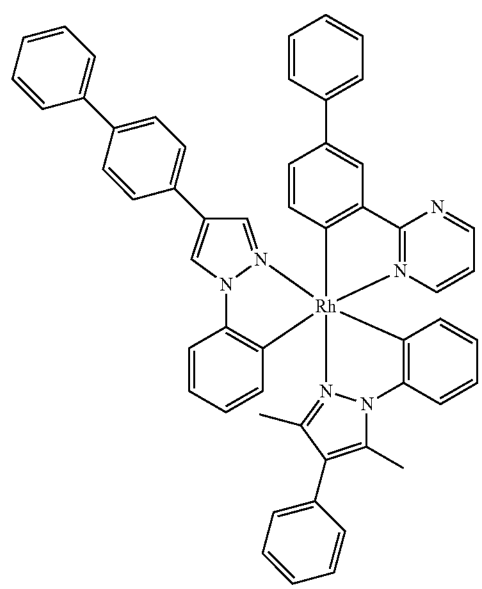

-continued
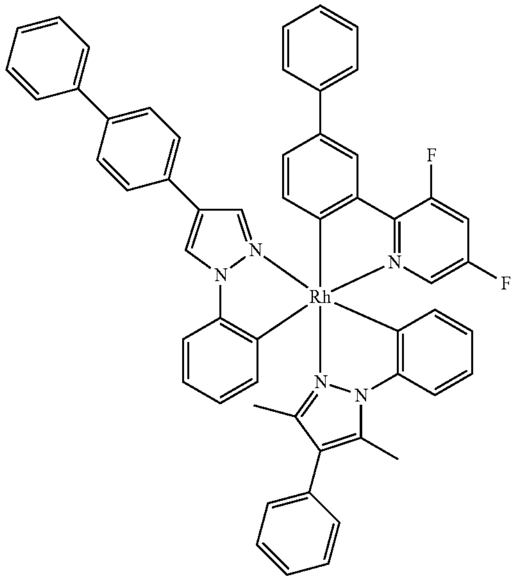
-continued
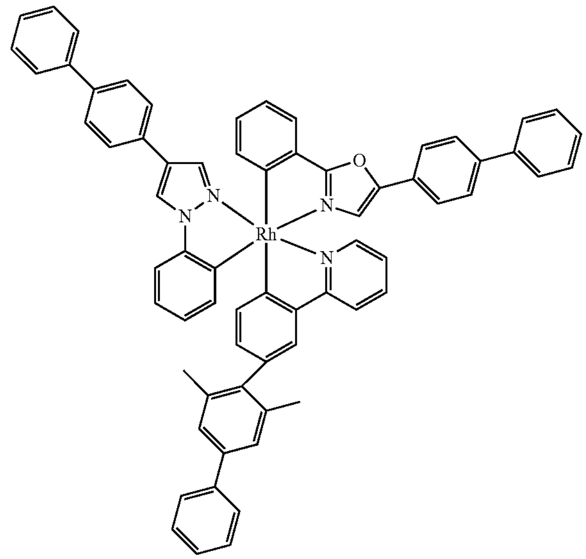
Structures Rh-25
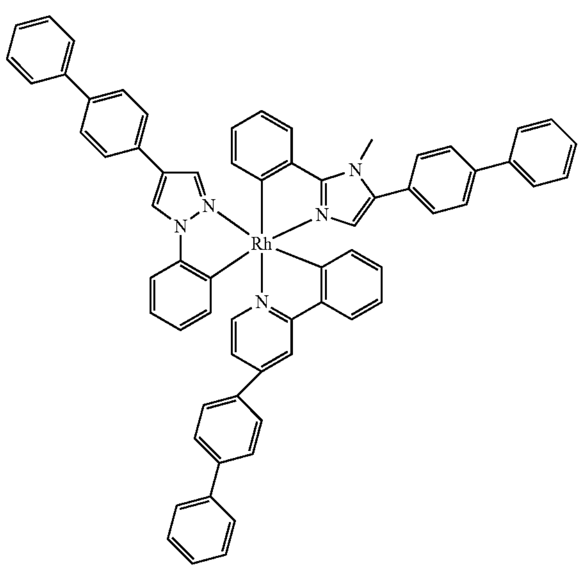
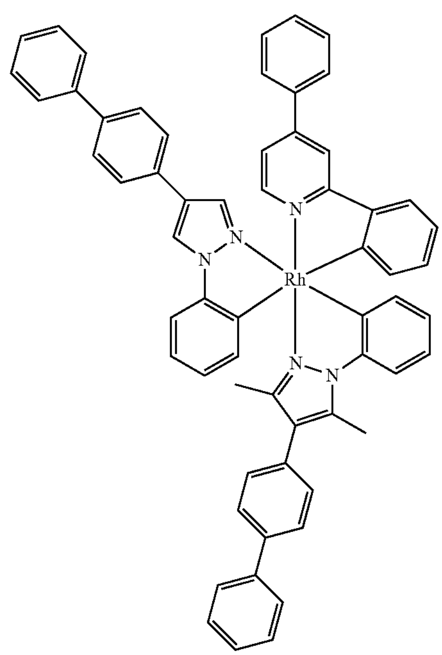

-continued
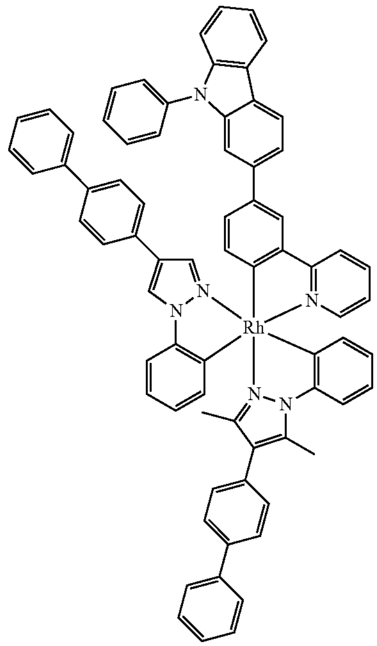
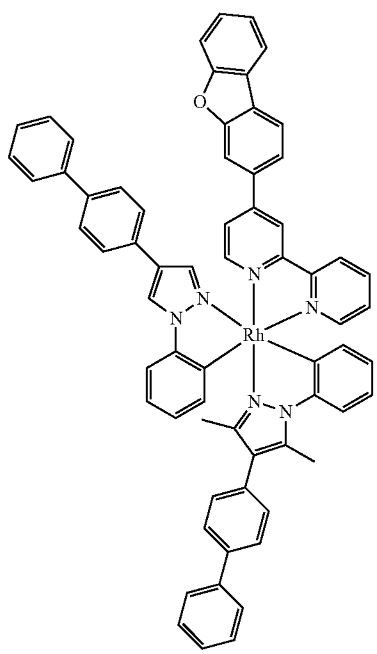
-continued
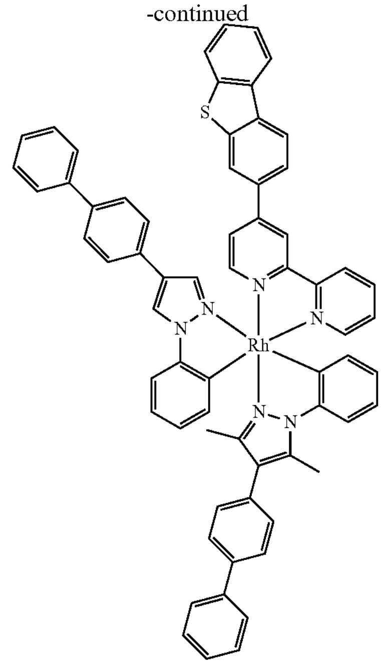
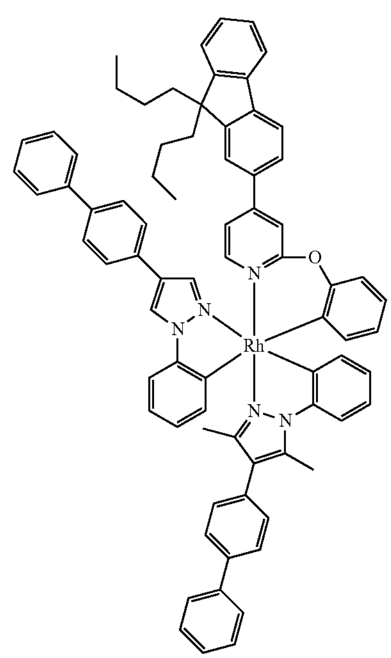

-continued
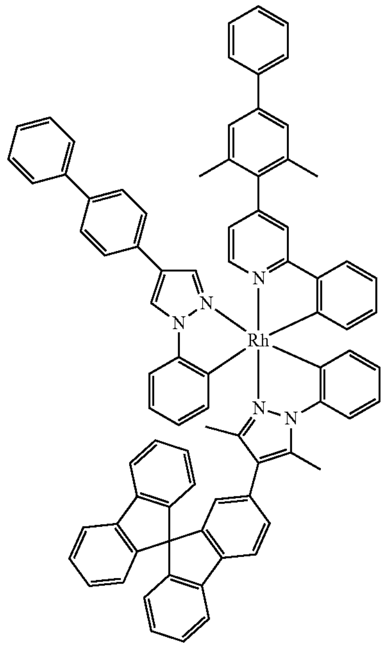
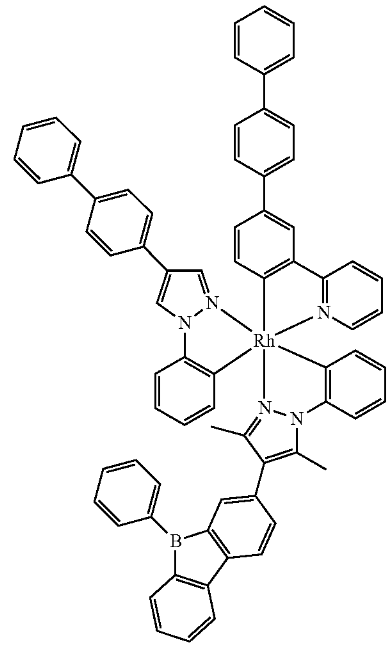
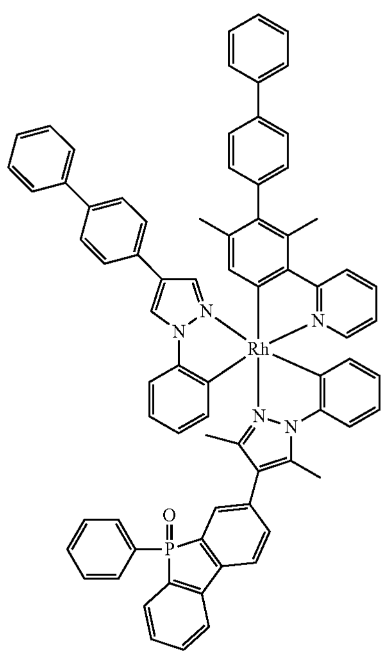
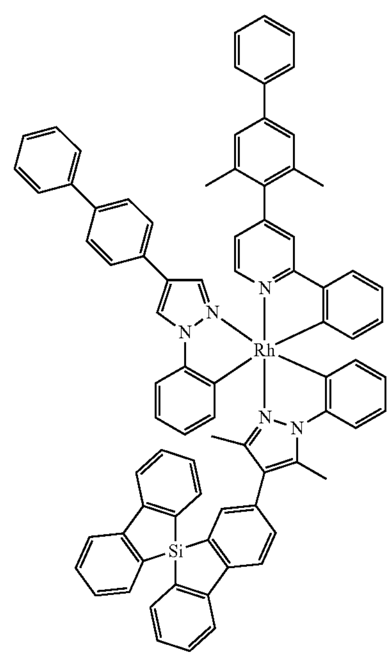

Structures Pt-1
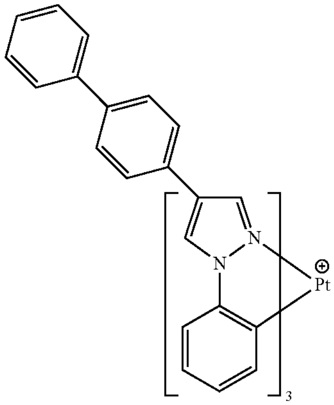
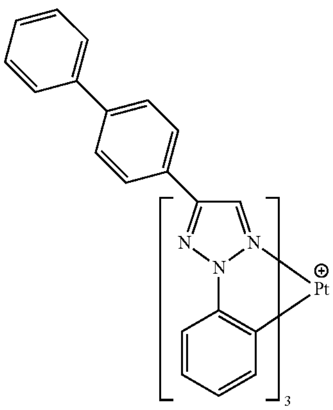
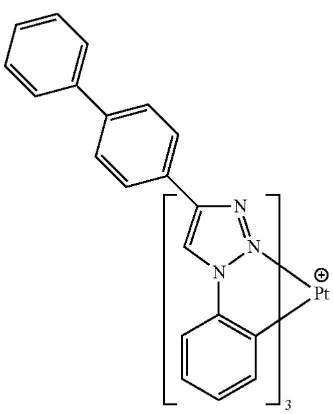
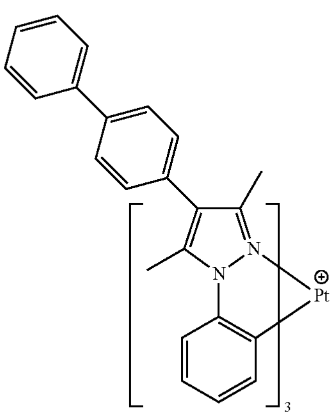
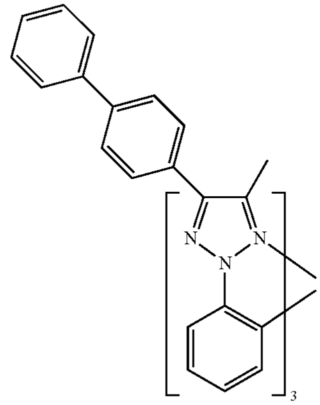
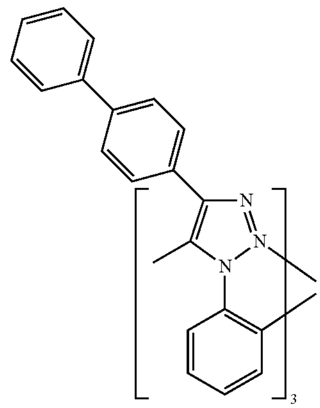
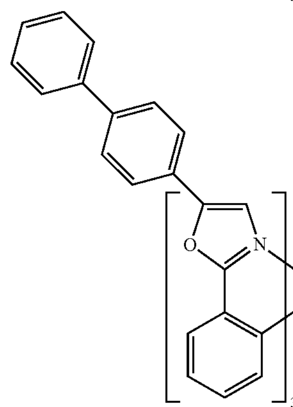
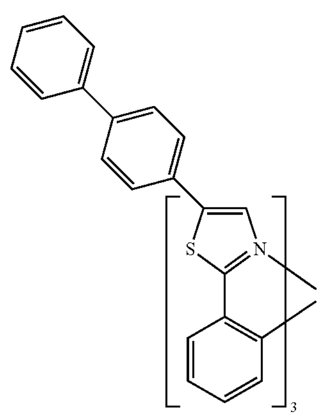

-continued
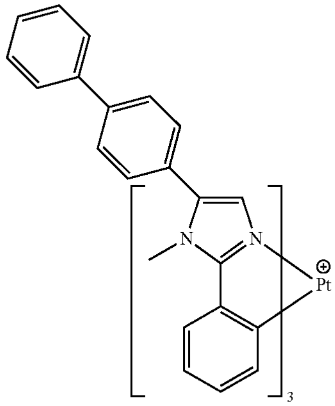
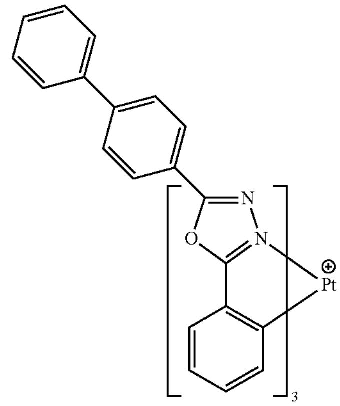
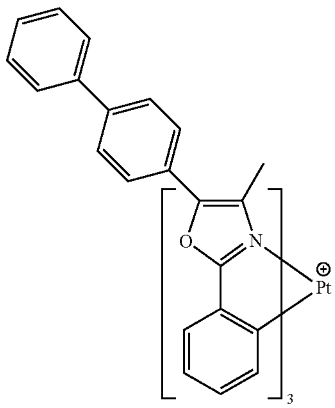
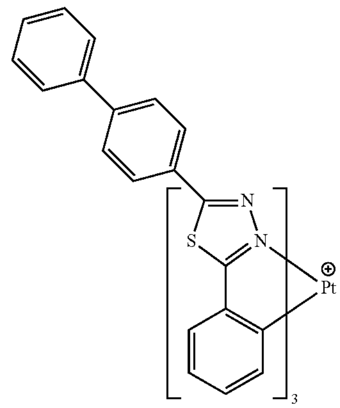
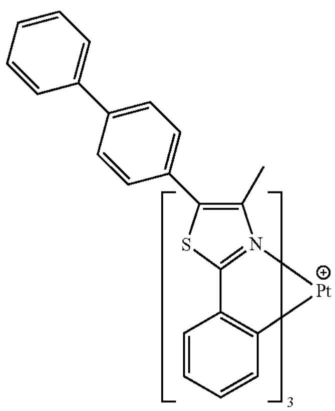
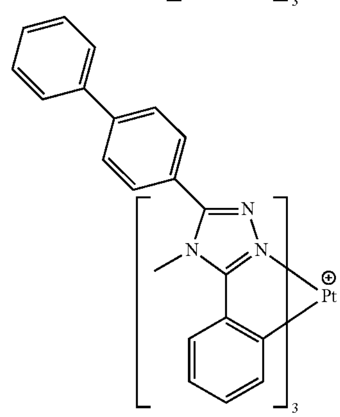
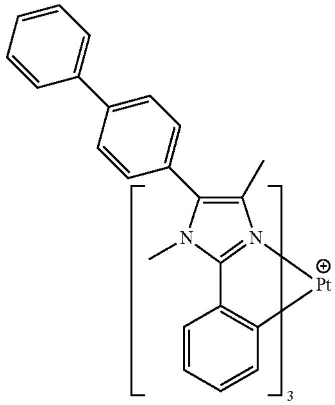
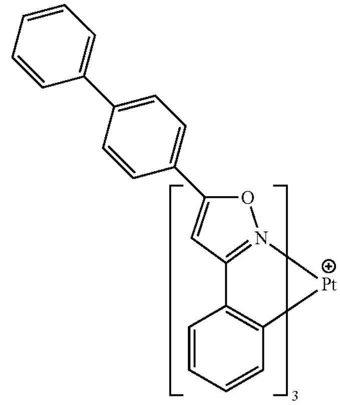

-continued
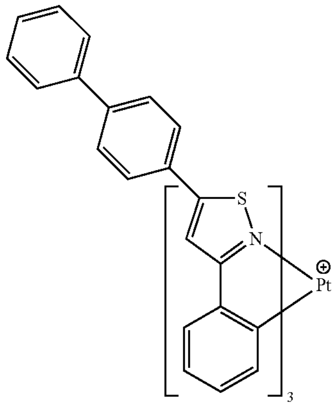
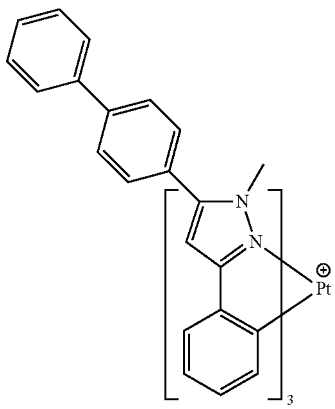
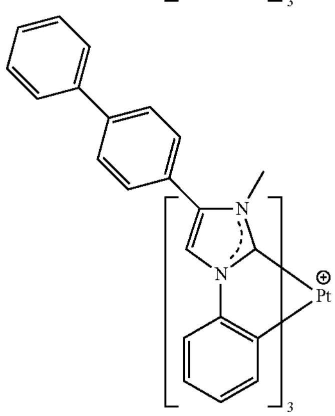
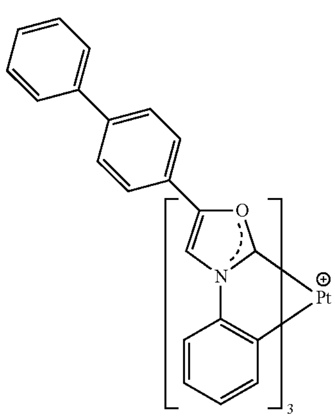
-continued
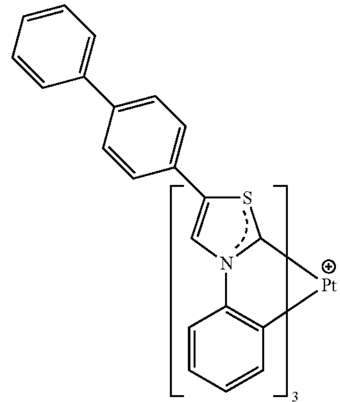
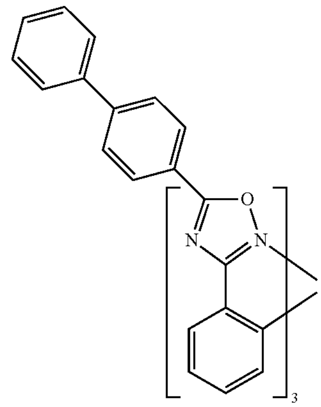
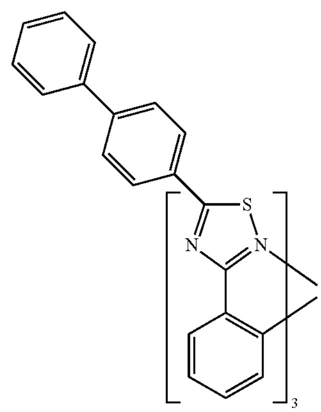
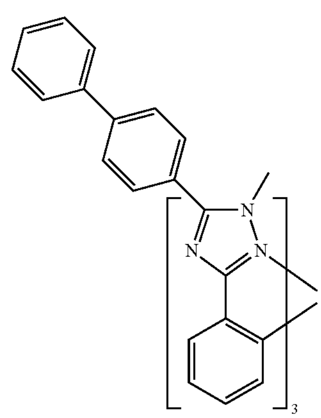

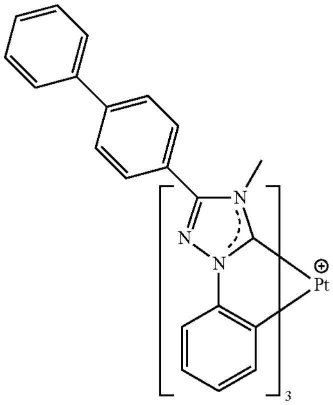
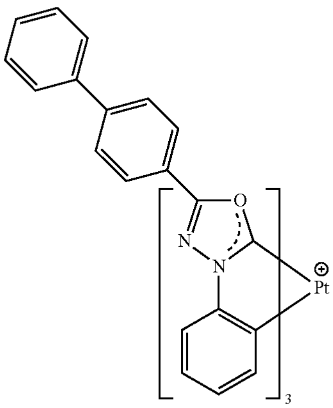
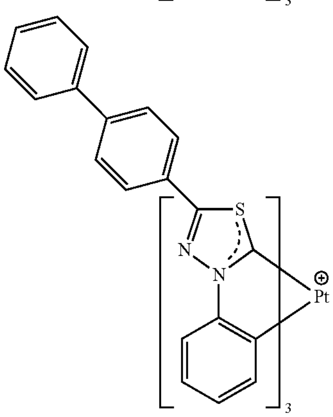
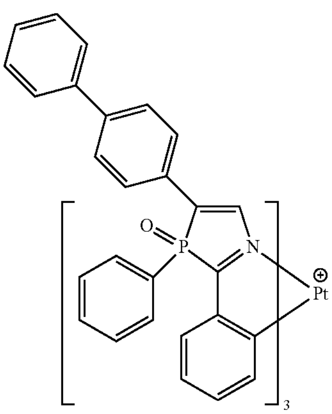
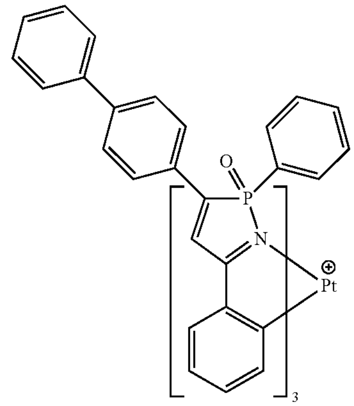
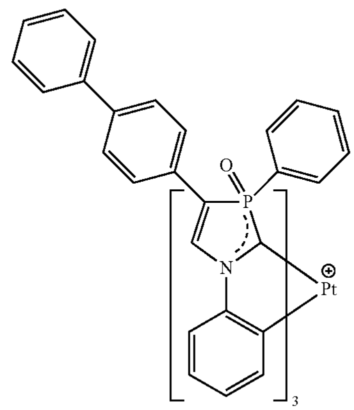
Structures Pt-2
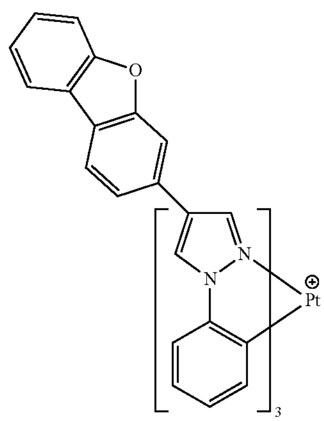
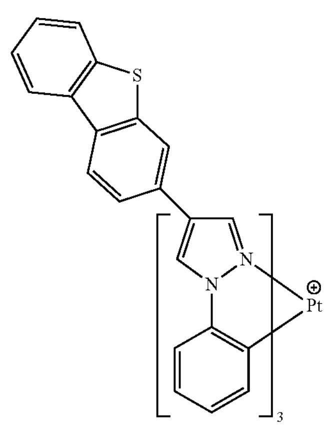

-continued
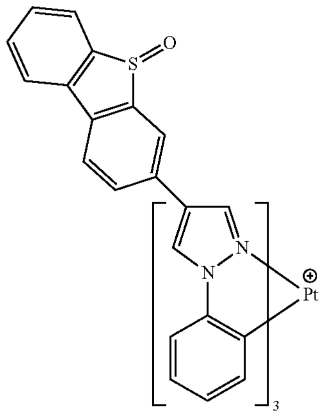
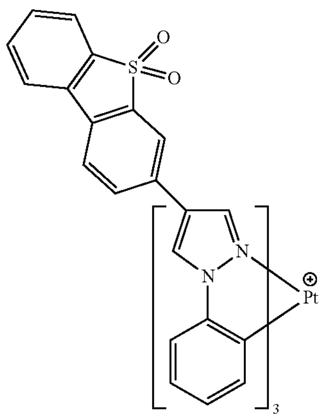
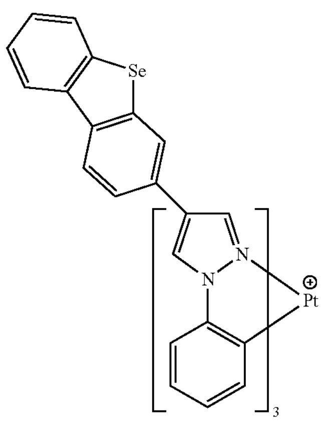
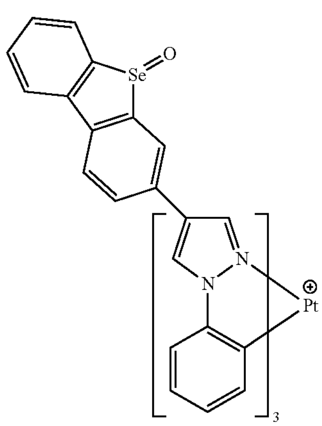
-continued
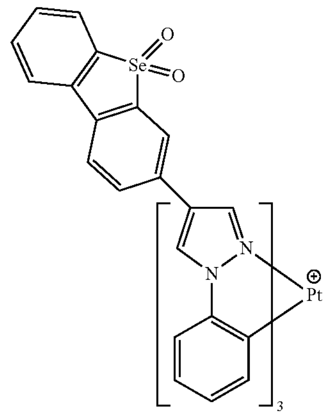
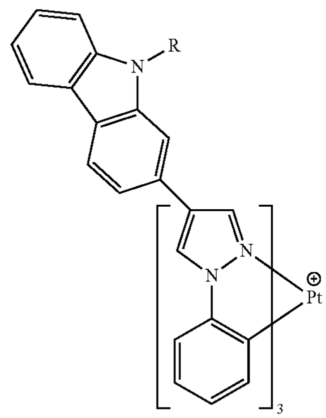
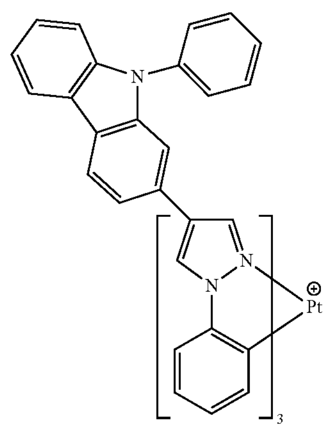
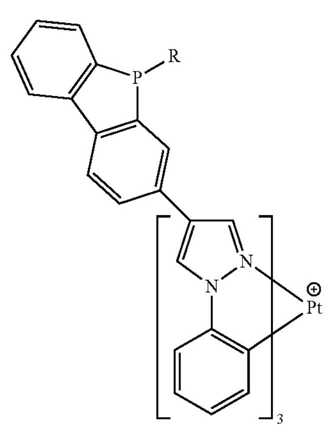

-continued
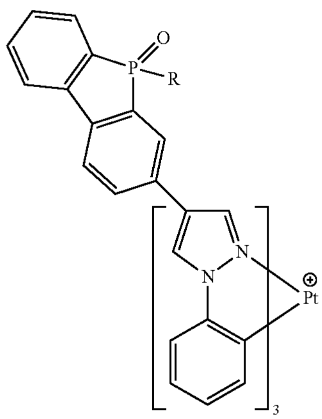
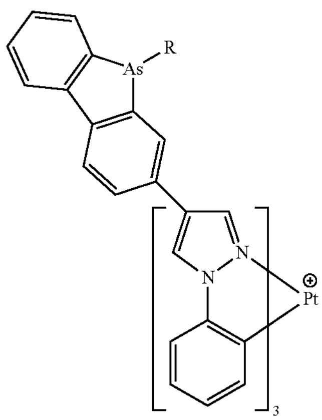
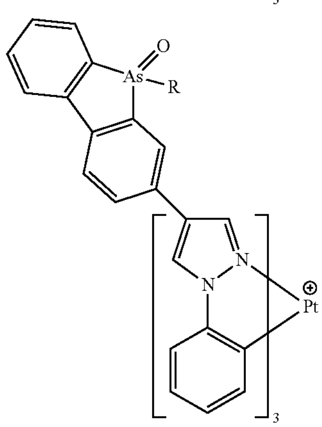
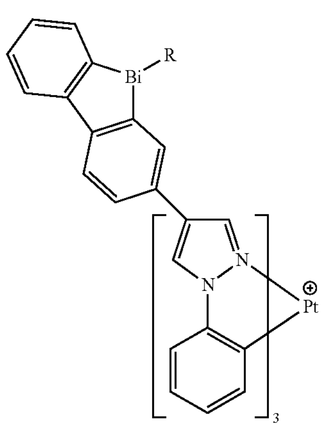
-continued
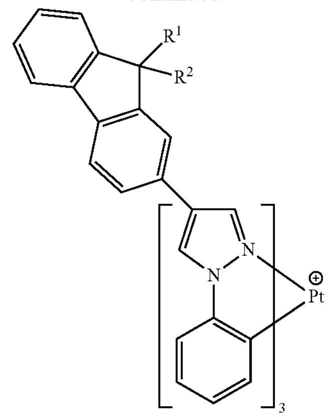
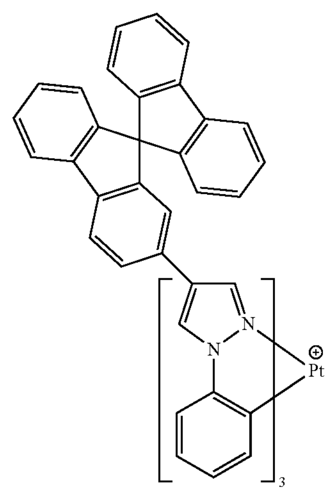
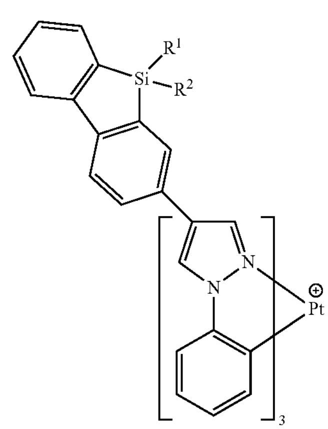

-continued
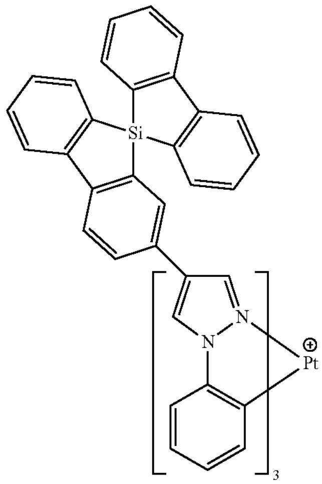
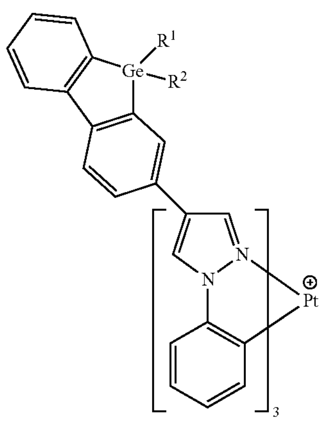
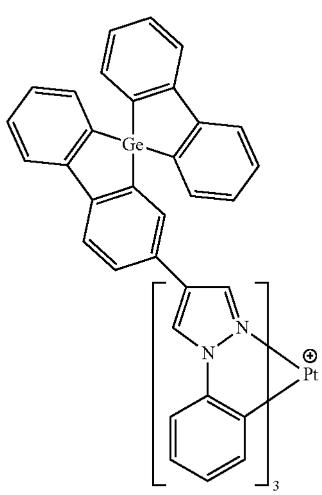
-continued
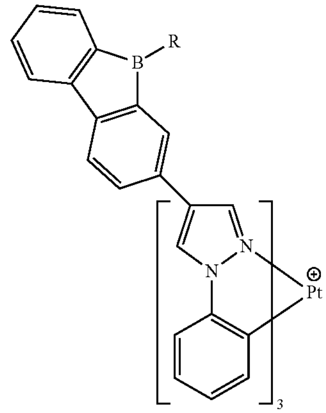
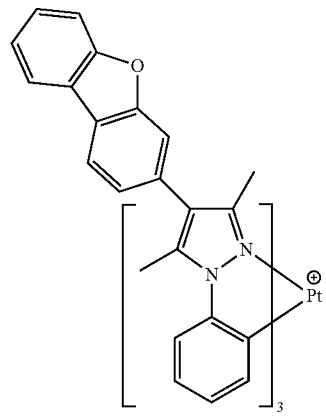
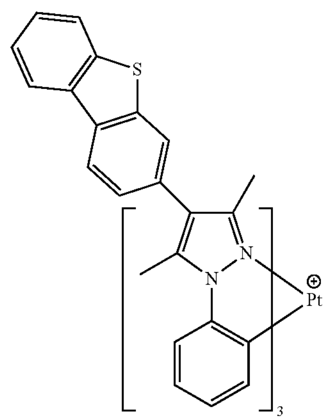
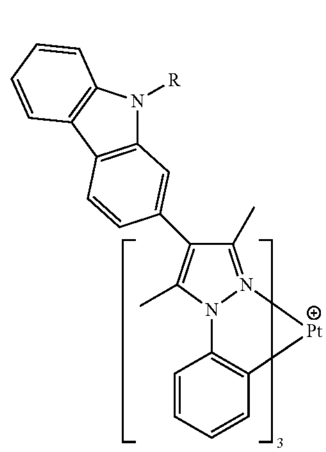

-continued
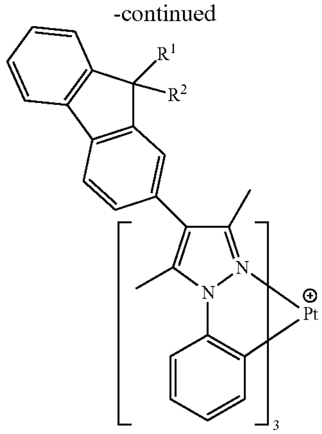
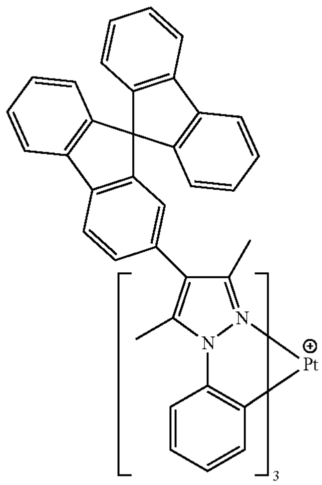
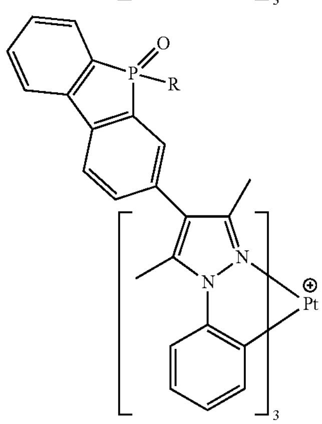
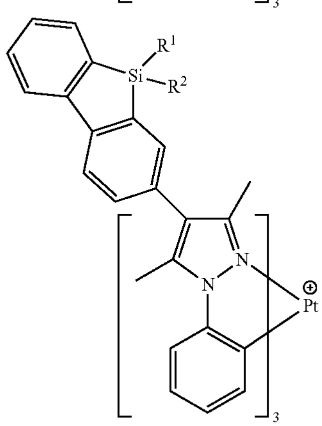
-continued
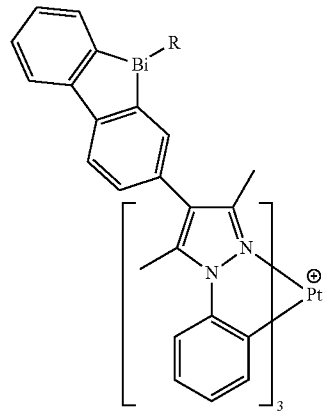
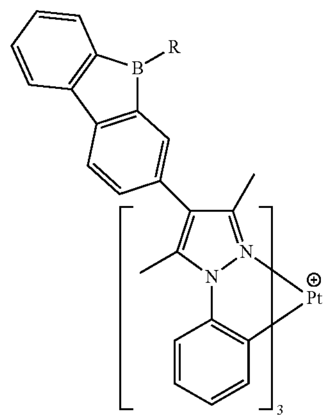
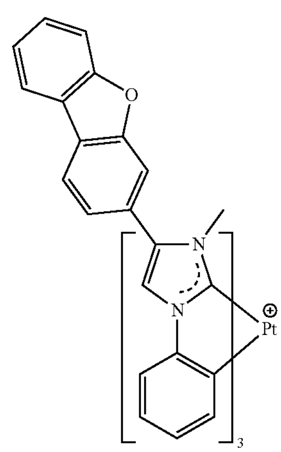
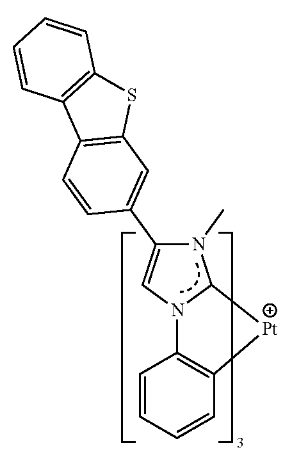

-continued
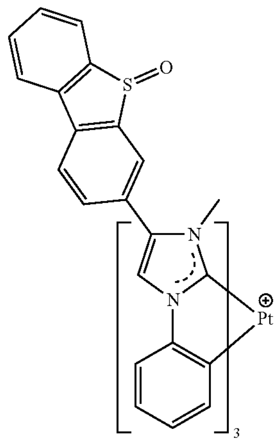
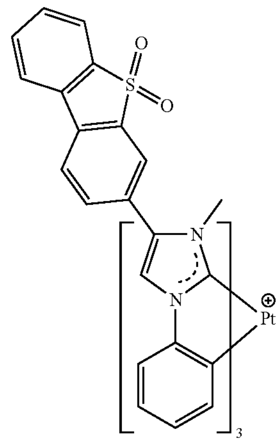
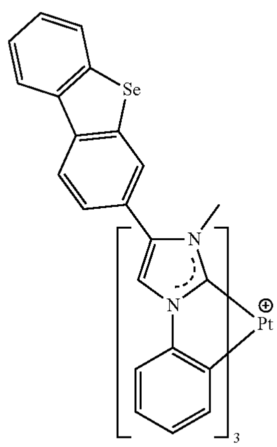
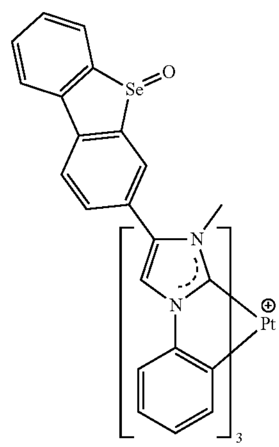
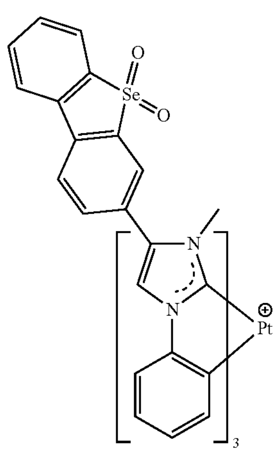
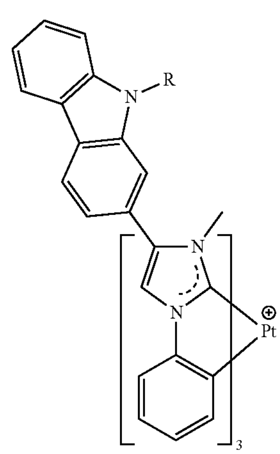
-continued
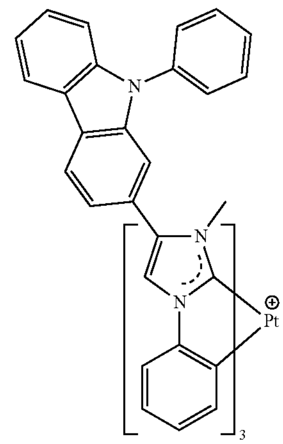
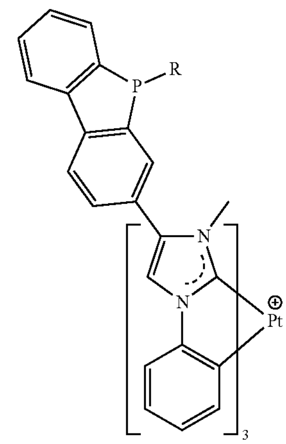
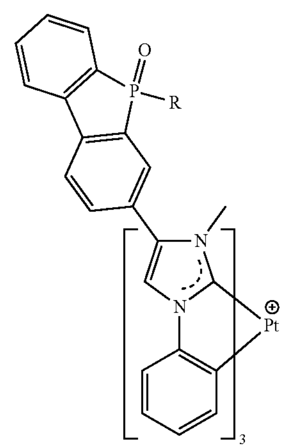
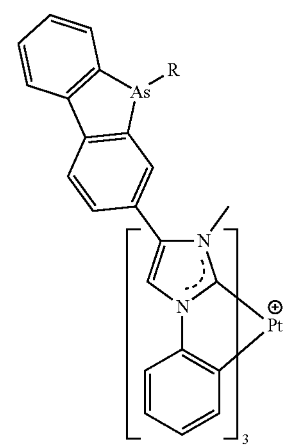
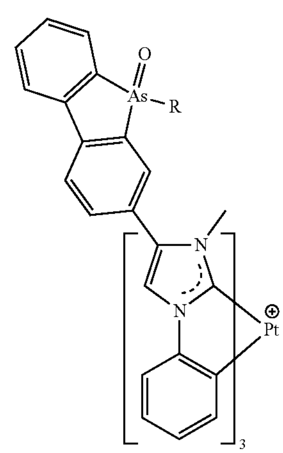
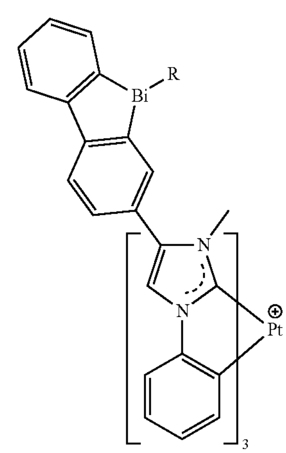

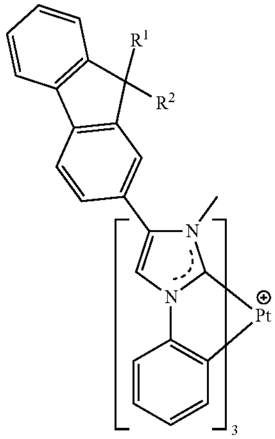
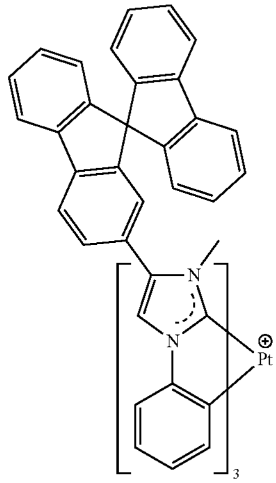
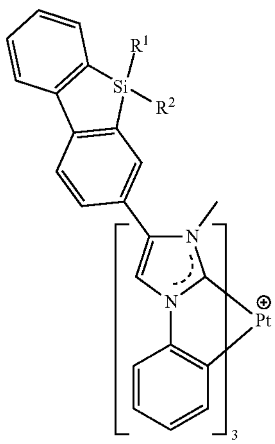
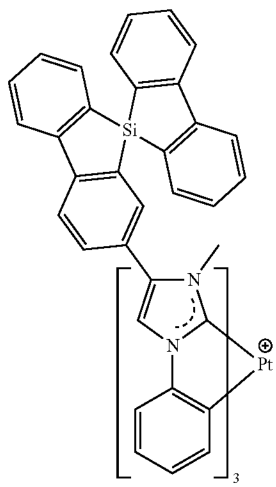
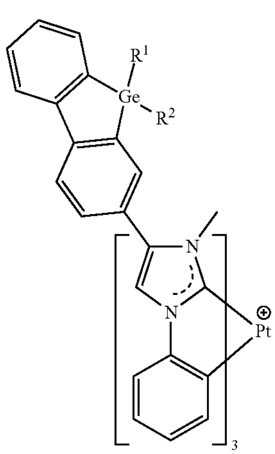
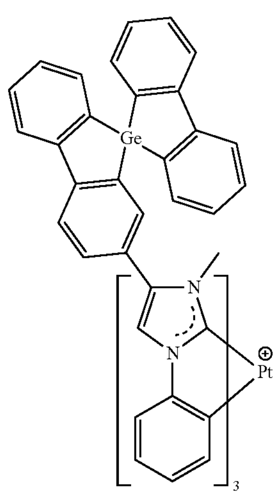
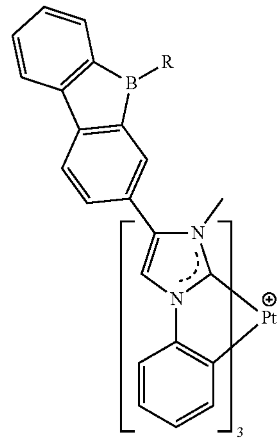
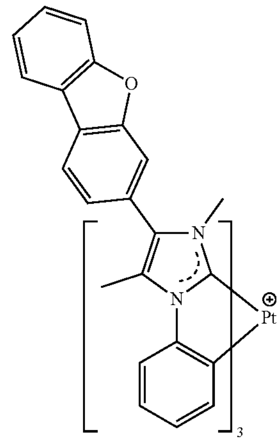
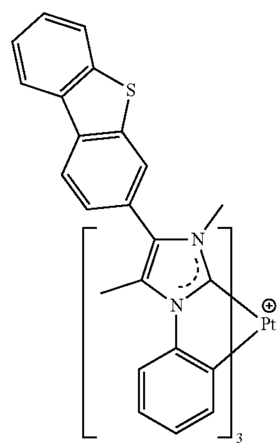
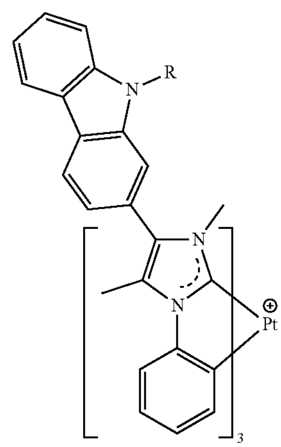
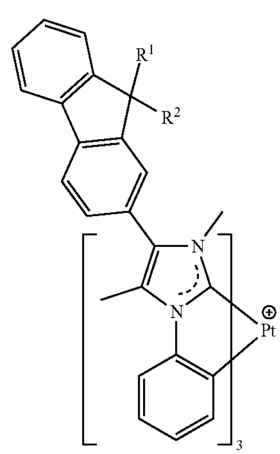
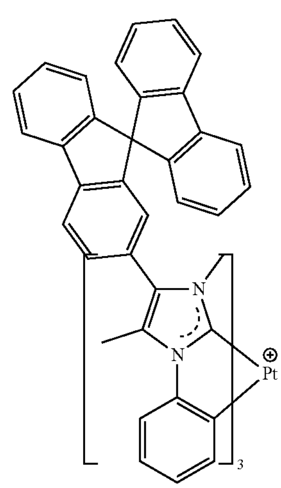

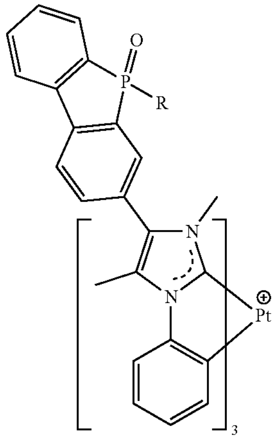
O
P
R
N
N
Pt
3
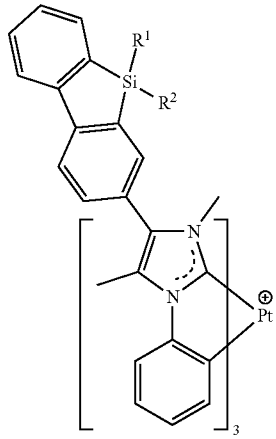
R1
Si
R2
N
N
Pt
3
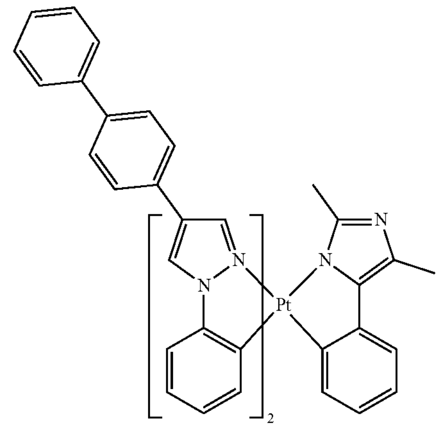
N
N
N
N
Pt
2
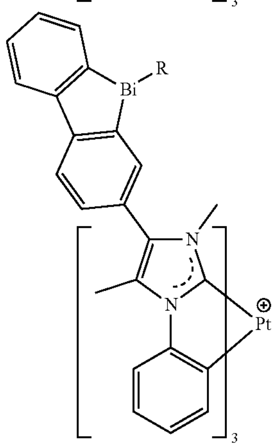
Bi
R
N
N
Pt
3
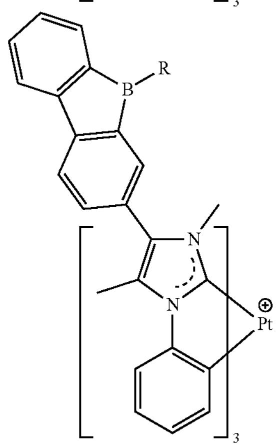
B
R
N
N
Pt
3
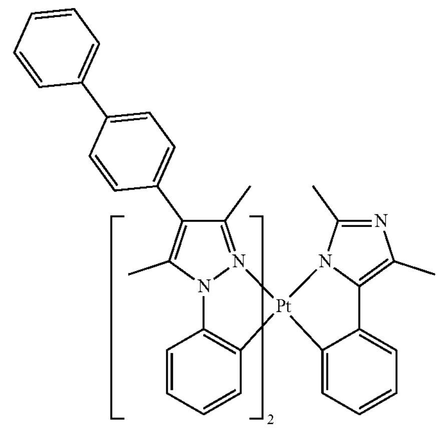
N
N
N
N
Pt
2
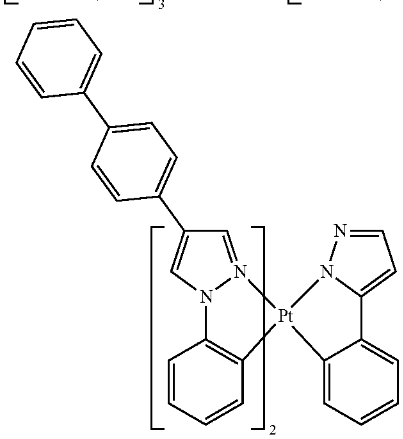
N
N
N
N
Pt
2
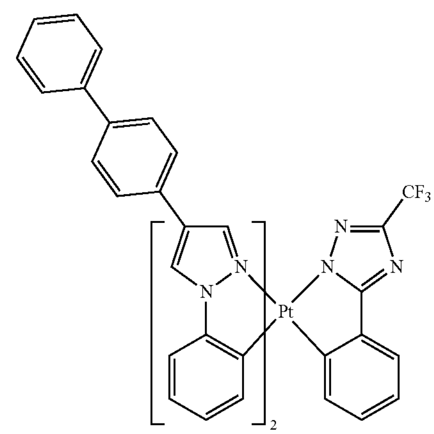
CF3
N
N
N
N
N
Pt
2
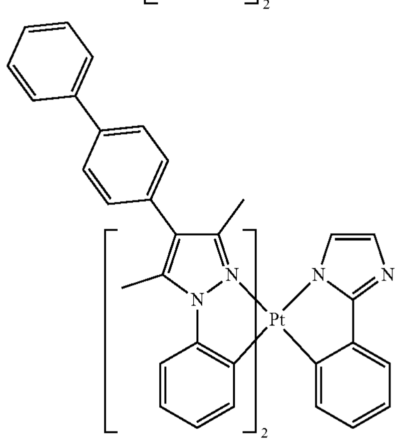
N
N
N
N
Pt
2
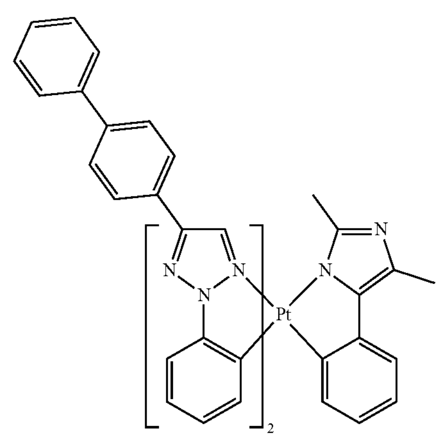
N
N
N
N
N
Pt
2

-continued
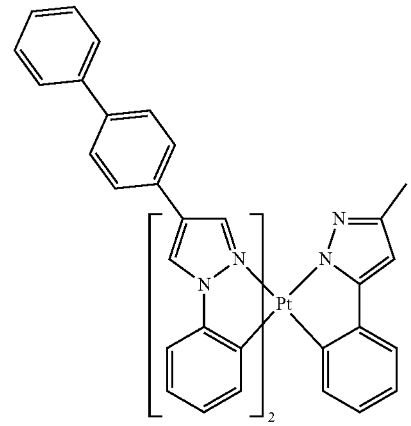
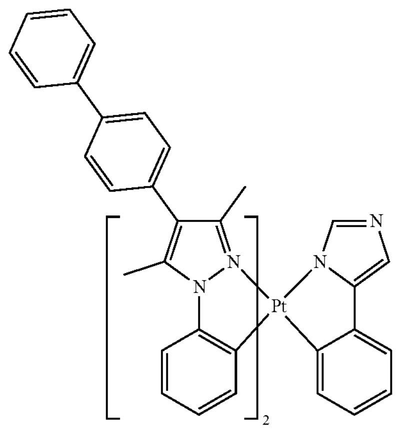
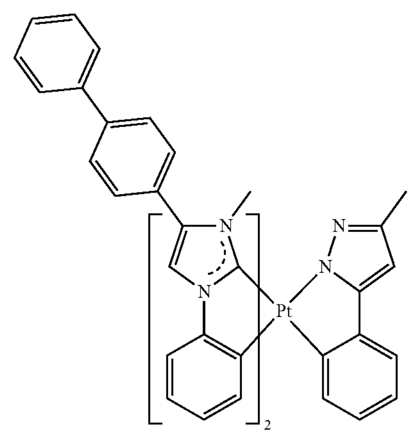
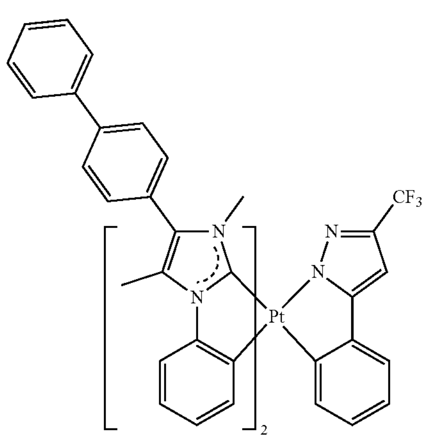
-continued
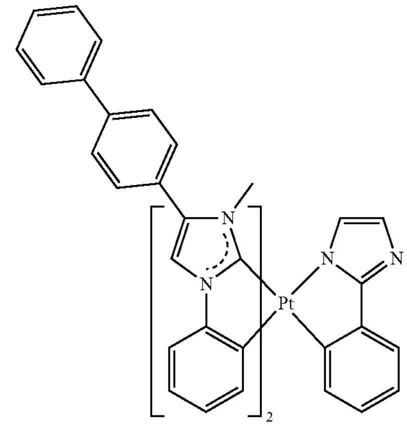
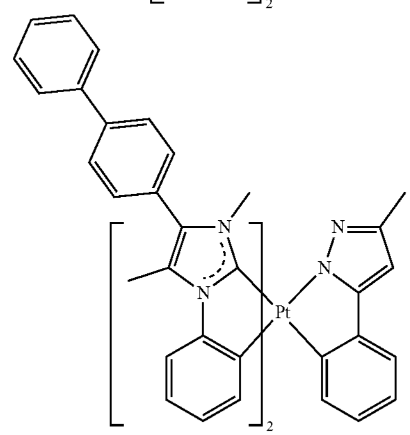
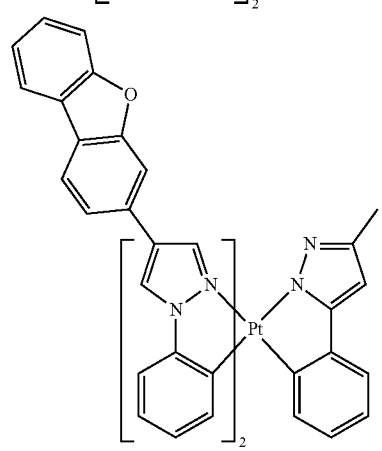
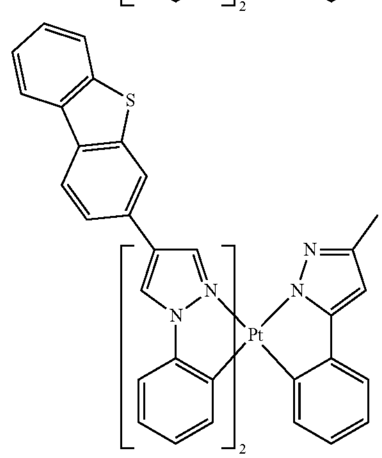

-continued
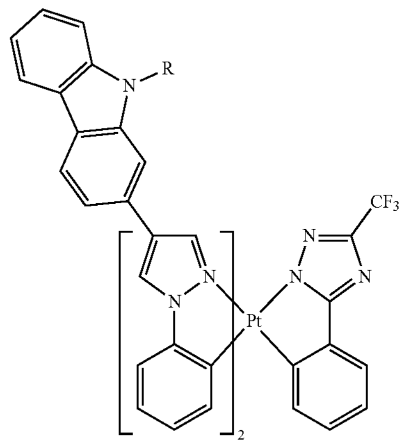
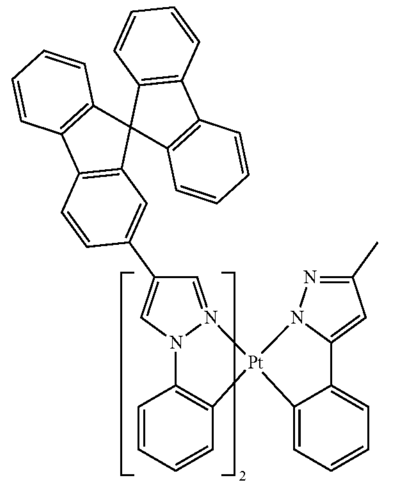
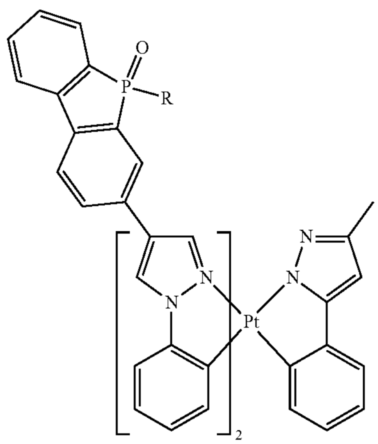
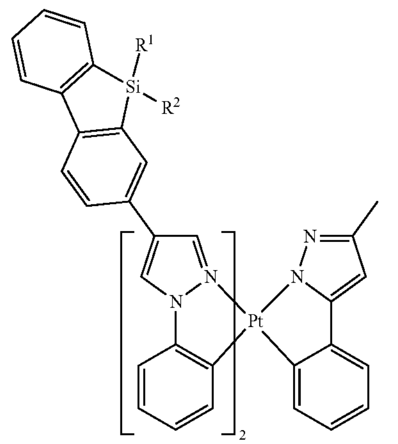
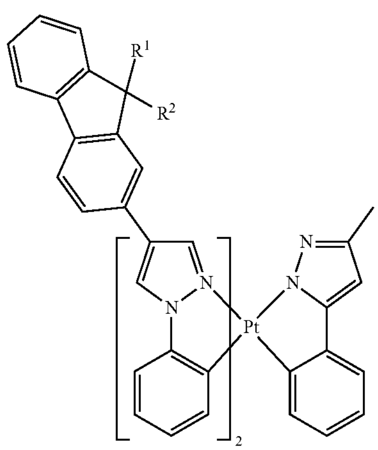
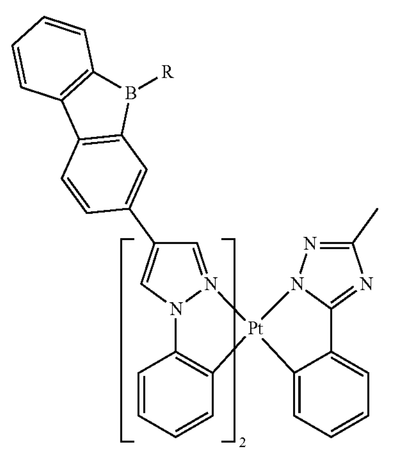

-continued
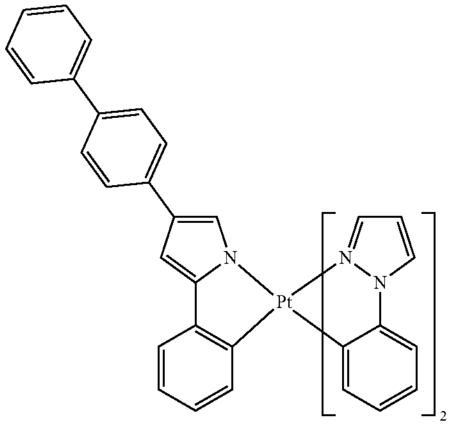
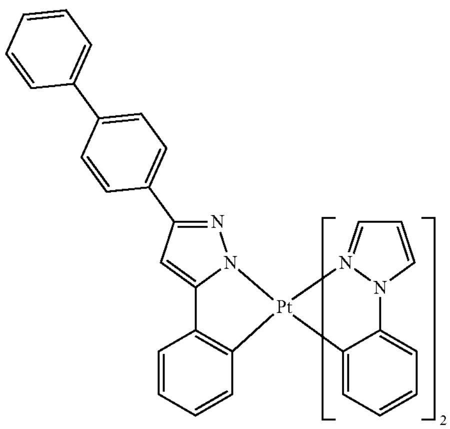
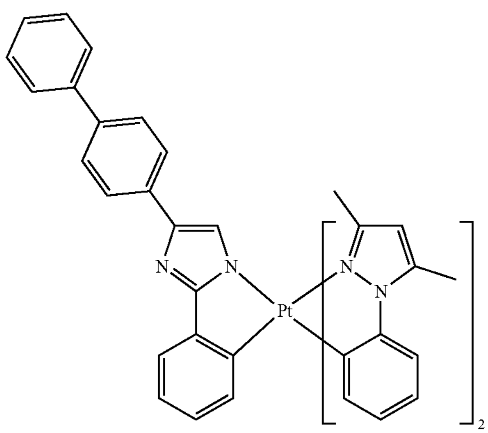
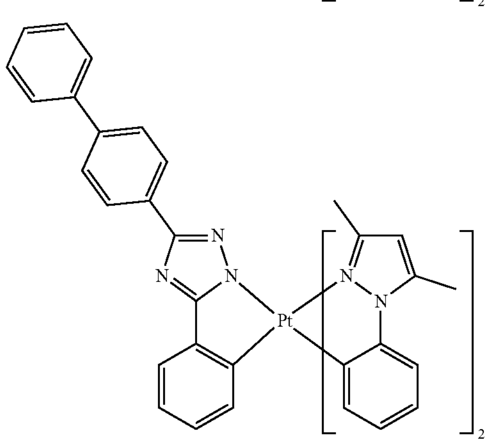
-continued
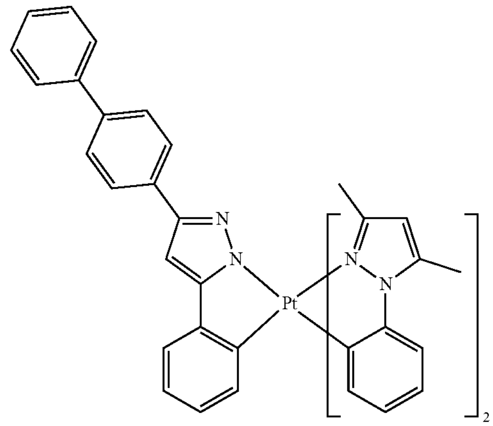
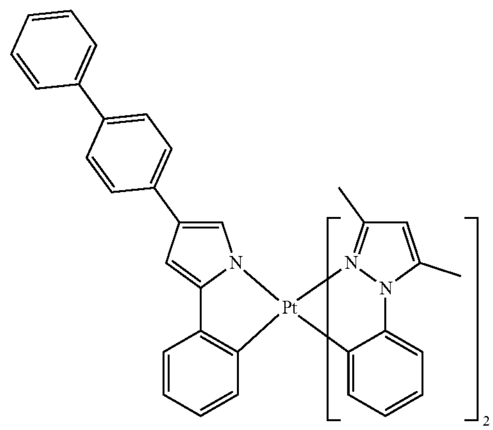
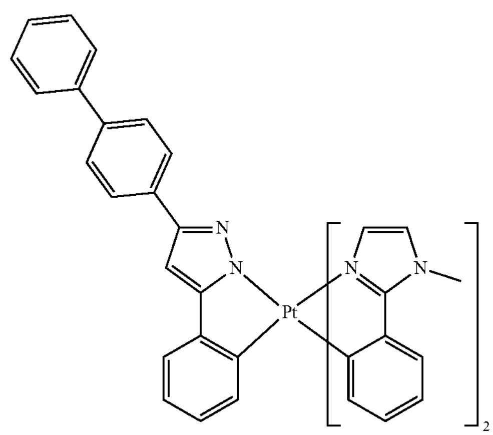
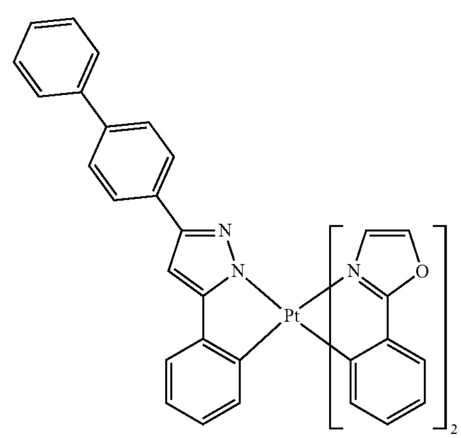

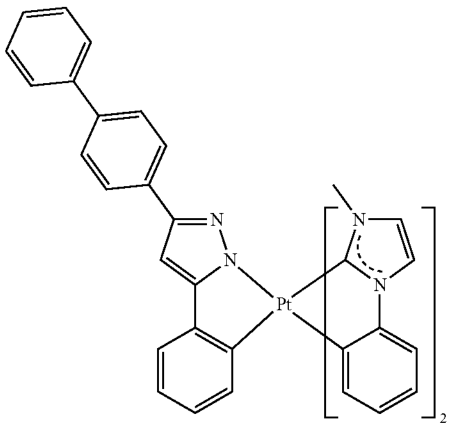
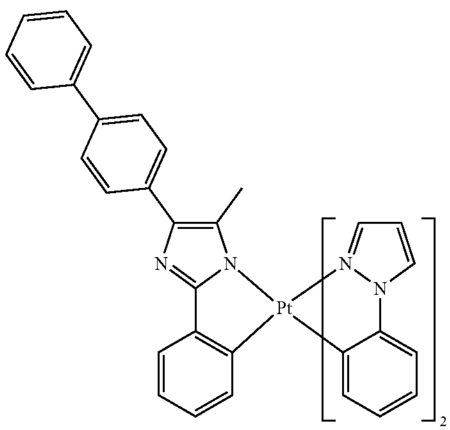
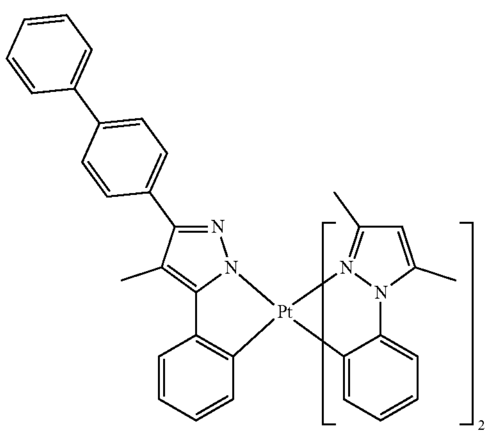
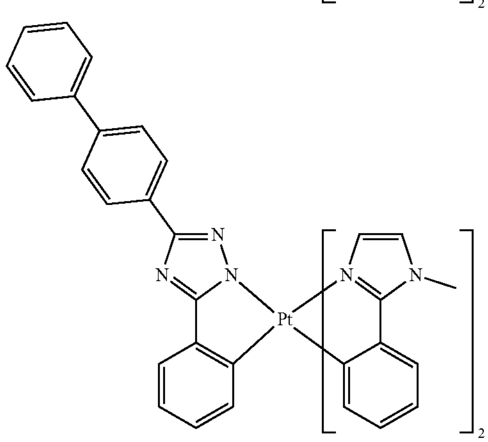
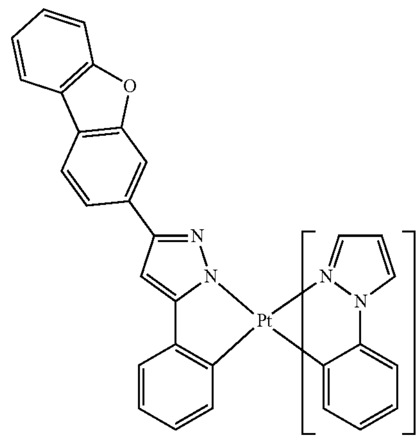
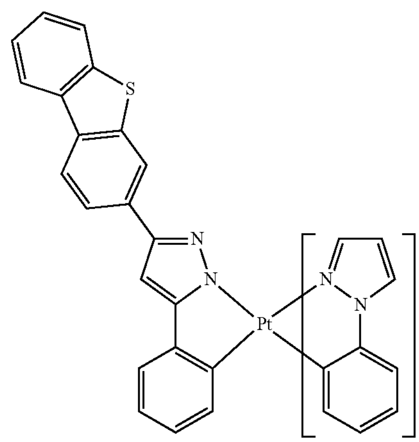
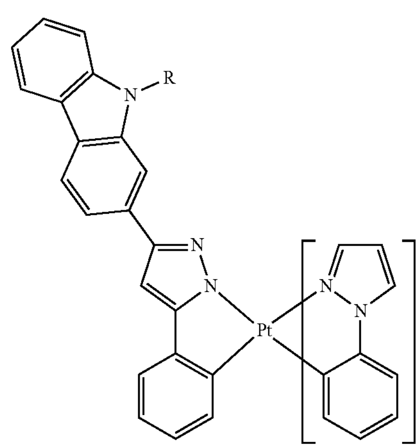

-continued
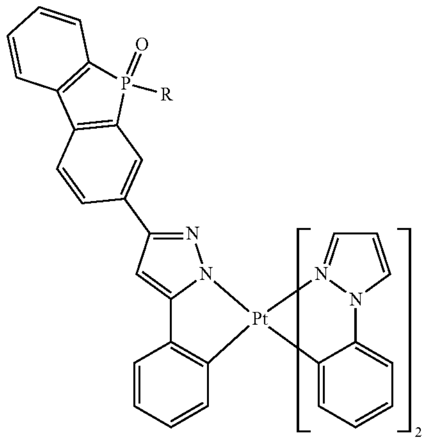
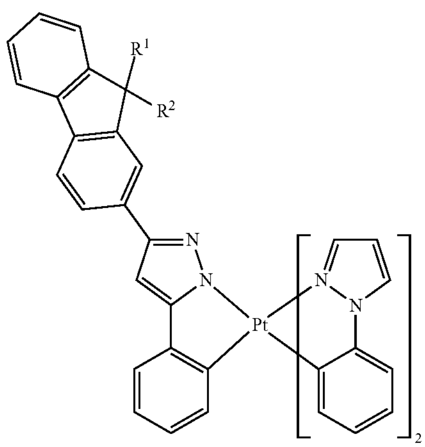
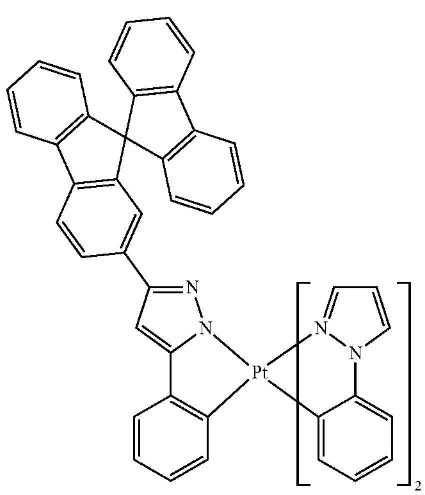
-continued
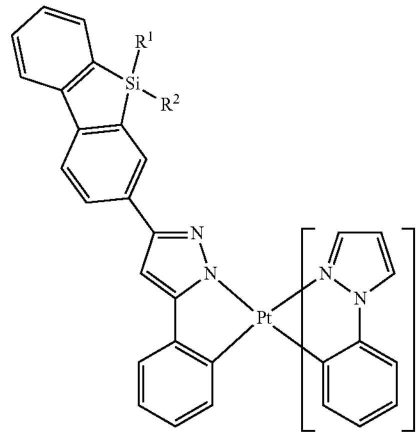
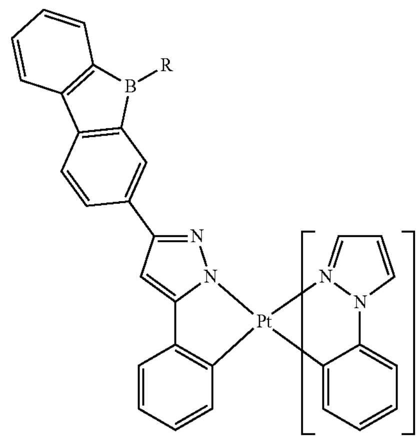
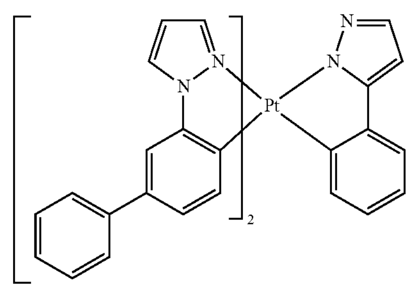
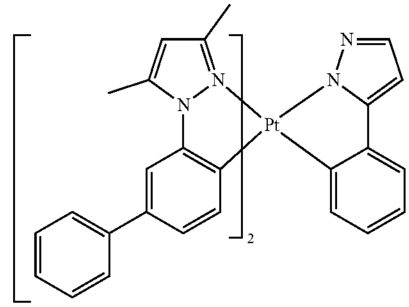

-continued
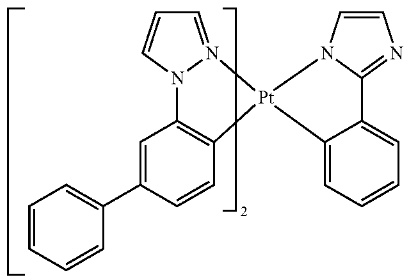
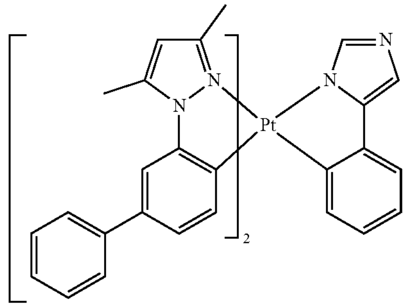
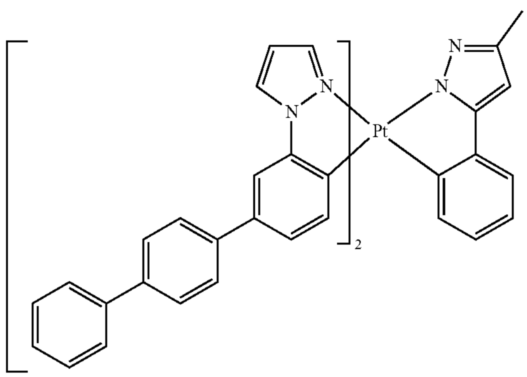
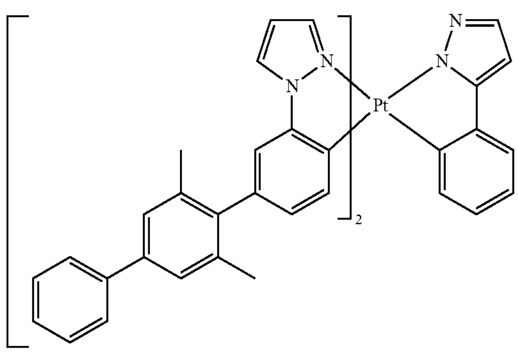
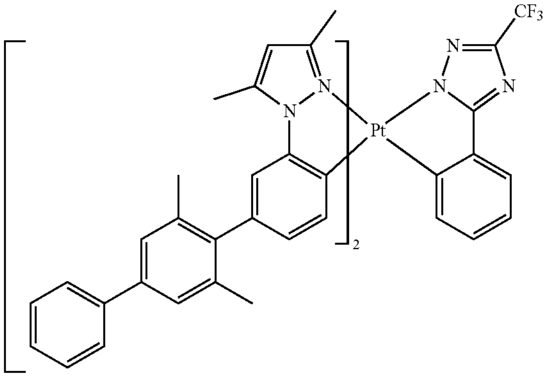
-continued
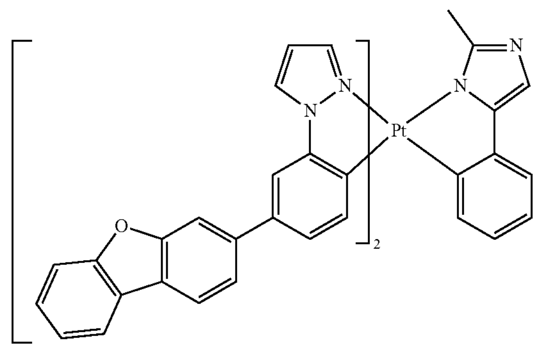
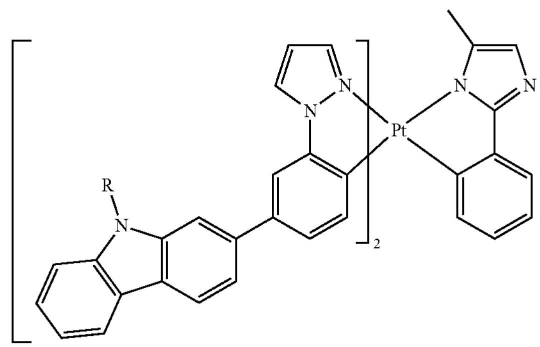
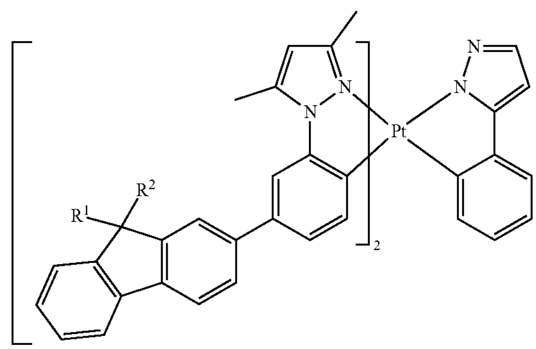
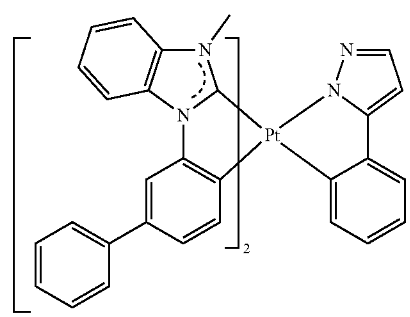
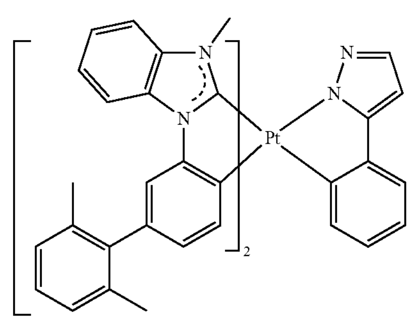

-continued
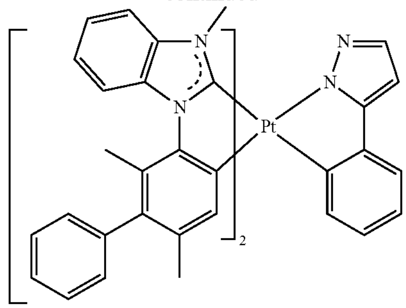
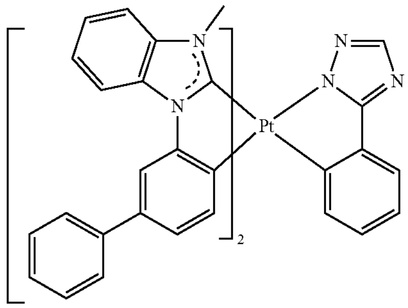
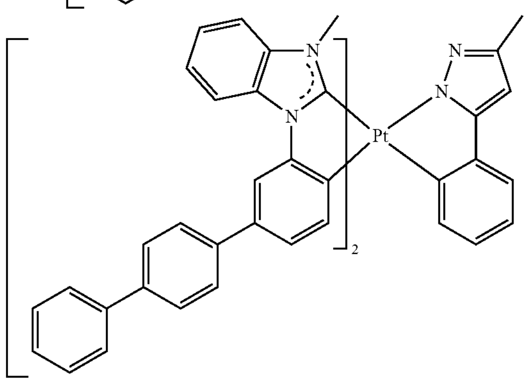
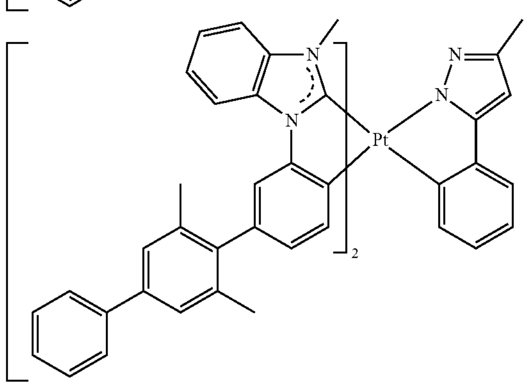
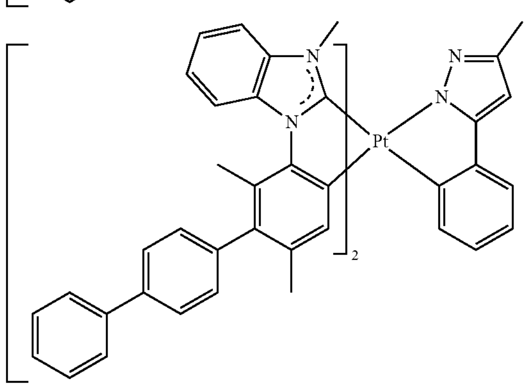
-continued
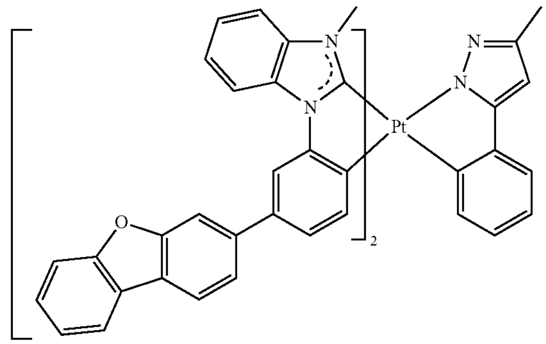
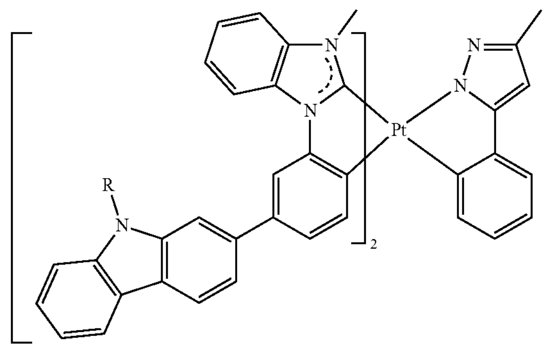
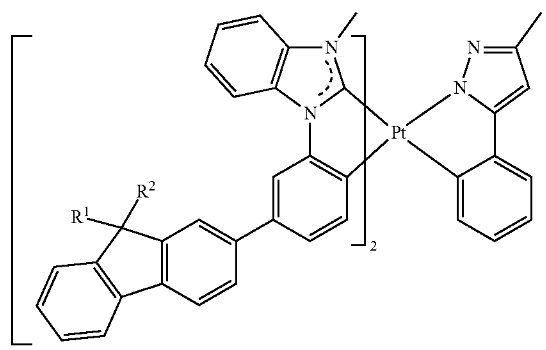
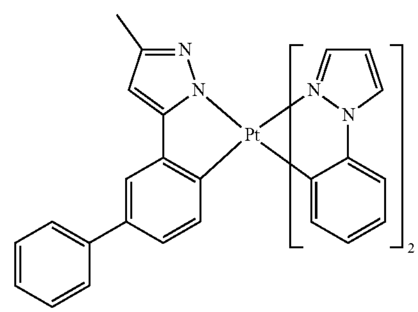
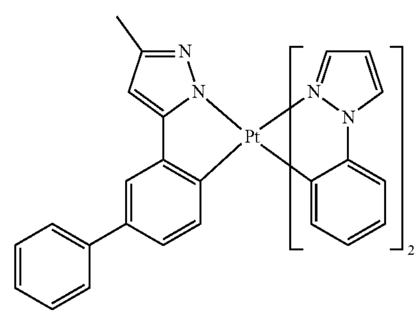

-continued
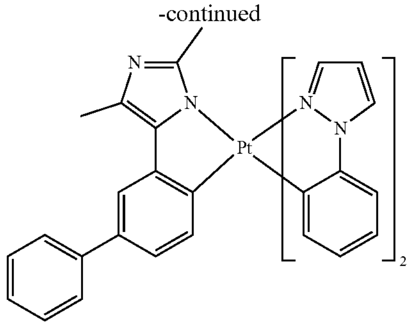
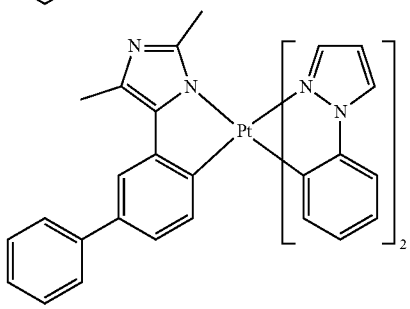
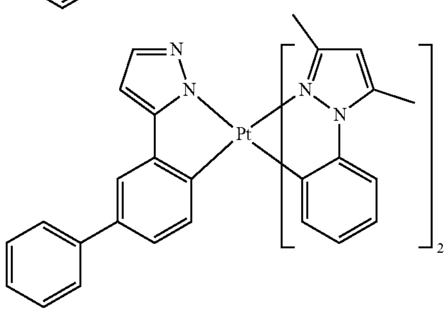
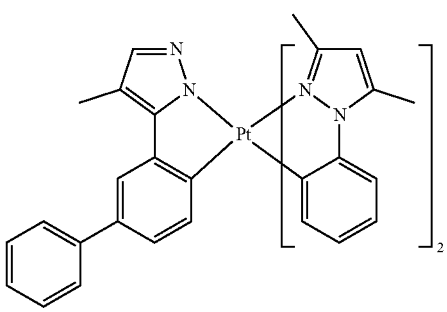
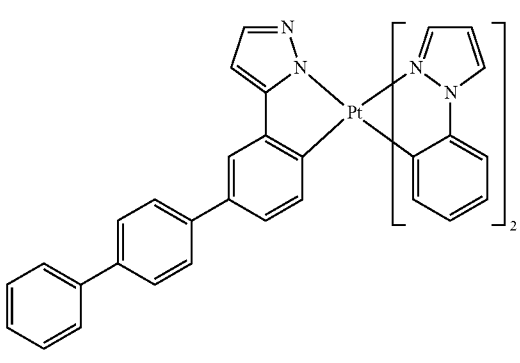
-continued
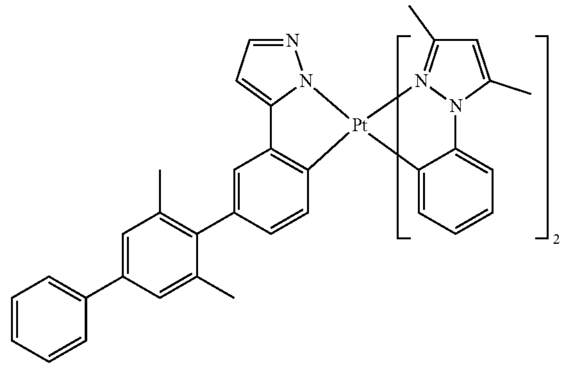
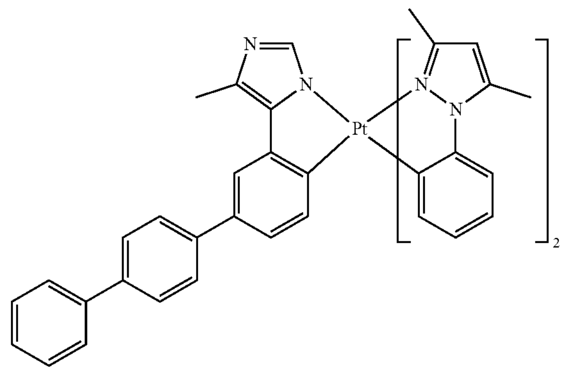
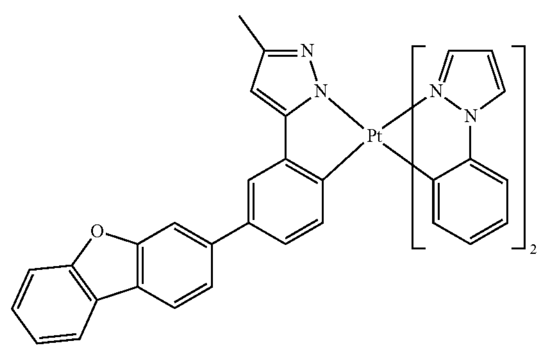
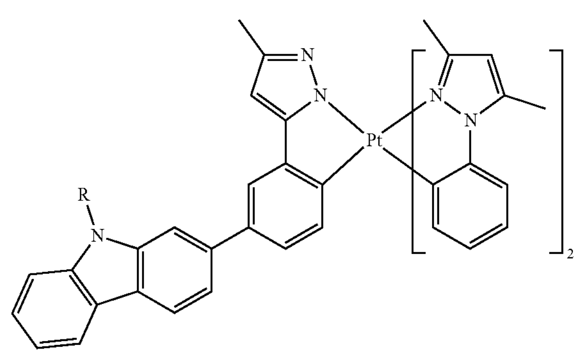

-continued
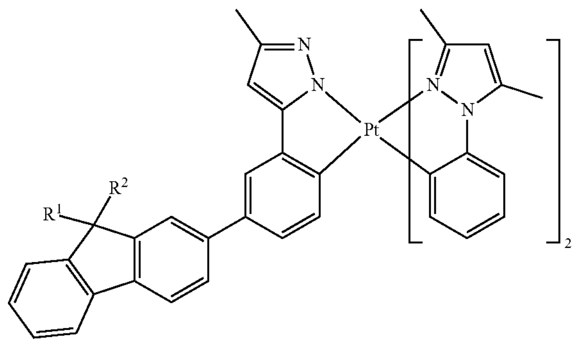
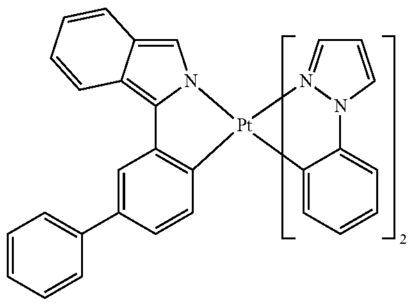
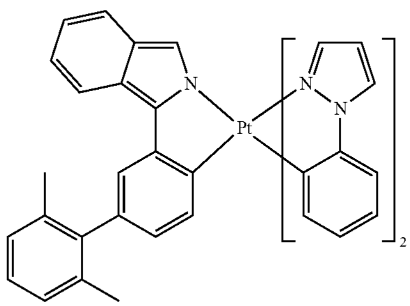
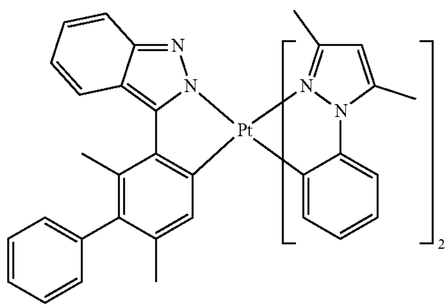
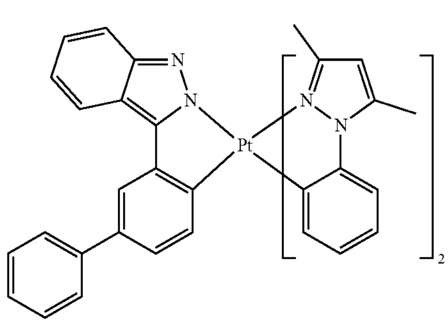
-continued
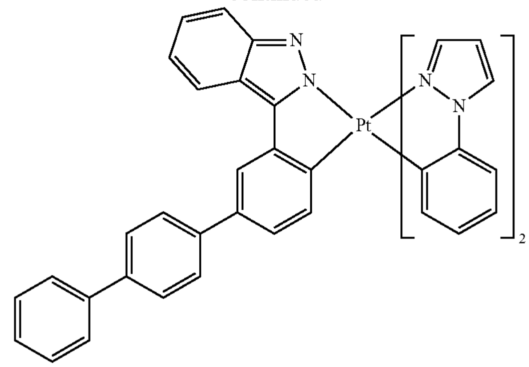
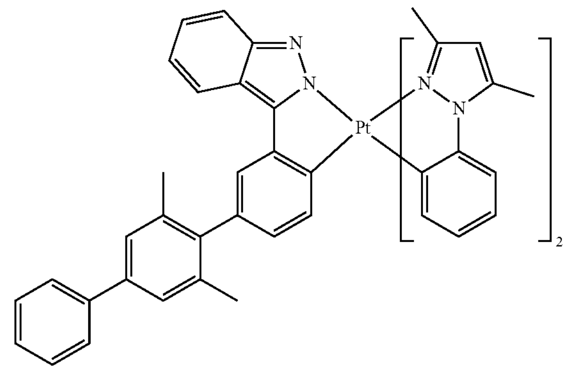
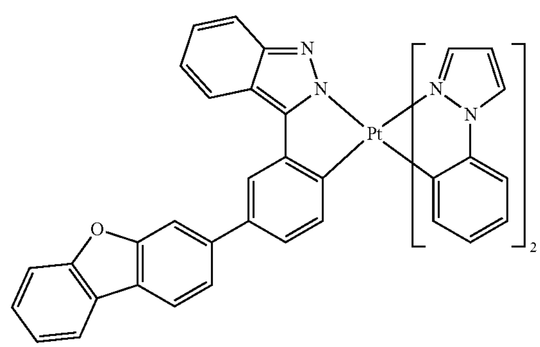
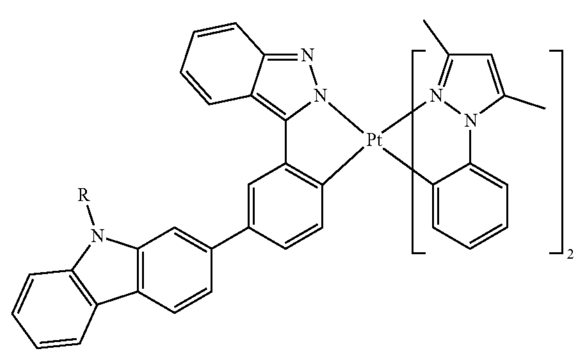

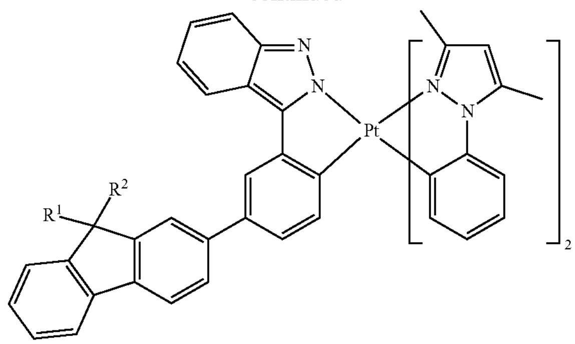
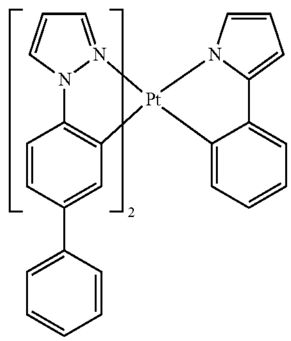
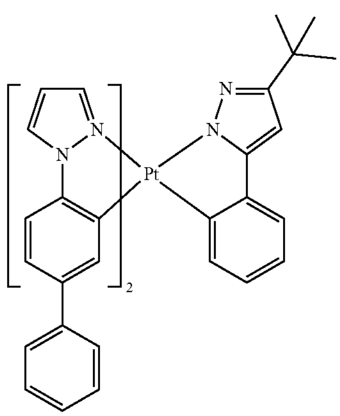
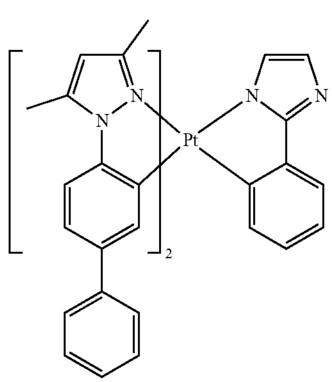
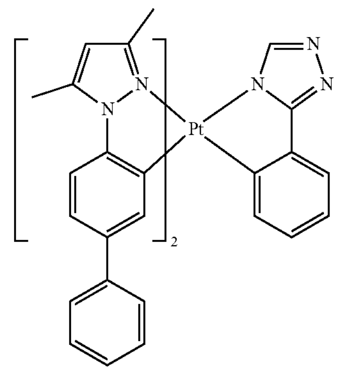
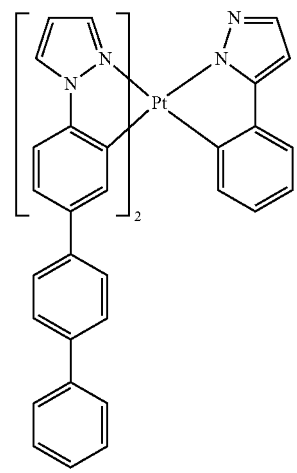
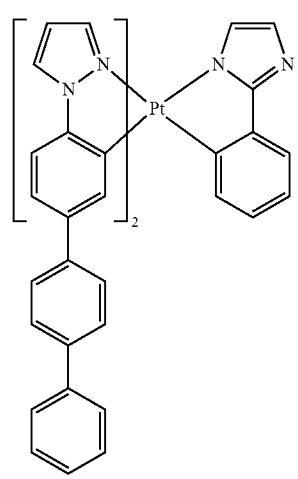

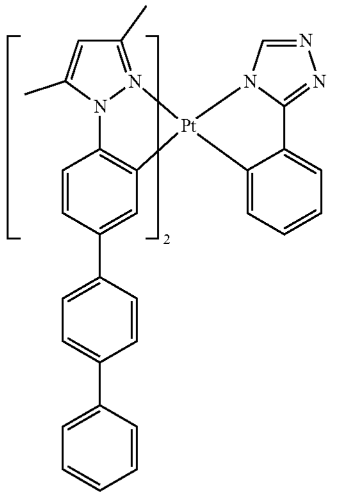
N
N
N
N
N
Pt
2
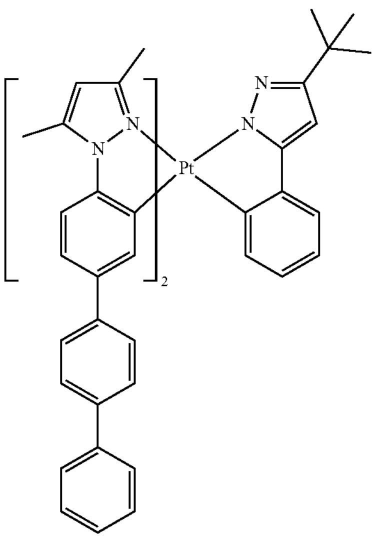
N
N
N
N
Pt
2
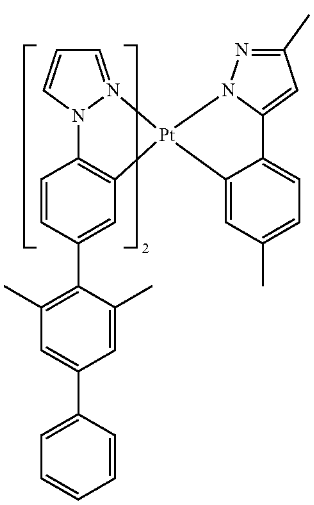
N
N
N
N
Pt
2
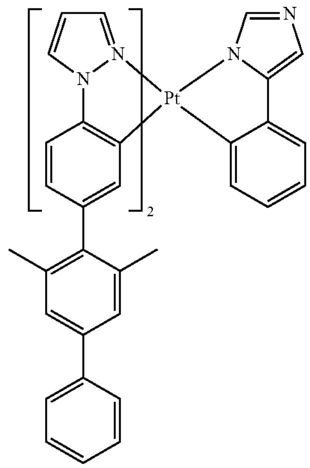
N
N
N
N
Pt
2
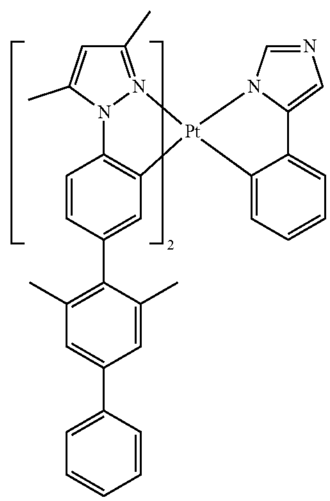
N
N
N
N
Pt
2
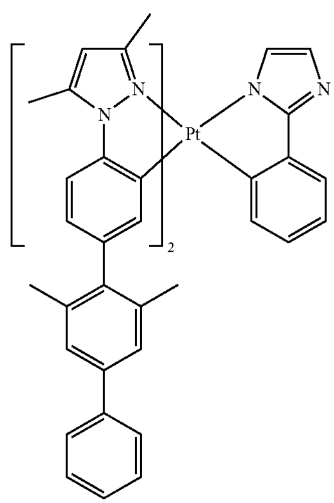
N
N
N
N
Pt
2

-continued
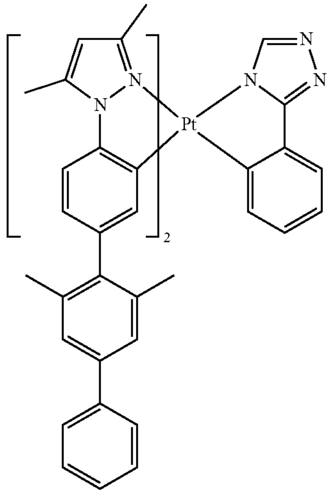
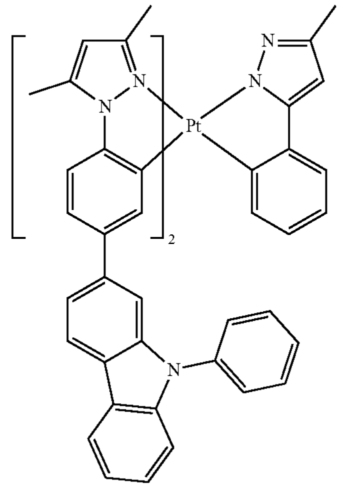
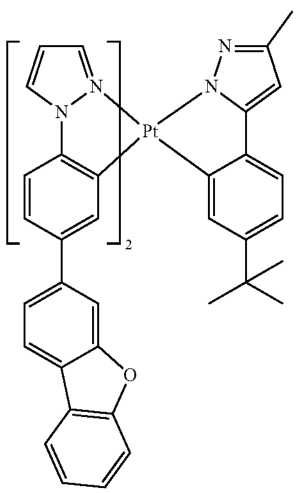
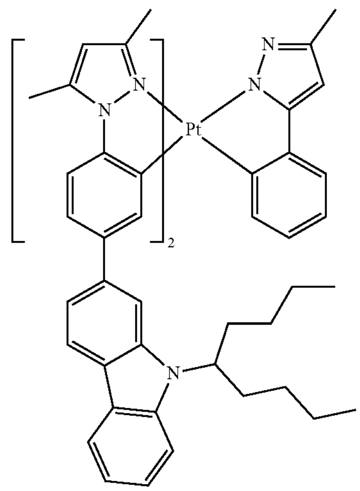
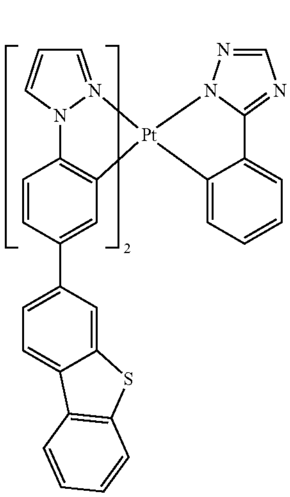
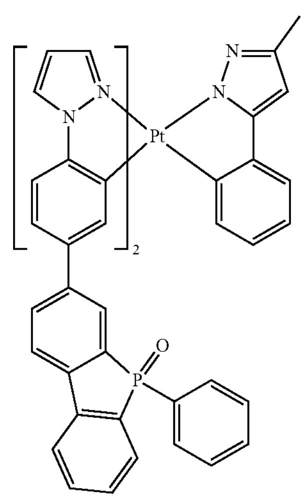

-continued
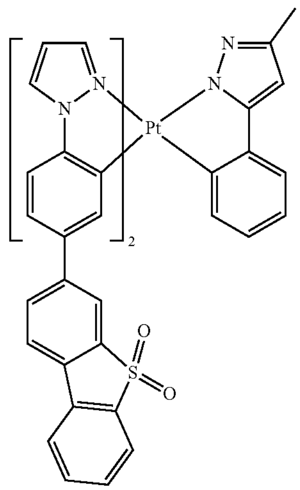
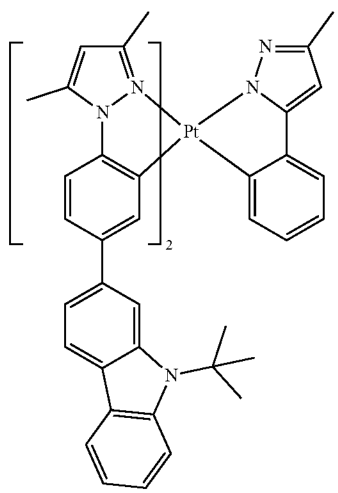
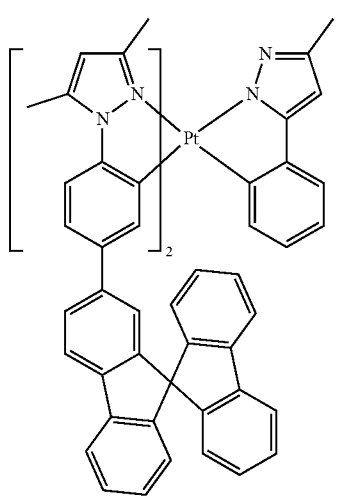
-continued
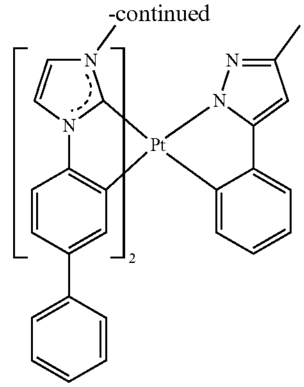
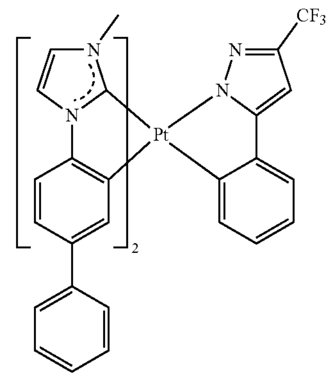
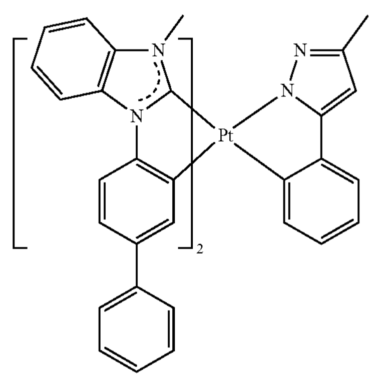
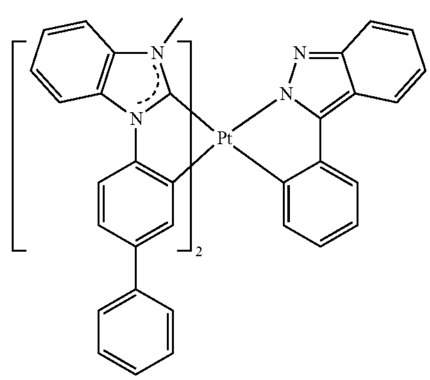

-continued
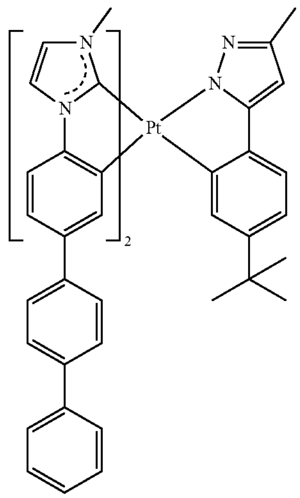
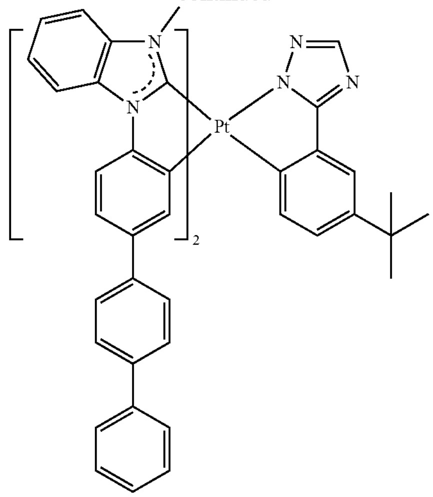
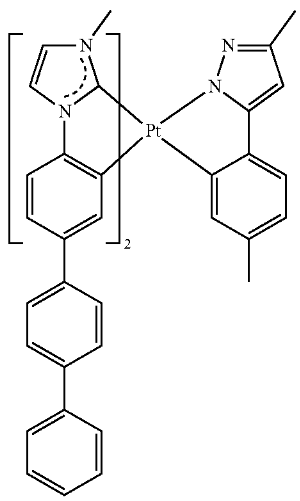
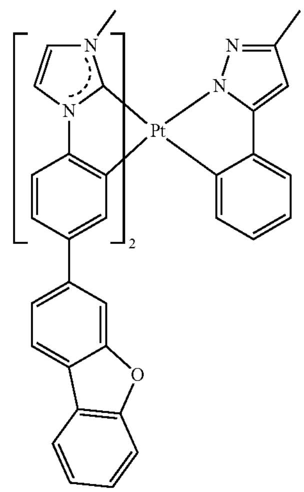
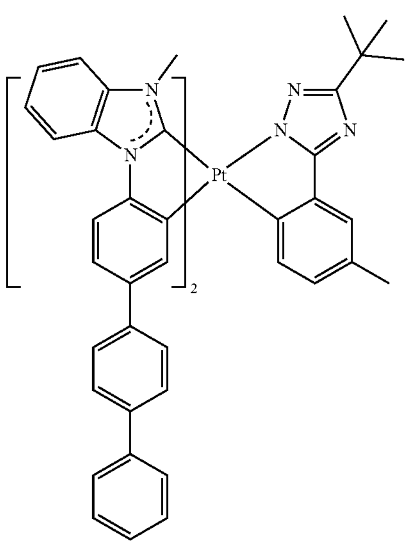
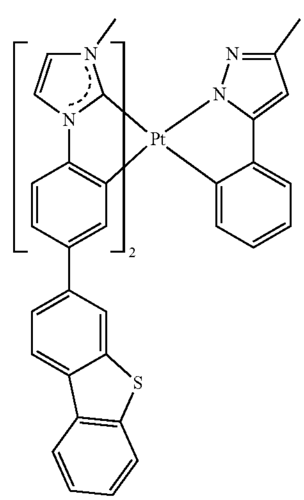

-continued
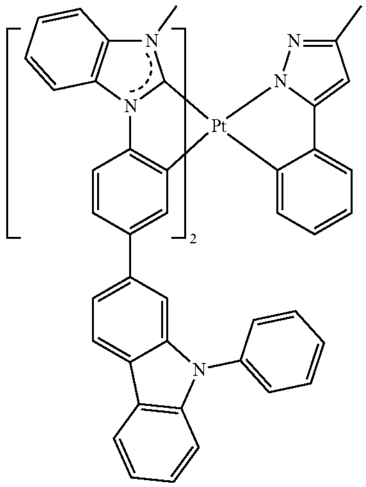
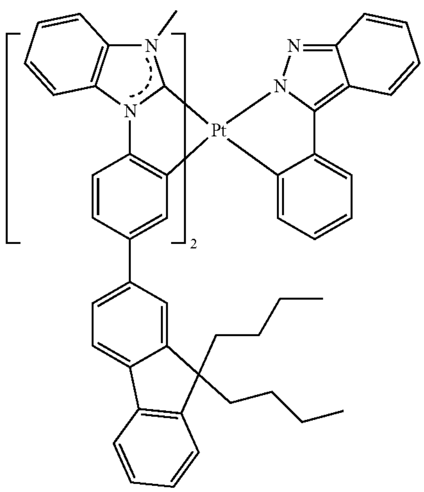
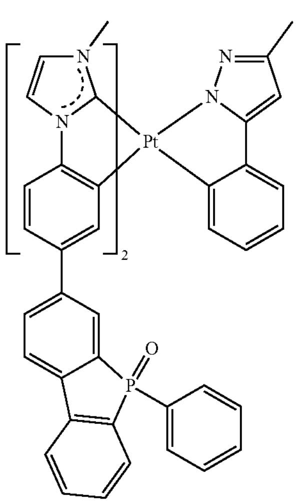
-continued
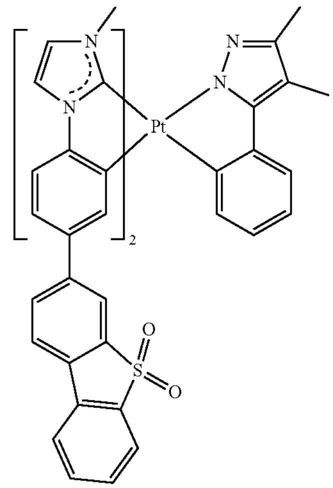
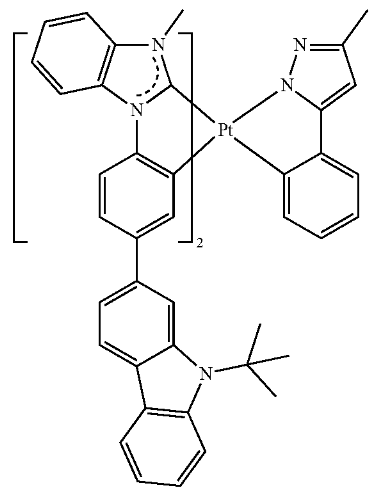
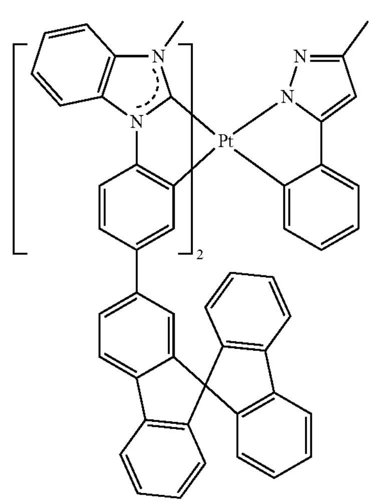

-continued
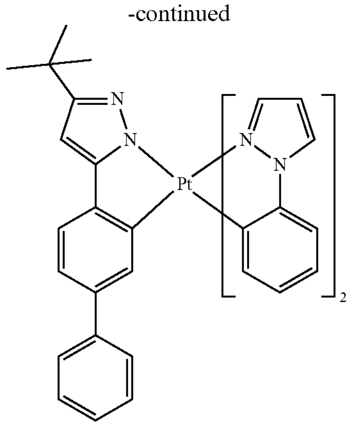
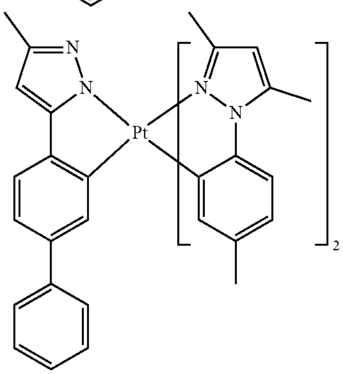
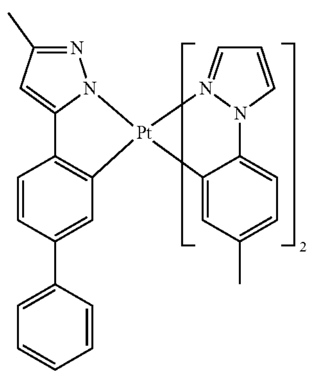
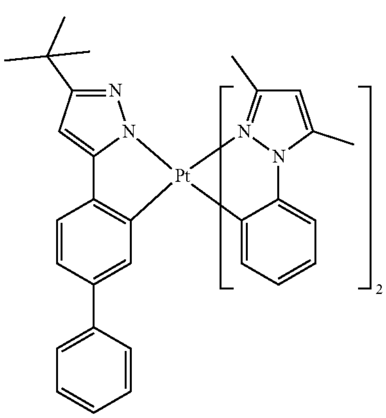
-continued
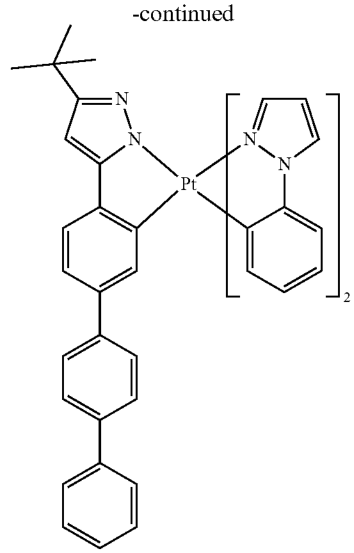
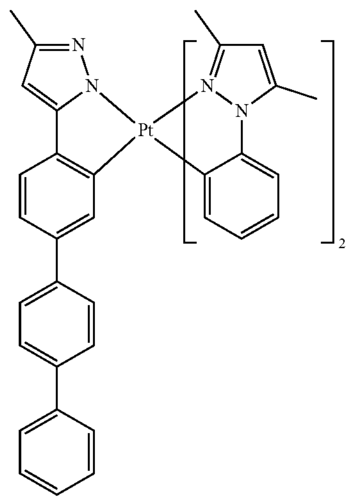
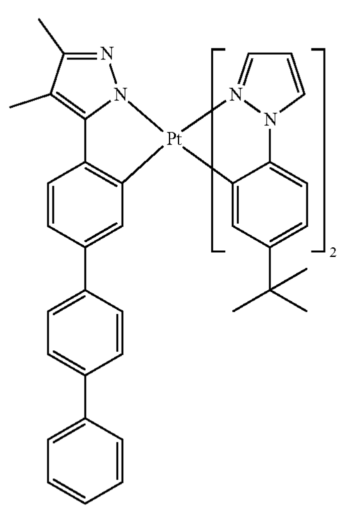

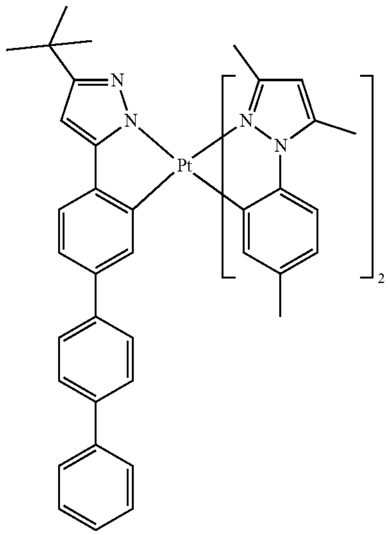
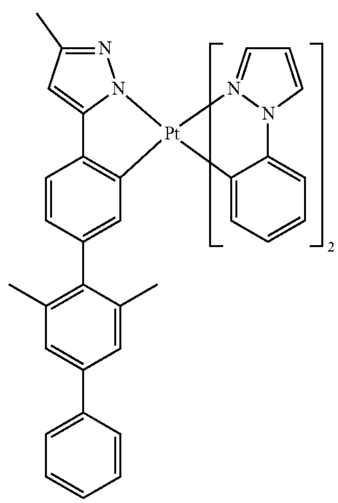
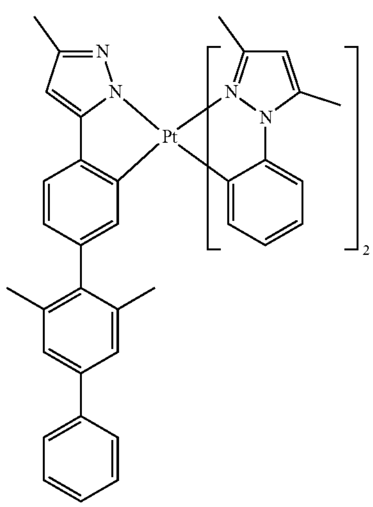
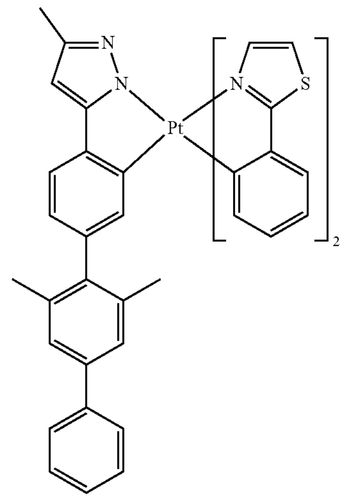
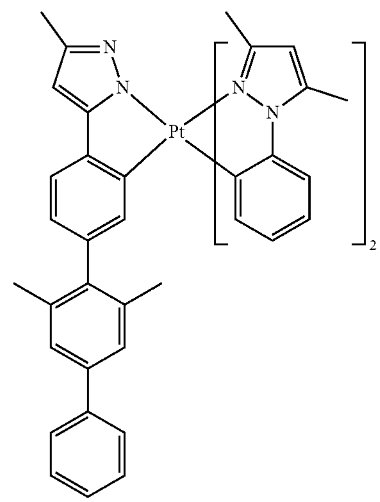
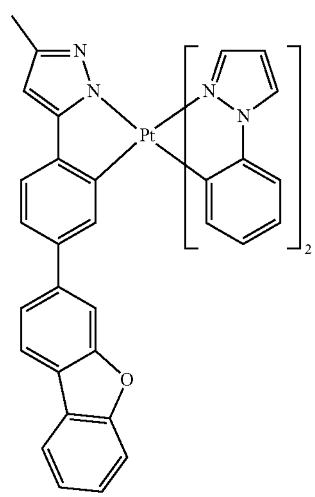

-continued
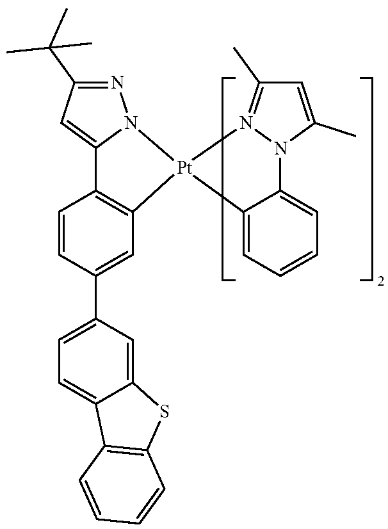
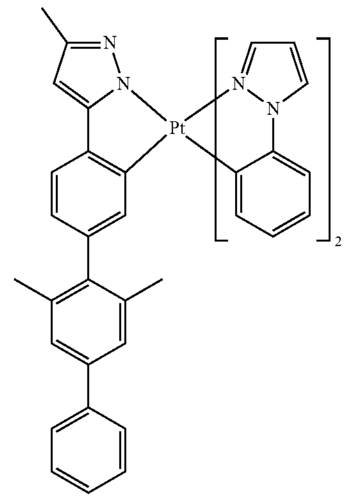
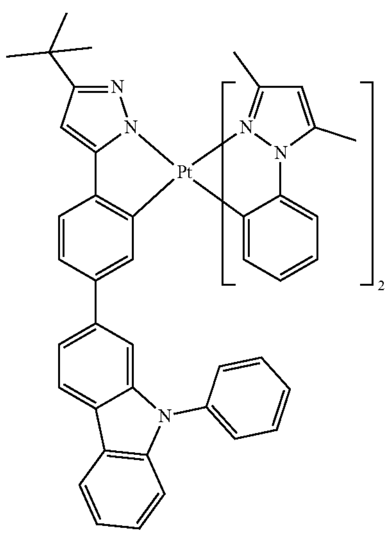
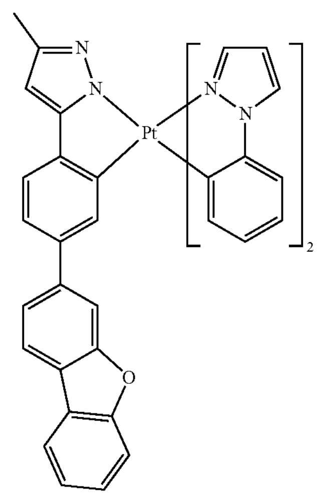
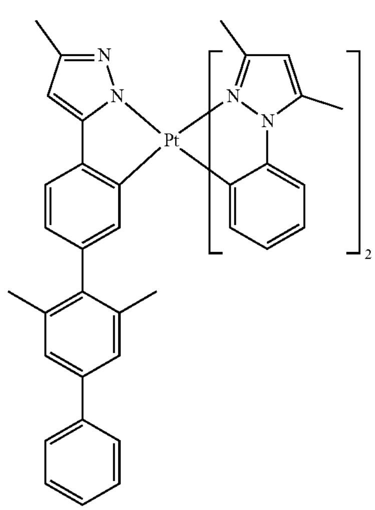
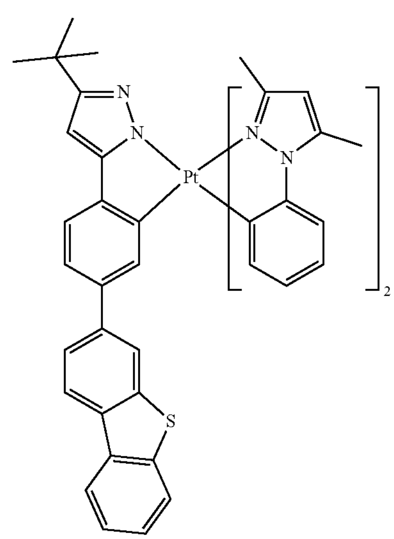

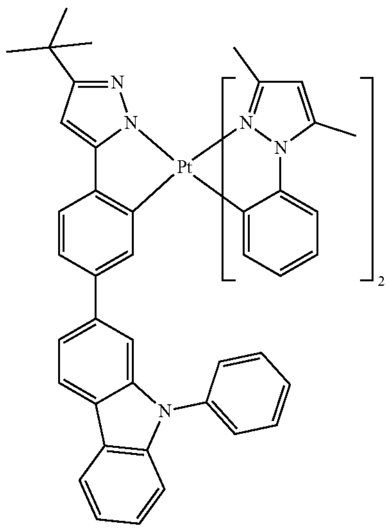
N
N
Pt
N
N
2
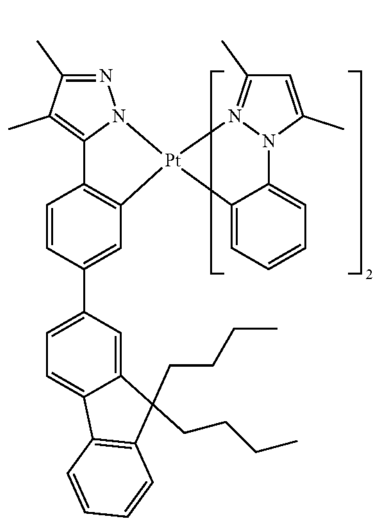
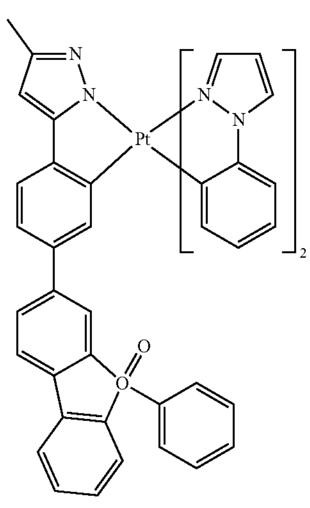
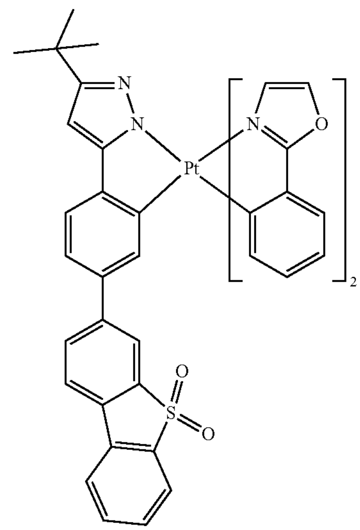
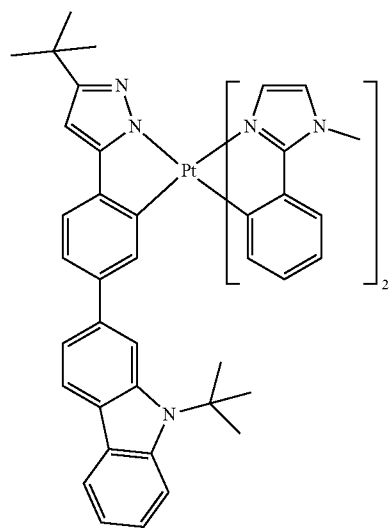
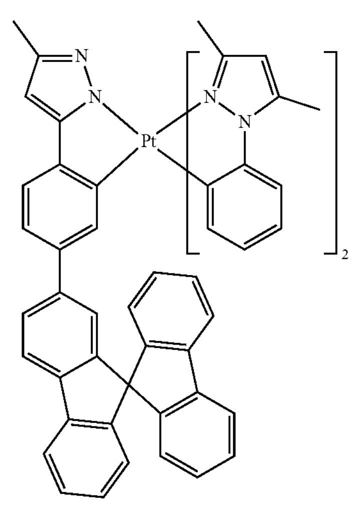

-continued
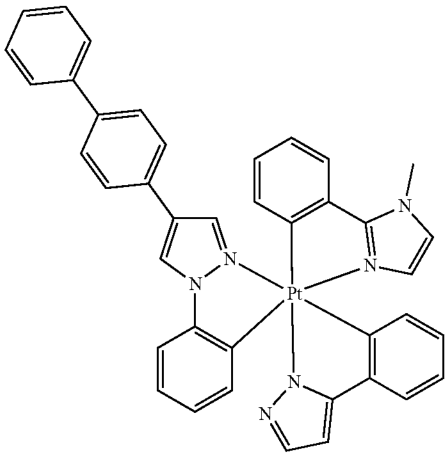
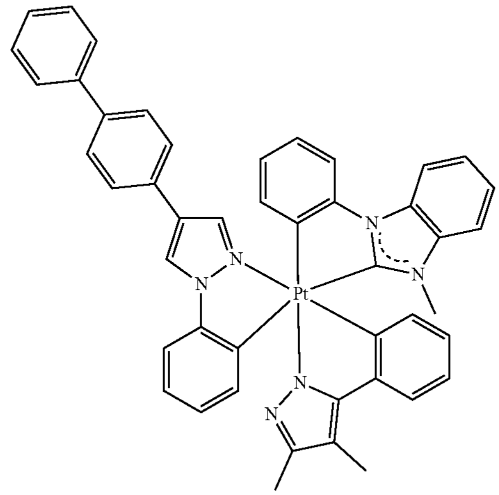
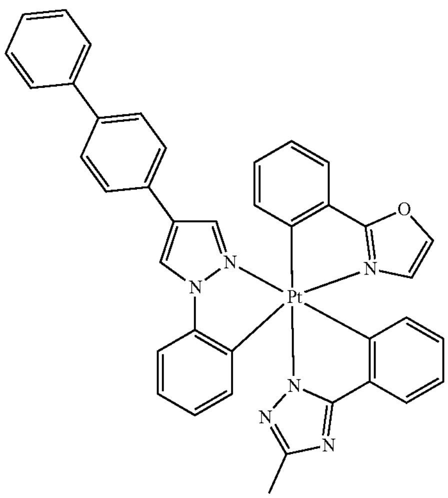
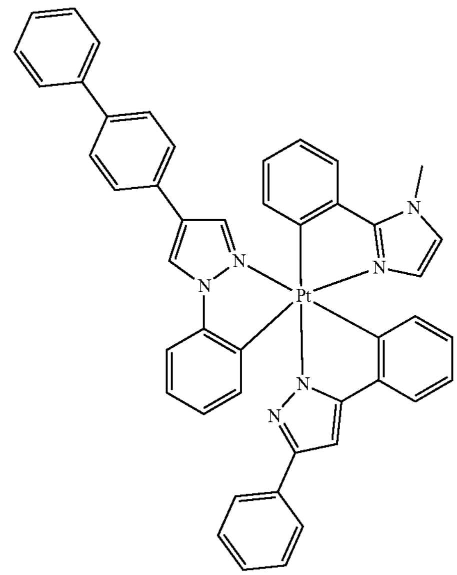
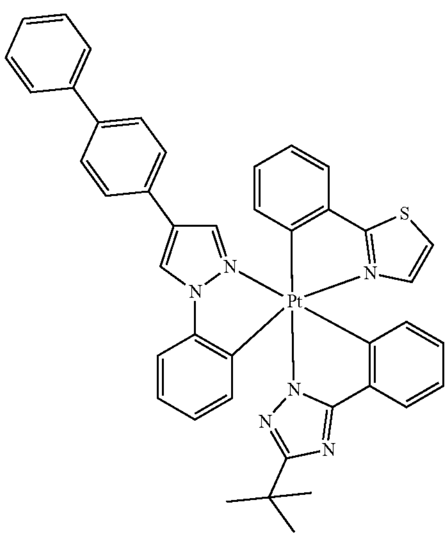
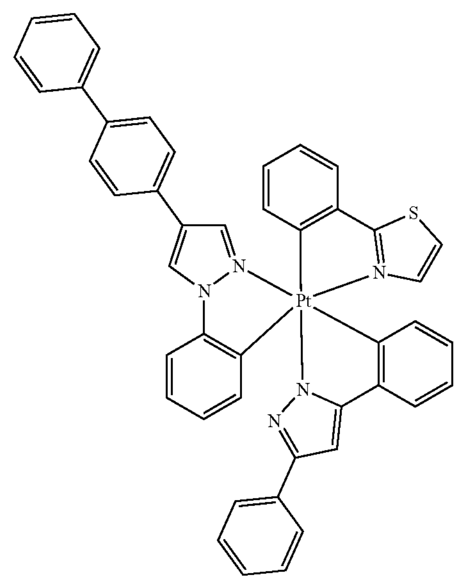

-continued
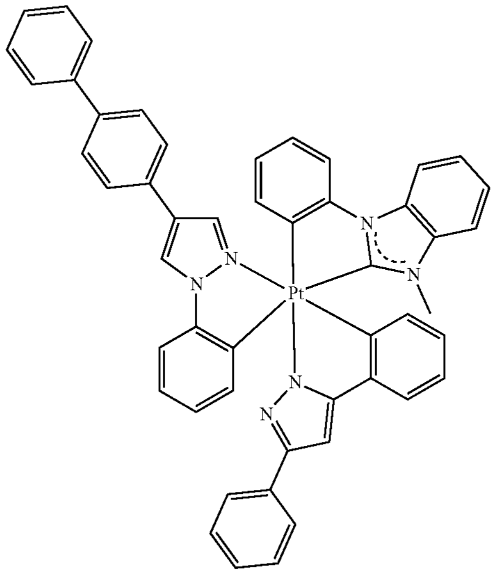
-continued
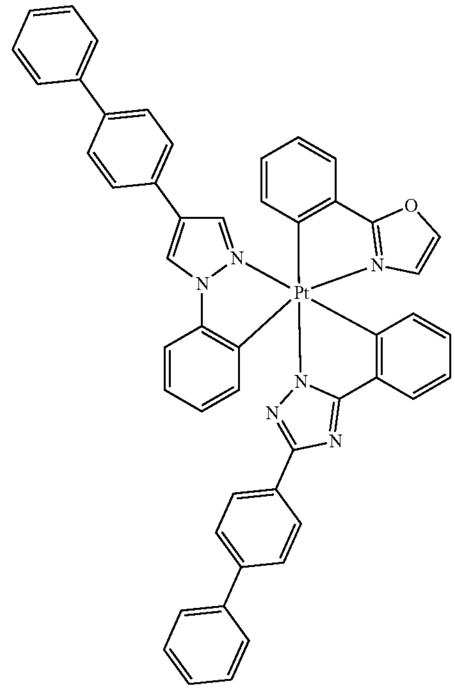
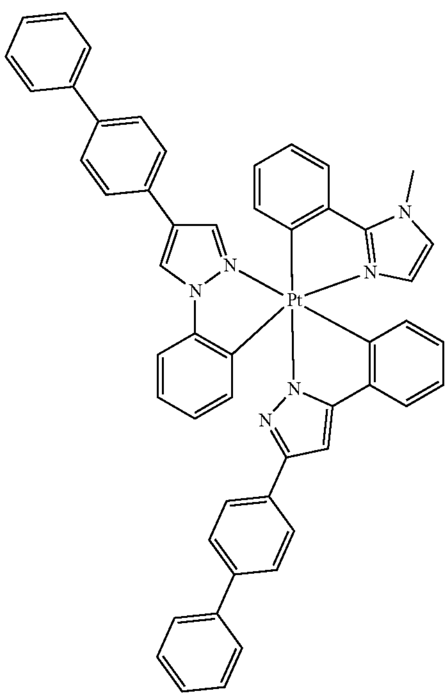
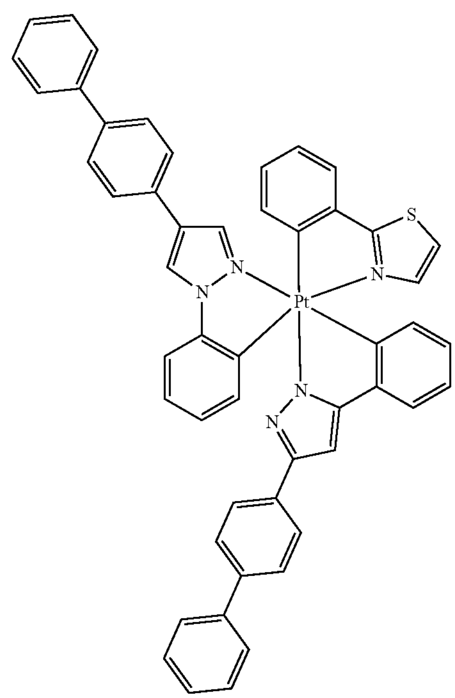

-continued
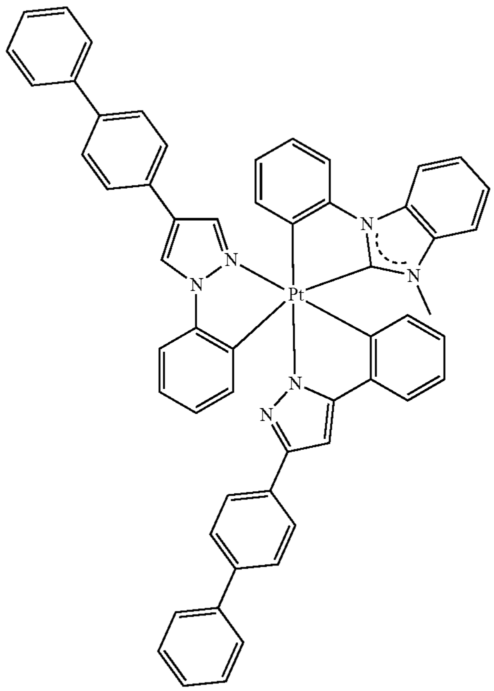
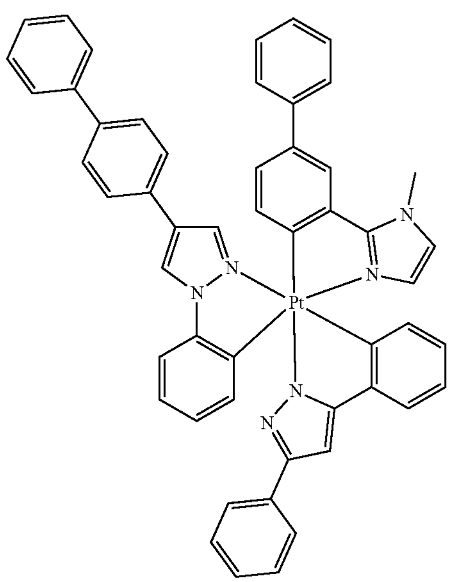
-continued
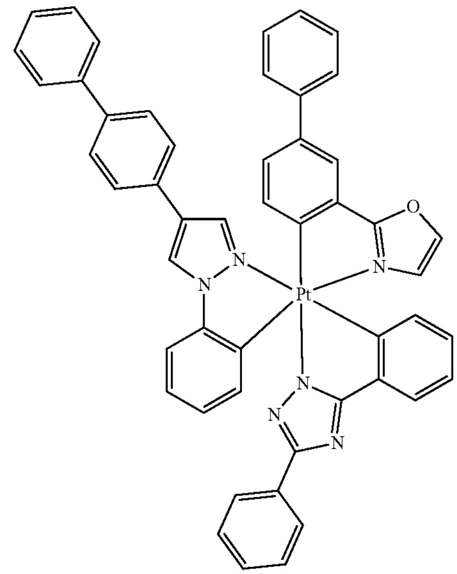
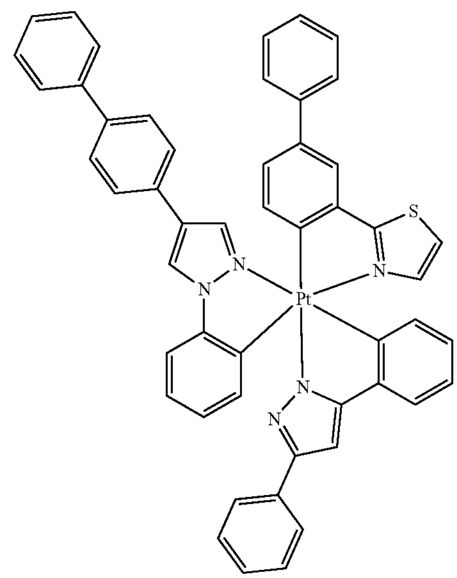
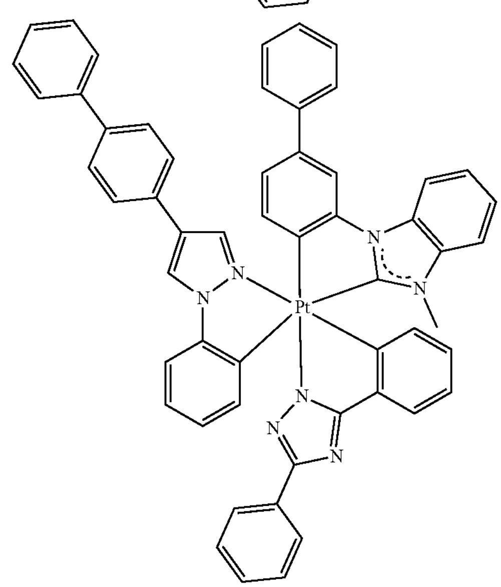

-continued
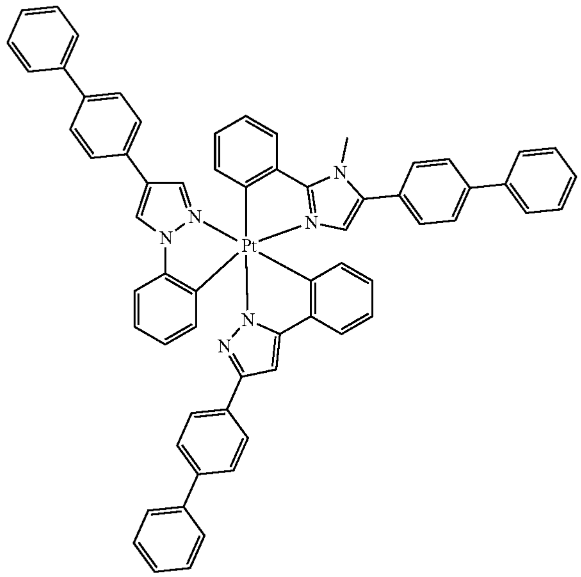
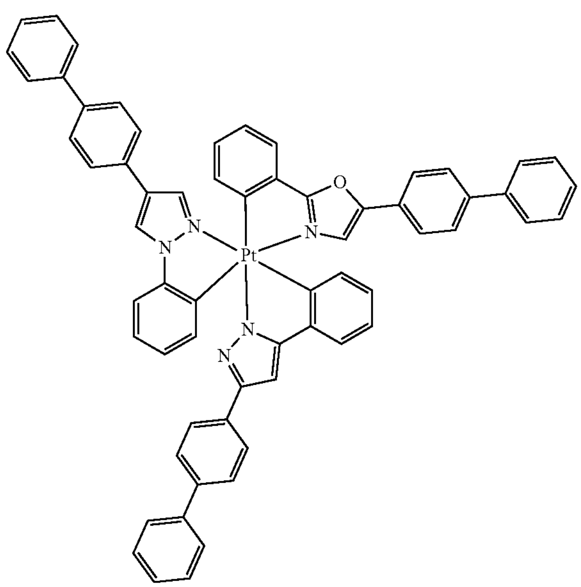
-continued
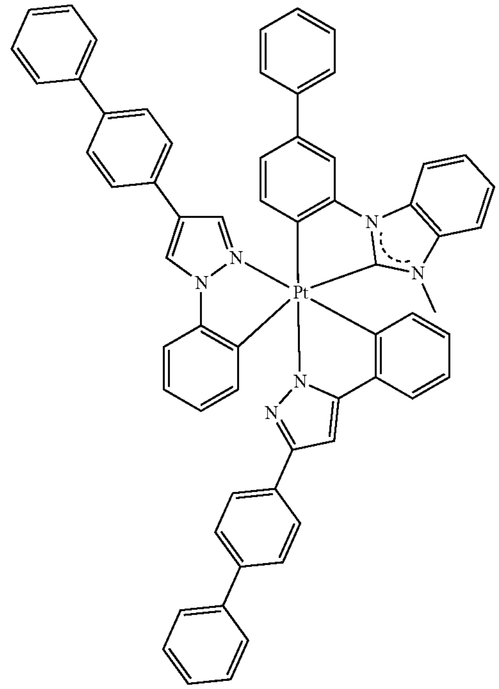
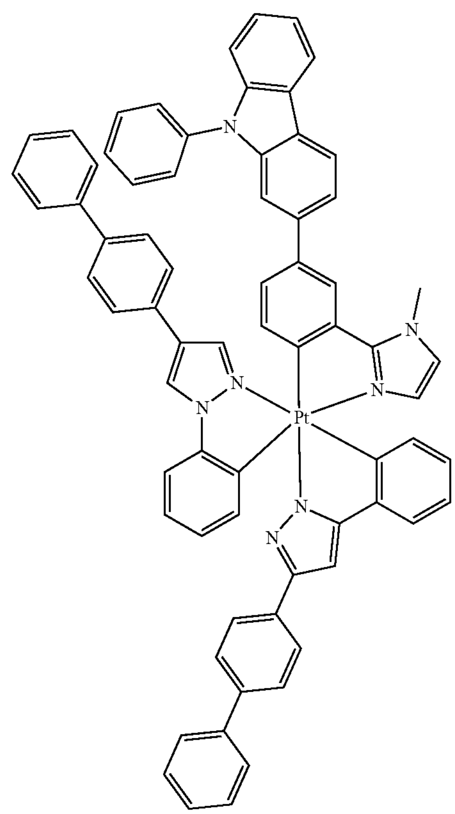

-continued
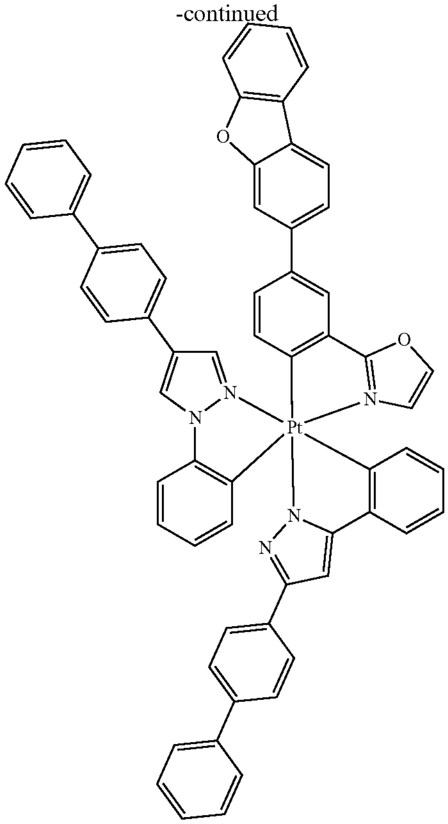
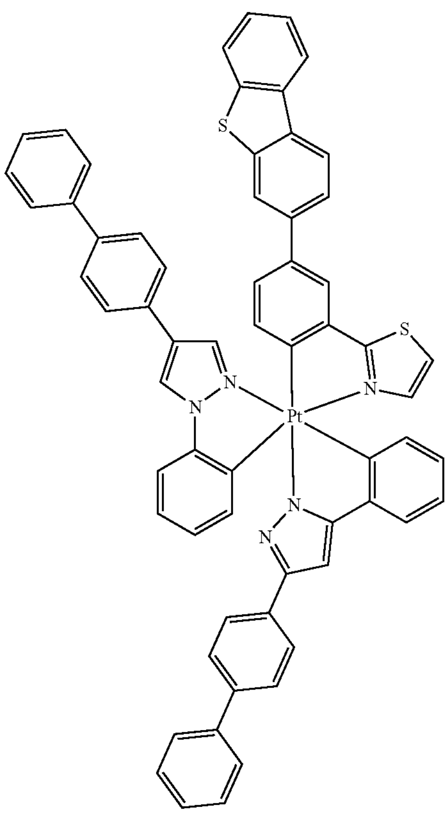
-continued
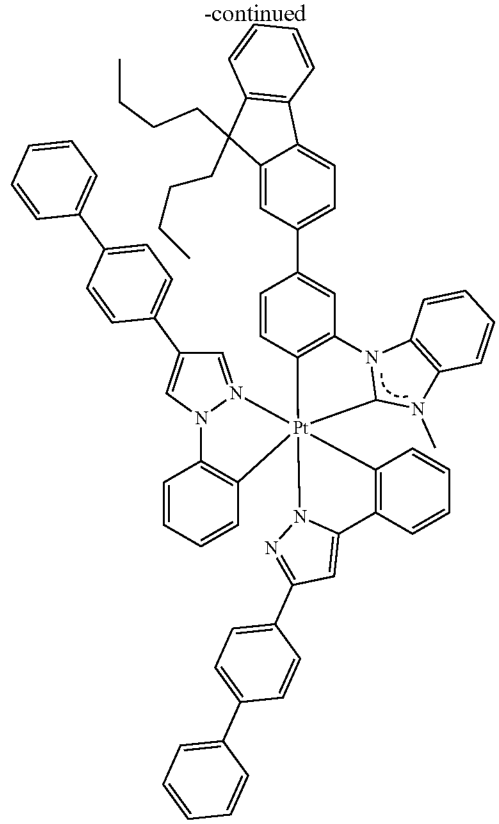
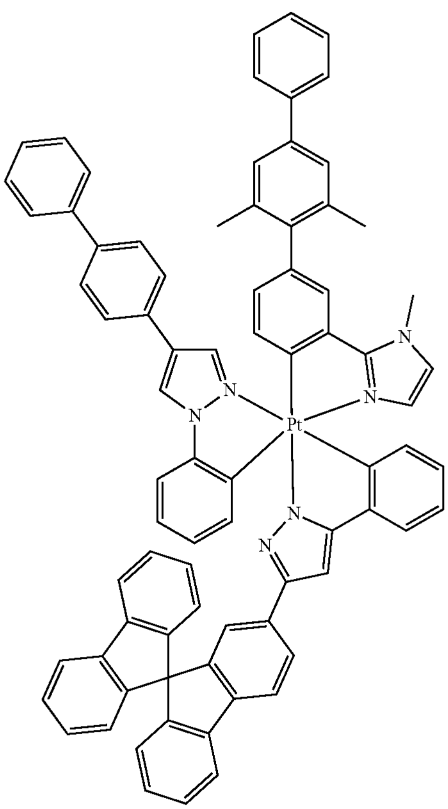

-continued
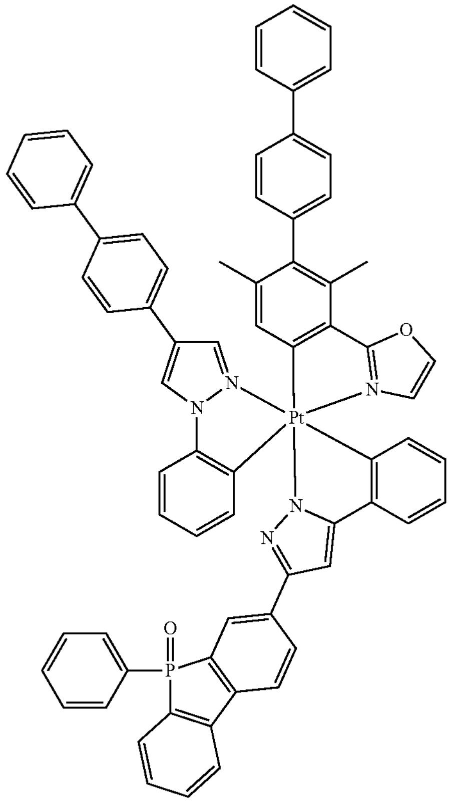
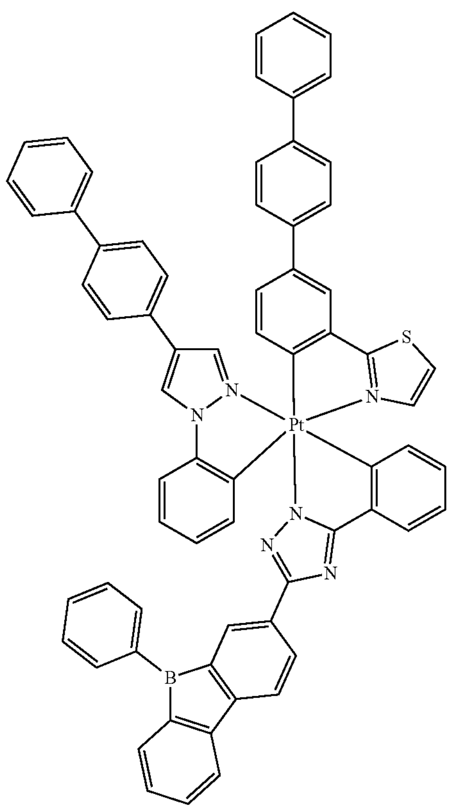
-continued
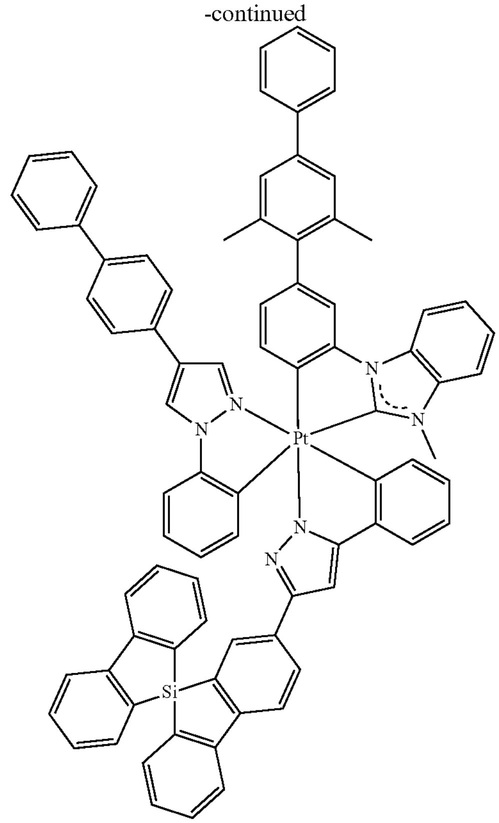
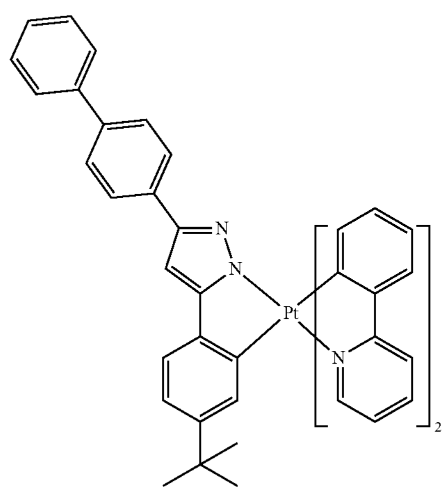

-continued
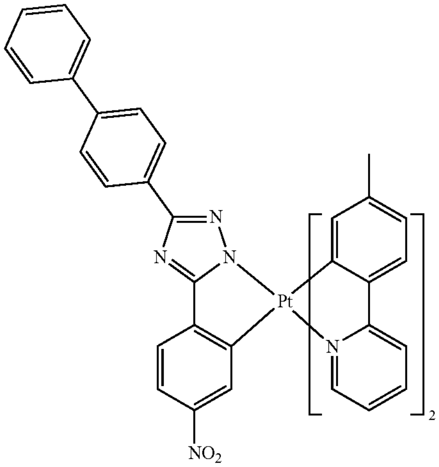
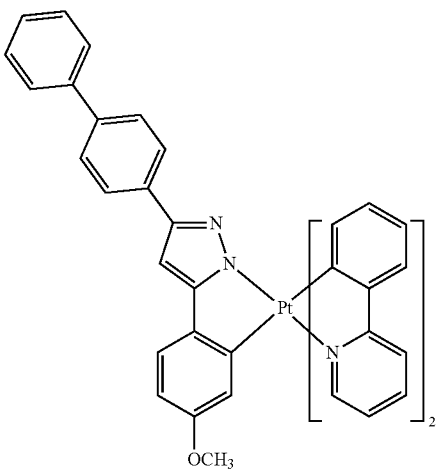
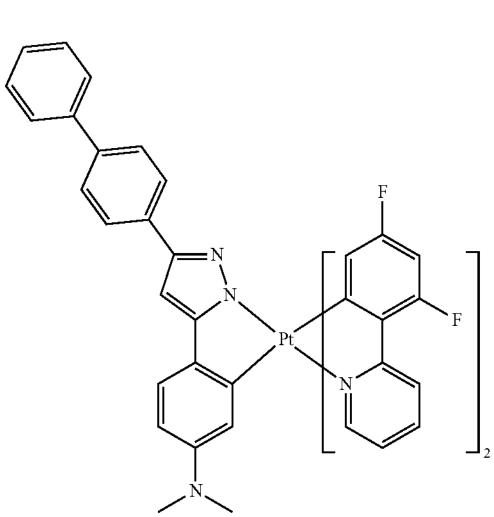
-continued
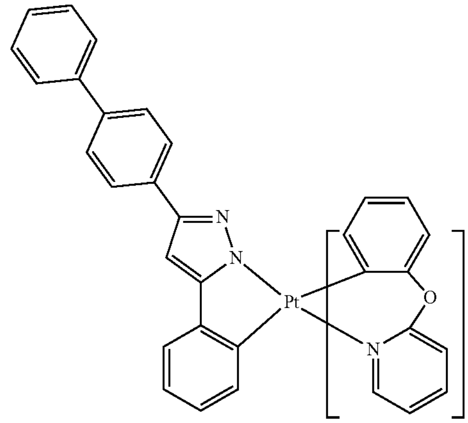
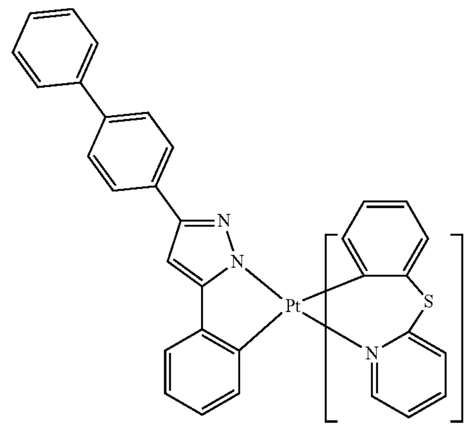
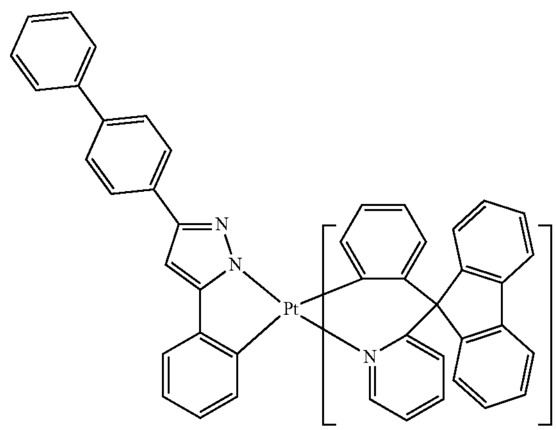
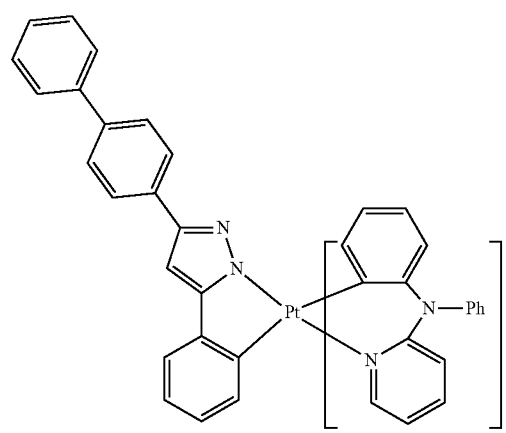

-continued
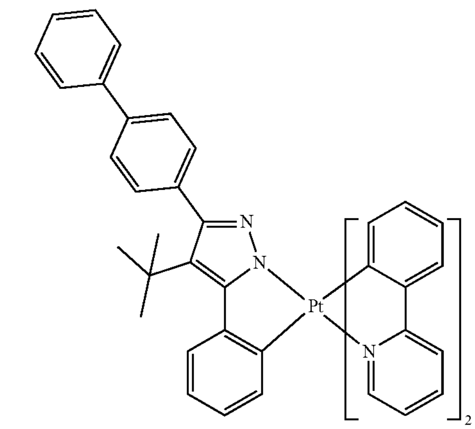
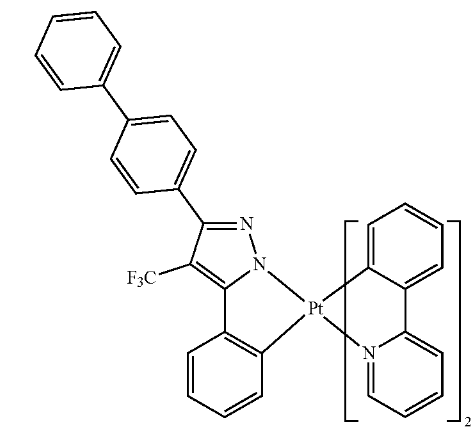
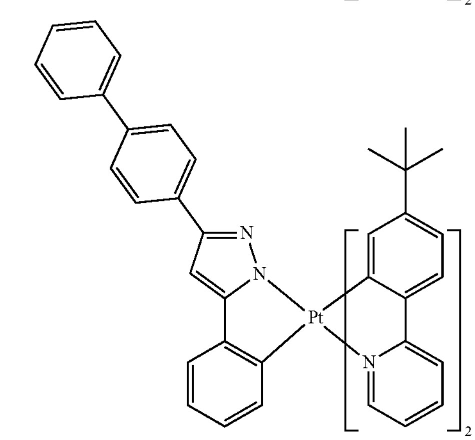
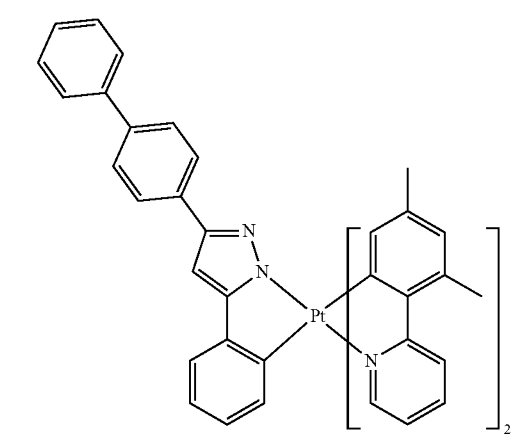
-continued
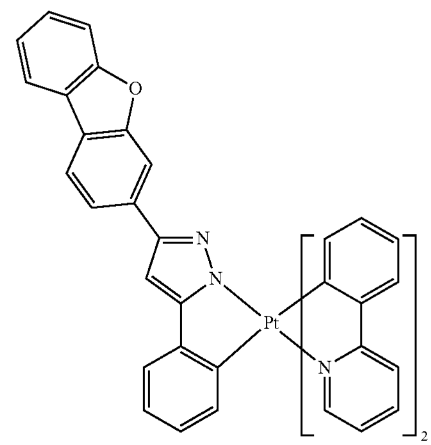
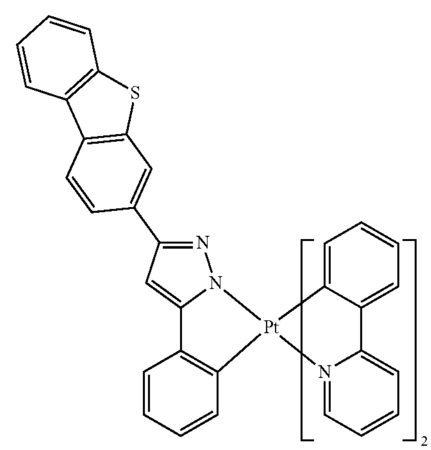
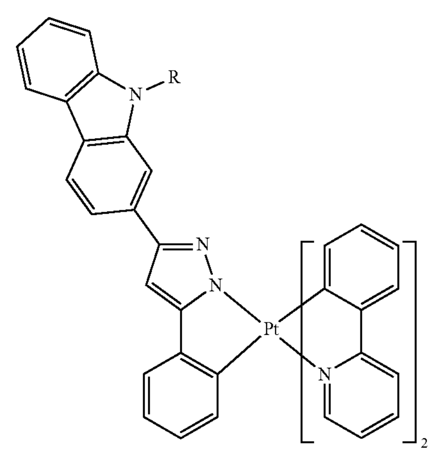

-continued

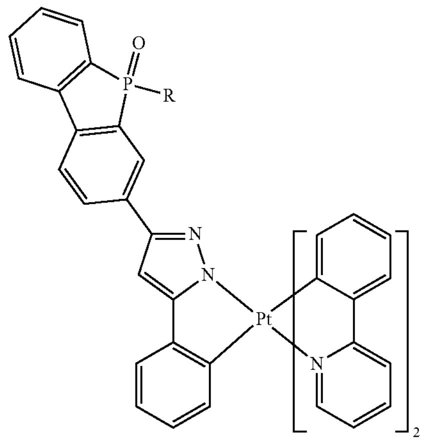

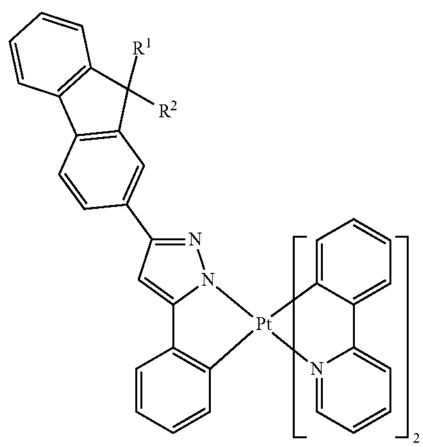

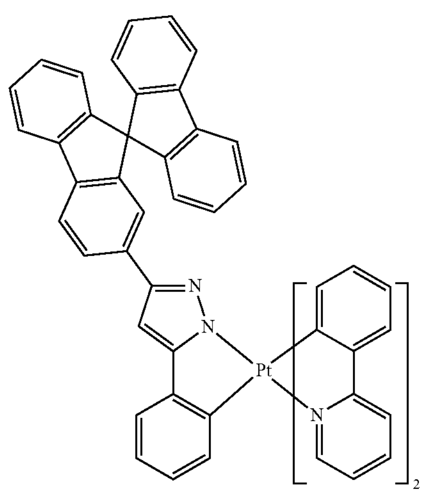

-continued

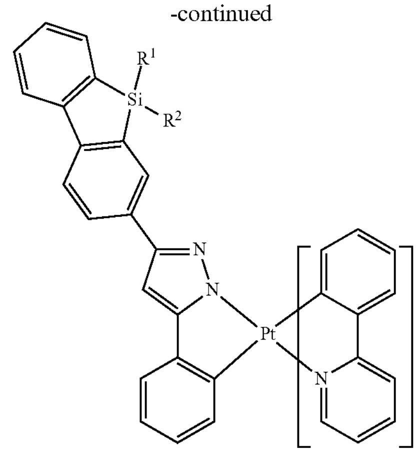

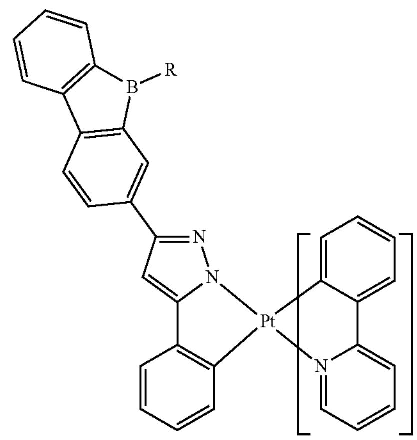

In the compounds shown in Structures Ir-1 to Ir-25, Rh-1 to Rh-25, and Pt-1 to Pt-13 above, each of R, $R^1$, $R^2$, $R^3$, and $R^4$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof. In another aspect, each of R, $R^1$, $R^2$, $R^3$ and $R^4$ is independently hydrogen, halogen, hydroxyl, thiol, nitro, cyano; or substituted or unsubstituted: aryl, cycloalkyl, cycloalkenyl, heterocyclyl, heteroaryl, alkyl, alkenyl, alkynyl, or amino. In another aspect, each of R, $R^1$, $R^2$, $R^3$ and $R^4$ is independently hydrogen; or substituted or unsubstituted: aryl, cycloalkyl, cycloalkenyl, heterocyclyl, heteroaryl, alkyl, alkenyl, or alkynyl.

2. Devices

Also disclosed herein are devices including one or more of the compounds disclosed herein.

The compounds disclosed herein are suited for use in a wide variety of devices, including, for example, optical and electro-optical devices, including, for example, photo-absorbing devices such as solar- and photo-sensitive devices, organic light emitting diodes (OLEDs), photo-emitting devices, or devices capable of both photo-absorption and emission and as markers for bio-applications.

Figure 2:
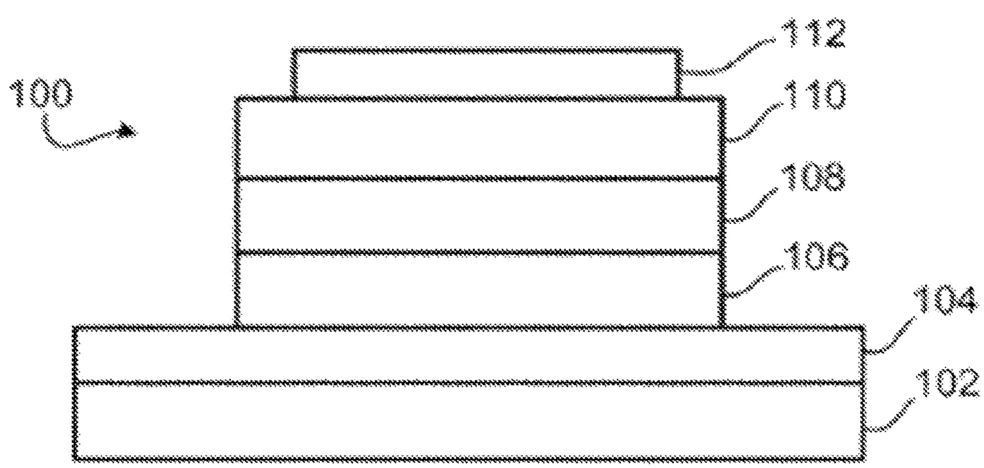
FIG. 2 depicts a device including a metal complex as disclosed herein.

Compounds described herein can be used in a light emitting device such as an OLED. FIG. 2 depicts a crosssectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 2 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more compounds of the present disclosure optionally together with a host material. The host material can be any suitable host material known in the art. The emission color of an OLED is determined by the emission energy (optical energy gap) of the light processing material 108, which can be tuned by tuning the electronic structure of the emitting compounds, the host material, or both. Both the hole-transporting material in the HTL layer 106 and the electron-transporting material(s) in the ETL layer 110 may include any suitable hole-transporter known in the art.

Compounds described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to be limiting in scope. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation of the compounds described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the compounds described herein. The following aspects are only exemplary and are not intended to be limiting in scope. Temperatures, catalysts, concentrations, reactant compositions, and other process conditions can vary, and one of skill in the art, in possession of this disclosure, could readily select appropriate reactants and conditions for a desired complex.

$^{1}H$ spectra were recorded at 400 MHz, $^{13}C$ NMR spectra were recorded at 100 MHz on Varian Liquid-State NMR instruments in $CDCl_3$ or DMSO-$d_6$ solutions and chemical shifts were referenced to residual protiated solvent. If $CDCl_3$ was used as solvent, $^{1}H$ NMR spectra were recorded with tetramethylsilane (δ=0.00 ppm) as internal reference; $^{13}C$ NMR spectra were recorded with $CDCl_3$ (δ=77.00 ppm) as internal reference. If DMSO-$d_6$ was used as solvent, $^{1}H$ NMR spectra were recorded with residual $H_2O$ (δ=3.33 ppm) as internal reference; $^{13}C$ NMR spectra were recorded with DMSO-$d_6$ (δ=39.52 ppm) as an internal reference. The following abbreviations (or combinations thereof) were used to explain $^{1}H$ NMR multiplicities: s=singlet, d=doublet, t=triplet, q=quartet, p=quintet, m=multiplet, br=broad.

General Synthetic Routes

A general synthetic route for the compounds disclosed herein includes:

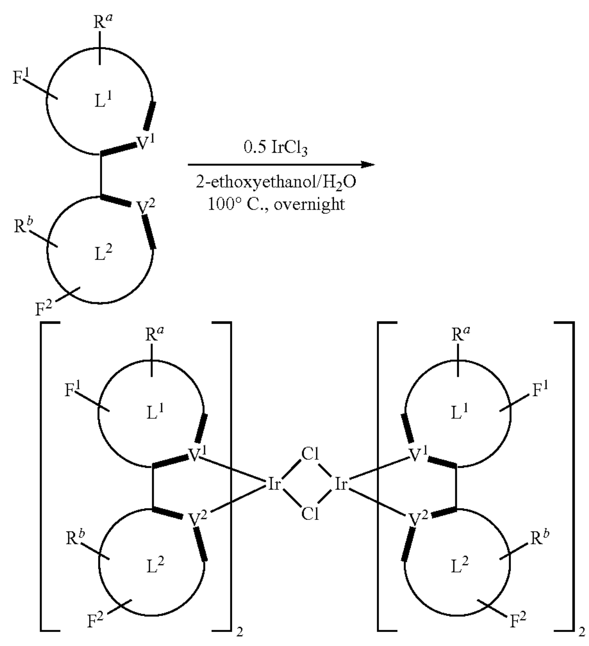

Dimer A

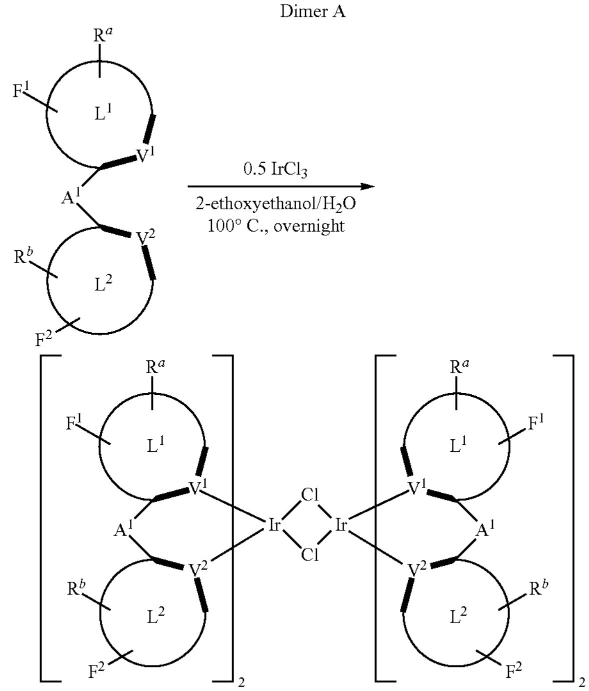

Dimer B

-continued
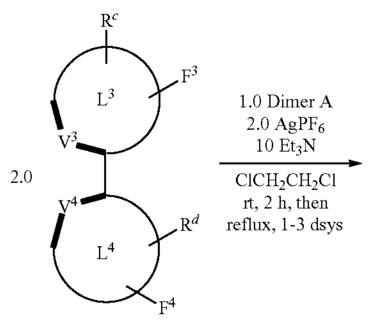
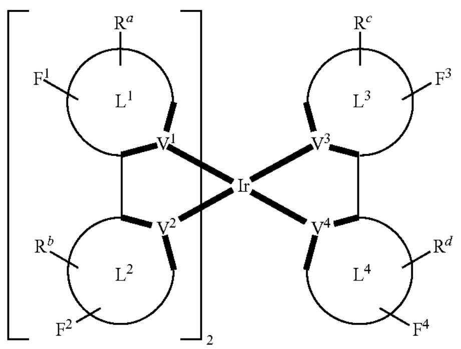
Formula V (Ir)
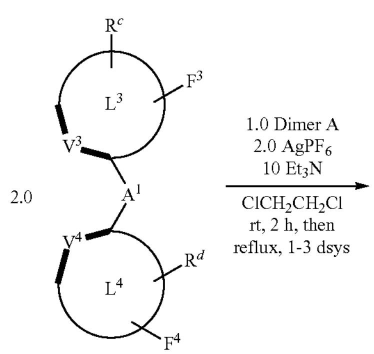
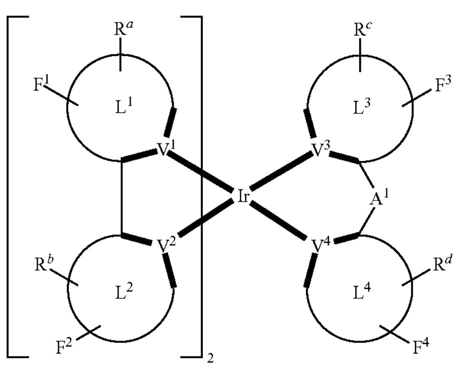
Formula VI (Ir)
-continued
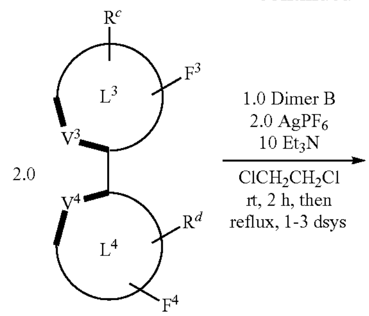
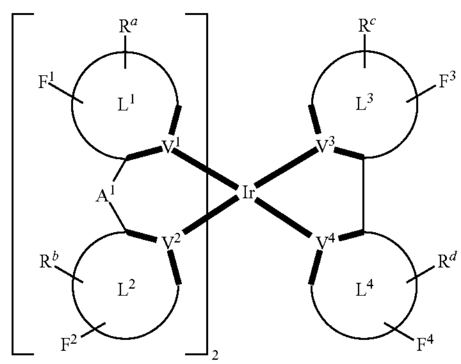
Formula VIII (Ir)
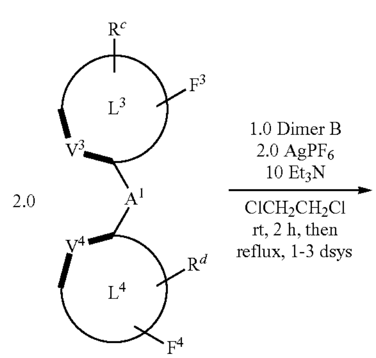

-continued
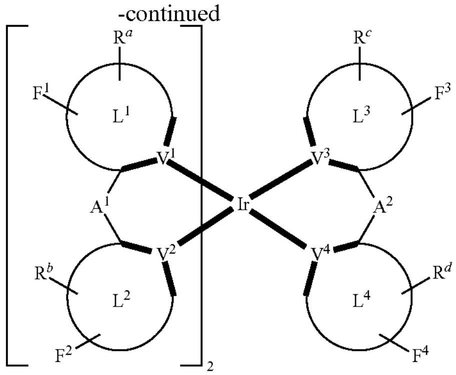
Formula IX (Ir)
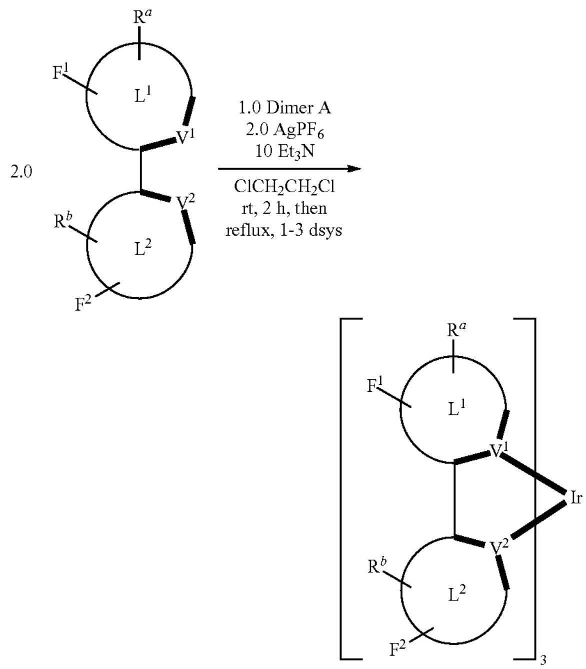
Formula VII (Ir)
-continued
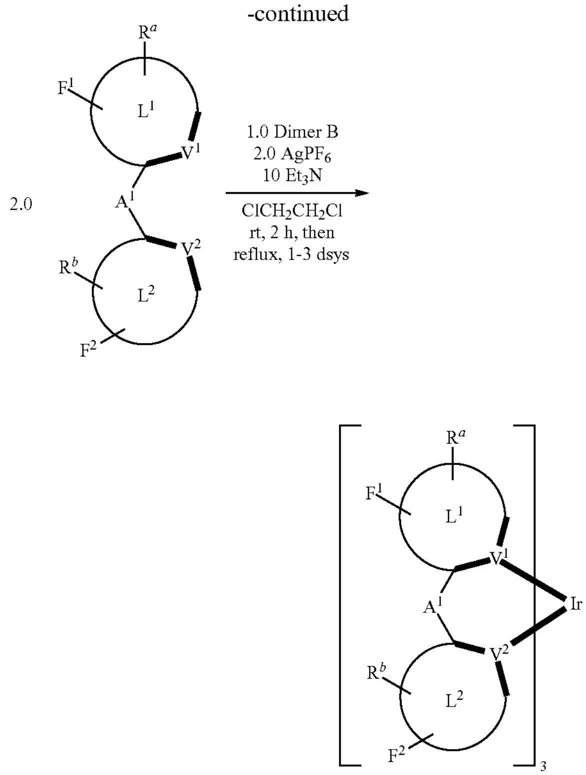
Formula X (Ir)
mer-Formula I-Formula X (Ir) $\xrightarrow[\text{solvent}]{hv}$ fac-Formula I-Formula X (Ir)
The rhodium complexes Formula I (Rh)-Formula X (Rh) can be synthesized through similar methods.
A synthetic route for the disclosed compounds herein also includes:
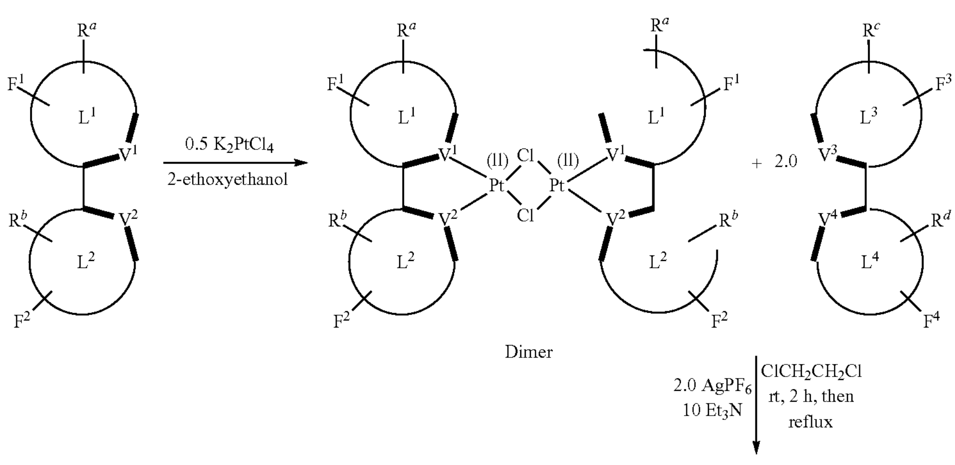

-continued
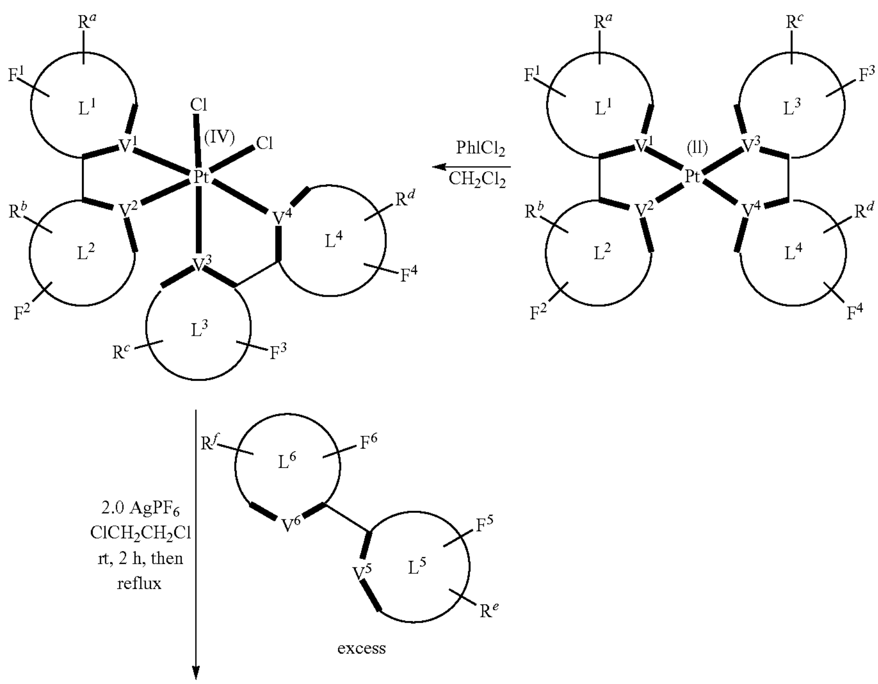
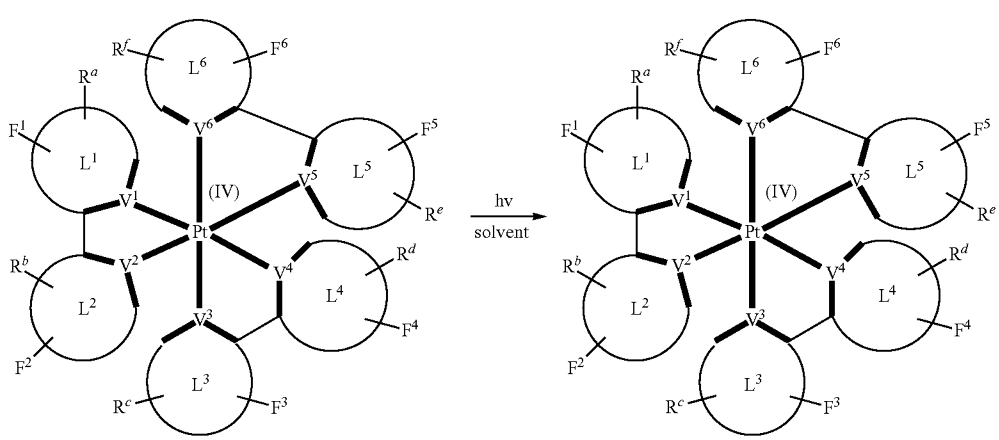
mer-Formula I (Pt) fac-Formula I (Pt)

Other mer- or fac-Pt(IV) complexes Formula I (Pt)-Formula X (Pt) can be obtained through similar methods.

1. Example 1

The iridium complex mer-$(fppy)_2Ir(1a)$ was prepared according to the following scheme:

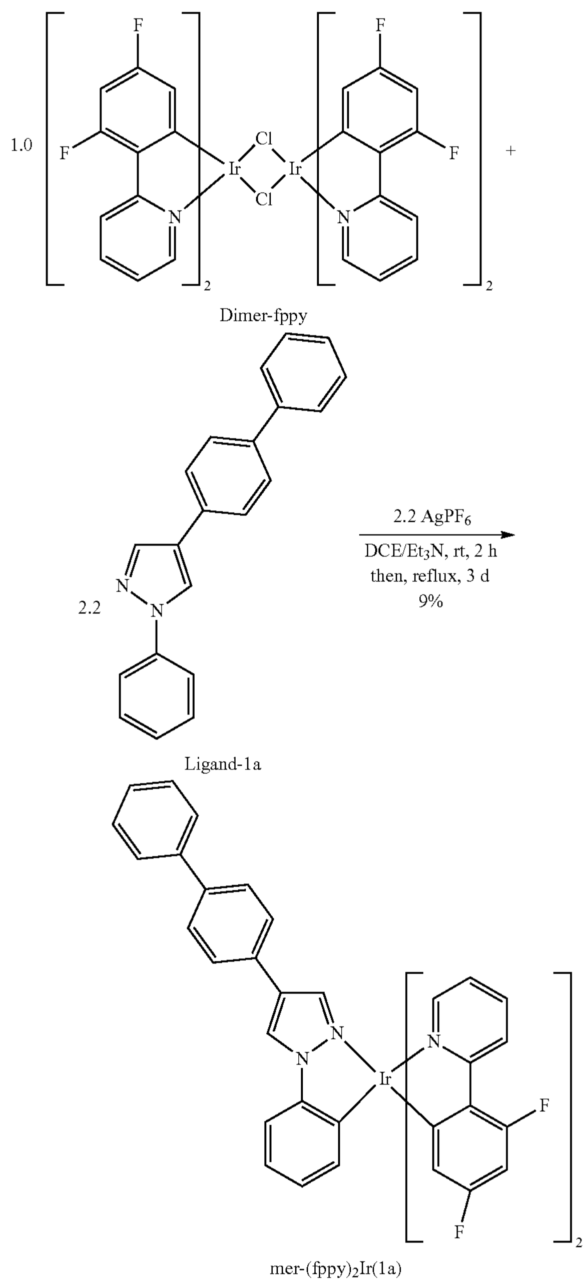

Figure 3:
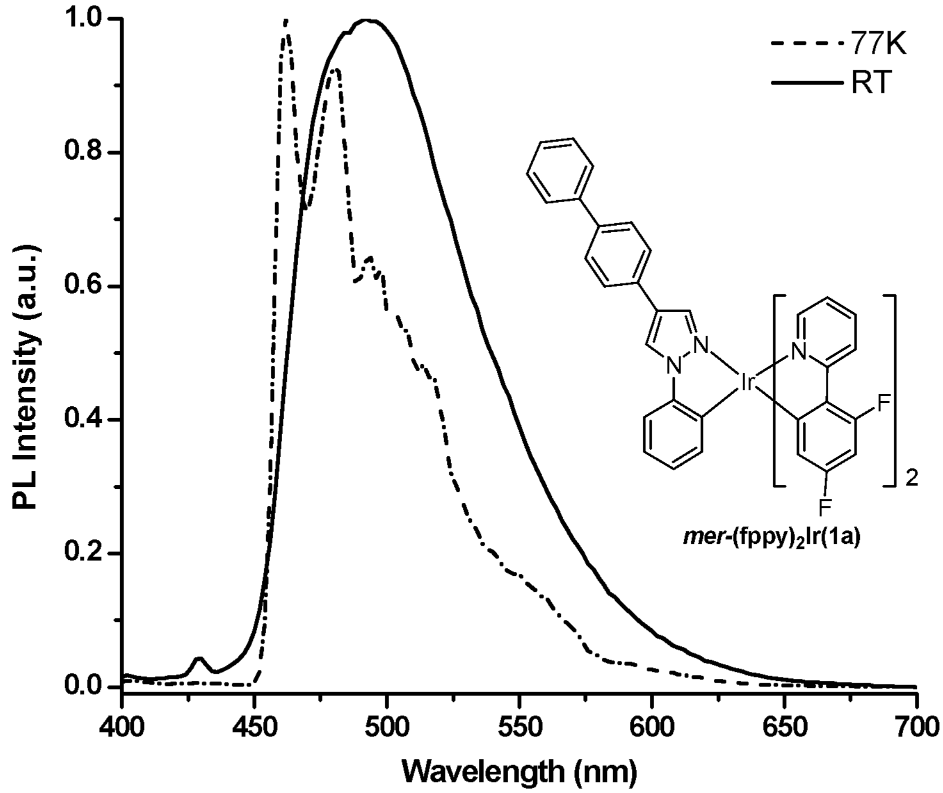
FIG. 3 shows emission spectra of mer-$(fppy)_2Ir(1a)$ in $CH_2Cl_2$ at room temperature and in 2-methyltetrahydrofuran at 77K.

A mixture of Dimer-fppy (230 mg, 0.19 mmol, 1.0 eq), ligand Ligand-1a (124 mg, 0.42 mmol, 2.2 eq) and $AgPF_6$ (106 mg, 0.42 mmol, 2.2 eq) in $ClCH_2CH_2Cl$ (20 mL) and $Et_3N$ (1 mL) under an atmosphere of nitrogen was stirred at room temperature for 2 hours, then refluxed for 3 days and cooled to ambient temperature. The solvent was removed, and the residue was purified through column chromatography on silica gel using dichloromethane/hexane (1:1) as eluent to obtain the desired product mer-$(fppy)_2Ir(1a)$ 30 mg as a yellow solid in 9% yield. $^1H$ NMR (DMSO-$d_6$, 400 MHz): δ 5.73 (d, J=7.2 Hz, 1H), 5.96 (d, J=7.6 Hz, 1H), 6.65-6.81 (m, 3H), 6.89 (t, J=2.0 Hz, 1H), 7.05 (t, J=2.0 Hz, 1H), 7.14-7.19 (m, 2H), 7.36-7.39 (m, 1H), 7.45-7.52 (m, 3H), 7.69-7.93 (m, 10H), 8.13 (d, J=5.6 Hz, 1H), 8.18 (d, J=8.0 Hz, 1H), 8.24 (d, J=8.0 Hz, 1H), 9.38 (s, 1H). Emission spectra of mer-$(fppy)_2Ir(1a)$ at room temperature in $CH_2Cl_2$ and at 77K in 2-methyltetrahydrofuran are shown in FIG. 3.

2. Example 2

The iridium complex fac-$(fppy)_2Ir(1a)$ was prepared according to the following scheme:

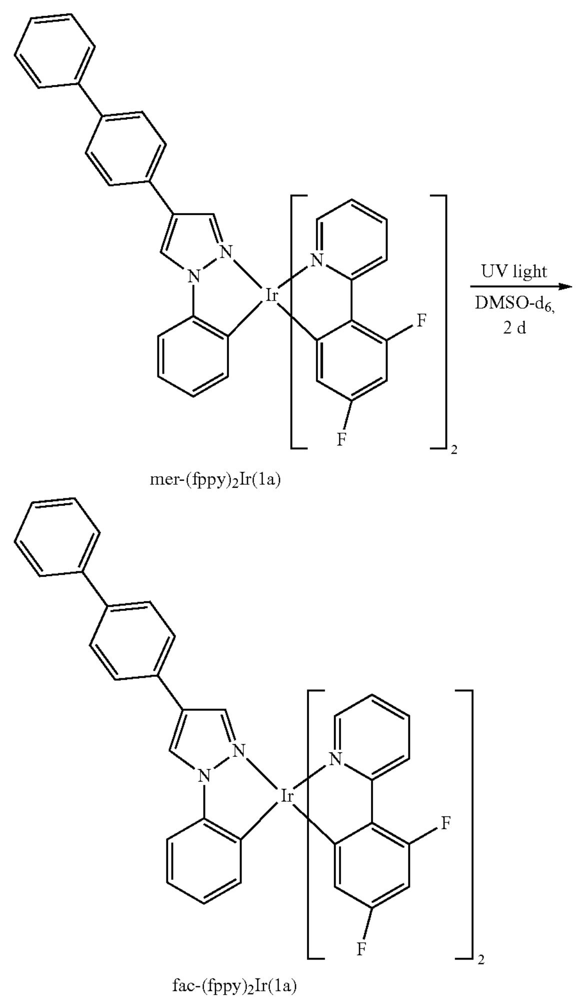

Figure 4:
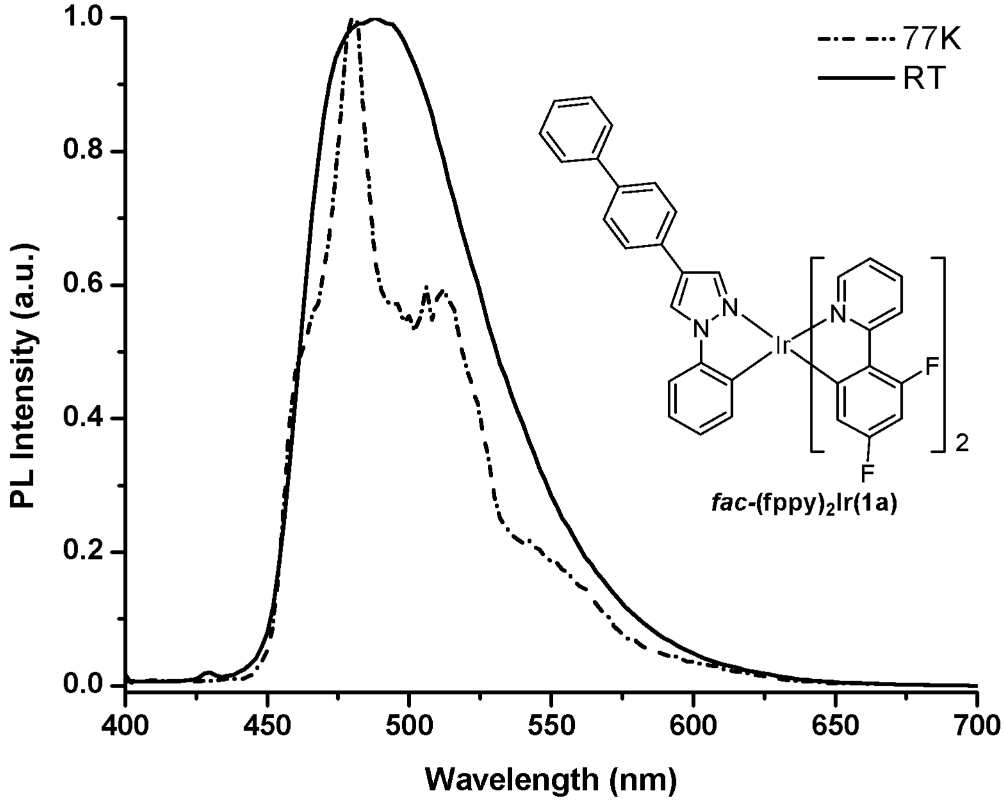
FIG. 4 shows emission spectra of fac-$(fppy)_2Ir(1a)$ in $CH_2Cl_2$ at room temperature and in 2-methyltetrahydrofuran at 77K.

A solution of mer-$(fppy)_2Ir(1a)$ in DMSO-$d_6$ was kept under UV light for 2 days, monitored by $^1H$ NMR until the mer-$(fppy)_2Ir(1a)$ was consumed completely to give fac-$(fppy)_2Ir(1a)$. $^1H$ NMR (DMSO-$d_6$, 400 MHz): δ 6.00 (dd, J=9.6, 2.4 Hz, 1H), 6.09 (dd, J=9.2, 2.4 Hz, 1H), 6.39 (dd, J=7.6, 0.8 Hz, 1H), 6.56-6.63 (m, 2H), 6.66 (t, J=8.0 Hz, 1H), 6.84-6.88 (m, 1H), 7.14 (t, J=7.6 Hz, 1H), 7.19 (t, J=7.2 Hz, 1H), 7.27 (t, J=7.2 Hz, 1H), 7.37 (t, J=7.6 Hz, 2H), 7.54-7.71 (m, 10H), 7.81-7.86 (m, 2H), 8.15 (t, J=7.2 Hz, 2H), 9.24 (s, 1H). Emission spectra of fac-$(fppy)_2Ir(1a)$ at room temperature in $CH_2Cl_2$ and at 77K in 2-methyltetrahydrofuran are shown in FIG. 4.

3. Example 3

The iridium complex mer-(fppy)Ir$(1a)_2$ was prepared according to the following scheme:

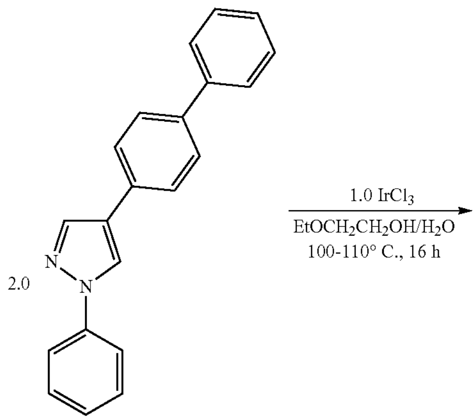

Ligand-1a

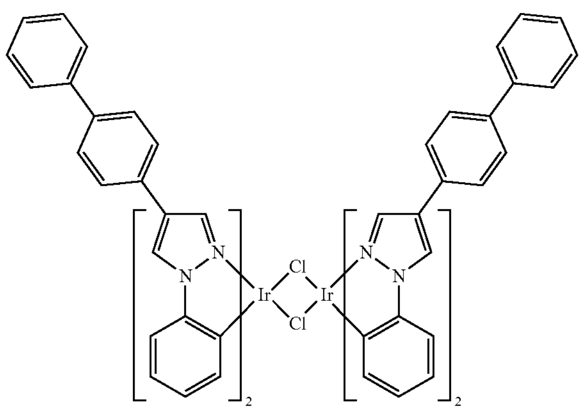

Dimer-1a

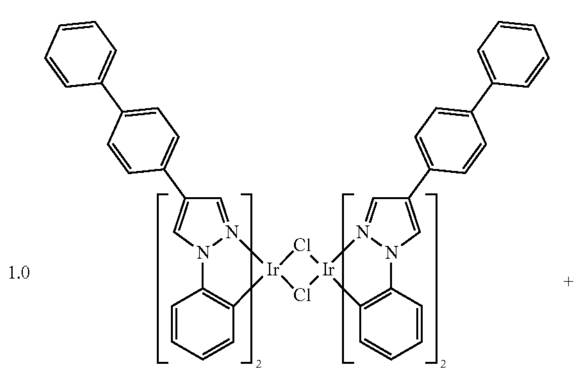

Dimer-1a

-continued

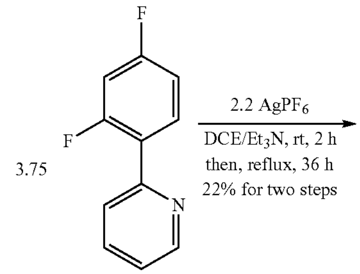

Ligand-fppy

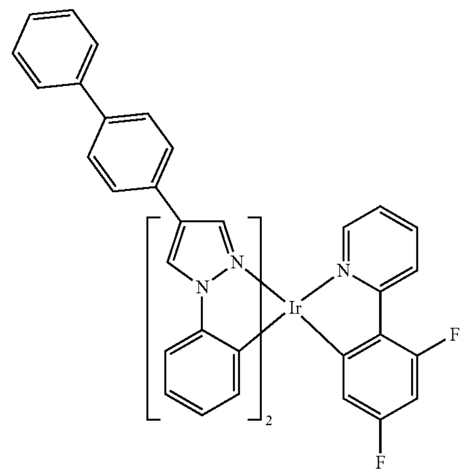

mer-$(fppy)_2Ir(1a)_2$

Synthesis of Iridium Complex Dimer-1a:

Dimer-1a

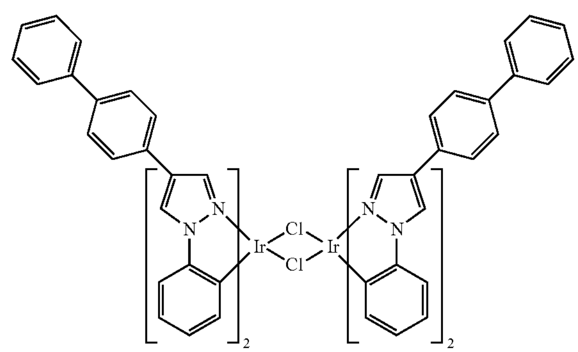

A mixture of Ligand-1a (575 mg, 1.94 mmol, 2.0 eq), $IrCl_3$ (289 mg, 0.97 mmol, 1.0 eq) in $EtCH_2CH_2OH$ (10 mL) and $H_2O$ (3.3 mL) under an atmosphere of nitrogen was stirred at 100-110° C. for 16 hours and cooled to ambient temperature. The precipitate was filtered off and washed with water, methanol, and $Et_2O$. Then the collected solid was dried in air to give the desired product Dimer-1a as a light yellow solid (565 mg), which was used directly for the next steps. $^1H$ NMR (DMSO-$d_6$, 400 MHz): δ 5.97 (d, J=7.2 Hz, 2H), 6.34 (d, J=7.6 Hz, 2H), 6.68-6.75 (m, 4H), 6.91-6.99 (m, 4H), 7.38 (t, J=7.6 Hz, 4H), 7.49 (t, J=7.6 Hz, 8H), 7.60 (d, J=8.0 Hz, 2H), 7.63 (d, J=8.0 Hz, 2H), 7.74-7.88 (m, 20H), 7.97 (d, J=7.56 Hz, 4H), 8.56 (s, 2H), 8.87 (s, 2H), 9.40 (s, 2H), 9.53 (s, 2H).

Synthesis of Iridium Complex mer-(fppy)Ir(1a)$_2$:

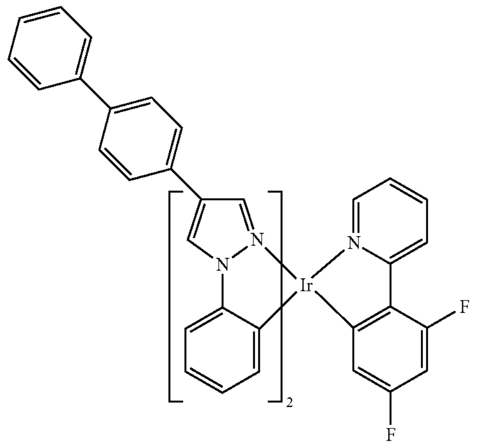

mer-(fppy)Ir(1a)$_2$

Figure 5:
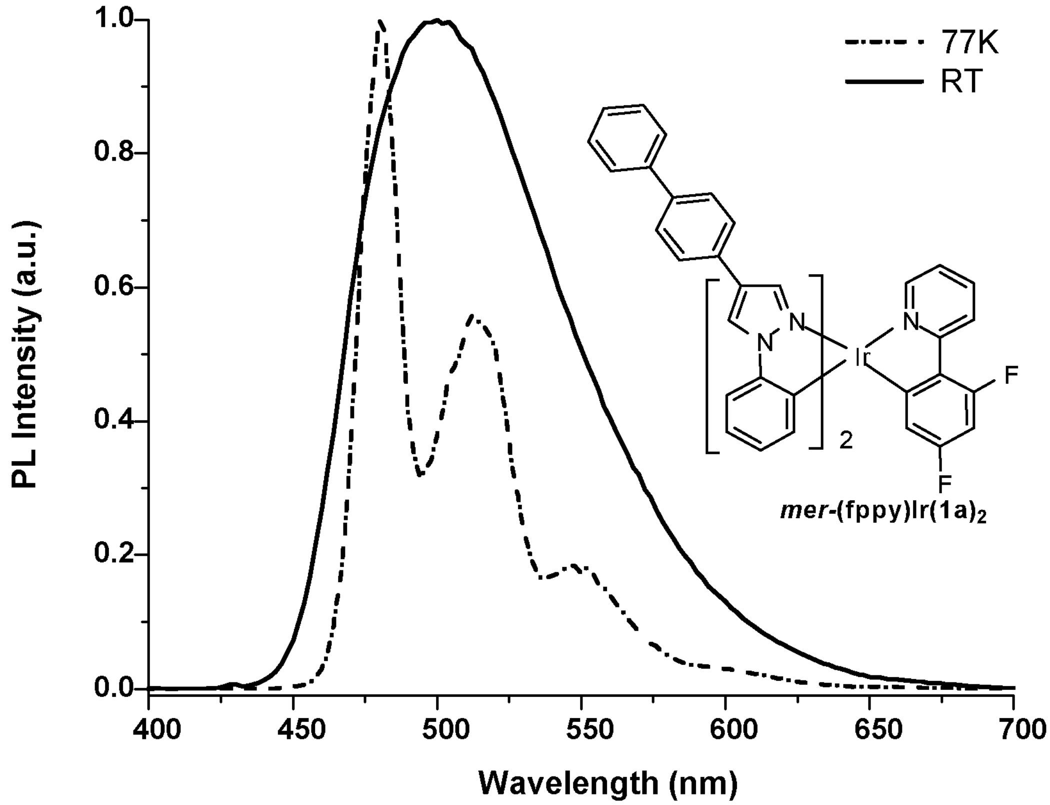
FIG. 5 shows emission spectra of mer-$(fppy)Ir(1a)_2$ in $CH_2Cl_2$ at room temperature and in 2-methyltetrahydrofuran at 77K.

A mixture of Dimer-1a (261 mg, 0.16 mmol, 1.0 eq), ligand Ligand-fppy (115 mg, 0.60 mmol, 3.75 eq) and $AgPF_6$ (126 mg, 0.50 mmol, 3.1 eq) in $ClCH_2CH_2Cl$ (20 mL) and $Et_3N$ (1 mL) under an atmosphere of nitrogen was stirred at room temperature for 2 hours, then refluxed for 36 hours and cooled to ambient temperature. The solvent was removed and the residue was purified through column chromatography on silica gel using dichloromethane/hexane (1:1) as eluent to obtain the desired product mer-(fppy)Ir (1a)$_2$ 94 mg as a yellow solid in 22% yield. $^1$H NMR (DMSO-d$_6$, 400 MHz): δ 6.39 (d, J=8.0 Hz, 1H), 6.45 (dd, J=8.0, 3.2 Hz, 1H), 6.68-6.79 (m, 3H), 6.89-6.96 (m, 2H), 7.03 (t, J=8.0 Hz, 1H), 7.25 (t, J=7.2 Hz, 1H), 7.34-7.39 (m, 3H), 7.46-7.50 (m, 5H), 7.61 (d, J=7.6 Hz, 1H), 7.68-7.79 (m, 13H), 7.95 (t, J=8.0 Hz, 1H), 8.19 (d, J=5.6 Hz, 1H), 8.32 (d, J=9.6 Hz, 1H), 9.30 (d, J=8.4 Hz, 2H). Emission spectra of mer-(fppy)Ir(1a)$_2$ at room temperature in $CH_2Cl_2$ and at 77K in 2-methyltetrahydrofuran are shown in FIG. 5.

4. Example 4

The iridium complex fac-(fppy)Ir(1a)$_2$ was prepared according to the following scheme:

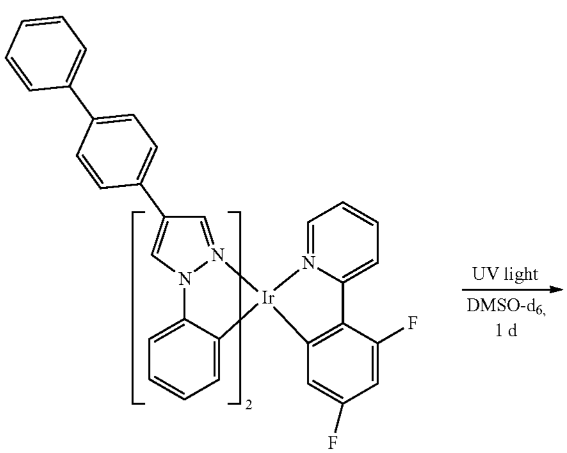

mer-(fppy)$_2$Ir(1a)$_2$

-continued

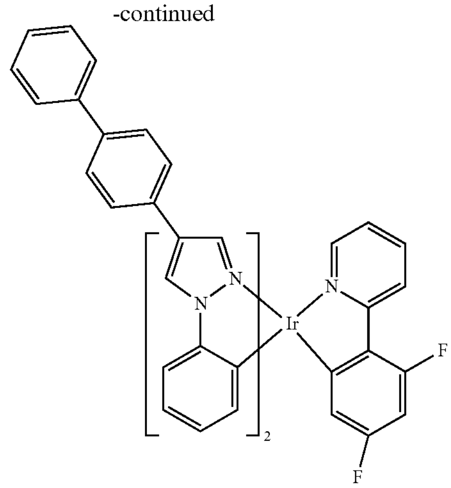

fac-(fppy)$_2$Ir(1a)$_2$

Figure 6:
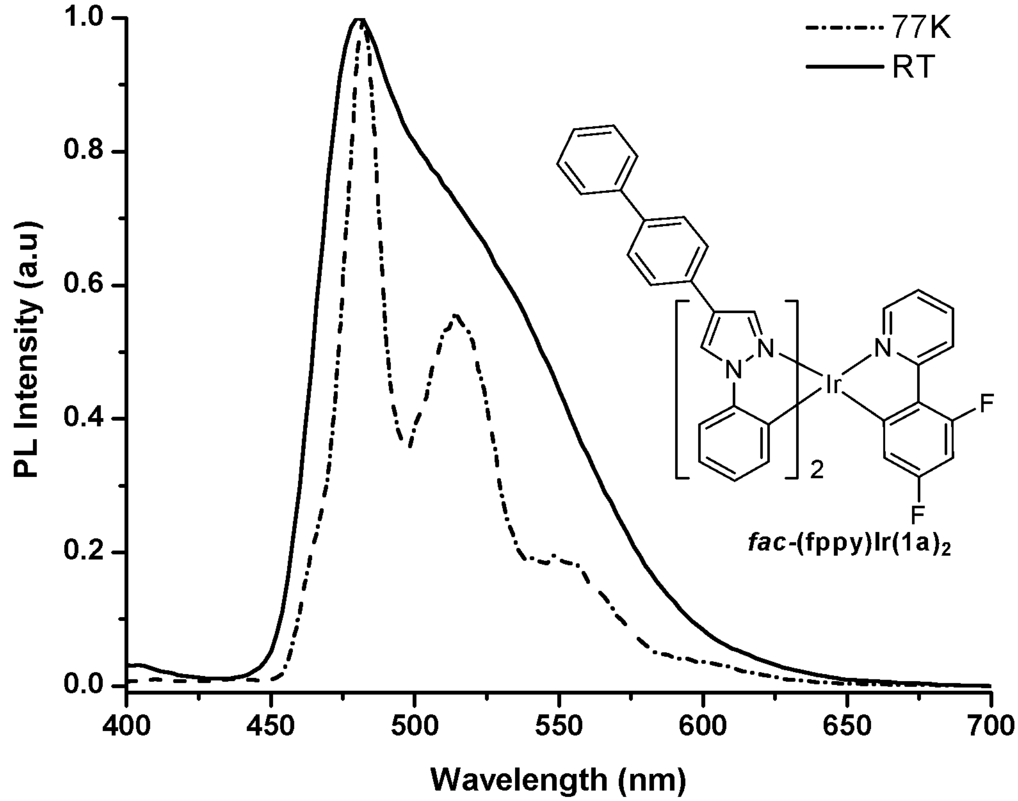
FIG. 6 shows emission spectra of fac-$(fppy)Ir(1a)_2$ in $CH_2Cl_2$ at room temperature and in 2-methyltetrahydrofuran at 77K.

A solution of mer-(fppy)Ir(1a)$_2$ in DMSO-d$_6$ was kept under UV light for 1 day, monitored by $^1$H NMR until the mer-(fppy)Ir(1a)$_2$ was consumed completely to give fac-(fppy)Ir(1a)$_2$. $^1$H NMR (DMSO-d$_6$, 400 MHz): δ 6.18 (dd, J=7.6, 2.0 Hz, 1H), 6.46 (d, J=5.6 Hz, 1H), 6.54 (d, J=6.0 Hz, 1H), 6.57-6.62 (m, 1H), 6.67 (t, J=5.6 Hz, 2H), 6.86-6.91 (m, 2H), 7.20 (t, J=5.6 Hz, 1H), 7.27-7.32 (m, 2H), 7.37-7.43 (m, 4H), 7.54-7.65 (m, 11H), 7.99 (s, 1H), 7.74-7.76 (m, 4H), 7.86 (t, J=6.0 Hz, 1H), 7.90 (d, J=4.4 Hz, 1H), 8.17 (t, J=6.4 Hz, 1H), 9.25 (s, 2H). Emission spectra of fac-(fppy)$_2$Ir(1a)$_2$ at room temperature in $CH_2Cl_2$ and at 77K in 2-methyltetrahydrofuran are shown in FIG. 6.

5. Example 5

The iridium complex mer-(fppy)Ir(1b)$_2$ was prepared according to the following scheme:

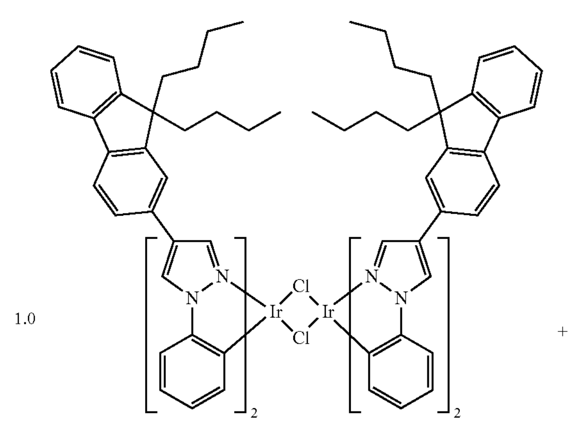

Dimer-1b

-continued

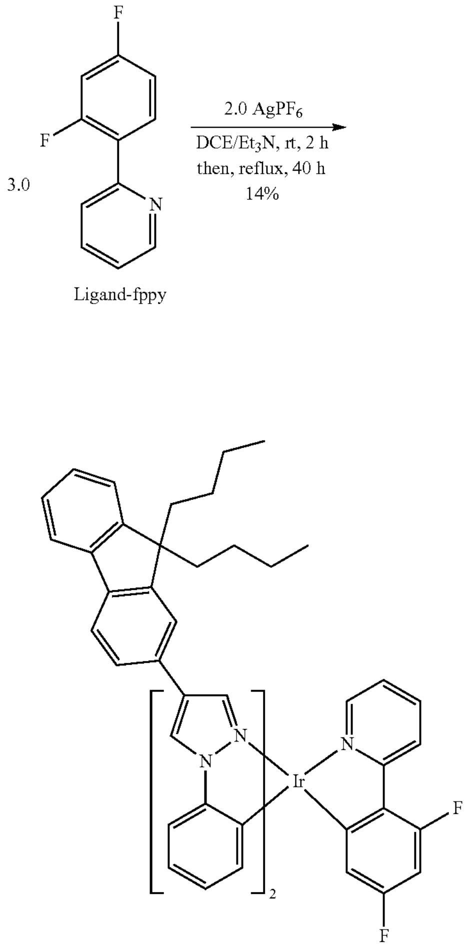

Ligand-fppy mer-(fppy)Ir(1b)$_2$

Figure 7:
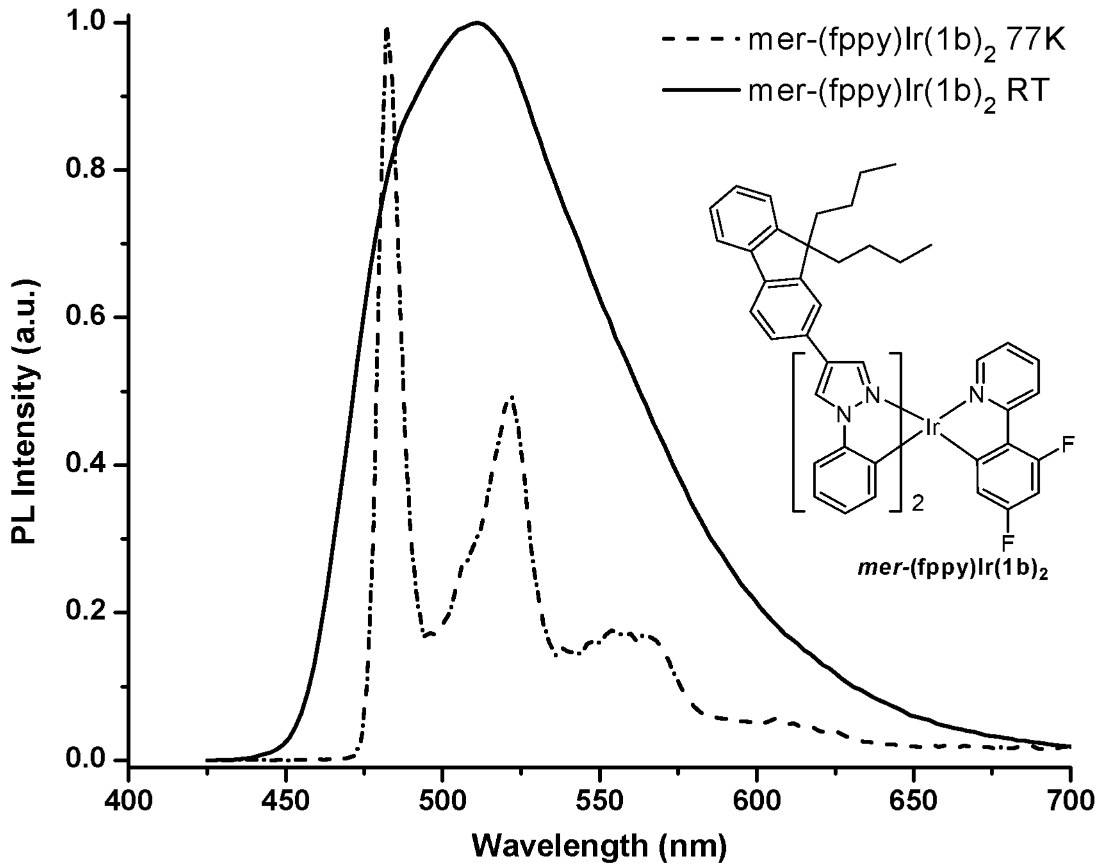
FIG. 7 shows emission spectra of mer-$(fppy)Ir(1b)_2$ in $CH_2Cl_2$ at room temperature and in 2-methyltetrahydrofuran at 77K.

A mixture of Dimer-1b (360 mg, 0.17 mmol, 1.0 eq), ligand Ligand-fppy (81 mg, 0.51 mmol, 3.0 eq) and $AgPF_6$ (86 mg, 0.34 mmol, 2.0 eq) in $ClCH_2CH_2Cl$ (20 mL) and $Et_3N$ (1 mL) under an atmosphere of nitrogen was stirred at room temperature for 2 hours, then refluxed for 40 hours and cooled to ambient temperature. The solvent was removed and the residue was purified through column chromatography on silica gel using dichloromethane/hexane (1:1) as eluent to obtain the desired product mer-(fppy)Ir(1b)$_2$ 52 mg as a yellow solid in 14% yield. $^1$H NMR (DMSO-d$_6$, 400 MHz): δ 0.41-0.57 (m, 8H), 0.58-0.65 (m, 12H), 0.96-1.07 (m, 8H), 2.02-2.06 (m, 8H), 6.43-6.45 (m, 2H), 6.68-6.75 (m, 2H), 6.78 (t, J=7.6 Hz, 1H), 6.90-6.97 (m, 2H), 7.04 (td, J=7.6, 2.0 Hz, 1H), 7.25 (t, J=6.8 Hz, 1H), 7.30-7.34 (m, 5H), 7.42-7.44 (m, 2H), 7.47 (s, 1H), 7.55 (d, J=8.0 Hz, 1H), 7.61-7.65 (m, 2H), 7.70 (d, J=7.6 Hz, 1H), 7.74-7.80 (m, 6H), 7.93-7.97 (m, 1H), 8.19 (d, J=5.2 Hz, 1H), 8.31-8.34 (m, 1H), 9.33 (d, J=7.2 Hz, 2H). Emission spectra of mer-(fppy)Ir(1b)$_2$ at room temperature in $CH_2Cl_2$ and at 77K in 2-methyltetrahydrofuran are shown in FIG. 7.

6. Example 6

The iridium complex fac-(fppy)Ir(1b)$_2$ was prepared according to the following scheme:

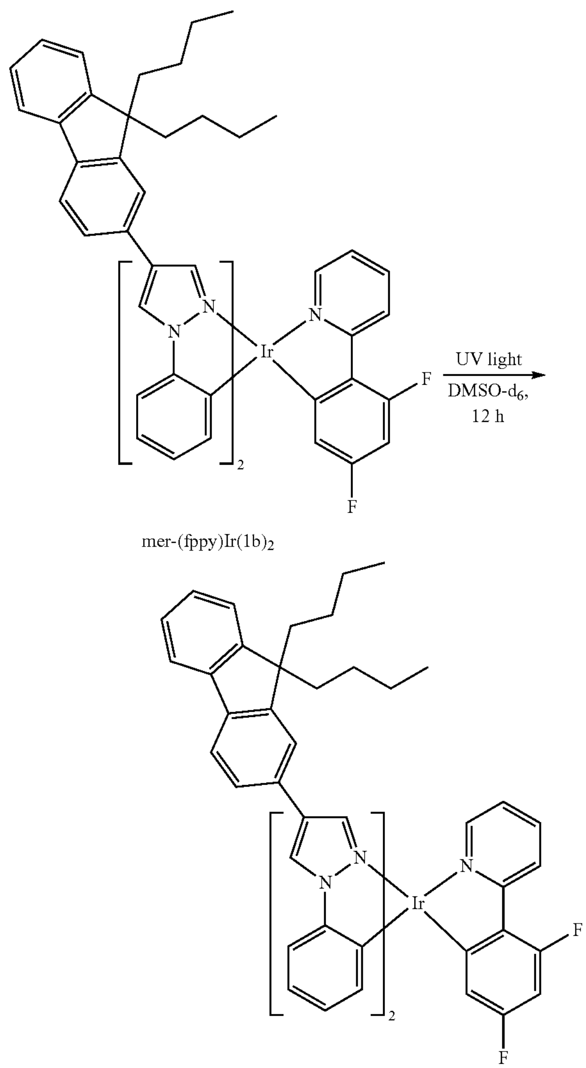

mer-(fppy)Ir(1b)$_2$ fac-(fppy)Ir(1b)$_2$

Figure 8:
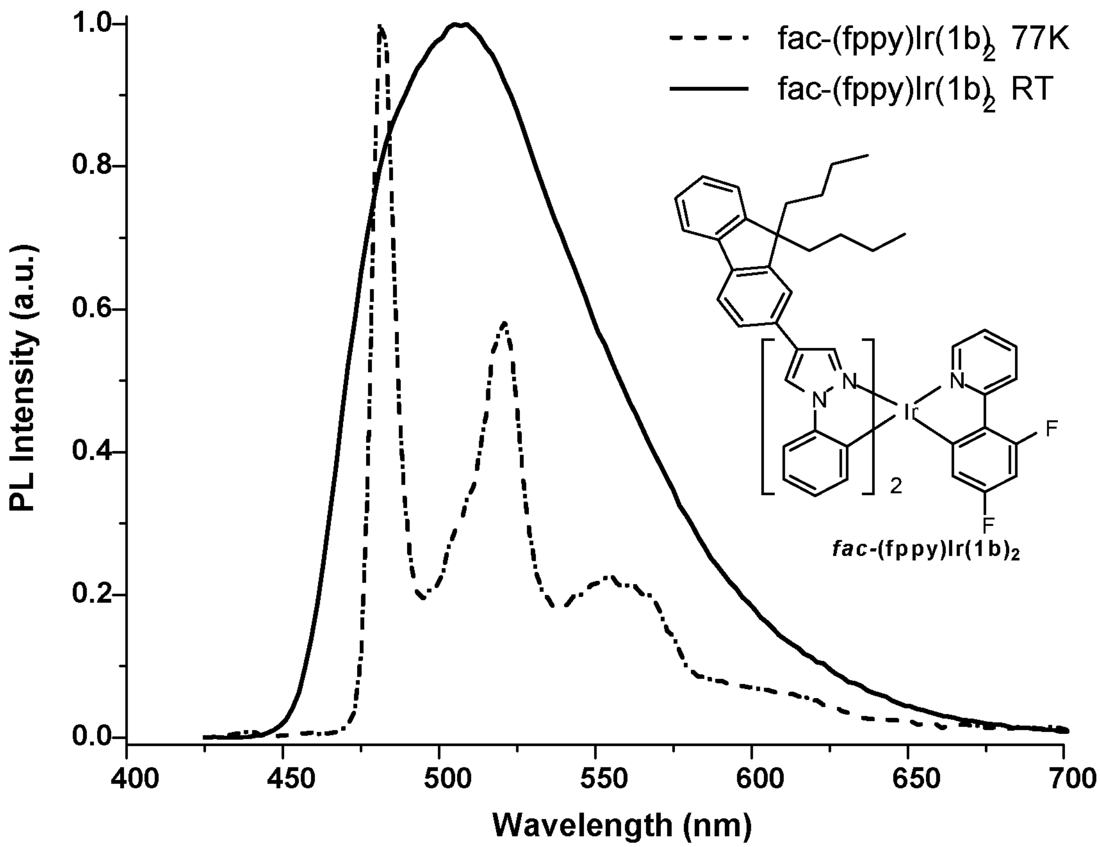
FIG. 8 shows emission spectra of fac-$(fppy)Ir(1b)_2$ in $CH_2Cl_2$ at room temperature and in 2-methyltetrahydrofuran at 77K.

A solution of mer-(fppy)Ir(1b)$_2$ in DMSO-d$_6$ was kept under UV light for 1 day, monitored by $^1$H NMR until the mer-(fppy)Ir(1b)$_2$ was consumed completely to give fac-(fppy)Ir(1b)$_2$. Emission spectra of fac-(fppy)Ir(1b)$_2$ at room temperature in $CH_2Cl_2$ and at 77K in 2-methyltetrahydrofuran are shown in FIG. 8.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A compound of Formula V:

Formula V

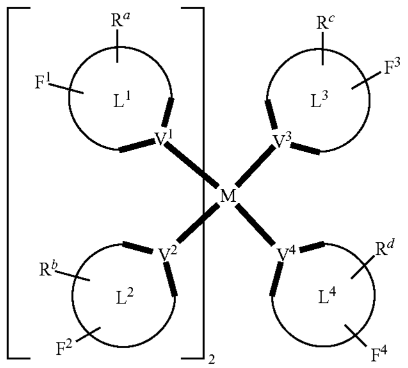

wherein:

M is Ir(III), Rh(III) or Pt(IV), each of $L^1$ is independently a substituted or unsubstituted structure selected from the group consisting of

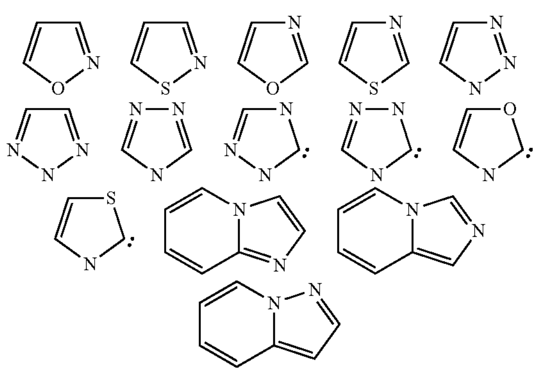

$L^3$ is a substituted or unsubstituted structure selected from the group consisting of

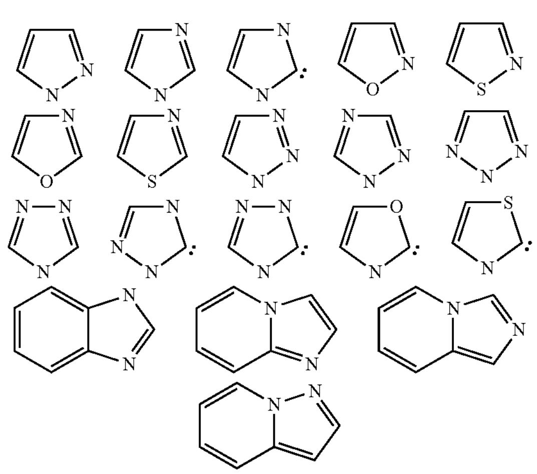

each of $L^2$ and $L^4$ is independently substituted or unsubstituted phenyl, each of $V^1$ and $V^3$ is coordinated with M and is independently N or C, each of $V^2$ and $V^4$ is coordinated with M and is C, each of $F^1$, $F^2$, $F^3$, and $F^4$ is independently present or absent, wherein at least one of $F^1$, $F^2$, $F^3$, and $F^4$ is present, and each $F^1$, $F^2$, $F^3$, and $F^4$ present is a fluorescent luminophore, and each of $R^a$, $R^b$, $R^c$, and $R^d$ is independently present or absent, and if present each $R^a$, $R^b$, $R^c$, and $R^d$ independently represents mono-, di-, or tri-substitutions, and wherein each $R^a$, $R^b$, $R^c$, and $R^d$ present is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

2. The compound of claim 1, wherein the compound has a neutral charge.

3. The compound of claim 1, wherein each of

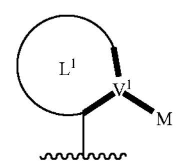

is independently one of the following structures:

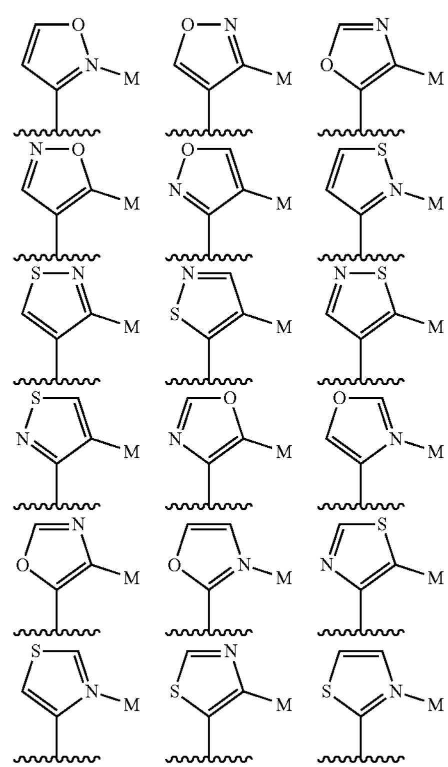

-continued
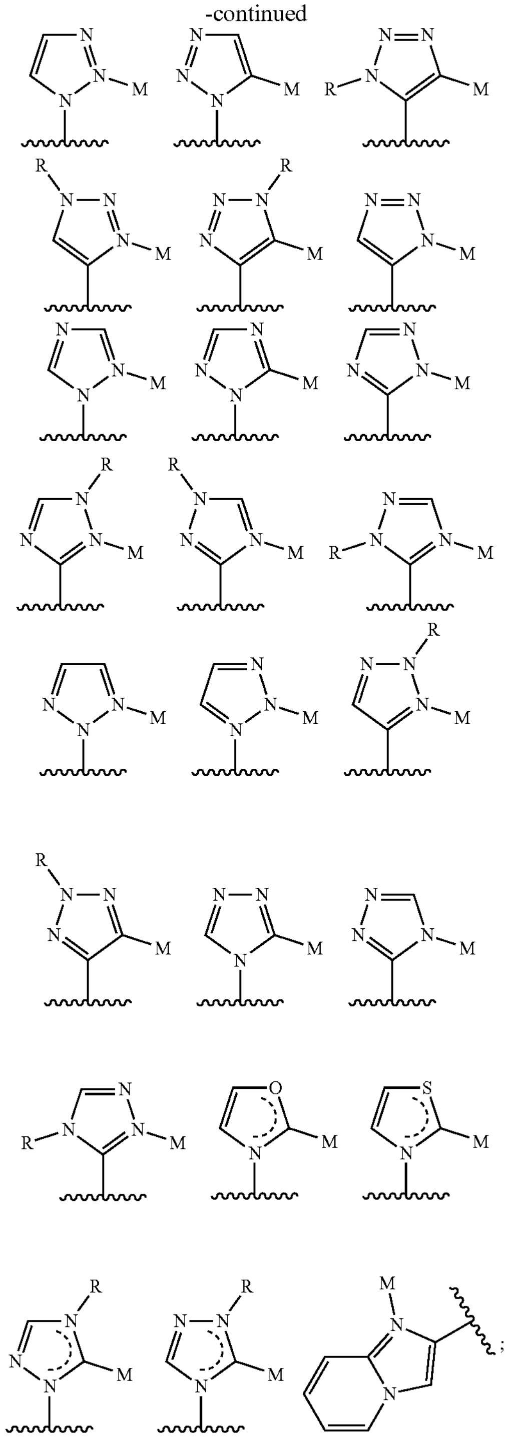
and
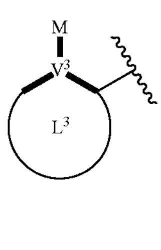
is one of the following structures:
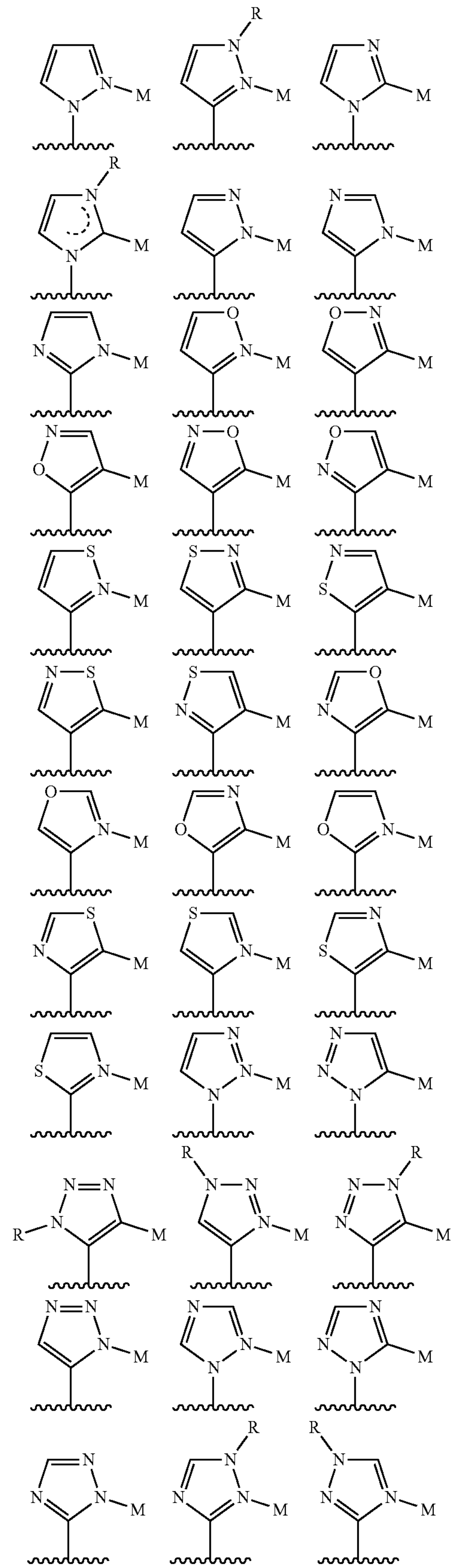

-continued

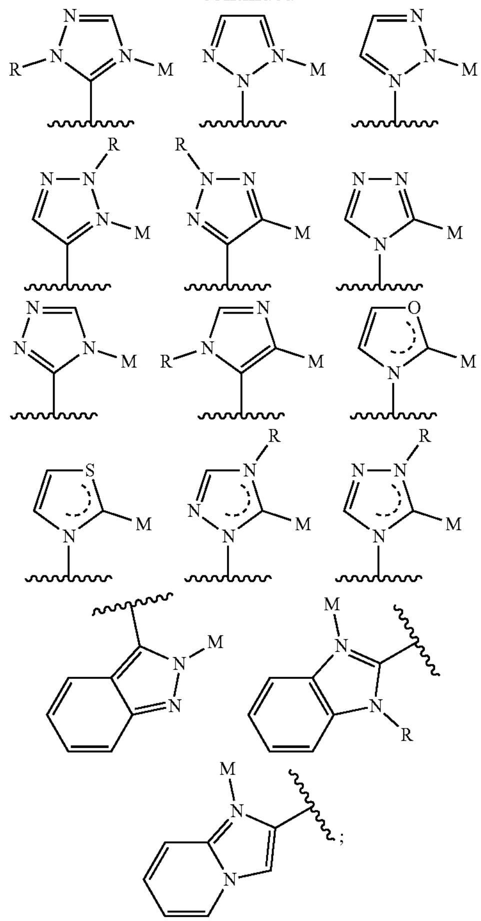

wherein R is deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

4. The compound of claim 1, wherein each of $F^1$, $F^2$, $F^3$, and $F^4$, if present, is independently one of the following structures:

1 Aromatic Hydrocarbons and Their Derivatives

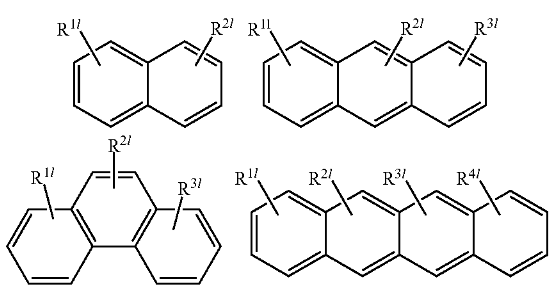

-continued

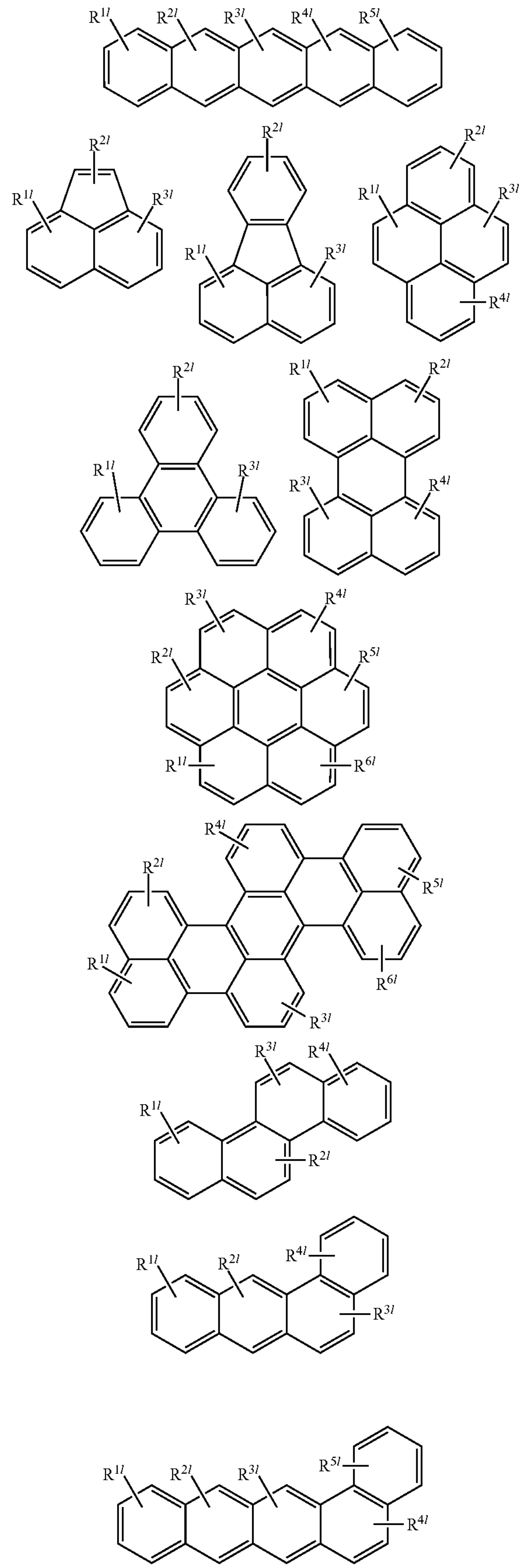

-continued
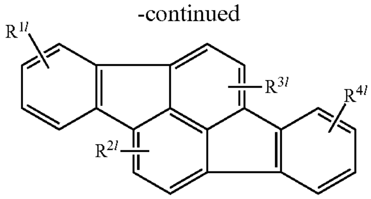
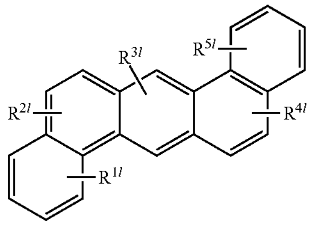
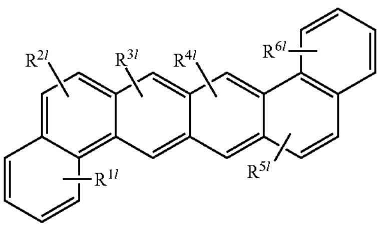
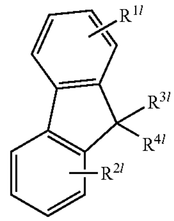
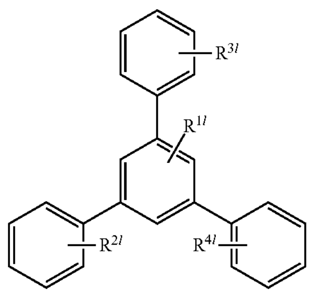
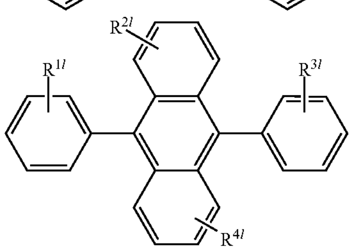
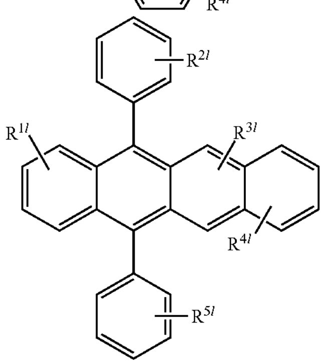
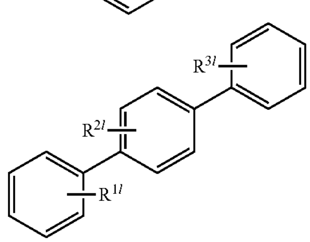
-continued
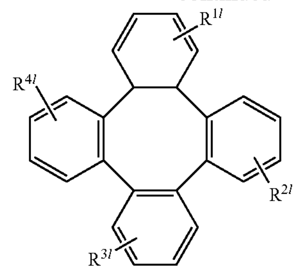
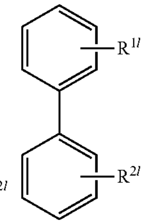
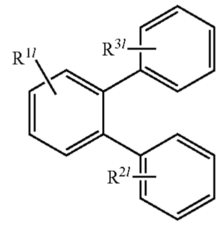
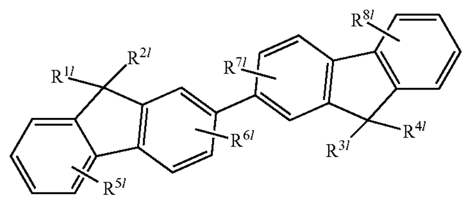
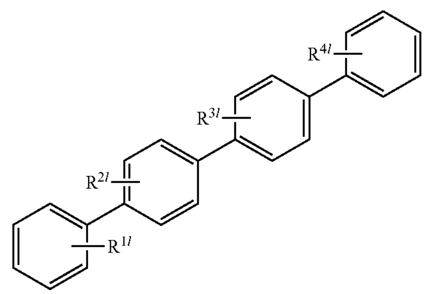
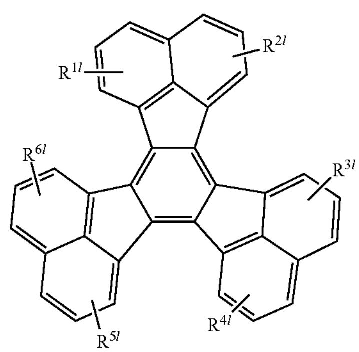
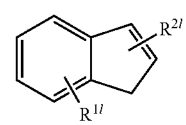
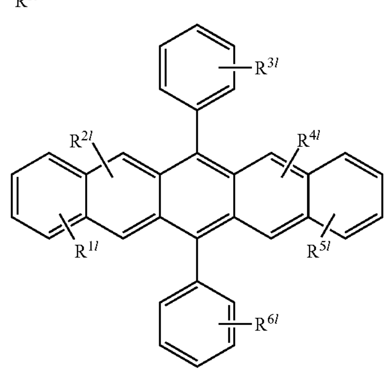

-continued
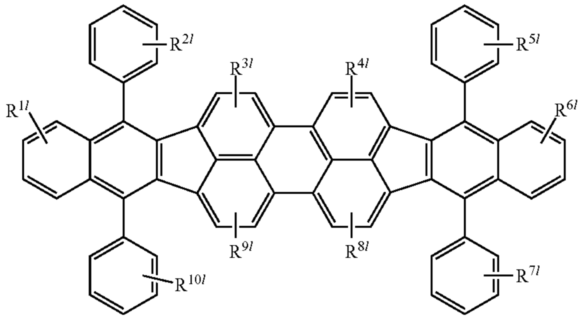
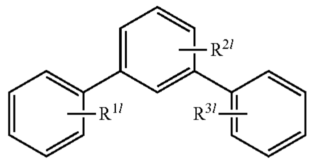
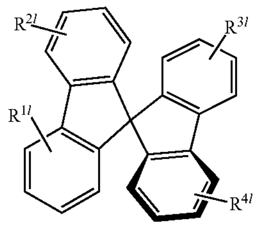
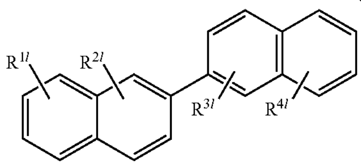
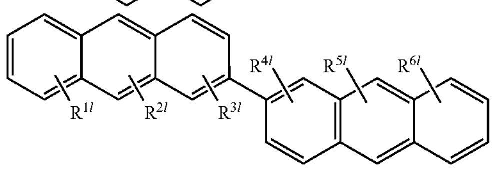
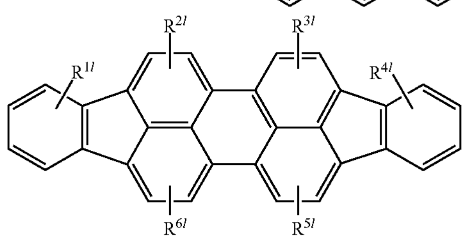
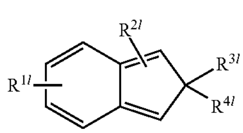
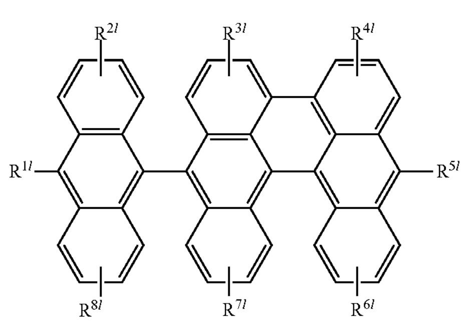
2 Arylethylene, Arylacetylene and Their Derivatives
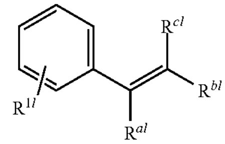
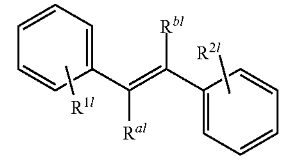
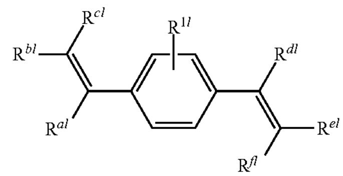
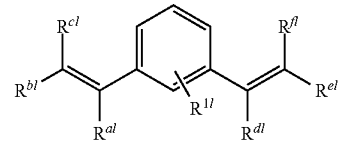
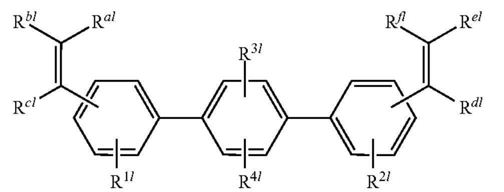
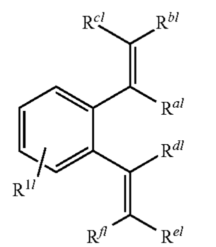
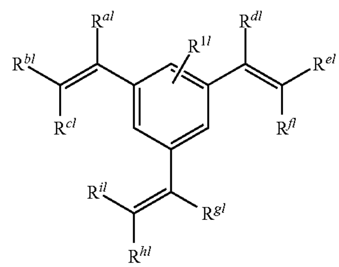
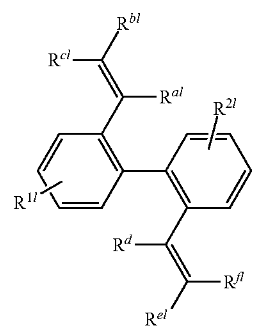
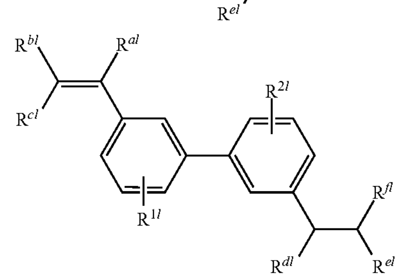
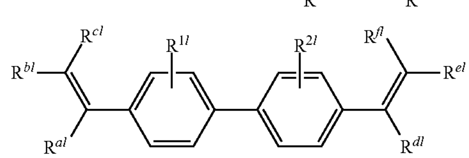

-continued
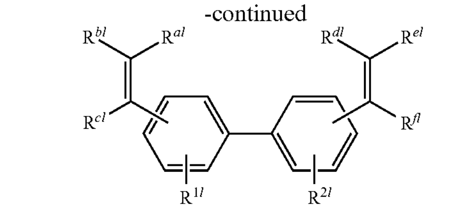
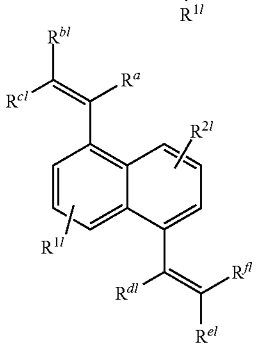
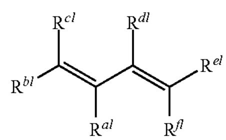
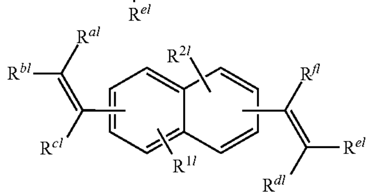
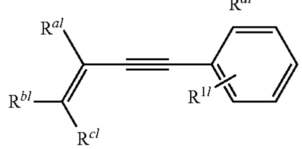
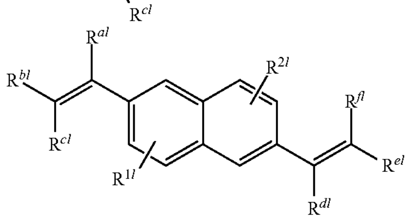
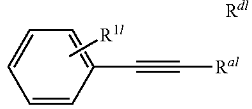
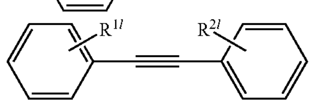
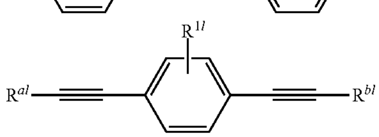
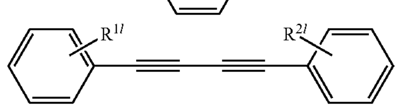
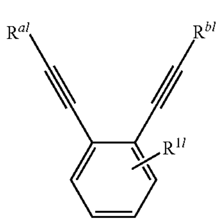
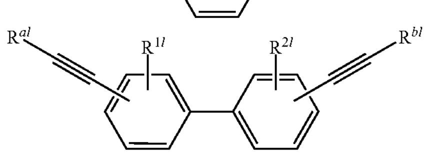
-continued
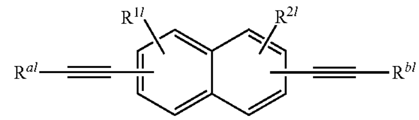
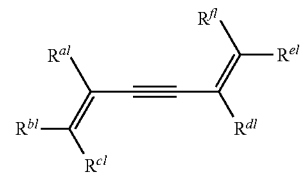
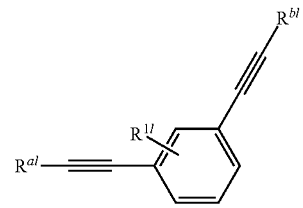
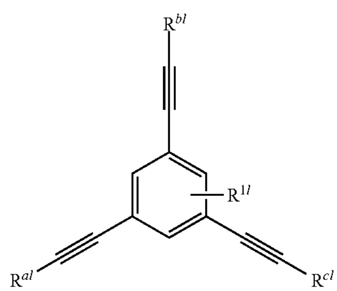
where each of $R^{al}$, $R^{bl}$, $R^{cl}$, $R^{dl}$, $R^{el}$, $R^{fl}$, $R^{gl}$, $R^{hl}$ and $R^{il}$ can be one of the following structure:
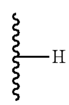
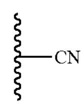
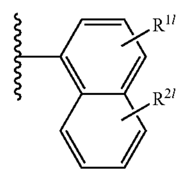
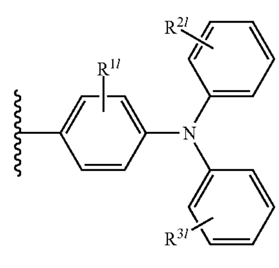
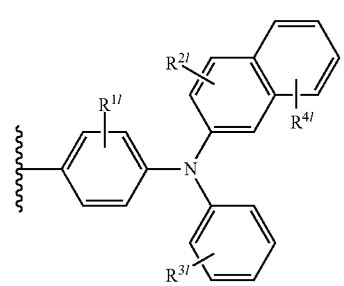

-continued
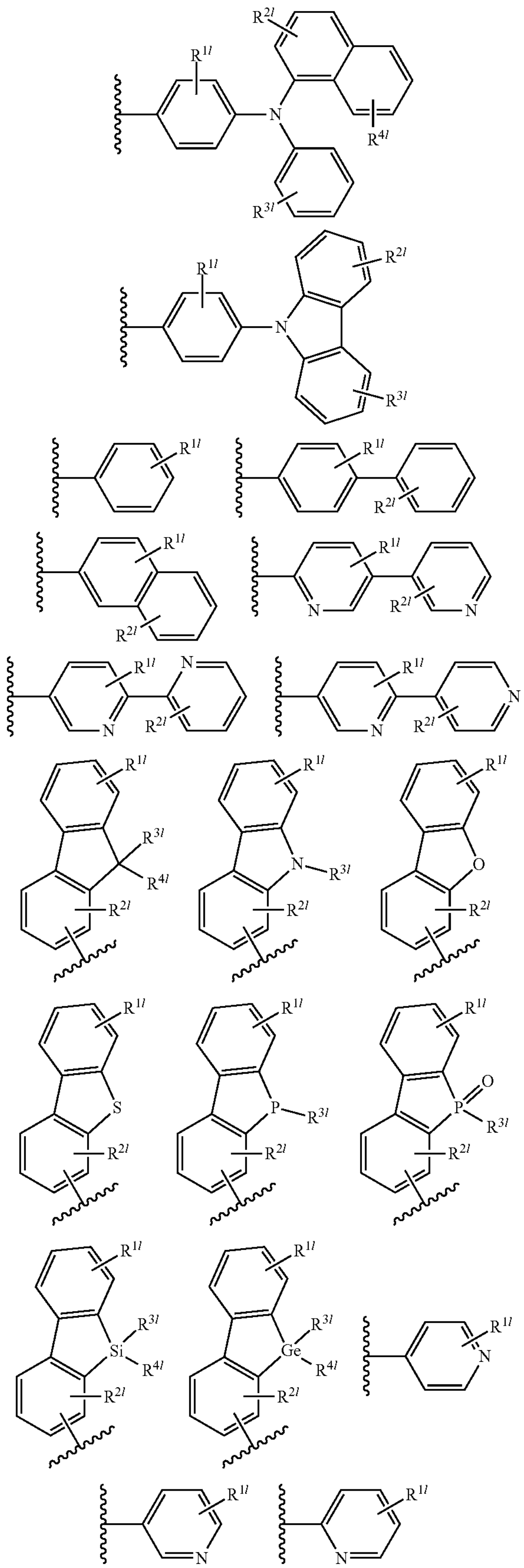
3 Heterocyclic Compounds and Their Derivatives
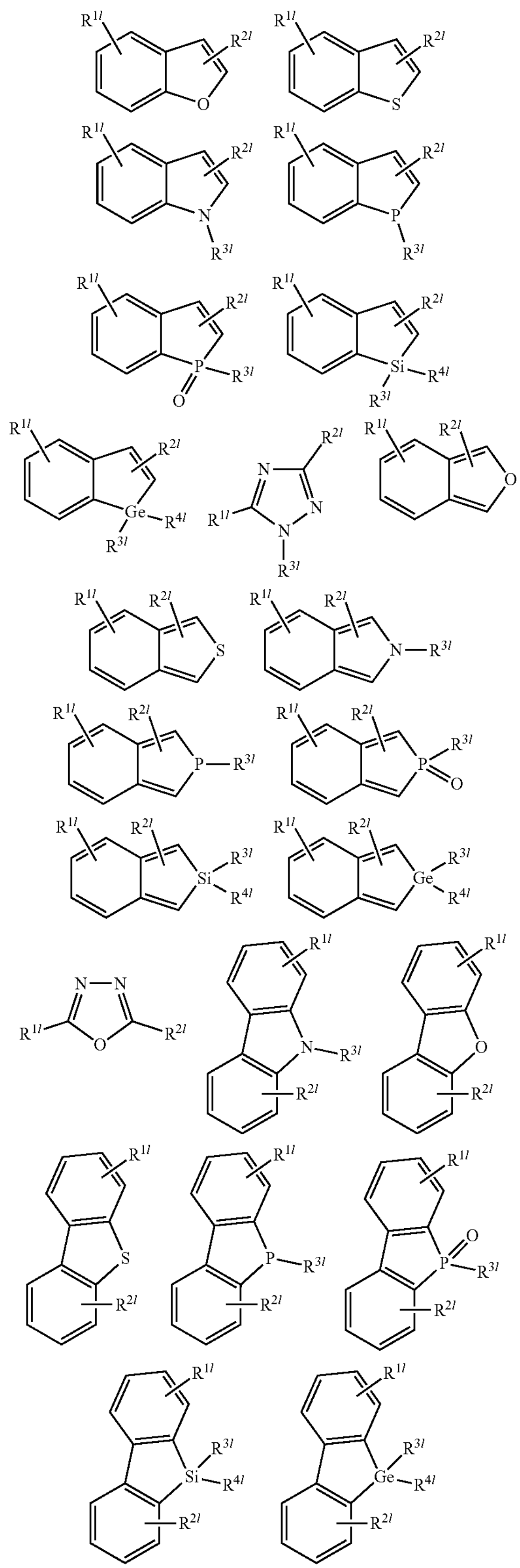

-continued
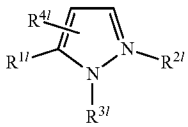
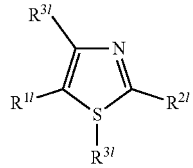
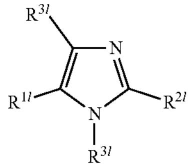
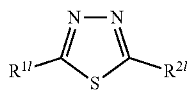
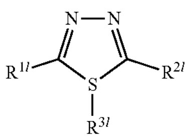
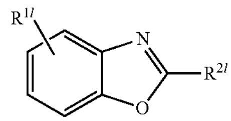
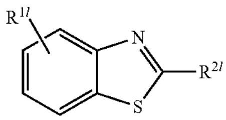
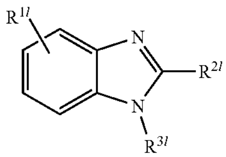
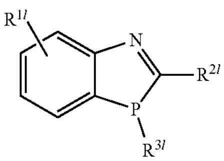
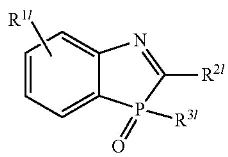
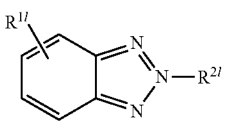
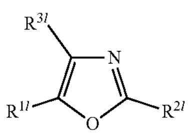
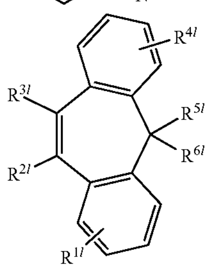
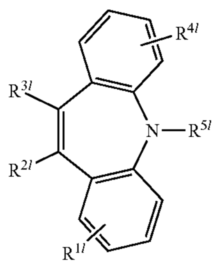
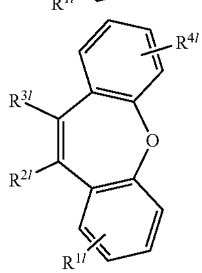
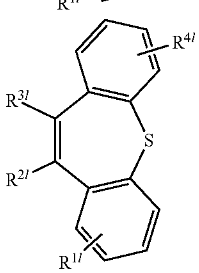
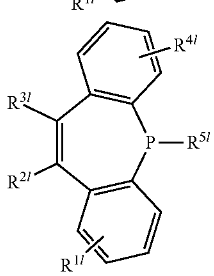
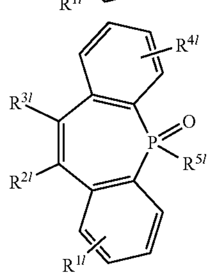
-continued
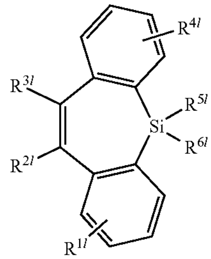
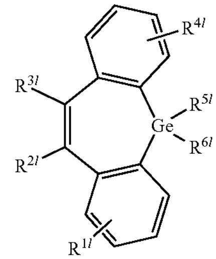
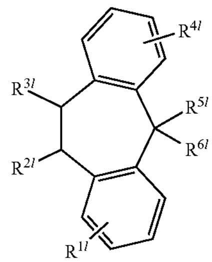
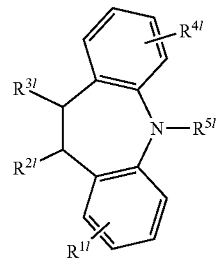
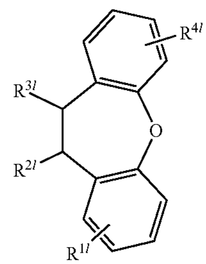
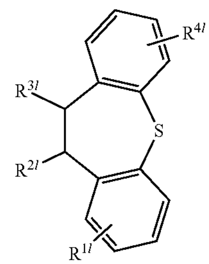
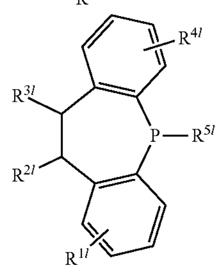
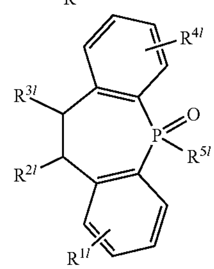
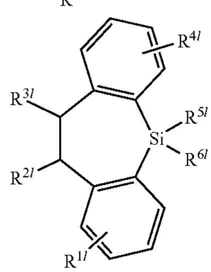
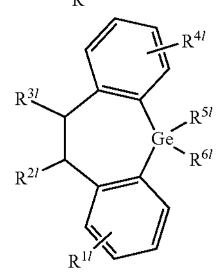
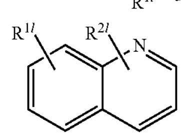
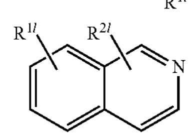
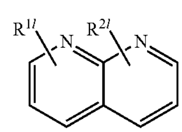
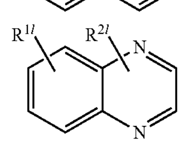
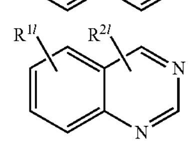
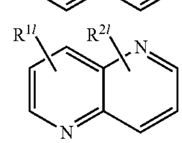
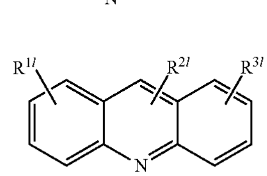
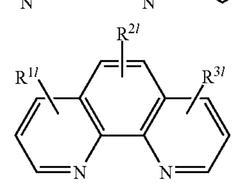

-continued
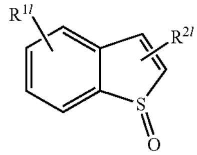
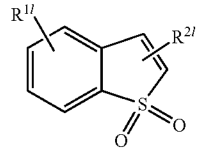
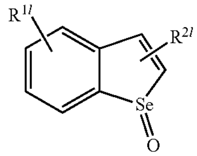
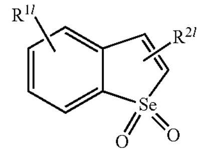
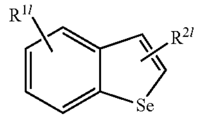
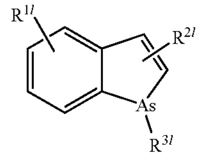
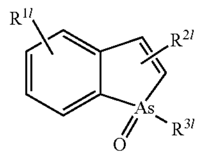
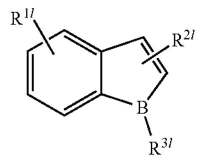
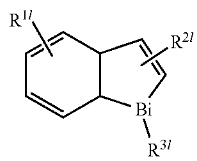
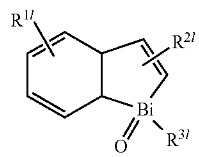
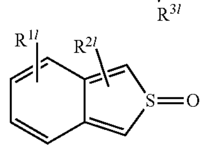
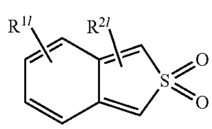
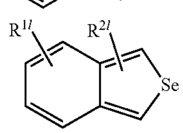
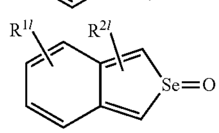
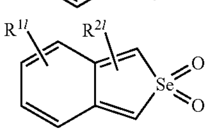
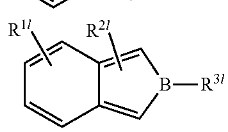
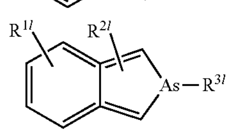
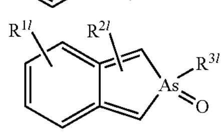
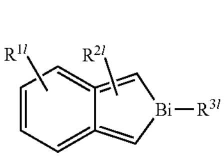
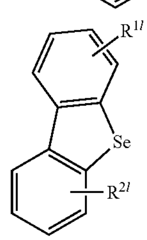
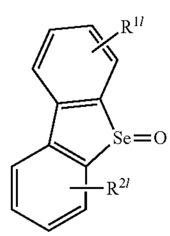
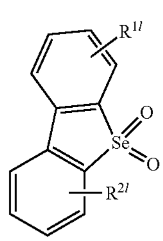
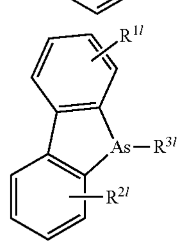
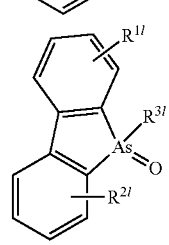
-continued
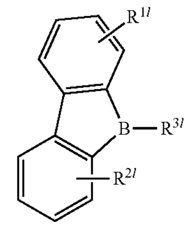
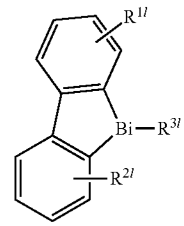
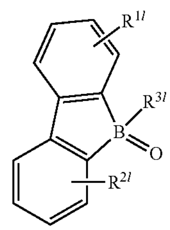
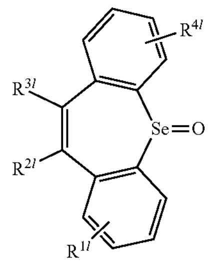
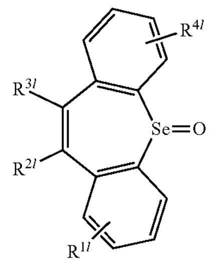
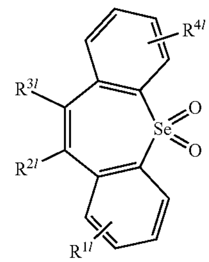
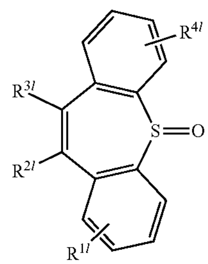
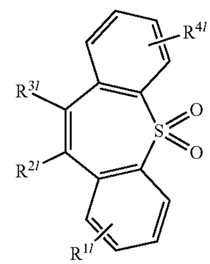
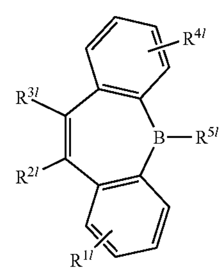
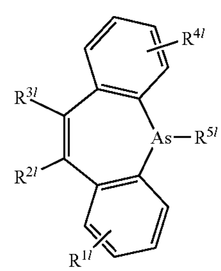
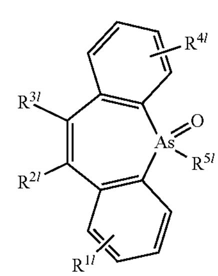
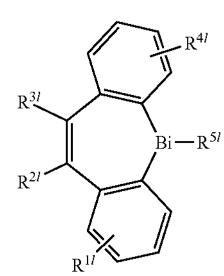

-continued
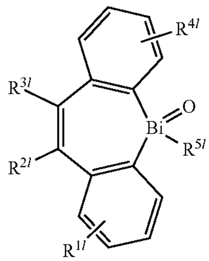
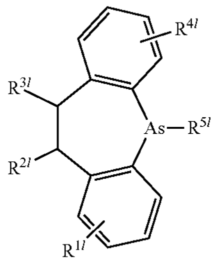
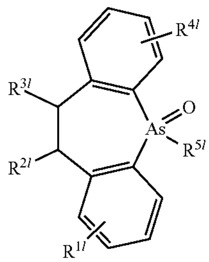
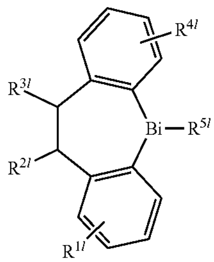
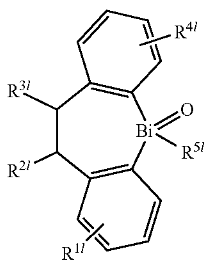
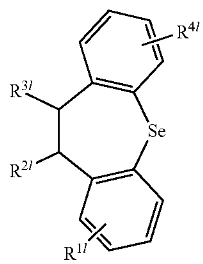
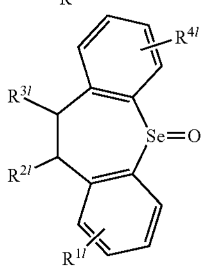
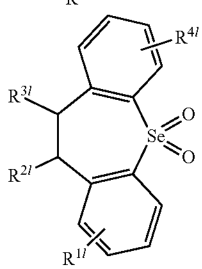
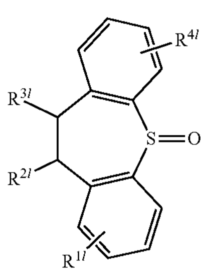
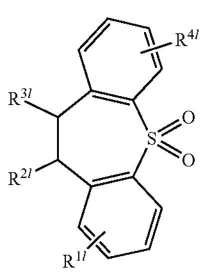
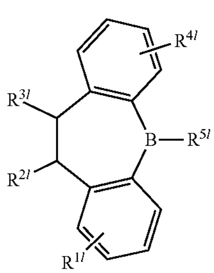
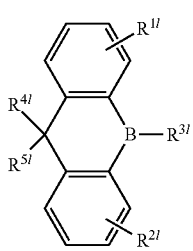
-continued
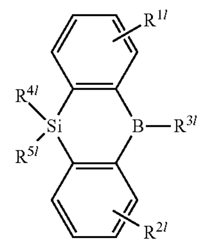
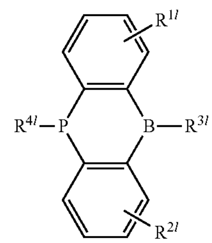
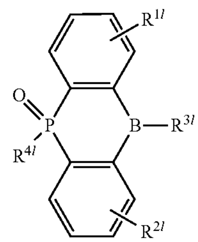
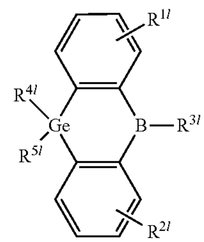
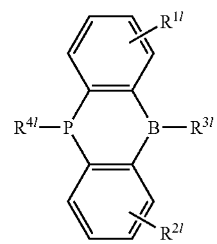
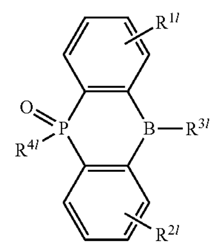
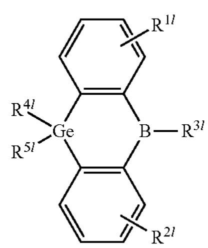
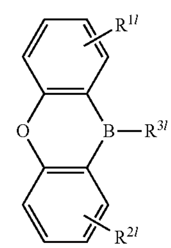
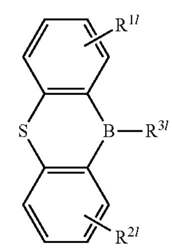
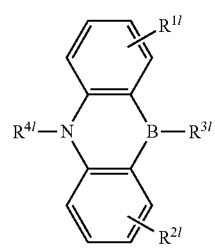
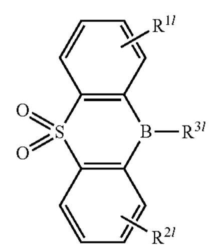
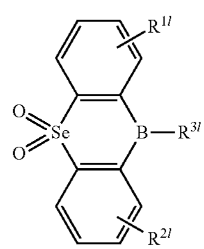
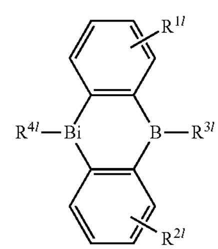
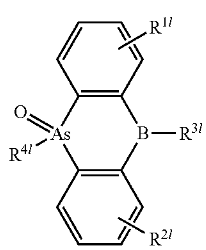
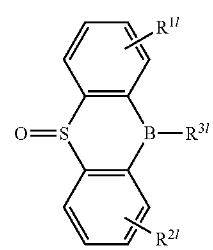

-continued
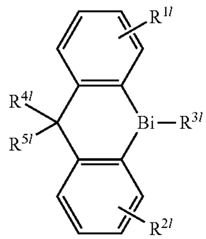
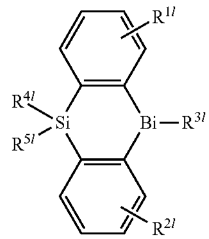
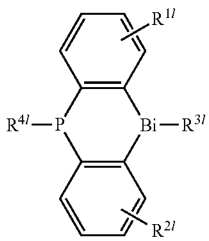
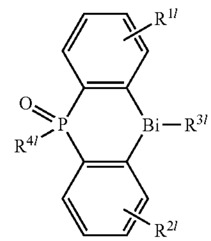
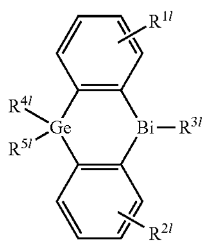
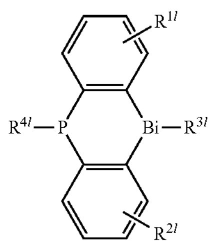
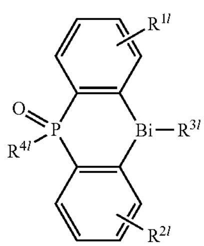
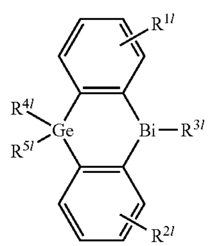
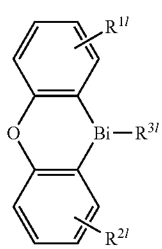
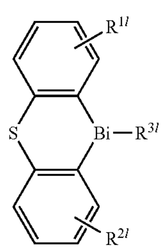
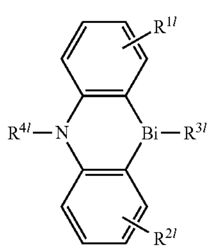
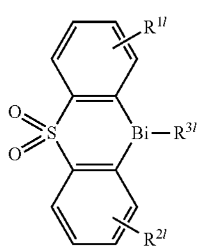
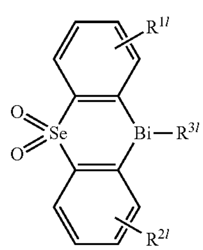
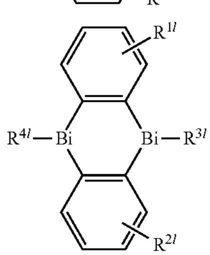
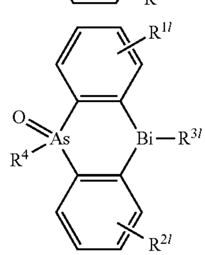
-continued
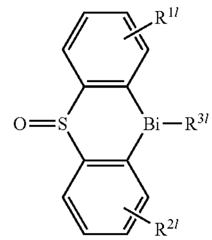
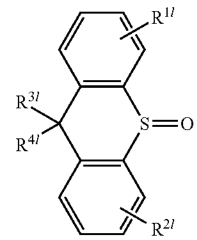
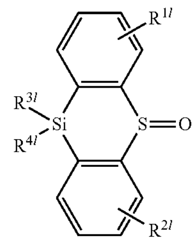
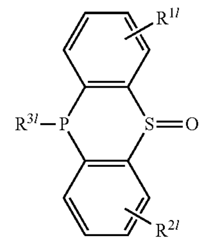
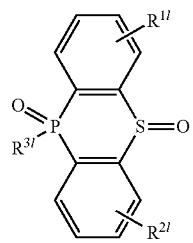
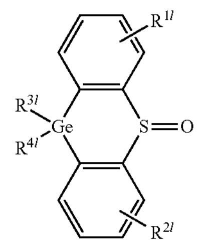
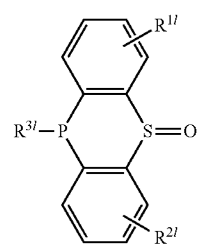
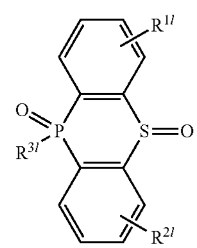
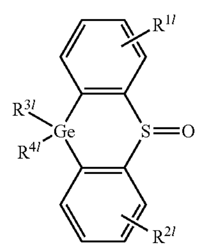
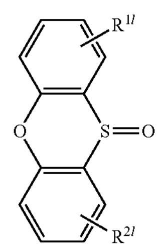
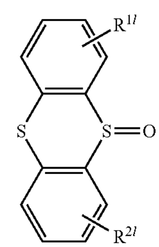
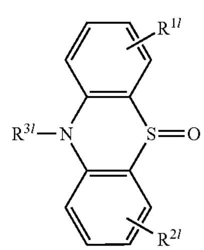
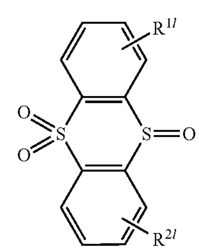
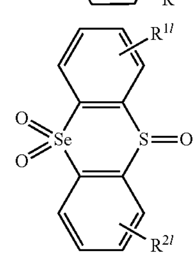
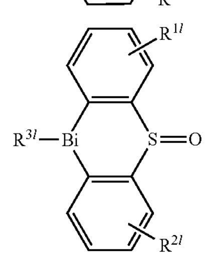

-continued
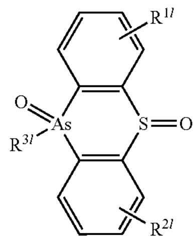 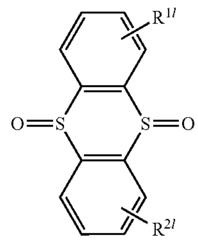
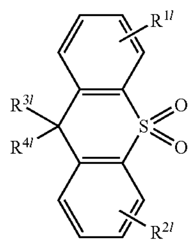 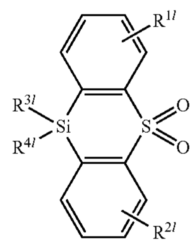
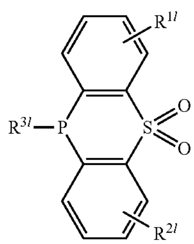 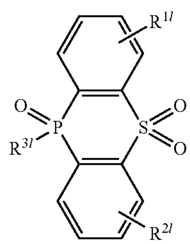
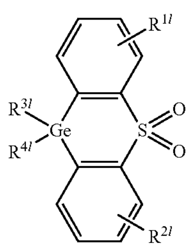 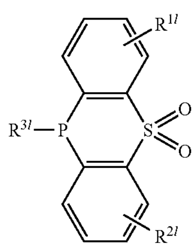
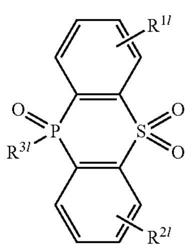 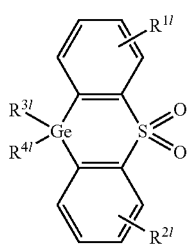 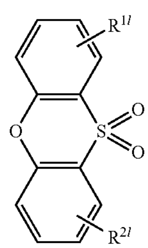
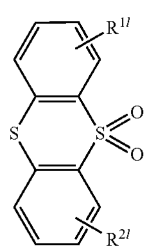 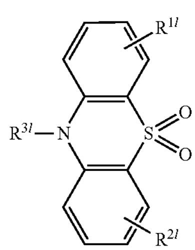 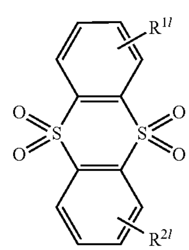
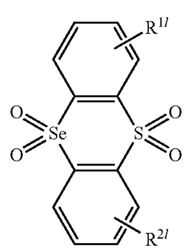 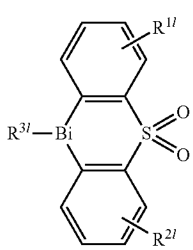
-continued
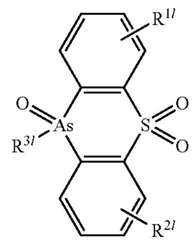 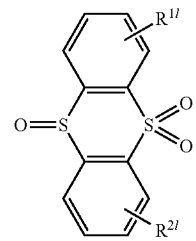
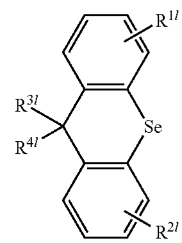 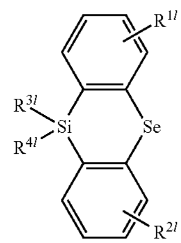 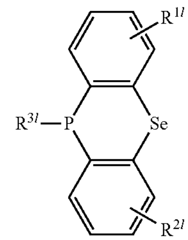
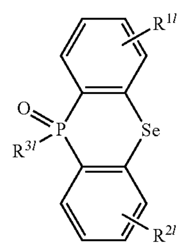 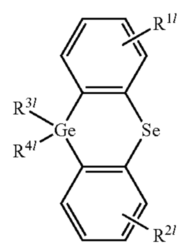 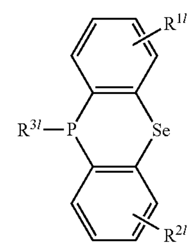
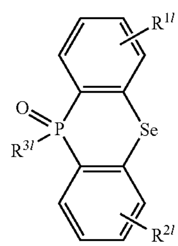 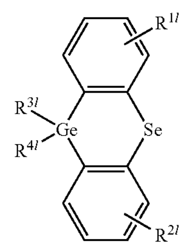 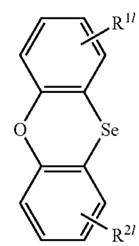
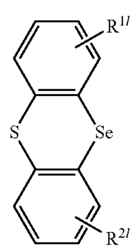 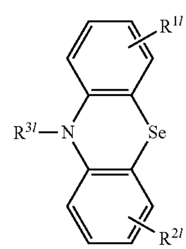 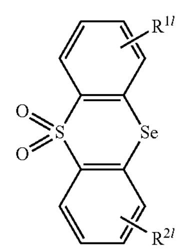
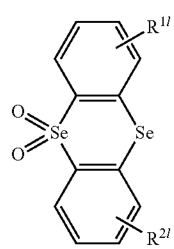 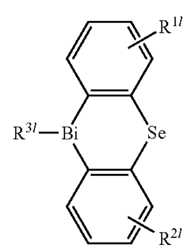 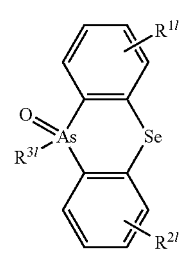
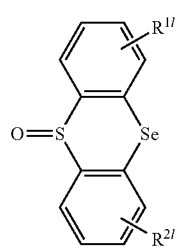 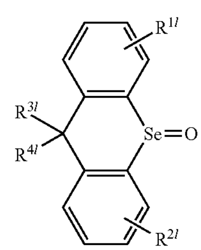 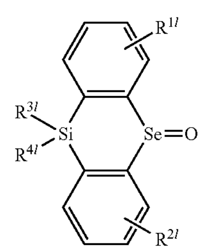

-continued
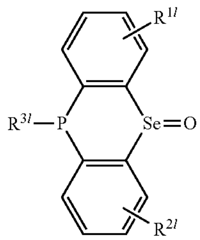
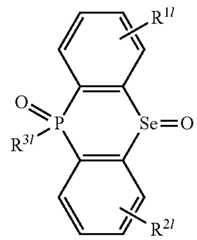
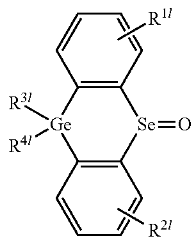
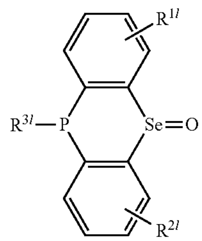
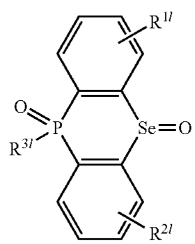
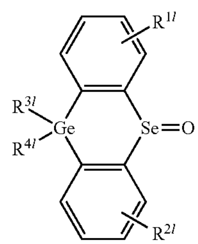
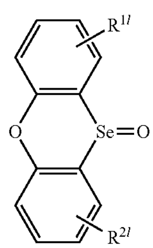
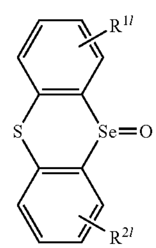
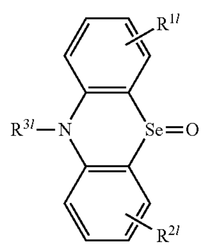
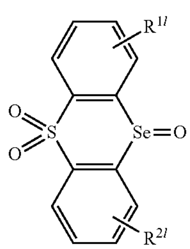
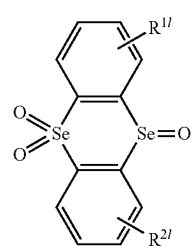
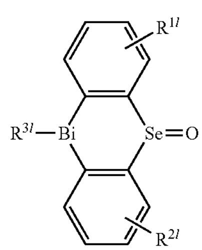
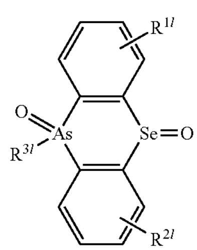
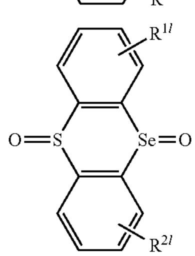
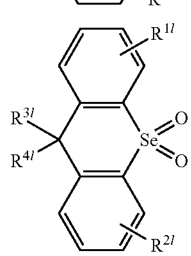
-continued
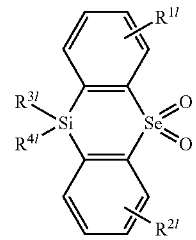
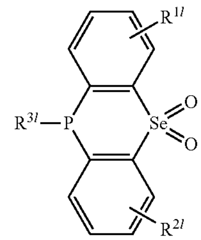
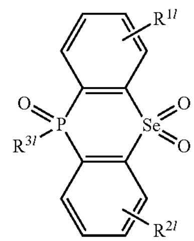
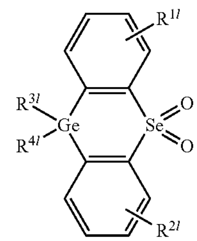
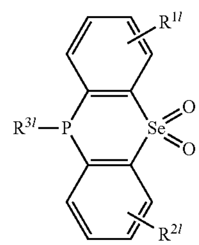
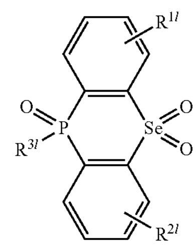
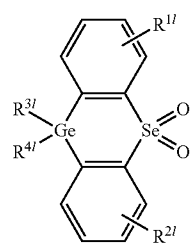
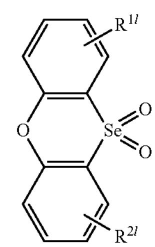
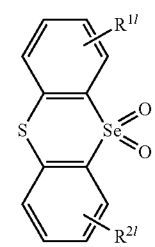
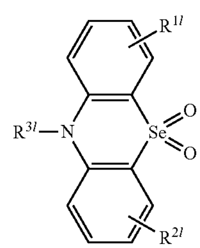
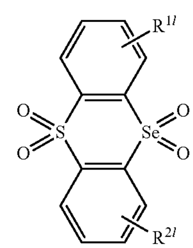
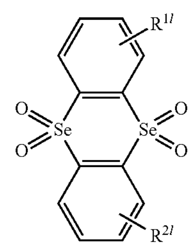
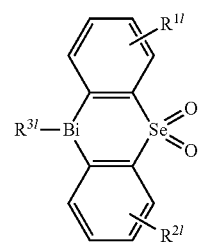
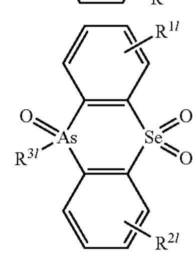
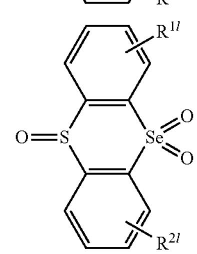

-continued
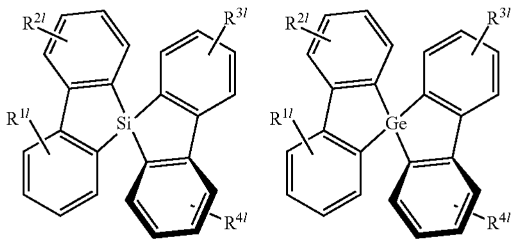
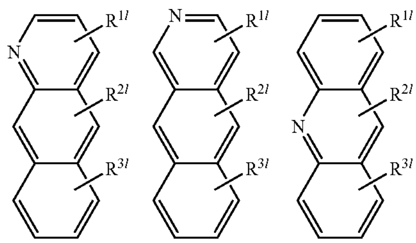
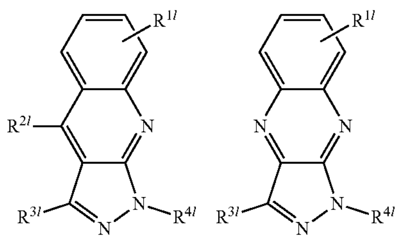
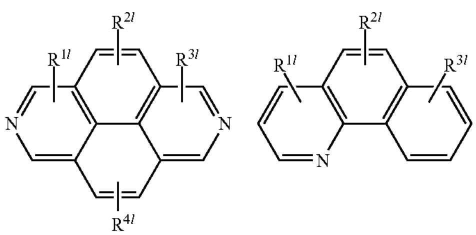
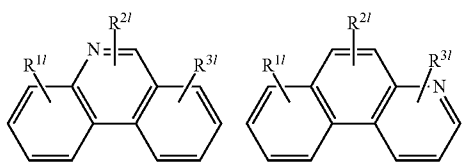
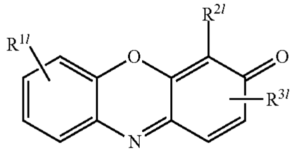
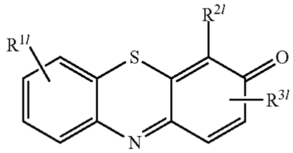
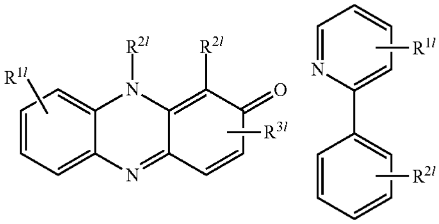
-continued
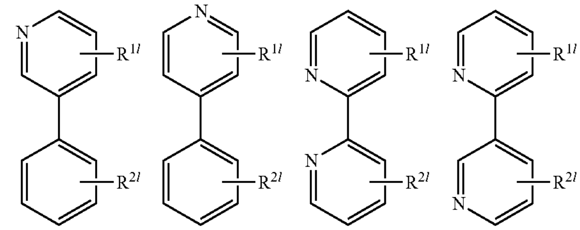
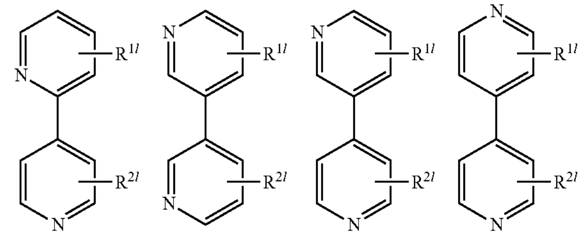
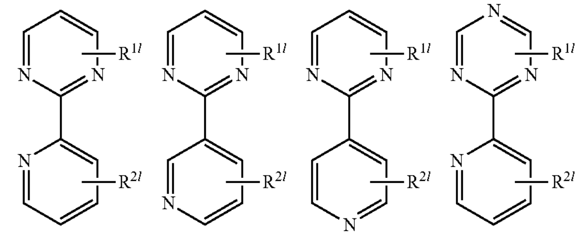
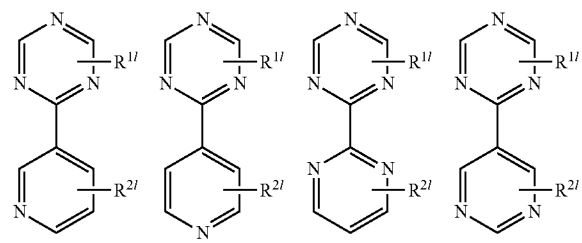
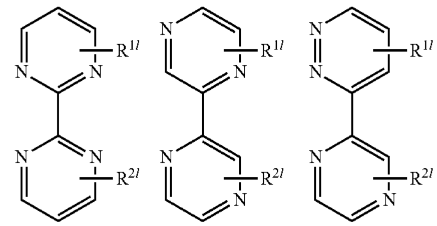
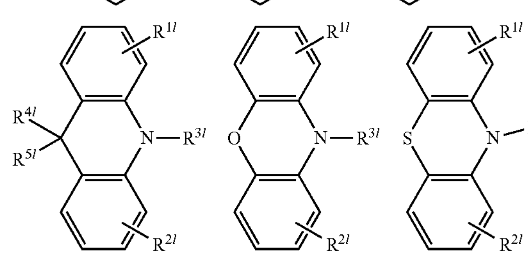
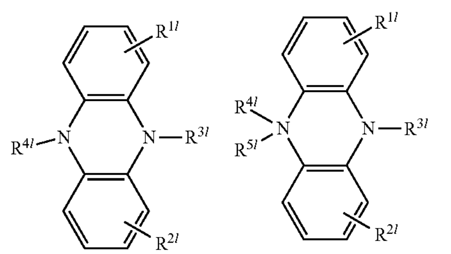

-continued
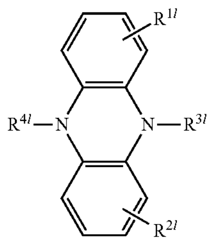
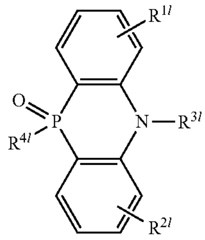
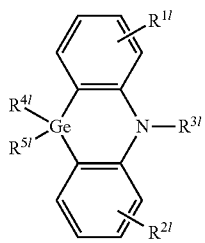
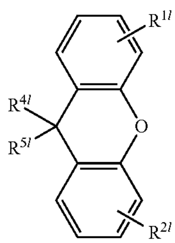
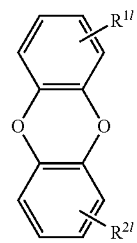
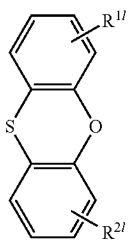
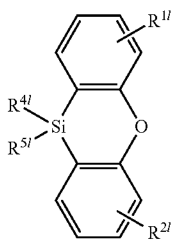
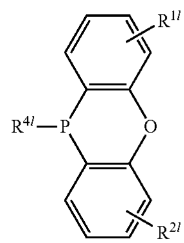
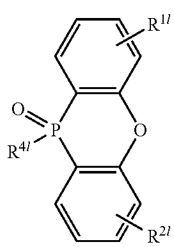
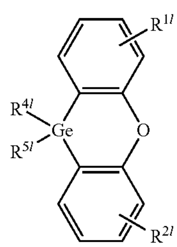
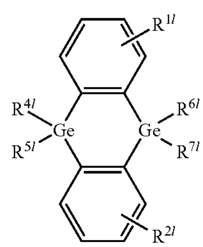
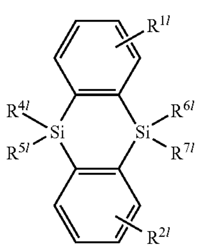
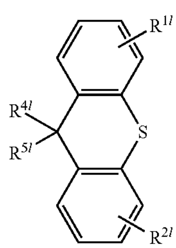
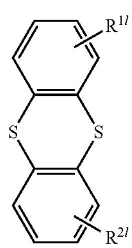
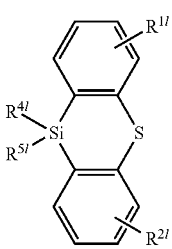
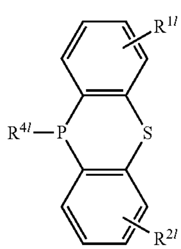
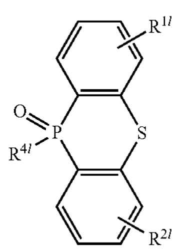
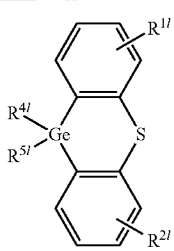
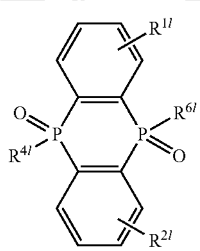
-continued
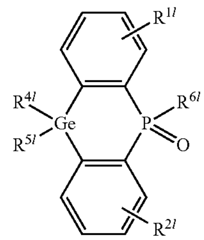
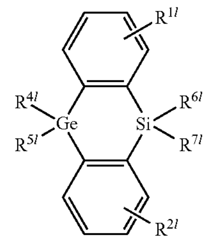
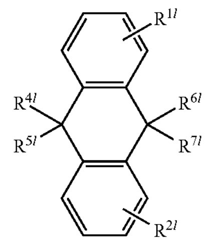
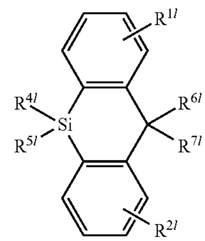
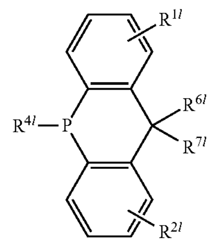
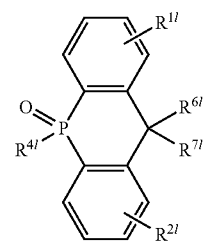
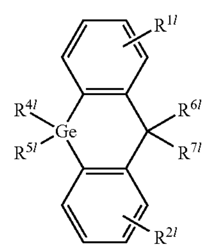
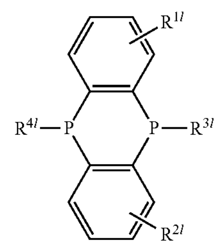
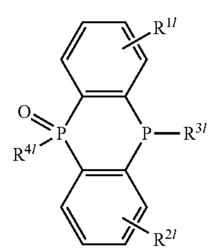
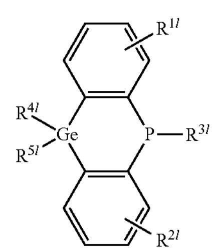
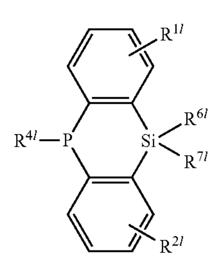
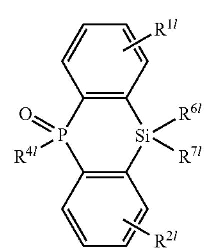
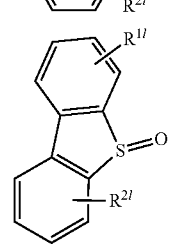
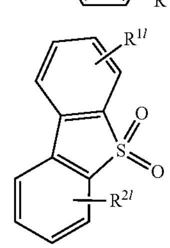

-continued
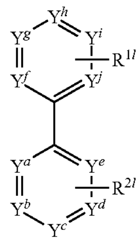
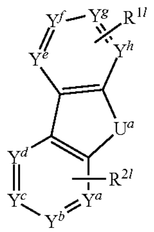
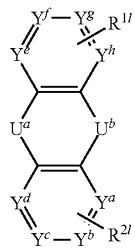
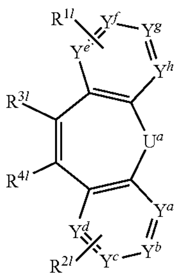
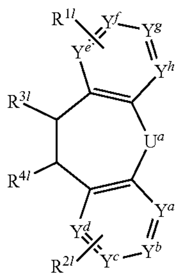
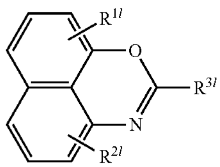
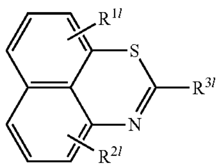
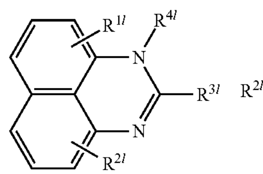
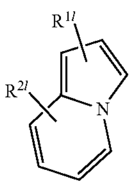
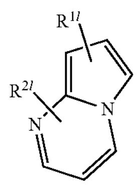
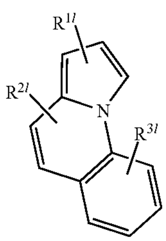
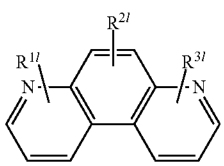
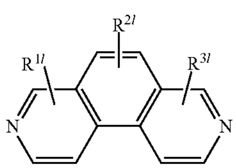
4 Other fluorescent luminophors
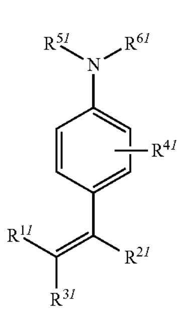
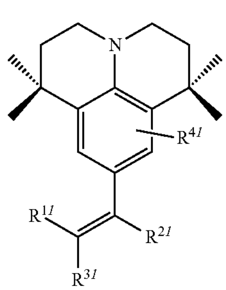
-continued
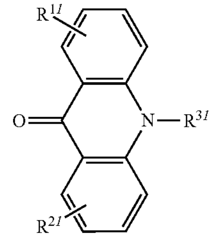
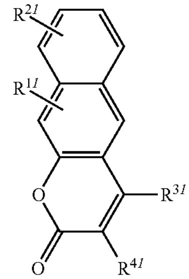
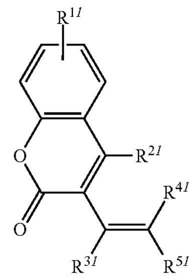
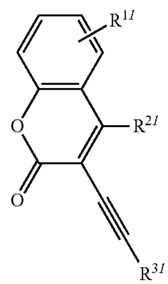
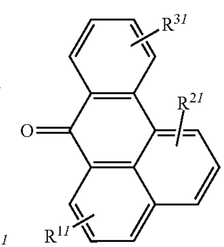
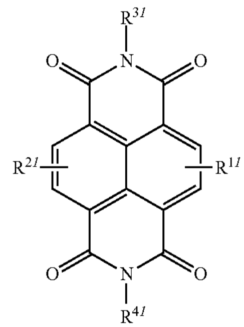
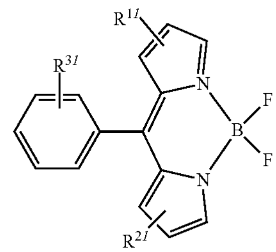
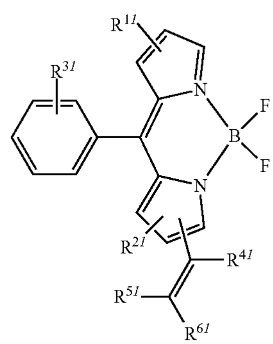
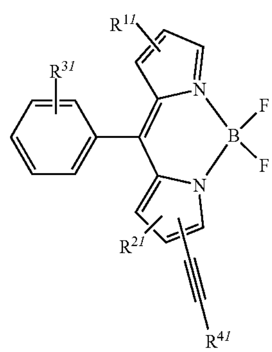
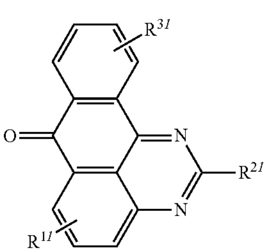
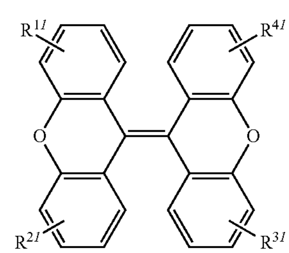

-continued
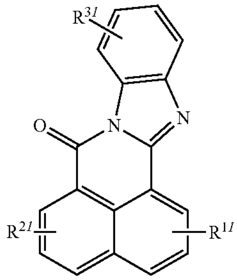
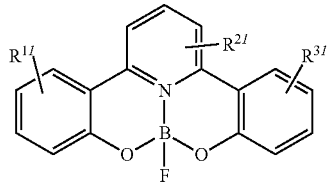
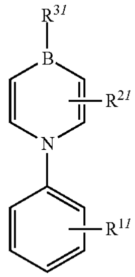
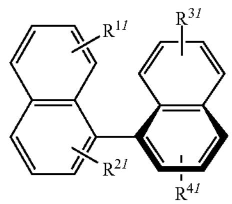
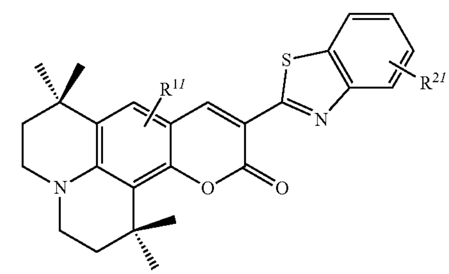
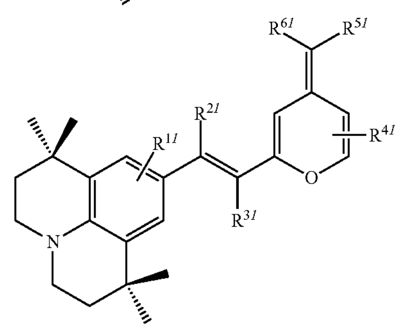
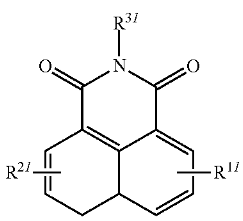
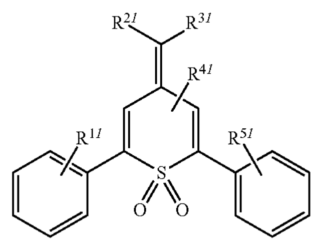
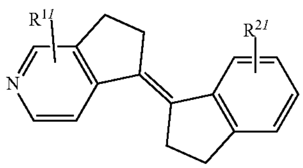
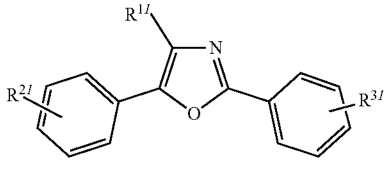
-continued
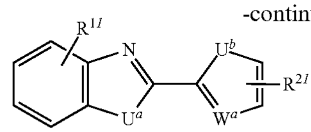
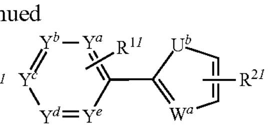
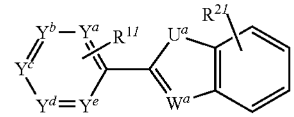
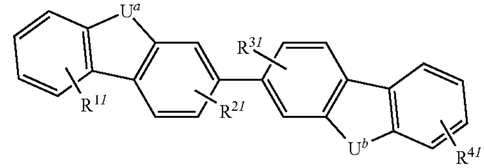
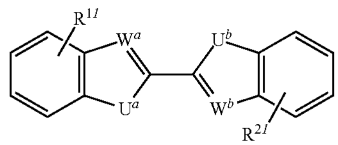
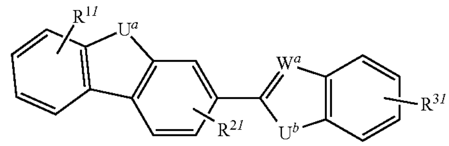
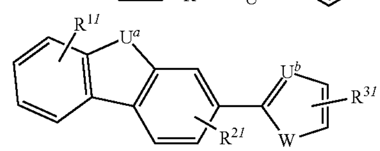
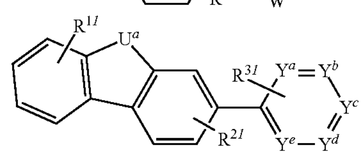
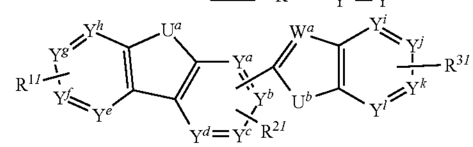
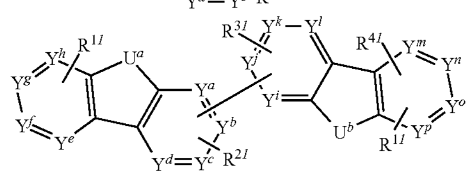
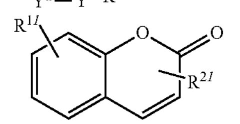
Coumarins
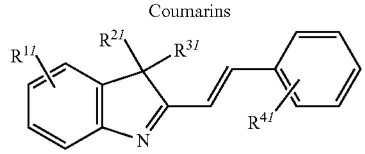
wherein:
each of $R^1$, $R^2$, $R^3$, $R^4$, $R^{11}$, $R^{21}$, $R^{31}$, $R^{41}$, $R^{51}$, $R^{61}$, $R^{71}$, $R^{81}$, $R^{91}$, and $R^{101}$, if present, is a mono-, di-, tri-, or tetra-substitution, valency permitting, and each $R^1$, $R^2$, $R^3$, $R^4$, $R^{11}$, $R^{21}$, $R^{31}$, $R^{41}$, $R^{51}$, $R^{61}$, $R^{71}$, $R^{81}$, $R^{91}$, and $R^{101}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$, if present, is independently C, N or B, each of $U^a$ and $U^b$, if present, is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and each of W, $W^a$, and $W^b$, if present, is independently CH, $CR^1$, $SiR^1$, GeH, $GeR^1$, N, P, B, Bi, or Bi═O.

5. The compound of claim 1, wherein the compound is one of the following structures Structures Ir-1

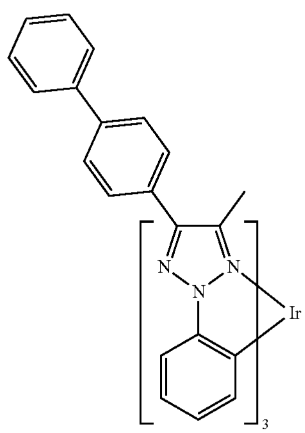

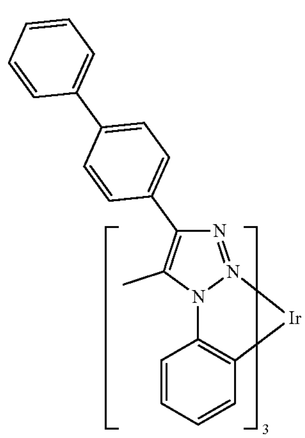

-continued

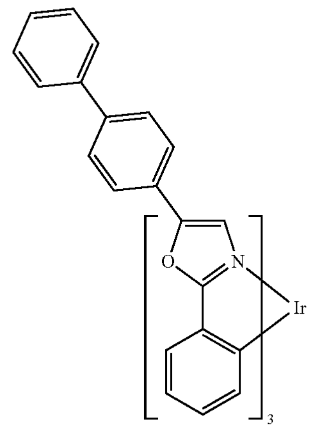

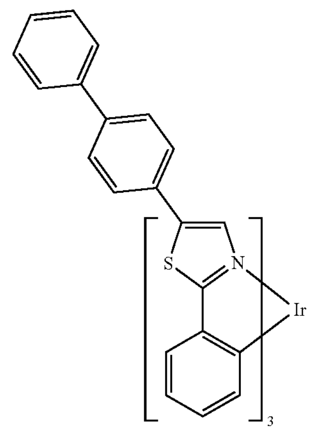

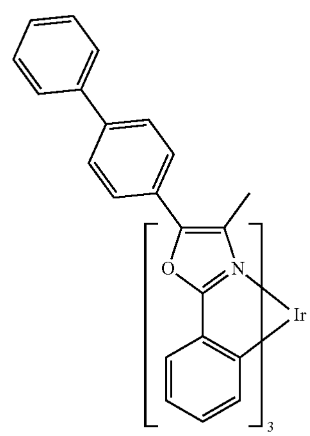

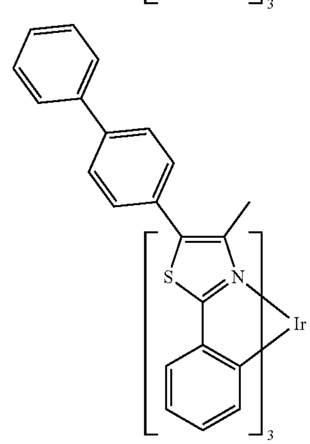

-continued
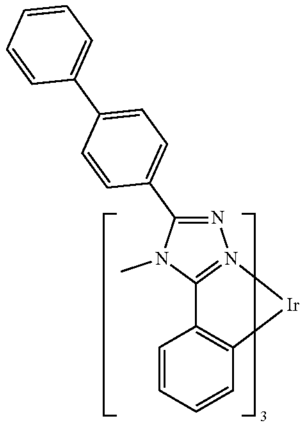
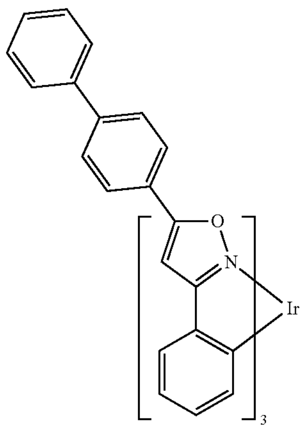
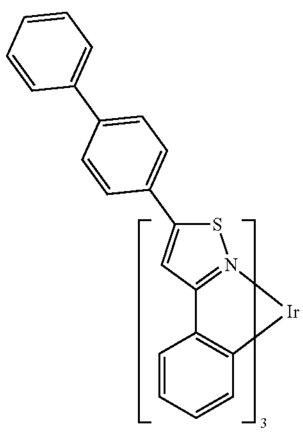
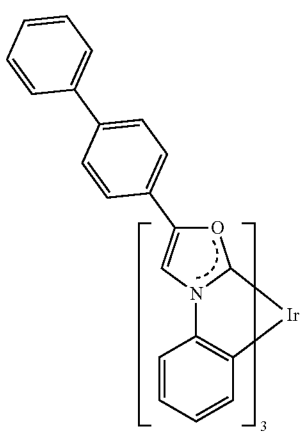
-continued
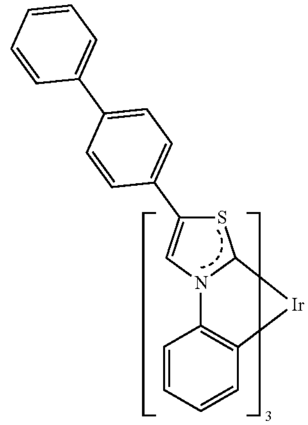
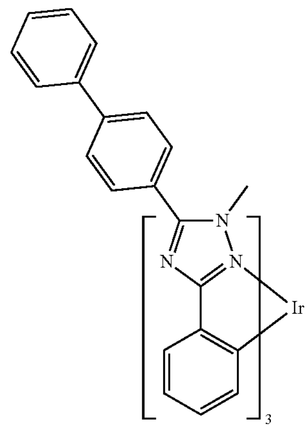
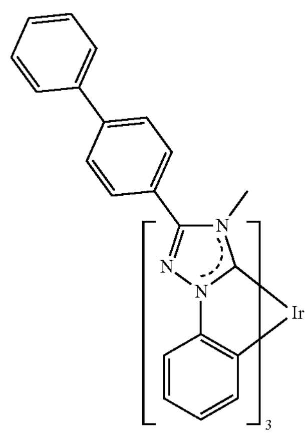
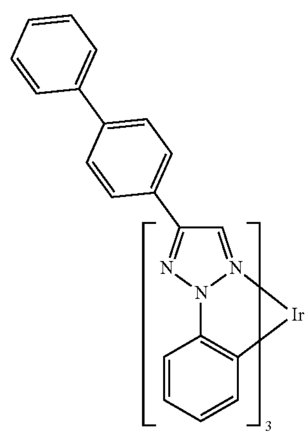

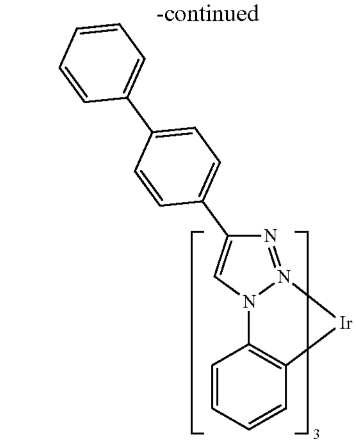
Structures Ir-2
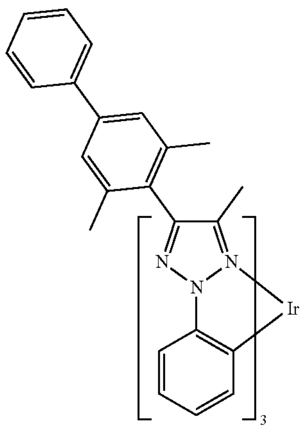
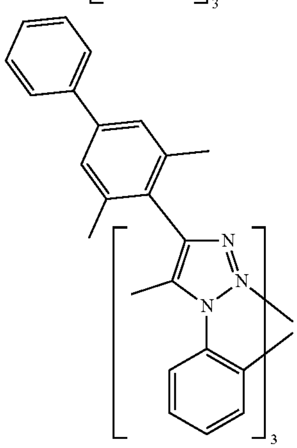
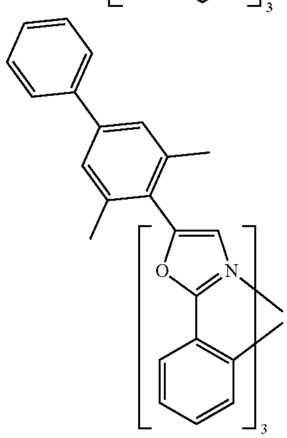
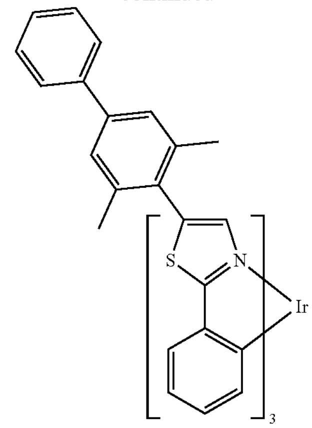
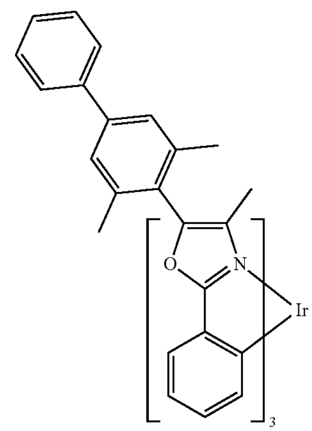
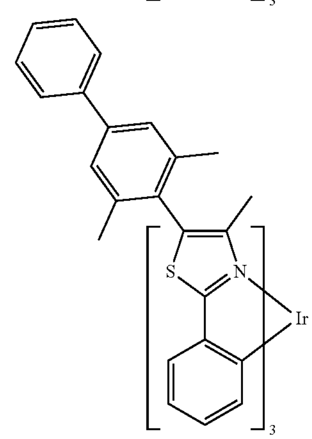
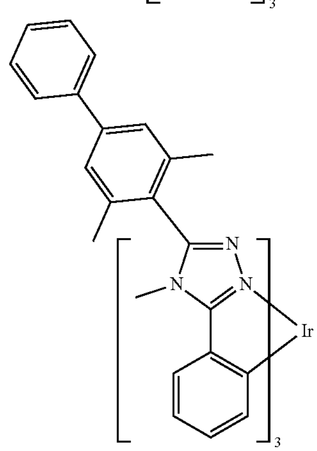

-continued
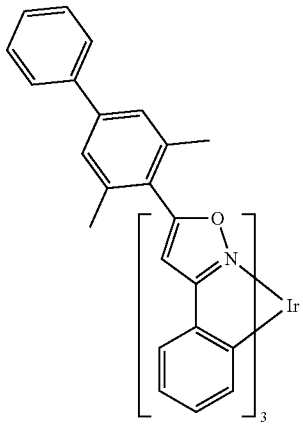
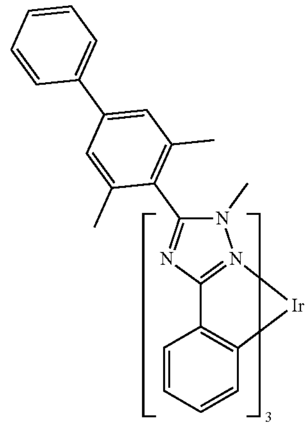
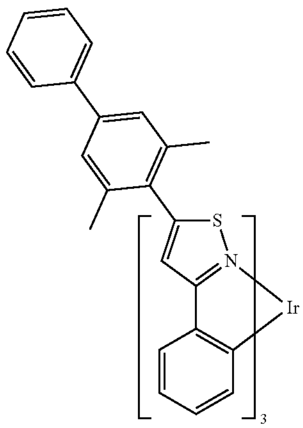
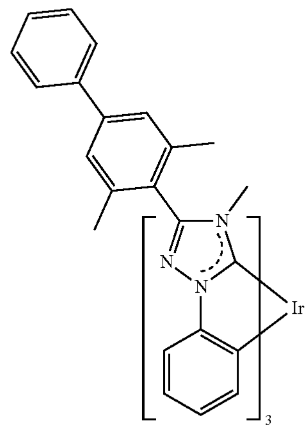
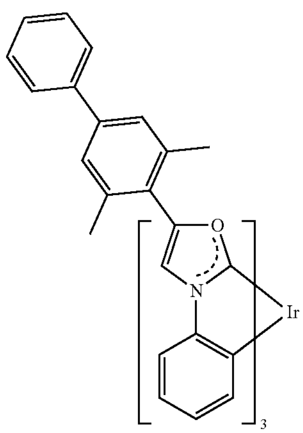
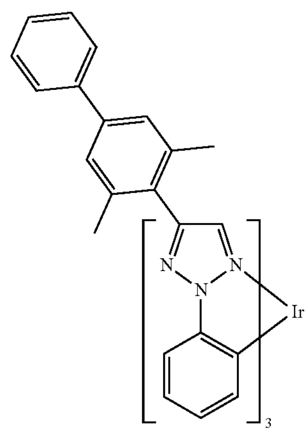
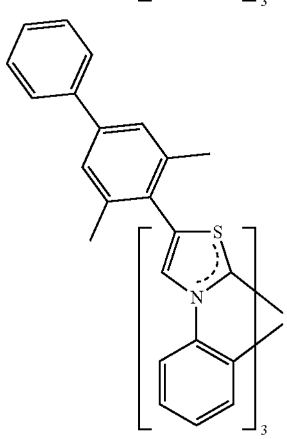
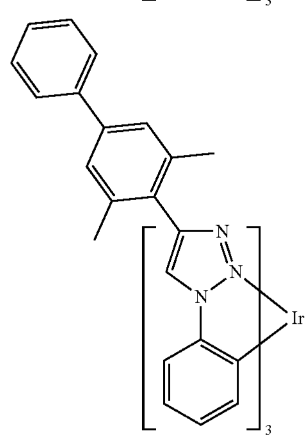

Structures Ir-9
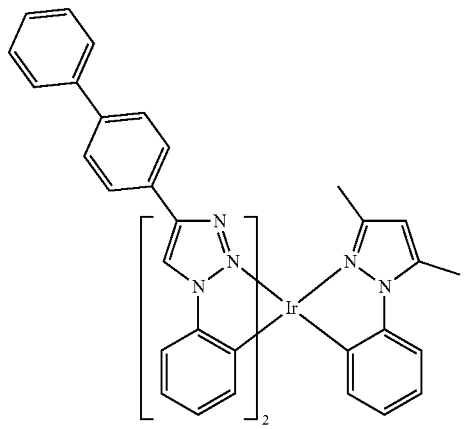
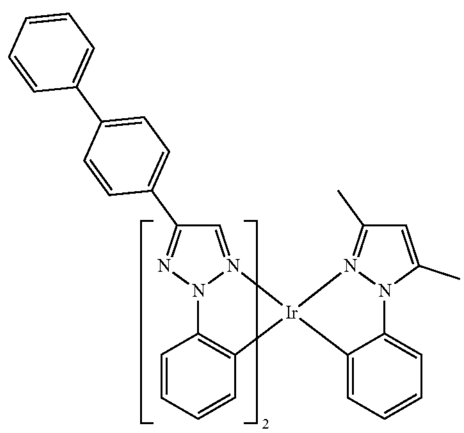
Structures Ir-10
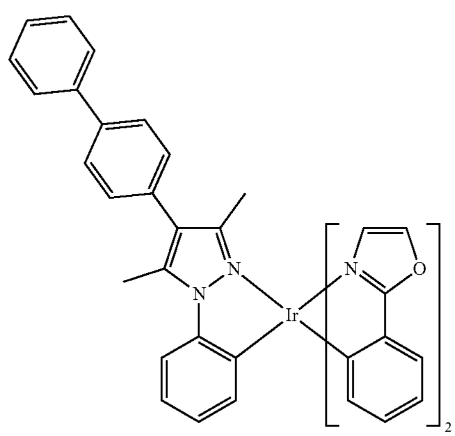
Structures Ir-15
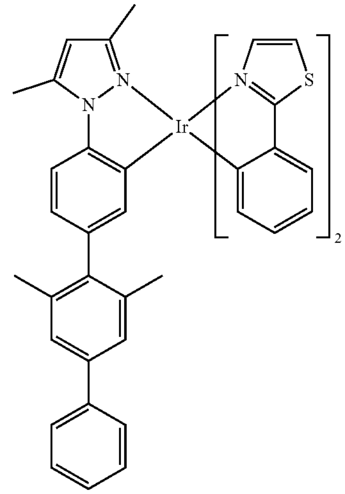
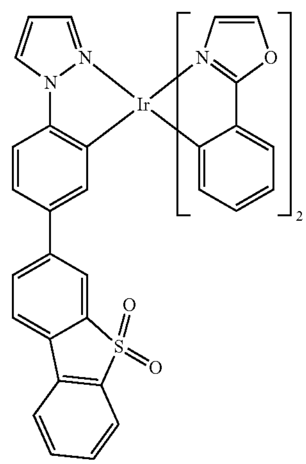
Structures Ir-16
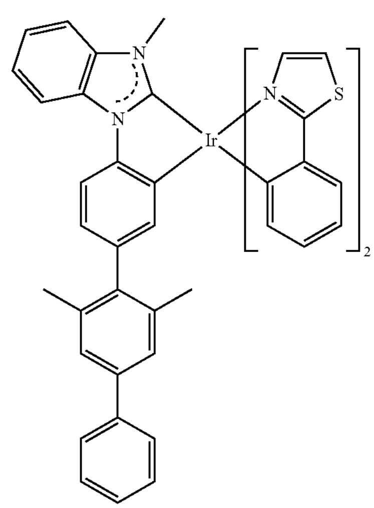

-continued
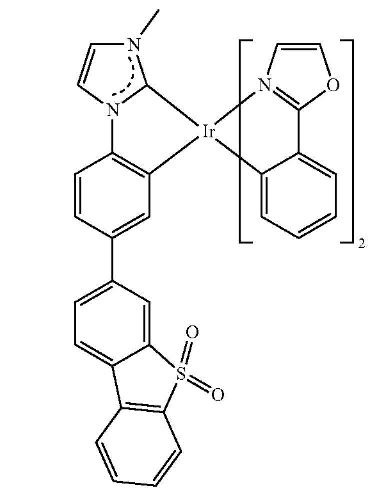
Structures Rh-1
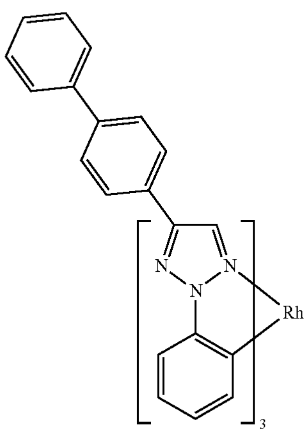
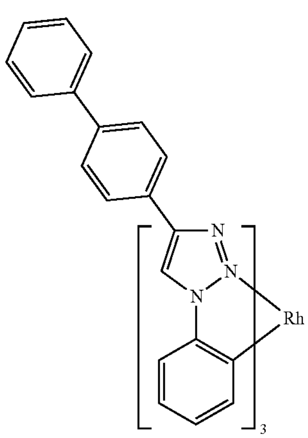
-continued
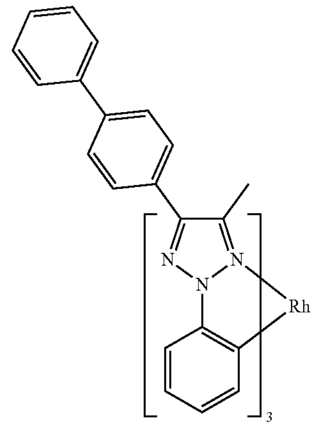
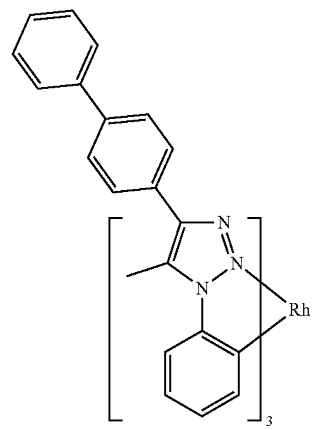
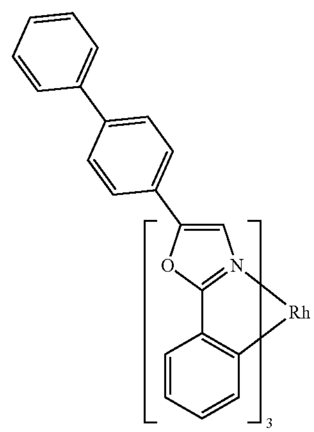
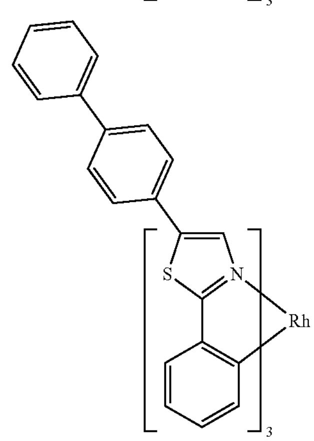

-continued
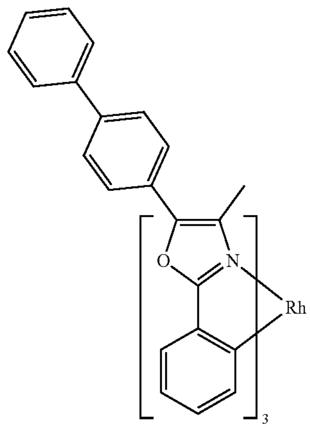
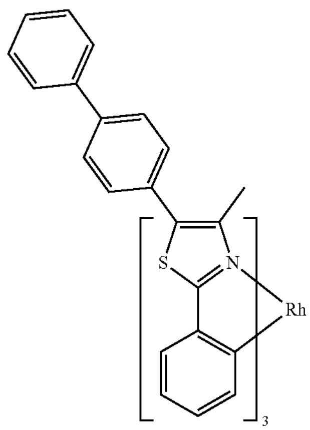
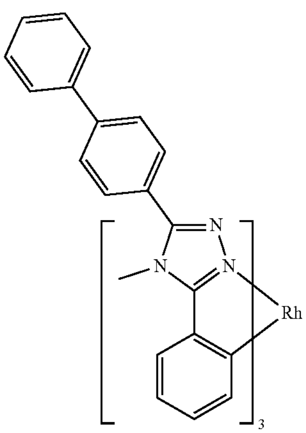
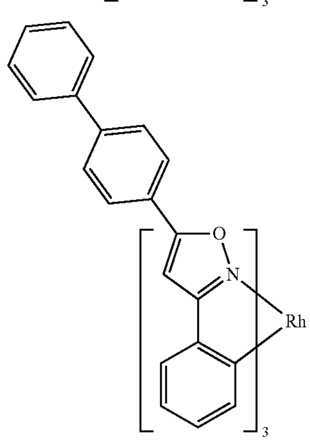
-continued
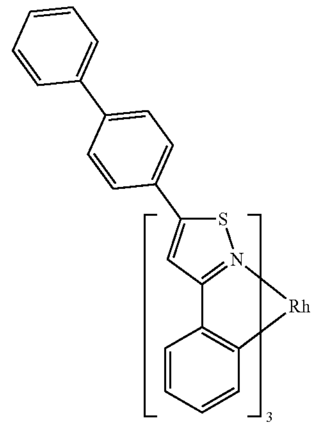
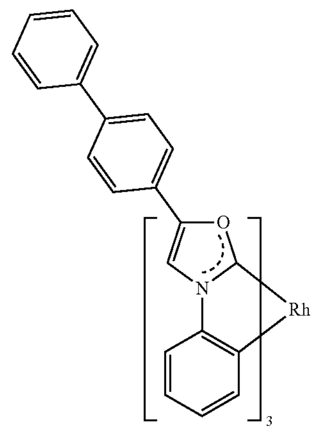
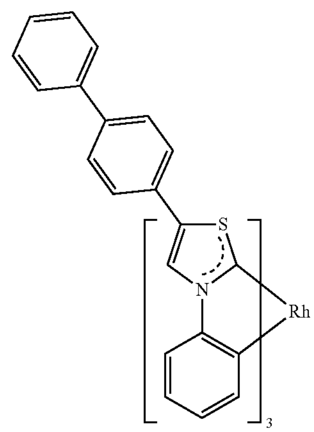
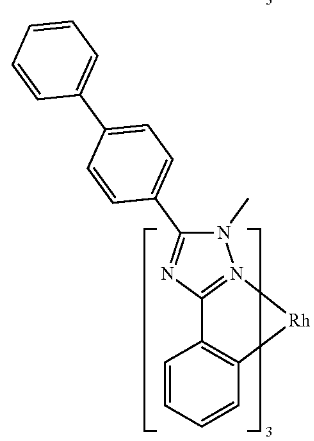

-continued
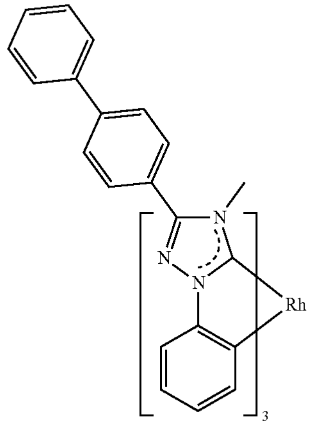
Structures Rh-2
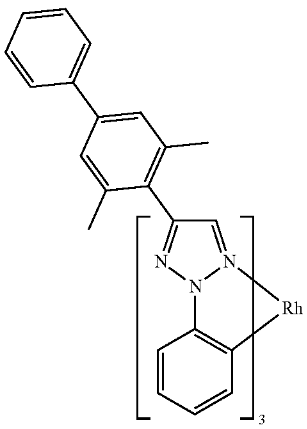
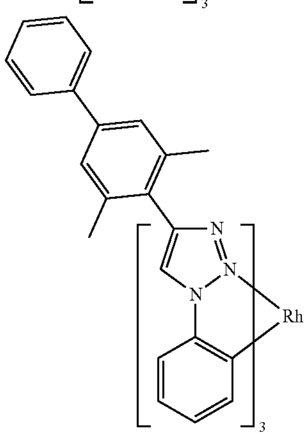
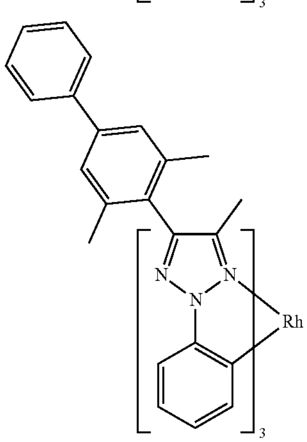
-continued
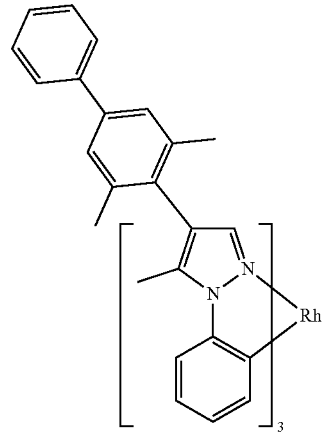
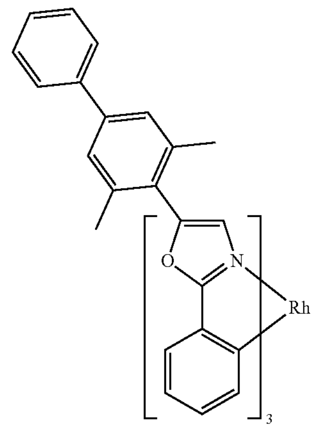
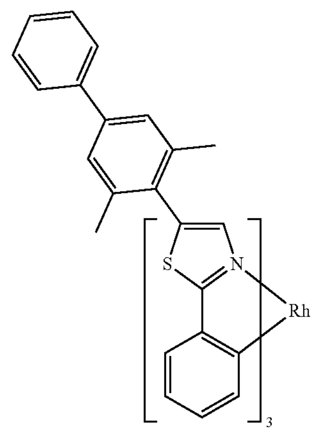
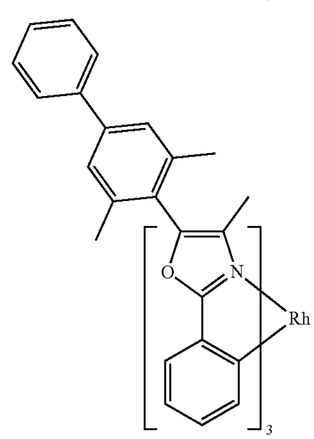

-continued
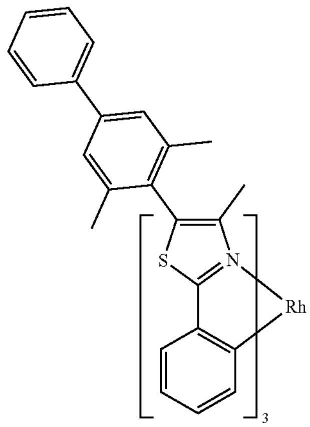
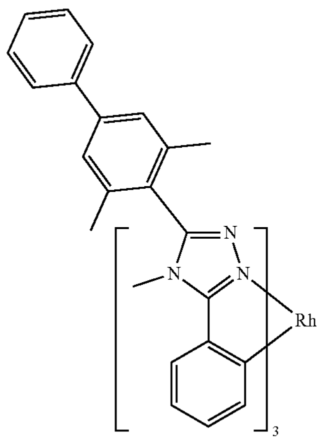
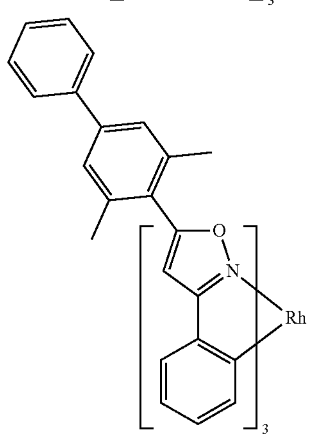
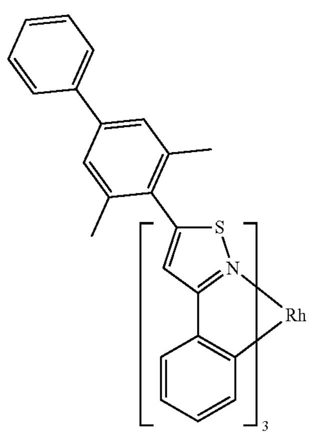
-continued
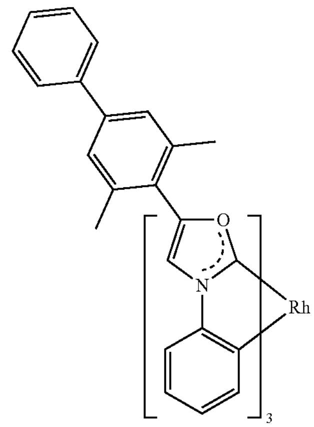
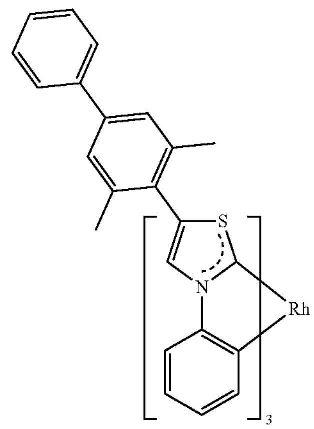
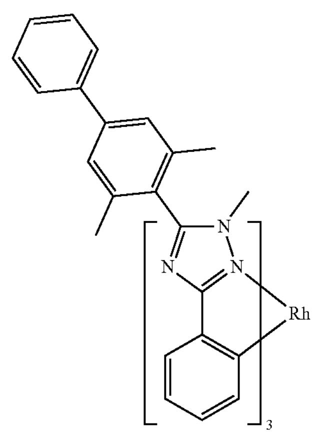
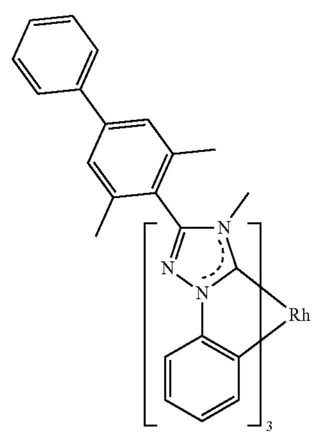

-continued
Structures Rh-9
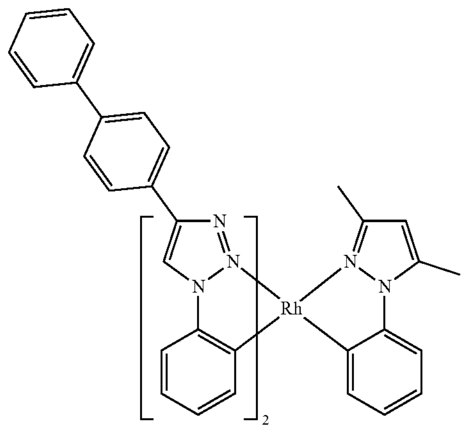
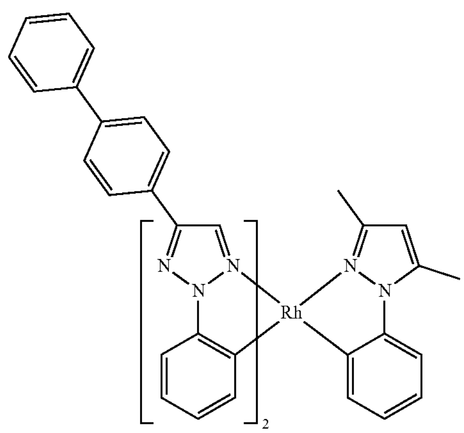
Structures Rh-10
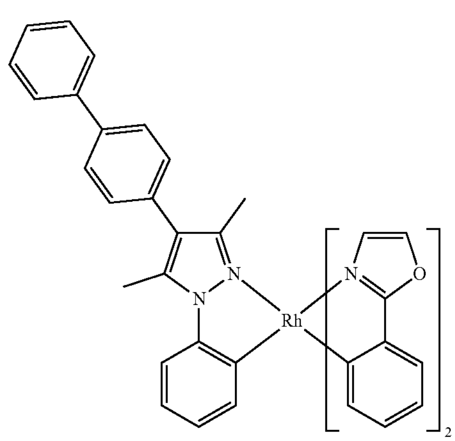
-continued
Structures Rh-15
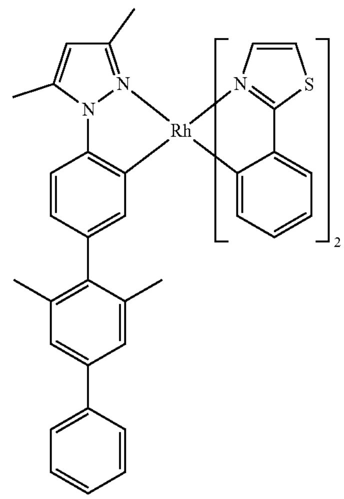
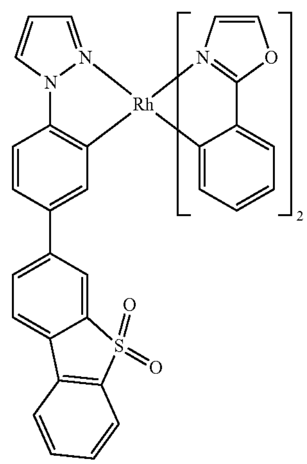
Structures Rh-16
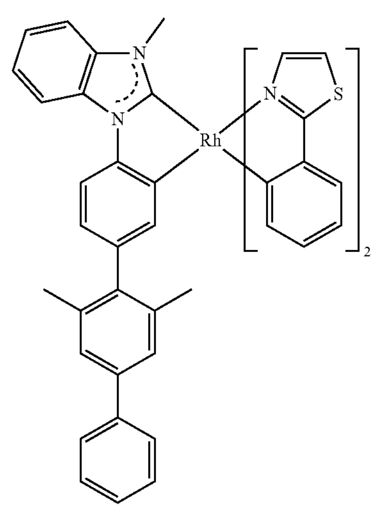

-continued
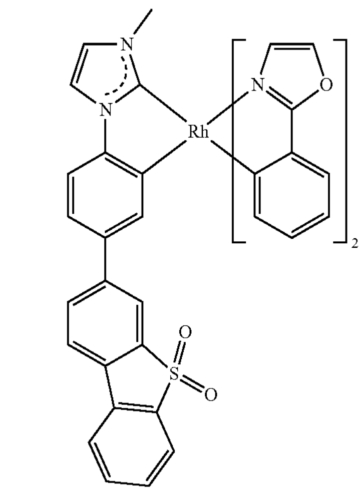
Structures Pt-1
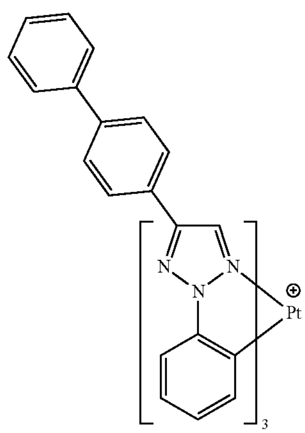
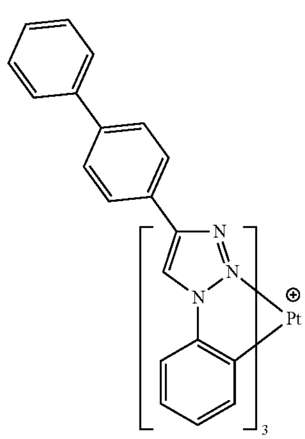
-continued
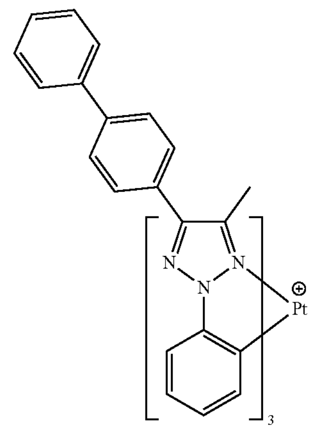
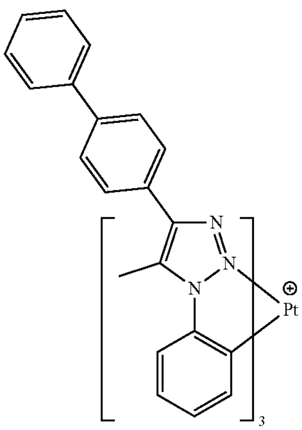
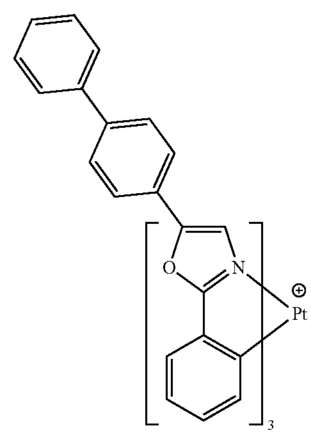
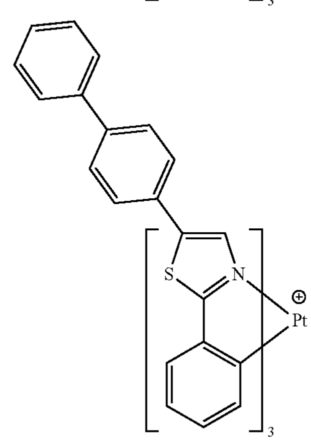

-continued
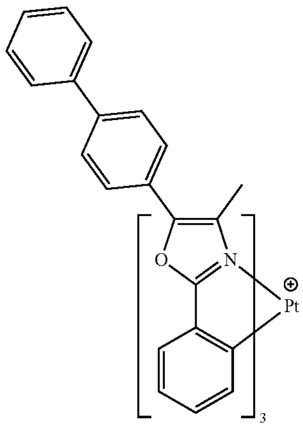
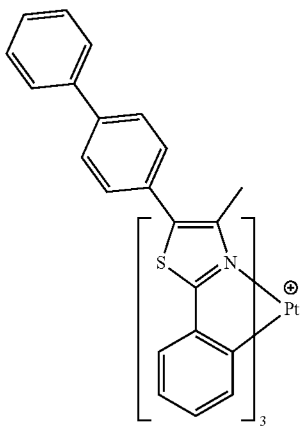
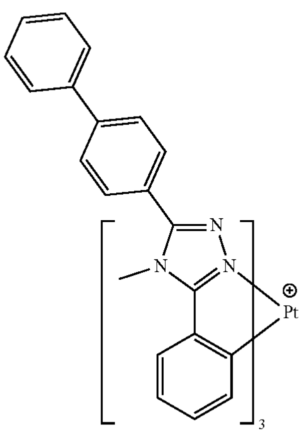
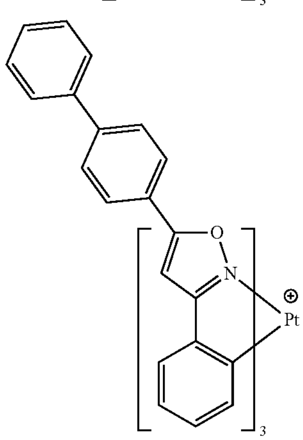
-continued
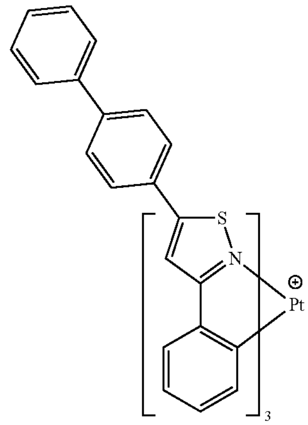
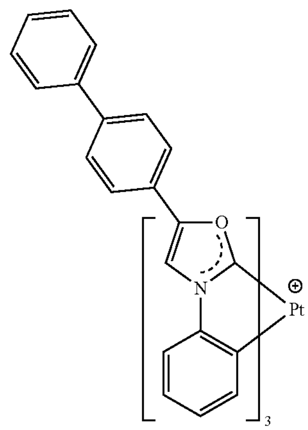
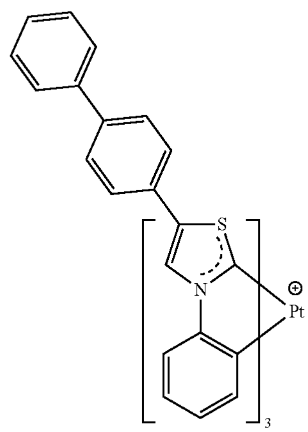
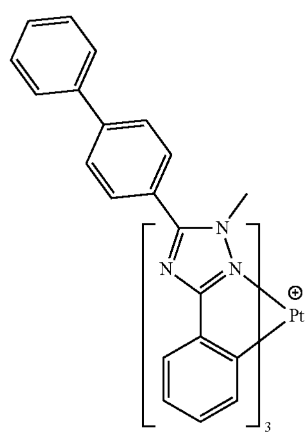

-continued

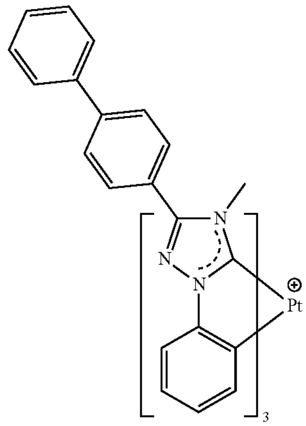

Structures Pt-4

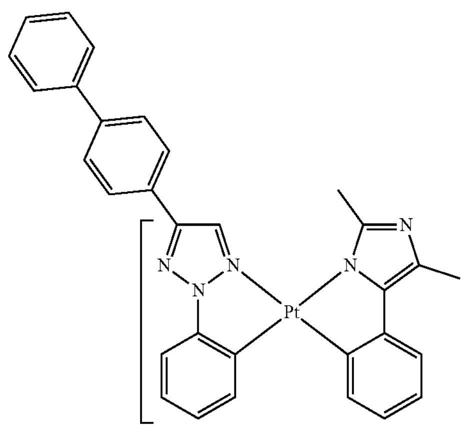

Structures Pt-5

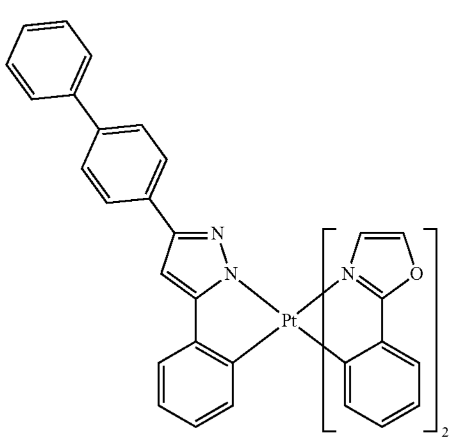

-continued

Structures Pt-10

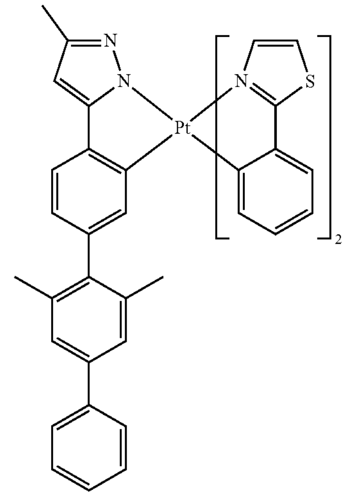

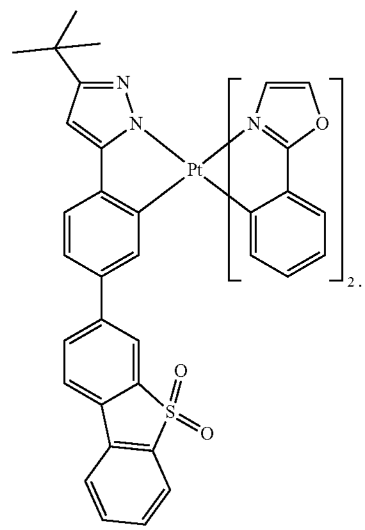

6. An emitter comprising the compound of claim 1, wherein the emitter is a delayed fluorescent and phosphorescent emitter.

7. An emitter comprising the compound of claim 1, wherein the emitter is a phosphorescent emitter.

8. An emitter comprising the compound of claim 1, wherein the emitter is a delayed fluorescent emitter.

9. A device comprising a compound of claim 1.

10. The device of claim 9, wherein the compound is selected to have 100% internal quantum efficiency in the device settings.

11. The device of claim 9, wherein the device is an organic light emitting diode.

12. The compound of claim 1, wherein polymeric comprises polyalkylene, polyester, or polyether.

13. The compound of claim 12, wherein polymeric comprises —$(CH_2O)_n$—$CH_3$, —$(CH_2CH_2O)_n$—$CH_3$,—$[CH_2CH(CH_3)]_n$—$CH_3$, —$[CH_2CH(COOCH_3)]_n$—$CH_3$, —$[CH_2CH(COO\ CH_2CH_3)]_n$—$CH_3$, or —$[CH_2CH(COO^tBu)]_n$—$CH_3$, where n is an integer.

14. The compound of claim 1, wherein each of $L^1$ is independently a substituted or unsubstituted structure selected from the group consisting of
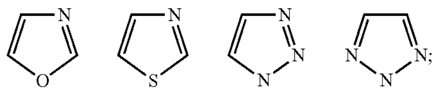
and
$L^3$ is a substituted or unsubstituted structure selected from the group consisting of
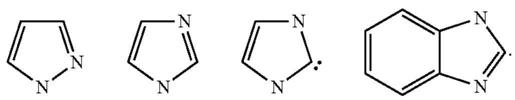
* * * * *

UNITED STATES PATENT AND TRADEMARK OFFICE
CERTIFICATE OF CORRECTION

PATENT NO. : 10,991,897 B2
APPLICATION NO. : 16/171026
DATED : April 27, 2021
INVENTOR(S) : Jian Li and Guijie Li It is certified that error appears in the above-identified patent and that said Letters Patent is hereby corrected as shown below:

In the Claims

Claim 1, Column 479, Lines 5-20 should read as follows:

Formula V

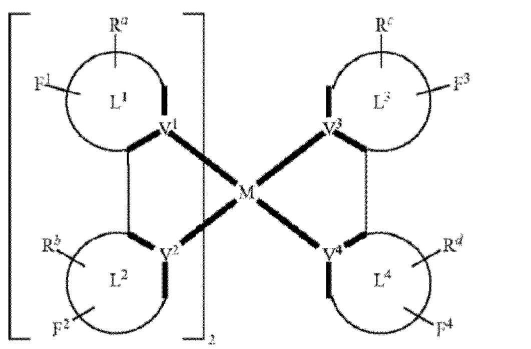

Claim 5, Column 537, Lines 25-40 should read as follows:

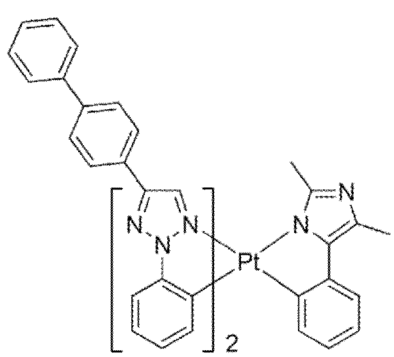

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*